US009917273B2

(12) United States Patent
Yomogita et al.

(10) Patent No.: US 9,917,273 B2
(45) Date of Patent: Mar. 13, 2018

(54) CROSS-LINKING POLYMER AND ORGANIC ELECTROLUMINESCENT ELEMENT USING SAME

(71) Applicant: IDEMITSU KOSAN CO., LTD., Tokyo (JP)

(72) Inventors: Akinori Yomogita, Sodegaura (JP); Hironori Kawakami, Sodegaura (JP); Masami Watanabe, Sodegaura (JP); Kiyoshi Ikeda, Sodegaura (JP); Masahiro Kawamura, Sodegaura (JP); Nobuhiro Yabunouchi, Sodegaura (JP); Tomoki Kato, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 375 days.

(21) Appl. No.: 14/234,876

(22) PCT Filed: Oct. 12, 2012

(86) PCT No.: PCT/JP2012/006546
§ 371 (c)(1),
(2) Date: Jan. 24, 2014

(87) PCT Pub. No.: WO2013/057908
PCT Pub. Date: Apr. 25, 2013

(65) Prior Publication Data

US 2014/0231771 A1 Aug. 21, 2014

(30) Foreign Application Priority Data

Oct. 19, 2011 (JP) ................................ 2011-229719
Oct. 19, 2011 (JP) ................................ 2011-229721

(51) Int. Cl.
*H01L 51/54* (2006.01)
*C09K 11/06* (2006.01)
(Continued)

(52) U.S. Cl.
CPC .......... *H01L 51/5088* (2013.01); *C08G 61/12* (2013.01); *C08G 73/0672* (2013.01);
(Continued)

(58) Field of Classification Search
CPC .... C08G 51/00; C08G 51/12; C08G 73/0622; C08G 73/0627; C08G 2261/00; C08G 2261/135; C08G 2261/14; C08G 2261/141; C08G 2261/142; C08G 2261/149; C08G 2261/1644; C08G 2261/30; C08G 2261/31; C08G 2261/312; C08G 2261/314; C08G 2261/3142; C08G 2261/316; C08G 2261/3162; C08G 2261/324; C08G 2261/3241; C08G 2261/40; C08G 2261/411; C08G 2261/76; C08G 2261/91; C08G 2261/92; C08G 2261/95; C08G 2261/124; C09D 179/00; C09D 179/04; H01L 51/0032; H01L 51/0034;
(Continued)

(56) References Cited

U.S. PATENT DOCUMENTS

| | | | | |
|---|---|---|---|---|
| 6,107,452 A * | 8/2000 | Miller | C08G 61/02 | 313/506 |
| 2003/0008175 A1* | 1/2003 | Lee | C08G 61/02 | 428/690 |

(Continued)

FOREIGN PATENT DOCUMENTS

| | | |
|---|---|---|
| JP | 2003-012777 | 1/2003 |
| JP | 2004-269696 | 9/2004 |

(Continued)

OTHER PUBLICATIONS

International Search Report in PCT/JP2012/006546 dated Dec. 25, 2012.

*Primary Examiner* — Andrew K Bohaty
(74) *Attorney, Agent, or Firm* — Foley & Lardner LLP

(57) ABSTRACT

A polymer including structural units represented by the following formulas (A) and (B).

In the formula (A), P is a group derived from a compound represented by the formula (P). $L_1$ is a linkage group. In the formula (B), Q is a group derived from a compound represented by the formula (Q). $L_2$ is a linkage group. In the formula (B), at least one of "c"Qs and "d"$L_2$s includes a cross-linkable group.

$$\left[ (P)_a - (L_1)_b \right] \quad (A)$$

$$\left[ (Q)_c - (L_2)_d \right] \quad (B)$$

(P)

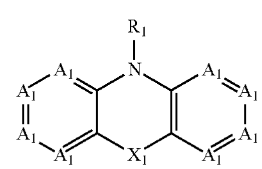

(Q)

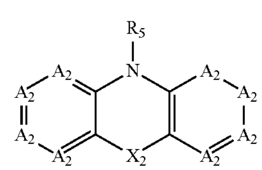

41 Claims, No Drawings

(51) Int. Cl.

| | |
|---|---|
| ***H01L 51/50*** | (2006.01) |
| ***C08G 61/12*** | (2006.01) |
| ***H01L 51/00*** | (2006.01) |
| ***C09D 179/04*** | (2006.01) |
| ***C08G 73/06*** | (2006.01) |

(52) U.S. Cl.

CPC ........ *C09D 179/04* (2013.01); *H01L 51/0035* (2013.01); *H01L 51/0043* (2013.01); *C08G 2261/124* (2013.01); *C08G 2261/135* (2013.01); *C08G 2261/149* (2013.01); *C08G 2261/1412* (2013.01); *C08G 2261/1644* (2013.01); *C08G 2261/3142* (2013.01); *C08G 2261/3162* (2013.01); *C08G 2261/364* (2013.01); *C08G 2261/411* (2013.01); *C08G 2261/76* (2013.01); *C08G 2261/91* (2013.01); *C08G 2261/92* (2013.01); *C08G 2261/95* (2013.01); *H01L 51/5056* (2013.01)

(58) Field of Classification Search

CPC ............. H01L 51/0035; H01L 51/0039; H01L 51/0043; H01L 51/50; H01L 51/5056; H01L 51/5088

USPC ........... 252/301.16–301.35, 500; 528/8, 210; 428/690, 691, 917, 411.4, 336; 427/58, 427/66; 313/500–512; 257/40, 88–104, 257/E51.001–E51.052

See application file for complete search history.

(56) References Cited

U.S. PATENT DOCUMENTS

| | | | | |
|---|---|---|---|---|
| 2008/0054794 | A1* | 3/2008 | Hatanaka | C09K 11/06 313/504 |
| 2008/0097076 | A1 | 4/2008 | Radu et al. | |
| 2009/0021147 | A1 | 1/2009 | Sugita et al. | |
| 2009/0227765 | A1* | 9/2009 | Towns | C08G 73/02 528/422 |
| 2011/0042661 | A1* | 2/2011 | Endo | C08G 61/12 257/40 |
| 2011/0095278 | A1 | 4/2011 | Sugita et al. | |
| 2012/0286654 | A1 | 11/2012 | Kobayashi | |

FOREIGN PATENT DOCUMENTS

| | | |
|---|---|---|
| JP | 2006-257196 | 9/2006 |
| JP | 2006-520409 | 9/2006 |
| JP | 2006-279007 | 10/2006 |
| JP | 2007-511636 | 5/2007 |
| JP | 2008-063327 | 3/2008 |
| JP | 2008-169367 | 7/2008 |
| JP | 2008-231419 | 10/2008 |
| JP | 2009-524703 | 7/2009 |
| JP | 2009-196982 | 9/2009 |
| JP | 2009-283509 | 12/2009 |
| JP | 2011-082052 | 4/2011 |
| JP | 2011-144375 | 7/2011 |
| JP | 2011-153134 | 8/2011 |
| WO | WO-2009/110360 A1 | 9/2009 |

* cited by examiner

CROSS-LINKING POLYMER AND ORGANIC ELECTROLUMINESCENT ELEMENT USING SAME

CROSS REFERENCE TO RELATED APPLICATIONS

This application is a national stage entry of PCT/JP2012/006546 filed Oct. 12, 2012, which claims priority to Japanese Application Nos. 2011-229719 filed Oct. 19, 2011 and 2011-229721 filed Oct. 19, 2011, the disclosures of which are hereby incorporated by reference in their entirety.

TECHNICAL FIELD

The invention relates to a cross-linking polymer and an organic electroluminescence device (Organic EL Device) using the same.

BACKGROUND ART

Due to self-emission and no dependency on viewing angle, as well as capability of plane emission and reduction in thickness, application of an organic EL device to a display of a TV or a mobile phone, an illumination or the like has been studied.

An organic EL device has a configuration in which a thin film of an organic compound is sandwiched between a cathode and an anode. The methods for forming a thin film are roughly divided into the deposition method and the coating method. The deposition method is a method in which a low-molecular weight compound is mainly used, and a thin film is formed on the substrate in vacuum. The industrial-base-production thereof proceeds. On the other hand, the coating method is a technique in which a thin film is formed on the substrate by using a solution (e.g. inkjet and printing). The deposition method has a high material utilization efficiency, and hence is suited to an increase in area and an enhancement of resolution. This method is a technology which is deemed to be indispensable in an organic EL display in the future.

The vacuum deposition method using a low-molecular material has an extremely low utilization efficiency of the material. In addition, if the size is increased, the degree of distortion of a shadow mask becomes large. Therefore, deposition on a large-sized substrate is difficult, and as a result, fabrication of a display using a large-sized organic EL substrate is difficult. In addition, the production cost also increases.

On the other hand, in the case of a high-molecular weight material, it is possible to form a homogenous film by applying a solution obtained by dissolving the high-molecular weight material in an organic solvent. A coating method represented by the inkjet method or the printing method can be used by utilizing such a nature of a high-molecular weight material. Therefore, it is possible to enhance the material utilization efficiency to near to 100%. In addition, since it can be applied to substrates of various shapes ranging from a small-sized substrate to a large-sized substrate, the production cost of the device can be significantly reduced.

However, in general, the coating method is not suited to a stacked-type device, and has a problem that it is not easy to improve the performance of the device.

The reason for unsuitability of applying the coating method to a stacked-type device is that, when stacking layers, films which have been formed in advance are inevitably dissolved. Specifically, in a stacked-type organic EL device fabricated by the coating method, a hole-injecting layer and a hole-transporting layer have to be insoluble in a solvent used when an emitting layer is formed.

Therefore, at present, most of organic EL devices obtained by the coating method are limited to a two-layer structure in which a hole-injecting layer is formed by a water-dispersion liquid of polythiophene:polystyrene sulfonic acid (PEDOT:PSS), and an emitting layer is formed by using an aromatic organic solvent such as toluene. Since the PEDOT:PSS layer is not dissolved in toluene, it is possible to fabricate such two-layer structure.

Accordingly, this method cannot be applied to a case where a hole-transporting layer is formed on a hole-injecting layer, and an emitting layer is further formed.

As represented by PEDOT/PSS, in many cases, a water-soluble or an alcohol-soluble material is used in a hole-injecting layer. Therefore, a hole-transporting material is formed into a hole-transporting layer and stacking on a hole-injecting layer by using an organic solvent other than a water-based or an alcohol-based organic solvent (e.g. toluene, xylene, dioxane and cyclohexanone).

Here, as the hole-transporting material, use of a heat- or light-cross-linking polymer is proposed (see Patent Document No. 1). However, a light-cross linking material has a problem that it deteriorates by exposure to light, and its hole-transporting property, luminous efficiency and device life are lowered. On the other hand, a heat-cross-linking material has a problem that it shrinks or suffers pinhole generation after the heat-cross-linking.

Further, if shrinkage does not occur after the heat-cross linking, it may be dissolved in a film-forming solvent used for stacking an emitting layer (Patent Document Nos. 2 to 4).

In addition, there is a technology in which a material obtained by bonding a polymerizable substituent to a low-molecular compound is used, and the material is applied, followed by polymerization to lower the solubility in a coating solvent for other layers, whereby a multi-layer structure is formed (see Patent Document 5). However, a low-molecular compound has a tendency that it is likely to be crystallized. Therefore, it has a problem that a high-quality thin film is unlikely to be formed.

As a hole-transporting material which can be used in a coating type multilayer organic EL device, a polymer in which a cross-linking group is introduced into the main chain is disclosed. However, as for these materials, if a cross-linking group unit is included, it becomes a ternary, or a quaternary (in the greatest case) compound, and as a result, it has a significantly complicated structure. Therefore, performance reproducibility may be difficult (Patent Document Nos. 6, 7 and 8). In addition, a material in which a cross-linking group is introduced into its terminal is disclosed. However, due to copolymerization of the same carbazole group as that of a soluble unit, minor adjustment of film-forming properties, adhesiveness, and further, electronic properties or the like by introducing a plurality of substituents becomes difficult. Further, since this material is an oligomer material having a molecular weight of about 2000 to 3000, adverse effects exerted by unreacted cross-linking groups on the lowering of device properties are concerned (Patent Document 9).

RELATED ART DOCUMENTS

Patent Documents

Patent Document 1: JP-A-2006-257196
Patent Document 2: JP-A-2008-63327

Patent Document 3: JP-A-2009-283509
Patent Document 4: JP-A-2011-82052
Patent Document 5: JP-A-2006-279007
Patent Document 6: JP-A-2011-153134
Patent Document 7: JP-A-2008-169367
Patent Document 8: JP-A-2009-196982
Patent Document 9: JP-A-2008-231419

SUMMARY OF THE INVENTION

The invention is aimed at providing a cross-linking polymer which is suited to the formation of a thin film by a coating method and is preferable as a material for electronics.

As a result of extensive studies, the inventors have found that a cross-linking type polymer having a structural unit derived from carbazole or a compound similar to carbazole (P and Q groups mentioned later) can form a high-quality thin film stably and easily, and that, due to a change in solubility by a cross-linking reaction by heat or the like, this material is effective as a material for electronics. The invention has been made based on this finding (First invention).

The inventors have also found that a polymer represented by the formula (C) given later is useful as a material for electronics. The invention has been made also based on this finding (Second invention).

According to the invention, the following polymer or the like are provided.

1. A polymer comprising structural units represented by the following formulas (A) and (B):

$$\text{+}\!\!\text{+}(P)_a\text{—}(L_1)_b\text{+} \quad (A)$$

$$\text{+}\!\!\text{+}(Q)_c\text{—}(L_2)_d\text{+} \quad (B)$$

wherein, in the formula (A), P is a group derived from a compound represented by the following formula (P):

(P)

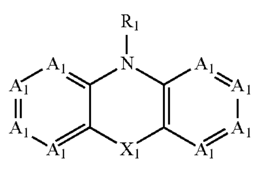

wherein $A_1$s are independently a nitrogen atom or $CR_2$;

$X_1$ is a single bond, O, S, $CR_2R_3$ or $NR_2$;

$R_1$ to $R_3$ are independently a hydrogen atom, a substituted or unsubstituted alkyl group including 1 to 20 carbon atoms, a substituted or unsubstituted cycloalkyl group including 3 to 10 carbon atoms that form a ring (hereinafter referred to as "ring carbon atoms"), a substituted or unsubstituted aryl group including 6 to 30 ring carbon atoms, a substituted or unsubstituted heteroaryl group having 3 to 30 atoms that form a ring (hereinafter referred to as "ring atoms"), a substituted or unsubstituted arylamino group or an arylsilyl group;

a is an integer of 2 to 5, (P)a means that a is the number of Ps and "a"Ps are bonded sequentially, "a"Ps are independent from each other; and the bonding position of Ps is not limited;

$L_1$ is a linkage group;

b is an integer of 0 to 5, and $(L_1)$b means that b is the number of $L_1$s and, when b is 2 or more, "b"$L_1$s are sequentially bonded, and in this case, "b"$L_1$s are independent from each other; and the bonding position of $L_1$s is not limited;

in the formula (A), the bonding position of P and $L_1$ is not limited;

in the formula (B), Q is a group derived form a compound represented by the following formula (Q):

(Q)

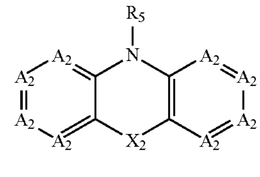

wherein $A_2$s are independently a nitrogen atom or $CR_6$;

$X_2$ is a single bond, O, S, $CR_6R_7$ or $NR_6$ $R_5$ to $R_7$ are independently a hydrogen atom, a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group, an arylsilyl group or a cross-linkable group;

c is an integer of 2 to 5, (Q)c means that c is the number of Qs and "c"Qs are bonded sequentially, "c"Qs are independent from each other and the bonding position of Qs is not limited;

$L_2$ is independently a substituted or unsubstituted alkylene group including 1 to 20 carbon atoms, a substituted or unsubstituted cycloalkylene group including 3 to 10 ring carbon atoms, a substituted or unsubstituted aromatic hydrocarbon ring group including 6 to 30 ring carbon atoms, a substituted or unsubstituted aromatic heterocyclic group including 3 to 30 ring atoms, a substituted or unsubstituted arylamine residue, an arylsilylene group or a cross-linkable group;

d is an integer of 0 to 5, $(L_2)$d means that d is the number of $L_2$s and, when d is 2 or more, "d"$L_2$s are bonded sequentially, and in this case, "d"$L_2$s are independent from each other; and the bonding position of $L_2$s is not limited;

in the formula (B), the bonding position of Q and $L_2$ is not limited; and in the formula (B), of "c"Qs and "d"$L_2$s, at least one includes a cross-linkable group.

2. The polymer according to 1, wherein the P or Q is a substituted or unsubstituted carbazole residue.

3. The polymer according to 2, wherein the bonding position of adjacent carbazole residues in the "a" substituted or unsubstituted carbozole residues being bonded sequentially or the bonding position of adjacent carbazole residues in the "c" substituted or unsubstituted carbazole residues being bonded sequentially are independently one selected from the $3^{rd}$-$3^{rd}$ position, the $3^{rd}$-$2^{nd}$ position and the $2^{nd}$-the $2^{nd}$ position.

4. The polymer according to 2 or 3, which comprises at least one of the following structural unit 1 and the structural unit 2:

Structural unit 1: the bonding position of one substituted or unsubstituted carbazole residue in (P)a and $L_1$ is the $9^{th}$, the $3^{rd}$ or the $2^{nd}$ position of the carbazole residue; and Structural unit 2: the bonding position of one substituted or unsubstituted carbazole residue in (Q)c and $L_2$ is the $9^{th}$, the $3^{rd}$ or the $2^{nd}$ position of the carbazole residue.

5. The polymer according to any of 2 to 4, which comprises at least one of the following structural unit 3 and the structural unit 4:

Structural unit 3: the bonding position of one substituted or unsubstituted carbazole residue in (P)a and $L_2$ is the $9^{th}$, the $3^{rd}$ or the $2^{nd}$ position of the carbazole residue; and Structural unit 4: the bonding position of one substituted or unsubstituted carbazole residue in (Q)c and $L_1$ is the $9^{th}$, the $3^{rd}$ or the $2^{nd}$ position of the carbazole residue.

6. The polymer according to any of 1 to 5, wherein a or c is independently 2 or 3.

7. The polymer according to any of 1 to 6, which is represented by any of the following formulas (1) to (7):

(1)

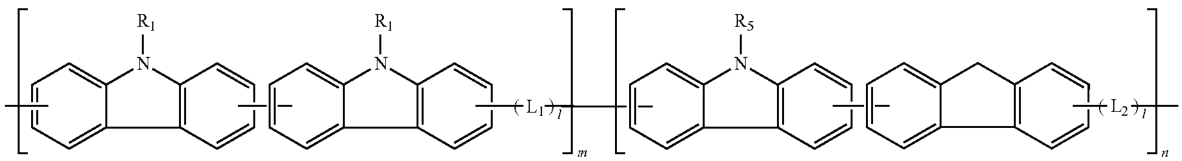

(2)

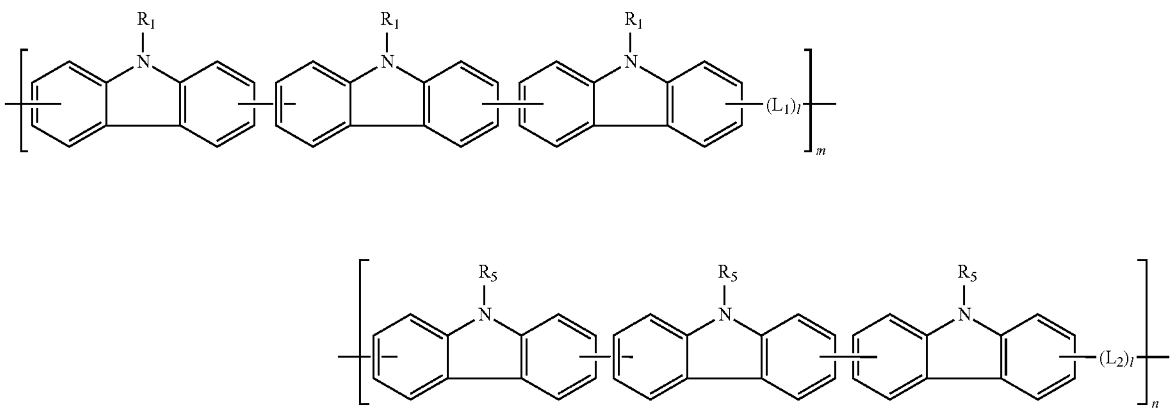

(3)

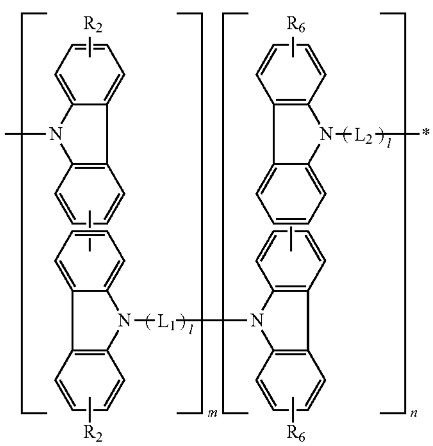

(4)

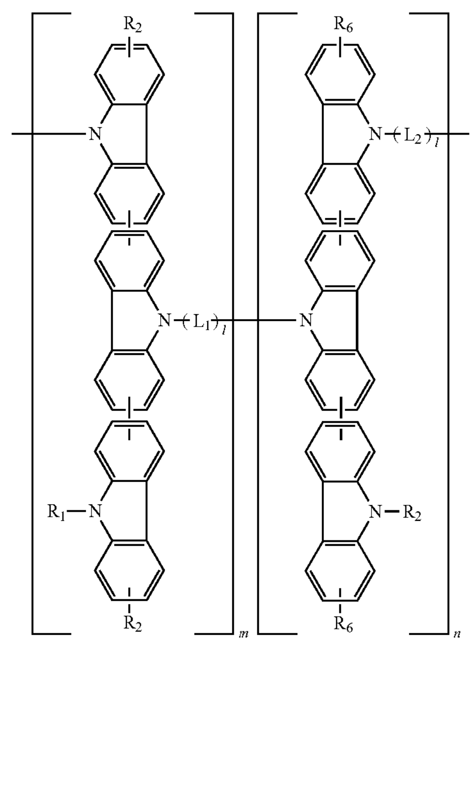

-continued
(5)
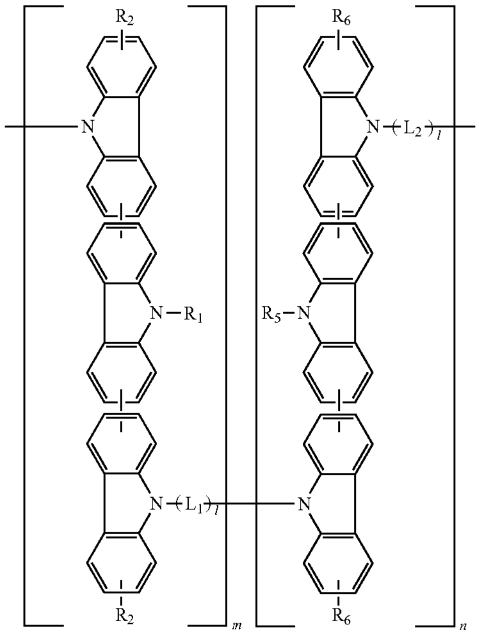
(6)
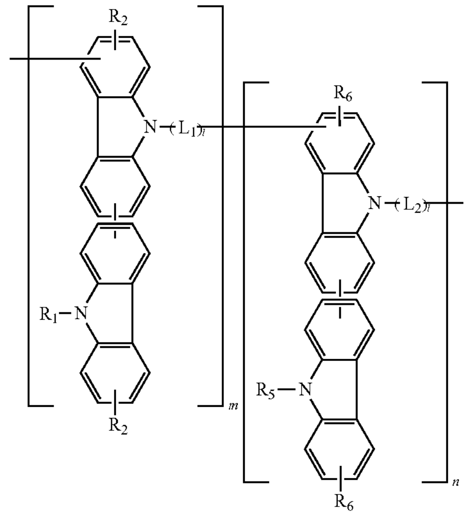
(7)
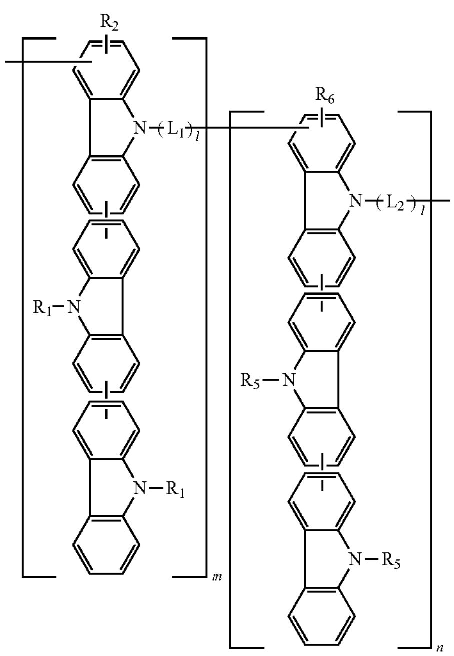
wherein in each formula, $R_1$, $R_2$, $R_5$, $R_6$, $L_1$ and $L_2$ are the same as $R_1$, $R_2$, $R_5$, $R_6$, $L_1$ and $L_2$ in the formulas (A) and (B);
m and n are independently the amount ratio (molar ratio) of each structural unit in the polymer; m is 0.01 to 0.99, n is 0.01 to 0.99 and m+n=1; and
l is 0 or 1.
8. The polymer according to 7 which is represented by any of the following formulas (8) to (25):

(8)
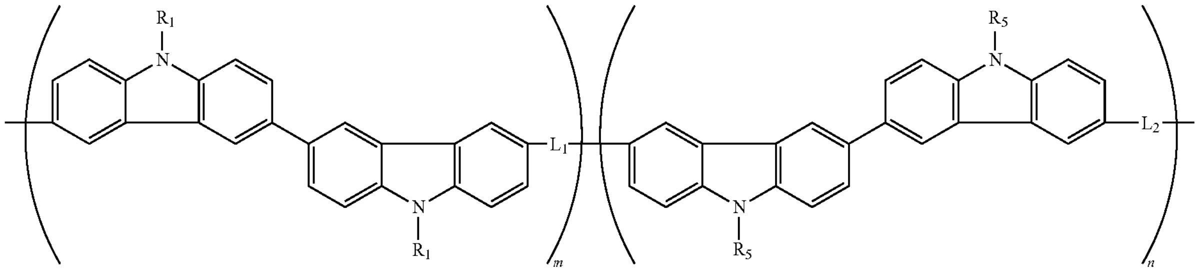
(9)
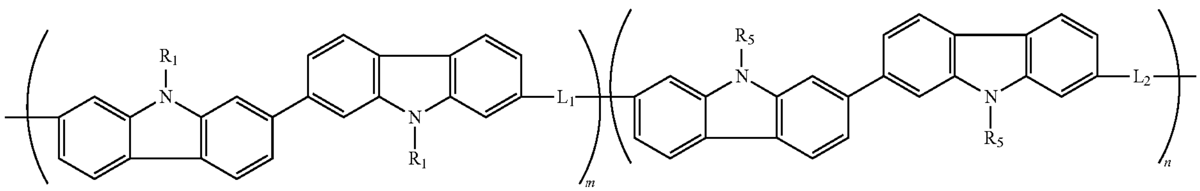
(10)
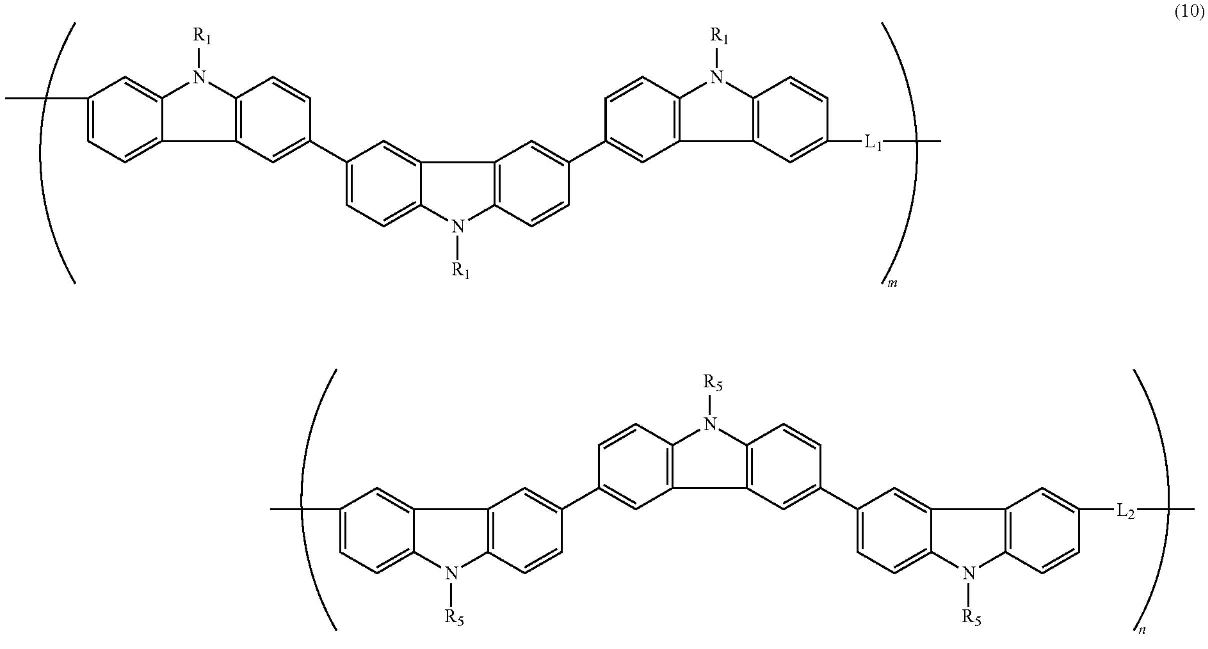
(11)
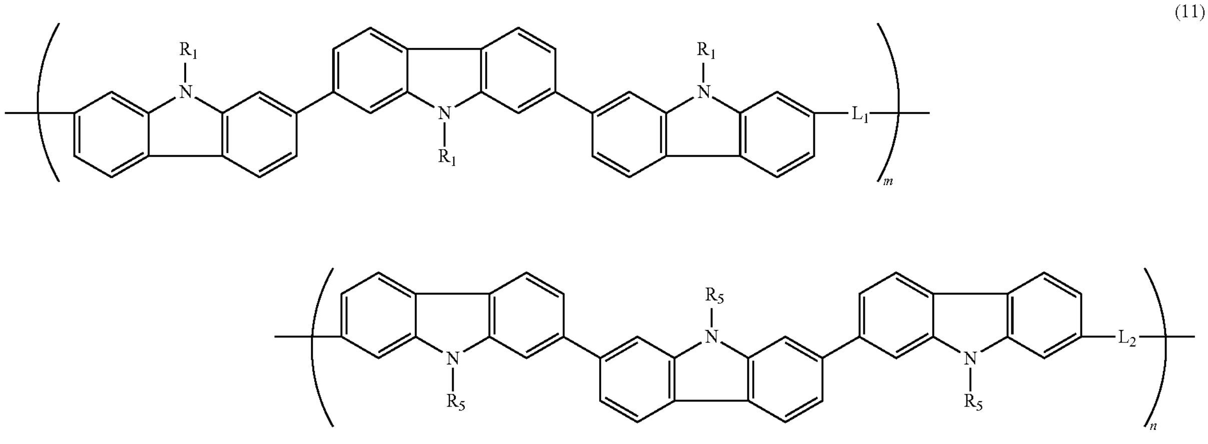

-continued
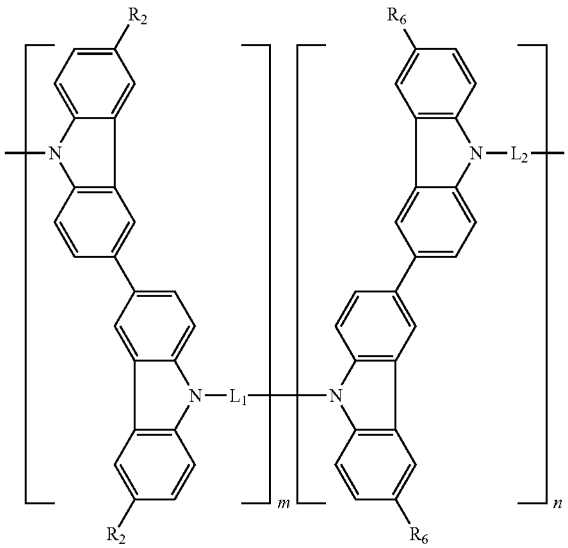
(12)
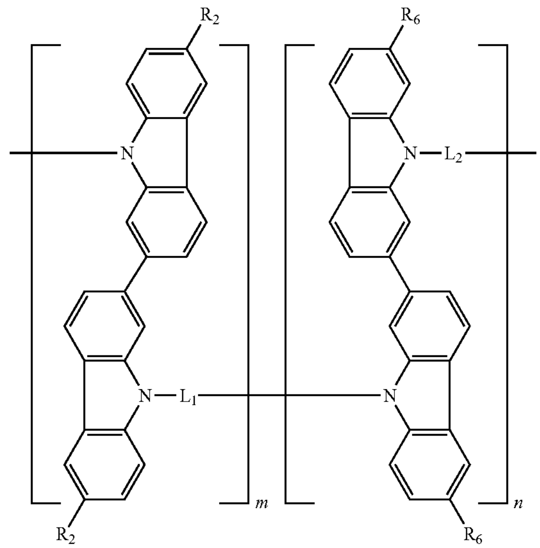
(13)
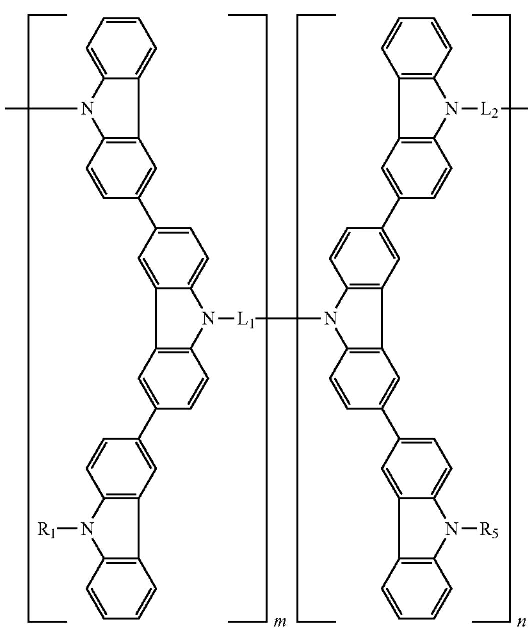
(14)
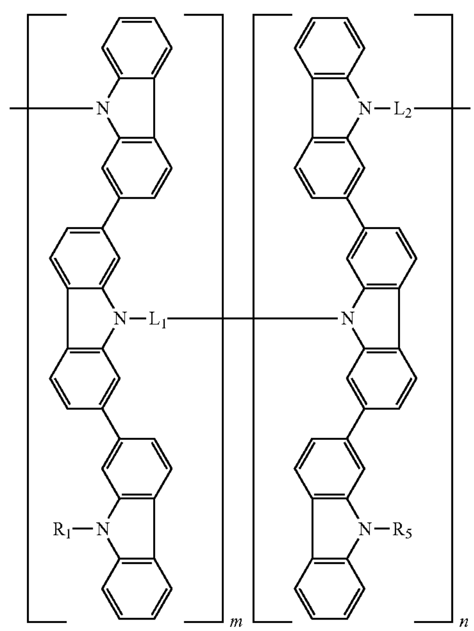
(15)

-continued
(16)
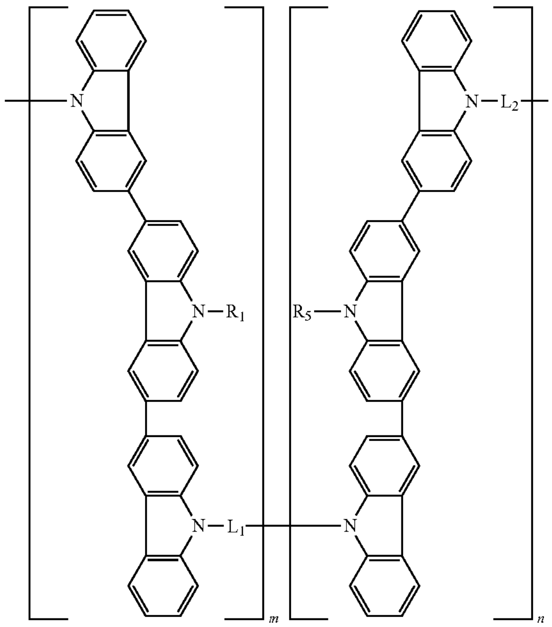
(17)
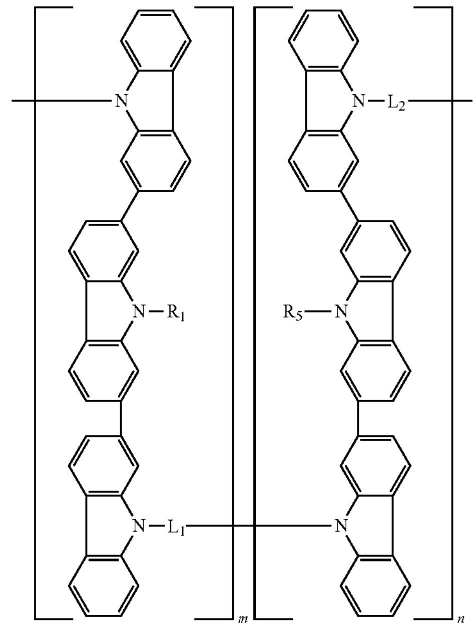
(18)
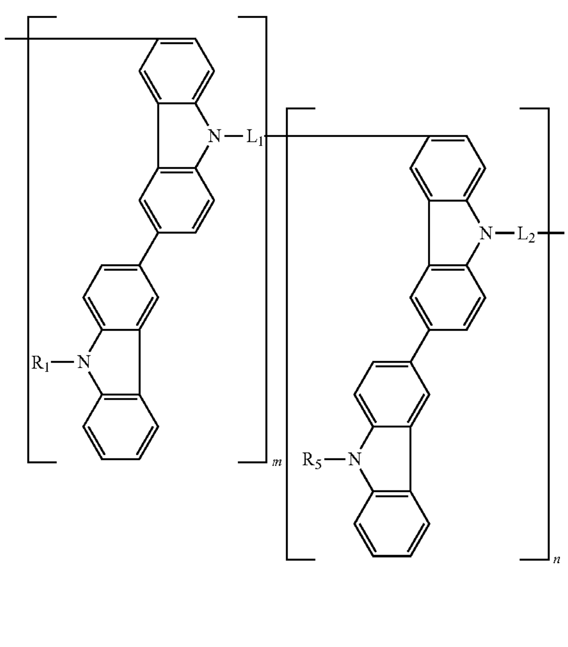
(19)
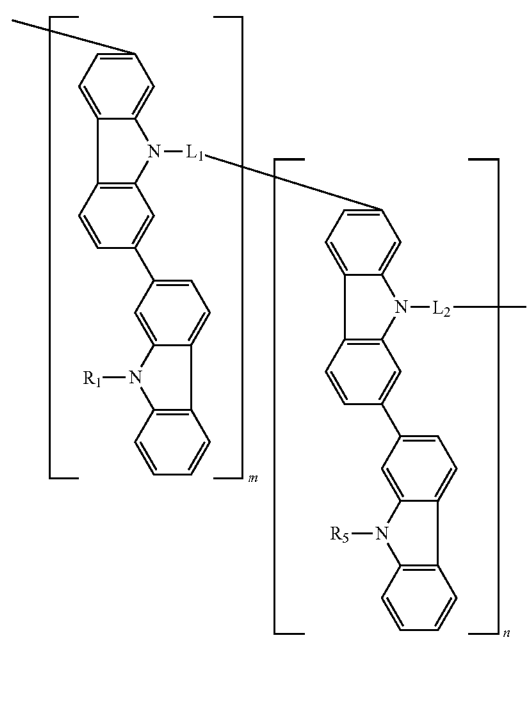

-continued
(20)
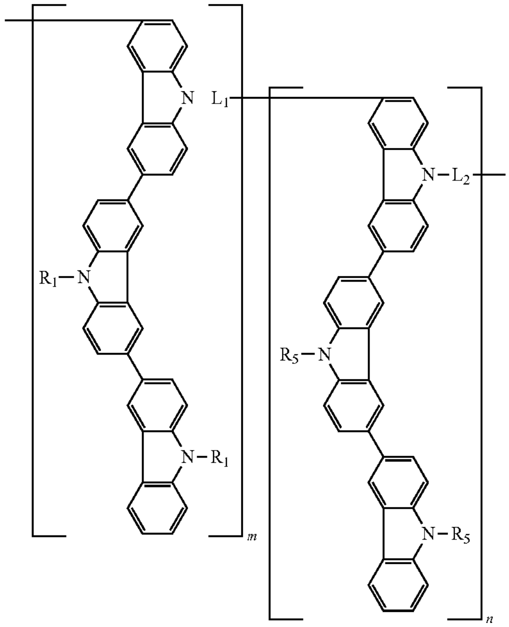
(21)
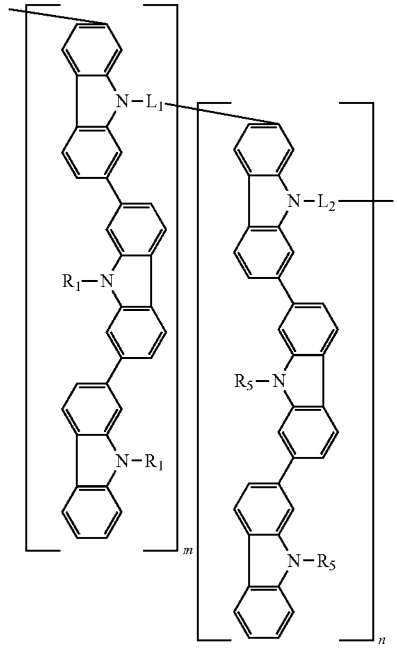
(22)
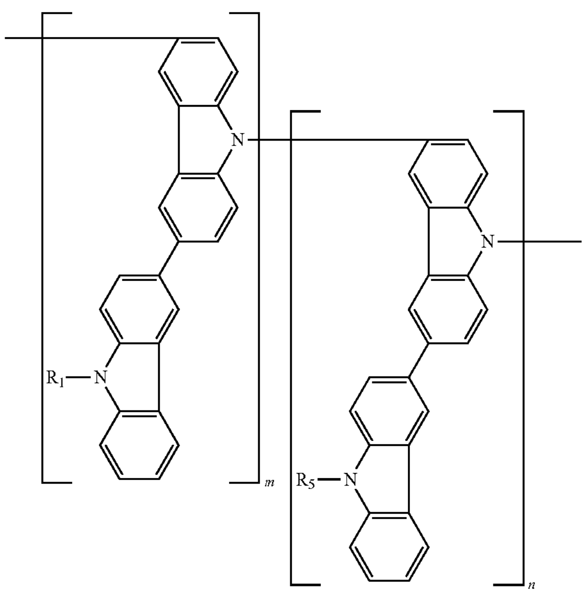
(23)
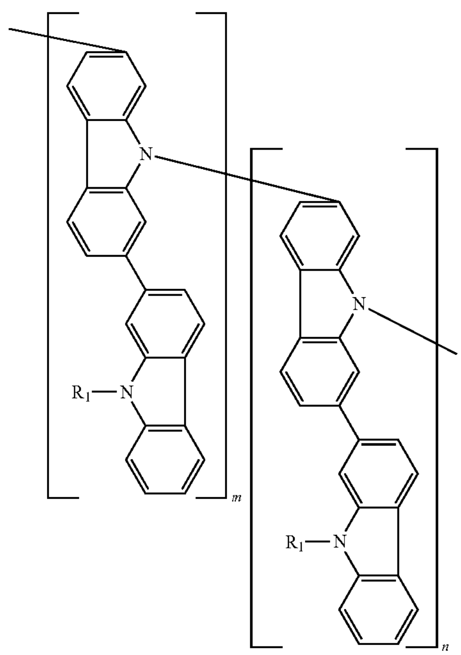

-continued (24)

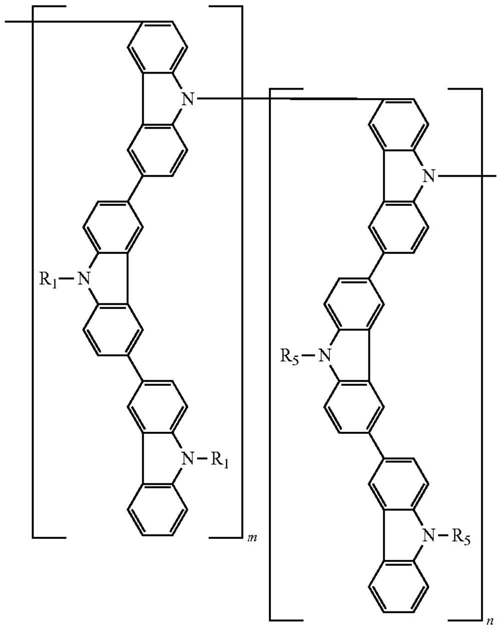

(25)

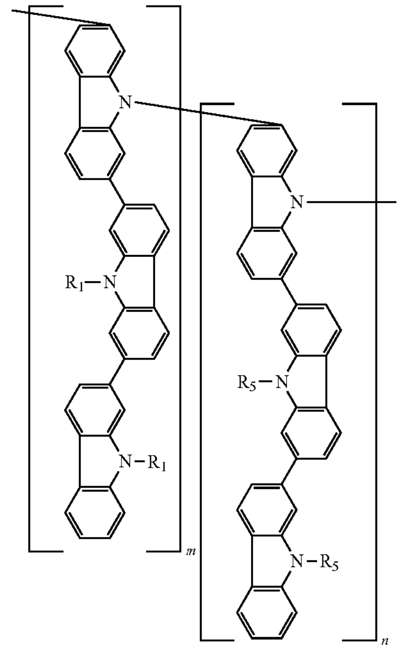

wherein in each formula, $R_1$, $R_2$, $R_5$, $R_6$, $L_1$ and $L_2$ are the same as $R_1$, $R_2$, $R_5$, $R_6$, $L_1$ and $L_2$ in the formulas (A) and (B);

m and n are independently the amount ratio (molar ratio) of each structural unit in the polymer; m is 0.01 to 0.99, n is 0.01 to 0.99 and m+n=1.

9. The polymer according to 7 or 8, wherein, in each of polymers represented by the formulas (1) to (25), at least one of $R_5$s or at least one of $R_6$s is a cross-linkable group and $L_2$ is not a cross-linkable group.

10. The polymer according to any of 1 to 9, wherein the cross-linkable group is a group selected from groups represented by the following formulas (31) to (42):

(31)

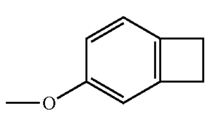

(32)

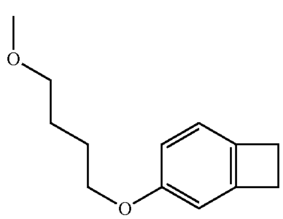

(33)

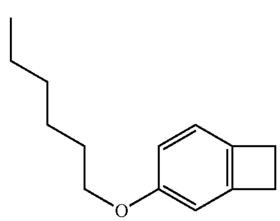

-continued (34)

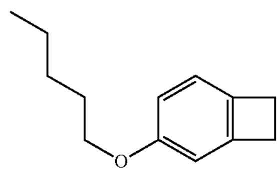

(35)

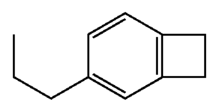

(36)

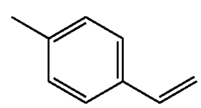

(37)

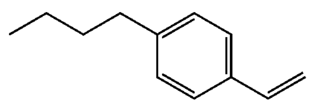

(38)

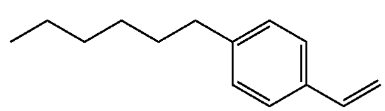

(39)

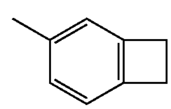

(40)

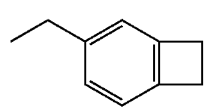

-continued (41)

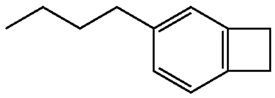

(42)

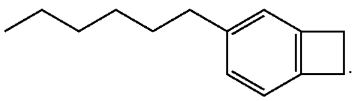

11. The polymer according to 7 or 8, wherein, in each of polymers represented by the formulas (1) to (21), at least one of $L_2$s is a cross-linkable group, and $R_5$ and $R_6$ are not cross-linkable groups.

12. The polymer according to 11, wherein the $L_2$ as the cross-linkable group is a group selected from groups represented by the following formulas (43) to (46):

(43)

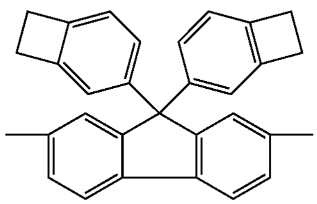

(44)

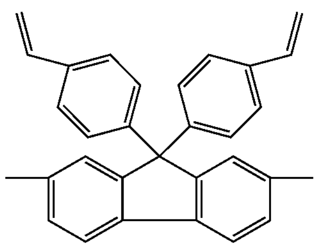

(45)

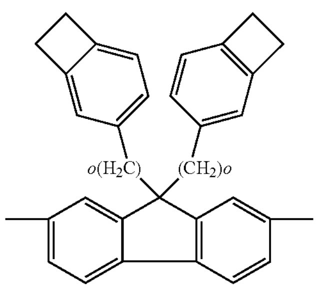

(46)

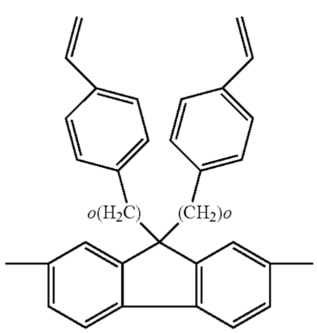

wherein in the formulas (45) and (46), o is an integer of 1 to 10.

13. The polymer according to any of 7 to 12, wherein, in each of polymers represented by the formulas (1) to (25), at least one of $R_1$, $R_2$, $R_5$ and $R_6$ is a group selected from the groups represented by the following formulas (51) to (55):

(51)

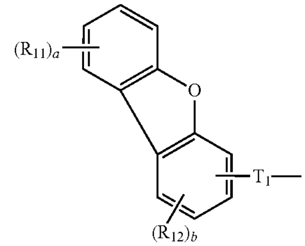

(52)

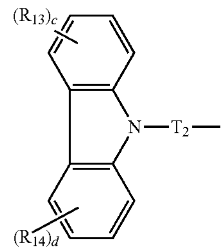

(53)

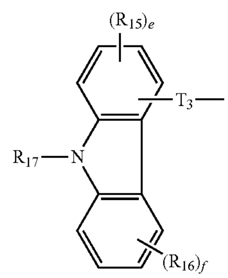

(54)

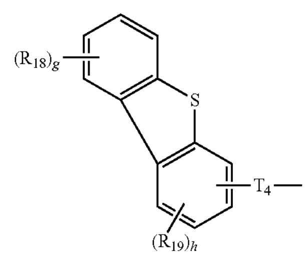

(55)

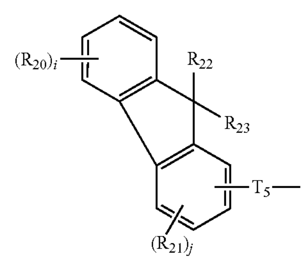

wherein $R_{11}$ to $R_{23}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted alkoxy group including 1 to 20 carbon atoms, a substituted or unsubstituted cycloalkoxy group including 3 to 10 ring carbon atoms, a substituted or unsubstituted aryloxy group including 6 to 30 ring carbon atoms, a substituted or unsubstituted aralkyl group including 7 to 40 carbon atoms, a substituted or unsubstituted heteroaryl group including 3 to 30 ring atoms, a substituted amino group, a substituted silyl group, a halogen atom, a nitro group, a cyano group or a hydroxyl group;

a, c, d, f, g and i are independently an integer of 0 to 4;

b, e, h and j are independently an integer of 0 to 3; and $T_1$ to $T_5$ are independently a single bond, a substituted or unsubstituted aromatic hydrocarbon ring group including 6 to 50 ring carbon atoms or an aromatic heterocyclic group including 3 to 30 ring atoms.

14. A polymer represented by the following formula (C):

$$Y_1 \leftarrow\!\!\left( (P')_a — (L)_b \right)_m\!\!\rightarrow Y_2 \quad (C)$$

wherein P' is a group derived from a compound represented by the following formula (P');

L is a linkage group;

a is an integer of 2 to 5, (P')a means that a is the number of P's and "a"P's are bonded sequentially, "a"P's are independent from each other; and the bonding position of P's is not limited;

b is an integer of 0 to 5, (L)b means that b is the number of Ls, when b is 2 or more, "b"Ls are bonded sequentially, and in this case, "b"Ls are independent from each other; and the bonding position of Ls is not limited;

when b is 0, L is a single bond;

in the formula (C), the bonding position of P' and L is not limited;

m is a repeating unit;

$Y_1$ and $Y_2$ are independently a cross-linkable group;

(P')

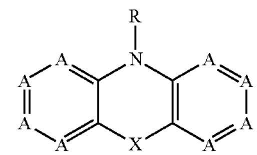

wherein As are independently a nitrogen atom or —C(R)—;

X is a single bond, —O—, —S—, $—C(R)_2—$ or —N(R)—;

R is independently a hydrogen atom, a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group or a substituted or unsubstituted arylsily group.

15. The polymer according to 14 wherein P' is a substituted or unsubstituted carbazole residue.

16. The polymer according to 14 or 15, wherein (P')a is "a"substituted or unsubstituted carbazole residues being bonded sequentially, and adjacent carbozole residues are bonded with each other at the $3^{rd}$-$3^{rd}$ position, the $3^{rd}$-$2^{nd}$ position or the $2^{nd}$-the $2^{nd}$ position.

17. The polymer according to any of 14 to 16, wherein (P')a is "a"substituted or unsubstituted carbazole residues being bonded sequentially, a carbazole residue is bonded with L at the $9^{th}$ position, the $3^{rd}$ position or the $2^{nd}$ position of the carbazole residue.

18. The polymer according to any of 14 to 17, wherein a is 2 or 3.

19. The polymer according to any of 14 to 18, which is represented by any of the following formulas (101) to (107):

(101)

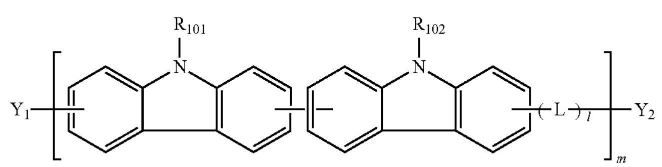

(102)

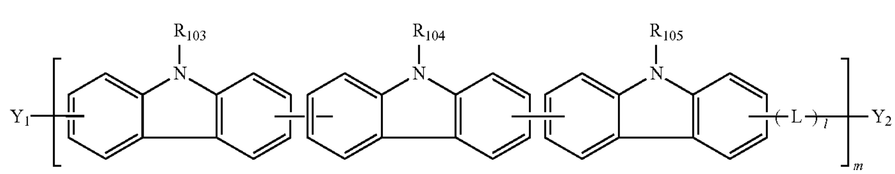

-continued
(103)
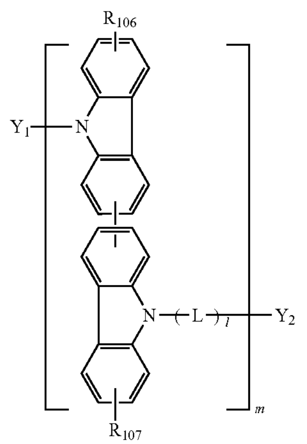
(104)
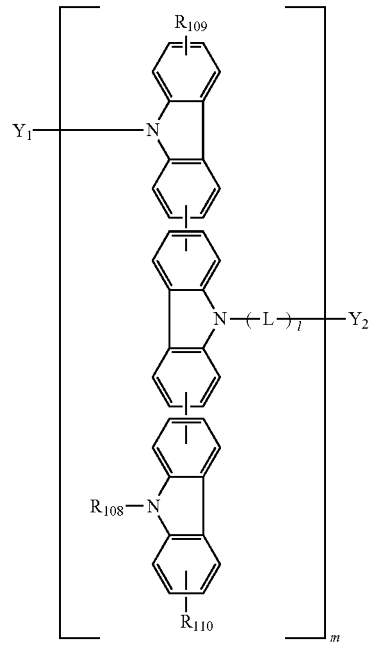
(105)
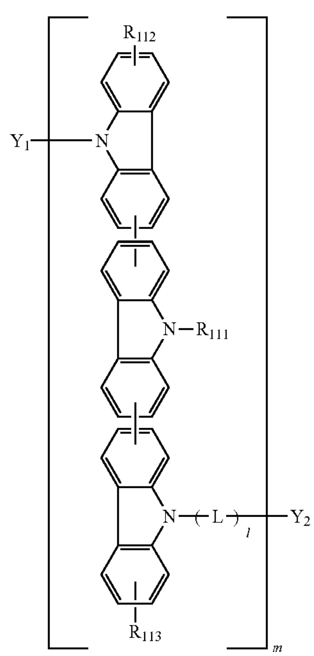
(106)
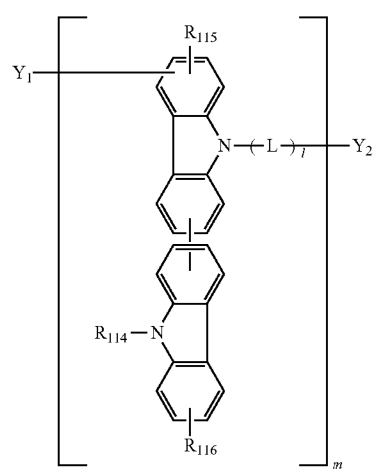

-continued (107)

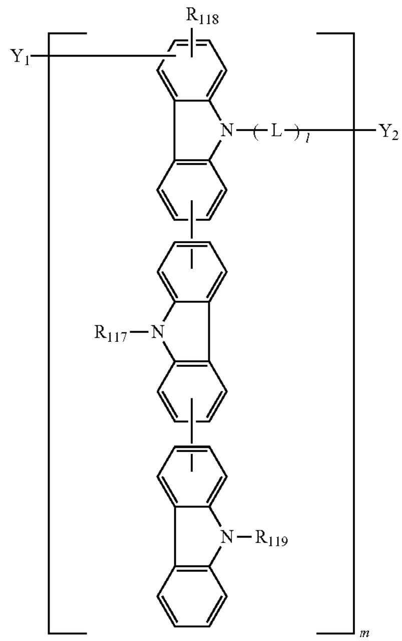

wherein $R_{101}$ to $R_{119}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group or a substituted or unsubstituted arylsilyl group;

l is an integer of 0 or 1; and $Y_1$, $Y_2$, L and m are as defined in the formula (C).

20. The polymer according to 19, wherein, in the formulas (101) to (107), at least one of $R_{101}$ and $R_{102}$, at least one of $R_{103}$ to $R_{105}$, at least one of $R_{106}$ and $R_{107}$, at least one of $R_{108}$ to $R_{110}$, at least one of $R_{111}$ to $R_{113}$, at least one of $R_{114}$ to $R_{116}$ and at least one of $R_{117}$ to $R_{119}$ are a group selected from the groups represented by the following formulas (51) to (55):

(51)

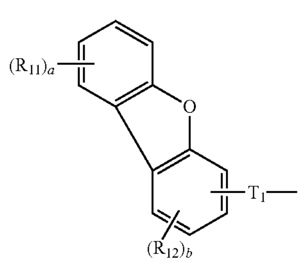

-continued (52)

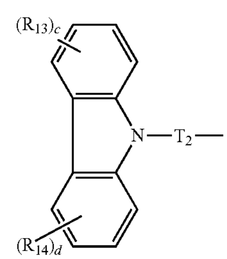

(53)

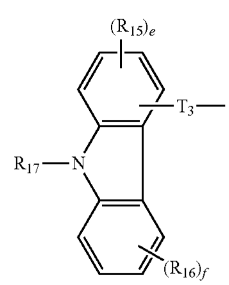

(54)

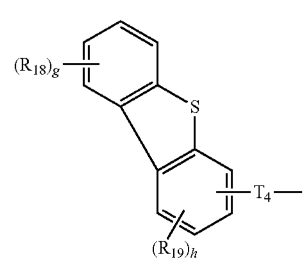

-continued (55)

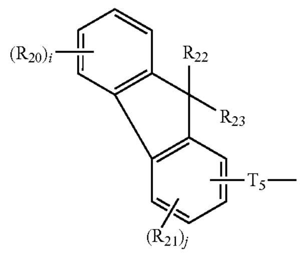

wherein $R_{11}$ to $R_{23}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted alkoxy group including 1 to 20 carbon atoms, a substituted or unsubstituted cycloalkoxy group including 3 to 10 ring carbon atoms, a substituted or unsubstituted aryloxy group including 6 to 30 ring carbon atoms, a substituted or unsubstituted aralkyl group including 7 to 40 carbon atoms, a substituted or unsubstituted heteroaryl group including 3 to 30 ring atoms, a substituted amino group, a substituted silyl group, a halogen atom, a nitro group, a cyano group or a hydroxyl group;

a, c, d, f, g and i are independently an integer of 0 to 4;

b, e, h and j are independently an integer of 0 to 3; and $T_1$ to $T_5$ are independently a single bond, a substituted or unsubstituted aromatic hydrocarbon ring group including 6 to 50 ring carbon atoms or an aromatic heterocyclic group including 3 to 30 ring atoms.

21. The polymer according to any of 14 to 20, wherein $Y_1$ and $Y_2$ are independently a group selected from the groups represented by the following formulas (31) to (42):

(31)

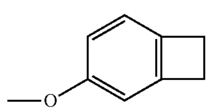

(32)

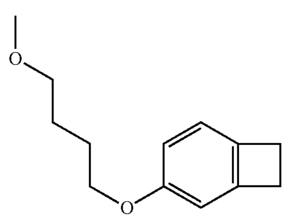

(33)

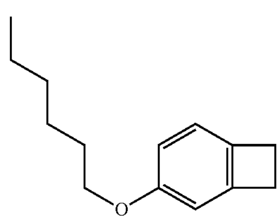

(34)

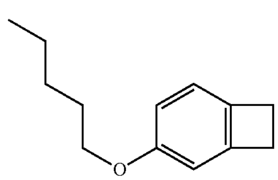

-continued (35)

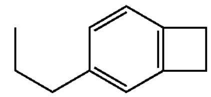

(36)

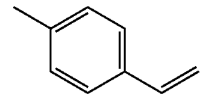

(37)

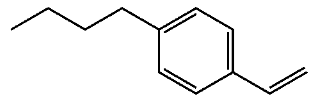

(38)

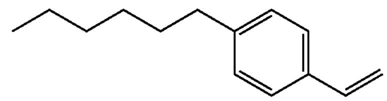

(39)

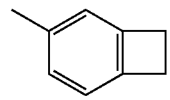

(40)

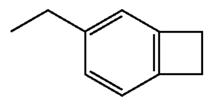

(41)

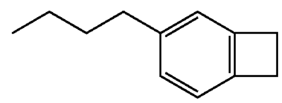

(42)

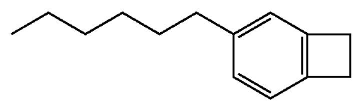

22. An applying liquid comprising the polymer according to any of 1 to 21 and a solvent.

23. The applying liquid according to 22, wherein at least one of the solvents is an organic solvent.

24. A method for producing an electronic device, wherein wet film formation is conducted by using the applying liquid according to 22 or 23.

25. The method for producing an electronic device according to 24, wherein the electronic device is an electroluminescence device, a photoelectronic conversion device or a transistor.

26. The method for producing an electronic device according to 24 or 25, wherein the electronic device is an organic electroluminescence device.

27. An organic electroluminescence device comprising:

an anode and a cathode;

one or more organic thin film layers including an emitting layer between the anode and the cathode; and at least one of the organic thin film layers comprising the polymer according to any of 1 to 21.

28. The organic electroluminescence device according to 27, wherein at least one of the organic thin film layers is a hole-injecting layer or a hole-transporting layer.

29. The organic electroluminescence device according to 28, wherein the hole-injecting layer or the hole-transporting layer is in contact with the emitting layer.

30. The organic electroluminescence device according to any of 27 to 29 wherein the emitting layer is formed by a wet film formation method.

According to the invention, it is possible to provide a cross-linking polymer suited to formation of a thin film by a coating method and is preferable as a material for electronics.

MODE FOR CARRYING OUT THE INVENTION

First Invention

The polymer according to the first invention of the present application has structural units represented by the following formulas (A) and (B):

$$-\!\!\left[\!\left(P\right)_a-\left(L_1\right)_b\right]\!\!- \qquad (A)$$

$$-\!\!\left[\!\left(Q\right)_c-\left(L_2\right)_d\right]\!\!- \qquad (B)$$

In the formulas (A) and (B), P and Q are groups derived from carbazole or a compound similar to carbazole. $L_1$ and $L_2$ are linkage groups. The structural unit represented by the formula (A) does not have a cross-linkable group. The structural unit represented by the formula (B) has one or more cross-linkable groups. In the polymer of the invention, due to the presence of structural units represented by the formulas (A) and (B), the surface flatness of a film obtained by cross linking after the film formation becomes high.

Further, resistance to an organic solvent used in the coating can be increased.

In the formula (A), P is a group derived from a compound represented by the following formula (P):

(P)

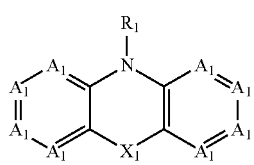

In the formula (P), $A_1$s are independently a nitrogen atom or $CR_2$.

$X_1$ is a single bond, O, S, $CR_2R_3$ or $NR_2$.

$R_1$ to $R_3$ are independently a hydrogen atom, a substituted or unsubstituted alkyl group having 1 to 20 carbon atoms, a substituted or unsubstituted cycloalkyl group having 3 to 10 carbon atoms that form a ring (hereinafter referred to as the "ring carbon atoms"), a substituted or unsubstituted aryl group having 6 to 30 ring carbon atoms, a substituted or unsubstituted heteroaryl group having 3 to 30 atoms that form a ring (hereinafter referred to as the "ring atoms") or a substituted or unsubstituted arylamino group.

At least one of $R_1$ to $R_3$ in the formula (P) is a single bond which bonds to other groups such as P or $L_1$.

a is an integer of 2 to 5, with 2 or 3 being preferable. (P)a means that "a"Ps are bonded sequentially. "a"Ps are independent from each other, and no specific restrictions are imposed on the bonding position of Ps.

$L_1$ is a linkage group. Preferably, $L_1$s are independently a substituted or unsubstituted alkylene group having 1 to 20 carbon atoms, a substituted or unsubstituted cycloalkylene group having 3 to 10 ring carbon atoms, a substituted or unsubstituted aromatic hydrocarbon ring group having 6 to 30 ring carbon atoms, a substituted or unsubstituted aromatic heterocyclic group having 3 to 30 ring atoms, a substituted or unsubstituted arylamine residue or an arylsilylene group. Alternatively, $L_1$ is a group obtained by bonding two or more of these groups. In this case, the groups may be the same or different.

b is an integer of 0 to 5. $(L_1)$b means that, when b is 2 or more, "b"$L_1$s are bonded sequentially. In this case, "b"$L_1$s are independent from each other. No specific restrictions are imposed on the bonding position of $L_1$s.

In the formula (A), the position at which P and $L_1$ are bonded is not limited.

In the formula (B), Q is a group derived from a compound represented by the following formula (Q):

(Q)

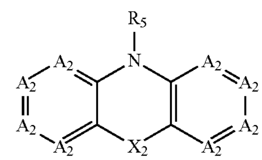

In the formula, $A_2$s are independently a nitrogen atom or $CR_6$.

$X_2$ is a single bond, O, S, $CR_6R_7$ or $NR_6$.

$R_5$ to $R_7$ are independently a group similar to the $R_1$ to $R_3$ mentioned above or a cross-linkable group.

c is an integer of 2 to 5, with 2 or 3 being preferable. (Q)c means that "c"Qs are bonded sequentially. "c"Qs are independent from each other, and no specific restrictions are imposed on the bonding position of Qs.

$L_2$ are independently a group similar to $L_1$ mentioned above or a cross-linkable group.

d is an integer of 0 to 5, and $(L_2)$d means that, when d is 2 or more, "d"$L_2$s are bonded sequentially. In this case, "d"$L_2$s are independent from each other, and no specific restrictions are imposed on the bonding position of $L_2$s.

In the formula (B), the bonding position of Q and $L_2$ is not restricted.

In the formula (B), at least one of "c"Qs and "d"$L_2$s has a cross-linkable group.

It suffices that the polymer of the invention have the above-mentioned structural units (A) and (B). In a range which does not impair the advantageous effects of the invention, it may contain other structural units, for example, a structural unit derived from α-olefin.

It is preferred that the polymer of the invention be a polymer in which the structural units (A) and (B) are alternately bonded. An example in which the structural units (A) and (B) are alternately bonded (AB) is shown below. The following example corresponds to -ABAB-.

$$-(P)_a-(L_1)_b-(Q)_c-(L_2)_d-(P)_a-(L_1)_b-(Q)_c-(L_2)_d- \qquad (AB)$$

In the invention, it is preferred that P or Q mentioned above be a substituted or unsubstituted carbazole residue.

In "a" substituted or unsubstituted carbazole residues which are bonded sequentially, the bonding position of adjacent carbazole residues, or in "c" substituted or unsubstituted carbazole residues which are bonded sequentially, the bonding position of adjacent carbazole residues are preferably one selected from the 3rd position-the 3rd position, the 3rd position-2nd position or the 2nd position-2nd position, respectively. As examples, the bonding form of two Ps is shown below.

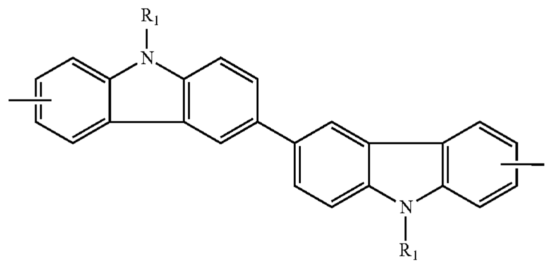

[3rd - 3'rd position]

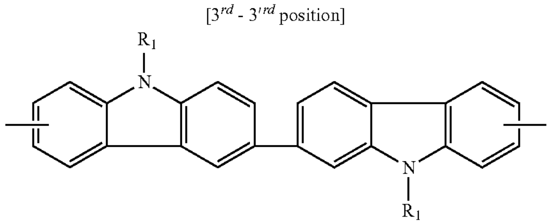

[3rd - 2'nd position]

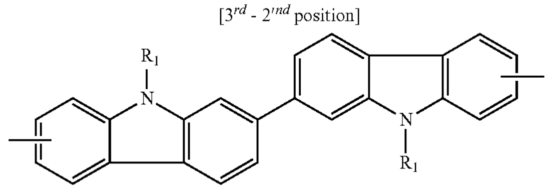

[2nd - 2'nd position]

It is preferred that at least one of the following structure 1 and the following structure 2 be contained Structure 1: The bonding position of one substituted or unsubstituted carbazole residue in (P)a and $L_1$ is the 9th, 3rd or the 2nd position of the carbazole residue.

Structure 2: The bonding position of one substituted or unsubstituted carbazole residue in (Q)c and $L_2$ is the 9th, 3rd or the 2nd position of the carbazole residue.

Further, it is preferred that at least one of the following structure 3 and the following structure 4 be contained.

Structure 3: The bonding position of one substituted or unsubstituted carbazole residue in (P)a and $L_2$ is the 9th, 3rd or the 2nd position of the carbazole residue.

Structure 4: The bonding position of one substituted or unsubstituted carbazole residue in (Q)c and $L_1$ is the 9th, 3rd or the 2nd position of the carbazole residue.

As examples, the bonding position of a carbazole residue and $L_1$ is shown below.

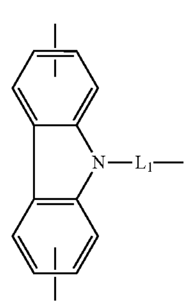

[$L_1$ is bonded to the 9th position of P]

-continued

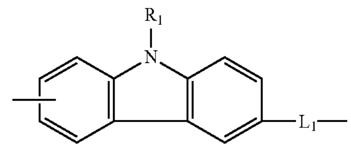

[$L_1$ is bonded to the 3rd position of P]

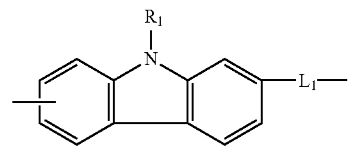

[$L_1$ is bonded to the 2nd position of P]

Further, it is preferred that at least one of $R_1$ to $R_3$ as mentioned above and at least one of $R_5$ to $R_7$ be a group selected from the groups represented by the following formulas (51) to (55).

(51)

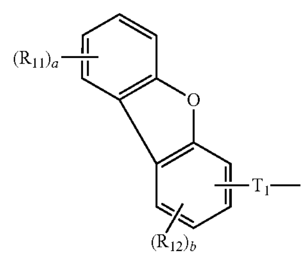

(52)

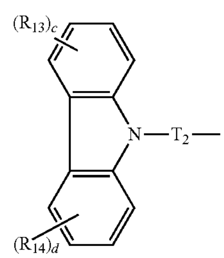

(53)

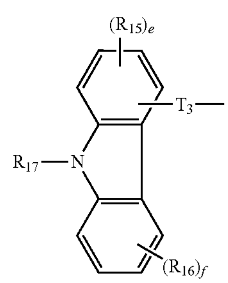

(54)

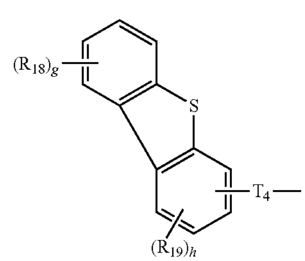

-continued (55)

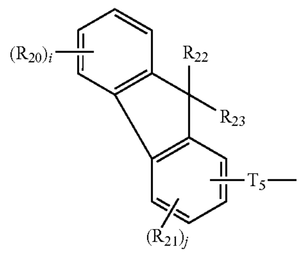

In the formula, $R_{11}$ to $R_{23}$ are independently a substituted or unsubstituted alkyl group having 1 to 20 carbon atoms, a substituted or unsubstituted cycloalkyl group having 3 to 10 ring carbon atoms, a substituted or unsubstituted aryl group having 6 to 30 ring carbon atoms, a substituted or unsubstituted alkoxy group having 1 to 20 carbon atoms, a substituted or unsubstituted cycloalkoxy group having 3 to 10 ring carbon atoms, a substituted or unsubstituted aryloxy group having 6 to 30 ring carbon atoms, a substituted or unsubstituted aralkyl group having 7 to 40 carbon atoms, a substituted or unsubstituted heteroaryl group having 3 to 30 ring atoms, a substituted amino group, a substituted silyl group, a halogen atom, a nitro group, a cyano group or a hydroxyl group.

a, c, d, f, g and i are independently an integer of 0 to 4.

b, e, h and j are independently an integer of 0 to 3.

$R_{17}$ is preferably a substituted or unsubstituted alkyl group having 1 to 20 carbon atoms, a substituted or unsubstituted cycloalkyl group having 3 to 10 ring carbon atoms, a substituted or unsubstituted aryl group having 6 to 30 ring carbon atoms or a substituted or unsubstituted heteroaryl group having 3 to 30 ring atoms.

$T_1$ to $T_5$ are independently a single bond, a substituted or unsubstituted aromatic hydrocarbon ring group having 6 to 50 ring carbon atoms or an aromatic heterocyclic group having 3 to 30 ring atoms.

Hereinbelow, an explanation will be given on each of the above-mentioned groups.

The “hydrogen atom” in this application includes detrium and tritium. The “ring carbon atom” means carbon atoms that constitute a saturated ring, an unsaturated ring or an aromatic ring, and the “ring atom” means carbon atoms and hetero atoms that constitute a hetero ring (including a saturated ring, an unsaturated ring and an aromatic ring).

As the substituted or unsubstituted alkyl group having 1 to 20 carbon atoms, a methyl group, an ethyl group, a propyl group, an isopropyl group, an n-butyl group, an isobutyl group, a sec-butyl group, a tert-butyl group, an n-pentyl group, an n-hexyl group, an n-heptyl group, an n-octyl group, an n-nonyl group, an n-decanyl group, an n-undecanyl group, an n-dodecanyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group or the like can be given. Of these, a methyl group, an ethyl group, a propyl group, an isopropyl group, an n-butyl group, an isobutyl group, a sec-butyl group, a tert-butyl group, an n-pentyl group, an n-hexyl group, an n-heptyl group, an n-octyl group and an n-nonyl group are preferable.

As the alkylene group of $L_1$ and $L_2$ (alkane residue), residues corresponding to the above-mentioned alkyl group can be given.

As the substituted or unsubstituted cycloalkyl group having 3 to 10 ring carbon atoms, a cyclopropyl group, a cyclobutyl group, a cyclopentyl group, a cyclohexyl group, a cyclopentylmethyl group, a cyclohexylmethyl group, a cyclohexyethyl group, a 4-fluorocyclohexyl group, a 1-adamantyl group, a 2-adamantyl group, a 1-norbonyl group, a 2-norbornyl group or the like can be given. Of these, a cyclopentyl group and a cyclohexyl group are preferable.

As the cycloalkylene group of $L_1$ and $L_2$ (cycloalkane residue), residues corresponding to the above-mentioned cycloalkyl group can be given.

As the substituted or unsubstituted aryl group (monovalent aromatic hydrocarbon group) having 6 to 50 (preferably 6 to 30) ring carbon atoms, a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a biphenyl-2-yl group, a biphenyl-3-yl group, a biphenyl-4-yl group, a p-terphenyl-4-yl group, a p-terphenyl-3-yl group, a p-terphenyl-2-yl group, an m-terphenyl-4-yl group, a m-terphenyl-3-yl group, an m-terphenyl-2-yl group, a o-tolyl group, a m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenyl-4-yl group, a 4"-t-butyl-p-terphenyl-4-yl group, a fluorene-1-yl group, a fluorene-2-yl group, a fluorene-3-yl group, a fluorene-4-yl group or the like can be given.

Of these, a phenyl group, a 1-naphthyl group, a 2-naphthyl group, a 1-anthryl group, a 2-anthryl group, a 9-anthryl group, a biphenyl-2-yl group, a biphenyl-3-yl group, a biphenyl-4-yl group, a p-terphenyl-4-yl group, a p-terphenyl-3-yl group, a p-terphenyl-2-yl group, an o-tolyl group, an m-tolyl group, a p-tolyl group, a fluorene-2-yl group, and a fluorene-3-yl group are preferable. A phenyl group, a 1-naphthyl group, a 2-naphthyl group, an m-tolyl group, a p-tolyl group, a fluorene-2-yl group, and a fluorene-3-yl group are more preferable.

As a divalent of larger group of the aromatic hydrocarbon ring group, a group obtained by removing a hydrogen atom from the above-mentioned aryl group can be mentioned.

As the substituted or unsubstituted heteroaryl group (monovalent aromatic heterocyclic group) having 3 to 30 ring atoms, a 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-dibenzofuranyl group, 4-benzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiadinyl group, 2-phenothiadinyl group, 3-phenothiadinyl group, 4-phenothiadinyl group, 10-phenothiadinyl group, 1-phenoxadinyl group, 2-phenoxadinyl group, 3-phenoxadinyl group, 4-phenoxadinyl group, 10-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group, 2-thienyl group, 3-thienyl group, 2-benzothiphenyl group, 3-thiophenyl group, 4-thiophenyl group, 5-thiophenyl group, 6-thiophenyl group, 7-thiophenyl group, 1-isothiophenyl group, 3-isothiophenyl group, 4-isothiophenyl group, 5-isothiophenyl group, 6-isothiophenyl group, 7-isothiophenyl group, 2-dibenzothiophenyl group, 4-dibenzothiophenyl group or the like can be given.

A 1-pyrrolyl group, a 2-pyrrolyl group, a 3-pyrrolyl group, a 1-carbazolyl group, a 2-carbazolyl group, a 3-carbazolyl group, a 4-carbazolyl group, a 9-carbazolyl group, a 2-dibenzofuranyl group, a 4-dibenzofranyl group, a 2-dibenzothiophenyl group, and a 4-dibenzothiophenyl group are preferable.

As a divalent or larger group of the aromatic heterocyclic group, a group obtained by removing a hydrogen atom from the above-mentioned heteroaryl group can be given.

As the substituted amino group, a substituted or unsubstituted mono- or dialkylamino group or a substituted or unsubstituted mono- or diarylamino group can be given.

As the alkylamino group or the dialkylamino group, one of which the alkyl part is the above-mentioned alkyl group can be given.

As the arylamino group, a diarylamino group and an alkylarylamino group can be given. As examples of the alkyl group and the aryl group bonding to the nitrogen atom, the aryl group and the alkyl group mentioned above can be given.

As the arylamine residue of $L_1$ and $L_2$, a triarylamine residue and an alkylarylamine residue can be given. As examples of the alkyl group and the aryl group bonding to the nitrogen atom, the aryl group and the alkyl group mentioned above can be given.

As the substituted silyl group, a silyl group substituted by an alkyl group and/or an aryl group can be given. As examples of the alkyl group and the aryl group bonding to the silicon atom, the aryl group and the alkyl group mentioned above can be given. The alkyl groups substituting the silyl group may be the same or different. Similarly, the aryl groups substituting the silyl group may be the same or different.

Specifically, as the trialkylsilyl group, a trimethylsilyl group, a vinyldimethylsilyl group, a triethylsilyl group, a tripropylsilyl group, a propyldimethylsilyl group, a tributylsilyl group, a t-butyldimethylsilyl group, a tripentylsilyl group, a triheptylsilyl group, a trihexylsilyl group or the like can be given. A trimethylsilyl group and a triethylsilyl group are preferable.

As the arylsilyl group, an alkylarylsilyl group or a triarylsilyl group can be given. As the triarylsilyl group, a triphenylsilyl group, a trinaphthylsilyl group or the like can be given. Of these, a triphenylsilyl group is preferable. As the alkylarylsilyl group, a dimethylphenylsilyl group, a diethylphenylsilyl group, a diphenylmethylsilyl group, an ethyldiphenylsilyl group or the like can be given. Of these, a diphenylmethylsilyl group and an ethyldiphenylsilyl group are preferable.

The alkoxy group having 1 to 20 carbon atoms is represented by —OY. As examples of Y, the above-mentioned examples of the alkyl group can be given. The alkoxy group is, a methoxy group or an ethoxy group, for example.

The cycloalkoxy group having 3 to 10 ring carbon atoms is represented by —OY. As examples of Y, the above-mentioned examples of the cycloalkyl group can be given. The cycloalkyl group is, for example, a cyclopentyloxy group or a cyclohexyloxy group.

The aryloxy group having 6 to 30 ring carbon atoms is represented by —OY. As examples of Y, the above-mentioned examples of the aromatic hydrocarbon ring can be given. The aryloxy group is, for example, a phenoxy group.

The aralkyl group having 7 to 40 carbon atoms is represented by —Y—Z. As examples of Y, the above-mentioned examples of the alkylene group corresponding to the above-mentioned examples of the alkyl group can be given. As examples of Z, the above-mentioned examples of the aryl group can be given. The aryl part of the aralkyl group has preferably 6 to 30 carbon atoms. It is preferred that the alkyl part have 1 to 10 carbon atoms, with 1 to 6 carbon atoms being particularly preferable. A benzyl group, a phenylethyl group and a 2-phenylpropane-2-yl group can be given, for example.

As the halogen atom, a fluorine atom, a chlorine atom and a bromine atom can be given, with a fluorine atom being preferable.

The substituents of the above-mentioned various groups are independently a linear or branched alkyl group having 1 to 20 carbon atoms, a linear or branched alkenyl group having 2 to 20 carbon atoms, a cycloalkyl group having 3 to 20 ring carbon atoms, a trialkylsilyl group having an alkyl group having 1 to 20 carbon atoms, a triarylsilyl group having an aryl group having 6 to 24 ring carbon atoms, an alkylarylsilyl group having an alkyl group having 1 to 20 carbon atoms and an aryl group having 6 to 24 ring carbon atoms, an aryl group having 6 to 24 ring carbon atoms, a heteroaryl group having 5 to 24 ring atoms, an alkoxy group having 1 to 20 carbon atoms, a halogen atom or a cyano group. Specifically, the aryl group, the alkyl group, the cycloalkyl group, the trialkylsilyl group, the triarylsilyl group, the alkylarylsilyl group, the heteroaryl group, the alkoxy group, the halogen atom or the cyano group as mentioned above can be given. Further, these groups may have the same substituents.

As the alkenyl group, a substituent having an unsaturated bond within the molecule of the above-mentioned alkyl group can be given.

In the invention, the cross-linkable group means a group which has a "part which is cross-linkable" by heat, light, an acid, an electron beam or the like (e.g. a known unsaturated double bond, an epoxy group, and oxetane). As the cross-linkable group, the following can be given, for (X1)

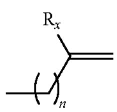

(X2)

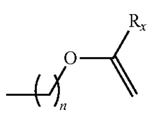

(X3)

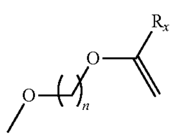

(X4)

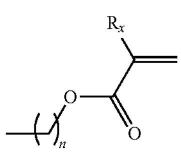

(X5)

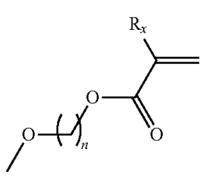

(X6)

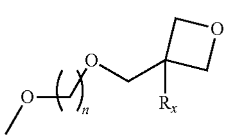

(X7)

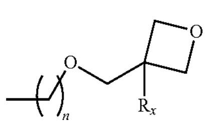

-continued (X8)

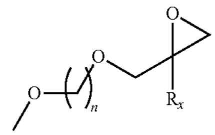

(X9)

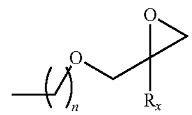

(X10)

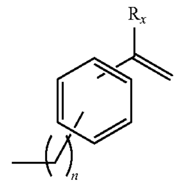

(X11)

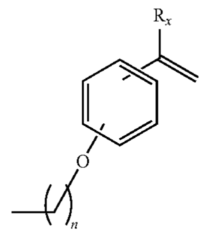

(X12)

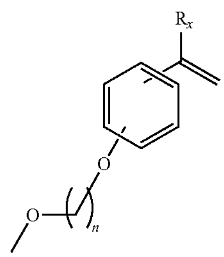

(X13)

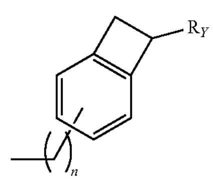

(X14)

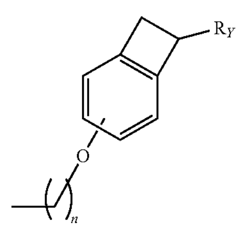

(X15)

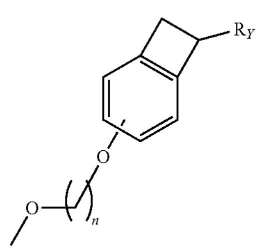

In each of the above-mentioned formulas, n is an integer of 0 to 10.

$R_x$ is a hydrogen atom, an alkyl group or a halogen. As the alkyl group, one having 1 to 20 carbon atoms can be given. An alkyl group having 1 to 4 carbon atoms is particularly preferable.

$R_Y$ is a hydrogen atom, an alkyl group, an amino group, an aryl group, a halogen atom, an amide group or a carbonyl group. As the alkyl group, one having 1 to 20 carbon atoms can be given, with an alkyl group having 1 to 4 carbon atoms being particularly preferable.

Specifically, groups selected from the groups represented by the following formulas (31) to (42) are preferable.

(31)

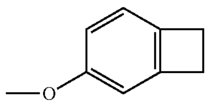

(32)

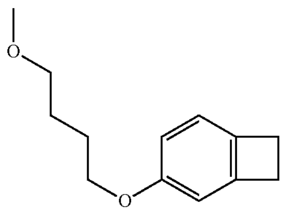

(33)

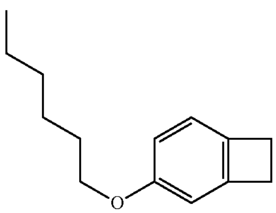

(34)

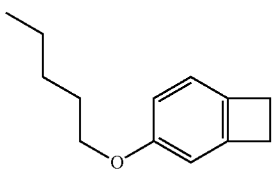

(35)

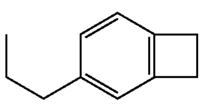

(36)

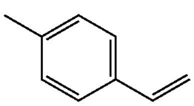

(37)

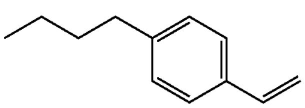

(38)

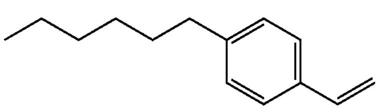

(39)

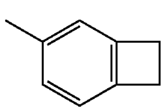

-continued (40)

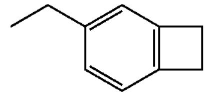

(41)

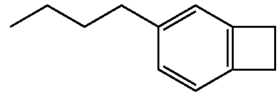

(42)

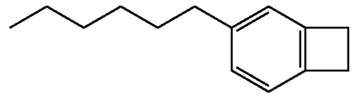

The cross-linkable group includes a group obtained by bonding the above-mentioned cross-linkable group to the linkage group represented by $L_1$ and $L_2$. Of these, groups selected from the groups represented by the formulas (43) to (46) are preferable.

(43)

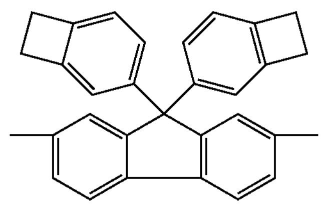

(44)

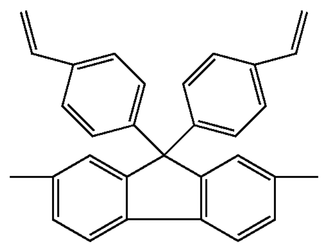

(45)

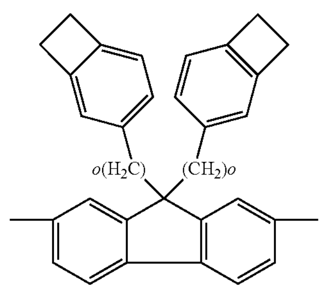

(46)

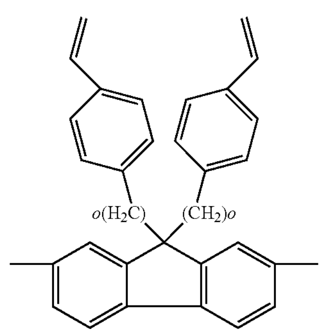

(in the formulas (45) and (46), o is an integer of 1 to 10).

The polymer of the invention is preferably one represented by the following formulas (1) to (7). Of these, one represented by the following formulas (8) to (25) are preferable. In the following formulas, in order to show the bonding state of the structural units A and B and the amount ratio thereof in the polymer, the polymer is shown in the form of a block copolymer for the sake of convenience. The polymer represented by the following formulas is not limited to a block copolymer. The polymer of the invention is not limited to a block copolymer, and includes a random copolymer (for example, -ABBABBBAAABA- or the like).

(1)

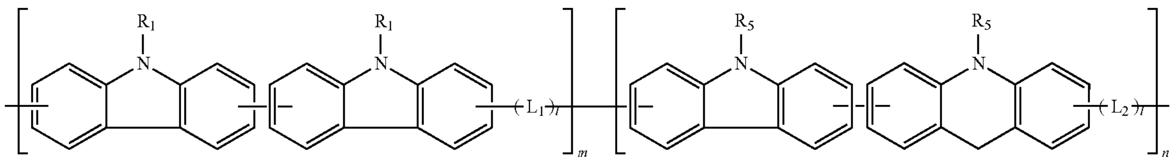

(2)

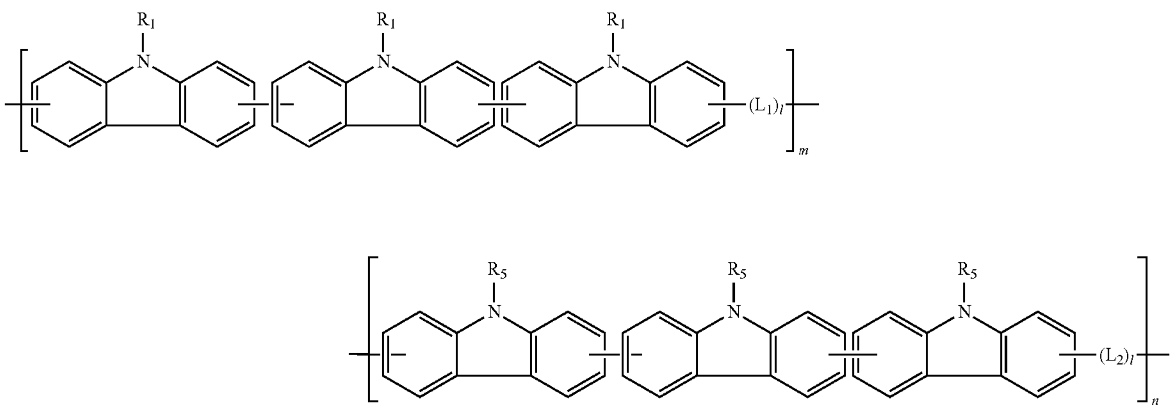

(3)

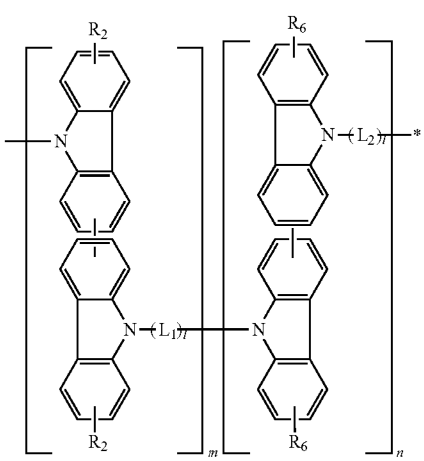

(4)

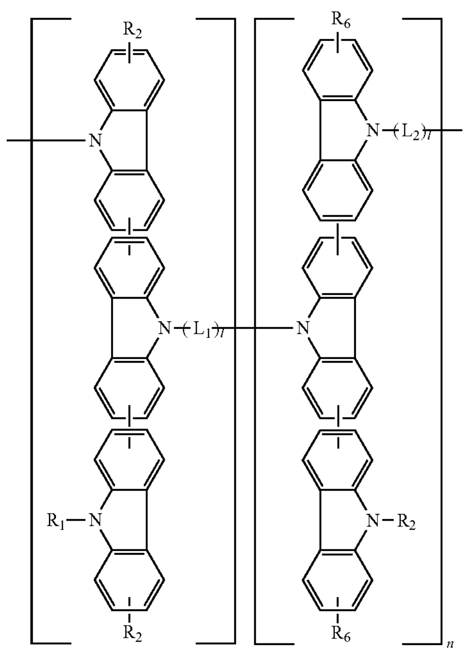

-continued
(5)
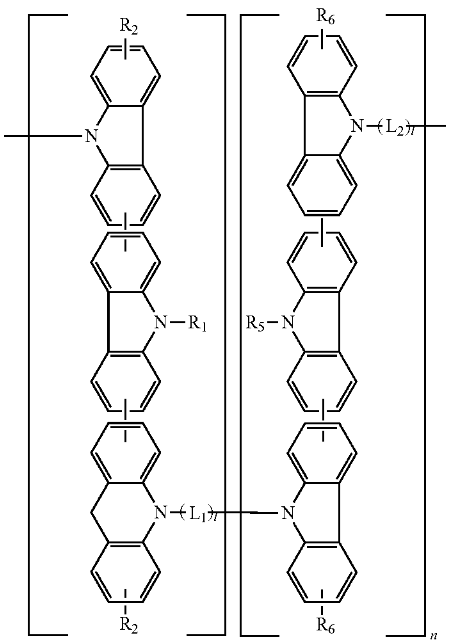
(6)
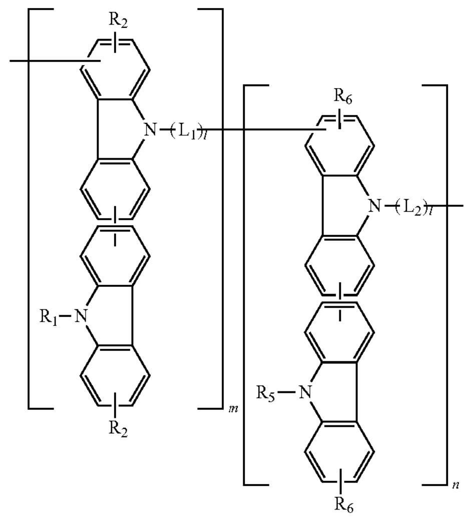
(7)
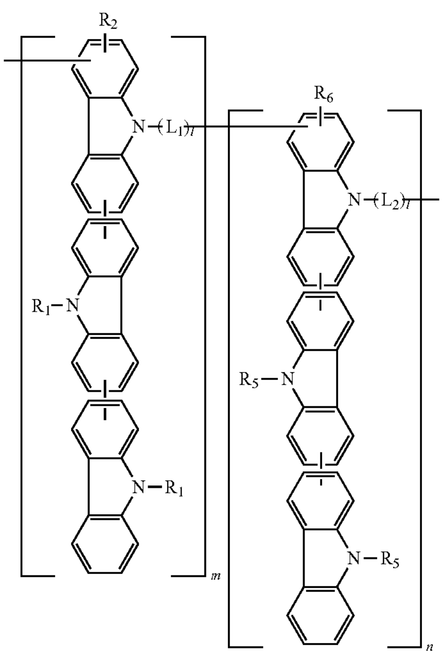
(8)
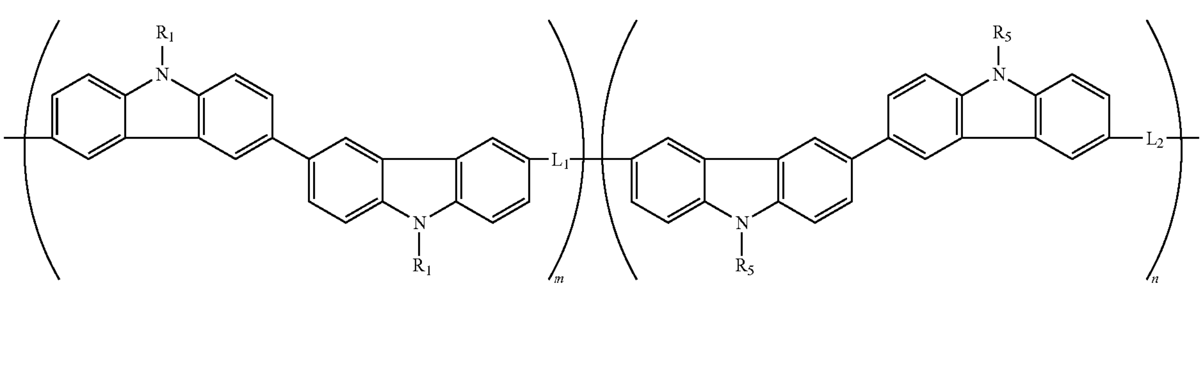

-continued
(9)
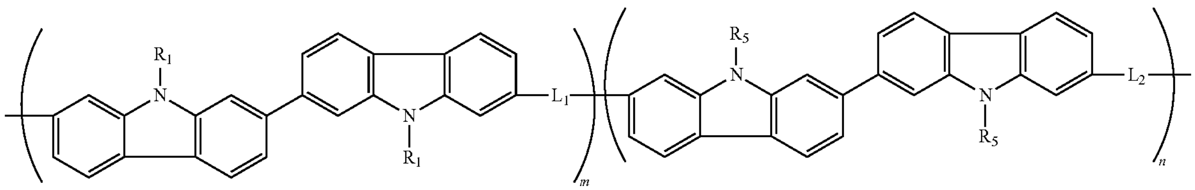
(10)
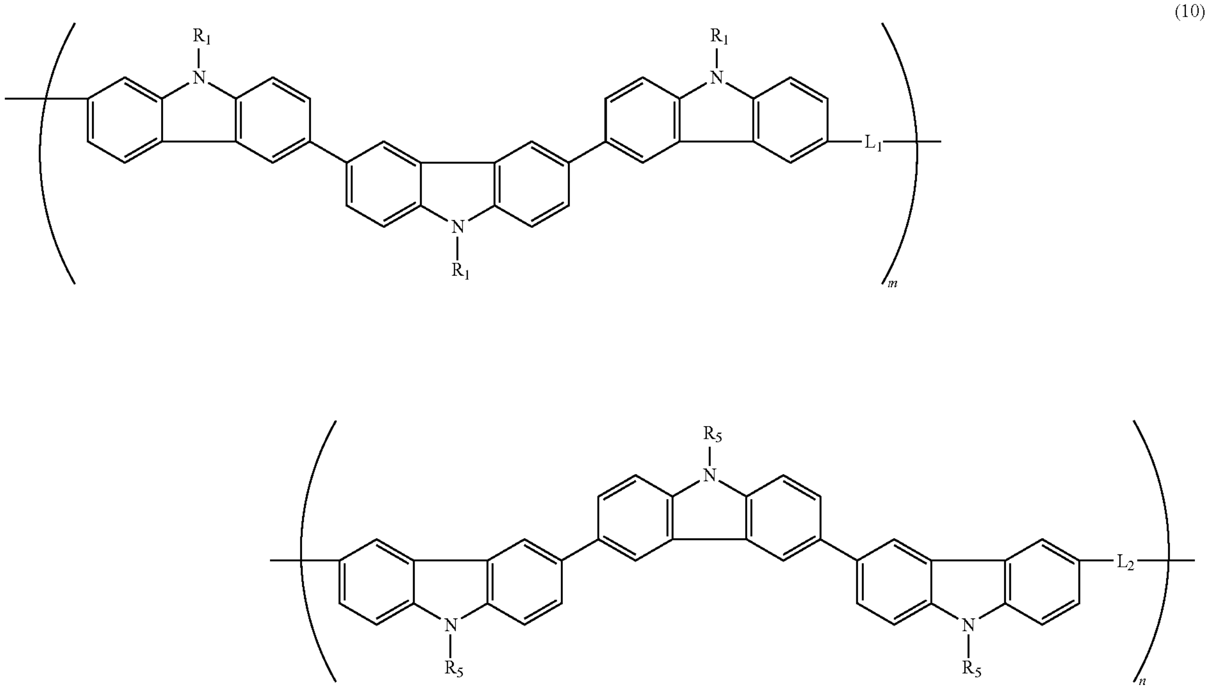
(11)
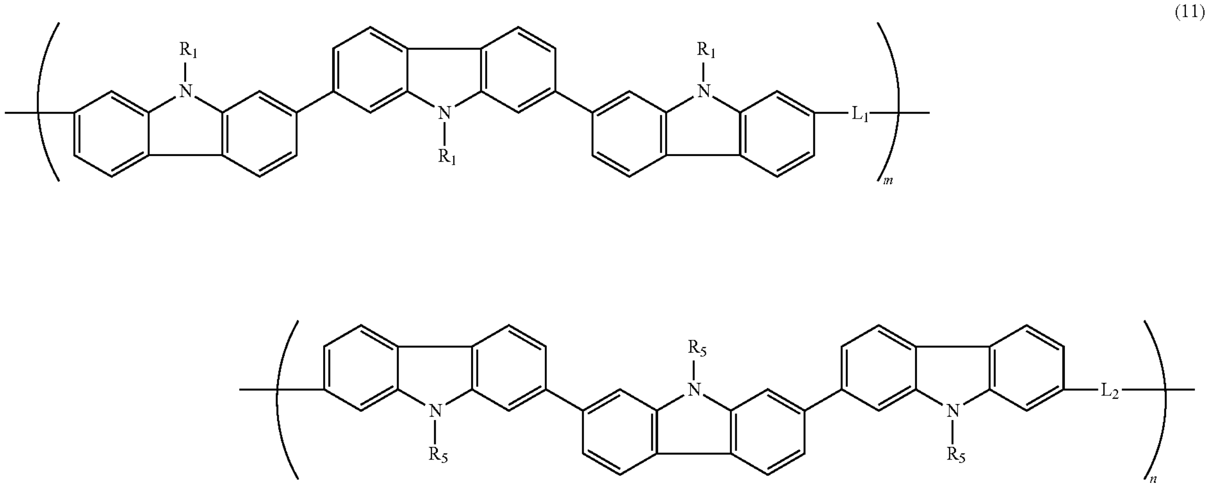

-continued
(12)
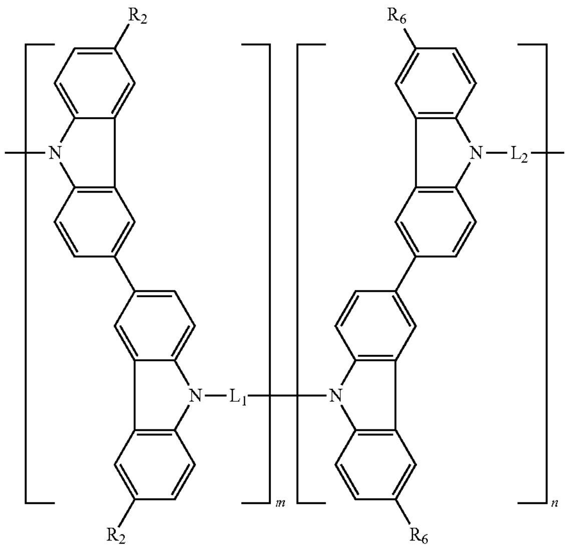
(13)
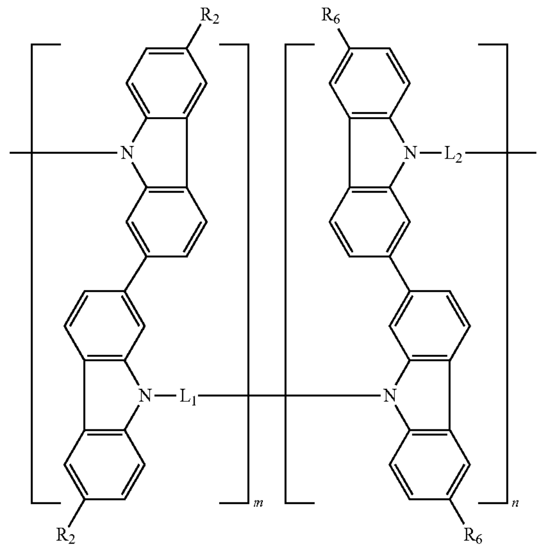
(14)
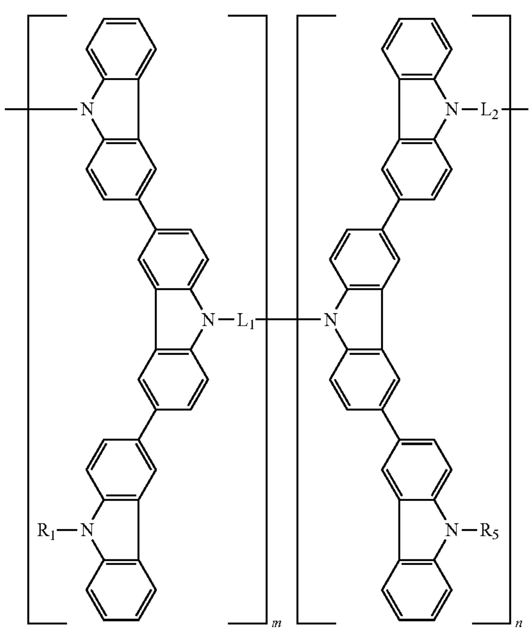
(15)
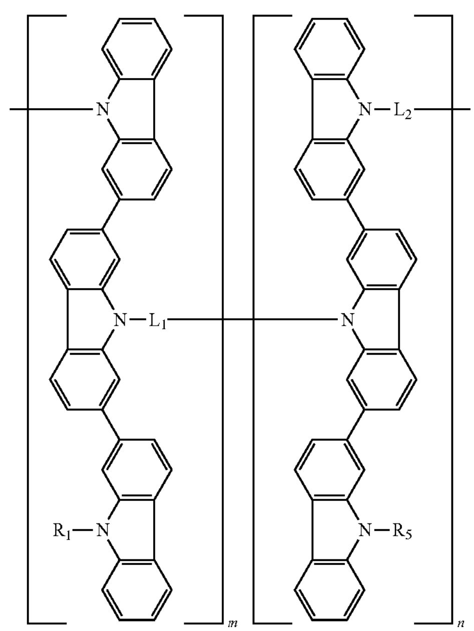

-continued
(16)
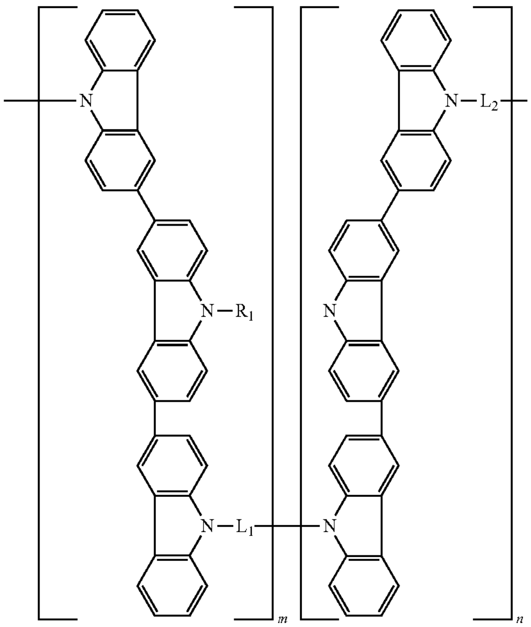
(17)
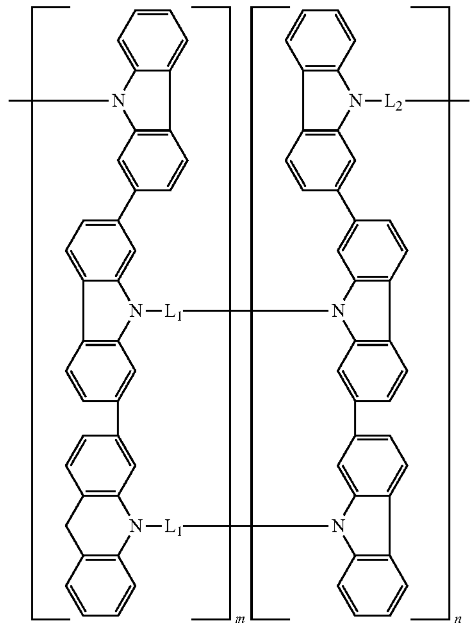
(18)
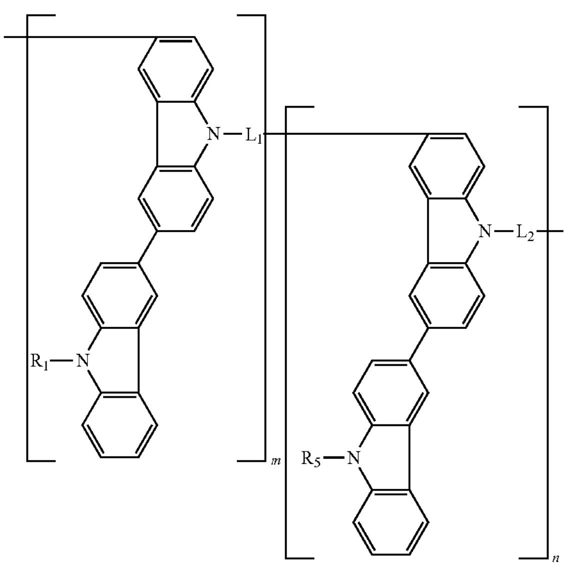
(19)
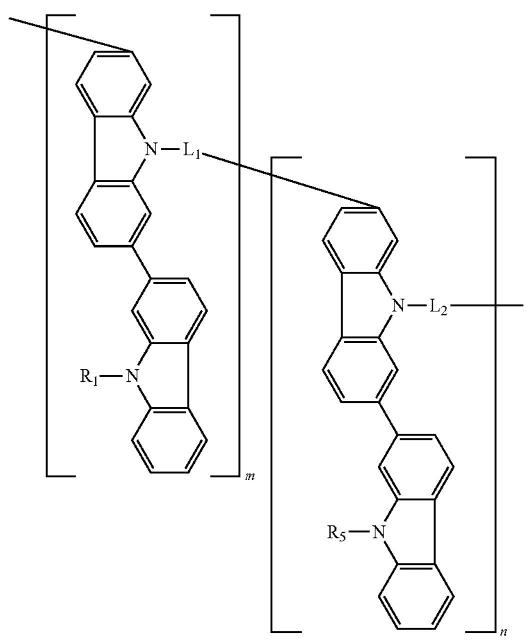

-continued
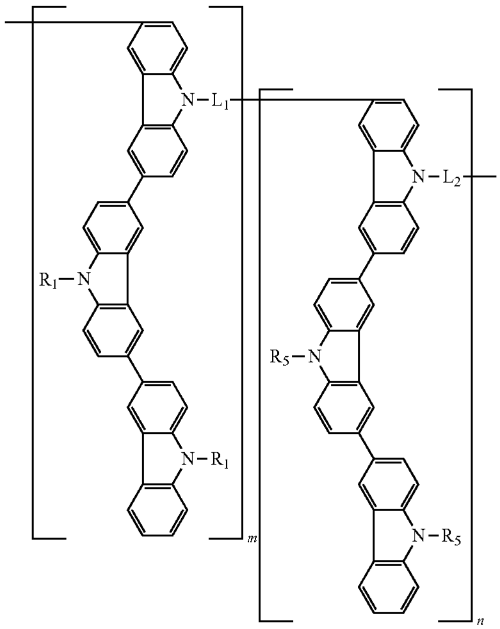
(20)
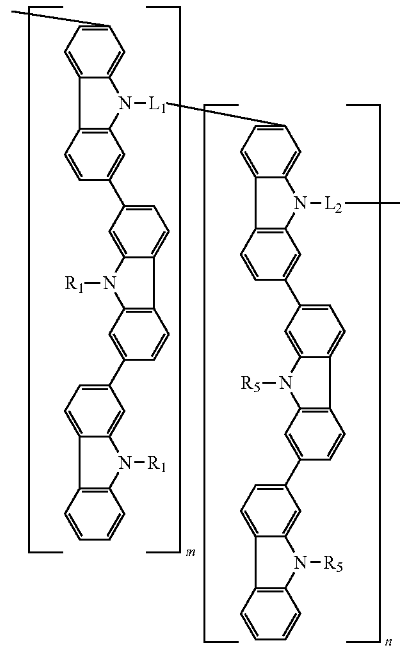
(21)
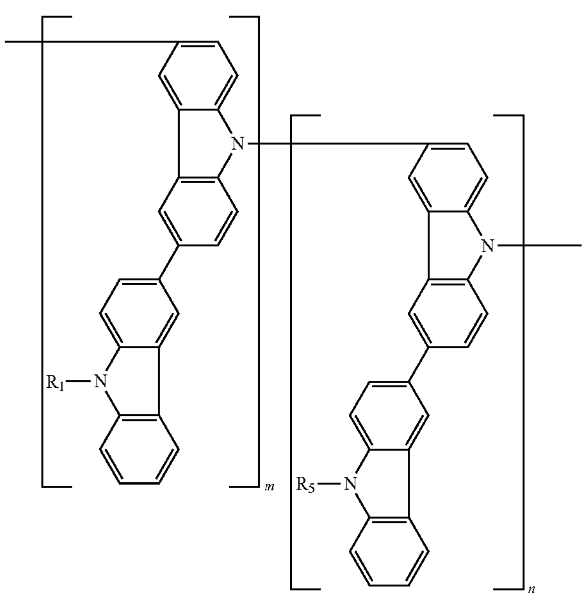
(22)
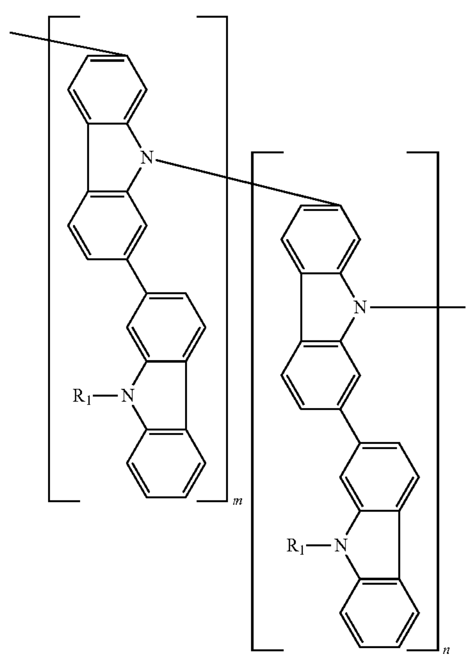
(23)

-continued (24)

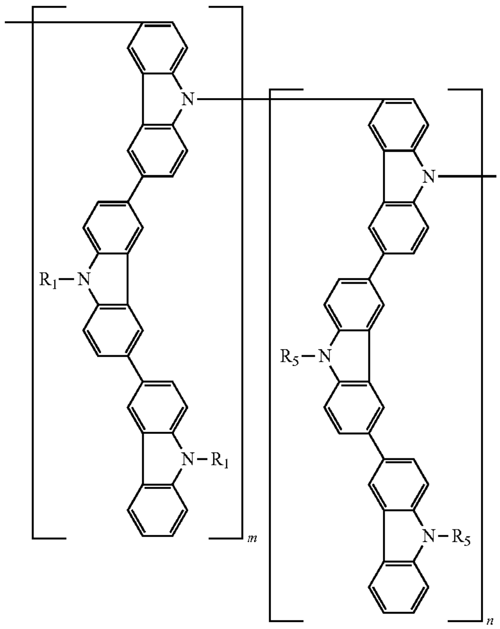

(25)

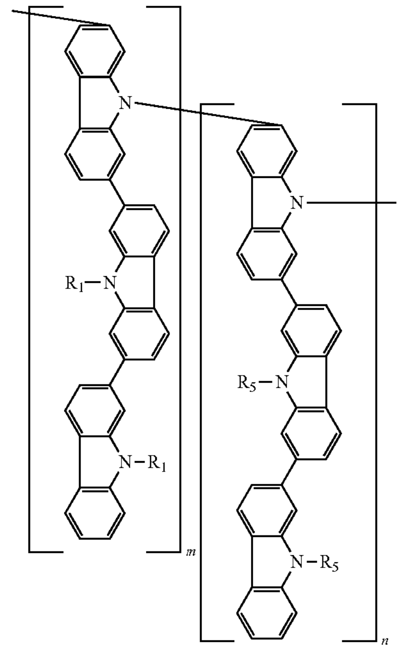

In each of the above-mentioned formulas, $R_1$, $R_2$, $R_5$, $R_6$, $L_1$ and $L_2$ are the same as $R_1$, $R_2$, $R_5$, $R_6$, $L_1$ and $L_2$ in the above-mentioned formulas (A) and (B).

m and n are independently an amount ratio (molar ratio) of each structural unit in the polymer, and m is 0.01 to 0.99 and n is 0.01 to 0.99 and m+n=1.

l is 0 or 1.

In the invention, a polymer in which at least one of $R_5$ or at least one of $R_6$ of each of polymers represented by the above formulas (1) to (25) is a cross-linkable group is more preferable. In this case, $L_2$ may be a cross-linkable group, and all $L_2$s may not be a cross-linkable group.

Further, it is preferred that the polymer of the invention be a polymer in which at least one of $L_2$s of each of polymers represented by the formulas (1) to (21) is a cross-linkable group. In this case, $R_5$ and $R_6$ may be a cross-linkable group, but all $R_5$ and $R_6$ may not be a cross-linkable group.

Further, it is preferred that at least one of $R_1$, $R_2$, $R_5$ and $R_6$ of each of polymers represented by the formulas (1) to (25) be a group selected from the groups represented by the above-mentioned formulas (51) to (55).

No specific restrictions are imposed on the molecular weight of the polymer of the invention, and the polymer includes an oligomer (larger than a dimer) to an ultra-high molecular weight polymer.

The polymer has a number average molecular weight (Mn) of preferably $10^3$ to $10^8$, more preferably $5\times10^3$ to $10^6$. The polymer has a weight average molecular weight (Mw) of preferably $10^3$ to $10^8$, more preferably $5\times10^3$ to $10^6$. Further, the molecular weight distribution represented by Mw/Mn is not particularly restricted, but preferably 10 or less, with 3 or less being particularly preferable.

If the molecular weight of the polymer is too large, a homogenous film cannot be formed during device fabrication due to gelation. On the other hand, if the molecular weight is too small, control of solubility may become difficult.

The number average molecular weight and the weight average molecular weight can be obtained by using size exclusion chromatography (SEC) and by calibrating with standard polystyrene.

The polymer of the invention can be obtained by polymerizing a polymerizable monomer corresponding to each group of P, Q, $L_1$ and $L_2$ of the structural units A and B.

No specific restrictions are imposed on the polymerization method, and a Suzuki polymerization method in which a dihalide derivative and a diboronic acid derivative or a boronic acid ester derivative corresponding to each of the above groups are subjected to a coupling reaction with a palladium catalyst is desirable. As for the halogen of the dihalide derivative, Br or I is more preferable as compared with Cl. The dehalide derivative is more preferably coupled to a boronic acid ester derivative than boronic acid. In particular, a boronic acid ester derivative, a dipinacol ester derivative and a di-1,3-propane diol derivative are preferable.

In the polymer of the invention, it is preferred that the molar ratio of the structural unit A and the structural unit B be respectively 0.01 to 0.99. It suffices that within this range, the molar ratio be adjusted such that the thermosetting property required for the polymer can be obtained. If the amount ratio of the structural unit B having a heat cross-linkable group becomes high, the cross-linking properties of the polymer also become high.

It is further preferred that the molar ratio of the structural unit A be 0.85 to 0.99, with 0.95 to 0.99 being particularly preferable.

The specific examples of the polymer of the invention [compounds (1-1) to (196-18)] are shown below. The polymer of the invention is not restricted thereto.

In each table, H is a hydrogen atom, and H-1 to H-18, H-29 and H-30 show the following groups. m and n are independently the amount ratio (molar ratio) of the structural unit in the polymer, and m is 0.01 to 0.99, n is 0.01 to 0.99, and m+n=1.

Further, as in the case of the formulas (1) to (25), in the following formula, in order to indicate the bonding state of the structural unit A and the structural unit B and the amount ratio thereof in the polymer, the polymer is expressed as a block polymer for the sake of convenience. However, the polymers shown below do not indicate only block copolymers.

H-1

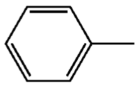

H-2

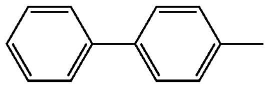

H-3

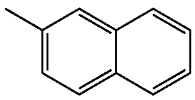

H-4

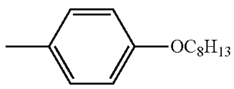

H-5

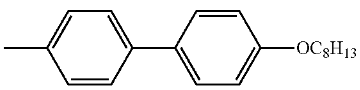

H-6

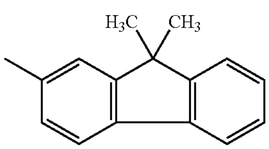

H-7

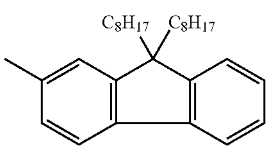

H-8

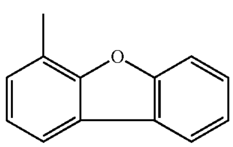

H-9

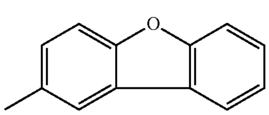

H-10

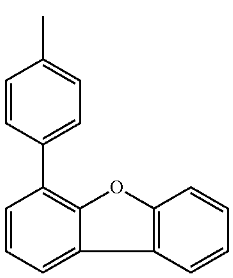

-continued

H-11

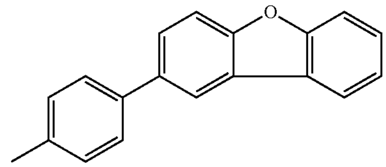

H-12

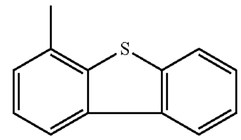

H-13

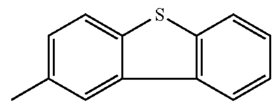

H-14

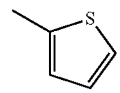

H-15

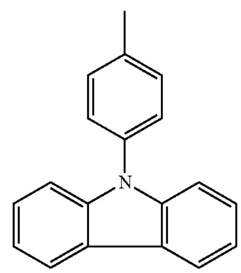

H-16

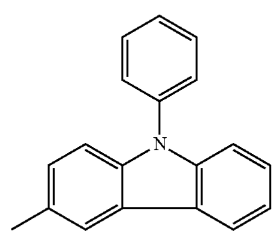

H-17

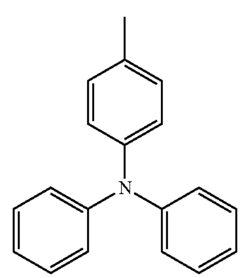

-continued
H-18
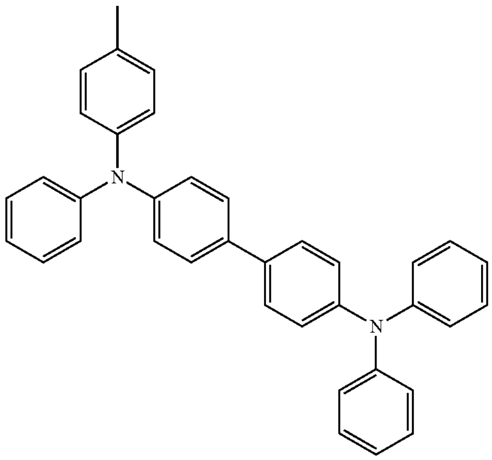
H-29
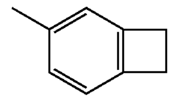
H-30
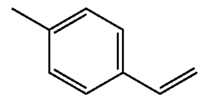
TABLE 1
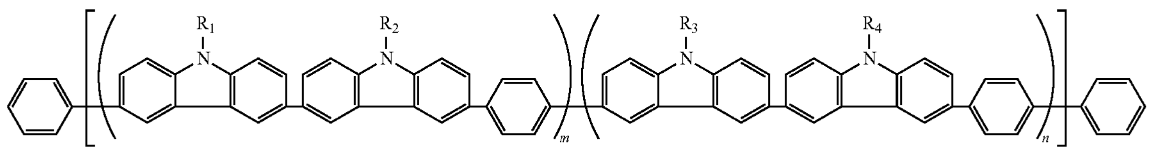
| Compound | R1 = R2 = R3 | R4 |
|---|---|---|
| 1-1 | H-1 | H-29 |
| 1-2 | H-2 | |
| 1-3 | H-3 | |
| 1-4 | H-4 | |
| 1-5 | H-5 | |
| 1-6 | H-6 | |
| 1-7 | H-7 | |
| 1-8 | H-8 | |
| 1-9 | H-9 | |
| 1-10 | H-10 | |
| 1-11 | H-11 | |
| 1-12 | H-12 | |
| 1-13 | H-13 | |
| 1-14 | H-14 | |
| 1-15 | H-15 | |
| 1-16 | H-16 | |
| 1-17 | H-17 | |
| 1-18 | H-18 | |
| 1-19 | H-1 | H-30 |
| 1-20 | H-2 | |
| 1-21 | H-3 | |
| 1-22 | H-4 | |
| 1-23 | H-5 | |
| 1-24 | H-6 | |
| 1-25 | H-7 | |
| 1-26 | H-8 | |
| 1-27 | H-9 | |
| 1-28 | H-10 | |
| 1-29 | H-11 | |
| 1-30 | H-12 | |
| 1-31 | H-13 | |
| 1-32 | H-14 | |
| 1-33 | H-15 | |
| 1-34 | H-16 | |
| 1-35 | H-17 | |
| 1-36 | H-18 | |
| Compound | R1 = R3 | R2 | R4 |
|---|---|---|---|
| 1-37 | H-1 | H-1 | H-29 |
| 1-38 | H-2 | | |
| 1-39 | H-3 | | |
| 1-40 | H-4 | | |
| 1-41 | H-5 | | |

TABLE 1-continued
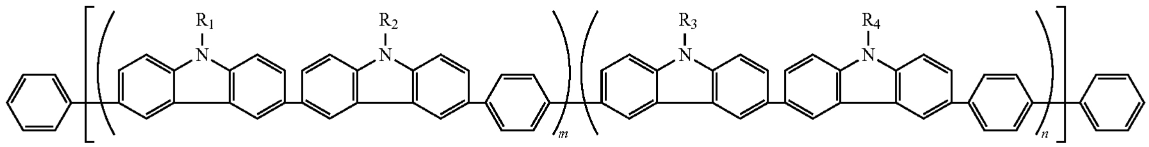
| | | | |
|---|---|---|---|
| 1-42 | H-6 | | |
| 1-43 | H-7 | | |
| 1-44 | H-8 | | |
| 1-45 | H-9 | | |
| 1-46 | H-10 | | |
| 1-47 | H-11 | | |
| 1-48 | H-12 | | |
| 1-49 | H-13 | | |
| 1-50 | H-14 | | |
| 1-51 | H-15 | | |
| 1-52 | H-16 | | |
| 1-53 | H-17 | | |
| 1-54 | H-18 | | |
| 1-55 | H-1 | H-1 | H-30 |
| 1-56 | H-2 | | |
| 1-57 | H-3 | | |
| 1-58 | H-4 | | |
| 1-59 | H-5 | | |
| 1-60 | H-6 | | |
| 1-61 | H-7 | | |
| 1-62 | H-8 | | |
| 1-63 | H-9 | | |
| 1-64 | H-10 | | |
| 1-65 | H-11 | | |
| 1-66 | H-12 | | |
| 1-67 | H-13 | | |
| 1-68 | H-14 | | |
| 1-69 | H-15 | | |
| 1-70 | H-16 | | |
| 1-71 | H-17 | | |
| 1-72 | H-18 | | |
TABLE 2
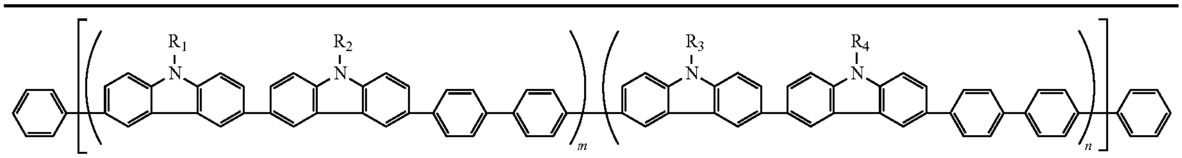
| Compound | R1 = R2 = R3 | R4 |
|---|---|---|
| 2-1 | H-1 | H-29 |
| 2-2 | H-2 | |
| 2-3 | H-3 | |
| 2-4 | H-4 | |
| 2-5 | H-5 | |
| 2-6 | H-6 | |
| 2-7 | H-7 | |
| 2-8 | H-8 | |
| 2-9 | H-9 | |
| 2-10 | H-10 | |
| 2-11 | H-11 | |
| 2-12 | H-12 | |
| 2-13 | H-13 | |
| 2-14 | H-14 | |
| 2-15 | H-15 | |
| 2-16 | H-16 | |
| 2-17 | H-17 | |
| 2-18 | H-18 | |
| 2-19 | H-1 | H-30 |
| 2-20 | H-2 | |
| 2-21 | H-3 | |
| 2-22 | H-4 | |
| 2-23 | H-5 | |
| 2-24 | H-6 | |
| 2-25 | H-7 | |
| 2-26 | H-8 | |

TABLE 2-continued
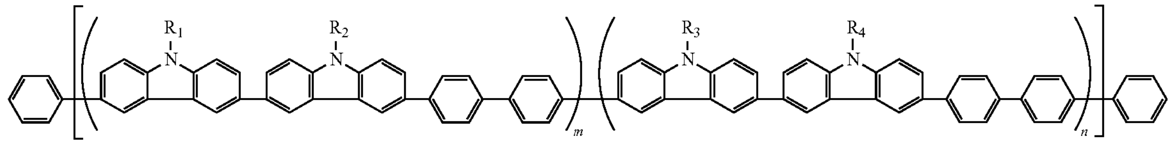
| | | | |
|---|---|---|---|
| 2-27 | H-9 | | |
| 2-28 | H-10 | | |
| 2-29 | H-11 | | |
| 2-30 | H-12 | | |
| 2-31 | H-13 | | |
| 2-32 | H-14 | | |
| 2-33 | H-15 | | |
| 2-34 | H-16 | | |
| 2-35 | H-17 | | |
| 2-36 | H-18 | | |
| Compound | R1 = R3 | R2 | R4 |
|---|---|---|---|
| 2-37 | H-1 | H-1 | H-29 |
| 2-38 | H-2 | | |
| 2-39 | H-3 | | |
| 2-40 | H-4 | | |
| 2-41 | H-5 | | |
| 2-42 | H-6 | | |
| 2-43 | H-7 | | |
| 2-44 | H-8 | | |
| 2-45 | H-9 | | |
| 2-46 | H-10 | | |
| 2-47 | H-11 | | |
| 2-48 | H-12 | | |
| 2-49 | H-13 | | |
| 2-50 | H-14 | | |
| 2-51 | H-15 | | |
| 2-52 | H-16 | | |
| 2-53 | H-17 | | |
| 2-54 | H-18 | | |
| 2-55 | H-1 | H-1 | H-30 |
| 2-56 | H-2 | | |
| 2-57 | H-3 | | |
| 2-58 | H-4 | | |
| 2-59 | H-5 | | |
| 2-60 | H-6 | | |
| 2-61 | H-7 | | |
| 2-62 | H-8 | | |
| 2-63 | H-9 | | |
| 2-64 | H-10 | | |
| 2-65 | H-11 | | |
| 2-66 | H-12 | | |
| 2-67 | H-13 | | |
| 2-68 | H-14 | | |
| 2-69 | H-15 | | |
| 2-70 | H-16 | | |
| 2-71 | H-17 | | |
| 2-72 | H-18 | | |
TABLE 3
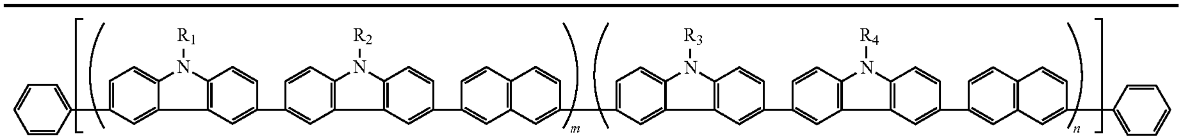
| Compound | R1 = R2 = R3 | R4 |
|---|---|---|
| 3-1 | H-1 | H-29 |
| 3-2 | H-2 | |
| 3-3 | H-3 | |
| 3-4 | H-4 | |
| 3-5 | H-5 | |
| 3-6 | H-6 | |
| 3-7 | H-7 | |
| 3-8 | H-8 | |
| 3-9 | H-9 | |

TABLE 3-continued
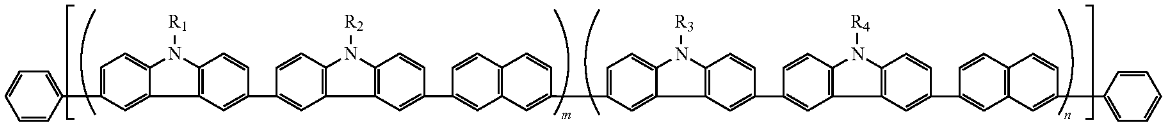
| | | | |
|---|---|---|---|
| 3-10 | H-10 | | |
| 3-11 | H-11 | | |
| 3-12 | H-12 | | |
| 3-13 | H-13 | | |
| 3-14 | H-14 | | |
| 3-15 | H-15 | | |
| 3-16 | H-16 | | |
| 3-17 | H-17 | | |
| 3-18 | H-18 | | |
| 3-19 | H-1 | | H-30 |
| 3-20 | H-2 | | |
| 3-21 | H-3 | | |
| 3-22 | H-4 | | |
| 3-23 | H-5 | | |
| 3-24 | H-6 | | |
| 3-25 | H-7 | | |
| 3-26 | H-8 | | |
| 3-27 | H-9 | | |
| 3-28 | H-10 | | |
| 3-29 | H-11 | | |
| 3-30 | H-12 | | |
| 3-31 | H-13 | | |
| 3-32 | H-14 | | |
| 3-33 | H-15 | | |
| 3-34 | H-16 | | |
| 3-35 | H-17 | | |
| 3-36 | H-18 | | |
| Compound | R1 = R3 | R2 | R4 |
|---|---|---|---|
| 3-37 | H-1 | H-1 | H-29 |
| 3-38 | H-2 | | |
| 3-39 | H-3 | | |
| 3-40 | H-4 | | |
| 3-41 | H-5 | | |
| 3-42 | H-6 | | |
| 3-43 | H-7 | | |
| 3-44 | H-8 | | |
| 3-45 | H-9 | | |
| 3-46 | H-10 | | |
| 3-47 | H-11 | | |
| 3-48 | H-12 | | |
| 3-49 | H-13 | | |
| 3-50 | H-14 | | |
| 3-51 | H-15 | | |
| 3-52 | H-16 | | |
| 3-53 | H-17 | | |
| 3-54 | H-18 | | |
| 3-55 | H-1 | H-1 | H-30 |
| 3-56 | H-2 | | |
| 3-57 | H-3 | | |
| 3-58 | H-4 | | |
| 3-59 | H-5 | | |
| 3-60 | H-6 | | |
| 3-61 | H-7 | | |
| 3-62 | H-8 | | |
| 3-63 | H-9 | | |
| 3-64 | H-10 | | |
| 3-65 | H-11 | | |
| 3-66 | H-12 | | |
| 3-67 | H-13 | | |
| 3-68 | H-14 | | |
| 3-69 | H-15 | | |
| 3-70 | H-16 | | |
| 3-71 | H-17 | | |
| 3-72 | H-18 | | |

TABLE 4
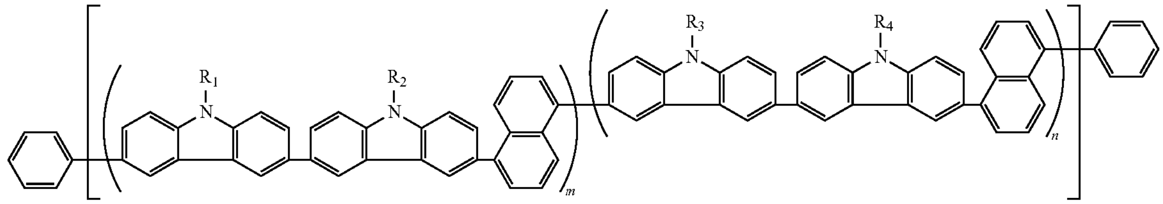
| Compound | R1 = R2 = R3 | R4 |
|---|---|---|
| 4-1 | H-1 | H-29 |
| 4-2 | H-2 | |
| 4-3 | H-3 | |
| 4-4 | H-4 | |
| 4-5 | H-5 | |
| 4-6 | H-6 | |
| 4-7 | H-7 | |
| 4-8 | H-8 | |
| 4-9 | H-9 | |
| 4-10 | H-10 | |
| 4-11 | H-11 | |
| 4-12 | H-12 | |
| 4-13 | H-13 | |
| 4-14 | H-14 | |
| 4-15 | H-15 | |
| 4-16 | H-16 | |
| 4-17 | H-17 | |
| 4-18 | H-18 | |
| 4-19 | H-1 | H-30 |
| 4-20 | H-2 | |
| 4-21 | H-3 | |
| 4-22 | H-4 | |
| 4-23 | H-5 | |
| 4-24 | H-6 | |
| 4-25 | H-7 | |
| 4-26 | H-8 | |
| 4-27 | H-9 | |
| 4-28 | H-10 | |
| 4-29 | H-11 | |
| 4-30 | H-12 | |
| 4-31 | H-13 | |
| 4-32 | H-14 | |
| 4-33 | H-15 | |
| 4-34 | H-16 | |
| 4-35 | H-17 | |
| 4-36 | H-18 | |
| Compound | R1 = R3 | R2 | R4 |
|---|---|---|---|
| 4-37 | H-1 | H-1 | H-29 |
| 4-38 | H-2 | | |
| 4-39 | H-3 | | |
| 4-40 | H-4 | | |
| 4-41 | H-5 | | |
| 4-42 | H-6 | | |
| 4-43 | H-7 | | |
| 4-44 | H-8 | | |
| 4-45 | H-9 | | |
| 4-46 | H-10 | | |
| 4-47 | H-11 | | |
| 4-48 | H-12 | | |
| 4-49 | H-13 | | |
| 4-50 | H-14 | | |
| 4-51 | H-15 | | |
| 4-52 | H-16 | | |
| 4-53 | H-17 | | |
| 4-54 | H-18 | | |
| 4-55 | H-1 | H-1 | H-30 |
| 4-56 | H-2 | | |
| 4-57 | H-3 | | |
| 4-58 | H-4 | | |
| 4-59 | H-5 | | |
| 4-60 | H-6 | | |
| 4-61 | H-7 | | |
| 4-62 | H-8 | | |
| 4-63 | H-9 | | |
| 4-64 | H-10 | | |

TABLE 4-continued
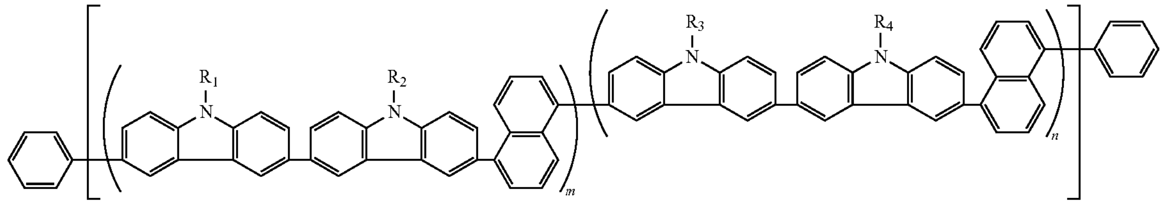
| | |
|---|---|
| 4-65 | H-11 |
| 4-66 | H-12 |
| 4-67 | H-13 |
| 4-68 | H-14 |
| 4-69 | H-15 |
| 4-70 | H-16 |
| 4-71 | H-17 |
| 4-72 | H-18 |
TABLE 5
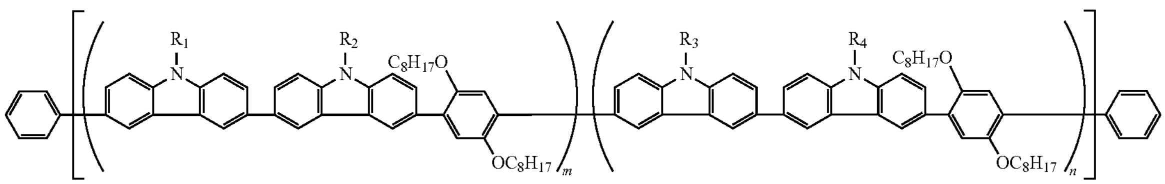
| Compound | R1 = R2 = R3 | R4 |
|---|---|---|
| 5-1 | H-1 | H-29 |
| 5-2 | H-2 | |
| 5-3 | H-3 | |
| 5-4 | H-4 | |
| 5-5 | H-5 | |
| 5-6 | H-6 | |
| 5-7 | H-7 | |
| 5-8 | H-8 | |
| 5-9 | H-9 | |
| 5-10 | H-10 | |
| 5-11 | H-11 | |
| 5-12 | H-12 | |
| 5-13 | H-13 | |
| 5-14 | H-14 | |
| 5-15 | H-15 | |
| 5-16 | H-16 | |
| 5-17 | H-17 | |
| 5-18 | H-18 | |
| 5-19 | H-1 | H-30 |
| 5-20 | H-2 | |
| 5-21 | H-3 | |
| 5-22 | H-4 | |
| 5-23 | H-5 | |
| 5-24 | H-6 | |
| 5-25 | H-7 | |
| 5-26 | H-8 | |
| 5-27 | H-9 | |
| 5-28 | H-10 | |
| 5-29 | H-11 | |
| 5-30 | H-12 | |
| 5-31 | H-13 | |
| 5-32 | H-14 | |
| 5-33 | H-15 | |
| 5-34 | H-16 | |
| 5-35 | H-17 | |
| 5-36 | H-18 | |
| Compound | R1 = R3 | R2 | R4 |
|---|---|---|---|
| 5-37 | H-1 | H-1 | H-29 |
| 5-38 | H-2 | | |
| 5-39 | H-3 | | |
| 5-40 | H-4 | | |
| 5-41 | H-5 | | |
| 5-42 | H-6 | | |

TABLE 5-continued
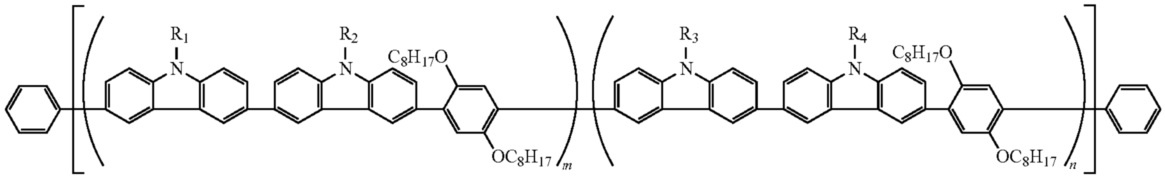
| | | | |
|---|---|---|---|
| 5-43 | H-7 | | |
| 5-44 | H-8 | | |
| 5-45 | H-9 | | |
| 5-46 | H-10 | | |
| 5-47 | H-11 | | |
| 5-48 | H-12 | | |
| 5-49 | H-13 | | |
| 5-50 | H-14 | | |
| 5-51 | H-15 | | |
| 5-52 | H-16 | | |
| 5-53 | H-17 | | |
| 5-54 | H-18 | | |
| 5-55 | H-1 | H-1 | H-30 |
| 5-56 | H-2 | | |
| 5-57 | H-3 | | |
| 5-58 | H-4 | | |
| 5-59 | H-5 | | |
| 5-60 | H-6 | | |
| 5-61 | H-7 | | |
| 5-62 | H-8 | | |
| 5-63 | H-9 | | |
| 5-64 | H-10 | | |
| 5-65 | H-11 | | |
| 5-66 | H-12 | | |
| 5-67 | H-13 | | |
| 5-68 | H-14 | | |
| 5-69 | H-15 | | |
| 5-70 | H-16 | | |
| 5-71 | H-17 | | |
| 5-72 | H-18 | | |
TABLE 6
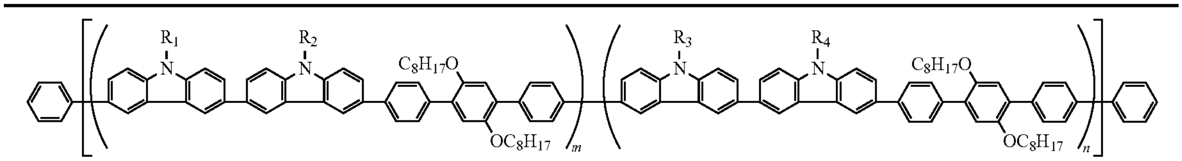
| Compound | R1 = R2 = R3 | R4 |
|---|---|---|
| 6-1 | H-1 | H-29 |
| 6-2 | H-2 | |
| 6-3 | H-3 | |
| 6-4 | H-4 | |
| 6-5 | H-5 | |
| 6-6 | H-6 | |
| 6-7 | H-7 | |
| 6-8 | H-8 | |
| 6-9 | H-9 | |
| 6-10 | H-10 | |
| 6-11 | H-11 | |
| 6-12 | H-12 | |
| 6-13 | H-13 | |
| 6-14 | H-14 | |
| 6-15 | H-15 | |
| 6-16 | H-16 | |
| 6-17 | H-17 | |
| 6-18 | H-18 | |
| 6-19 | H-1 | H-30 |
| 6-20 | H-2 | |
| 6-21 | H-3 | |
| 6-22 | H-4 | |
| 6-23 | H-5 | |
| 6-24 | H-6 | |
| 6-25 | H-7 | |

TABLE 6-continued
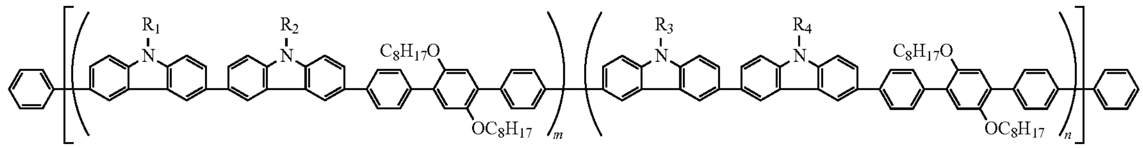
| | |
|---|---|
| 6-26 | H-8 |
| 6-27 | H-9 |
| 6-28 | H-10 |
| 6-29 | H-11 |
| 6-30 | H-12 |
| 6-31 | H-13 |
| 6-32 | H-14 |
| 6-33 | H-15 |
| 6-34 | H-16 |
| 6-35 | H-17 |
| 6-36 | H-18 |
| Compound | R1 = R3 | R2 | R4 |
|---|---|---|---|
| 6-37 | H-1 | H-1 | H-29 |
| 6-38 | H-2 | | |
| 6-39 | H-3 | | |
| 6-40 | H-4 | | |
| 6-41 | H-5 | | |
| 6-42 | H-6 | | |
| 6-43 | H-7 | | |
| 6-44 | H-8 | | |
| 6-45 | H-9 | | |
| 6-46 | H-10 | | |
| 6-47 | H-11 | | |
| 6-48 | H-12 | | |
| 6-49 | H-13 | | |
| 6-50 | H-14 | | |
| 6-51 | H-15 | | |
| 6-52 | H-16 | | |
| 6-53 | H-17 | | |
| 6-54 | H-18 | | |
| 6-55 | H-1 | H-1 | H-30 |
| 6-56 | H-2 | | |
| 6-57 | H-3 | | |
| 6-58 | H-4 | | |
| 6-59 | H-5 | | |
| 6-60 | H-6 | | |
| 6-61 | H-7 | | |
| 6-62 | H-8 | | |
| 6-63 | H-9 | | |
| 6-64 | H-10 | | |
| 6-65 | H-11 | | |
| 6-66 | H-12 | | |
| 6-67 | H-13 | | |
| 6-68 | H-14 | | |
| 6-69 | H-15 | | |
| 6-70 | H-16 | | |
| 6-71 | H-17 | | |
| 6-72 | H-18 | | |
TABLE 7
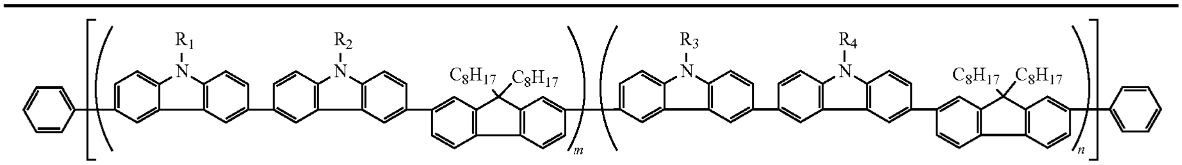
| Compound | R1 = R2 = R3 | R4 |
|---|---|---|
| 7-1 | H-1 | H-29 |
| 7-2 | H-2 | |
| 7-3 | H-3 | |
| 7-4 | H-4 | |
| 7-5 | H-5 | |
| 7-6 | H-6 | |
| 7-7 | H-7 | |

TABLE 7-continued
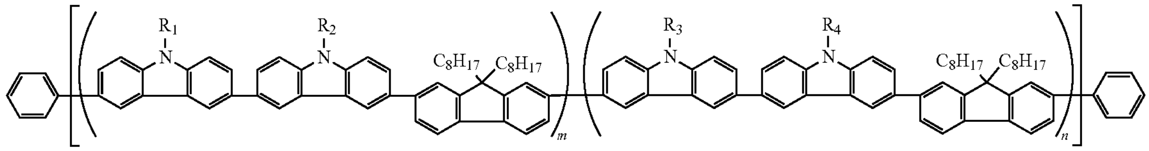
| | | | |
|---|---|---|---|
| 7-8 | H-8 | | |
| 7-9 | H-9 | | |
| 7-10 | H-10 | | |
| 7-11 | H-11 | | |
| 7-12 | H-12 | | |
| 7-13 | H-13 | | |
| 7-14 | H-14 | | |
| 7-15 | H-15 | | |
| 7-16 | H-16 | | |
| 7-17 | H-17 | | |
| 7-18 | H-18 | | |
| 7-19 | H-1 | | H-30 |
| 7-20 | H-2 | | |
| 7-21 | H-3 | | |
| 7-22 | H-4 | | |
| 7-23 | H-5 | | |
| 7-24 | H-6 | | |
| 7-25 | H-7 | | |
| 7-26 | H-8 | | |
| 7-27 | H-9 | | |
| 7-28 | H-10 | | |
| 7-29 | H-11 | | |
| 7-30 | H-12 | | |
| 7-31 | H-13 | | |
| 7-32 | H-14 | | |
| 7-33 | H-15 | | |
| 7-34 | H-16 | | |
| 7-35 | H-17 | | |
| 7-36 | H-18 | | |
| Compound | R1 = R3 | R2 | R4 |
|---|---|---|---|
| 7-37 | H-1 | H-1 | H-29 |
| 7-38 | H-2 | | |
| 7-39 | H-3 | | |
| 7-40 | H-4 | | |
| 7-41 | H-5 | | |
| 7-42 | H-6 | | |
| 7-43 | H-7 | | |
| 7-44 | H-8 | | |
| 7-45 | H-9 | | |
| 7-46 | H-10 | | |
| 7-47 | H-11 | | |
| 7-48 | H-12 | | |
| 7-49 | H-13 | | |
| 7-50 | H-14 | | |
| 7-51 | H-15 | | |
| 7-52 | H-16 | | |
| 7-53 | H-17 | | |
| 7-54 | H-18 | | |
| 7-55 | H-1 | H-1 | H-30 |
| 7-56 | H-2 | | |
| 7-57 | H-3 | | |
| 7-58 | H-4 | | |
| 7-59 | H-5 | | |
| 7-60 | H-6 | | |
| 7-61 | H-7 | | |
| 7-62 | H-8 | | |
| 7-63 | H-9 | | |
| 7-64 | H-10 | | |
| 7-65 | H-11 | | |
| 7-66 | H-12 | | |
| 7-67 | H-13 | | |
| 7-68 | H-14 | | |
| 7-69 | H-15 | | |
| 7-70 | H-16 | | |
| 7-71 | H-17 | | |
| 7-72 | H-18 | | |

TABLE 8
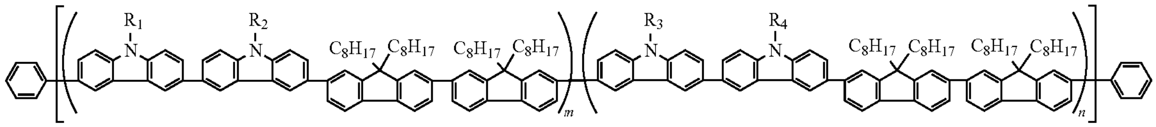
| Compound | R1 = R2 = R3 | R4 |
|---|---|---|
| 8-1 | H-1 | H-29 |
| 8-2 | H-2 | |
| 8-3 | H-3 | |
| 8-4 | H-4 | |
| 8-5 | H-5 | |
| 8-6 | H-6 | |
| 8-7 | H-7 | |
| 8-8 | H-8 | |
| 8-9 | H-9 | |
| 8-10 | H-10 | |
| 8-11 | H-11 | |
| 8-12 | H-12 | |
| 8-13 | H-13 | |
| 8-14 | H-14 | |
| 8-15 | H-15 | |
| 8-16 | H-16 | |
| 8-17 | H-17 | |
| 8-18 | H-18 | |
| 8-19 | H-1 | H-30 |
| 8-20 | H-2 | |
| 8-21 | H-3 | |
| 8-22 | H-4 | |
| 8-23 | H-5 | |
| 8-24 | H-6 | |
| 8-25 | H-7 | |
| 8-26 | H-8 | |
| 8-27 | H-9 | |
| 8-28 | H-10 | |
| 8-29 | H-11 | |
| 8-30 | H-12 | |
| 8-31 | H-13 | |
| 8-32 | H-14 | |
| 8-33 | H-15 | |
| 8-34 | H-16 | |
| 8-35 | H-17 | |
| 8-36 | H-18 | |
| Compound | R1 = R3 | R2 | R4 |
|---|---|---|---|
| 8-37 | H-1 | H-1 | H-29 |
| 8-38 | H-2 | | |
| 8-39 | H-3 | | |
| 8-40 | H-4 | | |
| 8-41 | H-5 | | |
| 8-42 | H-6 | | |
| 8-43 | H-7 | | |
| 8-44 | H-8 | | |
| 8-45 | H-9 | | |
| 8-46 | H-10 | | |
| 8-47 | H-11 | | |
| 8-48 | H-12 | | |
| 8-49 | H-13 | | |
| 8-50 | H-14 | | |
| 8-51 | H-15 | | |
| 8-52 | H-16 | | |
| 8-53 | H-17 | | |
| 8-54 | H-18 | | |
| 8-55 | H-1 | H-1 | H-30 |
| 8-56 | H-2 | | |
| 8-57 | H-3 | | |
| 8-58 | H-4 | | |
| 8-59 | H-5 | | |
| 8-60 | H-6 | | |
| 8-61 | H-7 | | |
| 8-62 | H-8 | | |
| 8-63 | H-9 | | |
| 8-64 | H-10 | | |
| 8-65 | H-11 | | |
| 8-66 | H-12 | | |
| 8-67 | H-13 | | |
| 8-68 | H-14 | | |

TABLE 8-continued
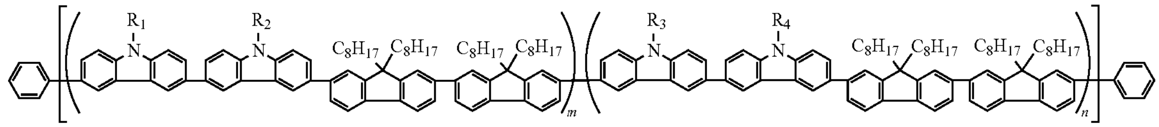
| | |
|---|---|
| 8-69 | H-15 |
| 8-70 | H-16 |
| 8-71 | H-17 |
| 8-72 | H-18 |
TABLE 9
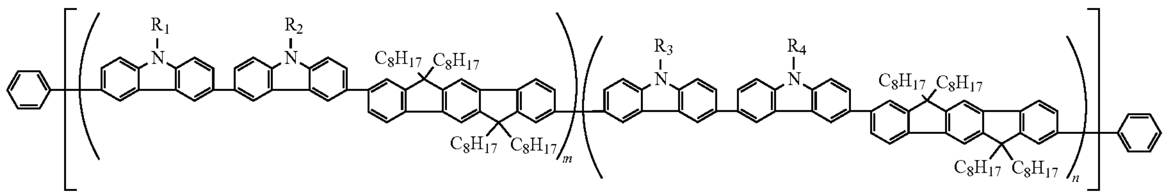
| Compound | R1 = R2 = R3 | R4 |
|---|---|---|
| 9-1 | H-1 | H-29 |
| 9-2 | H-2 | |
| 9-3 | H-3 | |
| 9-4 | H-4 | |
| 9-5 | H-5 | |
| 9-6 | H-6 | |
| 9-7 | H-7 | |
| 9-8 | H-8 | |
| 9-9 | H-9 | |
| 9-10 | H-10 | |
| 9-11 | H-11 | |
| 9-12 | H-12 | |
| 9-13 | H-13 | |
| 9-14 | H-14 | |
| 9-15 | H-15 | |
| 9-16 | H-16 | |
| 9-17 | H-17 | |
| 9-18 | H-18 | |
| 9-19 | H-1 | H-30 |
| 9-20 | H-2 | |
| 9-21 | H-3 | |
| 9-22 | H-4 | |
| 9-23 | H-5 | |
| 9-24 | H-6 | |
| 9-25 | H-7 | |
| 9-26 | H-8 | |
| 9-27 | H-9 | |
| 9-28 | H-10 | |
| 9-29 | H-11 | |
| 9-30 | H-12 | |
| 9-31 | H-13 | |
| 9-32 | H-14 | |
| 9-33 | H-15 | |
| 9-34 | H-16 | |
| 9-35 | H-17 | |
| 9-36 | H-18 | |
| Compound | R1 = R3 | R2 | R4 |
|---|---|---|---|
| 9-37 | H-1 | H-1 | H-29 |
| 9-38 | H-2 | | |
| 9-39 | H-3 | | |
| 9-40 | H-4 | | |
| 9-41 | H-5 | | |
| 9-42 | H-6 | | |
| 9-43 | H-7 | | |
| 9-44 | H-8 | | |
| 9-45 | H-9 | | |
| 9-46 | H-10 | | |
| 9-47 | H-11 | | |
| 9-48 | H-12 | | |
| 9-49 | H-13 | | |

TABLE 9-continued
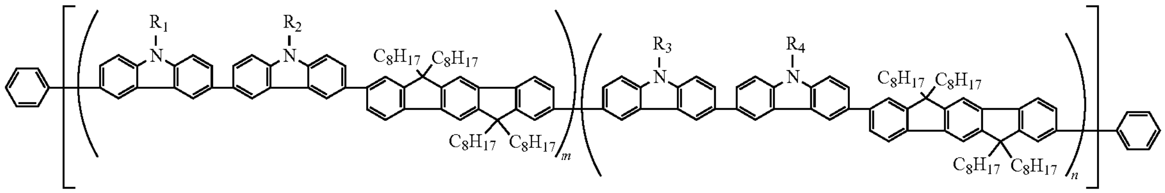
| | | | |
|---|---|---|---|
| 9-50 | H-14 | | |
| 9-51 | H-15 | | |
| 9-52 | H-16 | | |
| 9-53 | H-17 | | |
| 9-54 | H-18 | | |
| 9-55 | H-1 | H-1 | H-30 |
| 9-56 | H-2 | | |
| 9-57 | H-3 | | |
| 9-58 | H-4 | | |
| 9-59 | H-5 | | |
| 9-60 | H-6 | | |
| 9-61 | H-7 | | |
| 9-62 | H-8 | | |
| 9-63 | H-9 | | |
| 9-64 | H-10 | | |
| 9-65 | H-11 | | |
| 9-66 | H-12 | | |
| 9-67 | H-13 | | |
| 9-68 | H-14 | | |
| 9-69 | H-15 | | |
| 9-70 | H-16 | | |
| 9-71 | H-17 | | |
| 9-72 | H-18 | | |
TABLE 10
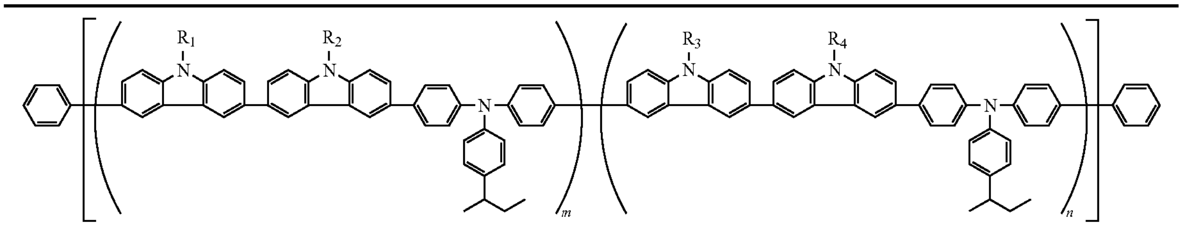
| Compound | R1 = R2 = R3 | R4 |
|---|---|---|
| 10-1 | H-1 | H-29 |
| 10-2 | H-2 | |
| 10-3 | H-3 | |
| 10-4 | H-4 | |
| 10-5 | H-5 | |
| 10-6 | H-6 | |
| 10-7 | H-7 | |
| 10-8 | H-8 | |
| 10-9 | H-9 | |
| 10-10 | H-10 | |
| 10-11 | H-11 | |
| 10-12 | H-12 | |
| 10-13 | H-13 | |
| 10-14 | H-14 | |
| 10-15 | H-15 | |
| 10-16 | H-16 | |
| 10-17 | H-17 | |
| 10-18 | H-18 | |
| 10-19 | H-1 | H-30 |
| 10-20 | H-2 | |
| 10-21 | H-3 | |
| 10-22 | H-4 | |
| 10-23 | H-5 | |
| 10-24 | H-6 | |
| 10-25 | H-7 | |
| 10-26 | H-8 | |
| 10-27 | H-9 | |
| 10-28 | H-10 | |
| 10-29 | H-11 | |

TABLE 10-continued
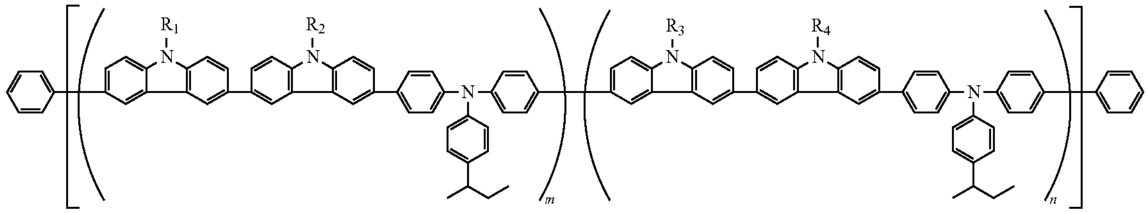
| | |
|---|---|
| 10-30 | H-12 |
| 10-31 | H-13 |
| 10-32 | H-14 |
| 10-33 | H-15 |
| 10-34 | H-16 |
| 10-35 | H-17 |
| 10-36 | H-18 |
| Compound | R1 = R3 | R2 | R4 |
|---|---|---|---|
| 10-37 | H-1 | H-1 | H-29 |
| 10-38 | H-2 | | |
| 10-39 | H-3 | | |
| 10-40 | H-4 | | |
| 10-41 | H-5 | | |
| 10-42 | H-6 | | |
| 10-43 | H-7 | | |
| 10-44 | H-8 | | |
| 10-45 | H-9 | | |
| 10-46 | H-10 | | |
| 10-47 | H-11 | | |
| 10-48 | H-12 | | |
| 10-49 | H-13 | | |
| 10-50 | H-14 | | |
| 10-51 | H-15 | | |
| 10-52 | H-16 | | |
| 10-53 | H-17 | | |
| 10-54 | H-18 | | |
| 10-55 | H-1 | H-1 | H-30 |
| 10-56 | H-2 | | |
| 10-57 | H-3 | | |
| 10-58 | H-4 | | |
| 10-59 | H-5 | | |
| 10-60 | H-6 | | |
| 10-61 | H-7 | | |
| 10-62 | H-8 | | |
| 10-63 | H-9 | | |
| 10-64 | H-10 | | |
| 10-65 | H-11 | | |
| 10-66 | H-12 | | |
| 10-67 | H-13 | | |
| 10-68 | H-14 | | |
| 10-69 | H-15 | | |
| 10-70 | H-16 | | |
| 10-71 | H-17 | | |
| 10-72 | H-18 | | |
TABLE 11-1
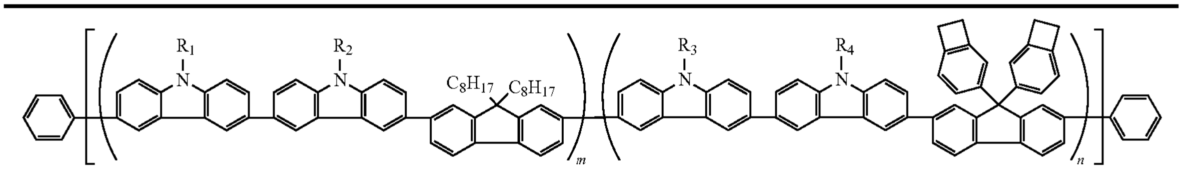
| Compound | R1 = R2 = R3 = R4 |
|---|---|
| 11-1 | H-1 |
| 11-2 | H-2 |
| 11-3 | H-3 |
| 11-4 | H-4 |
| 11-5 | H-5 |
| 11-6 | H-6 |
| 11-7 | H-7 |

TABLE 11-1-continued
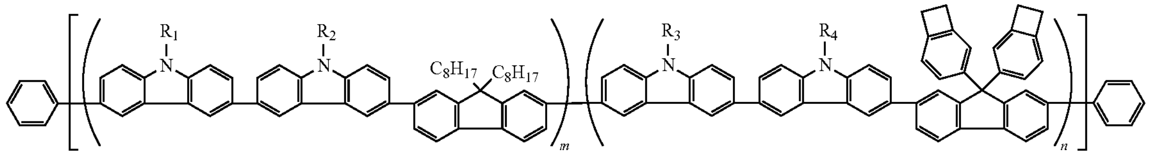
| | | |
|---|---|---|
| 11-8 | H-8 | |
| 11-9 | H-9 | |
| 11-10 | H-10 | |
| 11-11 | H-11 | |
| 11-12 | H-12 | |
| 11-13 | H-13 | |
| 11-14 | H-14 | |
| 11-15 | H-15 | |
| 11-16 | H-16 | |
| 11-17 | H-17 | |
| 11-18 | H-18 | |
| Compound | R1 = R3 | R2 = R4 |
|---|---|---|
| 11-19 | H-2 | H-1 |
| 11-20 | H-3 | |
| 11-21 | H-4 | |
| 11-22 | H-5 | |
| 11-23 | H-6 | |
| 11-24 | H-7 | |
| 11-25 | H-8 | |
| 11-26 | H-9 | |
| 11-27 | H-10 | |
| 11-28 | H-11 | |
| 11-29 | H-12 | |
| 11-30 | H-13 | |
| 11-31 | H-14 | |
| 11-32 | H-15 | |
| 11-33 | H-16 | |
| 11-34 | H-17 | |
| 11-35 | H-18 | |
| 11-36 | H-3 | H-2 |
| 11-37 | H-4 | |
| 11-38 | H-5 | |
| 11-39 | H-6 | |
| 11-40 | H-7 | |
| 11-41 | H-8 | |
| 11-42 | H-9 | |
| 11-43 | H-10 | |
| 11-44 | H-11 | |
| 11-45 | H-12 | |
| 11-46 | H-13 | |
| 11-47 | H-14 | |
| 11-48 | H-15 | |
| 11-49 | H-16 | |
| 11-50 | H-17 | |
| 11-51 | H-18 | |
| 11-52 | H-4 | H-3 |
| 11-53 | H-5 | |
| 11-54 | H-6 | |
| 11-55 | H-7 | |
| 11-56 | H-8 | |
| 11-57 | H-9 | |
| 11-58 | H-10 | |
| 11-59 | H-11 | |
| 11-60 | H-12 | |
| 11-61 | H-13 | |
| 11-62 | H-14 | |
| 11-63 | H-15 | |
| 11-64 | H-16 | |
| 11-65 | H-17 | |
| 11-66 | H-18 | |
| 11-67 | H-5 | H-4 |
| 11-68 | H-6 | |
| 11-69 | H-7 | |
| 11-70 | H-8 | |
| 11-71 | H-9 | |
| 11-72 | H-10 | |
| 11-73 | H-11 | |
| 11-74 | H-12 | |
| 11-75 | H-13 | |

TABLE 11-1-continued
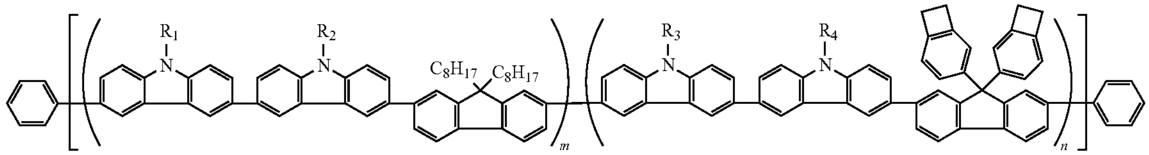
| | | |
|---|---|---|
| 11-76 | H-14 | |
| 11-77 | H-15 | |
| 11-78 | H-16 | |
| 11-79 | H-17 | |
| 11-80 | H-18 | |
| 11-81 | H-6 | H-5 |
| 11-82 | H-7 | |
| 11-83 | H-8 | |
| 11-84 | H-9 | |
| 11-85 | H-10 | |
| 11-86 | H-11 | |
| 11-87 | H-12 | |
| 11-88 | H-13 | |
| 11-89 | H-14 | |
| 11-90 | H-15 | |
| 11-91 | H-16 | |
| 11-92 | H-17 | |
| 11-93 | H-18 | |
| 11-94 | H-7 | H-6 |
| 11-95 | H-8 | |
| 11-96 | H-9 | |
| 11-97 | H-10 | |
| 11-98 | H-11 | |
| 11-99 | H-12 | |
| 11-100 | H-13 | |
| 11-101 | H-14 | |
| 11-102 | H-15 | |
| 11-103 | H-16 | |
| 11-104 | H-17 | |
| 11-105 | H-18 | |
| 11-106 | H-8 | H7 |
| 11-107 | H-9 | |
| 11-108 | H-10 | |
| 11-109 | H-11 | |
| 11-110 | H-12 | |
| 11-111 | H-13 | |
| 11-112 | H-14 | |
| 11-113 | H-15 | |
| 11-114 | H-16 | |
| 11-115 | H-17 | |
| 11-116 | H-18 | |
TABLE 11-2
| Compound | R1 = R3 | R2 = R4 |
|---|---|---|
| 11-117 | H-9 | H-8 |
| 11-118 | H-10 | |
| 11-119 | H-11 | |
| 11-120 | H-12 | |
| 11-121 | H-13 | |
| 11-122 | H-14 | |
| 11-123 | H-15 | |
| 11-124 | H-16 | |
| 11-125 | H-17 | |
| 11-126 | H-18 | |
| 11-127 | H-10 | H-9 |
| 11-128 | H-11 | |
| 11-129 | H-12 | |
| 11-130 | H-13 | |
| 11-131 | H-14 | |
| 11-132 | H-15 | |
| 11-133 | H-16 | |
| 11-134 | H-17 | |
| 11-135 | H-18 | |
| 11-136 | H-11 | H-10 |
| 11-137 | H-12 | |
| 11-138 | H-13 | |
| 11-139 | H-14 | |
| 11-140 | H-15 | |
| 11-141 | H-16 | |
| 11-142 | H-17 | |
| 11-143 | H-18 | |
| 11-144 | H-12 | H-11 |
| 11-145 | H-13 | |
| 11-146 | H-14 | |
| 11-147 | H-15 | |
| 11-148 | H-16 | |
| 11-149 | H-17 | |
| 11-150 | H-18 | |
| 11-151 | H-13 | H-12 |
| 11-152 | H-14 | |
| 11-153 | H-15 | |
| 11-154 | H-16 | |
| 11-155 | H-17 | |
| 11-156 | H-18 | |
| 11-157 | H-14 | H-13 |
| 11-158 | H-15 | |
| 11-159 | H-16 | |
| 11-160 | H-17 | |
| 11-161 | H-18 | |
| 11-162 | H-15 | H-14 |

TABLE 11-2-continued
| Compound | R1 = R3 | R2 = R4 |
|---|---|---|
| 11-163 | H-16 | |
| 11-164 | H-17 | |
| 11-165 | H-18 | |
| 11-166 | H-16 | H-15 |
| 11-167 | H-17 | |
| 11-168 | H-18 | |
| 11-169 | H-17 | H-16 |
| 11-170 | H-18 | |
| 11-171 | H-18 | H-17 |
TABLE 12-1
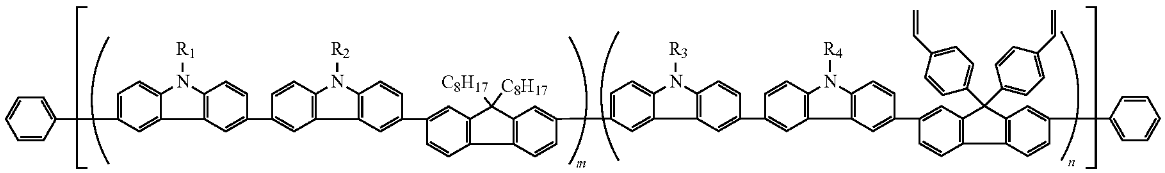
| Compound | R1 = R2 = R3 = R4 |
|---|---|
| 12-1 | H-1 |
| 12-2 | H-2 |
| 12-3 | H-3 |
| 12-4 | H-4 |
| 12-5 | H-5 |
| 12-6 | H-6 |
| 12-7 | H-7 |
| 12-8 | H-8 |
| 12-9 | H-9 |
| 12-10 | H-10 |
| 12-11 | H-11 |
| 12-12 | H-12 |
| 12-13 | H-13 |
| 12-14 | H-14 |
| 12-15 | H-15 |
| 12-16 | H-16 |
| 12-17 | H-17 |
| 12-18 | H-18 |
| Compound | R1 = R3 | R2 = R4 |
|---|---|---|
| 12-19 | H-2 | H-1 |
| 12-20 | H-3 | |
| 12-21 | H-4 | |
| 12-22 | H-5 | |
| 12-23 | H-6 | |
| 12-24 | H-7 | |
| 12-25 | H-8 | |
| 12-26 | H-9 | |
| 12-27 | H-10 | |
| 12-28 | H-11 | |
| 12-29 | H-12 | |
| 12-30 | H-13 | |
| 12-31 | H-14 | |
| 12-32 | H-15 | |
| 12-33 | H-16 | |
| 12-34 | H-17 | |
| 12-35 | H-18 | |
| 12-36 | H-3 | H-2 |
| 12-37 | H-4 | |
| 12-38 | H-5 | |
| 12-39 | H-6 | |
| 12-40 | H-7 | |
| 12-41 | H-8 | |
| 12-42 | H-9 | |
| 12-43 | H-10 | |
| 12-44 | H-11 | |
| 12-45 | H-12 | |
| 12-46 | H-13 | |
| 12-47 | H-14 | |
| 12-48 | H-15 | |
| 12-49 | H-16 | |
| 12-50 | H-17 | |
| 12-51 | H-18 | |
| 12-52 | H-4 | H-3 |
| 12-53 | H-5 | |
| 12-54 | H-6 | |

TABLE 12-1-continued
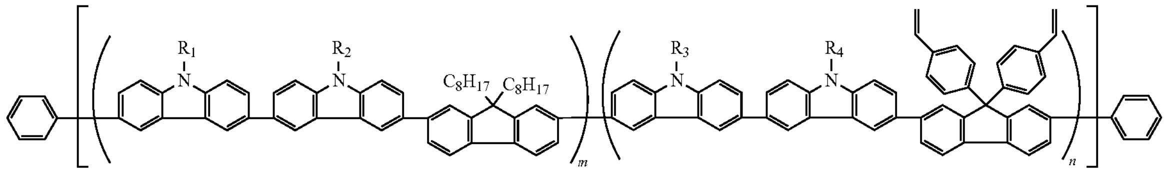
| | | |
|---|---|---|
| 12-55 | H-7 | |
| 12-56 | H-8 | |
| 12-57 | H-9 | |
| 12-58 | H-10 | |
| 12-59 | H-11 | |
| 12-60 | H-12 | |
| 12-61 | H-13 | |
| 12-62 | H-14 | |
| 12-63 | H-15 | |
| 12-64 | H-16 | |
| 12-65 | H-17 | |
| 12-66 | H-18 | |
| 12-67 | H-5 | H-4 |
| 12-68 | H-6 | |
| 12-69 | H-7 | |
| 12-70 | H-8 | |
| 12-71 | H-9 | |
| 12-72 | H-10 | |
| 12-73 | H-11 | |
| 12-74 | H-12 | |
| 12-75 | H-13 | |
| 12-76 | H-14 | |
| 12-77 | H-15 | |
| 12-78 | H-16 | |
| 12-79 | H-17 | |
| 12-80 | H-18 | |
| 12-81 | H-6 | H-5 |
| 12-82 | H-7 | |
| 12-83 | H-8 | |
| 12-84 | H-9 | |
| 12-85 | H-10 | |
| 12-86 | H-11 | |
| 12-87 | H-12 | |
| 12-88 | H-13 | |
| 12-89 | H-14 | |
| 12-90 | H-15 | |
| 12-91 | H-16 | |
| 12-92 | H-17 | |
| 12-93 | H-18 | |
| 12-94 | H-7 | H-6 |
| 12-95 | H-8 | |
| 12-96 | H-9 | |
| 12-97 | H-10 | |
| 12-98 | H-11 | |
| 12-99 | H-12 | |
| 12-100 | H-13 | |
| 12-101 | H-14 | |
| 12-102 | H-15 | |
| 12-103 | H-16 | |
| 12-104 | H-17 | |
| 12-105 | H-18 | |
| 12-106 | H-8 | H7 |
| 12-107 | H-9 | |
| 12-108 | H-10 | |
| 12-109 | H-11 | |
| 12-110 | H-12 | |
| 12-111 | H-13 | |
| 12-112 | H-14 | |
| 12-113 | H-15 | |
| 12-114 | H-16 | |
| 12-115 | H-17 | |
| 12-116 | H-18 | |

TABLE 12-2
| Compound | R1 = R3 | R2 = R4 |
|---|---|---|
| 12-117 | H-9 | H-8 |
| 12-118 | H-10 | |
| 12-119 | H-11 | |
| 12-120 | H-12 | |
| 12-121 | H-13 | |
| 12-122 | H-14 | |
| 12-123 | H-15 | |
| 12-124 | H-16 | |
| 12-125 | H-17 | |
| 12-126 | H-18 | |
| 12-127 | H-10 | H-9 |
| 12-128 | H-11 | |
| 12-129 | H-12 | |
| 12-130 | H-13 | |
| 12-131 | H-14 | |
| 12-132 | H-15 | |
| 12-133 | H-16 | |
| 12-134 | H-17 | |
| 12-135 | H-18 | |
| 12-136 | H-11 | H-10 |
| 12-137 | H-12 | |
| 12-138 | H-13 | |
| 12-139 | H-14 | |
| 12-140 | H-15 | |
| 12-141 | H-16 | |
| 12-142 | H-17 | |
| 12-143 | H-18 | |
| 12-144 | H-12 | H-11 |
TABLE 12-2-continued
| Compound | R1 = R3 | R2 = R4 |
|---|---|---|
| 12-145 | H-13 | |
| 12-146 | H-14 | |
| 12-147 | H-15 | |
| 12-148 | H-16 | |
| 12-149 | H-17 | |
| 12-150 | H-18 | |
| 12-151 | H-13 | H-12 |
| 12-152 | H-14 | |
| 12-153 | H-15 | |
| 12-154 | H-16 | |
| 12-155 | H-17 | |
| 12-156 | H-18 | |
| 12-157 | H-14 | H-13 |
| 12-158 | H-15 | |
| 12-159 | H-16 | |
| 12-160 | H-17 | |
| 12-161 | H-18 | |
| 12-162 | H-15 | H-14 |
| 12-163 | H-16 | |
| 12-164 | H-17 | |
| 12-165 | H-18 | |
| 12-166 | H-16 | H-15 |
| 12-167 | H-17 | |
| 12-168 | H-18 | |
| 12-169 | H-17 | H-16 |
| 12-170 | H-18 | |
| 12-171 | H-18 | H-17 |
TABLE 13-1
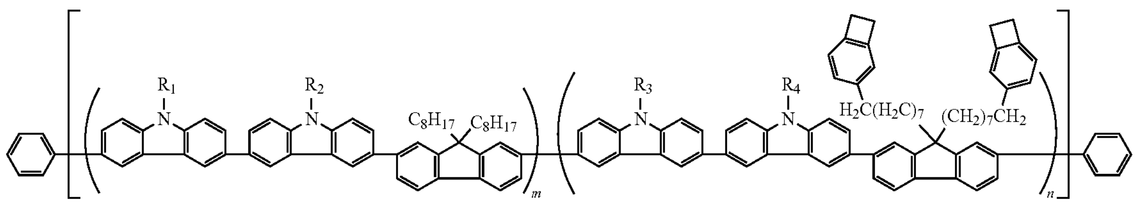
| Compound | R1 = R2 = R3 = R4 |
|---|---|
| 13-1 | H-1 |
| 13-2 | H-2 |
| 13-3 | H-3 |
| 13-4 | H-4 |
| 13-5 | H-5 |
| 13-6 | H-6 |
| 13-7 | H-7 |
| 13-8 | H-8 |
| 13-9 | H-9 |
| 13-10 | H-10 |
| 13-11 | H-11 |
| 13-12 | H-12 |
| 13-13 | H-13 |
| 13-14 | H-14 |
| 13-15 | H-15 |
| 13-16 | H-16 |
| 13-17 | H-17 |
| 13-18 | H-18 |
| Compound | R1 = R3 | R2 = R4 |
|---|---|---|
| 13-19 | H-2 | H-1 |
| 13-20 | H-3 | |
| 13-21 | H-4 | |
| 13-22 | H-5 | |
| 13-23 | H-6 | |
| 13-24 | H-7 | |
| 13-25 | H-8 | |
| 13-26 | H-9 | |
| 13-27 | H-10 | |
| 13-28 | H-11 | |
| 13-29 | H-12 | |
| 13-30 | H-13 | |

TABLE 13-1-continued
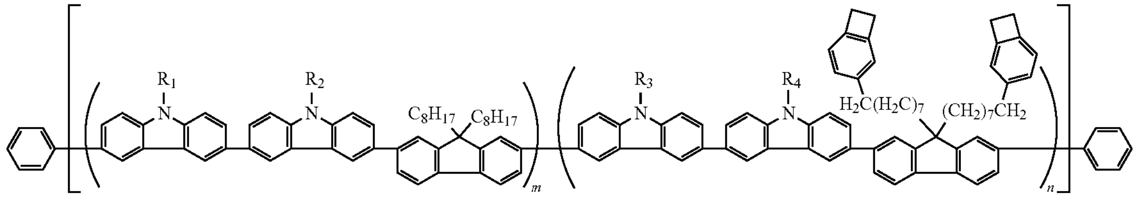
| | | |
|---|---|---|
| 13-31 | H-14 | |
| 13-32 | H-15 | |
| 13-33 | H-16 | |
| 13-34 | H-17 | |
| 13-35 | H-18 | |
| 13-36 | H-3 | H-2 |
| 13-37 | H-4 | |
| 13-38 | H-5 | |
| 13-39 | H-6 | |
| 13-40 | H-7 | |
| 13-41 | H-8 | |
| 13-42 | H-9 | |
| 13-43 | H-10 | |
| 13-44 | H-11 | |
| 13-45 | H-12 | |
| 13-46 | H-13 | |
| 13-47 | H-14 | |
| 13-48 | H-15 | |
| 13-49 | H-16 | |
| 13-50 | H-17 | |
| 13-51 | H-18 | |
| 13-52 | H-4 | H-3 |
| 13-53 | H-5 | |
| 13-54 | H-6 | |
| 13-55 | H-7 | |
| 13-56 | H-8 | |
| 13-57 | H-9 | |
| 13-58 | H-10 | |
| 13-59 | H-11 | |
| 13-60 | H-12 | |
| 13-61 | H-13 | |
| 13-62 | H-14 | |
| 13-63 | H-15 | |
| 13-64 | H-16 | |
| 13-65 | H-17 | |
| 13-66 | H-18 | |
| 13-67 | H-5 | H-4 |
| 13-68 | H-6 | |
| 13-69 | H-7 | |
| 13-70 | H-8 | |
| 13-71 | H-9 | |
| 13-72 | H-10 | |
| 13-73 | H-11 | |
| 13-74 | H-12 | |
| 13-75 | H-13 | |
| 13-76 | H-14 | |
| 13-77 | H-15 | |
| 13-78 | H-16 | |
| 13-79 | H-17 | |
| 13-80 | H-18 | |
| 13-81 | H-6 | H-5 |
| 13-82 | H-7 | |
| 13-83 | H-8 | |
| 13-84 | H-9 | |
| 13-85 | H-10 | |
| 13-86 | H-11 | |
| 13-87 | H-12 | |
| 13-88 | H-13 | |
| 13-89 | H-14 | |
| 13-90 | H-15 | |
| 13-91 | H-16 | |
| 13-92 | H-17 | |
| 13-93 | H-18 | |

TABLE 13-1-continued
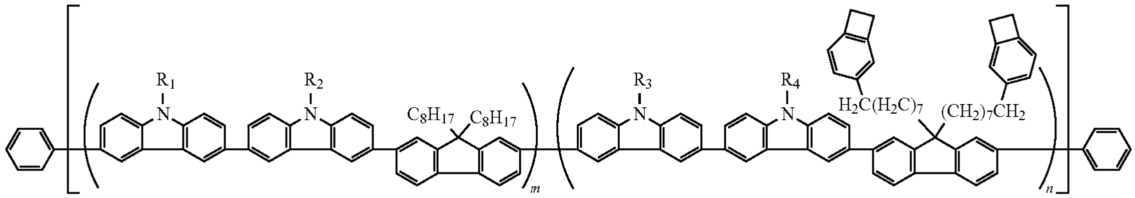
| | | |
|---|---|---|
| 13-94 | H-7 | H-6 |
| 13-95 | H-8 | |
| 13-96 | H-9 | |
| 13-97 | H-10 | |
| 13-98 | H-11 | |
| 13-99 | H-12 | |
| 13-100 | H-13 | |
| 13-101 | H-14 | |
| 13-102 | H-15 | |
| 13-103 | H-16 | |
| 13-104 | H-17 | |
| 13-105 | H-18 | |
| 13-106 | H-8 | H7 |
| 13-107 | H-9 | |
| 13-108 | H-10 | |
| 13-109 | H-11 | |
| 13-110 | H-12 | |
| 13-111 | H-13 | |
| 13-112 | H-14 | |
| 13-113 | H-15 | |
| 13-114 | H-16 | |
| 13-115 | H-17 | |
| 13-116 | H-18 | |
TABLE 13-2
| Compound | R1 = R3 | R2 = R4 |
|---|---|---|
| 13-117 | H-9 | H-8 |
| 13-118 | H-10 | |
| 13-119 | H-11 | |
| 13-120 | H-12 | |
| 13-121 | H-13 | |
| 13-122 | H-14 | |
| 13-123 | H-15 | |
| 13-124 | H-16 | |
| 13-125 | H-17 | |
| 13-126 | H-18 | |
| 13-127 | H-10 | H-9 |
| 13-128 | H-11 | |
| 13-129 | H-12 | |
| 13-130 | H-13 | |
| 13-131 | H-14 | |
| 13-132 | H-15 | |
| 13-133 | H-16 | |
| 13-134 | H-17 | |
| 13-135 | H-18 | |
| 13-136 | H-11 | H-10 |
| 13-137 | H-12 | |
| 13-138 | H-13 | |
| 13-139 | H-14 | |
| 13-140 | H-15 | |
| 13-141 | H-16 | |
| 13-142 | H-17 | |
| 13-143 | H-18 | |
TABLE 13-2-continued
| Compound | R1 = R3 | R2 = R4 |
|---|---|---|
| 13-144 | H-12 | H-11 |
| 13-145 | H-13 | |
| 13-146 | H-14 | |
| 13-147 | H-15 | |
| 13-148 | H-16 | |
| 13-149 | H-17 | |
| 13-150 | H-18 | |
| 13-151 | H-13 | H-12 |
| 13-152 | H-14 | |
| 13-153 | H-15 | |
| 13-154 | H-16 | |
| 13-155 | H-17 | |
| 13-156 | H-18 | |
| 13-157 | H-14 | H-13 |
| 13-158 | H-15 | |
| 13-159 | H-16 | |
| 13-160 | H-17 | |
| 13-161 | H-18 | |
| 13-162 | H-15 | H-14 |
| 13-163 | H-16 | |
| 13-164 | H-17 | |
| 13-165 | H-18 | |
| 13-166 | H-16 | H-15 |
| 13-167 | H-17 | |
| 13-168 | H-18 | |
| 13-169 | H-17 | H-16 |
| 13-170 | H-18 | |
| 13-171 | H-18 | H-17 |

TABLE 14-1
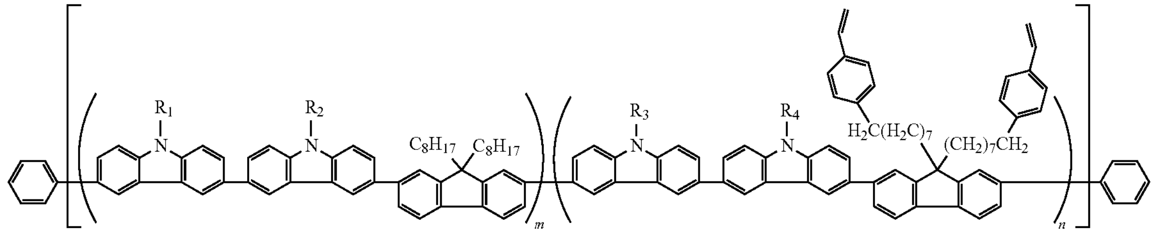
| Compound | R1 = R2 = R3 = R4 | |
|---|---|---|
| 14-1 | H-1 | |
| 14-2 | H-2 | |
| 14-3 | H-3 | |
| 14-4 | H-4 | |
| 14-5 | H-5 | |
| 14-6 | H-6 | |
| 14-7 | H-7 | |
| 14-8 | H-8 | |
| 14-9 | H-9 | |
| 14-10 | H-10 | |
| 14-11 | H-11 | |
| 14-12 | H-12 | |
| 14-13 | H-13 | |
| 14-14 | H-14 | |
| 14-15 | H-15 | |
| 14-16 | H-16 | |
| 14-17 | H-17 | |
| 14-18 | H-18 | |
| **Compound** | **R1 = R3** | **R2 = R4** |
| 14-19 | H-2 | H-1 |
| 14-20 | H-3 | |
| 14-21 | H-4 | |
| 14-22 | H-5 | |
| 14-23 | H-6 | |
| 14-24 | H-7 | |
| 14-25 | H-8 | |
| 14-26 | H-9 | |
| 14-27 | H-10 | |
| 14-28 | H-11 | |
| 14-29 | H-12 | |
| 14-30 | H-13 | |
| 14-31 | H-14 | |
| 14-32 | H-15 | |
| 14-33 | H-16 | |
| 14-34 | H-17 | |
| 14-35 | H-18 | |
| 14-36 | H-3 | H-2 |
| 14-37 | H-4 | |
| 14-38 | H-5 | |
| 14-39 | H-6 | |
| 14-40 | H-7 | |
| 14-41 | H-8 | |
| 14-42 | H-9 | |
| 14-43 | H-10 | |
| 14-44 | H-11 | |
| 14-45 | H-12 | |
| 14-46 | H-13 | |
| 14-47 | H-14 | |
| 14-48 | H-15 | |
| 14-49 | H-16 | |
| 14-50 | H-17 | |
| 14-51 | H-18 | |
| 14-52 | H-4 | H-3 |
| 14-53 | H-5 | |
| 14-54 | H-6 | |
| 14-55 | H-7 | |
| 14-56 | H-8 | |
| 14-57 | H-9 | |
| 14-58 | H-10 | |
| 14-59 | H-11 | |
| 14-60 | H-12 | |
| 14-61 | H-13 | |
| 14-62 | H-14 | |
| 14-63 | H-15 | |

TABLE 14-1-continued
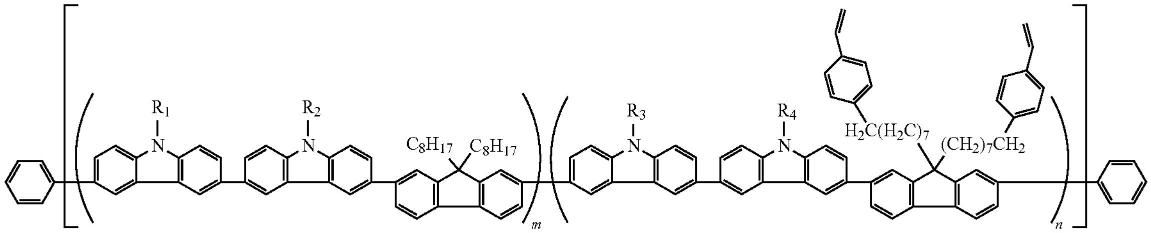
| | | |
|---|---|---|
| 14-64 | H-16 | |
| 14-65 | H-17 | |
| 14-66 | H-18 | |
| 14-67 | H-5 | H-4 |
| 14-68 | H-6 | |
| 14-69 | H-7 | |
| 14-70 | H-8 | |
| 14-71 | H-9 | |
| 14-72 | H-10 | |
| 14-73 | H-11 | |
| 14-74 | H-12 | |
| 14-75 | H-13 | |
| 14-76 | H-14 | |
| 14-77 | H-15 | |
| 14-78 | H-16 | |
| 14-79 | H-17 | |
| 14-80 | H-18 | |
| 14-81 | H-6 | H-5 |
| 14-82 | H-7 | |
| 14-83 | H-8 | |
| 14-84 | H-9 | |
| 14-85 | H-10 | |
| 14-86 | H-11 | |
| 14-87 | H-12 | |
| 14-88 | H-13 | |
| 14-89 | H-14 | |
| 14-90 | H-15 | |
| 14-91 | H-16 | |
| 14-92 | H-17 | |
| 14-93 | H-18 | |
| 14-94 | H-7 | H-6 |
| 14-95 | H-8 | |
| 14-96 | H-9 | |
| 14-97 | H-10 | |
| 14-98 | H-11 | |
| 14-99 | H-12 | |
| 14-100 | H-13 | |
| 14-101 | H-14 | |
| 14-102 | H-15 | |
| 14-103 | H-16 | |
| 14-104 | H-17 | |
| 14-105 | H-18 | |
| 14-106 | H-8 | H7 |
| 14-107 | H-9 | |
| 14-108 | H-10 | |
| 14-109 | H-11 | |
| 14-110 | H-12 | |
| 14-111 | H-13 | |
| 14-112 | H-14 | |
| 14-113 | H-15 | |
| 14-114 | H-16 | |
| 14-115 | H-17 | |
| 14-116 | H-18 | |
TABLE 14-2
| Compound | R1 = R3 | R2 = R4 |
|---|---|---|
| 14-117 | H-9 | H-8 |
| 14-118 | H-10 | |
| 14-119 | H-11 | |
| 14-120 | H-12 | |
| 14-121 | H-13 | |
| 14-122 | H-14 | |
| 14-123 | H-15 | |
TABLE 14-2-continued
| Compound | R1 = R3 | R2 = R4 |
|---|---|---|
| 14-124 | H-16 | |
| 14-125 | H-17 | |
| 14-126 | H-18 | |
| 14-127 | H-10 | H-9 |
| 14-128 | H-11 | |
| 14-129 | H-12 | |
| 14-130 | H-13 | |

TABLE 14-2-continued
| Compound | R1 = R3 | R2 = R4 |
|---|---|---|
| 14-131 | H-14 | |
| 14-132 | H-15 | |
| 14-133 | H-16 | |
| 14-134 | H-17 | |
| 14-135 | H-18 | |
| 14-136 | H-11 | H-10 |
| 14-137 | H-12 | |
| 14-138 | H-13 | |
| 14-139 | H-14 | |
| 14-140 | H-15 | |
| 14-141 | H-16 | |
| 14-142 | H-17 | |
| 14-143 | H-18 | |
| 14-144 | H-12 | H-11 |
| 14-145 | H-13 | |
| 14-146 | H-14 | |
| 14-147 | H-15 | |
| 14-148 | H-16 | |
| 14-149 | H-17 | |
| 14-150 | H-18 | |
| 14-151 | H-13 | H-12 |
| 14-152 | H-14 | |
| 14-153 | H-15 | |
| 14-154 | H-16 | |
| 14-155 | H-17 | |
| 14-156 | H-18 | |
| 14-157 | H-14 | H-13 |
| 14-158 | H-15 | |
| 14-159 | H-16 | |
| 14-160 | H-17 | |
| 14-161 | H-18 | |
| 14-162 | H-15 | H-14 |
| 14-163 | H-16 | |
| 14-164 | H-17 | |
| 14-165 | H-18 | |
| 14-166 | H-16 | H-15 |
| 14-167 | H-17 | |
| 14-168 | H-18 | |
| 14-169 | H-17 | H-16 |
| 14-170 | H-18 | |
| 14-171 | H-18 | H-17 |
TABLE 15
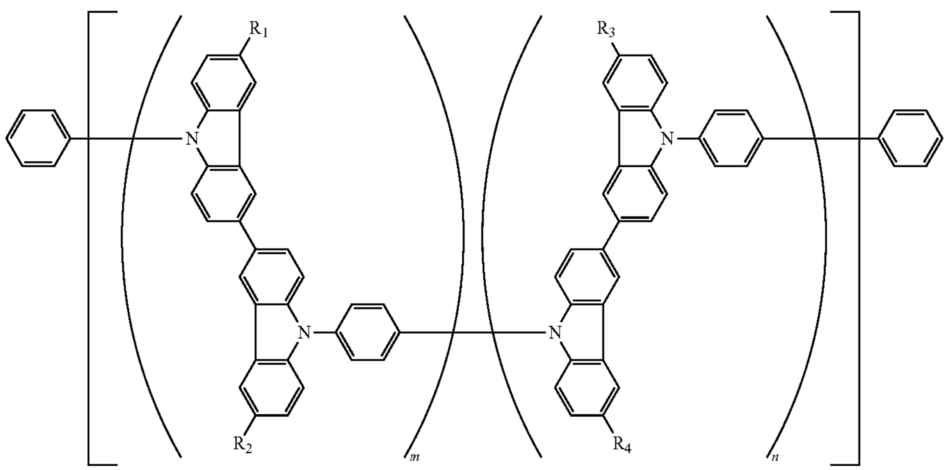
| Compound | R1 = R2 | R3 = R4 |
|---|---|---|
| 15-1 | H | H-29 |
| 15-2 | H-1 | |
| 15-3 | H-2 | |
| 15-4 | H-3 | |
| 15-5 | H-4 | |
| 15-6 | H-5 | |
| 15-7 | H-6 | |
| 15-8 | H-7 | |
| 15-9 | H-8 | |
| 15-10 | H-9 | |
| 15-11 | H-10 | |
| 15-12 | H-11 | |
| 15-13 | H-12 | |
| 15-14 | H-13 | |
| 15-15 | H-14 | |
| 15-16 | H-15 | |
| 15-17 | H-16 | |
| 15-18 | H-17 | |
| 15-19 | H-18 | |
| 15-20 | H | H-30 |
| 15-21 | H-1 | |
| 15-22 | H-2 | |
| 15-23 | H-3 | |
| 15-24 | H-4 | |
| 15-25 | H-5 | |
| 15-26 | H-6 | |
| 15-27 | H-7 | |
| 15-28 | H-8 | |

TABLE 15-continued
| | |
|---|---|
| 15-29 | H-9 |
| 15-30 | H-10 |
| 15-31 | H-11 |
| 15-32 | H-12 |
| 15-33 | H-13 |
| 15-34 | H-14 |
| 15-35 | H-15 |
| 15-36 | H-16 |
| 15-37 | H-17 |
| 15-38 | H-18 |
TABLE 16
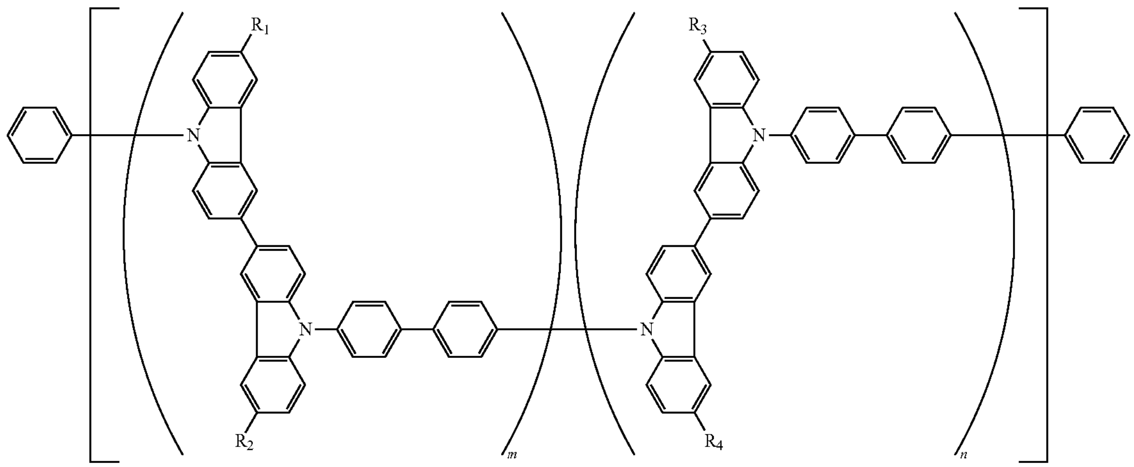
| Compound | R1 = R2 | R3 = R4 |
|---|---|---|
| 16-1 | H | H-29 |
| 16-2 | H-1 | |
| 16-3 | H-2 | |
| 16-4 | H-3 | |
| 16-5 | H-4 | |
| 16-6 | H-5 | |
| 16-7 | H-6 | |
| 16-8 | H-7 | |
| 16-9 | H-8 | |
| 16-10 | H-9 | |
| 16-11 | H-10 | |
| 16-12 | H-11 | |
| 16-13 | H-12 | |
| 16-14 | H-13 | |
| 16-15 | H-14 | |
| 16-16 | H-15 | |
| 16-17 | H-16 | |
| 16-18 | H-17 | |
| 16-19 | H-18 | |
| 16-20 | H | H-30 |
| 16-21 | H-1 | |
| 16-22 | H-2 | |
| 16-23 | H-3 | |
| 16-24 | H-4 | |
| 16-25 | H-5 | |
| 16-26 | H-6 | |
| 16-27 | H-7 | |
| 16-28 | H-8 | |
| 16-29 | H-9 | |
| 16-30 | H-10 | |
| 16-31 | H-11 | |
| 16-32 | H-12 | |
| 16-33 | H-13 | |
| 16-34 | H-14 | |
| 16-35 | H-15 | |
| 16-36 | H-16 | |
| 16-37 | H-17 | |
| 16-38 | H-18 | |

TABLE 17
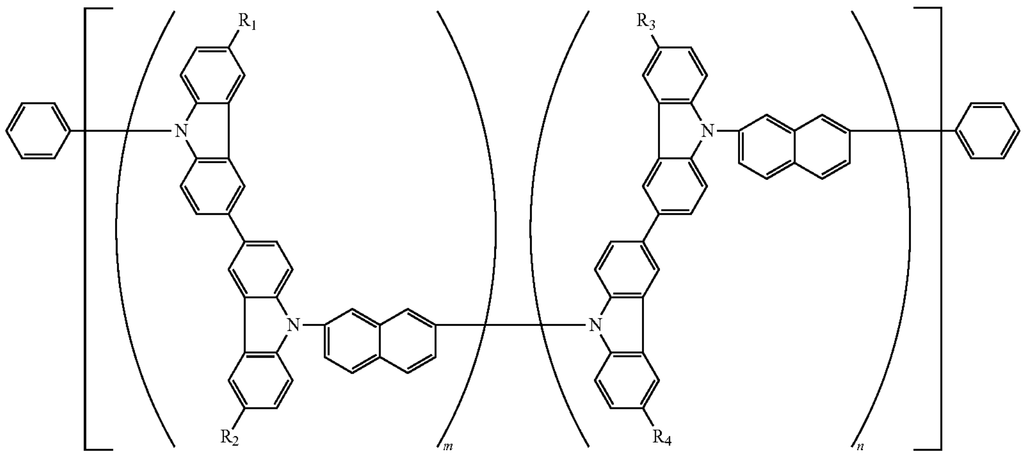
| Compound | R1 = R2 | R3 = R4 |
|---|---|---|
| 17-1 | H | H-29 |
| 17-2 | H-1 | |
| 17-3 | H-2 | |
| 17-4 | H-3 | |
| 17-5 | H-4 | |
| 17-6 | H-5 | |
| 17-7 | H-6 | |
| 17-8 | H-7 | |
| 17-9 | H-8 | |
| 17-10 | H-9 | |
| 17-11 | H-10 | |
| 17-12 | H-11 | |
| 17-13 | H-12 | |
| 17-14 | H-13 | |
| 17-15 | H-14 | |
| 17-16 | H-15 | |
| 17-17 | H-16 | |
| 17-18 | H-17 | |
| 17-19 | H-18 | |
| 17-20 | H | H-30 |
| 17-21 | H-1 | |
| 17-22 | H-2 | |
| 17-23 | H-3 | |
| 17-24 | H-4 | |
| 17-25 | H-5 | |
| 17-26 | H-6 | |
| 17-27 | H-7 | |
| 17-28 | H-8 | |
| 17-29 | H-9 | |
| 17-30 | H-10 | |
| 17-31 | H-11 | |
| 17-32 | H-12 | |
| 17-33 | H-13 | |
| 17-34 | H-14 | |
| 17-35 | H-15 | |
| 17-36 | H-16 | |
| 17-37 | H-17 | |
| 17-38 | H-18 | |

TABLE 18
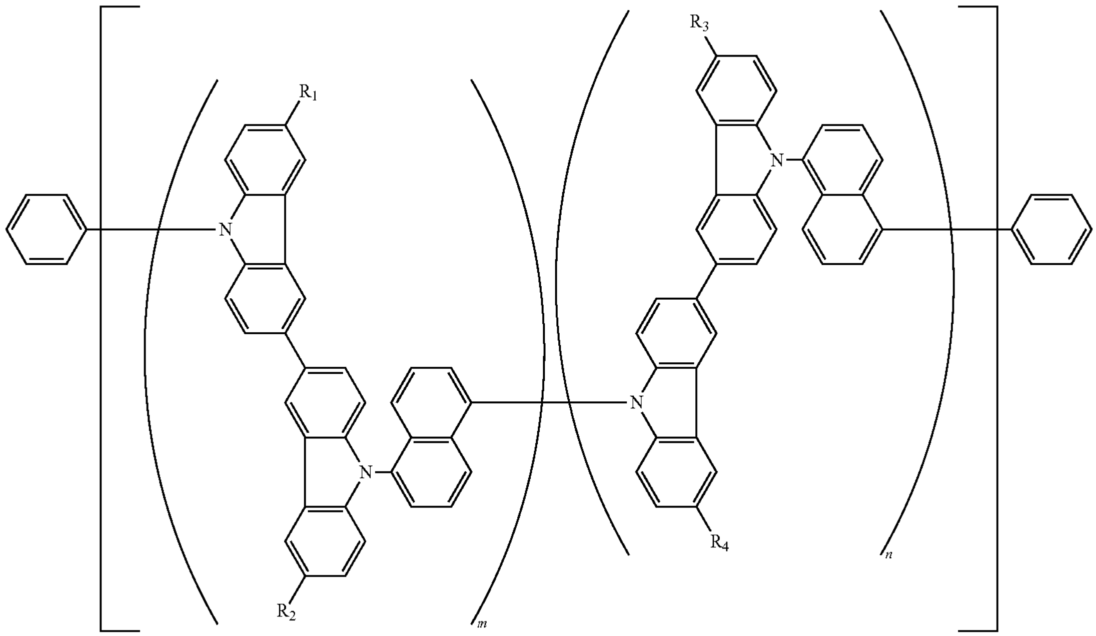
| Compound | R1 = R2 | R3 = R4 |
|---|---|---|
| 18-1 | H | H-29 |
| 18-2 | H-1 | |
| 18-3 | H-2 | |
| 18-4 | H-3 | |
| 18-5 | H-4 | |
| 18-6 | H-5 | |
| 18-7 | H-6 | |
| 18-8 | H-7 | |
| 18-9 | H-8 | |
| 18-10 | H-9 | |
| 18-11 | H-10 | |
| 18-12 | H-11 | |
| 18-13 | H-12 | |
| 18-14 | H-13 | |
| 18-15 | H-14 | |
| 18-16 | H-15 | |
| 18-17 | H-16 | |
| 18-18 | H-17 | |
| 18-19 | H-18 | |
| 18-20 | H | H-30 |
| 18-21 | H-1 | |
| 18-22 | H-2 | |
| 18-23 | H-3 | |
| 18-24 | H-4 | |
| 18-25 | H-5 | |
| 18-26 | H-6 | |
| 18-27 | H-7 | |
| 18-28 | H-8 | |
| 18-29 | H-9 | |
| 18-30 | H-10 | |
| 18-31 | H-11 | |
| 18-32 | H-12 | |
| 18-33 | H-13 | |
| 18-34 | H-14 | |
| 18-35 | H-15 | |
| 18-36 | H-16 | |
| 18-37 | H-17 | |
| 18-38 | H-18 | |

TABLE 19
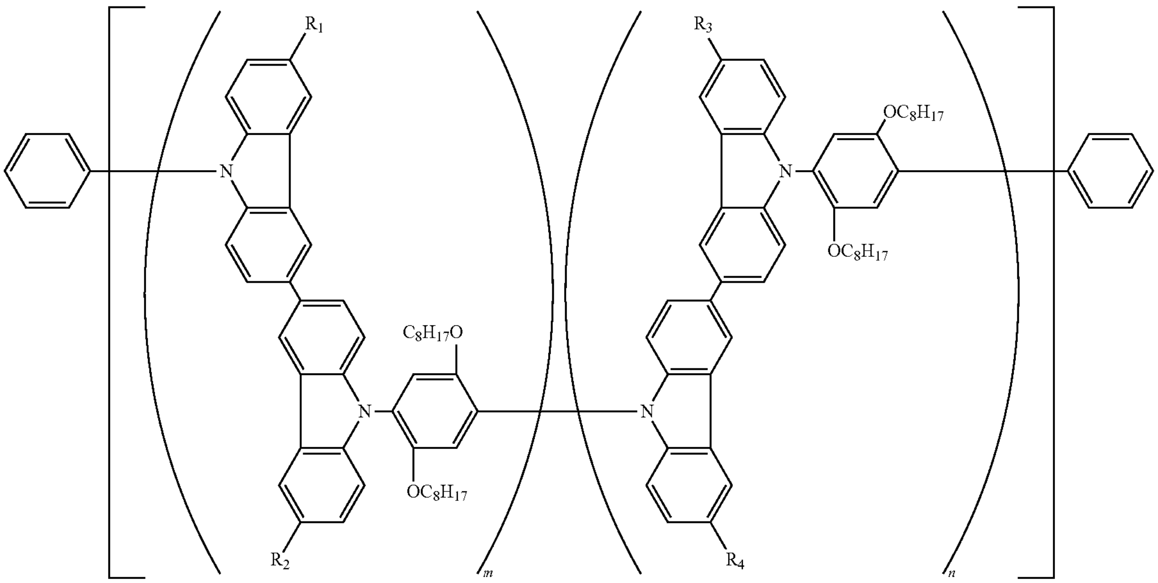
| Compound | R1 = R2 | R3 = R4 |
|---|---|---|
| 19-1 | H | H-29 |
| 19-2 | H-1 | |
| 19-3 | H-2 | |
| 19-4 | H-3 | |
| 19-5 | H-4 | |
| 19-6 | H-5 | |
| 19-7 | H-6 | |
| 19-8 | H-7 | |
| 19-9 | H-8 | |
| 19-10 | H-9 | |
| 19-11 | H-10 | |
| 19-12 | H-11 | |
| 19-13 | H-12 | |
| 19-14 | H-13 | |
| 19-15 | H-14 | |
| 19-16 | H-15 | |
| 19-17 | H-16 | |
| 19-18 | H-17 | |
| 19-19 | H-18 | |
| 19-20 | H | H-30 |
| 19-21 | H-1 | |
| 19-22 | H-2 | |
| 19-23 | H-3 | |
| 19-24 | H-4 | |
| 19-25 | H-5 | |
| 19-26 | H-6 | |
| 19-27 | H-7 | |
| 19-28 | H-8 | |
| 19-29 | H-9 | |
| 19-30 | H-10 | |
| 19-31 | H-11 | |
| 19-32 | H-12 | |
| 19-33 | H-13 | |
| 19-34 | H-14 | |
| 19-35 | H-15 | |
| 19-36 | H-16 | |
| 19-37 | H-17 | |
| 19-38 | H-18 | |

TABLE 20
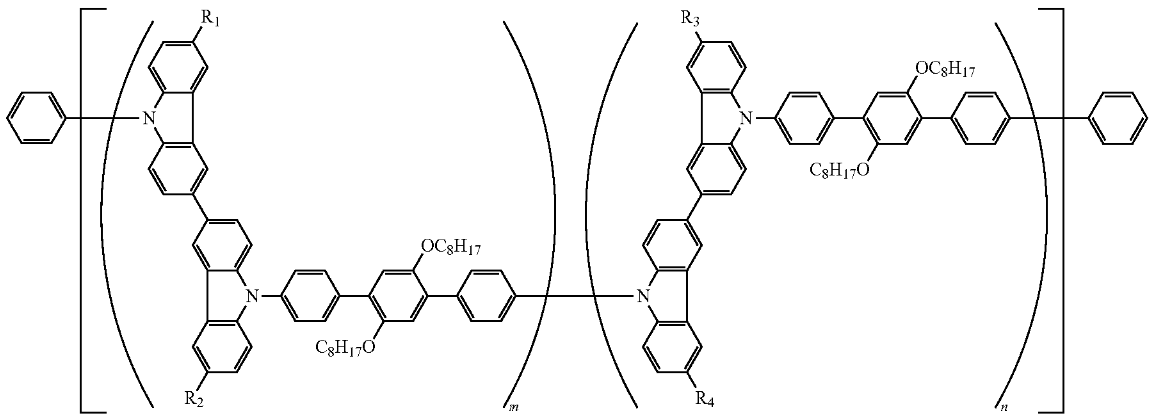
| Compound | R1 = R2 | R3 = R4 |
|---|---|---|
| 20-1 | H | H-29 |
| 20-2 | H-1 | |
| 20-3 | H-2 | |
| 20-4 | H-3 | |
| 20-5 | H-4 | |
| 20-6 | H-5 | |
| 20-7 | H-6 | |
| 20-8 | H-7 | |
| 20-9 | H-8 | |
| 20-10 | H-9 | |
| 20-11 | H-10 | |
| 20-12 | H-11 | |
| 20-13 | H-12 | |
| 20-14 | H-13 | |
| 20-15 | H-14 | |
| 20-16 | H-15 | |
| 20-17 | H-16 | |
| 20-18 | H-17 | |
| 20-19 | H-18 | |
| 20-20 | H | H-30 |
| 20-21 | H-1 | |
| 20-22 | H-2 | |
| 20-23 | H-3 | |
| 20-24 | H-4 | |
| 20-25 | H-5 | |
| 20-26 | H-6 | |
| 20-27 | H-7 | |
| 20-28 | H-8 | |
| 20-29 | H-9 | |
| 20-30 | H-10 | |
| 20-31 | H-11 | |
| 20-32 | H-12 | |
| 20-33 | H-13 | |
| 20-34 | H-14 | |
| 20-35 | H-15 | |
| 20-36 | H-16 | |
| 20-37 | H-17 | |
| 20-38 | H-18 | |

TABLE 21
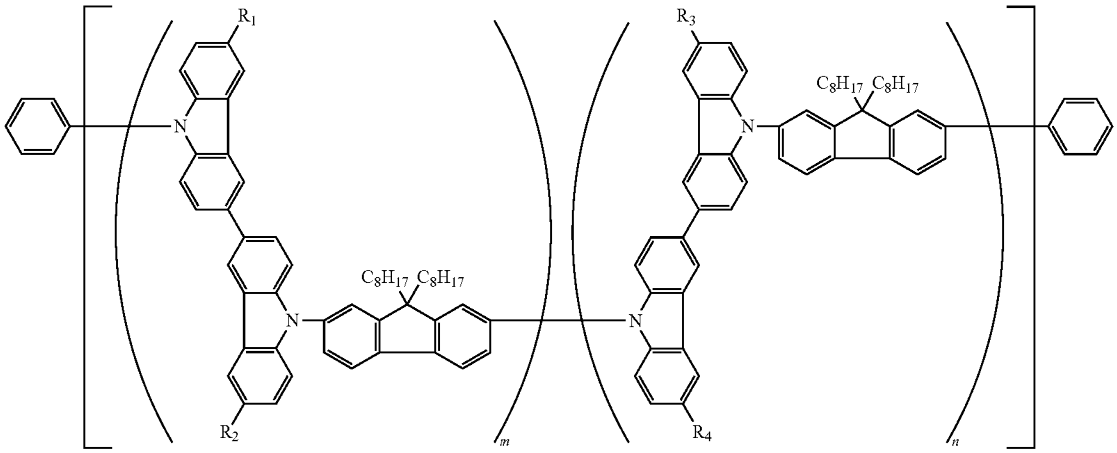
| Compound | R1 = R2 | R3 = R4 |
|---|---|---|
| 21-1 | H | H-29 |
| 21-2 | H-1 | |
| 21-3 | H-2 | |
| 21-4 | H-3 | |
| 21-5 | H-4 | |
| 21-6 | H-5 | |
| 21-7 | H-6 | |
| 21-8 | H-7 | |
| 21-9 | H-8 | |
| 21-10 | H-9 | |
| 21-11 | H-10 | |
| 21-12 | H-11 | |
| 21-13 | H-12 | |
| 21-14 | H-13 | |
| 21-15 | H-14 | |
| 21-16 | H-15 | |
| 21-17 | H-16 | |
| 21-18 | H-17 | |
| 21-19 | H-18 | |
| 21-20 | H | H-30 |
| 21-21 | H-1 | |
| 21-22 | H-2 | |
| 21-23 | H-3 | |
| 21-24 | H-4 | |
| 21-25 | H-5 | |
| 21-26 | H-6 | |
| 21-27 | H-7 | |
| 21-28 | H-8 | |
| 21-29 | H-9 | |
| 21-30 | H-10 | |
| 21-31 | H-11 | |
| 21-32 | H-12 | |
| 21-33 | H-13 | |
| 21-34 | H-14 | |
| 21-35 | H-15 | |
| 21-36 | H-16 | |
| 21-37 | H-17 | |
| 21-38 | H-18 | |

TABLE 22
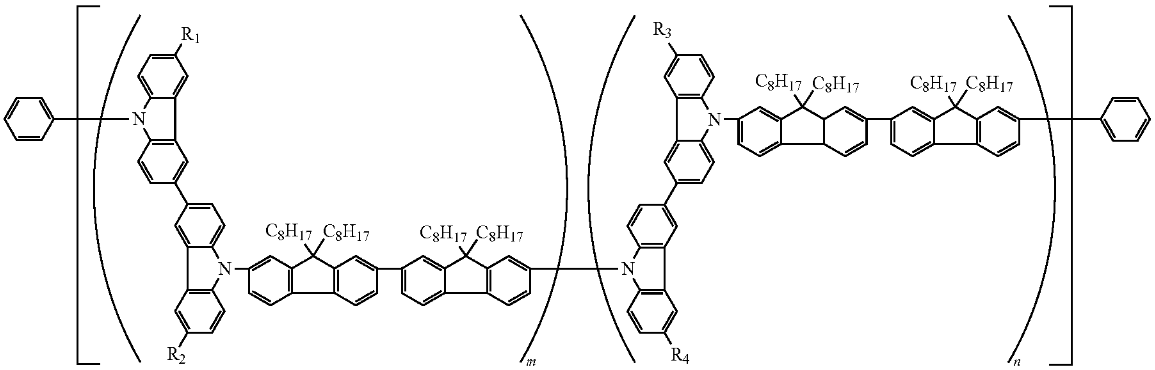
| Compound | R1 = R2 | R3 = R4 |
|---|---|---|
| 22-1 | H | H-29 |
| 22-2 | H-1 | |
| 22-3 | H-2 | |
| 22-4 | H-3 | |
| 22-5 | H-4 | |
| 22-6 | H-5 | |
| 22-7 | H-6 | |
| 22-8 | H-7 | |
| 22-9 | H-8 | |
| 22-10 | H-9 | |
| 22-11 | H-10 | |
| 22-12 | H-11 | |
| 22-13 | H-12 | |
| 22-14 | H-13 | |
| 22-15 | H-14 | |
| 22-16 | H-15 | |
| 22-17 | H-16 | |
| 22-18 | H-17 | |
| 22-19 | H-18 | |
| 22-20 | H | H-30 |
| 22-21 | H-1 | |
| 22-22 | H-2 | |
| 22-23 | H-3 | |
| 22-24 | H-4 | |
| 22-25 | H-5 | |
| 22-26 | H-6 | |
| 22-27 | H-7 | |
| 22-28 | H-8 | |
| 22-29 | H-9 | |
| 22-30 | H-10 | |
| 22-31 | H-11 | |
| 22-32 | H-12 | |
| 22-33 | H-13 | |
| 22-34 | H-14 | |
| 22-35 | H-15 | |
| 22-36 | H-16 | |
| 22-37 | H-17 | |
| 22-38 | H-18 | |

TABLE 23
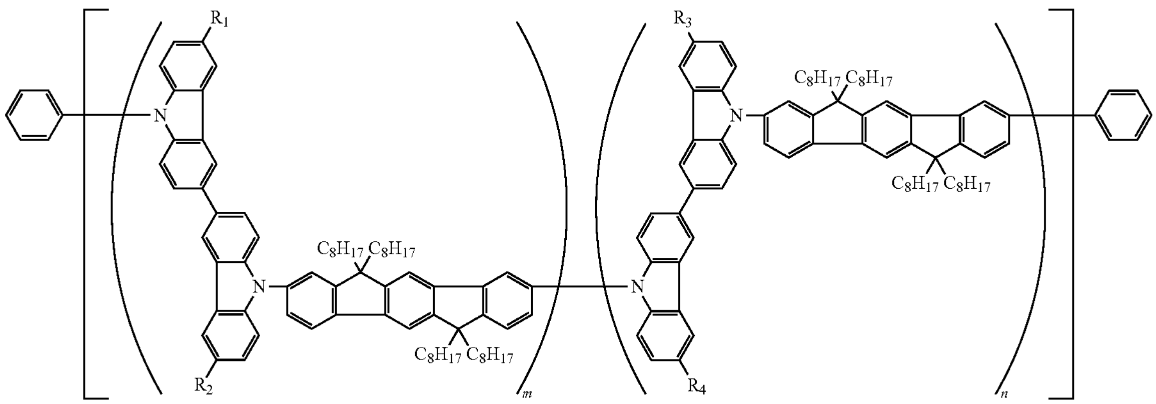
| Compound | R1 = R2 | R3 = R4 |
|---|---|---|
| 23-1 | H | H-29 |
| 23-2 | H-1 | |
| 23-3 | H-2 | |
| 23-4 | H-3 | |
| 23-5 | H-4 | |
| 23-6 | H-5 | |
| 23-7 | H-6 | |
| 23-8 | H-7 | |
| 23-9 | H-8 | |
| 23-10 | H-9 | |
| 23-11 | H-10 | |
| 23-12 | H-11 | |
| 23-13 | H-12 | |
| 23-14 | H-13 | |
| 23-15 | H-14 | |
| 23-16 | H-15 | |
| 23-17 | H-16 | |
| 23-18 | H-17 | |
| 23-19 | H-18 | |
| 23-20 | H | H-30 |
| 23-21 | H-1 | |
| 23-22 | H-2 | |
| 23-23 | H-3 | |
| 23-24 | H-4 | |
| 23-25 | H-5 | |
| 23-26 | H-6 | |
| 23-27 | H-7 | |
| 23-28 | H-8 | |
| 23-29 | H-9 | |
| 23-30 | H-10 | |
| 23-31 | H-11 | |
| 23-32 | H-12 | |
| 23-33 | H-13 | |
| 23-34 | H-14 | |
| 23-35 | H-15 | |
| 23-36 | H-16 | |
| 23-37 | H-17 | |
| 23-38 | H-18 | |

TABLE 24
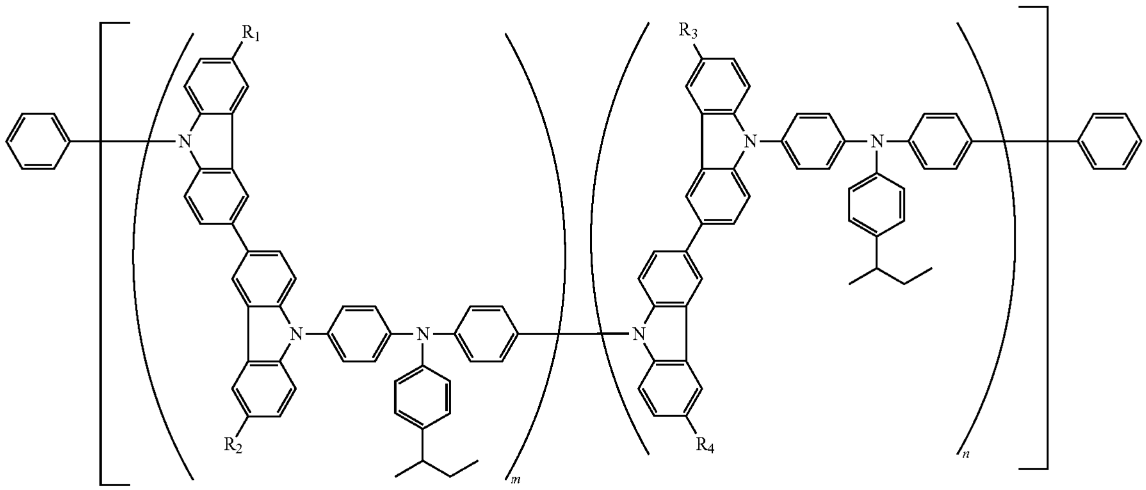
| Compound | R1 = R2 | R3 = R4 |
|---|---|---|
| 24-1 | H | H-29 |
| 24-2 | H-1 | |
| 24-3 | H-2 | |
| 24-4 | H-3 | |
| 24-5 | H-4 | |
| 24-6 | H-5 | |
| 24-7 | H-6 | |
| 24-8 | H-7 | |
| 24-9 | H-8 | |
| 24-10 | H-9 | |
| 24-11 | H-10 | |
| 24-12 | H-11 | |
| 24-13 | H-12 | |
| 24-14 | H-13 | |
| 24-15 | H-14 | |
| 24-16 | H-15 | |
| 24-17 | H-16 | |
| 24-18 | H-17 | |
| 24-19 | H-18 | |
| 24-20 | H | H-30 |
| 24-21 | H-1 | |
| 24-22 | H-2 | |
| 24-23 | H-3 | |
| 24-24 | H-4 | |
| 24-25 | H-5 | |
| 24-26 | H-6 | |
| 24-27 | H-7 | |
| 24-28 | H-8 | |
| 24-29 | H-9 | |
| 24-30 | H-10 | |
| 24-31 | H-11 | |
| 24-32 | H-12 | |
| 24-33 | H-13 | |
| 24-34 | H-14 | |
| 24-35 | H-15 | |
| 24-36 | H-16 | |
| 24-37 | H-17 | |
| 24-38 | H-18 | |

TABLE 25
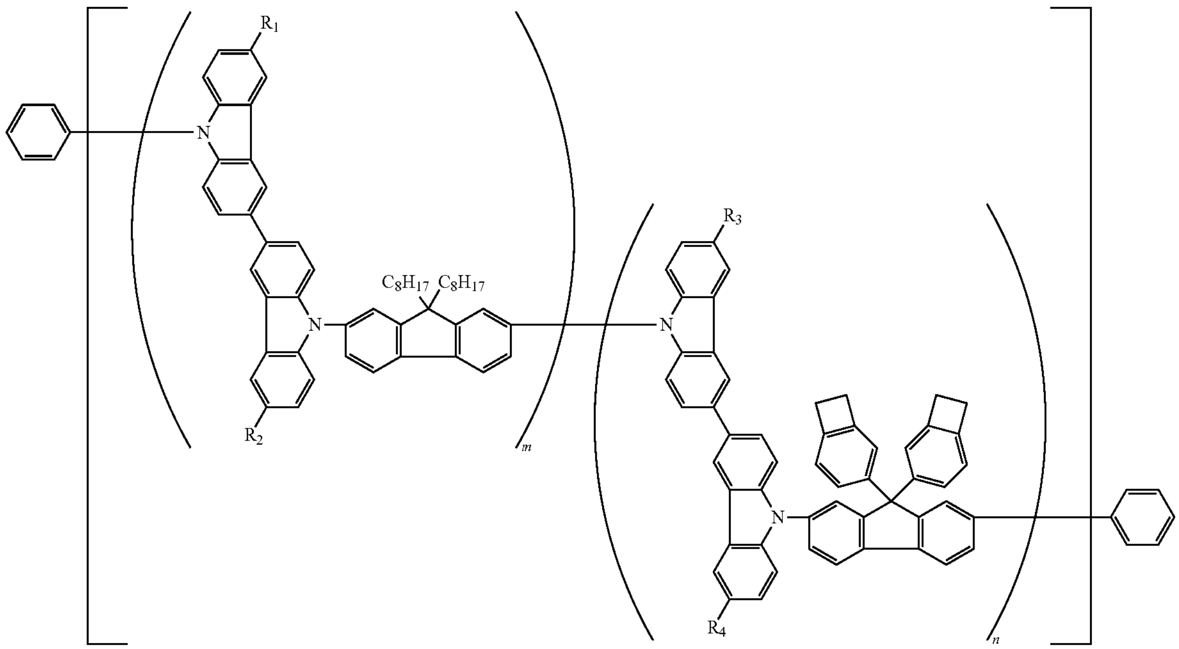
| Compound | R1 = R2 = R3 = R4 |
|---|---|
| 25-1 | H |
| 25-2 | H-1 |
| 25-3 | H-2 |
| 25-4 | H-3 |
| 25-5 | H-4 |
| 25-6 | H-5 |
| 25-7 | H-6 |
| 25-8 | H-7 |
| 25-9 | H-8 |
| 25-10 | H-9 |
| 25-11 | H-10 |
| 25-12 | H-11 |
| 25-13 | H-12 |
| 25-14 | H-13 |
| 25-15 | H-14 |
| 25-16 | H-15 |
| 25-17 | H-16 |
| 25-18 | H-17 |
| 25-19 | H-18 |

TABLE 26
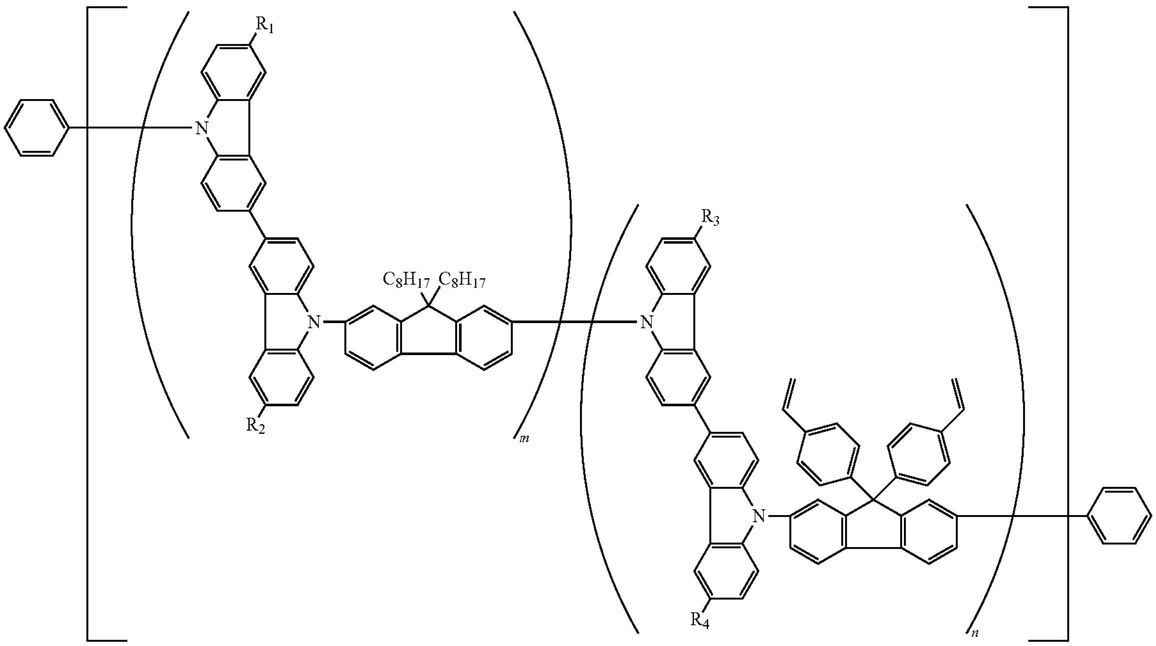
| Compound | R1 = R2 = R3 = R4 |
|---|---|
| 26-1 | H |
| 26-2 | H-1 |
| 26-3 | H-2 |
| 26-4 | H-3 |
| 26-5 | H-4 |
| 26-6 | H-5 |
| 26-7 | H-6 |
| 26-8 | H-7 |
| 26-9 | H-8 |
| 26-10 | H-9 |
| 26-11 | H-10 |
| 26-12 | H-11 |
| 26-13 | H-12 |
| 26-14 | H-13 |
| 26-15 | H-14 |
| 26-16 | H-15 |
| 26-17 | H-16 |
| 26-18 | H-17 |
| 26-19 | H-18 |

TABLE 27
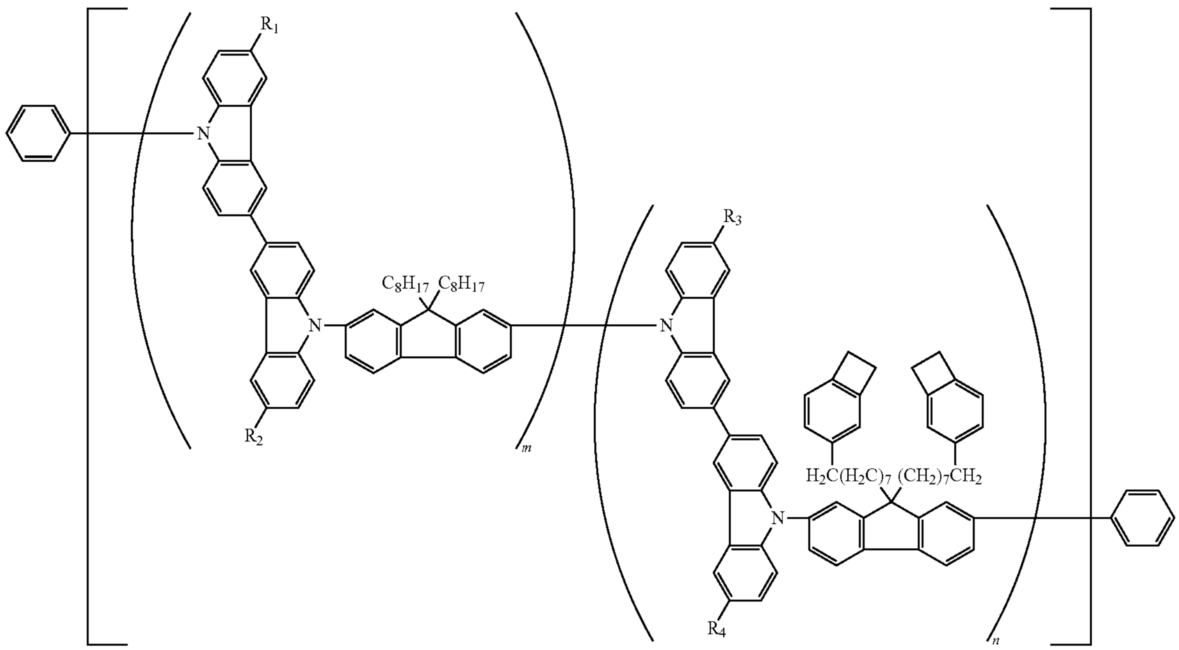
| Compound | R1 = R2 = R3 = R4 |
|---|---|
| 27-1 | H |
| 27-2 | H-1 |
| 27-3 | H-2 |
| 27-4 | H-3 |
| 27-5 | H-4 |
| 27-6 | H-5 |
| 27-7 | H-6 |
| 27-8 | H-7 |
| 27-9 | H-8 |
| 27-10 | H-9 |
| 27-11 | H-10 |
| 27-12 | H-11 |
| 27-13 | H-12 |
| 27-14 | H-13 |
| 27-15 | H-14 |
| 27-16 | H-15 |
| 27-17 | H-16 |
| 27-18 | H-17 |
| 27-19 | H-18 |

TABLE 28
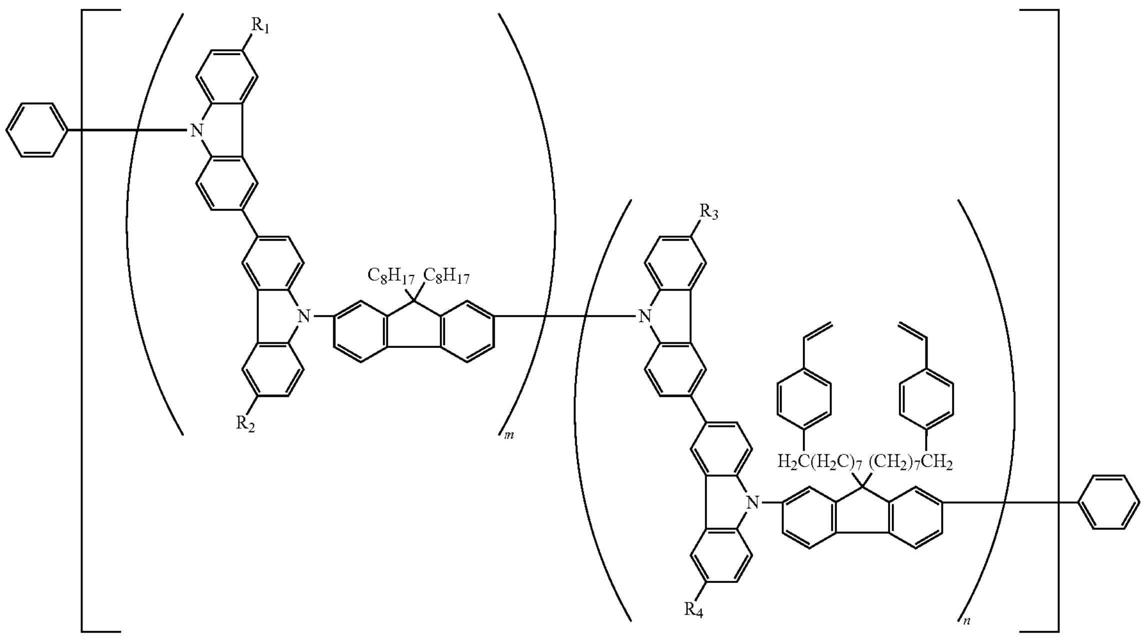
| Compound | R1 = R2 = R3 = R4 |
|---|---|
| 28-1 | H |
| 28-2 | H-1 |
| 28-3 | H-2 |
| 28-4 | H-3 |
| 28-5 | H-4 |
| 28-6 | H-5 |
| 28-7 | H-6 |
| 28-8 | H-7 |
| 28-9 | H-8 |
| 28-10 | H-9 |
| 28-11 | H-10 |
| 28-12 | H-11 |
| 28-13 | H-12 |
| 28-14 | H-13 |
| 28-15 | H-14 |
| 28-16 | H-15 |
| 28-17 | H-16 |
| 28-18 | H-17 |
| 28-19 | H-18 |

TABLE 29
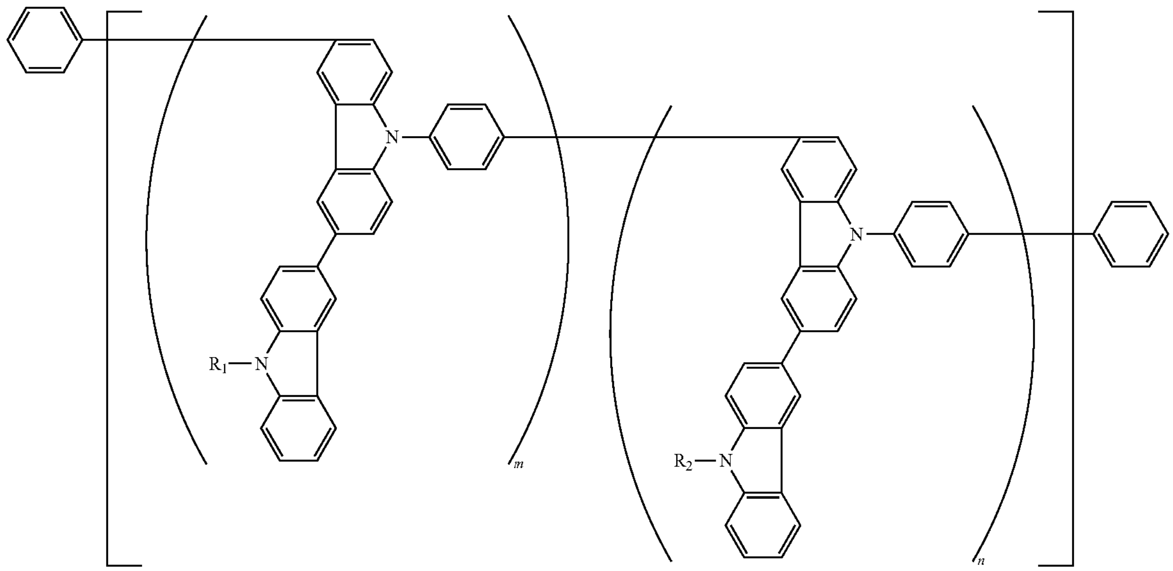
| Compound | R1 | R2 |
|---|---|---|
| 29-1 | H-1 | H-29 |
| 29-2 | H-2 | |
| 29-3 | H-3 | |
| 29-4 | H-4 | |
| 29-5 | H-5 | |
| 29-6 | H-6 | |
| 29-7 | H-7 | |
| 29-8 | H-8 | |
| 29-9 | H-9 | |
| 29-10 | H-10 | |
| 29-11 | H-11 | |
| 29-12 | H-12 | |
| 29-13 | H-13 | |
| 29-14 | H-14 | |
| 29-15 | H-15 | |
| 29-16 | H-16 | |
| 29-17 | H-17 | |
| 29-18 | H-18 | |
| 29-19 | H-1 | H-30 |
| 29-20 | H-2 | |
| 29-21 | H-3 | |
| 29-22 | H-4 | |
| 29-23 | H-5 | |
| 29-24 | H-6 | |
| 29-25 | H-7 | |
| 29-26 | H-8 | |
| 29-27 | H-9 | |
| 29-28 | H-10 | |
| 29-29 | H-11 | |
| 29-30 | H-12 | |
| 29-31 | H-13 | |
| 29-32 | H-14 | |
| 29-33 | H-15 | |
| 29-34 | H-16 | |
| 29-35 | H-17 | |
| 29-36 | H-18 | |

TABLE 30
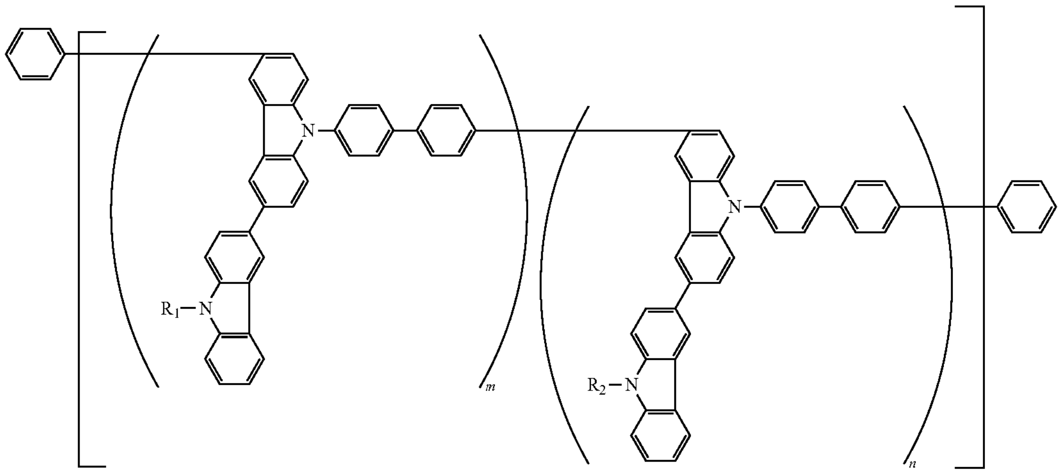
| Compound | R1 | R2 |
|---|---|---|
| 30-1 | H-1 | H-29 |
| 30-2 | H-2 | |
| 30-3 | H-3 | |
| 30-4 | H-4 | |
| 30-5 | H-5 | |
| 30-6 | H-6 | |
| 30-7 | H-7 | |
| 30-8 | H-8 | |
| 30-9 | H-9 | |
| 30-10 | H-10 | |
| 30-11 | H-11 | |
| 30-12 | H-12 | |
| 30-13 | H-13 | |
| 30-14 | H-14 | |
| 30-15 | H-15 | |
| 30-16 | H-16 | |
| 30-17 | H-17 | |
| 30-18 | H-18 | |
| 30-19 | H-1 | H-30 |
| 30-20 | H-2 | |
| 30-21 | H-3 | |
| 30-22 | H-4 | |
| 30-23 | H-5 | |
| 30-24 | H-6 | |
| 30-25 | H-7 | |
| 30-26 | H-8 | |
| 30-27 | H-9 | |
| 30-28 | H-10 | |
| 30-29 | H-11 | |
| 30-30 | H-12 | |
| 30-31 | H-13 | |
| 30-32 | H-14 | |
| 30-33 | H-15 | |
| 30-34 | H-16 | |
| 30-35 | H-17 | |
| 30-36 | H-18 | |

TABLE 31
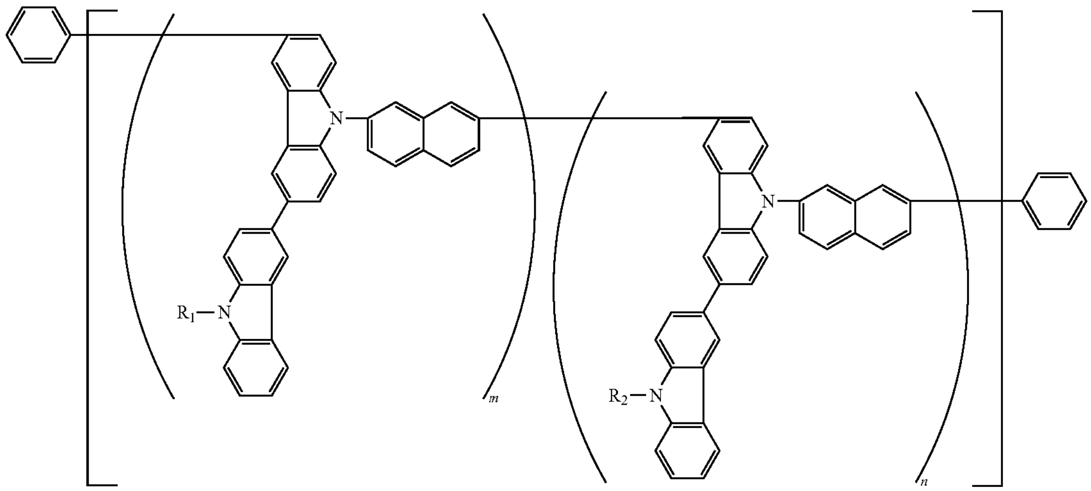
| Compound | R1 | R2 |
|---|---|---|
| 31-1 | H-1 | H-29 |
| 31-2 | H-2 | |
| 31-3 | H-3 | |
| 31-4 | H-4 | |
| 31-5 | H-5 | |
| 31-6 | H-6 | |
| 31-7 | H-7 | |
| 31-8 | H-8 | |
| 31-9 | H-9 | |
| 31-10 | H-10 | |
| 31-11 | H-11 | |
| 31-12 | H-12 | |
| 31-13 | H-13 | |
| 31-14 | H-14 | |
| 31-15 | H-15 | |
| 31-16 | H-16 | |
| 31-17 | H-17 | |
| 31-18 | H-18 | |
| 31-19 | H-1 | H-30 |
| 31-20 | H-2 | |
| 31-21 | H-3 | |
| 31-22 | H-4 | |
| 31-23 | H-5 | |
| 31-24 | H-6 | |
| 31-25 | H-7 | |
| 31-26 | H-8 | |
| 31-27 | H-9 | |
| 31-28 | H-10 | |
| 31-29 | H-11 | |
| 31-30 | H-12 | |
| 31-31 | H-13 | |
| 31-32 | H-14 | |
| 31-33 | H-15 | |
| 31-34 | H-16 | |
| 31-35 | H-17 | |
| 31-36 | H-18 | |

TABLE 32
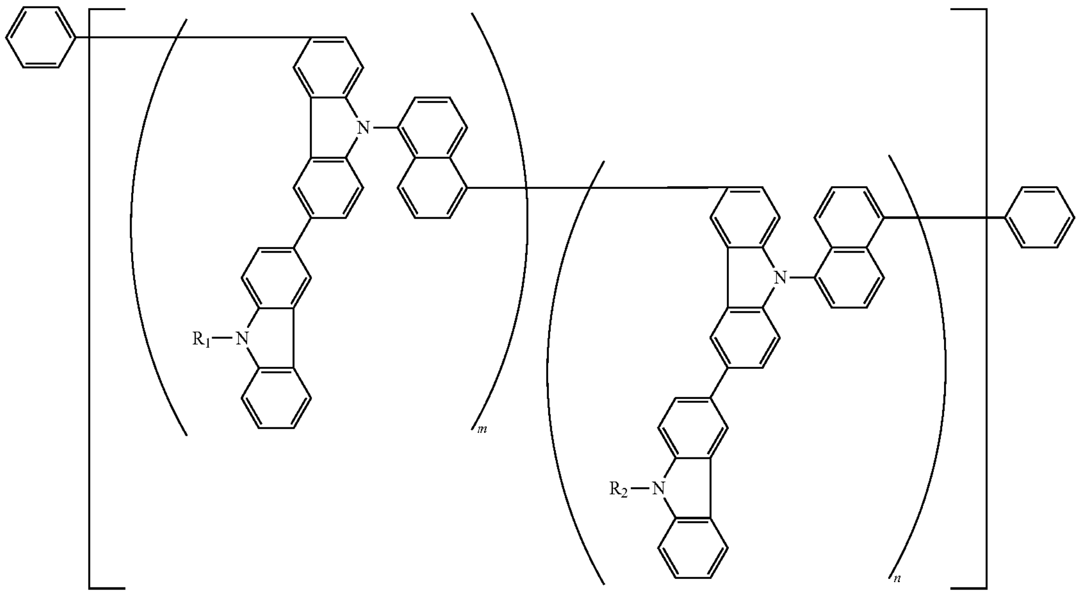
| Compound | R1 | R2 |
|---|---|---|
| 32-1 | H-1 | H-29 |
| 32-2 | H-2 | |
| 32-3 | H-3 | |
| 32-4 | H-4 | |
| 32-5 | H-5 | |
| 32-6 | H-6 | |
| 32-7 | H-7 | |
| 32-8 | H-8 | |
| 32-9 | H-9 | |
| 32-10 | H-10 | |
| 32-11 | H-11 | |
| 32-12 | H-12 | |
| 32-13 | H-13 | |
| 32-14 | H-14 | |
| 32-15 | H-15 | |
| 32-16 | H-16 | |
| 32-17 | H-17 | |
| 32-18 | H-18 | |
| 32-19 | H-1 | H-30 |
| 32-20 | H-2 | |
| 32-21 | H-3 | |
| 32-22 | H-4 | |
| 32-23 | H-5 | |
| 32-24 | H-6 | |
| 32-25 | H-7 | |
| 32-26 | H-8 | |
| 32-27 | H-9 | |
| 32-28 | H-10 | |
| 32-29 | H-11 | |
| 32-30 | H-12 | |
| 32-31 | H-13 | |
| 32-32 | H-14 | |
| 32-33 | H-15 | |
| 32-34 | H-16 | |
| 32-35 | H-17 | |
| 32-36 | H-18 | |

TABLE 33
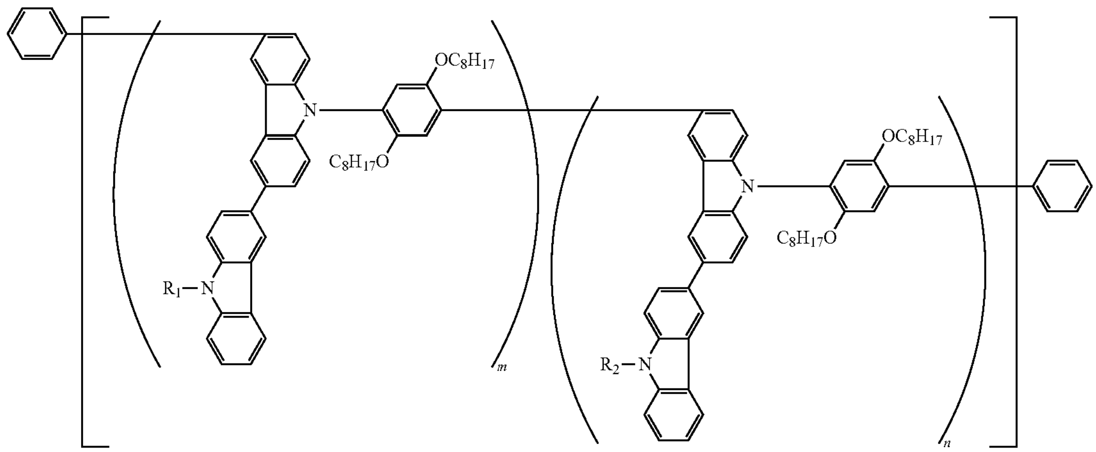
| Compound | R1 | R2 |
| --- | --- | --- |
| 33-1 | H-1 | H-29 |
| 33-2 | H-2 | |
| 33-3 | H-3 | |
| 33-4 | H-4 | |
| 33-5 | H-5 | |
| 33-6 | H-6 | |
| 33-7 | H-7 | |
| 33-8 | H-8 | |
| 33-9 | H-9 | |
| 33-10 | H-10 | |
| 33-11 | H-11 | |
| 33-12 | H-12 | |
| 33-13 | H-13 | |
| 33-14 | H-14 | |
| 33-15 | H-15 | |
| 33-16 | H-16 | |
| 33-17 | H-17 | |
| 33-18 | H-18 | |
| 33-19 | H-1 | H-30 |
| 33-20 | H-2 | |
| 33-21 | H-3 | |
| 33-22 | H-4 | |
| 33-23 | H-5 | |
| 33-24 | H-6 | |
| 33-25 | H-7 | |
| 33-26 | H-8 | |
| 33-27 | H-9 | |
| 33-28 | H-10 | |
| 33-29 | H-11 | |
| 33-30 | H-12 | |
| 33-31 | H-13 | |
| 33-32 | H-14 | |
| 33-33 | H-15 | |
| 33-34 | H-16 | |
| 33-35 | H-17 | |
| 33-36 | H-18 | |

TABLE 34
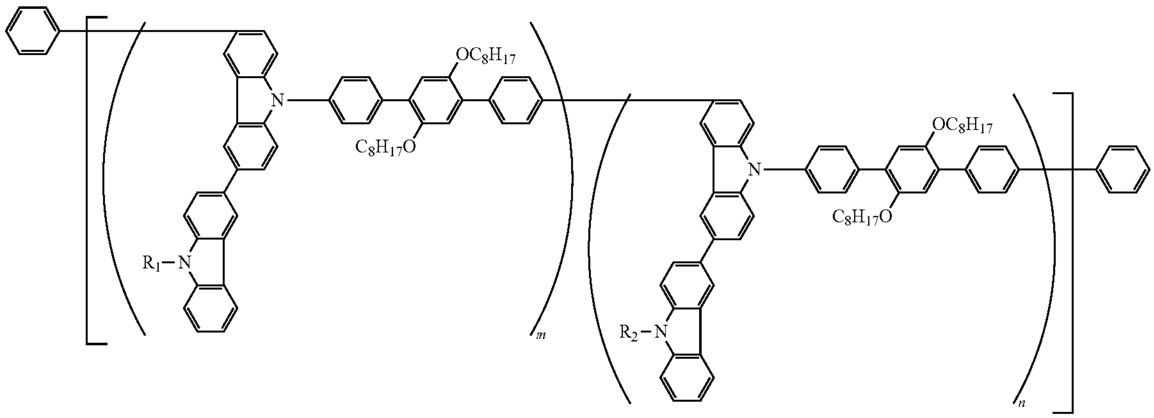
| Compound | R1 | R2 |
|---|---|---|
| 34-1 | H-1 | H-29 |
| 34-2 | H-2 | |
| 34-3 | H-3 | |
| 34-4 | H-4 | |
| 34-5 | H-5 | |
| 34-6 | H-6 | |
| 34-7 | H-7 | |
| 34-8 | H-8 | |
| 34-9 | H-9 | |
| 34-10 | H-10 | |
| 34-11 | H-11 | |
| 34-12 | H-12 | |
| 34-13 | H-13 | |
| 34-14 | H-14 | |
| 34-15 | H-15 | |
| 34-16 | H-16 | |
| 34-17 | H-17 | |
| 34-18 | H-18 | |
| 34-19 | H-1 | H-30 |
| 34-20 | H-2 | |
| 34-21 | H-3 | |
| 34-22 | H-4 | |
| 34-23 | H-5 | |
| 34-24 | H-6 | |
| 34-25 | H-7 | |
| 34-26 | H-8 | |
| 34-27 | H-9 | |
| 34-28 | H-10 | |
| 34-29 | H-11 | |
| 34-30 | H-12 | |
| 34-31 | H-13 | |
| 34-32 | H-14 | |
| 34-33 | H-15 | |
| 34-34 | H-16 | |
| 34-35 | H-17 | |
| 34-36 | H-18 | |

TABLE 35
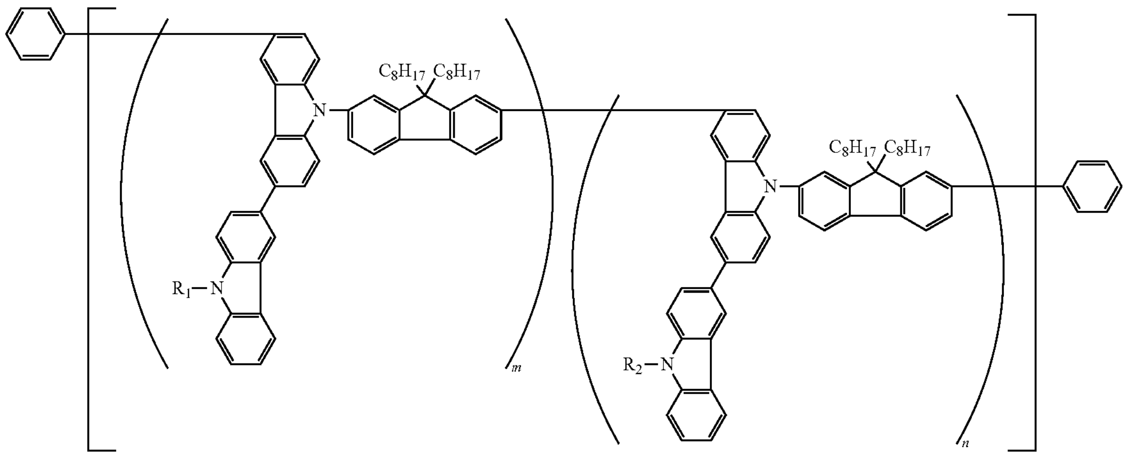
| Compound | R1 | R2 |
|---|---|---|
| 35-1 | H-1 | H-29 |
| 35-2 | H-2 | |
| 35-3 | H-3 | |
| 35-4 | H-4 | |
| 35-5 | H-5 | |
| 35-6 | H-6 | |
| 35-7 | H-7 | |
| 35-8 | H-8 | |
| 35-9 | H-9 | |
| 35-10 | H-10 | |
| 35-11 | H-11 | |
| 35-12 | H-12 | |
| 35-13 | H-13 | |
| 35-14 | H-14 | |
| 35-15 | H-15 | |
| 35-16 | H-16 | |
| 35-17 | H-17 | |
| 35-18 | H-18 | |
| 35-19 | H-1 | H-30 |
| 35-20 | H-2 | |
| 35-21 | H-3 | |
| 35-22 | H-4 | |
| 35-23 | H-5 | |
| 35-24 | H-6 | |
| 35-25 | H-7 | |
| 35-26 | H-8 | |
| 35-27 | H-9 | |
| 35-28 | H-10 | |
| 35-29 | H-11 | |
| 35-30 | H-12 | |
| 35-31 | H-13 | |
| 35-32 | H-14 | |
| 35-33 | H-15 | |
| 35-34 | H-16 | |
| 35-35 | H-17 | |
| 35-36 | H-18 | |

TABLE 36
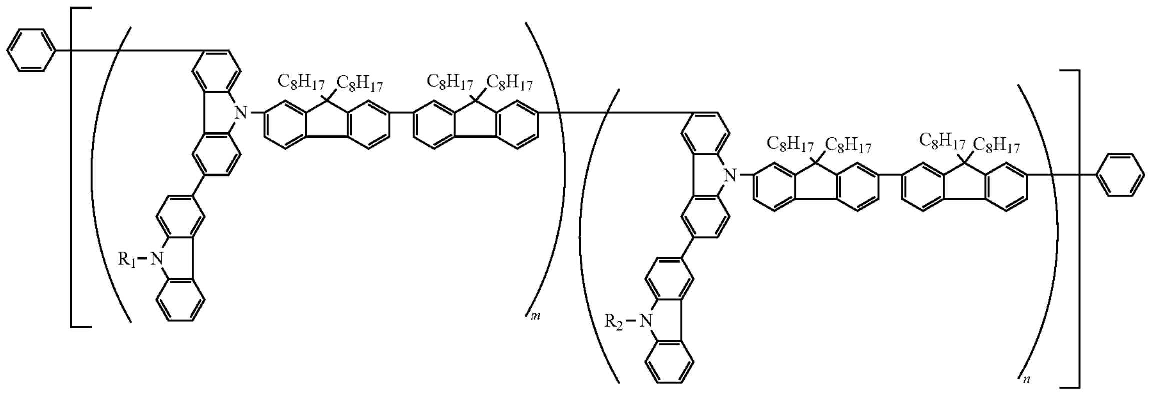
| Compound | R1 | R2 |
|---|---|---|
| 36-1 | H-1 | H-29 |
| 36-2 | H-2 | |
| 36-3 | H-3 | |
| 36-4 | H-4 | |
| 36-5 | H-5 | |
| 36-6 | H-6 | |
| 36-7 | H-7 | |
| 36-8 | H-8 | |
| 36-9 | H-9 | |
| 36-10 | H-10 | |
| 36-11 | H-11 | |
| 36-12 | H-12 | |
| 36-13 | H-13 | |
| 36-14 | H-14 | |
| 36-15 | H-15 | |
| 36-16 | H-16 | |
| 36-17 | H-17 | |
| 36-18 | H-18 | |
| 36-19 | H-1 | H-30 |
| 36-20 | H-2 | |
| 36-21 | H-3 | |
| 36-22 | H-4 | |
| 36-23 | H-5 | |
| 36-24 | H-6 | |
| 36-25 | H-7 | |
| 36-26 | H-8 | |
| 36-27 | H-9 | |
| 36-28 | H-10 | |
| 36-29 | H-11 | |
| 36-30 | H-12 | |
| 36-31 | H-13 | |
| 36-32 | H-14 | |
| 36-33 | H-15 | |
| 36-34 | H-16 | |
| 36-35 | H-17 | |
| 36-36 | H-18 | |

TABLE 37
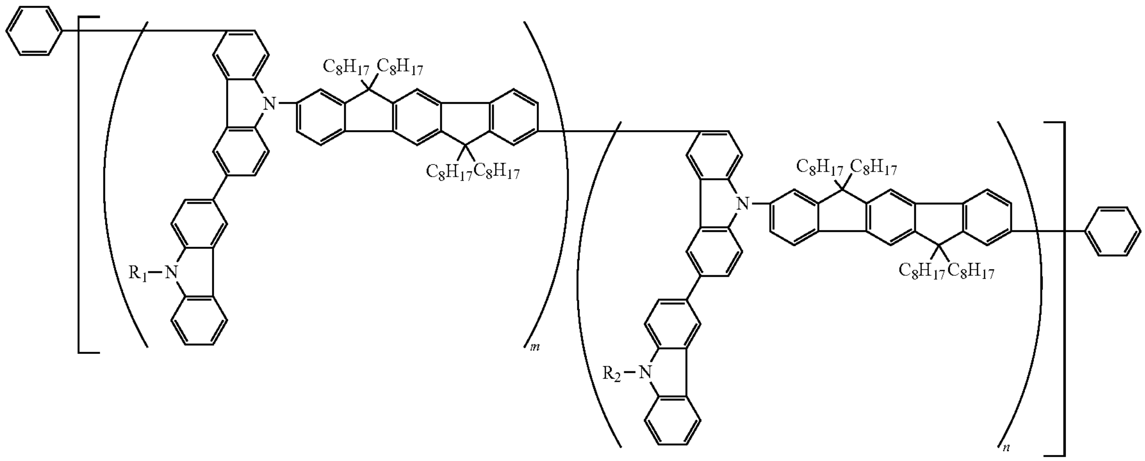
| Compound | R1 | R2 |
|---|---|---|
| 37-1 | H-1 | H-29 |
| 37-2 | H-2 | |
| 37-3 | H-3 | |
| 37-4 | H-4 | |
| 37-5 | H-5 | |
| 37-6 | H-6 | |
| 37-7 | H-7 | |
| 37-8 | H-8 | |
| 37-9 | H-9 | |
| 37-10 | H-10 | |
| 37-11 | H-11 | |
| 37-12 | H-12 | |
| 37-13 | H-13 | |
| 37-14 | H-14 | |
| 37-15 | H-15 | |
| 37-16 | H-16 | |
| 37-17 | H-17 | |
| 37-18 | H-18 | |
| 37-19 | H-1 | H-30 |
| 37-20 | H-2 | |
| 37-21 | H-3 | |
| 37-22 | H-4 | |
| 37-23 | H-5 | |
| 37-24 | H-6 | |
| 37-25 | H-7 | |
| 37-26 | H-8 | |
| 37-27 | H-9 | |
| 37-28 | H-10 | |
| 37-29 | H-11 | |
| 37-30 | H-12 | |
| 37-31 | H-13 | |
| 37-32 | H-14 | |
| 37-33 | H-15 | |
| 37-34 | H-16 | |
| 37-35 | H-17 | |
| 37-36 | H-18 | |

TABLE 38
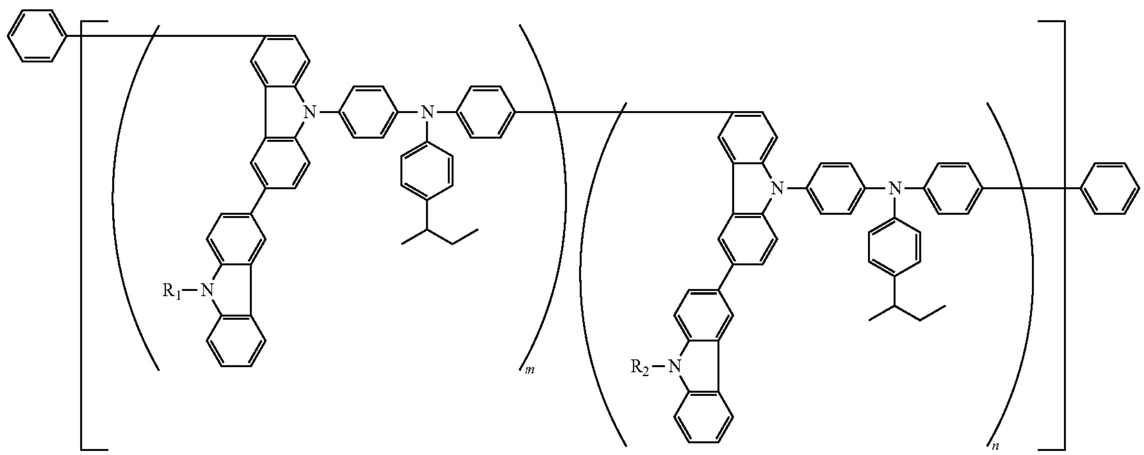
| Compound | R1 | R2 |
|---|---|---|
| 38-1 | H-1 | H-29 |
| 38-2 | H-2 | |
| 38-3 | H-3 | |
| 38-4 | H-4 | |
| 38-5 | H-5 | |
| 38-6 | H-6 | |
| 38-7 | H-7 | |
| 38-8 | H-8 | |
| 38-9 | H-9 | |
| 38-10 | H-10 | |
| 38-11 | H-11 | |
| 38-12 | H-12 | |
| 38-13 | H-13 | |
| 38-14 | H-14 | |
| 38-15 | H-15 | |
| 38-16 | H-16 | |
| 38-17 | H-17 | |
| 38-18 | H-18 | |
| 38-19 | H-1 | H-30 |
| 38-20 | H-2 | |
| 38-21 | H-3 | |
| 38-22 | H-4 | |
| 38-23 | H-5 | |
| 38-24 | H-6 | |
| 38-25 | H-7 | |
| 38-26 | H-8 | |
| 38-27 | H-9 | |
| 38-28 | H-10 | |
| 38-29 | H-11 | |
| 38-30 | H-12 | |
| 38-31 | H-13 | |
| 38-32 | H-14 | |
| 38-33 | H-15 | |
| 38-34 | H-16 | |
| 38-35 | H-17 | |
| 38-36 | H-18 | |

TABLE 39
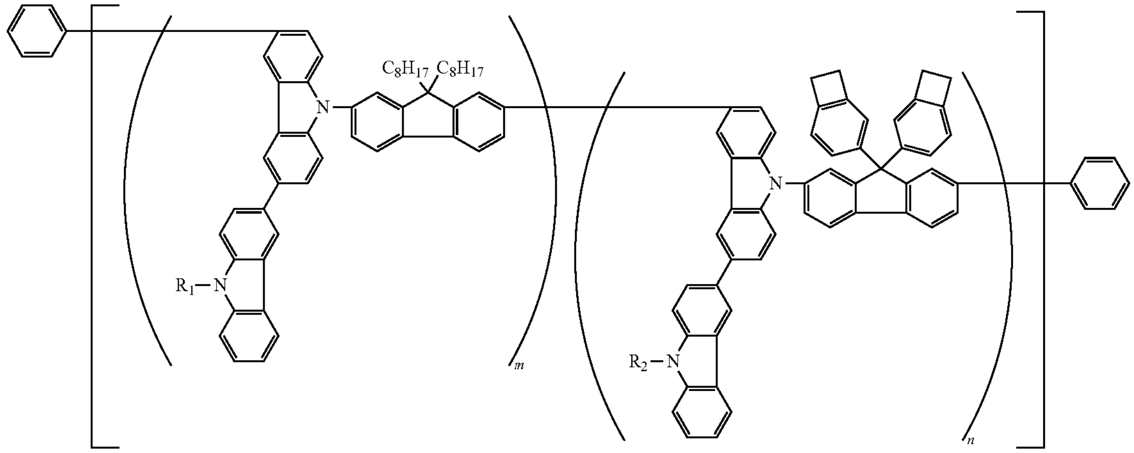
| Compound | R1 = R2 |
|---|---|
| 39-1 | H-1 |
| 39-2 | H-2 |
| 39-3 | H-3 |
| 39-4 | H-4 |
| 39-5 | H-5 |
| 39-6 | H-6 |
| 39-7 | H-7 |
| 39-8 | H-8 |
| 39-9 | H-9 |
| 39-10 | H-10 |
| 39-11 | H-11 |
| 39-12 | H-12 |
| 39-13 | H-13 |
| 39-14 | H-14 |
| 39-15 | H-15 |
| 39-16 | H-16 |
| 39-17 | H-17 |
| 39-18 | H-18 |
TABLE 40
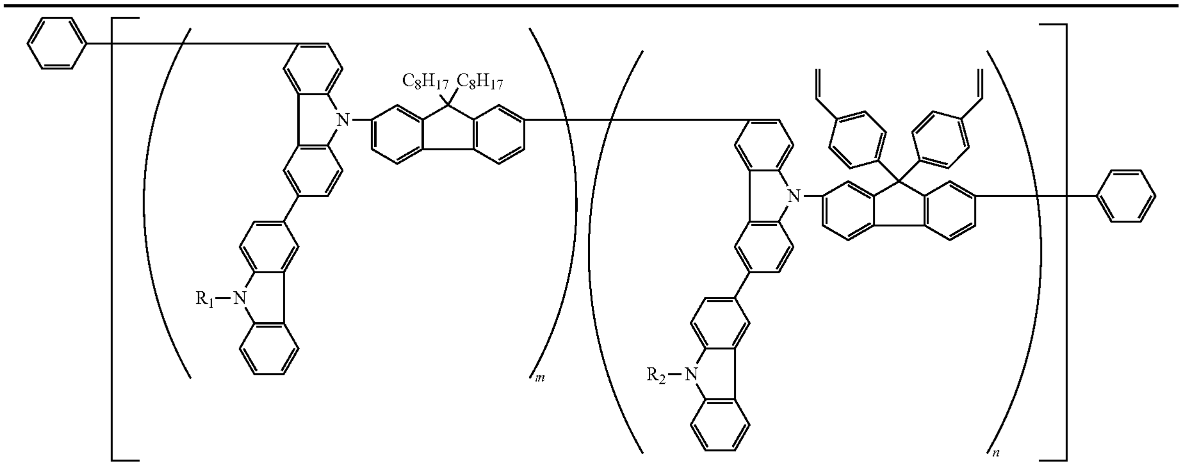
| Compound | R1 = R2 |
|---|---|
| 40-1 | H-1 |
| 40-2 | H-2 |
| 40-3 | H-3 |
| 40-4 | H-4 |
| 40-5 | H-5 |
| 40-6 | H-6 |
| 40-7 | H-7 |
| 40-8 | H-8 |

TABLE 40-continued
| | |
|---|---|
| 40-9 | H-9 |
| 40-10 | H-10 |
| 40-11 | H-11 |
| 40-12 | H-12 |
| 40-13 | H-13 |
| 40-14 | H-14 |
| 40-15 | H-15 |
| 40-16 | H-16 |
| 40-17 | H-17 |
| 40-18 | H-18 |
TABLE 41
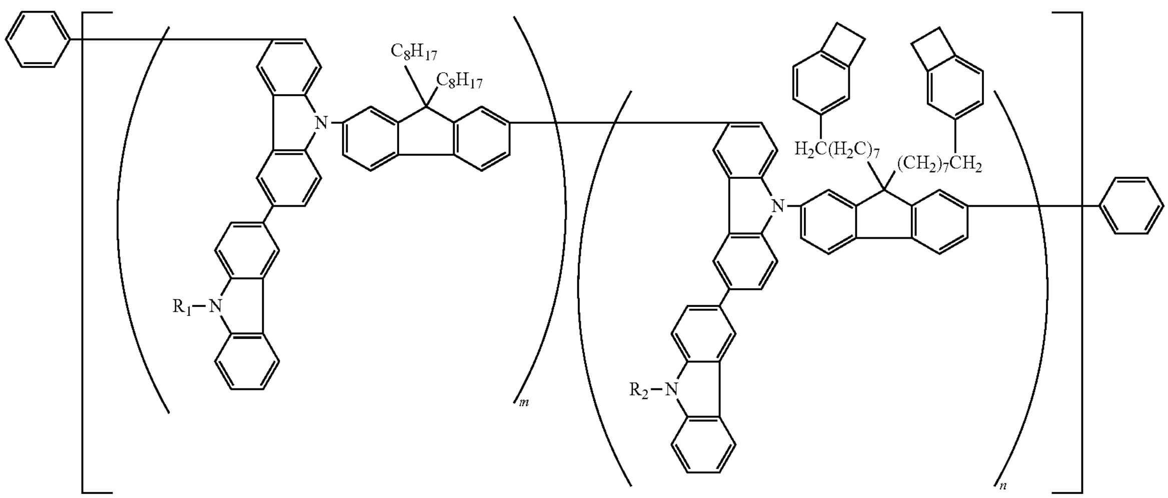
| Compound | R1 = R2 |
|---|---|
| 41-1 | H-1 |
| 41-2 | H-2 |
| 41-3 | H-3 |
| 41-4 | H-4 |
| 41-5 | H-5 |
| 41-6 | H-6 |
| 41-7 | H-7 |
| 41-8 | H-8 |
| 41-9 | H-9 |
| 41-10 | H-10 |
| 41-11 | H-11 |
| 41-12 | H-12 |
| 41-13 | H-13 |
| 41-14 | H-14 |
| 41-15 | H-15 |
| 41-16 | H-16 |
| 41-17 | H-17 |
| 41-18 | H-18 |

TABLE 42
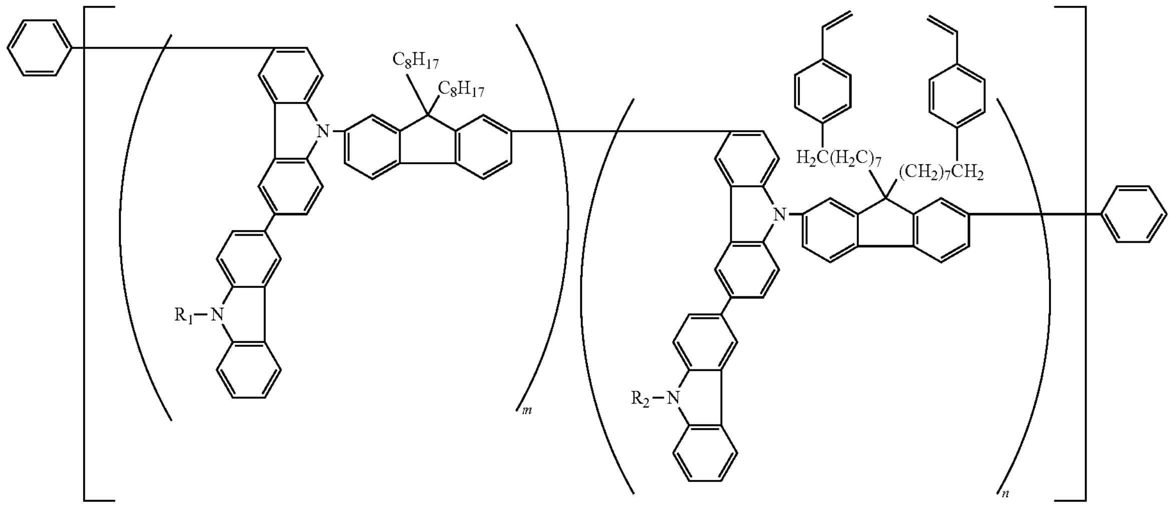
| Compound | R1 = R2 |
|---|---|
| 42-1 | H-1 |
| 42-2 | H-2 |
| 42-3 | H-3 |
| 42-4 | H-4 |
| 42-5 | H-5 |
| 42-6 | H-6 |
| 42-7 | H-7 |
| 42-8 | H-8 |
| 42-9 | H-9 |
| 42-10 | H-10 |
| 42-11 | H-11 |
| 42-12 | H-12 |
| 42-13 | H-13 |
| 42-14 | H-14 |
| 42-15 | H-15 |
| 42-16 | H-16 |
| 42-17 | H-17 |
| 42-18 | H-18 |
TABLE 43
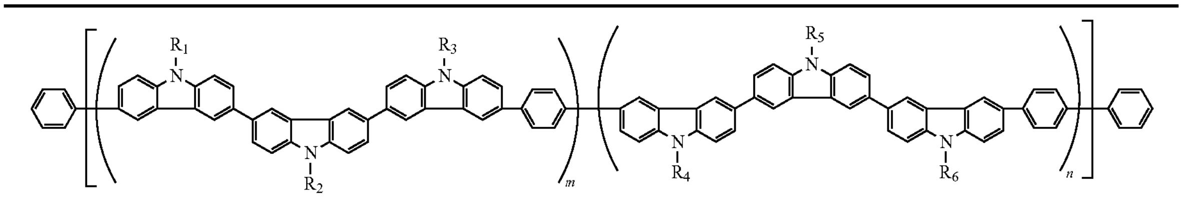
| Compound | R1 = R3 = R4 = R6 | R2 | R5 |
|---|---|---|---|
| 43-1 | H-1 | H-1 | H-29 |
| 43-2 | H-2 | | |
| 43-3 | H-3 | | |
| 43-4 | H-4 | | |
| 43-5 | H-5 | | |
| 43-6 | H-6 | | |
| 43-7 | H-7 | | |
| 43-8 | H-8 | | |
| 43-9 | H-9 | | |
| 43-10 | H-10 | | |
| 43-11 | H-11 | | |
| 43-12 | H-12 | | |
| 43-13 | H-13 | | |
| 43-14 | H-14 | | |
| 43-15 | H-15 | | |
| 43-16 | H-16 | | |
| 43-17 | H-17 | | |
| 43-18 | H-18 | | |

TABLE 43-continued
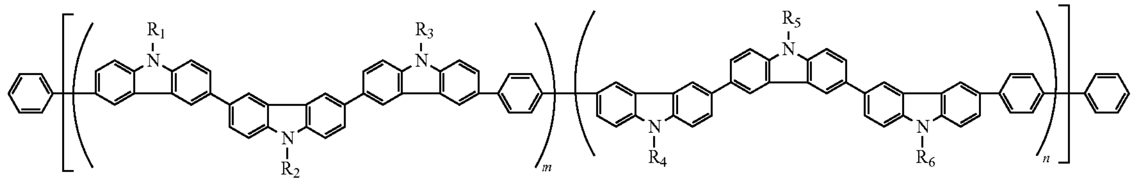
| Compound | R1 = R3 = R4 = R6 | R2 | R5 |
|---|---|---|---|
| 43-19 | H-1 | H-1 | H-30 |
| 43-20 | H-2 | | |
| 43-21 | H-3 | | |
| 43-22 | H-4 | | |
| 43-23 | H-5 | | |
| 43-24 | H-6 | | |
| 43-25 | H-7 | | |
| 43-26 | H-8 | | |
| 43-27 | H-9 | | |
| 43-28 | H-10 | | |
| 43-29 | H-11 | | |
| 43-30 | H-12 | | |
| 43-31 | H-13 | | |
| 43-32 | H-14 | | |
| 43-33 | H-15 | | |
| 43-34 | H-16 | | |
| 43-35 | H-17 | | |
| 43-36 | H-18 | | |
TABLE 44
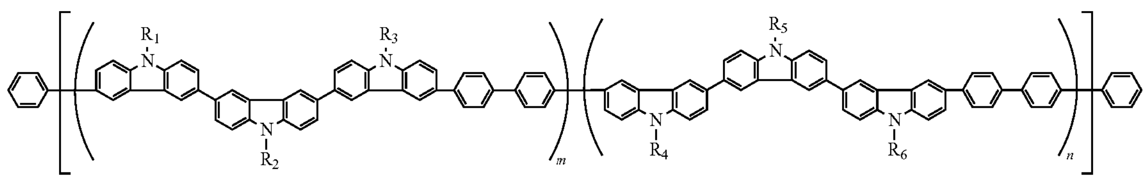
| Compound | R1 = R3 = R4 = R6 | R2 | R5 |
|---|---|---|---|
| 44-1 | H-1 | H-1 | H-29 |
| 44-2 | H-2 | | |
| 44-3 | H-3 | | |
| 44-4 | H-4 | | |
| 44-5 | H-5 | | |
| 44-6 | H-6 | | |
| 44-7 | H-7 | | |
| 44-8 | H-8 | | |
| 44-9 | H-9 | | |
| 44-10 | H-10 | | |
| 44-11 | H-11 | | |
| 44-12 | H-12 | | |
| 44-13 | H-13 | | |
| 44-14 | H-14 | | |
| 44-15 | H-15 | | |
| 44-16 | H-16 | | |
| 44-17 | H-17 | | |
| 44-18 | H-18 | | |
| 44-19 | H-1 | H-1 | H-30 |
| 44-20 | H-2 | | |
| 44-21 | H-3 | | |
| 44-22 | H-4 | | |
| 44-23 | H-5 | | |
| 44-24 | H-6 | | |
| 44-25 | H-7 | | |
| 44-26 | H-8 | | |
| 44-27 | H-9 | | |
| 44-28 | H-10 | | |
| 44-29 | H-11 | | |
| 44-30 | H-12 | | |
| 44-31 | H-13 | | |
| 44-32 | H-14 | | |
| 44-33 | H-15 | | |
| 44-34 | H-16 | | |

TABLE 44-continued
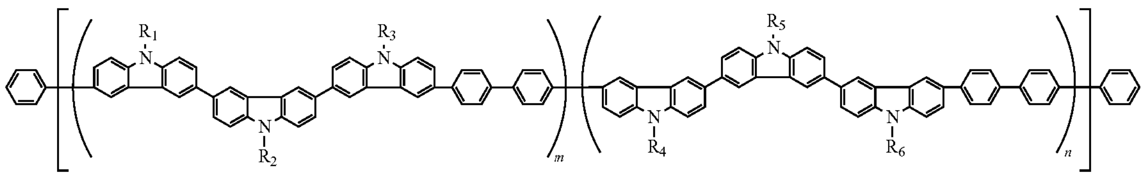
| Compound | R1 = R3 = R4 = R6 | R2 | R5 |
|---|---|---|---|
| 44-35 | H-17 | | |
| 44-36 | H-18 | | |
TABLE 45
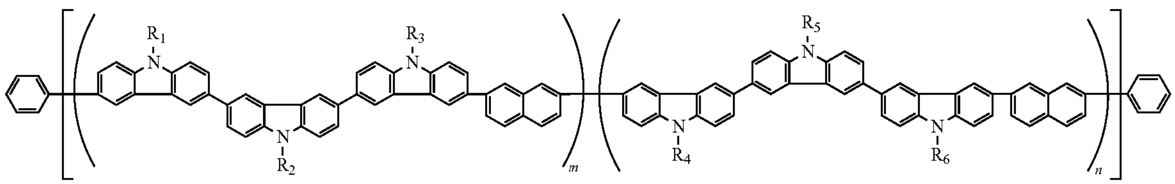
| Compound | R1 = R3 = R4 = R6 | R2 | R5 |
|---|---|---|---|
| 45-1 | H-1 | H-1 | H-29 |
| 45-2 | H-2 | | |
| 45-3 | H-3 | | |
| 45-4 | H-4 | | |
| 45-5 | H-5 | | |
| 45-6 | H-6 | | |
| 45-7 | H-7 | | |
| 45-8 | H-8 | | |
| 45-9 | H-9 | | |
| 45-10 | H-10 | | |
| 45-11 | H-11 | | |
| 45-12 | H-12 | | |
| 45-13 | H-13 | | |
| 45-14 | H-14 | | |
| 45-15 | H-15 | | |
| 45-16 | H-16 | | |
| 45-17 | H-17 | | |
| 45-18 | H-18 | | |
| 45-19 | H-1 | H-1 | H-30 |
| 45-20 | H-2 | | |
| 45-21 | H-3 | | |
| 45-22 | H-4 | | |
| 45-23 | H-5 | | |
| 45-24 | H-6 | | |
| 45-25 | H-7 | | |
| 45-26 | H-8 | | |
| 45-27 | H-9 | | |
| 45-28 | H-10 | | |
| 45-29 | H-11 | | |
| 45-30 | H-12 | | |
| 45-31 | H-13 | | |
| 45-32 | H-14 | | |
| 45-33 | H-15 | | |
| 45-34 | H-16 | | |
| 45-35 | H-17 | | |
| 45-36 | H-18 | | |

TABLE 46
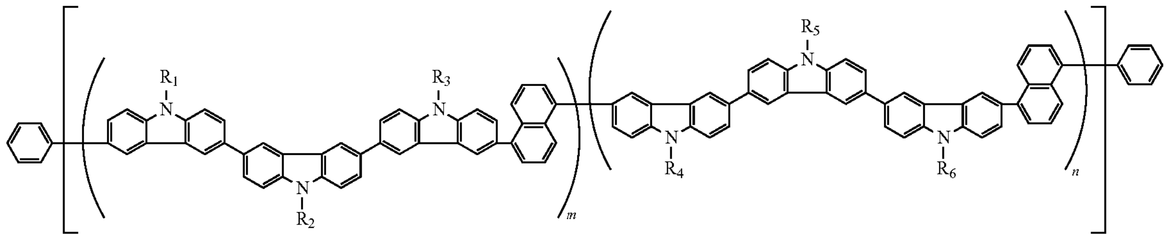
| Compound | R1 = R3 = R4 = R6 | R2 | R5 |
|---|---|---|---|
| 46-1 | H-1 | H-1 | H-29 |
| 46-2 | H-2 | | |
| 46-3 | H-3 | | |
| 46-4 | H-4 | | |
| 46-5 | H-5 | | |
| 46-6 | H-6 | | |
| 46-7 | H-7 | | |
| 46-8 | H-8 | | |
| 46-9 | H-9 | | |
| 46-10 | H-10 | | |
| 46-11 | H-11 | | |
| 46-12 | H-12 | | |
| 46-13 | H-13 | | |
| 46-14 | H-14 | | |
| 46-15 | H-15 | | |
| 46-16 | H-16 | | |
| 46-17 | H-17 | | |
| 46-18 | H-18 | | |
| 46-19 | H-1 | H-1 | H-30 |
| 46-20 | H-2 | | |
| 46-21 | H-3 | | |
| 46-22 | H-4 | | |
| 46-23 | H-5 | | |
| 46-24 | H-6 | | |
| 46-25 | H-7 | | |
| 46-26 | H-8 | | |
| 46-27 | H-9 | | |
| 46-28 | H-10 | | |
| 46-29 | H-11 | | |
| 46-30 | H-12 | | |
| 46-31 | H-13 | | |
| 46-32 | H-14 | | |
| 46-33 | H-15 | | |
| 46-34 | H-16 | | |
| 46-35 | H-17 | | |
| 46-36 | H-18 | | |
TABLE 47
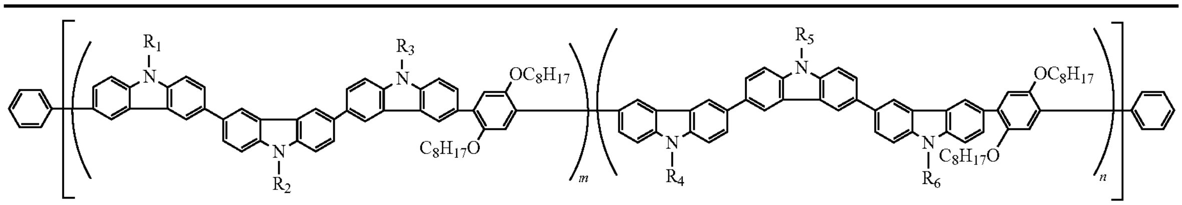
| Compound | R1 = R3 = R4 = R6 | R2 | R5 |
|---|---|---|---|
| 47-1 | H-1 | H-1 | H-29 |
| 47-2 | H-2 | | |
| 47-3 | H-3 | | |
| 47-4 | H-4 | | |
| 47-5 | H-5 | | |
| 47-6 | H-6 | | |
| 47-7 | H-7 | | |
| 47-8 | H-8 | | |
| 47-9 | H-9 | | |
| 47-10 | H-10 | | |
| 47-11 | H-11 | | |
| 47-12 | H-12 | | |
| 47-13 | H-13 | | |

TABLE 47-continued
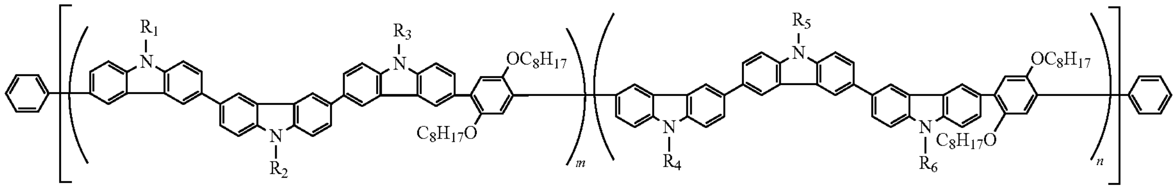
| Compound | R1 = R3 = R4 = R6 | R2 | R5 |
|---|---|---|---|
| 47-14 | H-14 | | |
| 47-15 | H-15 | | |
| 47-16 | H-16 | | |
| 47-17 | H-17 | | |
| 47-18 | H-18 | | |
| 47-19 | H-1 | H-1 | H-30 |
| 47-20 | H-2 | | |
| 47-21 | H-3 | | |
| 47-22 | H-4 | | |
| 47-23 | H-5 | | |
| 47-24 | H-6 | | |
| 47-25 | H-7 | | |
| 47-26 | H-8 | | |
| 47-27 | H-9 | | |
| 47-28 | H-10 | | |
| 47-29 | H-11 | | |
| 47-30 | H-12 | | |
| 47-31 | H-13 | | |
| 47-32 | H-14 | | |
| 47-33 | H-15 | | |
| 47-34 | H-16 | | |
| 47-35 | H-17 | | |
| 47-36 | H-18 | | |
TABLE 48
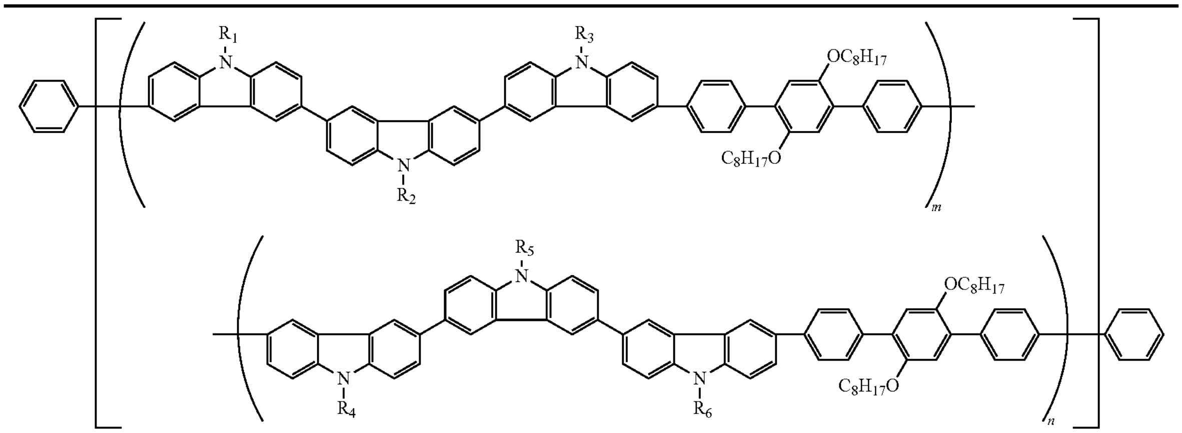
| Compound | R1 = R3 = R4 = R6 | R2 | R5 |
|---|---|---|---|
| 48-1 | H-1 | H-1 | H-29 |
| 48-2 | H-2 | | |
| 48-3 | H-3 | | |
| 48-4 | H-4 | | |
| 48-5 | H-5 | | |
| 48-6 | H-6 | | |
| 48-7 | H-7 | | |
| 48-8 | H-8 | | |
| 48-9 | H-9 | | |
| 48-10 | H-10 | | |
| 48-11 | H-11 | | |
| 48-12 | H-12 | | |
| 48-13 | H-13 | | |
| 48-14 | H-14 | | |
| 48-15 | H-15 | | |
| 48-16 | H-16 | | |
| 48-17 | H-17 | | |

TABLE 48-continued
| | | | |
|---|---|---|---|
| 48-18 | H-18 | | |
| 48-19 | H-1 | H-1 | H-30 |
| 48-20 | H-2 | | |
| 48-21 | H-3 | | |
| 48-22 | H-4 | | |
| 48-23 | H-5 | | |
| 48-24 | H-6 | | |
| 48-25 | H-7 | | |
| 48-26 | H-8 | | |
| 48-27 | H-9 | | |
| 48-28 | H-10 | | |
| 48-29 | H-11 | | |
| 48-30 | H-12 | | |
| 48-31 | H-13 | | |
| 48-32 | H-14 | | |
| 48-33 | H-15 | | |
| 48-34 | H-16 | | |
| 48-35 | H-17 | | |
| 48-36 | H-18 | | |
TABLE 49
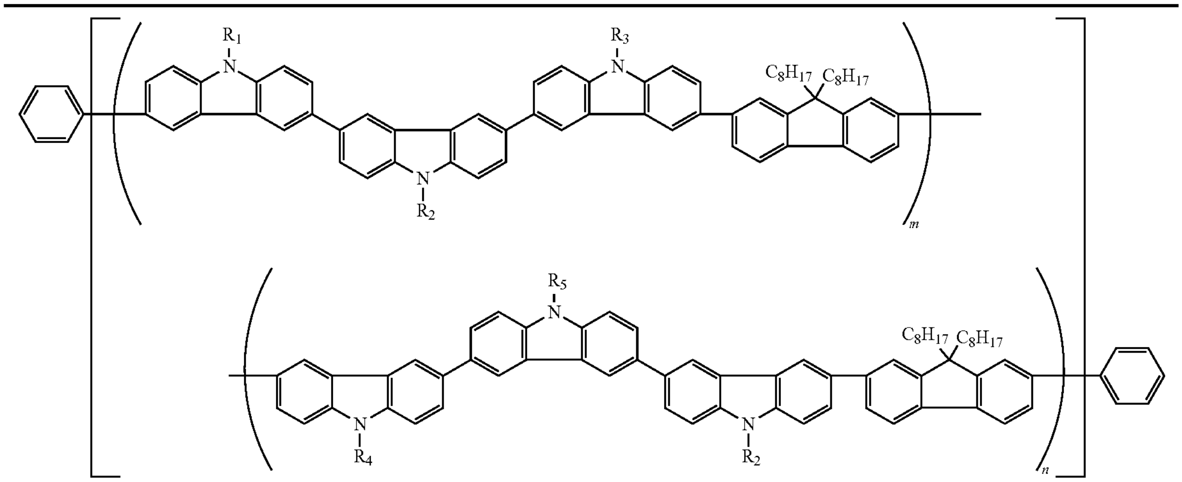
| Compound | R1 = R3 = R4 = R6 | R2 | R5 |
|---|---|---|---|
| 49-1 | H-1 | H-1 | H-29 |
| 49-2 | H-2 | | |
| 49-3 | H-3 | | |
| 49-4 | H-4 | | |
| 49-5 | H-5 | | |
| 49-6 | H-6 | | |
| 49-7 | H-7 | | |
| 49-8 | H-8 | | |
| 49-9 | H-9 | | |
| 49-10 | H-10 | | |
| 49-11 | H-11 | | |
| 49-12 | H-12 | | |
| 49-13 | H-13 | | |
| 49-14 | H-14 | | |
| 49-15 | H-15 | | |
| 49-16 | H-16 | | |
| 49-17 | H-17 | | |
| 49-18 | H-18 | | |
| 49-19 | H-1 | H-1 | H-30 |
| 49-20 | H-2 | | |
| 49-21 | H-3 | | |
| 49-22 | H-4 | | |
| 49-23 | H-5 | | |
| 49-24 | H-6 | | |
| 49-25 | H-7 | | |
| 49-26 | H-8 | | |
| 49-27 | H-9 | | |
| 49-28 | H-10 | | |
| 49-29 | H-11 | | |
| 49-30 | H-12 | | |
| 49-31 | H-13 | | |

TABLE 49-continued
| | |
|---|---|
| 49-32 | H-14 |
| 49-33 | H-15 |
| 49-34 | H-16 |
| 49-35 | H-17 |
| 49-36 | H-18 |
TABLE 50
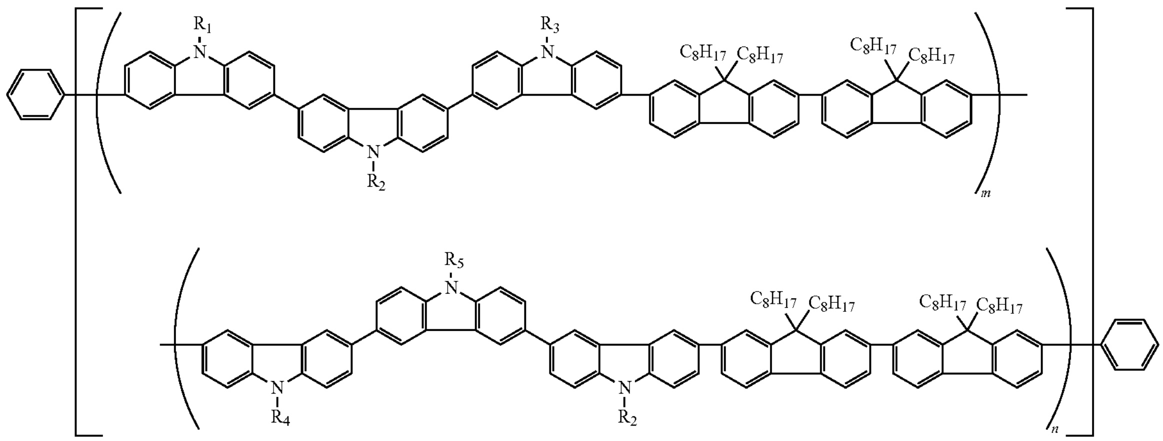
| Compound | R1 = R3 = R4 = R6 | R2 | R5 |
|---|---|---|---|
| 50-1 | H-1 | H-1 | H-29 |
| 50-2 | H-2 | | |
| 50-3 | H-3 | | |
| 50-4 | H-4 | | |
| 50-5 | H-5 | | |
| 50-6 | H-6 | | |
| 50-7 | H-7 | | |
| 50-8 | H-8 | | |
| 50-9 | H-9 | | |
| 50-10 | H-10 | | |
| 50-11 | H-11 | | |
| 50-12 | H-12 | | |
| 50-13 | H-13 | | |
| 50-14 | H-14 | | |
| 50-15 | H-15 | | |
| 50-16 | H-16 | | |
| 50-17 | H-17 | | |
| 50-18 | H-18 | | |
| 50-19 | H-1 | H-1 | H-30 |
| 50-20 | H-2 | | |
| 50-21 | H-3 | | |
| 50-22 | H-4 | | |
| 50-23 | H-5 | | |
| 50-24 | H-6 | | |
| 50-25 | H-7 | | |
| 50-26 | H-8 | | |
| 50-27 | H-9 | | |
| 50-28 | H-10 | | |
| 50-29 | H-11 | | |
| 50-30 | H-12 | | |
| 50-31 | H-13 | | |
| 50-32 | H-14 | | |
| 50-33 | H-15 | | |
| 50-34 | H-16 | | |
| 50-35 | H-17 | | |
| 50-36 | H-18 | | |

TABLE 51
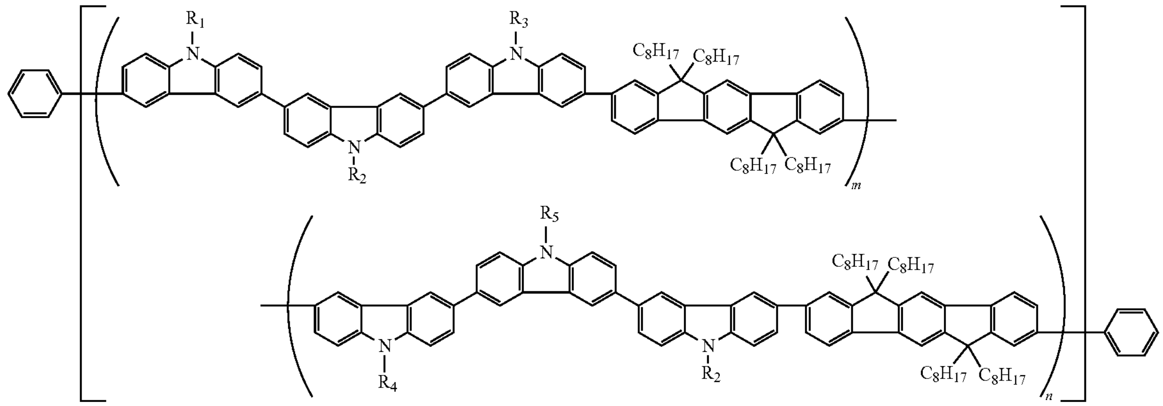
| Compound | R1 = R3 = R4 = R6 | R2 | R5 |
|---|---|---|---|
| 51-1 | H-1 | H-1 | H-29 |
| 51-2 | H-2 | | |
| 51-3 | H-3 | | |
| 51-4 | H-4 | | |
| 51-5 | H-5 | | |
| 51-6 | H-6 | | |
| 51-7 | H-7 | | |
| 51-8 | H-8 | | |
| 51-9 | H-9 | | |
| 51-10 | H-10 | | |
| 51-11 | H-11 | | |
| 51-12 | H-12 | | |
| 51-13 | H-13 | | |
| 51-14 | H-14 | | |
| 51-15 | H-15 | | |
| 51-16 | H-16 | | |
| 51-17 | H-17 | | |
| 51-18 | H-18 | | |
| 51-19 | H-1 | H-1 | H-30 |
| 51-20 | H-2 | | |
| 51-21 | H-3 | | |
| 51-22 | H-4 | | |
| 51-23 | H-5 | | |
| 51-24 | H-6 | | |
| 51-25 | H-7 | | |
| 51-26 | H-8 | | |
| 51-27 | H-9 | | |
| 51-28 | H-10 | | |
| 51-29 | H-11 | | |
| 51-30 | H-12 | | |
| 51-31 | H-13 | | |
| 51-32 | H-14 | | |
| 51-33 | H-15 | | |
| 51-34 | H-16 | | |
| 51-35 | H-17 | | |
| 51-36 | H-18 | | |
TABLE 52
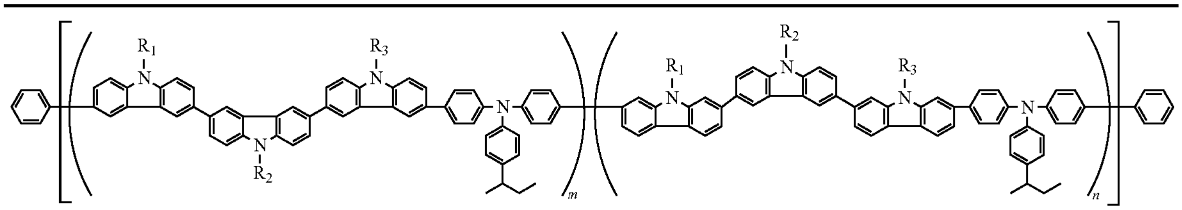
| Compound | R1 = R3 = R4 = R6 | R2 | R5 |
|---|---|---|---|
| 52-1 | H-1 | H-1 | H-29 |
| 52-2 | H-2 | | |
| 52-3 | H-3 | | |
| 52-4 | H-4 | | |

TABLE 52-continued
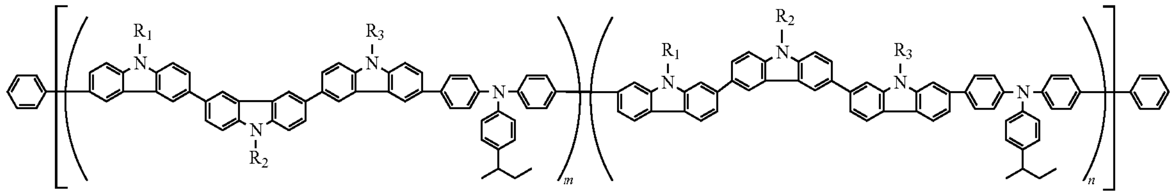
| Compound | R1 = R3 = R4 = R6 | R2 | R5 |
|---|---|---|---|
| 52-5 | H-5 | | |
| 52-6 | H-6 | | |
| 52-7 | H-7 | | |
| 52-8 | H-8 | | |
| 52-9 | H-9 | | |
| 52-10 | H-10 | | |
| 52-11 | H-11 | | |
| 52-12 | H-12 | | |
| 52-13 | H-13 | | |
| 52-14 | H-14 | | |
| 52-15 | H-15 | | |
| 52-16 | H-16 | | |
| 52-17 | H-17 | | |
| 52-18 | H-18 | | |
| 52-19 | H-1 | H-1 | H-30 |
| 52-20 | H-2 | | |
| 52-21 | H-3 | | |
| 52-22 | H-4 | | |
| 52-23 | H-5 | | |
| 52-24 | H-6 | | |
| 52-25 | H-7 | | |
| 52-26 | H-8 | | |
| 52-27 | H-9 | | |
| 52-28 | H-10 | | |
| 52-29 | H-11 | | |
| 52-30 | H-12 | | |
| 52-31 | H-13 | | |
| 52-32 | H-14 | | |
| 52-33 | H-15 | | |
| 52-34 | H-16 | | |
| 52-35 | H-17 | | |
| 52-36 | H-18 | | |
TABLE 53
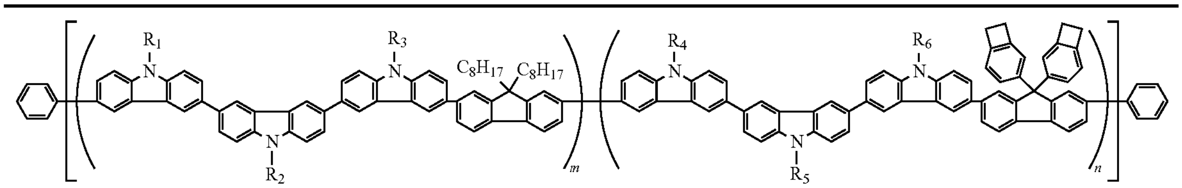
| Compound | R1 = R2 = R3 = R4 = R5 = R6 |
|---|---|
| 53-1 | H-1 |
| 53-2 | H-2 |
| 53-3 | H-3 |
| 53-4 | H-4 |
| 53-5 | H-5 |
| 53-6 | H-6 |
| 53-7 | H-7 |
| 53-8 | H-8 |
| 53-9 | H-9 |
| 53-10 | H-10 |
| 53-11 | H-11 |
| 53-12 | H-12 |
| 53-13 | H-13 |
| 53-14 | H-14 |
| 53-15 | H-15 |
| 53-16 | H-16 |
| 53-17 | H-17 |
| 53-18 | H-18 |

TABLE 54
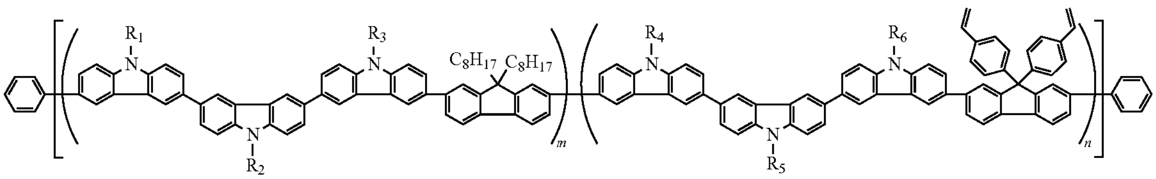
| Compound | R1 = R2 = R3 = R4 = R5 = R6 |
|---|---|
| 54-1 | H-1 |
| 54-2 | H-2 |
| 54-3 | H-3 |
| 54-4 | H-4 |
| 54-5 | H-5 |
| 54-6 | H-6 |
| 54-7 | H-7 |
| 54-8 | H-8 |
| 54-9 | H-9 |
| 54-10 | H-10 |
| 54-11 | H-11 |
| 54-12 | H-12 |
| 54-13 | H-13 |
| 54-14 | H-14 |
| 54-15 | H-15 |
| 54-16 | H-16 |
| 54-17 | H-17 |
| 54-18 | H-18 |
TABLE 55
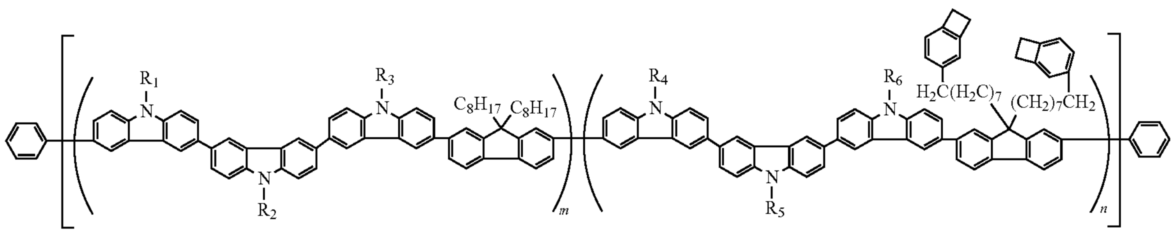
| Compound | R1 = R2 = R3 = R4 = R5 = R6 |
|---|---|
| 55-1 | H-1 |
| 55-2 | H-2 |
| 55-3 | H-3 |
| 55-4 | H-4 |
| 55-5 | H-5 |
| 55-6 | H-6 |
| 55-7 | H-7 |
| 55-8 | H-8 |
| 55-9 | H-9 |
| 55-10 | H-10 |
| 55-11 | H-11 |
| 55-12 | H-12 |
| 55-13 | H-13 |
| 55-14 | H-14 |
| 55-15 | H-15 |
| 55-16 | H-16 |
| 55-17 | H-17 |
| 55-18 | H-18 |

TABLE 56
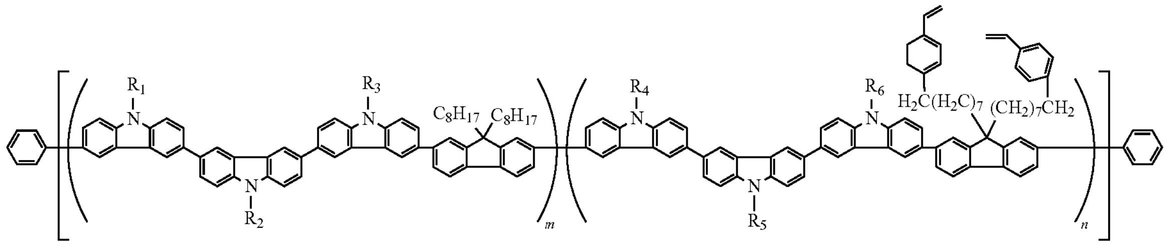
| Compound | R1 = R2 = R3 = R4 = R5 = R6 |
| --- | --- |
| 56-1 | H-1 |
| 56-2 | H-2 |
| 56-3 | H-3 |
| 56-4 | H-4 |
| 56-5 | H-5 |
| 56-6 | H-6 |
| 56-7 | H-7 |
| 56-8 | H-8 |
| 56-9 | H-9 |
| 56-10 | H-10 |
| 56-11 | H-11 |
| 56-12 | H-12 |
| 56-13 | H-13 |
| 56-14 | H-14 |
| 56-15 | H-15 |
| 56-16 | H-16 |
| 56-17 | H-17 |
| 56-18 | H-18 |
TABLE 57
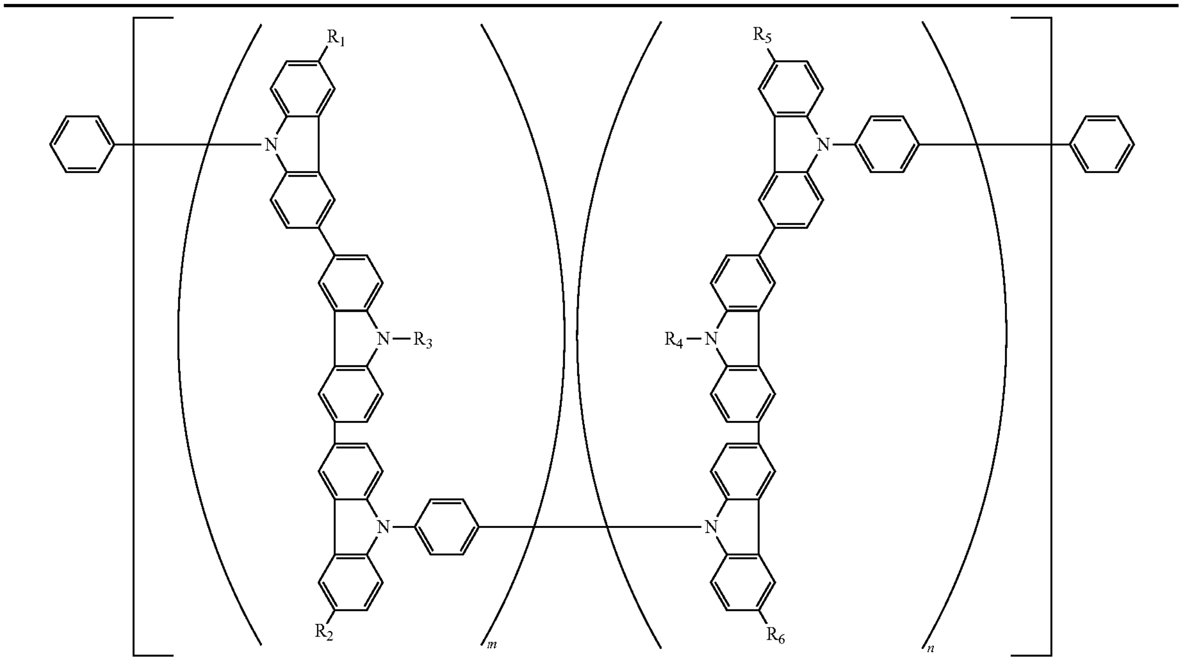
| Compound | R1 = R2 = R5 = R6 | R3 | R4 |
| --- | --- | --- | --- |
| 57-1 | H | H-1 | H-29 |
| 57-2 | | H-2 | |
| 57-3 | | H-3 | |
| 57-4 | | H-4 | |
| 57-5 | | H-5 | |
| 57-6 | | H-6 | |
| 57-7 | | H-7 | |
| 57-8 | | H-8 | |
| 57-9 | | H-9 | |

TABLE 57-continued
| | | | |
|---|---|---|---|
| 57-10 | | H-10 | |
| 57-11 | | H-11 | |
| 57-12 | | H-12 | |
| 57-13 | | H-13 | |
| 57-14 | | H-14 | |
| 57-15 | | H-15 | |
| 57-16 | | H-16 | |
| 57-17 | | H-17 | |
| 57-18 | | H-18 | |
| 57-19 | H | H-1 | H-29 |
| 57-20 | | H-2 | |
| 57-21 | | H-3 | |
| 57-22 | | H-4 | |
| 57-23 | | H-5 | |
| 57-24 | | H-6 | |
| 57-25 | | H-7 | |
| 57-26 | | H-8 | |
| 57-27 | | H-9 | |
| 57-28 | | H-10 | |
| 57-29 | | H-11 | |
| 57-30 | | H-12 | |
| 57-31 | | H-13 | |
| 57-32 | | H-14 | |
| 57-33 | | H-15 | |
| 57-34 | | H-16 | |
| 57-35 | | H-17 | |
| 57-36 | | H-18 | |
TABLE 58
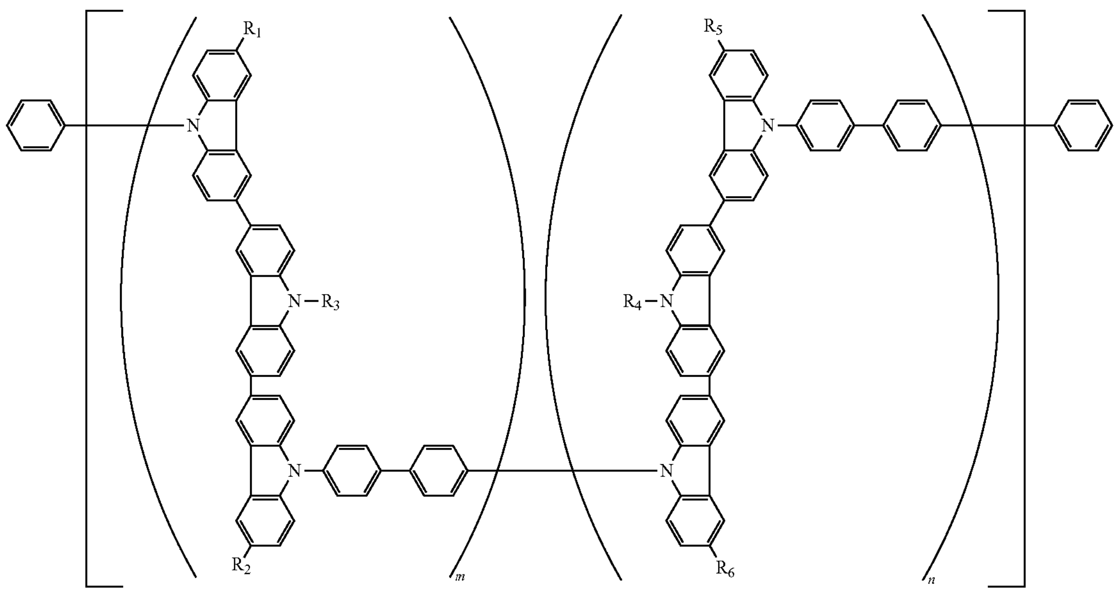
| Compound | R1 = R2 = R5 = R6 | R3 | R4 |
|---|---|---|---|
| 58-1 | H | H-1 | H-29 |
| 58-2 | | H-2 | |
| 58-3 | | H-3 | |
| 58-4 | | H-4 | |
| 58-5 | | H-5 | |
| 58-6 | | H-6 | |
| 58-7 | | H-7 | |
| 58-8 | | H-8 | |
| 58-9 | | H-9 | |
| 58-10 | | H-10 | |
| 58-11 | | H-11 | |
| 58-12 | | H-12 | |
| 58-13 | | H-13 | |
| 58-14 | | H-14 | |
| 58-15 | | H-15 | |
| 58-16 | | H-16 | |
| 58-17 | | H-17 | |

TABLE 58-continued
| | | | |
|---|---|---|---|
| 58-18 | | H-18 | |
| 58-19 | H | H-1 | H-29 |
| 58-20 | | H-2 | |
| 58-21 | | H-3 | |
| 58-22 | | H-4 | |
| 58-23 | | H-5 | |
| 58-24 | | H-6 | |
| 58-25 | | H-7 | |
| 58-26 | | H-8 | |
| 58-27 | | H-9 | |
| 58-28 | | H-10 | |
| 58-29 | | H-11 | |
| 58-30 | | H-12 | |
| 58-31 | | H-13 | |
| 58-32 | | H-14 | |
| 58-33 | | H-15 | |
| 58-34 | | H-16 | |
| 58-35 | | H-17 | |
| 58-36 | | H-18 | |
TABLE 59
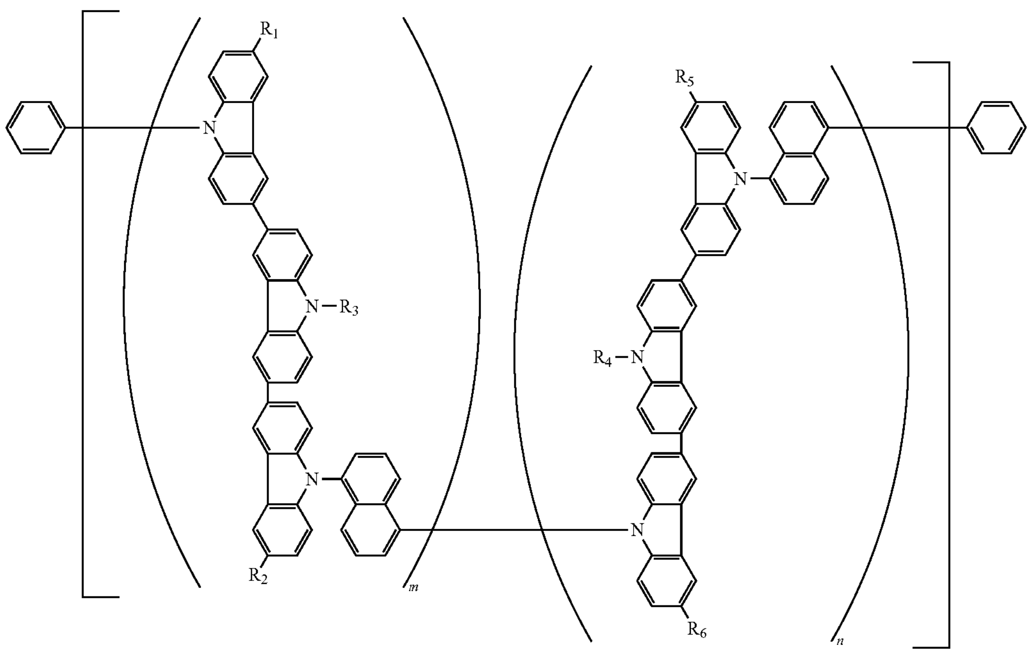
| Compound | R1 = R2 = R5 = R6 | R3 | R4 |
|---|---|---|---|
| 59-1 | H | H-1 | H-29 |
| 59-2 | | H-2 | |
| 59-3 | | H-3 | |
| 59-4 | | H-4 | |
| 59-5 | | H-5 | |
| 59-6 | | H-6 | |
| 59-7 | | H-7 | |
| 59-8 | | H-8 | |
| 59-9 | | H-9 | |
| 59-10 | | H-10 | |
| 59-11 | | H-11 | |
| 59-12 | | H-12 | |
| 59-13 | | H-13 | |
| 59-14 | | H-14 | |
| 59-15 | | H-15 | |
| 59-16 | | H-16 | |
| 59-17 | | H-17 | |
| 59-18 | | H-18 | |
| 59-19 | H | H-1 | H-29 |
| 59-20 | | H-2 | |
| 59-21 | | H-3 | |
| 59-22 | | H-4 | |

TABLE 59-continued
| | |
|---|---|
| 59-23 | H-5 |
| 59-24 | H-6 |
| 59-25 | H-7 |
| 59-26 | H-8 |
| 59-27 | H-9 |
| 59-28 | H-10 |
| 59-29 | H-11 |
| 59-30 | H-12 |
| 59-31 | H-13 |
| 59-32 | H-14 |
| 59-33 | H-15 |
| 59-34 | H-16 |
| 59-35 | H-17 |
| 59-36 | H-18 |
TABLE 60
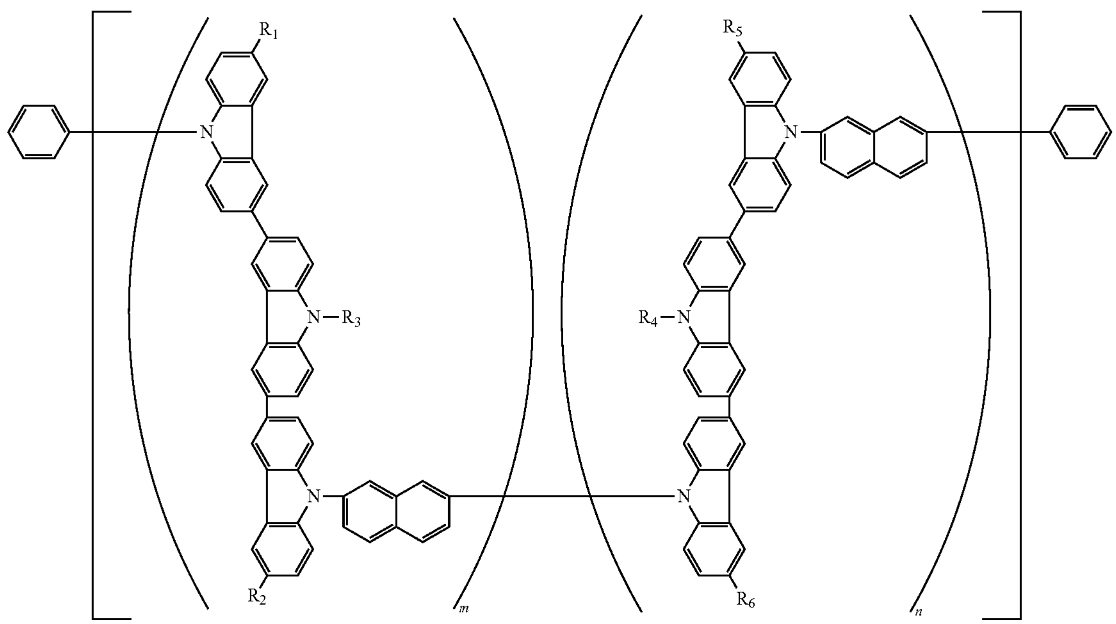
| Compound | R1 = R2 = R5 = R6 | R3 | R4 |
|---|---|---|---|
| 60-1 | H | H-1 | H-29 |
| 60-2 | | H-2 | |
| 60-3 | | H-3 | |
| 60-4 | | H-4 | |
| 60-5 | | H-5 | |
| 60-6 | | H-6 | |
| 60-7 | | H-7 | |
| 60-8 | | H-8 | |
| 60-9 | | H-9 | |
| 60-10 | | H-10 | |
| 60-11 | | H-11 | |
| 60-12 | | H-12 | |
| 60-13 | | H-13 | |
| 60-14 | | H-14 | |
| 60-15 | | H-15 | |
| 60-16 | | H-16 | |
| 60-17 | | H-17 | |
| 60-18 | | H-18 | |
| 60-19 | H | H-1 | H-29 |
| 60-20 | | H-2 | |
| 60-21 | | H-3 | |
| 60-22 | | H-4 | |
| 60-23 | | H-5 | |
| 60-24 | | H-6 | |
| 60-25 | | H-7 | |
| 60-26 | | H-8 | |
| 60-27 | | H-9 | |
| 60-28 | | H-10 | |

TABLE 60-continued
| | |
|---|---|
| 60-29 | H-11 |
| 60-30 | H-12 |
| 60-31 | H-13 |
| 60-32 | H-14 |
| 60-33 | H-15 |
| 60-34 | H-16 |
| 60-35 | H-17 |
| 60-36 | H-18 |
TABLE 61
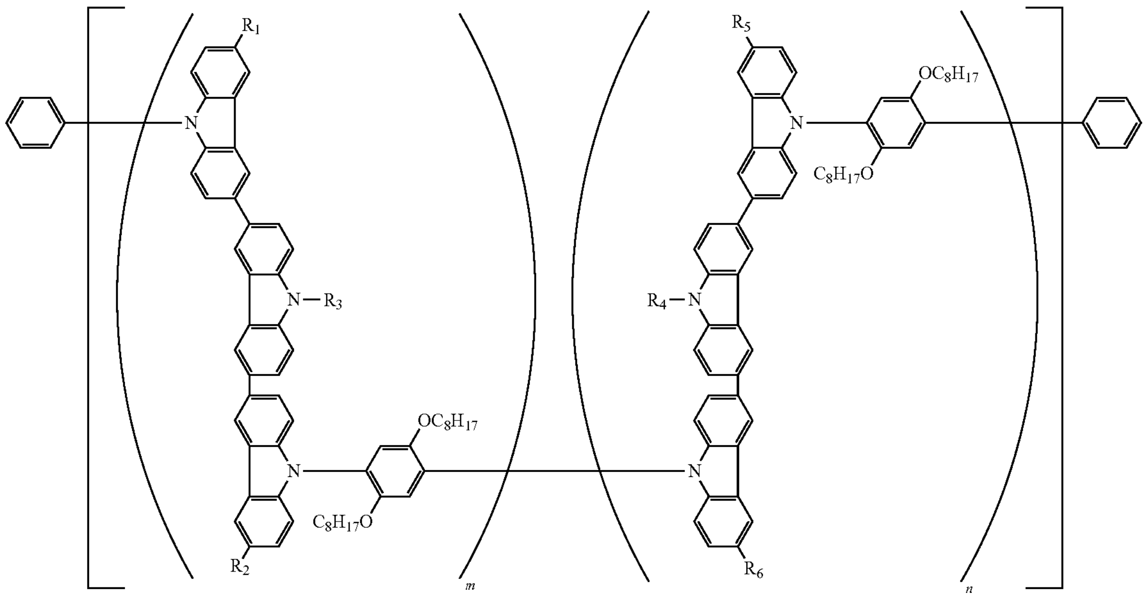
| Compound | R1 = R2 = R5 = R6 | R3 | R4 |
|---|---|---|---|
| 61-1 | H | H-1 | H-29 |
| 61-2 | | H-2 | |
| 61-3 | | H-3 | |
| 61-4 | | H-4 | |
| 61-5 | | H-5 | |
| 61-6 | | H-6 | |
| 61-7 | | H-7 | |
| 61-8 | | H-8 | |
| 61-9 | | H-9 | |
| 61-10 | | H-10 | |
| 61-11 | | H-11 | |
| 61-12 | | H-12 | |
| 61-13 | | H-13 | |
| 61-14 | | H-14 | |
| 61-15 | | H-15 | |
| 61-16 | | H-16 | |
| 61-17 | | H-17 | |
| 61-18 | | H-18 | |
| 61-19 | H | H-1 | H-29 |
| 61-20 | | H-2 | |
| 61-21 | | H-3 | |
| 61-22 | | H-4 | |
| 61-23 | | H-5 | |
| 61-24 | | H-6 | |
| 61-25 | | H-7 | |
| 61-26 | | H-8 | |
| 61-27 | | H-9 | |
| 61-28 | | H-10 | |
| 61-29 | | H-11 | |
| 61-30 | | H-12 | |
| 61-31 | | H-13 | |
| 61-32 | | H-14 | |
| 61-33 | | H-15 | |

TABLE 61-continued
| | |
|---|---|
| 61-34 | H-16 |
| 61-35 | H-17 |
| 61-36 | H-18 |
TABLE 62
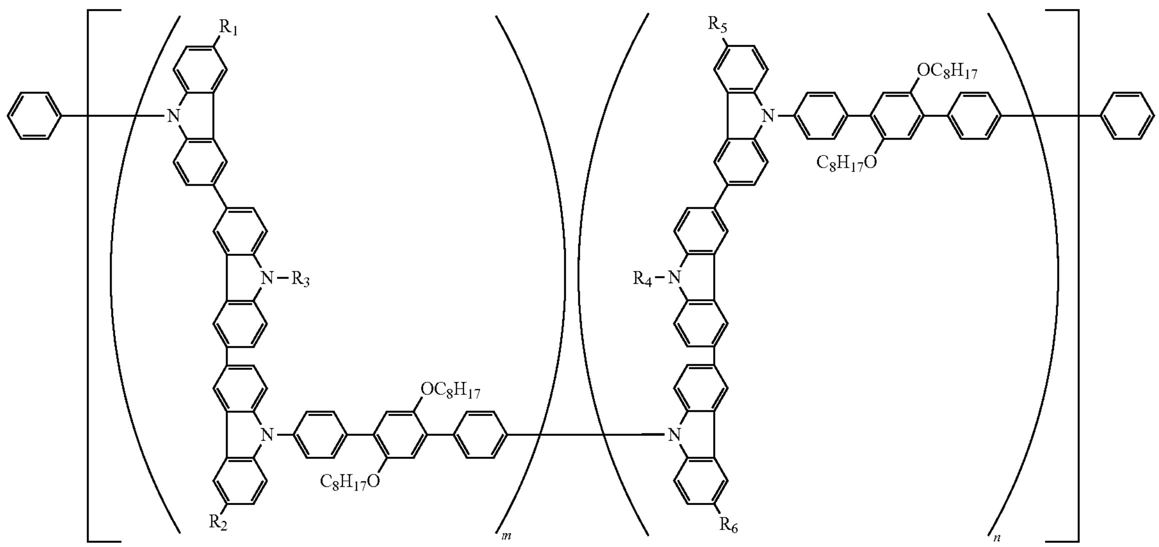
| Compound | R1 = R2 = R5 = R6 | R3 | R4 |
|---|---|---|---|
| 62-1 | H | H-1 | H-29 |
| 62-2 | | H-2 | |
| 62-3 | | H-3 | |
| 62-4 | | H-4 | |
| 62-5 | | H-5 | |
| 62-6 | | H-6 | |
| 62-7 | | H-7 | |
| 62-8 | | H-8 | |
| 62-9 | | H-9 | |
| 62-10 | | H-10 | |
| 62-11 | | H-11 | |
| 62-12 | | H-12 | |
| 62-13 | | H-13 | |
| 62-14 | | H-14 | |
| 62-15 | | H-15 | |
| 62-16 | | H-16 | |
| 62-17 | | H-17 | |
| 62-18 | | H-18 | |
| 62-19 | H | H-1 | H-29 |
| 62-20 | | H-2 | |
| 62-21 | | H-3 | |
| 62-22 | | H-4 | |
| 62-23 | | H-5 | |
| 62-24 | | H-6 | |
| 62-25 | | H-7 | |
| 62-26 | | H-8 | |
| 62-27 | | H-9 | |
| 62-28 | | H-10 | |
| 62-29 | | H-11 | |
| 62-30 | | H-12 | |
| 62-31 | | H-13 | |
| 62-32 | | H-14 | |
| 62-33 | | H-15 | |
| 62-34 | | H-16 | |
| 62-35 | | H-17 | |
| 62-36 | | H-18 | |

TABLE 63
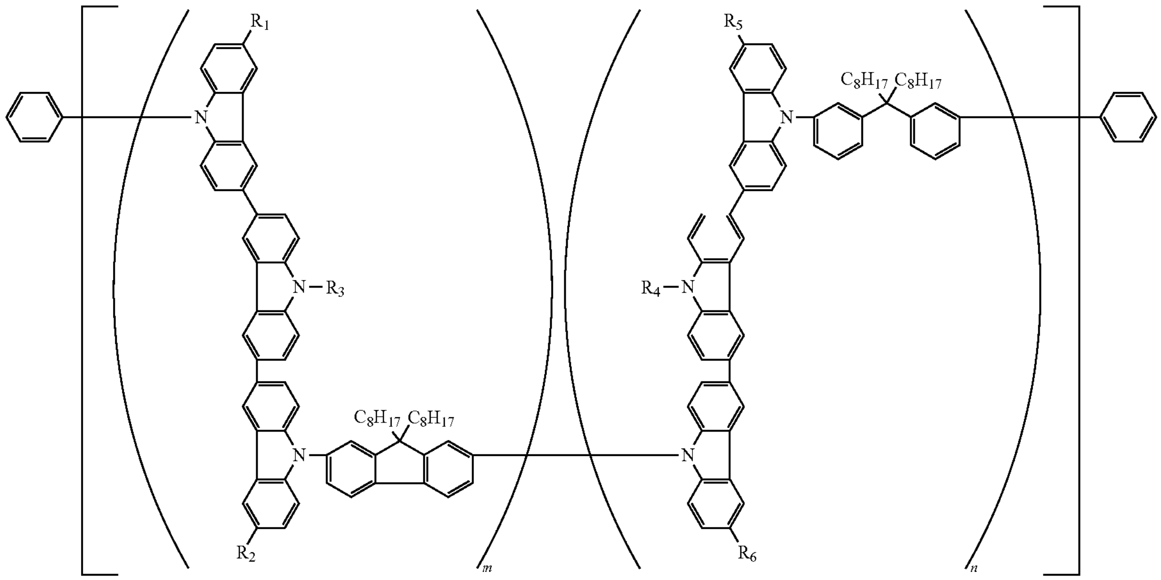
| Compound | R1 = R2 = R5 = R6 | R3 | R4 |
|---|---|---|---|
| 63-1 | H | H-1 | H-29 |
| 63-2 | | H-2 | |
| 63-3 | | H-3 | |
| 63-4 | | H-4 | |
| 63-5 | | H-5 | |
| 63-6 | | H-6 | |
| 63-7 | | H-7 | |
| 63-8 | | H-8 | |
| 63-9 | | H-9 | |
| 63-10 | | H-10 | |
| 63-11 | | H-11 | |
| 63-12 | | H-12 | |
| 63-13 | | H-13 | |
| 63-14 | | H-14 | |
| 63-15 | | H-15 | |
| 63-16 | | H-16 | |
| 63-17 | | H-17 | |
| 63-18 | | H-18 | |
| 63-19 | H | H-1 | H-29 |
| 63-20 | | H-2 | |
| 63-21 | | H-3 | |
| 63-22 | | H-4 | |
| 63-23 | | H-5 | |
| 63-24 | | H-6 | |
| 63-25 | | H-7 | |
| 63-26 | | H-8 | |
| 63-27 | | H-9 | |
| 63-28 | | H-10 | |
| 63-29 | | H-11 | |
| 63-30 | | H-12 | |
| 63-31 | | H-13 | |
| 63-32 | | H-14 | |
| 63-33 | | H-15 | |
| 63-34 | | H-16 | |
| 63-35 | | H-17 | |
| 63-36 | | H-18 | |

TABLE 64
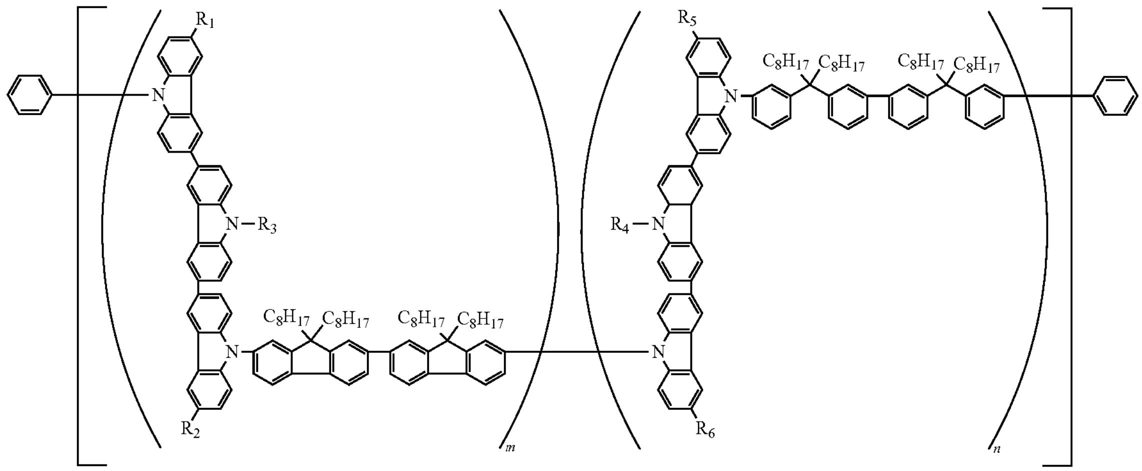
| Compound | R1 = R2 = R5 = R6 | R3 | R4 |
|---|---|---|---|
| 64-1 | H | H-1 | H-29 |
| 64-2 | | H-2 | |
| 64-3 | | H-3 | |
| 64-4 | | H-4 | |
| 64-5 | | H-5 | |
| 64-6 | | H-6 | |
| 64-7 | | H-7 | |
| 64-8 | | H-8 | |
| 64-9 | | H-9 | |
| 64-10 | | H-10 | |
| 64-11 | | H-11 | |
| 64-12 | | H-12 | |
| 64-13 | | H-13 | |
| 64-14 | | H-14 | |
| 64-15 | | H-15 | |
| 64-16 | | H-16 | |
| 64-17 | | H-17 | |
| 64-18 | | H-18 | |
| 64-19 | H | H-1 | H-29 |
| 64-20 | | H-2 | |
| 64-21 | | H-3 | |
| 64-22 | | H-4 | |
| 64-23 | | H-5 | |
| 64-24 | | H-6 | |
| 64-25 | | H-7 | |
| 64-26 | | H-8 | |
| 64-27 | | H-9 | |
| 64-28 | | H-10 | |
| 64-29 | | H-11 | |
| 64-30 | | H-12 | |
| 64-31 | | H-13 | |
| 64-32 | | H-14 | |
| 64-33 | | H-15 | |
| 64-34 | | H-16 | |
| 64-35 | | H-17 | |
| 64-36 | | H-18 | |

TABLE 65
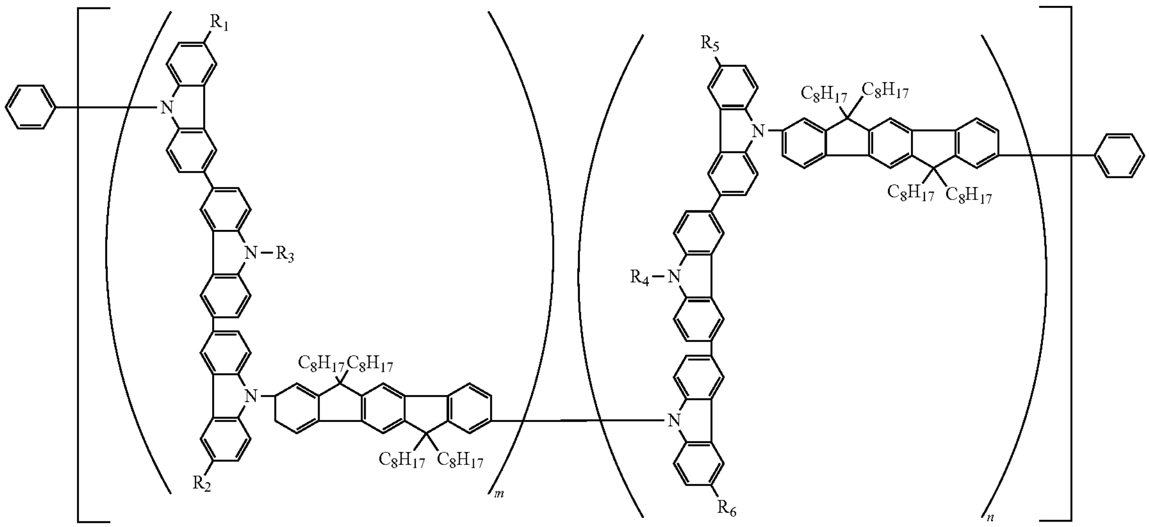
| Compound | R1 = R2 = R5 = R6 | R3 | R4 |
|---|---|---|---|
| 65-1 | H | H-1 | H-29 |
| 65-2 | | H-2 | |
| 65-3 | | H-3 | |
| 65-4 | | H-4 | |
| 65-5 | | H-5 | |
| 65-6 | | H-6 | |
| 65-7 | | H-7 | |
| 65-8 | | H-8 | |
| 65-9 | | H-9 | |
| 65-10 | | H-10 | |
| 65-11 | | H-11 | |
| 65-12 | | H-12 | |
| 65-13 | | H-13 | |
| 65-14 | | H-14 | |
| 65-15 | | H-15 | |
| 65-16 | | H-16 | |
| 65-17 | | H-17 | |
| 65-18 | | H-18 | |
| 65-19 | H | H-1 | H-29 |
| 65-20 | | H-2 | |
| 65-21 | | H-3 | |
| 65-22 | | H-4 | |
| 65-23 | | H-5 | |
| 65-24 | | H-6 | |
| 65-25 | | H-7 | |
| 65-26 | | H-8 | |
| 65-27 | | H-9 | |
| 65-28 | | H-10 | |
| 65-29 | | H-11 | |
| 65-30 | | H-12 | |
| 65-31 | | H-13 | |
| 65-32 | | H-14 | |
| 65-33 | | H-15 | |
| 65-34 | | H-16 | |
| 65-35 | | H-17 | |
| 65-36 | | H-18 | |

TABLE 66
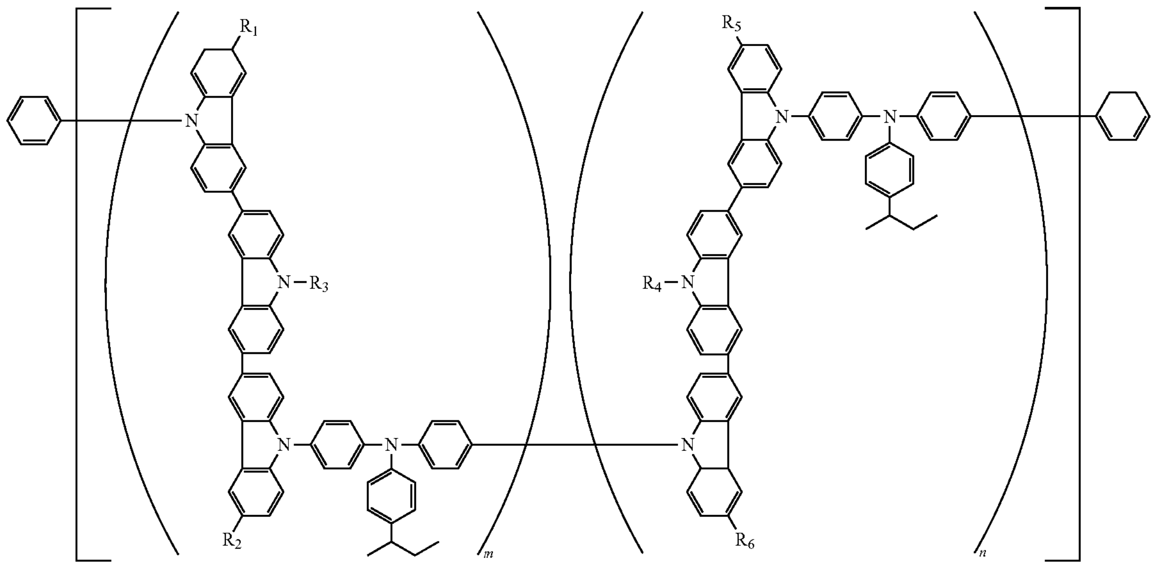
| Compound | R1 = R2 = R5 = R6 | R3 | R4 |
|---|---|---|---|
| 66-1 | H | H-1 | H-29 |
| 66-2 | | H-2 | |
| 66-3 | | H-3 | |
| 66-4 | | H-4 | |
| 66-5 | | H-5 | |
| 66-6 | | H-6 | |
| 66-7 | | H-7 | |
| 66-8 | | H-8 | |
| 66-9 | | H-9 | |
| 66-10 | | H-10 | |
| 66-11 | | H-11 | |
| 66-12 | | H-12 | |
| 66-13 | | H-13 | |
| 66-14 | | H-14 | |
| 66-15 | | H-15 | |
| 66-16 | | H-16 | |
| 66-17 | | H-17 | |
| 66-18 | | H-18 | |
| 66-19 | H | H-1 | H-29 |
| 66-20 | | H-2 | |
| 66-21 | | H-3 | |
| 66-22 | | H-4 | |
| 66-23 | | H-5 | |
| 66-24 | | H-6 | |
| 66-25 | | H-7 | |
| 66-26 | | H-8 | |
| 66-27 | | H-9 | |
| 66-28 | | H-10 | |
| 66-29 | | H-11 | |
| 66-30 | | H-12 | |

TABLE 66-continued
| | |
|---|---|
| 66-31 | H-13 |
| 66-32 | H-14 |
| 66-33 | H-15 |
| 66-34 | H-16 |
| 66-35 | H-17 |
| 66-36 | H-18 |
TABLE 67
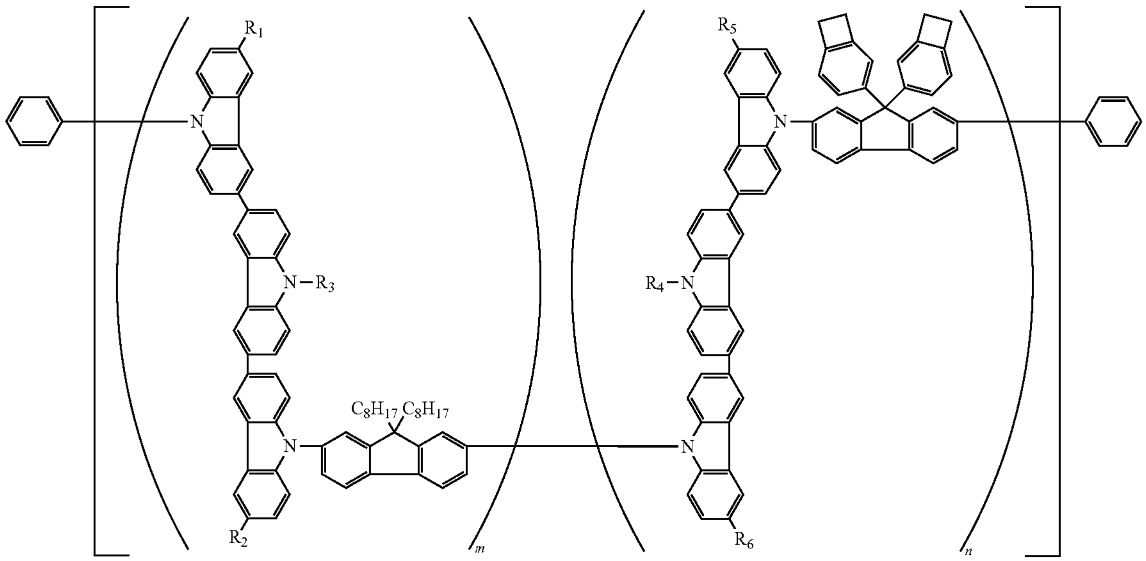
| Compound | R1 = R2 = R5 = R6 | R3 = R4 |
|---|---|---|
| 67-1 | H | H-1 |
| 67-2 | | H-2 |
| 67-3 | | H-3 |
| 67-4 | | H-4 |
| 67-5 | | H-5 |
| 67-6 | | H-6 |
| 67-7 | | H-7 |
| 67-8 | | H-8 |
| 67-9 | | H-9 |
| 67-10 | | H-10 |
| 67-11 | | H-11 |
| 67-12 | | H-12 |
| 67-13 | | H-13 |
| 67-14 | | H-14 |
| 67-15 | | H-15 |
| 67-16 | | H-16 |
| 67-17 | | H-17 |
| 67-18 | | H-18 |

TABLE 68
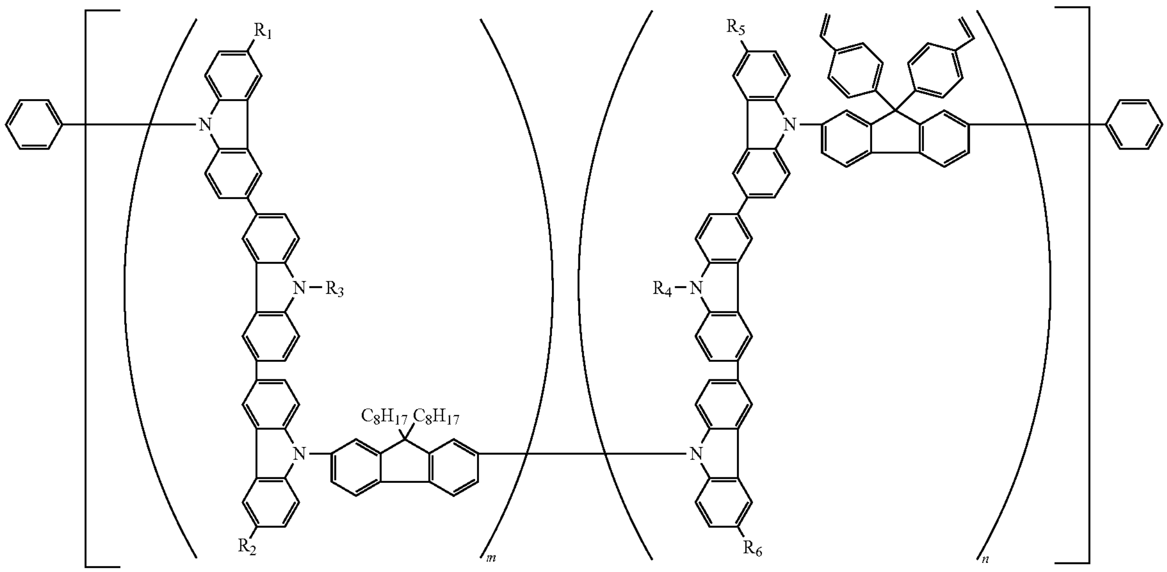
| Compound | R1 = R2 = R5 = R6 | R3 = R4 |
|---|---|---|
| 68-1 | H | H-1 |
| 68-2 | | H-2 |
| 68-3 | | H-3 |
| 68-4 | | H-4 |
| 68-5 | | H-5 |
| 68-6 | | H-6 |
| 68-7 | | H-7 |
| 68-8 | | H-8 |
| 68-9 | | H-9 |
| 68-10 | | H-10 |
| 68-11 | | H-11 |
| 68-12 | | H-12 |
| 68-13 | | H-13 |
| 68-14 | | H-14 |
| 68-15 | | H-15 |
| 68-16 | | H-16 |
| 68-17 | | H-17 |
| 68-18 | | H-18 |

TABLE 69
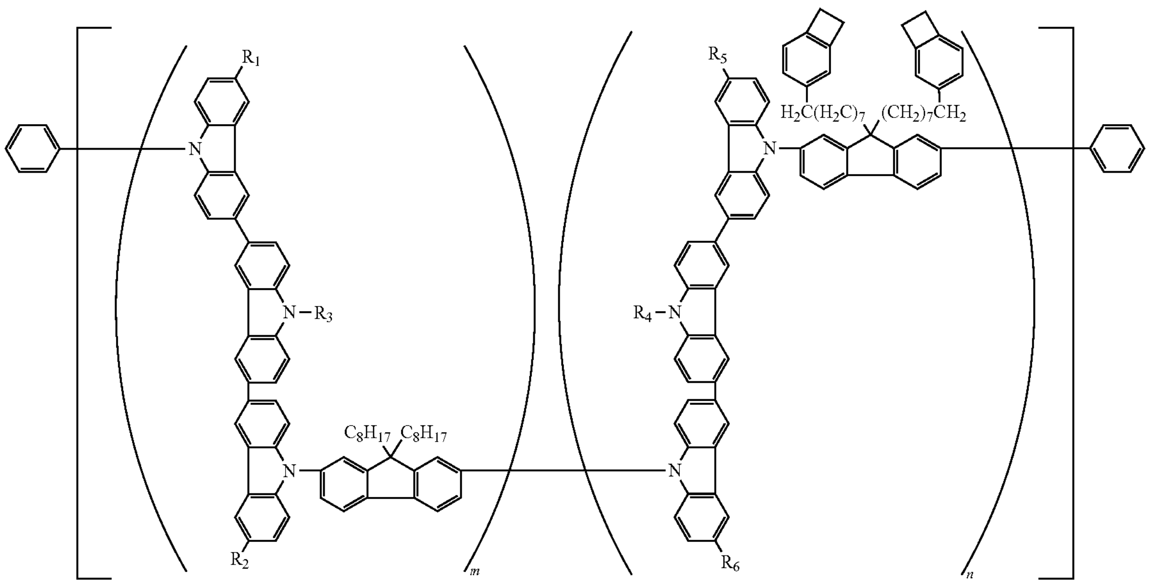
| Compound | R1 = R2 = R5 = R6 | R3 = R4 |
|---|---|---|
| 69-1 | H | H-1 |
| 69-2 | | H-2 |
| 69-3 | | H-3 |
| 69-4 | | H-4 |
| 69-5 | | H-5 |
| 69-6 | | H-6 |
| 69-7 | | H-7 |
| 69-8 | | H-8 |
| 69-9 | | H-9 |
| 69-10 | | H-10 |
| 69-11 | | H-11 |
| 69-12 | | H-12 |
| 69-13 | | H-13 |
| 69-14 | | H-14 |
| 69-15 | | H-15 |
| 69-16 | | H-16 |
| 69-17 | | H-17 |
| 69-18 | | H-18 |

TABLE 70
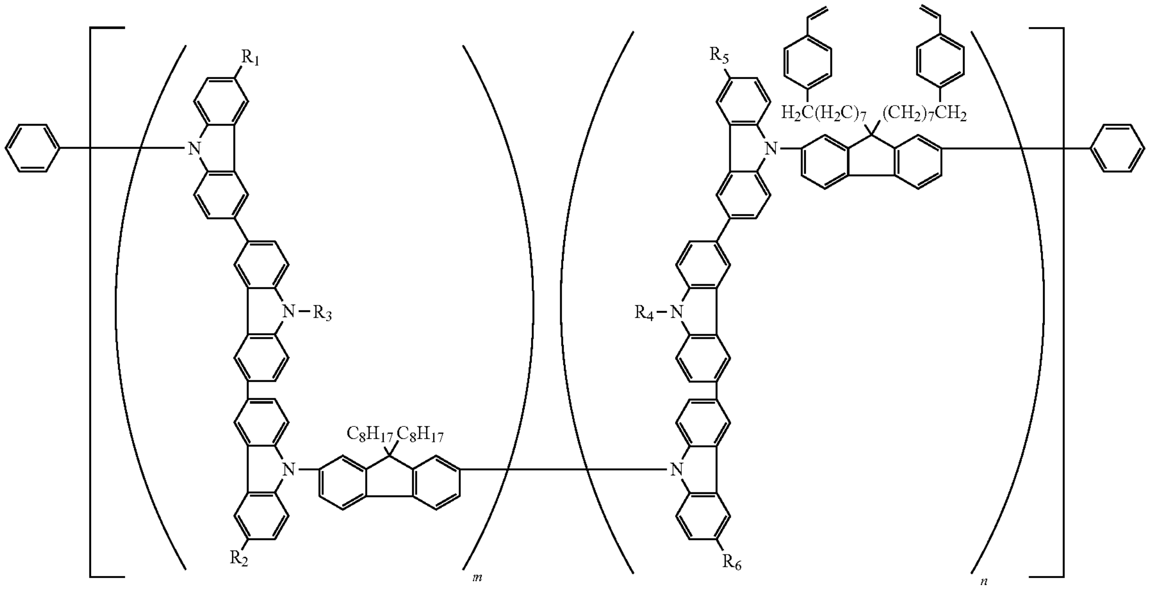
| Compound | R1 = R2 = R5 = R6 | R3 = R4 |
|---|---|---|
| 70-1 | H | H-1 |
| 70-2 | | H-2 |
| 70-3 | | H-3 |
| 70-4 | | H-4 |
| 70-5 | | H-5 |
| 70-6 | | H-6 |
| 70-7 | | H-7 |
| 70-8 | | H-8 |
| 70-9 | | H-9 |
| 70-10 | | H-10 |
| 70-11 | | H-11 |
| 70-12 | | H-12 |
| 70-13 | | H-13 |
| 70-14 | | H-14 |
| 70-15 | | H-15 |
| 70-16 | | H-16 |
| 70-17 | | H-17 |
| 70-18 | | H-18 |

TABLE 71
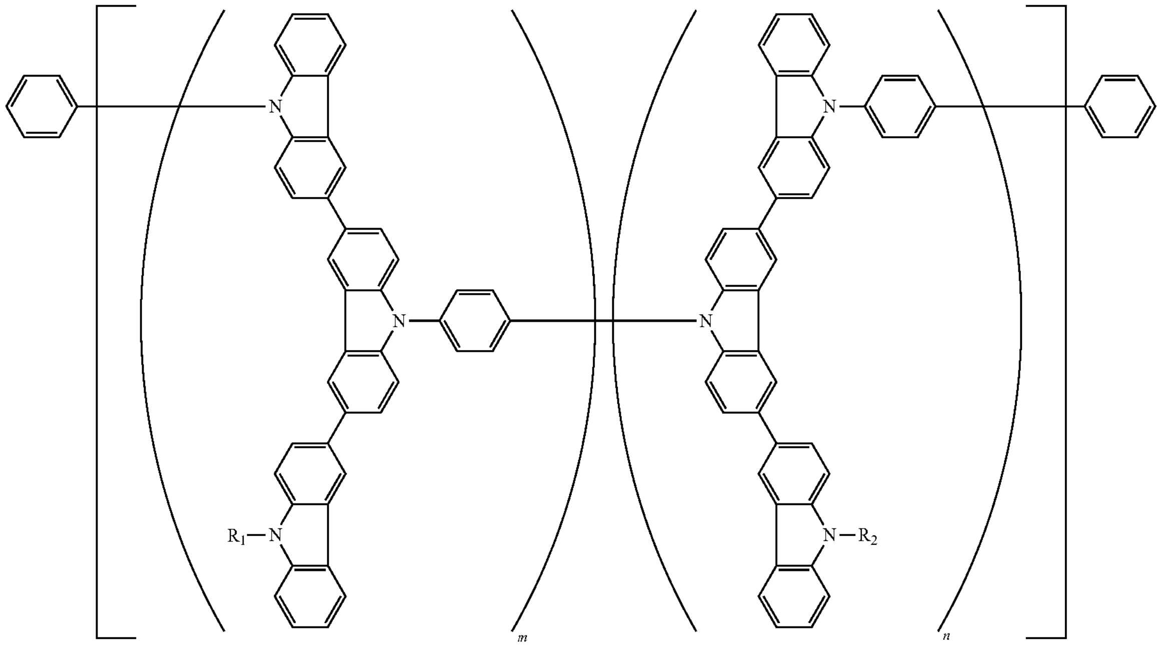
| Compound | R1 | R2 |
|---|---|---|
| 71-1 | H-1 | H-29 |
| 71-2 | H-2 | |
| 71-3 | H-3 | |
| 71-4 | H-4 | |
| 71-5 | H-5 | |
| 71-6 | H-6 | |
| 71-7 | H-7 | |
| 71-8 | H-8 | |
| 71-9 | H-9 | |
| 71-10 | H-10 | |
| 71-11 | H-11 | |
| 71-12 | H-12 | |
| 71-13 | H-13 | |
| 71-14 | H-14 | |
| 71-15 | H-15 | |
| 71-16 | H-16 | |
| 71-17 | H-17 | |
| 71-18 | H-18 | |
| 71-19 | H-1 | H-30 |
| 71-20 | H-2 | |
| 71-21 | H-3 | |
| 71-22 | H-4 | |
| 71-23 | H-5 | |
| 71-24 | H-6 | |
| 71-25 | H-7 | |
| 71-26 | H-8 | |
| 71-27 | H-9 | |
| 71-28 | H-10 | |
| 71-29 | H-11 | |
| 71-30 | H-12 | |
| 71-31 | H-13 | |
| 71-32 | H-14 | |
| 71-33 | H-15 | |
| 71-34 | H-16 | |
| 71-35 | H-17 | |
| 71-36 | H-18 | |

TABLE 72
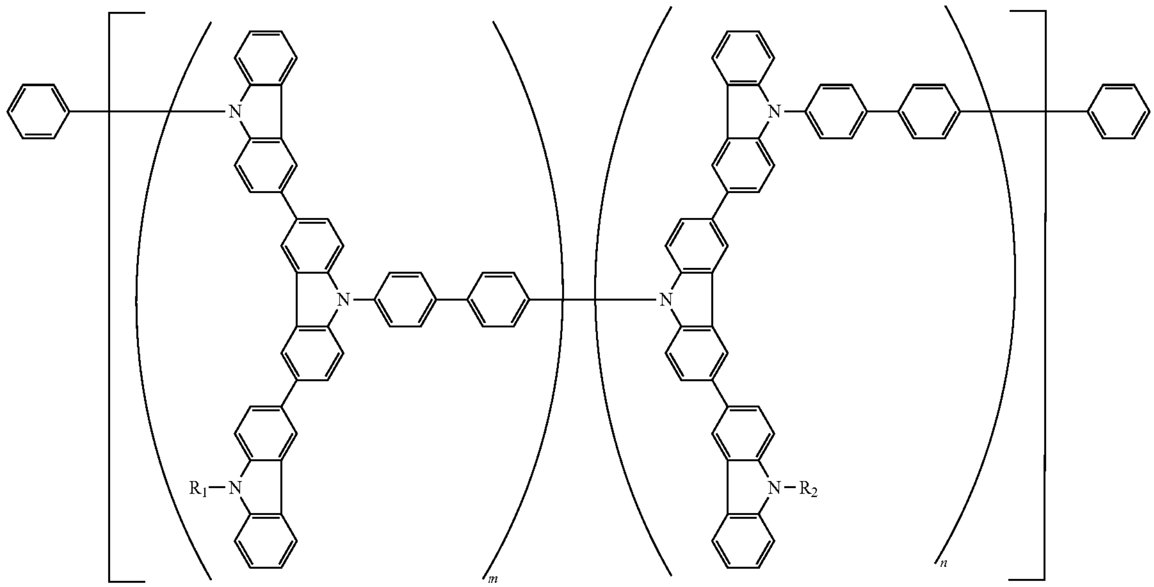
| Compound | R1 | R2 |
|---|---|---|
| 72-1 | H-1 | H-29 |
| 72-2 | H-2 | |
| 72-3 | H-3 | |
| 72-4 | H-4 | |
| 72-5 | H-5 | |
| 72-6 | H-6 | |
| 72-7 | H-7 | |
| 72-8 | H-8 | |
| 72-9 | H-9 | |
| 72-10 | H-10 | |
| 72-11 | H-11 | |
| 72-12 | H-12 | |
| 72-13 | H-13 | |
| 72-14 | H-14 | |
| 72-15 | H-15 | |
| 72-16 | H-16 | |
| 72-17 | H-17 | |
| 72-18 | H-18 | |
| 72-19 | H-1 | H-30 |
| 72-20 | H-2 | |
| 72-21 | H-3 | |
| 72-22 | H-4 | |
| 72-23 | H-5 | |
| 72-24 | H-6 | |
| 72-25 | H-7 | |
| 72-26 | H-8 | |
| 72-27 | H-9 | |
| 72-28 | H-10 | |
| 72-29 | H-11 | |
| 72-30 | H-12 | |
| 72-31 | H-13 | |
| 72-32 | H-14 | |
| 72-33 | H-15 | |
| 72-34 | H-16 | |
| 72-35 | H-17 | |
| 72-36 | H-18 | |

TABLE 73
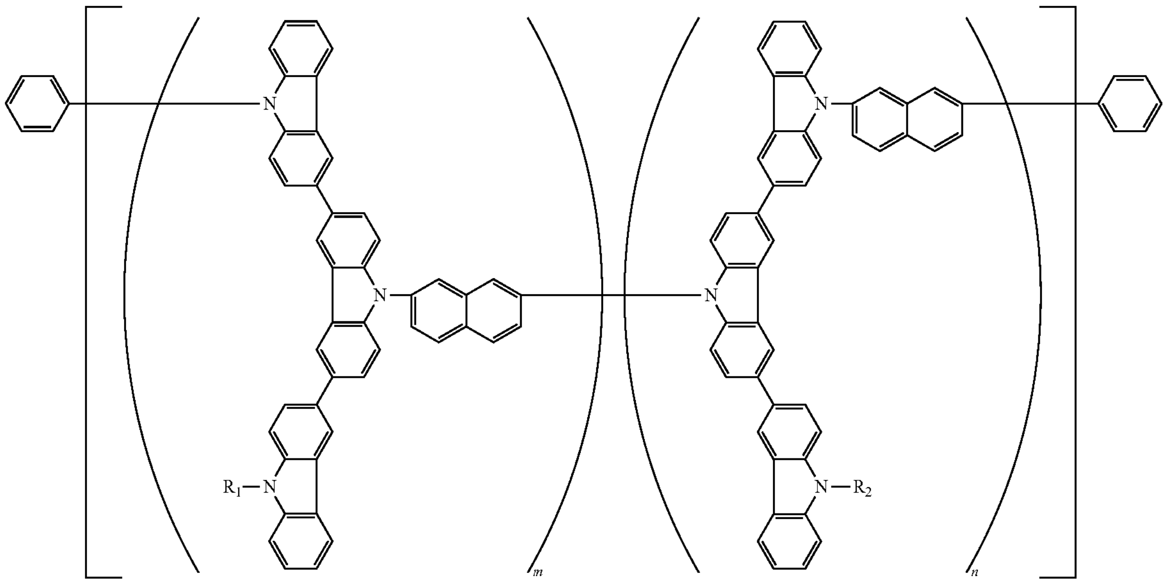
| Compound | R1 | R2 |
|---|---|---|
| 73-1 | H-1 | H-29 |
| 73-2 | H-2 | |
| 73-3 | H-3 | |
| 73-4 | H-4 | |
| 73-5 | H-5 | |
| 73-6 | H-6 | |
| 73-7 | H-7 | |
| 73-8 | H-8 | |
| 73-9 | H-9 | |
| 73-10 | H-10 | |
| 73-11 | H-11 | |
| 73-12 | H-12 | |
| 73-13 | H-13 | |
| 73-14 | H-14 | |
| 73-15 | H-15 | |
| 73-16 | H-16 | |
| 73-17 | H-17 | |
| 73-18 | H-18 | |
| 73-19 | H-1 | H-30 |
| 73-20 | H-2 | |
| 73-21 | H-3 | |
| 73-22 | H-4 | |
| 73-23 | H-5 | |
| 73-24 | H-6 | |
| 73-25 | H-7 | |
| 73-26 | H-8 | |
| 73-27 | H-9 | |
| 73-28 | H-10 | |
| 73-29 | H-11 | |
| 73-30 | H-12 | |
| 73-31 | H-13 | |
| 73-32 | H-14 | |
| 73-33 | H-15 | |
| 73-34 | H-16 | |
| 73-35 | H-17 | |
| 73-36 | H-18 | |

TABLE 74
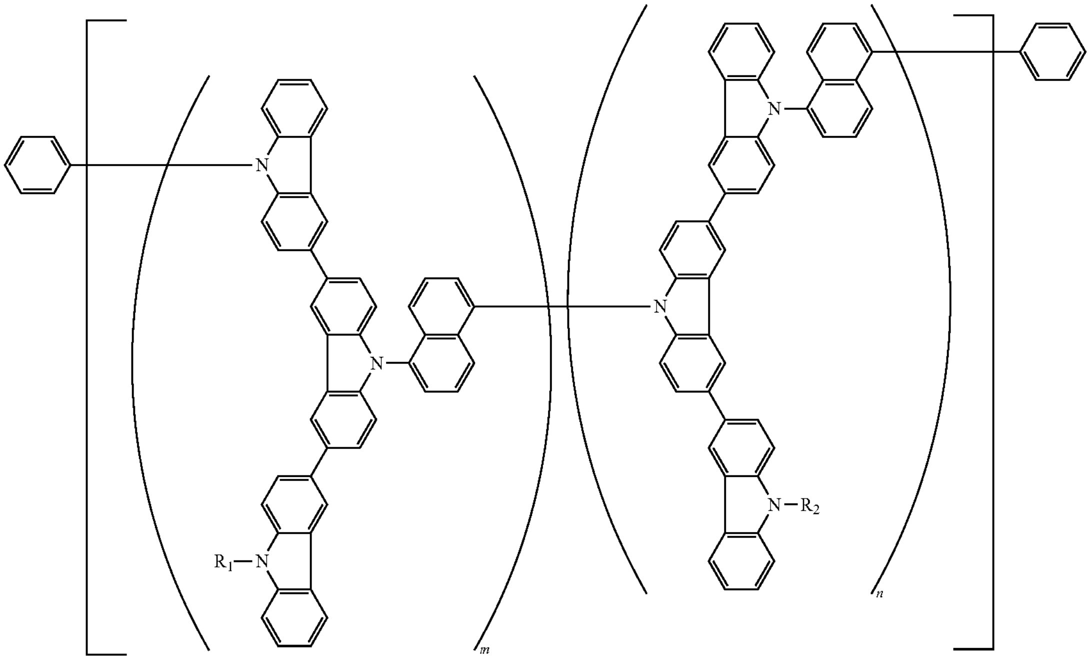
| Compound | R1 | R2 |
|---|---|---|
| 74-1 | H-1 | H-29 |
| 74-2 | H-2 | |
| 74-3 | H-3 | |
| 74-4 | H-4 | |
| 74-5 | H-5 | |
| 74-6 | H-6 | |
| 74-7 | H-7 | |
| 74-8 | H-8 | |
| 74-9 | H-9 | |
| 74-10 | H-10 | |
| 74-11 | H-11 | |
| 74-12 | H-12 | |
| 74-13 | H-13 | |
| 74-14 | H-14 | |
| 74-15 | H-15 | |
| 74-16 | H-16 | |
| 74-17 | H-17 | |
| 74-18 | H-18 | |
| 74-19 | H-1 | H-30 |
| 74-20 | H-2 | |
| 74-21 | H-3 | |
| 74-22 | H-4 | |
| 74-23 | H-5 | |
| 74-24 | H-6 | |
| 74-25 | H-7 | |
| 74-26 | H-8 | |
| 74-27 | H-9 | |
| 74-28 | H-10 | |
| 74-29 | H-11 | |
| 74-30 | H-12 | |
| 74-31 | H-13 | |
| 74-32 | H-14 | |
| 74-33 | H-15 | |
| 74-34 | H-16 | |
| 74-35 | H-17 | |
| 74-36 | H-18 | |

TABLE 75
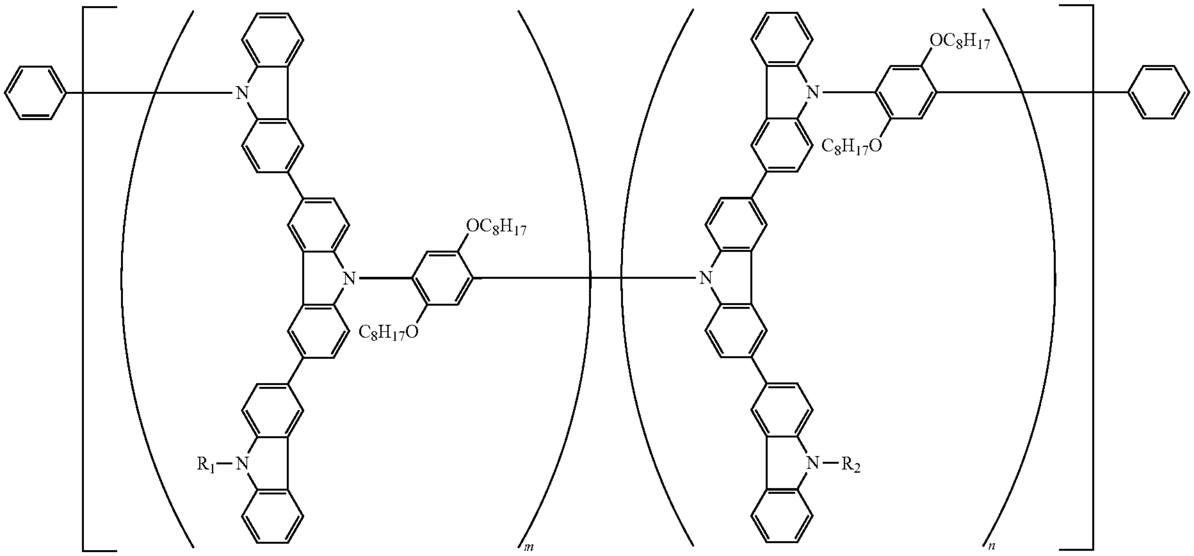
| Com. | R1 | R2 |
|---|---|---|
| 75-1 | H-1 | H-29 |
| 75-2 | H-2 | |
| 75-3 | H-3 | |
| 75-4 | H-4 | |
| 75-5 | H-5 | |
| 75-6 | H-6 | |
| 75-7 | H-7 | |
| 75-8 | H-8 | |
| 75-9 | H-9 | |
| 75-10 | H-10 | |
| 75-11 | H-11 | |
| 75-12 | H-12 | |
| 75-13 | H-13 | |
| 75-14 | H-14 | |
| 75-15 | H-15 | |
| 75-16 | H-16 | |
| 75-17 | H-17 | |
| 75-18 | H-18 | |
| 75-19 | H-1 | H-30 |
| 75-20 | H-2 | |
| 75-21 | H-3 | |
| 75-22 | H-4 | |
| 75-23 | H-5 | |
| 75-24 | H-6 | |
| 75-25 | H-7 | |
| 75-26 | H-8 | |
| 75-27 | H-9 | |
| 75-28 | H-10 | |
| 75-29 | H-11 | |
| 75-30 | H-12 | |
| 75-31 | H-13 | |
| 75-32 | H-14 | |
| 75-33 | H-15 | |
| 75-34 | H-16 | |
| 75-35 | H-17 | |
| 75-36 | H-18 | |

TABLE 76
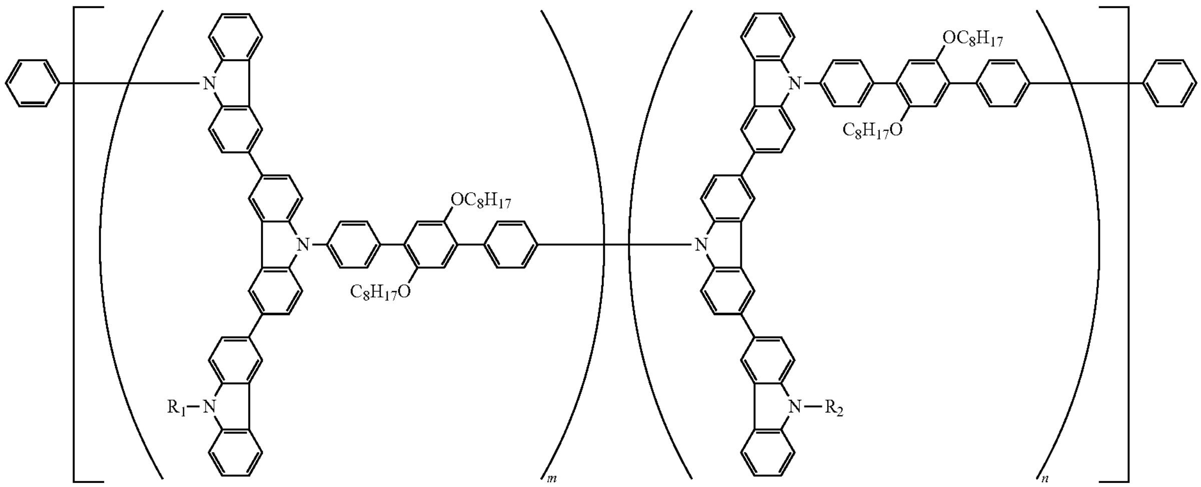
| Com. | R1 | R2 |
|---|---|---|
| 76-1 | H-1 | H-29 |
| 76-2 | H-2 | |
| 76-3 | H-3 | |
| 76-4 | H-4 | |
| 76-5 | H-5 | |
| 76-6 | H-6 | |
| 76-7 | H-7 | |
| 76-8 | H-8 | |
| 76-9 | H-9 | |
| 76-10 | H-10 | |
| 76-11 | H-11 | |
| 76-12 | H-12 | |
| 76-13 | H-13 | |
| 76-14 | H-14 | |
| 76-15 | H-15 | |
| 76-16 | H-16 | |
| 76-17 | H-17 | |
| 76-18 | H-18 | |
| 76-19 | H-1 | H-30 |
| 76-20 | H-2 | |
| 76-21 | H-3 | |
| 76-22 | H-4 | |
| 76-23 | H-5 | |
| 76-24 | H-6 | |
| 76-25 | H-7 | |
| 76-26 | H-8 | |
| 76-27 | H-9 | |
| 76-28 | H-10 | |
| 76-29 | H-11 | |
| 76-30 | H-12 | |
| 76-31 | H-13 | |
| 76-32 | H-14 | |
| 76-33 | H-15 | |
| 76-34 | H-16 | |
| 76-35 | H-17 | |
| 76-36 | H-18 | |

TABLE 77
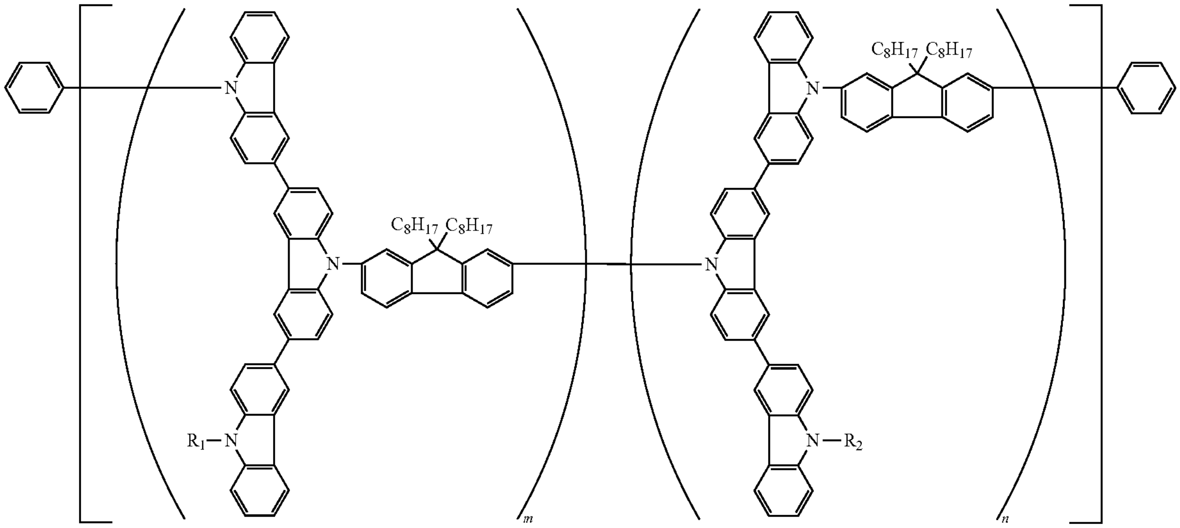
| Com. | R1 | R2 |
|---|---|---|
| 77-1 | H-1 | H-29 |
| 77-2 | H-2 | |
| 77-3 | H-3 | |
| 77-4 | H-4 | |
| 77-5 | H-5 | |
| 77-6 | H-6 | |
| 77-7 | H-7 | |
| 77-8 | H-8 | |
| 77-9 | H-9 | |
| 77-10 | H-10 | |
| 77-11 | H-11 | |
| 77-12 | H-12 | |
| 77-13 | H-13 | |
| 77-14 | H-14 | |
| 77-15 | H-15 | |
| 77-16 | H-16 | |
| 77-17 | H-17 | |
| 77-18 | H-18 | |
| 77-19 | H-1 | H-30 |
| 77-20 | H-2 | |
| 77-21 | H-3 | |
| 77-22 | H-4 | |
| 77-23 | H-5 | |
| 77-24 | H-6 | |
| 77-25 | H-7 | |
| 77-26 | H-8 | |
| 77-27 | H-9 | |
| 77-28 | H-10 | |
| 77-29 | H-11 | |
| 77-30 | H-12 | |
| 77-31 | H-13 | |
| 77-32 | H-14 | |
| 77-33 | H-15 | |
| 77-34 | H-16 | |
| 77-35 | H-17 | |
| 77-36 | H-18 | |

TABLE 78
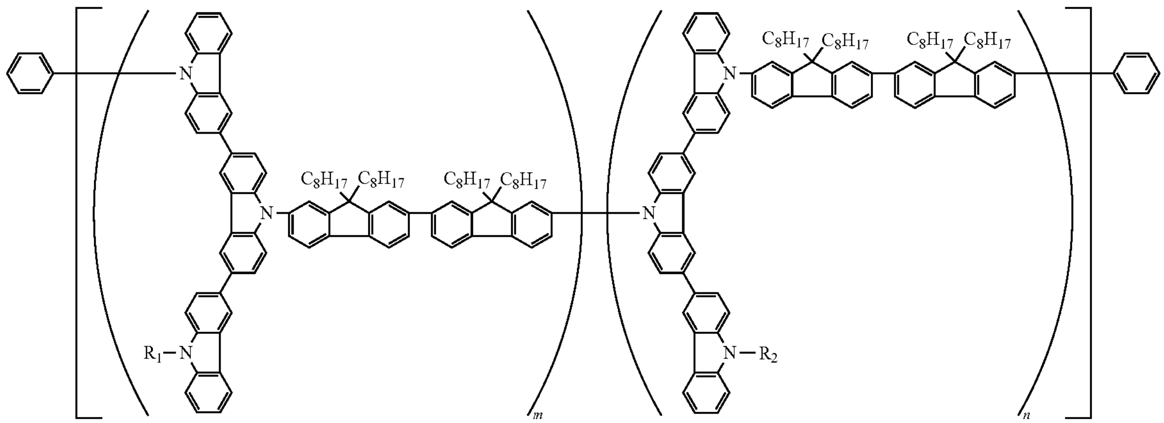
| Com. | R1 | R2 |
|---|---|---|
| 78-1 | H-1 | H-29 |
| 78-2 | H-2 | |
| 78-3 | H-3 | |
| 78-4 | H-4 | |
| 78-5 | H-5 | |
| 78-6 | H-6 | |
| 78-7 | H-7 | |
| 78-8 | H-8 | |
| 78-9 | H-9 | |
| 78-10 | H-10 | |
| 78-11 | H-11 | |
| 78-12 | H-12 | |
| 78-13 | H-13 | |
| 78-14 | H-14 | |
| 78-15 | H-15 | |
| 78-16 | H-16 | |
| 78-17 | H-17 | |
| 78-18 | H-18 | |
| 78-19 | H-1 | H-30 |
| 78-20 | H-2 | |
| 78-21 | H-3 | |
| 78-22 | H-4 | |
| 78-23 | H-5 | |
| 78-24 | H-6 | |
| 78-25 | H-7 | |
| 78-26 | H-8 | |
| 78-27 | H-9 | |
| 78-28 | H-10 | |
| 78-29 | H-11 | |
| 78-30 | H-12 | |
| 78-31 | H-13 | |
| 78-32 | H-14 | |
| 78-33 | H-15 | |
| 78-34 | H-16 | |
| 78-35 | H-17 | |
| 78-36 | H-18 | |

TABLE 79
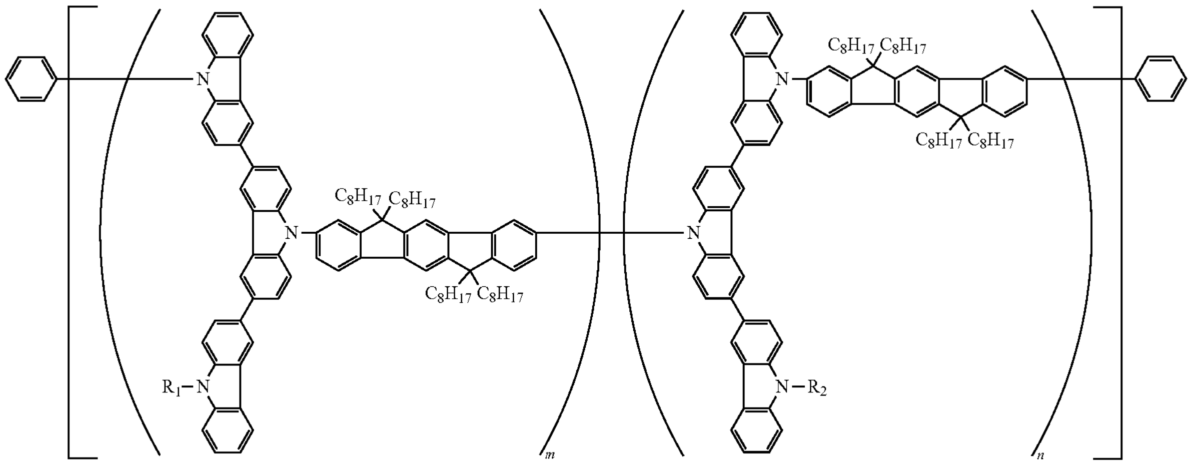
| Com. | R1 | R2 |
|---|---|---|
| 79-1 | H-1 | H-29 |
| 79-2 | H-2 | |
| 79-3 | H-3 | |
| 79-4 | H-4 | |
| 79-5 | H-5 | |
| 79-6 | H-6 | |
| 79-7 | H-7 | |
| 79-8 | H-8 | |
| 79-9 | H-9 | |
| 79-10 | H-10 | |
| 79-11 | H-11 | |
| 79-12 | H-12 | |
| 79-13 | H-13 | |
| 79-14 | H-14 | |
| 79-15 | H-15 | |
| 79-16 | H-16 | |
| 79-17 | H-17 | |
| 79-18 | H-18 | |
| 79-19 | H-1 | H-30 |
| 79-20 | H-2 | |
| 79-21 | H-3 | |
| 79-22 | H-4 | |
| 79-23 | H-5 | |
| 79-24 | H-6 | |
| 79-25 | H-7 | |
| 79-26 | H-8 | |
| 79-27 | H-9 | |
| 79-28 | H-10 | |
| 79-29 | H-11 | |
| 79-30 | H-12 | |
| 79-31 | H-13 | |
| 79-32 | H-14 | |
| 79-33 | H-15 | |
| 79-34 | H-16 | |
| 79-35 | H-17 | |
| 79-36 | H-18 | |

TABLE 80
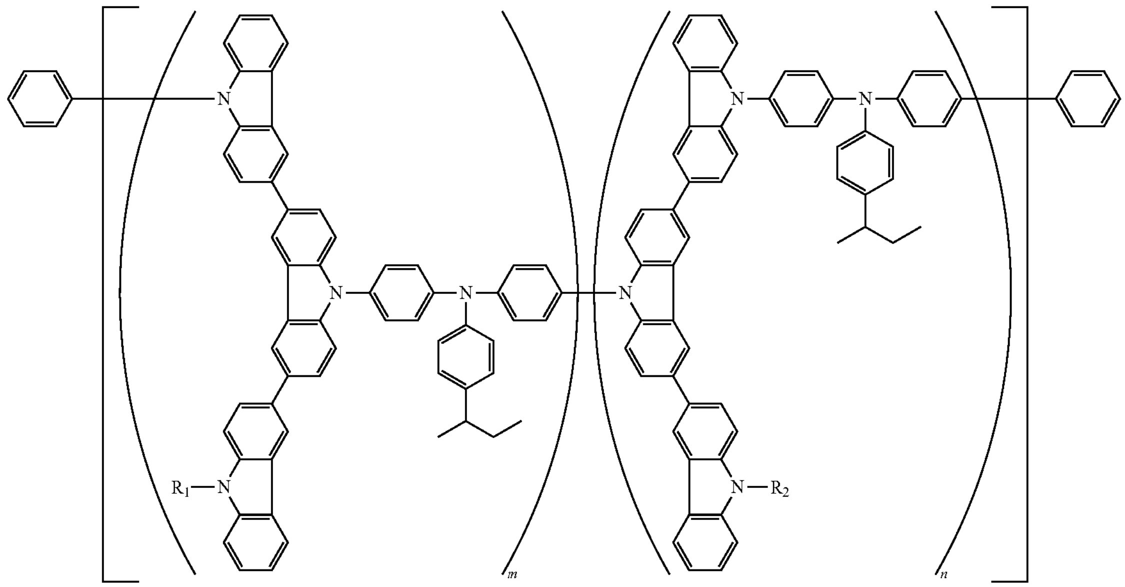
| Com. | R1 | R2 |
|---|---|---|
| 80-1 | H-1 | H-29 |
| 80-2 | H-2 | |
| 80-3 | H-3 | |
| 80-4 | H-4 | |
| 80-5 | H-5 | |
| 80-6 | H-6 | |
| 80-7 | H-7 | |
| 80-8 | H-8 | |
| 80-9 | H-9 | |
| 80-10 | H-10 | |
| 80-11 | H-11 | |
| 80-12 | H-12 | |
| 80-13 | H-13 | |
| 80-14 | H-14 | |
| 80-15 | H-15 | |
| 80-16 | H-16 | |
| 80-17 | H-17 | |
| 80-18 | H-18 | |
| 80-19 | H-1 | H-30 |
| 80-20 | H-2 | |
| 80-21 | H-3 | |
| 80-22 | H-4 | |
| 80-23 | H-5 | |
| 80-24 | H-6 | |
| 80-25 | H-7 | |
| 80-26 | H-8 | |
| 80-27 | H-9 | |
| 80-28 | H-10 | |
| 80-29 | H-11 | |
| 80-30 | H-12 | |
| 80-31 | H-13 | |
| 80-32 | H-14 | |
| 80-33 | H-15 | |
| 80-34 | H-16 | |
| 80-35 | H-17 | |
| 80-36 | H-18 | |

TABLE 81
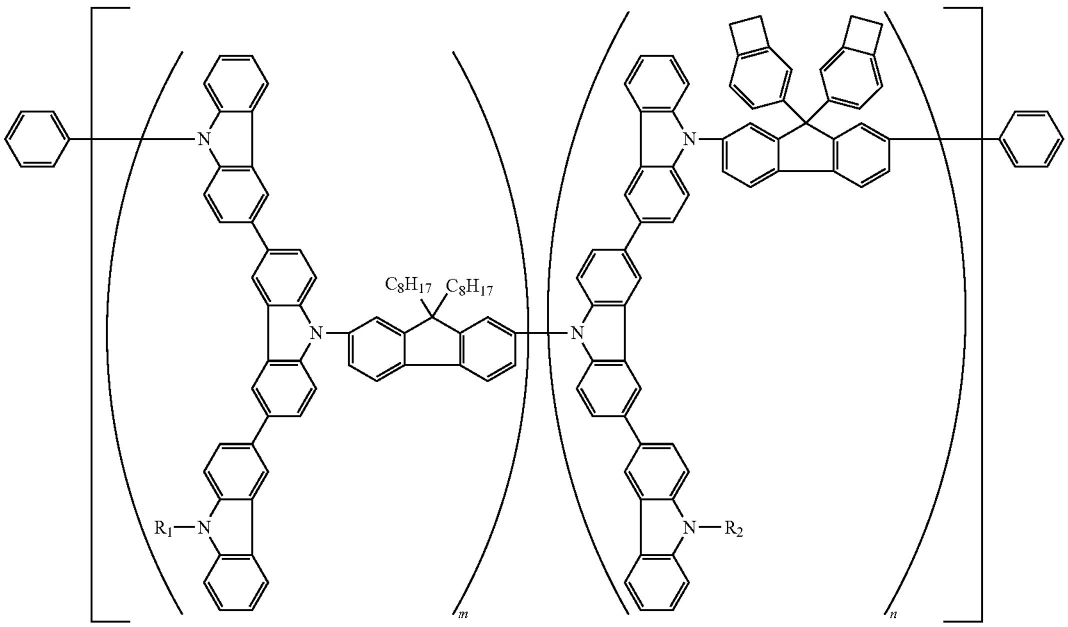
| Com. | R1 = R2 |
| --- | --- |
| 81-1 | H-1 |
| 81-2 | H-2 |
| 81-3 | H-3 |
| 81-4 | H-4 |
| 81-5 | H-5 |
| 81-6 | H-6 |
| 81-7 | H-7 |
| 81-8 | H-8 |
| 81-9 | H-9 |
| 81-10 | H-10 |
| 81-11 | H-11 |
| 81-12 | H-12 |
| 81-13 | H-13 |
| 81-14 | H-14 |
| 81-15 | H-15 |
| 81-16 | H-16 |
| 81-17 | H-17 |
| 81-18 | H-18 |

TABLE 82
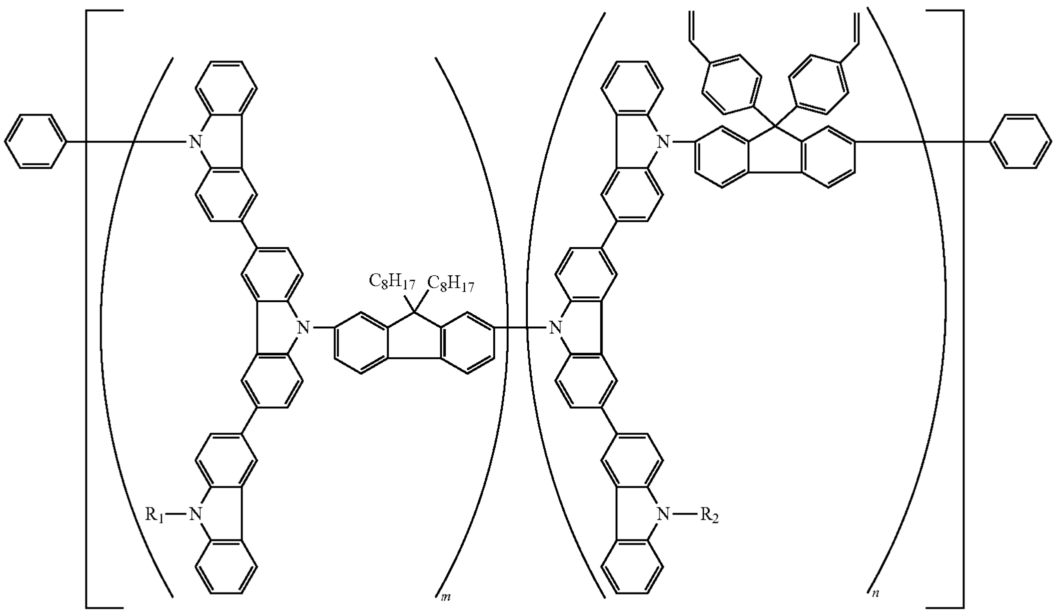
| Com. | R1 = R2 |
|---|---|
| 82-1 | H-1 |
| 82-2 | H-2 |
| 82-3 | H-3 |
| 82-4 | H-4 |
| 82-5 | H-5 |
| 82-6 | H-6 |
| 82-7 | H-7 |
| 82-8 | H-8 |
| 82-9 | H-9 |
| 82-10 | H-10 |
| 82-11 | H-11 |
| 82-12 | H-12 |
| 82-13 | H-13 |
| 82-14 | H-14 |
| 82-15 | H-15 |
| 82-16 | H-16 |
| 82-17 | H-17 |
| 82-18 | H-18 |

TABLE 83
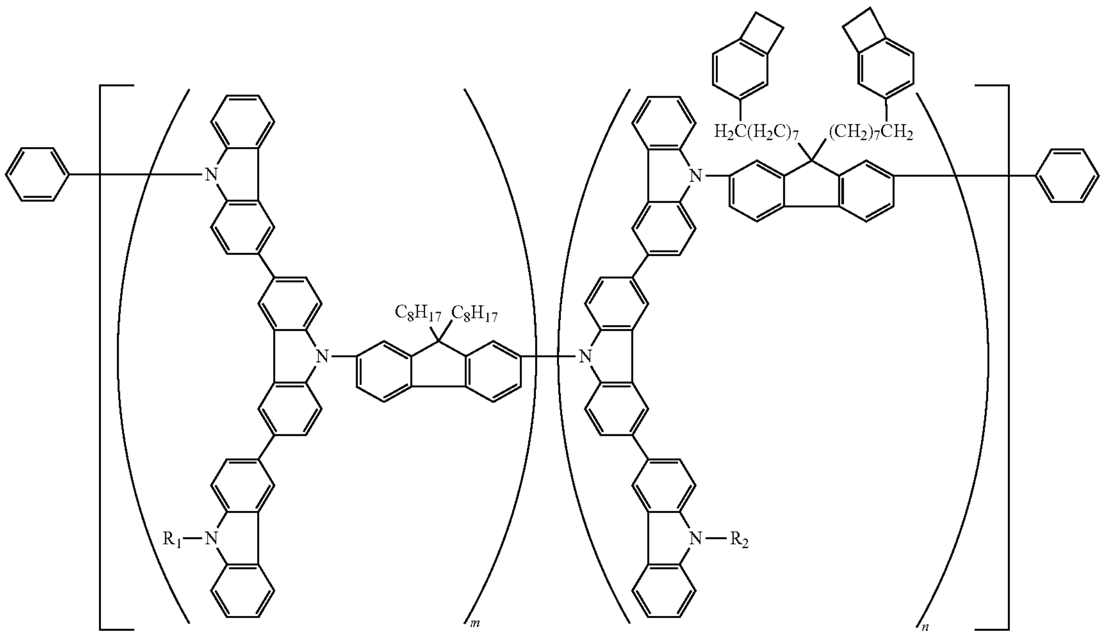
| Com. | R1 = R2 |
|---|---|
| 83-1 | H-1 |
| 83-2 | H-2 |
| 83-3 | H-3 |
| 83-4 | H-4 |
| 83-5 | H-5 |
| 83-6 | H-6 |
| 83-7 | H-7 |
| 83-8 | H-8 |
| 83-9 | H-9 |
| 83-10 | H-10 |
| 83-11 | H-11 |
| 83-12 | H-12 |
| 83-13 | H-13 |
| 83-14 | H-14 |
| 83-15 | H-15 |
| 83-16 | H-16 |
| 83-17 | H-17 |
| 83-18 | H-18 |

TABLE 84
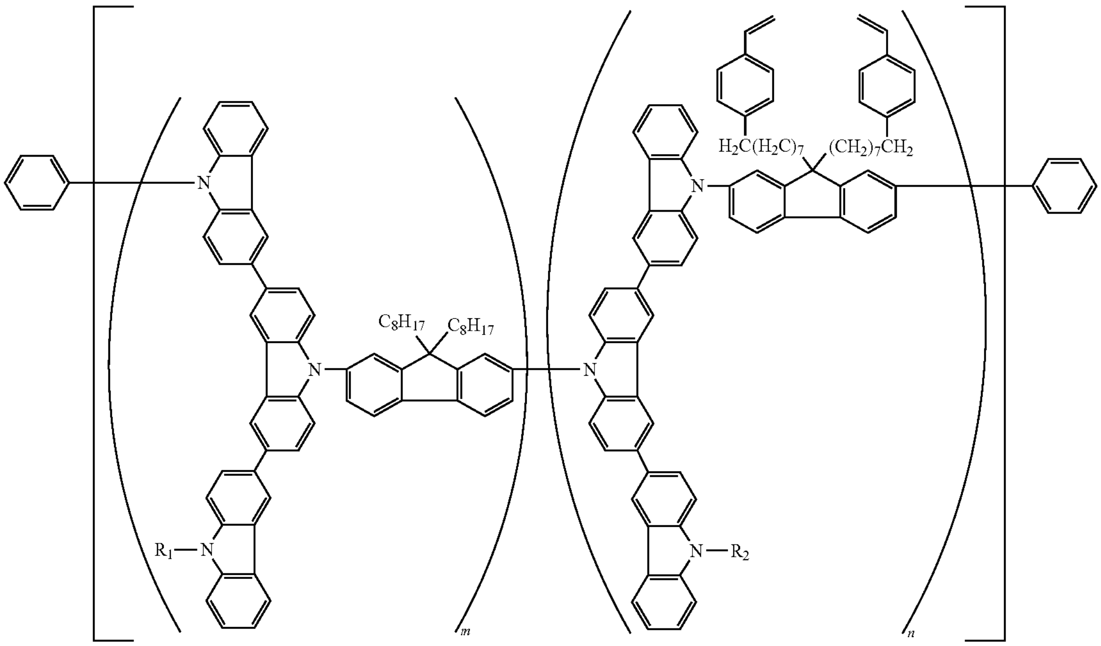
| Com. | R1 = R2 |
|---|---|
| 84-1 | H-1 |
| 84-2 | H-2 |
| 84-3 | H-3 |
| 84-4 | H-4 |
| 84-5 | H-5 |
| 84-6 | H-6 |
| 84-7 | H-7 |
| 84-8 | H-8 |
| 84-9 | H-9 |
| 84-10 | H-10 |
| 84-11 | H-11 |
| 84-12 | H-12 |
| 84-13 | H-13 |
| 84-14 | H-14 |
| 84-15 | H-15 |
| 84-16 | H-16 |
| 84-17 | H-17 |
| 84-18 | H-18 |

TABLE 85
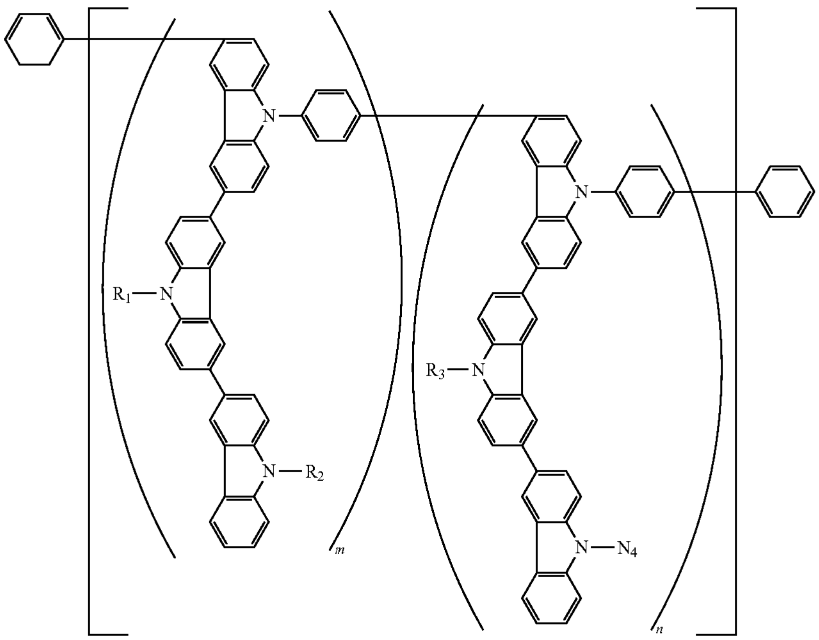
| Com. | R1 = R3 | R2 | R4 |
|---|---|---|---|
| 85-1 | H-1 | H-1 | H-29 |
| 85-2 | H-2 | | |
| 85-3 | H-3 | | |
| 85-4 | H-4 | | |
| 85-5 | H-5 | | |
| 85-6 | H-6 | | |
| 85-7 | H-7 | | |
| 85-8 | H-8 | | |
| 85-9 | H-9 | | |
| 85-10 | H-10 | | |
| 85-11 | H-11 | | |
| 85-12 | H-12 | | |
| 85-13 | H-13 | | |
| 85-14 | H-14 | | |
| 85-15 | H-15 | | |
| 85-16 | H-16 | | |
| 85-17 | H-17 | | |
| 85-18 | H-18 | | |
| 85-19 | H-1 | H-1 | H-30 |
| 85-20 | H-2 | | |
| 85-21 | H-3 | | |
| 85-22 | H-4 | | |
| 85-23 | H-5 | | |
| 85-24 | H-6 | | |
| 85-25 | H-7 | | |
| 85-26 | H-8 | | |
| 85-27 | H-9 | | |
| 85-28 | H-10 | | |
| 85-29 | H-11 | | |
| 85-30 | H-12 | | |
| 85-31 | H-13 | | |
| 85-32 | H-14 | | |
| 85-33 | H-15 | | |
| 85-34 | H-16 | | |
| 85-35 | H-17 | | |
| 85-36 | H-18 | | |

TABLE 86
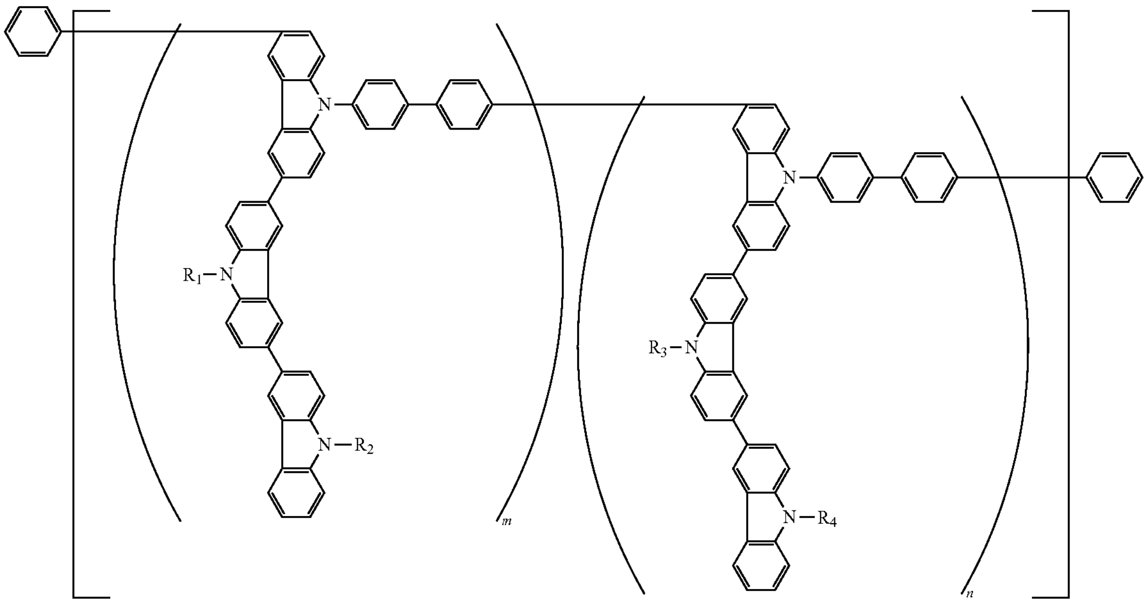
| Com. | R1 = R3 | R2 | R4 |
|---|---|---|---|
| 86-1 | H-1 | H-1 | H-29 |
| 86-2 | H-2 | | |
| 86-3 | H-3 | | |
| 86-4 | H-4 | | |
| 86-5 | H-5 | | |
| 86-6 | H-6 | | |
| 86-7 | H-7 | | |
| 86-8 | H-8 | | |
| 86-9 | H-9 | | |
| 86-10 | H-10 | | |
| 86-11 | H-11 | | |
| 86-12 | H-12 | | |
| 86-13 | H-13 | | |
| 86-14 | H-14 | | |
| 86-15 | H-15 | | |
| 86-16 | H-16 | | |
| 86-17 | H-17 | | |
| 86-18 | H-18 | | |
| 86-19 | H-1 | H-1 | H-30 |
| 86-20 | H-2 | | |
| 86-21 | H-3 | | |
| 86-22 | H-4 | | |
| 86-23 | H-5 | | |
| 86-24 | H-6 | | |
| 86-25 | H-7 | | |
| 86-26 | H-8 | | |
| 86-27 | H-9 | | |
| 86-28 | H-10 | | |
| 86-29 | H-11 | | |
| 86-30 | H-12 | | |
| 86-31 | H-13 | | |
| 86-32 | H-14 | | |
| 86-33 | H-15 | | |
| 86-34 | H-16 | | |
| 86-35 | H-17 | | |
| 86-36 | H-18 | | |

TABLE 87
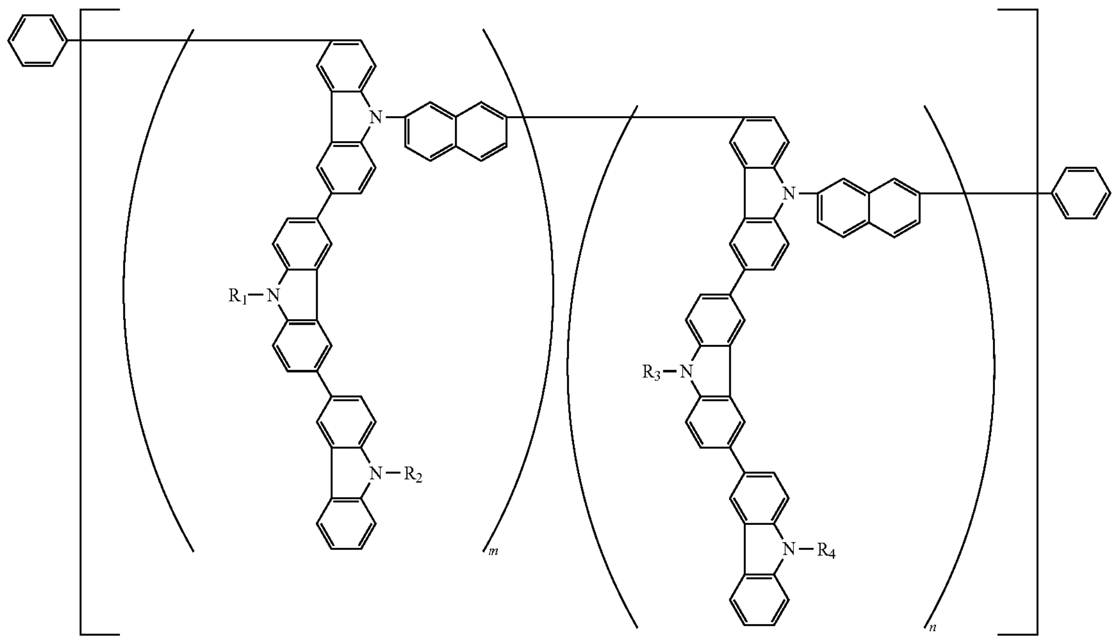
| Com. | R1 = R3 | R2 | R4 |
|---|---|---|---|
| 87-1 | H-1 | H-1 | H-29 |
| 87-2 | H-2 | | |
| 87-3 | H-3 | | |
| 87-4 | H-4 | | |
| 87-5 | H-5 | | |
| 87-6 | H-6 | | |
| 87-7 | H-7 | | |
| 87-8 | H-8 | | |
| 87-9 | H-9 | | |
| 87-10 | H-10 | | |
| 87-11 | H-11 | | |
| 87-12 | H-12 | | |
| 87-13 | H-13 | | |
| 87-14 | H-14 | | |
| 87-15 | H-15 | | |
| 87-16 | H-16 | | |
| 87-17 | H-17 | | |
| 87-18 | H-18 | | |
| 87-19 | H-1 | H-1 | H-30 |
| 87-20 | H-2 | | |
| 87-21 | H-3 | | |
| 87-22 | H-4 | | |
| 87-23 | H-5 | | |
| 87-24 | H-6 | | |
| 87-25 | H-7 | | |
| 87-26 | H-8 | | |
| 87-27 | H-9 | | |
| 87-28 | H-10 | | |
| 87-29 | H-11 | | |
| 87-30 | H-12 | | |
| 87-31 | H-13 | | |
| 87-32 | H-14 | | |
| 87-33 | H-15 | | |
| 87-34 | H-16 | | |
| 87-35 | H-17 | | |
| 87-36 | H-18 | | |

TABLE 88
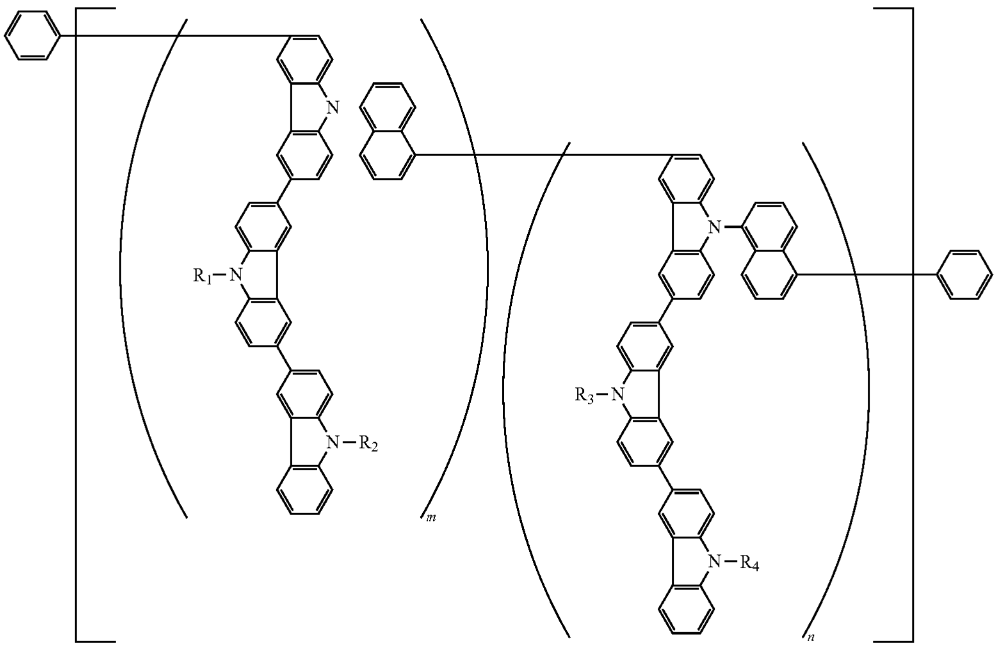
| Com. | R1 = R3 | R2 | R4 |
|---|---|---|---|
| 88-1 | H-1 | H-1 | H-29 |
| 88-2 | H-2 | | |
| 88-3 | H-3 | | |
| 88-4 | H-4 | | |
| 88-5 | H-5 | | |
| 88-6 | H-6 | | |
| 88-7 | H-7 | | |
| 88-8 | H-8 | | |
| 88-9 | H-9 | | |
| 88-10 | H-10 | | |
| 88-11 | H-11 | | |
| 88-12 | H-12 | | |
| 88-13 | H-13 | | |
| 88-14 | H-14 | | |
| 88-15 | H-15 | | |
| 88-16 | H-16 | | |
| 88-17 | H-17 | | |
| 88-18 | H-18 | | |
| 88-19 | H-1 | H-1 | H-30 |
| 88-20 | H-2 | | |
| 88-21 | H-3 | | |
| 88-22 | H-4 | | |
| 88-23 | H-5 | | |
| 88-24 | H-6 | | |
| 88-25 | H-7 | | |
| 88-26 | H-8 | | |
| 88-27 | H-9 | | |
| 88-28 | H-10 | | |
| 88-29 | H-11 | | |
| 88-30 | H-12 | | |
| 88-31 | H-13 | | |
| 88-32 | H-14 | | |
| 88-33 | H-15 | | |
| 88-34 | H-16 | | |
| 88-35 | H-17 | | |
| 88-36 | H-18 | | |

TABLE 89
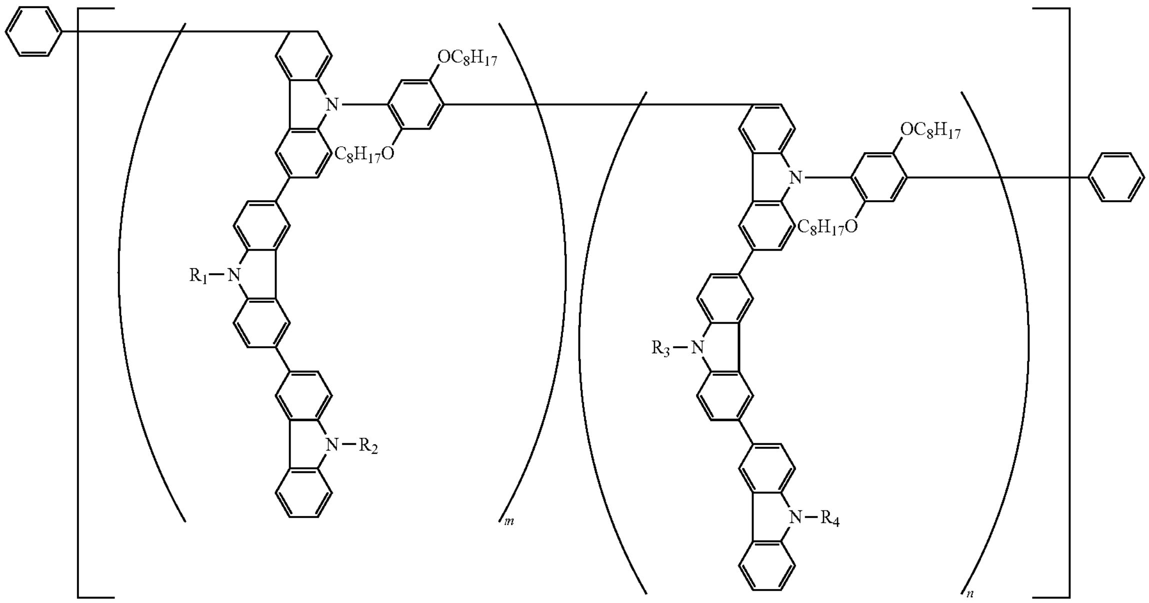
| Com. | R1 = R3 | R2 | R4 |
|---|---|---|---|
| 89-1 | H-1 | H-1 | H-29 |
| 89-2 | H-2 | | |
| 89-3 | H-3 | | |
| 89-4 | H-4 | | |
| 89-5 | H-5 | | |
| 89-6 | H-6 | | |
| 89-7 | H-7 | | |
| 89-8 | H-8 | | |
| 89-9 | H-9 | | |
| 89-10 | H-10 | | |
| 89-11 | H-11 | | |
| 89-12 | H-12 | | |
| 89-13 | H-13 | | |
| 89-14 | H-14 | | |
| 89-15 | H-15 | | |
| 89-16 | H-16 | | |
| 89-17 | H-17 | | |
| 89-18 | H-18 | | |
| 89-19 | H-1 | H-1 | H-30 |
| 89-20 | H-2 | | |
| 89-21 | H-3 | | |
| 89-22 | H-4 | | |
| 89-23 | H-5 | | |
| 89-24 | H-6 | | |
| 89-25 | H-7 | | |
| 89-26 | H-8 | | |
| 89-27 | H-9 | | |
| 89-28 | H-10 | | |
| 89-29 | H-11 | | |
| 89-30 | H-12 | | |
| 89-31 | H-13 | | |
| 89-32 | H-14 | | |
| 89-33 | H-15 | | |
| 89-34 | H-16 | | |
| 89-35 | H-17 | | |
| 89-36 | H-18 | | |

TABLE 90
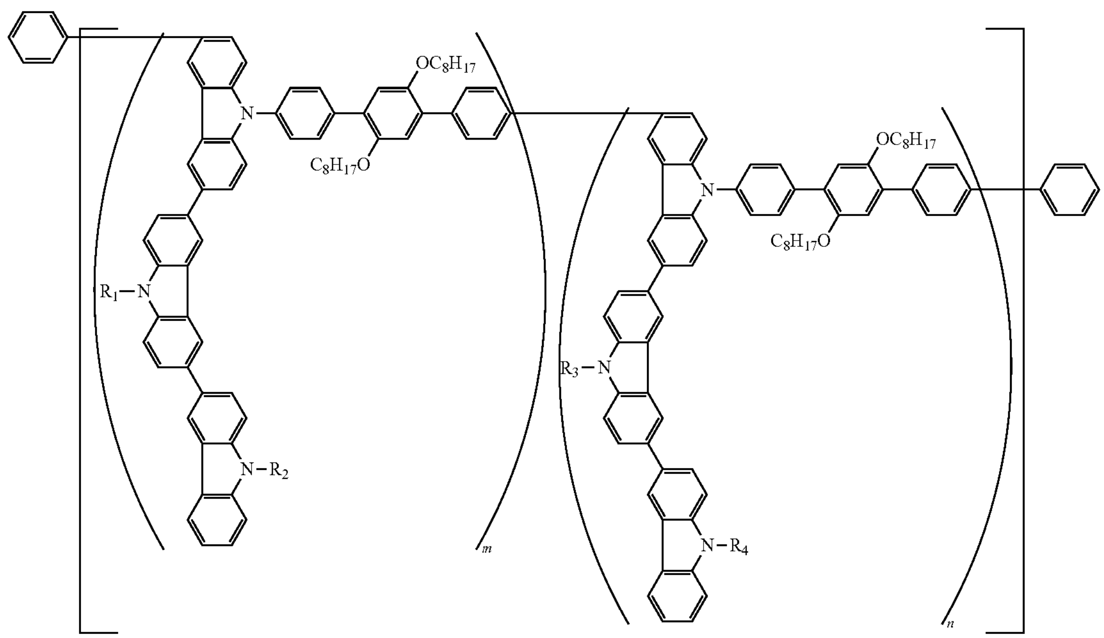
| Com. | R1 = R3 | R2 | R4 |
|---|---|---|---|
| 90-1 | H-1 | H-1 | H-29 |
| 90-2 | H-2 | | |
| 90-3 | H-3 | | |
| 90-4 | H-4 | | |
| 90-5 | H-5 | | |
| 90-6 | H-6 | | |
| 90-7 | H-7 | | |
| 90-8 | H-8 | | |
| 90-9 | H-9 | | |
| 90-10 | H-10 | | |
| 90-11 | H-11 | | |
| 90-12 | H-12 | | |
| 90-13 | H-13 | | |
| 90-14 | H-14 | | |
| 90-15 | H-15 | | |
| 90-16 | H-16 | | |
| 90-17 | H-17 | | |
| 90-18 | H-18 | | |
| 90-19 | H-1 | H-1 | H-30 |
| 90-20 | H-2 | | |
| 90-21 | H-3 | | |
| 90-22 | H-4 | | |
| 90-23 | H-5 | | |
| 90-24 | H-6 | | |
| 90-25 | H-7 | | |
| 90-26 | H-8 | | |
| 90-27 | H-9 | | |
| 90-28 | H-10 | | |
| 90-29 | H-11 | | |
| 90-30 | H-12 | | |
| 90-31 | H-13 | | |
| 90-32 | H-14 | | |
| 90-33 | H-15 | | |
| 90-34 | H-16 | | |
| 90-35 | H-17 | | |
| 90-36 | H-18 | | |

TABLE 91
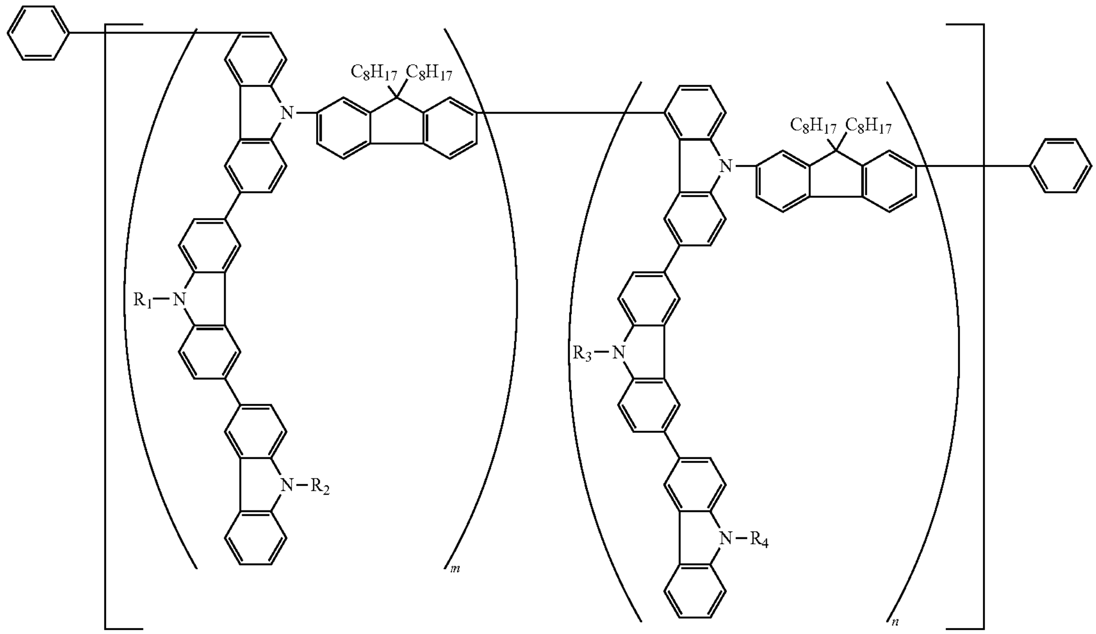
| Com. | R1 = R3 | R2 | R4 |
|---|---|---|---|
| 91-1 | H-1 | H-1 | H-29 |
| 91-2 | H-2 | | |
| 91-3 | H-3 | | |
| 91-4 | H-4 | | |
| 91-5 | H-5 | | |
| 91-6 | H-6 | | |
| 91-7 | H-7 | | |
| 91-8 | H-8 | | |
| 91-9 | H-9 | | |
| 91-10 | H-10 | | |
| 91-11 | H-11 | | |
| 91-12 | H-12 | | |
| 91-13 | H-13 | | |
| 91-14 | H-14 | | |
| 91-15 | H-15 | | |
| 91-16 | H-16 | | |
| 91-17 | H-17 | | |
| 91-18 | H-18 | | |
| 91-19 | H-1 | H-1 | H-30 |
| 91-20 | H-2 | | |
| 91-21 | H-3 | | |
| 91-22 | H-4 | | |
| 91-23 | H-5 | | |
| 91-24 | H-6 | | |
| 91-25 | H-7 | | |
| 91-26 | H-8 | | |
| 91-27 | H-9 | | |
| 91-28 | H-10 | | |
| 91-29 | H-11 | | |
| 91-30 | H-12 | | |
| 91-31 | H-13 | | |
| 91-32 | H-14 | | |
| 91-33 | H-15 | | |
| 91-34 | H-16 | | |
| 91-35 | H-17 | | |
| 91-36 | H-18 | | |

TABLE 92
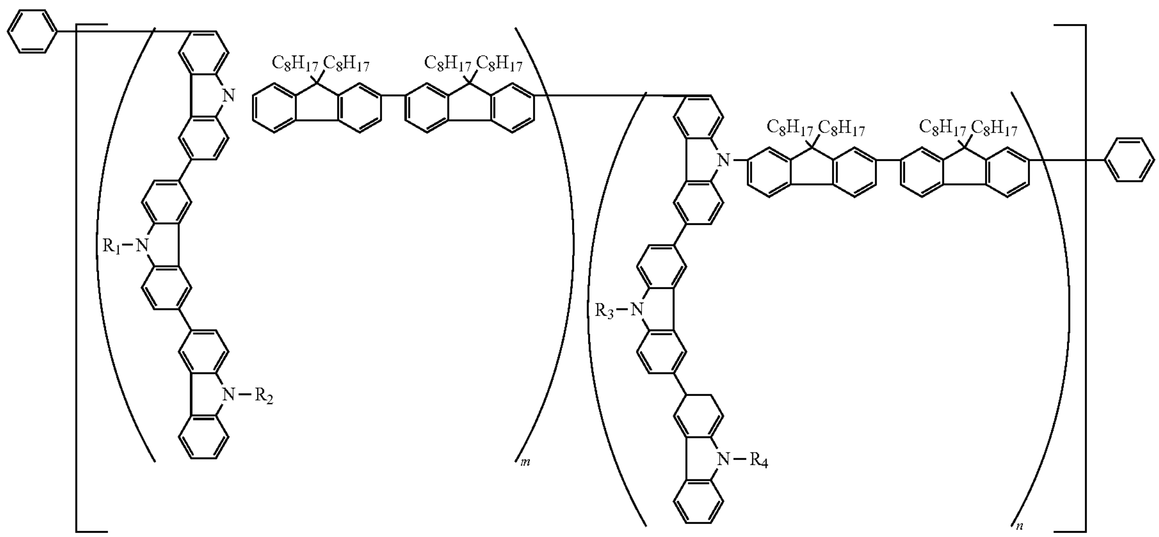
| Com. | R1 = R3 | R2 | R4 |
|---|---|---|---|
| 92-1 | H-1 | H-1 | H-29 |
| 92-2 | H-2 | | |
| 92-3 | H-3 | | |
| 92-4 | H-4 | | |
| 92-5 | H-5 | | |
| 92-6 | H-6 | | |
| 92-7 | H-7 | | |
| 92-8 | H-8 | | |
| 92-9 | H-9 | | |
| 92-10 | H-10 | | |
| 92-11 | H-11 | | |
| 92-12 | H-12 | | |
| 92-13 | H-13 | | |
| 92-14 | H-14 | | |
| 92-15 | H-15 | | |
| 92-16 | H-16 | | |
| 92-17 | H-17 | | |
| 92-18 | H-18 | | |
| 92-19 | H-1 | H-1 | H-30 |
| 92-20 | H-2 | | |
| 92-21 | H-3 | | |
| 92-22 | H-4 | | |
| 92-23 | H-5 | | |
| 92-24 | H-6 | | |
| 92-25 | H-7 | | |
| 92-26 | H-8 | | |
| 92-27 | H-9 | | |
| 92-28 | H-10 | | |
| 92-29 | H-11 | | |
| 92-30 | H-12 | | |
| 92-31 | H-13 | | |
| 92-32 | H-14 | | |
| 92-33 | H-15 | | |
| 92-34 | H-16 | | |
| 92-35 | H-17 | | |
| 92-36 | H-18 | | |

TABLE 93
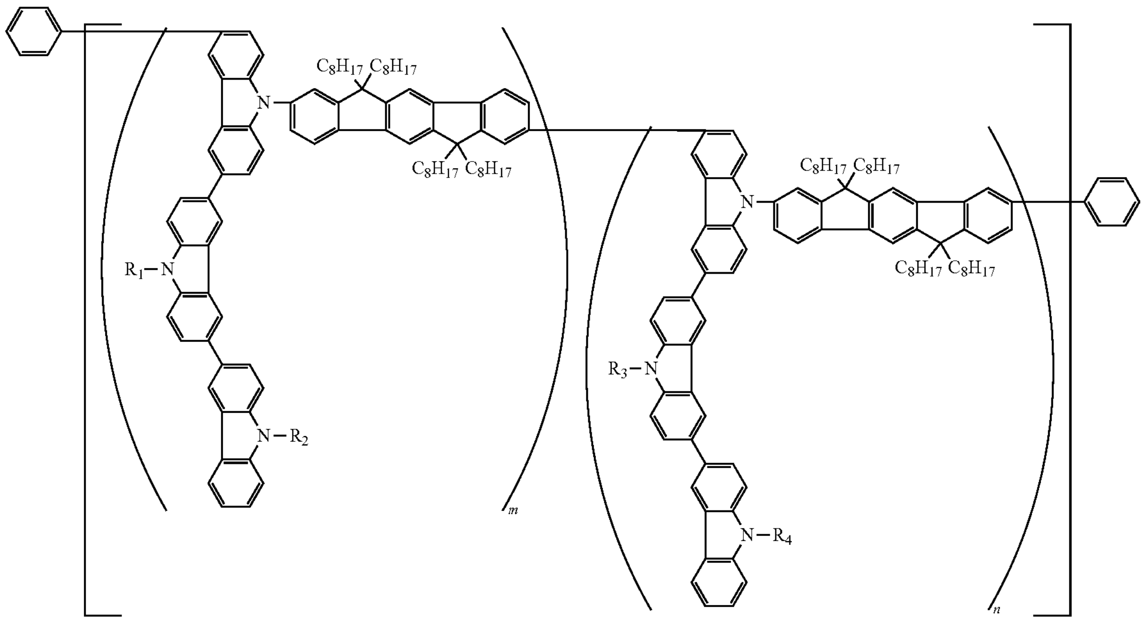
| Com. | R1 = R3 | R2 | R4 |
|---|---|---|---|
| 93-1 | H-1 | H-1 | H-29 |
| 93-2 | H-2 | | |
| 93-3 | H-3 | | |
| 93-4 | H-4 | | |
| 93-5 | H-5 | | |
| 93-6 | H-6 | | |
| 93-7 | H-7 | | |
| 93-8 | H-8 | | |
| 93-9 | H-9 | | |
| 93-10 | H-10 | | |
| 93-11 | H-11 | | |
| 93-12 | H-12 | | |
| 93-13 | H-13 | | |
| 93-14 | H-14 | | |
| 93-15 | H-15 | | |
| 93-16 | H-16 | | |
| 93-17 | H-17 | | |
| 93-18 | H-18 | | |
| 93-19 | H-1 | H-1 | H-30 |
| 93-20 | H-2 | | |
| 93-21 | H-3 | | |
| 93-22 | H-4 | | |
| 93-23 | H-5 | | |
| 93-24 | H-6 | | |
| 93-25 | H-7 | | |
| 93-26 | H-8 | | |
| 93-27 | H-9 | | |
| 93-28 | H-10 | | |
| 93-29 | H-11 | | |
| 93-30 | H-12 | | |
| 93-31 | H-13 | | |
| 93-32 | H-14 | | |
| 93-33 | H-15 | | |
| 93-34 | H-16 | | |
| 93-35 | H-17 | | |
| 93-36 | H-18 | | |

TABLE 94
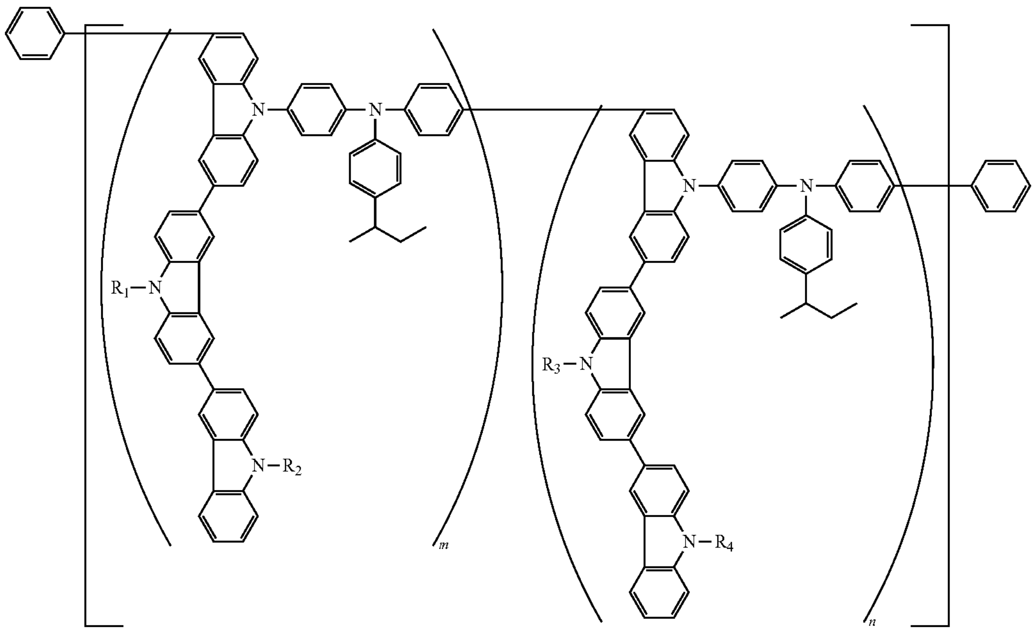
| Com. | R1 = R3 | R2 | R4 |
|---|---|---|---|
| 94-1 | H-1 | H-1 | H-29 |
| 94-2 | H-2 | | |
| 94-3 | H-3 | | |
| 94-4 | H-4 | | |
| 94-5 | H-5 | | |
| 94-6 | H-6 | | |
| 94-7 | H-7 | | |
| 94-8 | H-8 | | |
| 94-9 | H-9 | | |
| 94-10 | H-10 | | |
| 94-11 | H-11 | | |
| 94-12 | H-12 | | |
| 94-13 | H-13 | | |
| 94-14 | H-14 | | |
| 94-15 | H-15 | | |
| 94-16 | H-16 | | |
| 94-17 | H-17 | | |
| 94-18 | H-18 | | |
| 94-19 | H-1 | H-1 | H-30 |
| 94-20 | H-2 | | |
| 94-21 | H-3 | | |
| 94-22 | H-4 | | |
| 94-23 | H-5 | | |
| 94-24 | H-6 | | |
| 94-25 | H-7 | | |
| 94-26 | H-8 | | |
| 94-27 | H-9 | | |
| 94-28 | H-10 | | |
| 94-29 | H-11 | | |
| 94-30 | H-12 | | |
| 94-31 | H-13 | | |
| 94-32 | H-14 | | |
| 94-33 | H-15 | | |
| 94-34 | H-16 | | |
| 94-35 | H-17 | | |
| 94-36 | H-18 | | |

TABLE 95
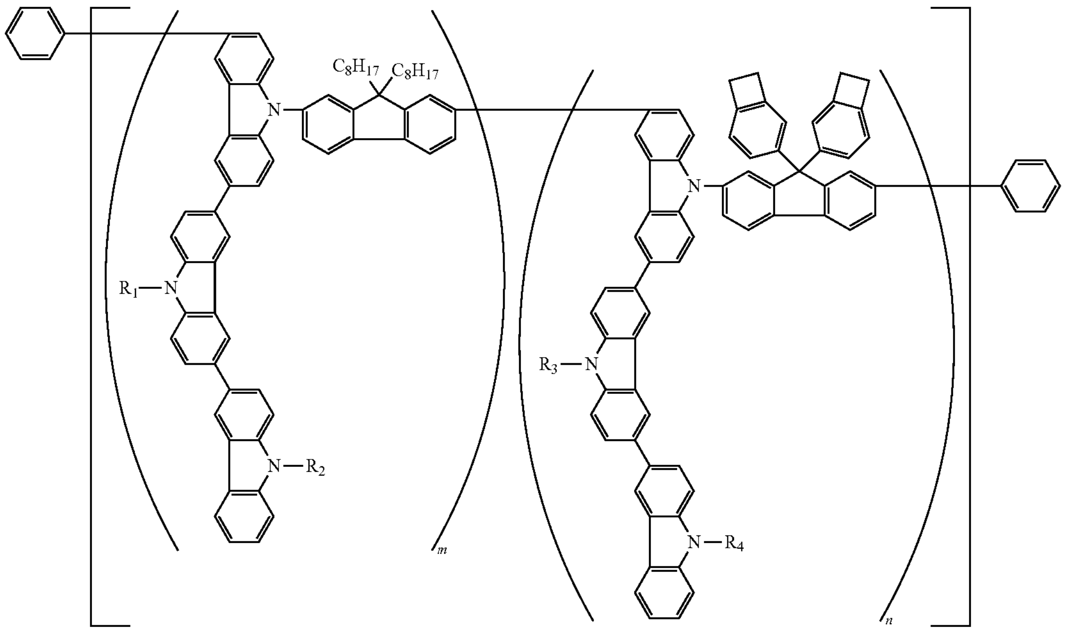
| Com. | R1 = R2 = R3 = R4 |
|---|---|
| 95-1 | H-1 |
| 95-2 | H-2 |
| 95-3 | H-3 |
| 95-4 | H-4 |
| 95-5 | H-5 |
| 95-6 | H-6 |
| 95-7 | H-7 |
| 95-8 | H-8 |
| 95-9 | H-9 |
| 95-10 | H-10 |
| 95-11 | H-11 |
| 95-12 | H-12 |
| 95-13 | H-13 |
| 95-14 | H-14 |
| 95-15 | H-15 |
| 95-16 | H-16 |
| 95-17 | H-17 |
| 95-18 | H-18 |

TABLE 96
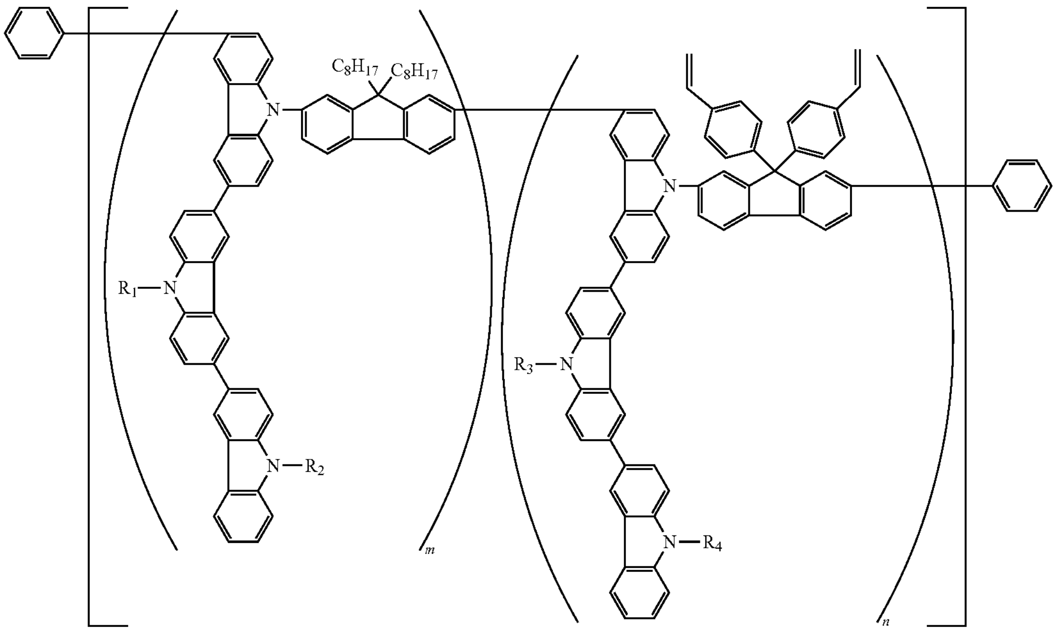
| Com. | R1 = R2 = R3 = R4 |
|---|---|
| 96-1 | H-1 |
| 96-2 | H-2 |
| 96-3 | H-3 |
| 96-4 | H-4 |
| 96-5 | H-5 |
| 96-6 | H-6 |
| 96-7 | H-7 |
| 96-8 | H-8 |
| 96-9 | H-9 |
| 96-10 | H-10 |
| 96-11 | H-11 |
| 96-12 | H-12 |
| 96-13 | H-13 |
| 96-14 | H-14 |
| 96-15 | H-15 |
| 96-16 | H-16 |
| 96-17 | H-17 |
| 96-18 | H-18 |

TABLE 97
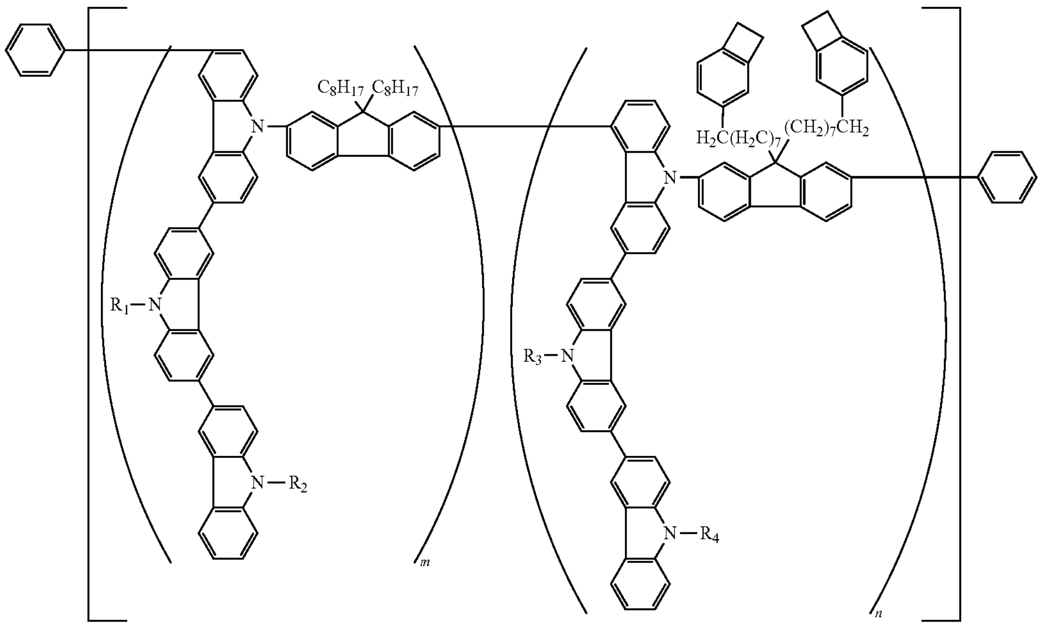
| Com. | R1 = R2 = R3 = R4 |
|---|---|
| 97-1 | H-1 |
| 97-2 | H-2 |
| 97-3 | H-3 |
| 97-4 | H-4 |
| 97-5 | H-5 |
| 97-6 | H-6 |
| 97-7 | H-7 |
| 97-8 | H-8 |
| 97-9 | H-9 |
| 97-10 | H-10 |
| 97-11 | H-11 |
| 97-12 | H-12 |
| 97-13 | H-13 |
| 97-14 | H-14 |
| 97-15 | H-15 |
| 97-16 | H-16 |
| 97-17 | H-17 |
| 97-18 | H-18 |

TABLE 98
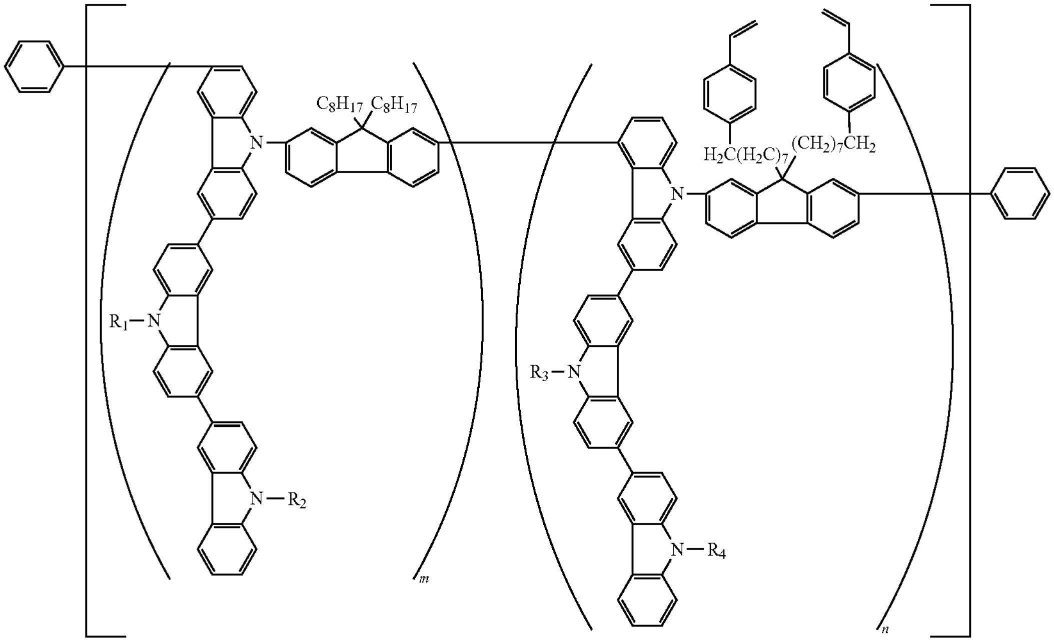
| Com. | R1 = R2 = R3 = R4 |
|---|---|
| 98-1 | H-1 |
| 98-2 | H-2 |
| 98-3 | H-3 |
| 98-4 | H-4 |
| 98-5 | H-5 |
| 98-6 | H-6 |
| 98-7 | H-7 |
| 98-8 | H-8 |
| 98-9 | H-9 |
| 98-10 | H-10 |
| 98-11 | H-11 |
| 98-12 | H-12 |
| 98-13 | H-13 |
| 98-14 | H-14 |
| 98-15 | H-15 |
| 98-16 | H-16 |
| 98-17 | H-17 |
| 98-18 | H-18 |
TABLE 99
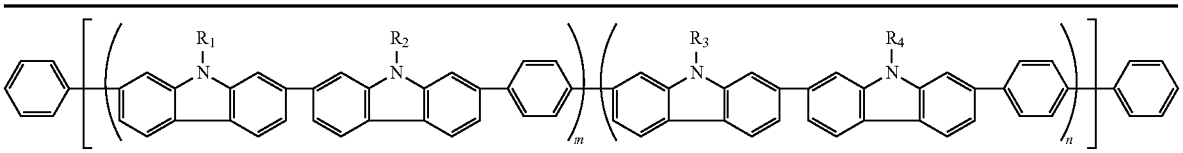
| Com. | R1 = R2 = R3 | R4 |
|---|---|---|
| 99-1 | H-1 | H-29 |
| 99-2 | H-2 | |
| 99-3 | H-3 | |
| 99-4 | H-4 | |
| 99-5 | H-5 | |
| 99-6 | H-6 | |
| 99-7 | H-7 | |
| 99-8 | H-8 | |
| 99-9 | H-9 | |
| 99-10 | H-10 | |
| 99-11 | H-11 | |
| 99-12 | H-12 | |
| 99-13 | H-13 | |
| 99-14 | H-14 | |

TABLE 99-continued
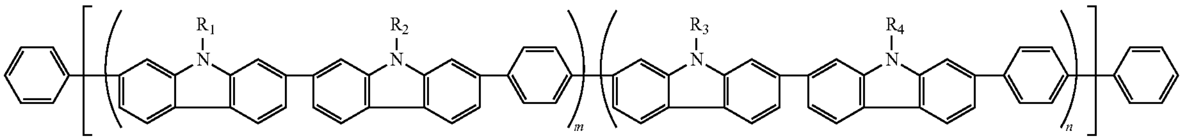
| | | | |
|---|---|---|---|
| 99-15 | H-15 | | |
| 99-16 | H-16 | | |
| 99-17 | H-17 | | |
| 99-18 | H-18 | | |
| 99-19 | H-1 | H-30 | |
| 99-20 | H-2 | | |
| 99-21 | H-3 | | |
| 99-22 | H-4 | | |
| 99-23 | H-5 | | |
| 99-24 | H-6 | | |
| 99-25 | H-7 | | |
| 99-26 | H-8 | | |
| 99-27 | H-9 | | |
| 99-28 | H-10 | | |
| 99-29 | H-11 | | |
| 99-30 | H-12 | | |
| 99-31 | H-13 | | |
| 99-32 | H-14 | | |
| 99-33 | H-15 | | |
| 99-34 | H-16 | | |
| 99-35 | H-17 | | |
| 99-36 | H-18 | | |
| Com. | R1 = R3 | R2 | R4 |
|---|---|---|---|
| 99-37 | H-1 | H-1 | H-29 |
| 99-38 | H-2 | | |
| 99-39 | H-3 | | |
| 99-40 | H-4 | | |
| 99-41 | H-5 | | |
| 99-42 | H-6 | | |
| 99-43 | H-7 | | |
| 99-44 | H-8 | | |
| 99-45 | H-9 | | |
| 99-46 | H-10 | | |
| 99-47 | H-11 | | |
| 99-48 | H-12 | | |
| 99-49 | H-13 | | |
| 99-50 | H-14 | | |
| 99-51 | H-15 | | |
| 99-52 | H-16 | | |
| 99-53 | H-17 | | |
| 99-54 | H-18 | | |
| 99-55 | H-1 | H-1 | H-30 |
| 99-56 | H-2 | | |
| 99-57 | H-3 | | |
| 99-58 | H-4 | | |
| 99-59 | H-5 | | |
| 99-60 | H-6 | | |
| 99-61 | H-7 | | |
| 99-62 | H-8 | | |
| 99-63 | H-9 | | |
| 99-64 | H-10 | | |
| 99-65 | H-11 | | |
| 99-66 | H-12 | | |
| 99-67 | H-13 | | |
| 99-68 | H-14 | | |
| 99-69 | H-15 | | |
| 99-70 | H-16 | | |
| 99-71 | H-17 | | |
| 99-72 | H-18 | | |

TABLE 100
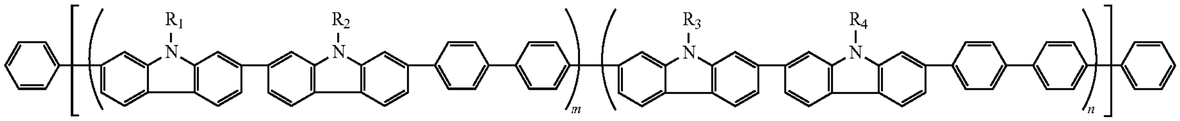
| Com. | R1 = R2 = R3 | R4 |
|---|---|---|
| 100-1 | H-1 | H-29 |
| 100-2 | H-2 | |
| 100-3 | H-3 | |
| 100-4 | H-4 | |
| 100-5 | H-5 | |
| 100-6 | H-6 | |
| 100-7 | H-7 | |
| 100-8 | H-8 | |
| 100-9 | H-9 | |
| 100-10 | H-10 | |
| 100-11 | H-11 | |
| 100-12 | H-12 | |
| 100-13 | H-13 | |
| 100-14 | H-14 | |
| 100-15 | H-15 | |
| 100-16 | H-16 | |
| 100-17 | H-17 | |
| 100-18 | H-18 | |
| 100-19 | H-1 | H-30 |
| 100-20 | H-2 | |
| 100-21 | H-3 | |
| 100-22 | H-4 | |
| 100-23 | H-5 | |
| 100-24 | H-6 | |
| 100-25 | H-7 | |
| 100-26 | H-8 | |
| 100-27 | H-9 | |
| 100-28 | H-10 | |
| 100-29 | H-11 | |
| 100-30 | H-12 | |
| 100-31 | H-13 | |
| 100-32 | H-14 | |
| 100-33 | H-15 | |
| 100-34 | H-16 | |
| 100-35 | H-17 | |
| 100-36 | H-18 | |
| Com. | R1 = R3 | R2 | R4 |
|---|---|---|---|
| 100-37 | H-1 | H-1 | H-29 |
| 100-38 | H-2 | | |
| 100-39 | H-3 | | |
| 100-40 | H-4 | | |
| 100-41 | H-5 | | |
| 100-42 | H-6 | | |
| 100-43 | H-7 | | |
| 100-44 | H-8 | | |
| 100-45 | H-9 | | |
| 100-46 | H-10 | | |
| 100-47 | H-11 | | |
| 100-48 | H-12 | | |
| 100-49 | H-13 | | |
| 100-50 | H-14 | | |
| 100-51 | H-15 | | |
| 100-52 | H-16 | | |
| 100-53 | H-17 | | |
| 100-54 | H-18 | | |
| 100-55 | H-1 | H-1 | H-30 |
| 100-56 | H-2 | | |
| 100-57 | H-3 | | |
| 100-58 | H-4 | | |
| 100-59 | H-5 | | |
| 100-60 | H-6 | | |
| 100-61 | H-7 | | |
| 100-62 | H-8 | | |
| 100-63 | H-9 | | |
| 100-64 | H-10 | | |
| 100-65 | H-11 | | |
| 100-66 | H-12 | | |
| 100-67 | H-13 | | |
| 100-68 | H-14 | | |

TABLE 100-continued
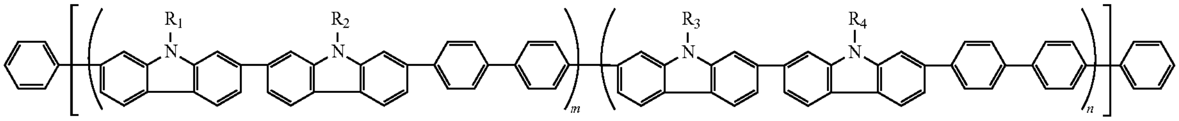
| | |
|---|---|
| 100-69 | H-15 |
| 100-70 | H-16 |
| 100-71 | H-17 |
| 100-72 | H-18 |
TABLE 101
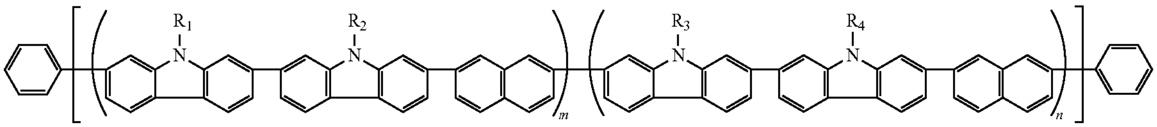
| Com. | R1 = R2 = R3 | R4 |
|---|---|---|
| 101-1 | H-1 | H-29 |
| 101-2 | H-2 | |
| 101-3 | H-3 | |
| 101-4 | H-4 | |
| 101-5 | H-5 | |
| 101-6 | H-6 | |
| 101-7 | H-7 | |
| 101-8 | H-8 | |
| 101-9 | H-9 | |
| 101-10 | H-10 | |
| 101-11 | H-11 | |
| 101-12 | H-12 | |
| 101-13 | H-13 | |
| 101-14 | H-14 | |
| 101-15 | H-15 | |
| 101-16 | H-16 | |
| 101-17 | H-17 | |
| 101-18 | H-18 | |
| 101-19 | H-1 | H-30 |
| 101-20 | H-2 | |
| 101-21 | H-3 | |
| 101-22 | H-4 | |
| 101-23 | H-5 | |
| 101-24 | H-6 | |
| 101-25 | H-7 | |
| 101-26 | H-8 | |
| 101-27 | H-9 | |
| 101-28 | H-10 | |
| 101-29 | H-11 | |
| 101-30 | H-12 | |
| 101-31 | H-13 | |
| 101-32 | H-14 | |
| 101-33 | H-15 | |
| 101-34 | H-16 | |
| 101-35 | H-17 | |
| 101-36 | H-18 | |
| Com. | R1 = R3 | R2 | R4 |
|---|---|---|---|
| 101-37 | H-1 | H-1 | H-29 |
| 101-38 | H-2 | | |
| 101-39 | H-3 | | |
| 101-40 | H-4 | | |
| 101-41 | H-5 | | |
| 101-42 | H-6 | | |
| 101-43 | H-7 | | |
| 101-44 | H-8 | | |
| 101-45 | H-9 | | |
| 101-46 | H-10 | | |
| 101-47 | H-11 | | |
| 101-48 | H-12 | | |
| 101-49 | H-13 | | |
| 101-50 | H-14 | | |
| 101-51 | H-15 | | |
| 101-52 | H-16 | | |

TABLE 101-continued
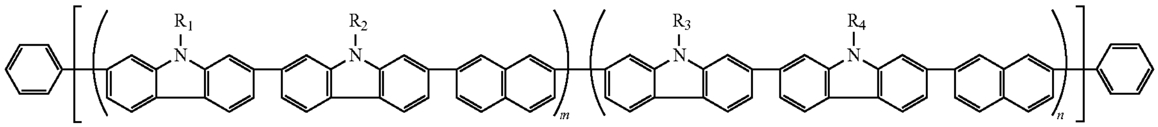
| | | | |
|---|---|---|---|
| 101-53 | H-17 | | |
| 101-54 | H-18 | | |
| 101-55 | H-1 | H-1 | H-30 |
| 101-56 | H-2 | | |
| 101-57 | H-3 | | |
| 101-58 | H-4 | | |
| 101-59 | H-5 | | |
| 101-60 | H-6 | | |
| 101-61 | H-7 | | |
| 101-62 | H-8 | | |
| 101-63 | H-9 | | |
| 101-64 | H-10 | | |
| 101-65 | H-11 | | |
| 101-66 | H-12 | | |
| 101-67 | H-13 | | |
| 101-68 | H-14 | | |
| 101-69 | H-15 | | |
| 101-70 | H-16 | | |
| 101-71 | H-17 | | |
| 101-72 | H-18 | | |
TABLE 102
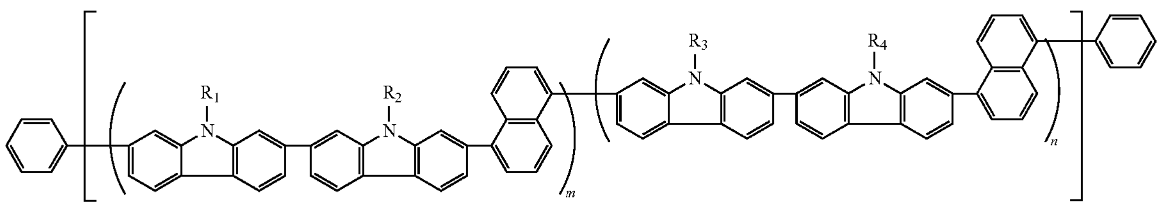
| Com. | R1 = R2 = R3 | R4 |
|---|---|---|
| 102-1 | H-1 | H-29 |
| 102-2 | H-2 | |
| 102-3 | H-3 | |
| 102-4 | H-4 | |
| 102-5 | H-5 | |
| 102-6 | H-6 | |
| 102-7 | H-7 | |
| 102-8 | H-8 | |
| 102-9 | H-9 | |
| 102-10 | H-10 | |
| 102-11 | H-11 | |
| 102-12 | H-12 | |
| 102-13 | H-13 | |
| 102-14 | H-14 | |
| 102-15 | H-15 | |
| 102-16 | H-16 | |
| 102-17 | H-17 | |
| 102-18 | H-18 | |
| 102-19 | H-1 | H-30 |
| 102-20 | H-2 | |
| 102-21 | H-3 | |
| 102-22 | H-4 | |
| 102-23 | H-5 | |
| 102-24 | H-6 | |
| 102-25 | H-7 | |
| 102-26 | H-8 | |
| 102-27 | H-9 | |
| 102-28 | H-10 | |
| 102-29 | H-11 | |
| 102-30 | H-12 | |
| 102-31 | H-13 | |
| 102-32 | H-14 | |

TABLE 102-continued
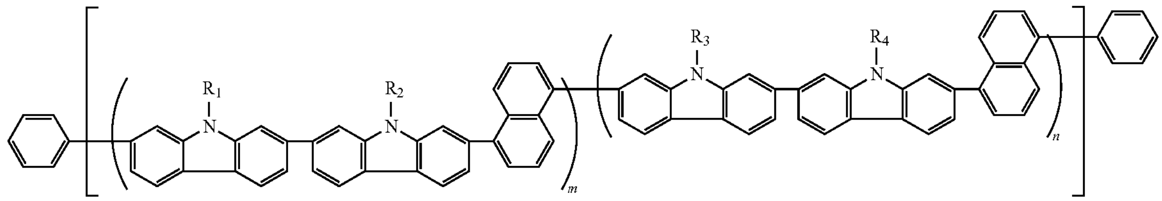
| | |
|---|---|
| 102-33 | H-15 |
| 102-34 | H-16 |
| 102-35 | H-17 |
| 102-36 | H-18 |
| Com. | R1 = R3 | R2 | R4 |
|---|---|---|---|
| 102-37 | H-1 | H-1 | H-29 |
| 102-38 | H-2 | | |
| 102-39 | H-3 | | |
| 102-40 | H-4 | | |
| 102-41 | H-5 | | |
| 102-42 | H-6 | | |
| 102-43 | H-7 | | |
| 102-44 | H-8 | | |
| 102-45 | H-9 | | |
| 102-46 | H-10 | | |
| 102-47 | H-11 | | |
| 102-48 | H-12 | | |
| 102-49 | H-13 | | |
| 102-50 | H-14 | | |
| 102-51 | H-15 | | |
| 102-52 | H-16 | | |
| 102-53 | H-17 | | |
| 102-54 | H-18 | | |
| 102-55 | H-1 | H-1 | H-30 |
| 102-56 | H-2 | | |
| 102-57 | H-3 | | |
| 102-58 | H-4 | | |
| 102-59 | H-5 | | |
| 102-60 | H-6 | | |
| 102-61 | H-7 | | |
| 102-62 | H-8 | | |
| 102-63 | H-9 | | |
| 102-64 | H-10 | | |
| 102-65 | H-11 | | |
| 102-66 | H-12 | | |
| 102-67 | H-13 | | |
| 102-68 | H-14 | | |
| 102-69 | H-15 | | |
| 102-70 | H-16 | | |
| 102-71 | H-17 | | |
| 102-72 | H-18 | | |
TABLE 103
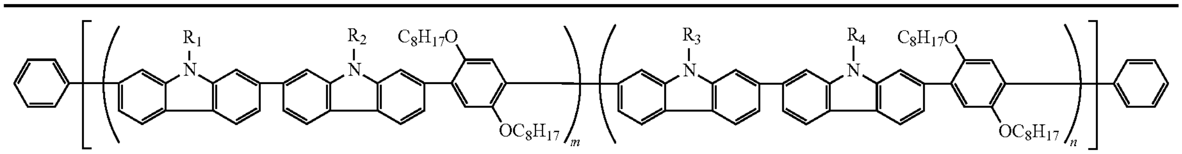
| Com. | R1 = R2 = R3 | R4 |
|---|---|---|
| 103-1 | H-1 | H-29 |
| 103-2 | H-2 | |
| 103-3 | H-3 | |
| 103-4 | H-4 | |
| 103-5 | H-5 | |
| 103-6 | H-6 | |
| 103-7 | H-7 | |
| 103-8 | H-8 | |
| 103-9 | H-9 | |
| 103-10 | H-10 | |
| 103-11 | H-11 | |
| 103-12 | H-12 | |

TABLE 103-continued
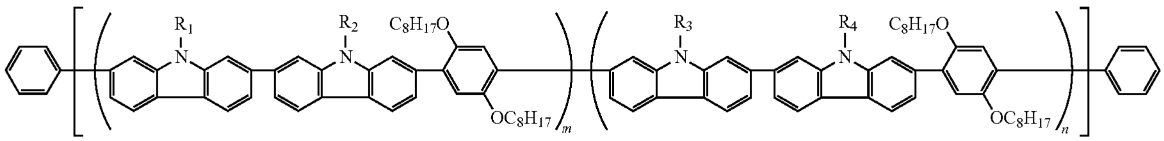
| | | | |
|---|---|---|---|
| 103-13 | H-13 | | |
| 103-14 | H-14 | | |
| 103-15 | H-15 | | |
| 103-16 | H-16 | | |
| 103-17 | H-17 | | |
| 103-18 | H-18 | | |
| 103-19 | H-1 | H-30 | |
| 103-20 | H-2 | | |
| 103-21 | H-3 | | |
| 103-22 | H-4 | | |
| 103-23 | H-5 | | |
| 103-24 | H-6 | | |
| 103-25 | H-7 | | |
| 103-26 | H-8 | | |
| 103-27 | H-9 | | |
| 103-28 | H-10 | | |
| 103-29 | H-11 | | |
| 103-30 | H-12 | | |
| 103-31 | H-13 | | |
| 103-32 | H-14 | | |
| 103-33 | H-15 | | |
| 103-34 | H-16 | | |
| 103-35 | H-17 | | |
| 103-36 | H-18 | | |
| Com. | R1 = R3 | R2 | R4 |
| 103-37 | H-1 | H-1 | H-29 |
| 103-38 | H-2 | | |
| 103-39 | H-3 | | |
| 103-40 | H-4 | | |
| 103-41 | H-5 | | |
| 103-42 | H-6 | | |
| 103-43 | H-7 | | |
| 103-44 | H-8 | | |
| 103-45 | H-9 | | |
| 103-46 | H-10 | | |
| 103-47 | H-11 | | |
| 103-48 | H-12 | | |
| 103-49 | H-13 | | |
| 103-50 | H-14 | | |
| 103-51 | H-15 | | |
| 103-52 | H-16 | | |
| 103-53 | H-17 | | |
| 103-54 | H-18 | | |
| 103-55 | H-1 | H-1 | H-30 |
| 103-56 | H-2 | | |
| 103-57 | H-3 | | |
| 103-58 | H-4 | | |
| 103-59 | H-5 | | |
| 103-60 | H-6 | | |
| 103-61 | H-7 | | |
| 103-62 | H-8 | | |
| 103-63 | H-9 | | |
| 103-64 | H-10 | | |
| 103-65 | H-11 | | |
| 103-66 | H-12 | | |
| 103-67 | H-13 | | |
| 103-68 | H-14 | | |
| 103-69 | H-15 | | |
| 103-70 | H-16 | | |
| 103-71 | H-17 | | |
| 103-72 | H-18 | | |

TABLE 104
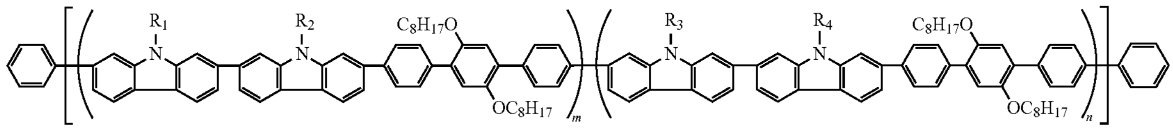
| Com. | R1 = R2 = R3 | R4 |
|---|---|---|
| 104-1 | H-1 | H-29 |
| 104-2 | H-2 | |
| 104-3 | H-3 | |
| 104-4 | H-4 | |
| 104-5 | H-5 | |
| 104-6 | H-6 | |
| 104-7 | H-7 | |
| 104-8 | H-8 | |
| 104-9 | H-9 | |
| 104-10 | H-10 | |
| 104-11 | H-11 | |
| 104-12 | H-12 | |
| 104-13 | H-13 | |
| 104-14 | H-14 | |
| 104-15 | H-15 | |
| 104-16 | H-16 | |
| 104-17 | H-17 | |
| 104-18 | H-18 | |
| 104-19 | H-1 | H-30 |
| 104-20 | H-2 | |
| 104-21 | H-3 | |
| 104-22 | H-4 | |
| 104-23 | H-5 | |
| 104-24 | H-6 | |
| 104-25 | H-7 | |
| 104-26 | H-8 | |
| 104-27 | H-9 | |
| 104-28 | H-10 | |
| 104-29 | H-11 | |
| 104-30 | H-12 | |
| 104-31 | H-13 | |
| 104-32 | H-14 | |
| 104-33 | H-15 | |
| 104-34 | H-16 | |
| 104-35 | H-17 | |
| 104-36 | H-18 | |
| Com. | R1 = R3 | R2 | R4 |
|---|---|---|---|
| 104-37 | H-1 | H-1 | H-29 |
| 104-38 | H-2 | | |
| 104-39 | H-3 | | |
| 104-40 | H-4 | | |
| 104-41 | H-5 | | |
| 104-42 | H-6 | | |
| 104-43 | H-7 | | |
| 104-44 | H-8 | | |
| 104-45 | H-9 | | |
| 104-46 | H-10 | | |
| 104-47 | H-11 | | |
| 104-48 | H-12 | | |
| 104-49 | H-13 | | |
| 104-50 | H-14 | | |
| 104-51 | H-15 | | |
| 104-52 | H-16 | | |
| 104-53 | H-17 | | |
| 104-54 | H-18 | | |
| 104-55 | H-1 | H-1 | H-30 |
| 104-56 | H-2 | | |
| 104-57 | H-3 | | |
| 104-58 | H-4 | | |
| 104-59 | H-5 | | |
| 104-60 | H-6 | | |
| 104-61 | H-7 | | |
| 104-62 | H-8 | | |
| 104-63 | H-9 | | |
| 104-64 | H-10 | | |
| 104-65 | H-11 | | |
| 104-66 | H-12 | | |
| 104-67 | H-13 | | |
| 104-68 | H-14 | | |

TABLE 104-continued
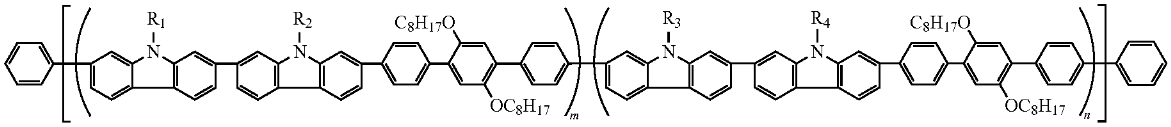
| | |
|---|---|
| 104-69 | H-15 |
| 104-70 | H-16 |
| 104-71 | H-17 |
| 104-72 | H-18 |
TABLE 105
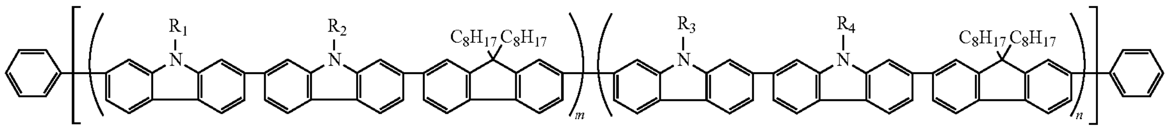
| Com. | R1 = R2 = R3 | R4 |
|---|---|---|
| 105-1 | H-1 | H-29 |
| 105-2 | H-2 | |
| 105-3 | H-3 | |
| 105-4 | H-4 | |
| 105-5 | H-5 | |
| 105-6 | H-6 | |
| 105-7 | H-7 | |
| 105-8 | H-8 | |
| 105-9 | H-9 | |
| 105-10 | H-10 | |
| 105-11 | H-11 | |
| 105-12 | H-12 | |
| 105-13 | H-13 | |
| 105-14 | H-14 | |
| 105-15 | H-15 | |
| 105-16 | H-16 | |
| 105-17 | H-17 | |
| 105-18 | H-18 | |
| 105-19 | H-1 | H-30 |
| 105-20 | H-2 | |
| 105-21 | H-3 | |
| 105-22 | H-4 | |
| 105-23 | H-5 | |
| 105-24 | H-6 | |
| 105-25 | H-7 | |
| 105-26 | H-8 | |
| 105-27 | H-9 | |
| 105-28 | H-10 | |
| 105-29 | H-11 | |
| 105-30 | H-12 | |
| 105-31 | H-13 | |
| 105-32 | H-14 | |
| 105-33 | H-15 | |
| 105-34 | H-16 | |
| 105-35 | H-17 | |
| 105-36 | H-18 | |
| Com. | R1 = R3 | R2 | R4 |
|---|---|---|---|
| 105-37 | H-1 | H-1 | H-29 |
| 105-38 | H-2 | | |
| 105-39 | H-3 | | |
| 105-40 | H-4 | | |
| 105-41 | H-5 | | |
| 105-42 | H-6 | | |
| 105-43 | H-7 | | |
| 105-44 | H-8 | | |
| 105-45 | H-9 | | |
| 105-46 | H-10 | | |
| 105-47 | H-11 | | |
| 105-48 | H-12 | | |
| 105-49 | H-13 | | |
| 105-50 | H-14 | | |
| 105-51 | H-15 | | |
| 105-52 | H-16 | | |

TABLE 105-continued
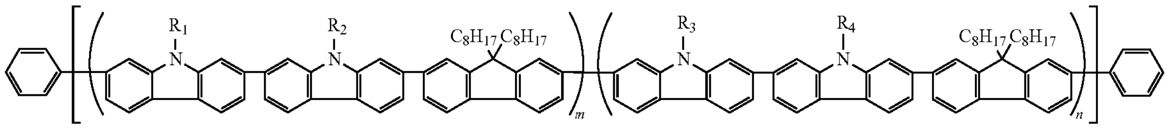
| | | | |
|---|---|---|---|
| 105-53 | H-17 | | |
| 105-54 | H-18 | | |
| 105-55 | H-1 | H-1 | H-30 |
| 105-56 | H-2 | | |
| 105-57 | H-3 | | |
| 105-58 | H-4 | | |
| 105-59 | H-5 | | |
| 105-60 | H-6 | | |
| 105-61 | H-7 | | |
| 105-62 | H-8 | | |
| 105-63 | H-9 | | |
| 105-64 | H-10 | | |
| 105-65 | H-11 | | |
| 105-66 | H-12 | | |
| 105-67 | H-13 | | |
| 105-68 | H-14 | | |
| 105-69 | H-15 | | |
| 105-70 | H-16 | | |
| 105-71 | H-17 | | |
| 105-72 | H-18 | | |
TABLE 106
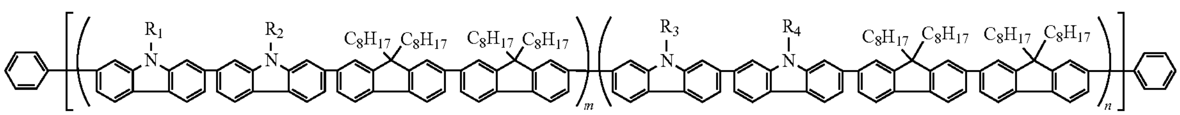
| Com. | R1 = R2 = R3 | R4 |
|---|---|---|
| 106-1 | H-1 | H-29 |
| 106-2 | H-2 | |
| 106-3 | H-3 | |
| 106-4 | H-4 | |
| 106-5 | H-5 | |
| 106-6 | H-6 | |
| 106-7 | H-7 | |
| 106-8 | H-8 | |
| 106-9 | H-9 | |
| 106-10 | H-10 | |
| 106-11 | H-11 | |
| 106-12 | H-12 | |
| 106-13 | H-13 | |
| 106-14 | H-14 | |
| 106-15 | H-15 | |
| 106-16 | H-16 | |
| 106-17 | H-17 | |
| 106-18 | H-18 | |
| 106-19 | H-1 | H-30 |
| 106-20 | H-2 | |
| 106-21 | H-3 | |
| 106-22 | H-4 | |
| 106-23 | H-5 | |
| 106-24 | H-6 | |
| 106-25 | H-7 | |
| 106-26 | H-8 | |
| 106-27 | H-9 | |
| 106-28 | H-10 | |
| 106-29 | H-11 | |
| 106-30 | H-12 | |
| 106-31 | H-13 | |
| 106-32 | H-14 | |
| 106-33 | H-15 | |
| 106-34 | H-16 | |
| 106-35 | H-17 | |
| 106-36 | H-18 | |

TABLE 106-continued
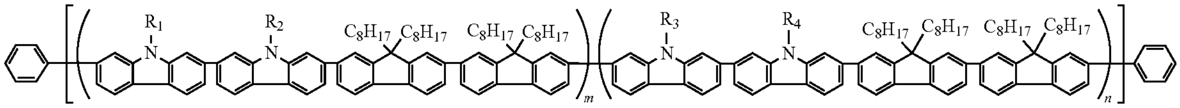
| Com. | R1 = R3 | R2 | R4 |
|---|---|---|---|
| 106-37 | H-1 | H-1 | H-29 |
| 106-38 | H-2 | | |
| 106-39 | H-3 | | |
| 106-40 | H-4 | | |
| 106-41 | H-5 | | |
| 106-42 | H-6 | | |
| 106-43 | H-7 | | |
| 106-44 | H-8 | | |
| 106-45 | H-9 | | |
| 106-46 | H-10 | | |
| 106-47 | H-11 | | |
| 106-48 | H-12 | | |
| 106-49 | H-13 | | |
| 106-50 | H-14 | | |
| 106-51 | H-15 | | |
| 106-52 | H-16 | | |
| 106-53 | H-17 | | |
| 106-54 | H-18 | | |
| 106-55 | H-1 | H-1 | H-30 |
| 106-56 | H-2 | | |
| 106-57 | H-3 | | |
| 106-58 | H-4 | | |
| 106-59 | H-5 | | |
| 106-60 | H-6 | | |
| 106-61 | H-7 | | |
| 106-62 | H-8 | | |
| 106-63 | H-9 | | |
| 106-64 | H-10 | | |
| 106-65 | H-11 | | |
| 106-66 | H-12 | | |
| 106-67 | H-13 | | |
| 106-68 | H-14 | | |
| 106-69 | H-15 | | |
| 106-70 | H-16 | | |
| 106-71 | H-17 | | |
| 106-72 | H-18 | | |
TABLE 107
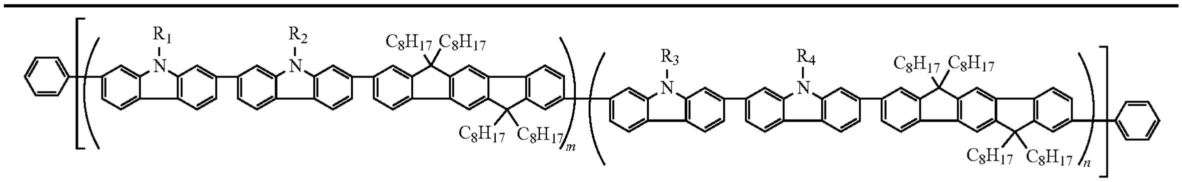
| Com. | R1 = R2 = R3 | R4 |
|---|---|---|
| 107-1 | H-1 | H-29 |
| 107-2 | H-2 | |
| 107-3 | H-3 | |
| 107-4 | H-4 | |
| 107-5 | H-5 | |
| 107-6 | H-6 | |
| 107-7 | H-7 | |
| 107-8 | H-8 | |
| 107-9 | H-9 | |
| 107-10 | H-10 | |
| 107-11 | H-11 | |
| 107-12 | H-12 | |
| 107-13 | H-13 | |
| 107-14 | H-14 | |
| 107-15 | H-15 | |
| 107-16 | H-16 | |
| 107-17 | H-17 | |
| 107-18 | H-18 | |
| 107-19 | H-1 | H-30 |

TABLE 107-continued
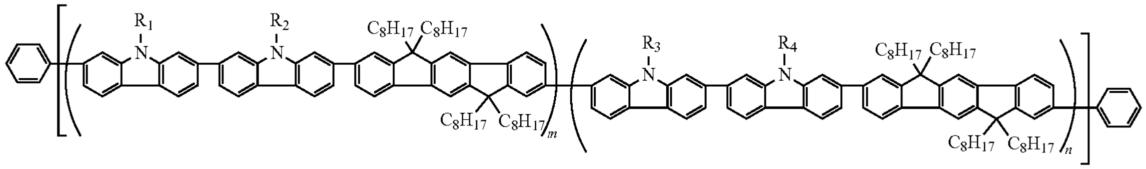
| | | | |
|---|---|---|---|
| 107-20 | H-2 | | |
| 107-21 | H-3 | | |
| 107-22 | H-4 | | |
| 107-23 | H-5 | | |
| 107-24 | H-6 | | |
| 107-25 | H-7 | | |
| 107-26 | H-8 | | |
| 107-27 | H-9 | | |
| 107-28 | H-10 | | |
| 107-29 | H-11 | | |
| 107-30 | H-12 | | |
| 107-31 | H-13 | | |
| 107-32 | H-14 | | |
| 107-33 | H-15 | | |
| 107-34 | H-16 | | |
| 107-35 | H-17 | | |
| 107-36 | H-18 | | |
| Com. | R1 = R3 | R2 | R4 |
|---|---|---|---|
| 107-37 | H-1 | H-1 | H-29 |
| 107-38 | H-2 | | |
| 107-39 | H-3 | | |
| 107-40 | H-4 | | |
| 107-41 | H-5 | | |
| 107-42 | H-6 | | |
| 107-43 | H-7 | | |
| 107-44 | H-8 | | |
| 107-45 | H-9 | | |
| 107-46 | H-10 | | |
| 107-47 | H-11 | | |
| 107-48 | H-12 | | |
| 107-49 | H-13 | | |
| 107-50 | H-14 | | |
| 107-51 | H-15 | | |
| 107-52 | H-16 | | |
| 107-53 | H-17 | | |
| 107-54 | H-18 | | |
| 107-55 | H-1 | H-1 | H-30 |
| 107-56 | H-2 | | |
| 107-57 | H-3 | | |
| 107-58 | H-4 | | |
| 107-59 | H-5 | | |
| 107-60 | H-6 | | |
| 107-61 | H-7 | | |
| 107-62 | H-8 | | |
| 107-63 | H-9 | | |
| 107-64 | H-10 | | |
| 107-65 | H-11 | | |
| 107-66 | H-12 | | |
| 107-67 | H-13 | | |
| 107-68 | H-14 | | |
| 107-69 | H-15 | | |
| 107-70 | H-16 | | |
| 107-71 | H-17 | | |
| 107-72 | H-18 | | |

TABLE 108
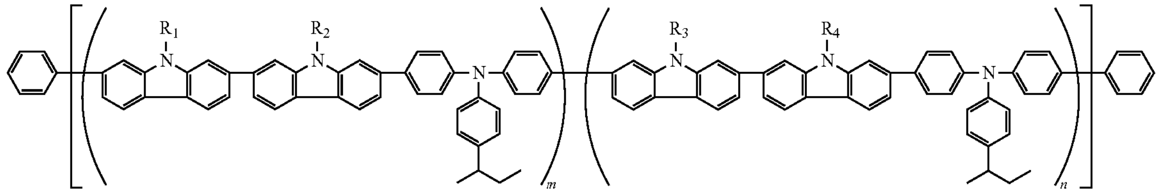
| Com. | R1 = R2 = R3 | R4 |
|---|---|---|
| 108-1 | H-1 | H-29 |
| 108-2 | H-2 | |
| 108-3 | H-3 | |
| 108-4 | H-4 | |
| 108-5 | H-5 | |
| 108-6 | H-6 | |
| 108-7 | H-7 | |
| 108-8 | H-8 | |
| 108-9 | H-9 | |
| 108-10 | H-10 | |
| 108-11 | H-11 | |
| 108-12 | H-12 | |
| 108-13 | H-13 | |
| 108-14 | H-14 | |
| 108-15 | H-15 | |
| 108-16 | H-16 | |
| 108-17 | H-17 | |
| 108-18 | H-18 | |
| 108-19 | H-1 | H-30 |
| 108-20 | H-2 | |
| 108-21 | H-3 | |
| 108-22 | H-4 | |
| 108-23 | H-5 | |
| 108-24 | H-6 | |
| 108-25 | H-7 | |
| 108-26 | H-8 | |
| 108-27 | H-9 | |
| 108-28 | H-10 | |
| 108-29 | H-11 | |
| 108-30 | H-12 | |
| 108-31 | H-13 | |
| 108-32 | H-14 | |
| 108-33 | H-15 | |
| 108-34 | H-16 | |
| 108-35 | H-17 | |
| 108-36 | H-18 | |
| Com. | R1 = R3 | R2 | R4 |
|---|---|---|---|
| 108-37 | H-1 | H-1 | H-29 |
| 108-38 | H-2 | | |
| 108-39 | H-3 | | |
| 108-40 | H-4 | | |
| 108-41 | H-5 | | |
| 108-42 | H-6 | | |
| 108-43 | H-7 | | |
| 108-44 | H-8 | | |
| 108-45 | H-9 | | |
| 108-46 | H-10 | | |
| 108-47 | H-11 | | |
| 108-48 | H-12 | | |
| 108-49 | H-13 | | |
| 108-50 | H-14 | | |
| 108-51 | H-15 | | |
| 108-52 | H-16 | | |
| 108-53 | H-17 | | |
| 108-54 | H-18 | | |
| 108-55 | H-1 | H-1 | H-30 |
| 108-56 | H-2 | | |
| 108-57 | H-3 | | |
| 108-58 | H-4 | | |
| 108-59 | H-5 | | |
| 108-60 | H-6 | | |
| 108-61 | H-7 | | |
| 108-62 | H-8 | | |
| 108-63 | H-9 | | |
| 108-64 | H-10 | | |
| 108-65 | H-11 | | |

TABLE 108-continued
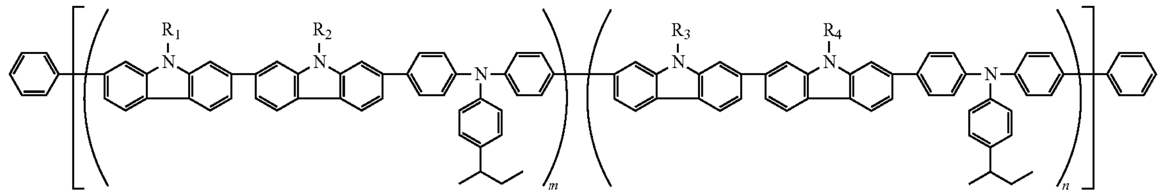
| | |
|---|---|
| 108-66 | H-12 |
| 108-67 | H-13 |
| 108-68 | H-14 |
| 108-69 | H-15 |
| 108-70 | H-16 |
| 108-71 | H-17 |
| 108-72 | H-18 |
TABLE 109-1
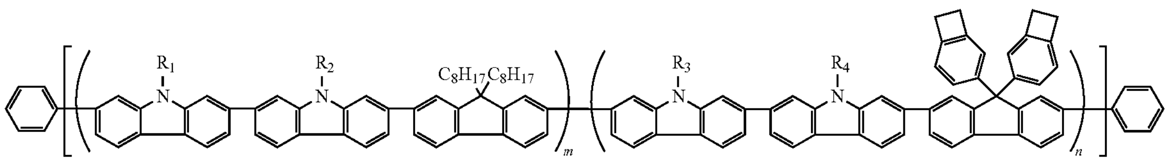
| Com. | R1 = R2 = R3 = R4 |
|---|---|
| 109-1 | H-1 |
| 109-2 | H-2 |
| 109-3 | H-3 |
| 109-4 | H-4 |
| 109-5 | H-5 |
| 109-6 | H-6 |
| 109-7 | H-7 |
| 109-8 | H-8 |
| 109-9 | H-9 |
| 109-10 | H-10 |
| 109-11 | H-11 |
| 109-12 | H-12 |
| 109-13 | H-13 |
| 109-14 | H-14 |
| 109-15 | H-15 |
| 109-16 | H-16 |
| 109-17 | H-17 |
| 109-18 | H-18 |
| Com. | R1 = R3 | R2 = R4 |
|---|---|---|
| 109-19 | H-2 | H-1 |
| 109-20 | H-3 | |
| 109-21 | H-4 | |
| 109-22 | H-5 | |
| 109-23 | H-6 | |
| 109-24 | H-7 | |
| 109-25 | H-8 | |
| 109-26 | H-9 | |
| 109-27 | H-10 | |
| 109-28 | H-11 | |
| 109-29 | H-12 | |
| 109-30 | H-13 | |
| 109-31 | H-14 | |
| 109-32 | H-15 | |
| 109-33 | H-16 | |
| 109-34 | H-17 | |
| 109-35 | H-18 | |
| 109-36 | H-3 | H-2 |
| 109-37 | H-4 | |
| 109-38 | H-5 | |
| 109-39 | H-6 | |
| 109-40 | H-7 | |
| 109-41 | H-8 | |
| 109-42 | H-9 | |
| 109-43 | H-10 | |
| 109-44 | H-11 | |

TABLE 109-1-continued
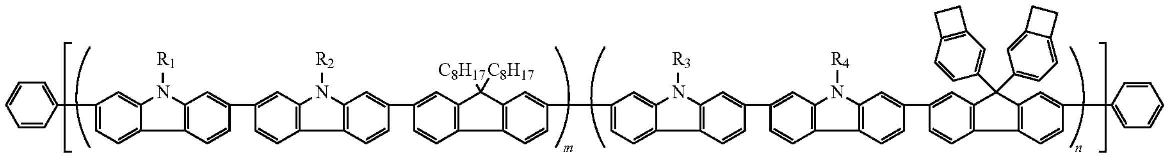
| | | |
|---|---|---|
| 109-45 | H-12 | |
| 109-46 | H-13 | |
| 109-47 | H-14 | |
| 109-48 | H-15 | |
| 109-49 | H-16 | |
| 109-50 | H-17 | |
| 109-51 | H-18 | |
| 109-52 | H-4 | H-3 |
| 109-53 | H-5 | |
| 109-54 | H-6 | |
| 109-55 | H-7 | |
| 109-56 | H-8 | |
| 109-57 | H-9 | |
| 109-58 | H-10 | |
| 109-59 | H-11 | |
| 109-60 | H-12 | |
| 109-61 | H-13 | |
| 109-62 | H-14 | |
| 109-63 | H-15 | |
| 109-64 | H-16 | |
| 109-65 | H-17 | |
| 109-66 | H-18 | |
| 109-67 | H-5 | H-4 |
| 109-68 | H-6 | |
| 109-69 | H-7 | |
| 109-70 | H-8 | |
| 109-71 | H-9 | |
| 109-72 | H-10 | |
| 109-73 | H-11 | |
| 109-74 | H-12 | |
| 109-75 | H-13 | |
| 109-76 | H-14 | |
| 109-77 | H-15 | |
| 109-78 | H-16 | |
| 109-79 | H-17 | |
| 109-80 | H-18 | |
| 109-81 | H-6 | H-5 |
| 109-82 | H-7 | |
| 109-83 | H-8 | |
| 109-84 | H-9 | |
| 109-85 | H-10 | |
| 109-86 | H-11 | |
| 109-87 | H-12 | |
| 109-88 | H-13 | |
| 109-89 | H-14 | |
| 109-90 | H-15 | |
| 109-91 | H-16 | |
| 109-92 | H-17 | |
| 109-93 | H-18 | |
| 109-94 | H-7 | H-6 |
| 109-95 | H-8 | |
| 109-96 | H-9 | |
| 109-97 | H-10 | |
| 109-98 | H-11 | |
| 109-99 | H-12 | |
| 109-100 | H-13 | |
| 109-101 | H-14 | |
| 109-102 | H-15 | |
| 109-103 | H-16 | |
| 109-104 | H-17 | |
| 109-105 | H-18 | |
| 109-106 | H-8 | H7 |
| 109-107 | H-9 | |
| 109-108 | H-10 | |
| 109-109 | H-11 | |
| 109-110 | H-12 | |
| 109-111 | H-13 | |
| 109-112 | H-14 | |
| 109-113 | H-15 | |

TABLE 109-1-continued
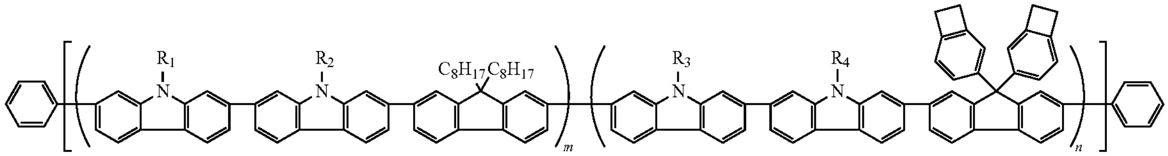
| | |
|---|---|
| 109-114 | H-16 |
| 109-115 | H-17 |
| 109-116 | H-18 |
TABLE 109-2
| Com. | R1 = R3 | R2 = R4 |
|---|---|---|
| 109-117 | H-9 | H-8 |
| 109-118 | H-10 | |
| 109-119 | H-11 | |
| 109-120 | H-12 | |
| 109-121 | H-13 | |
| 109-122 | H-14 | |
| 109-123 | H-15 | |
| 109-124 | H-16 | |
| 109-125 | H-17 | |
| 109-126 | H-18 | |
| 109-127 | H-10 | H-9 |
| 109-128 | H-11 | |
| 109-129 | H-12 | |
| 109-130 | H-13 | |
| 109-131 | H-14 | |
| 109-132 | H-15 | |
| 109-133 | H-16 | |
| 109-134 | H-17 | |
| 109-135 | H-18 | |
| 109-136 | H-11 | H-10 |
| 109-137 | H-12 | |
| 109-138 | H-13 | |
| 109-139 | H-14 | |
| 109-140 | H-15 | |
| 109-141 | H-16 | |
| 109-142 | H-17 | |
| 109-143 | H-18 | |
TABLE 109-2-continued
| Com. | R1 = R3 | R2 = R4 |
|---|---|---|
| 109-144 | H-12 | H-11 |
| 109-145 | H-13 | |
| 109-146 | H-14 | |
| 109-147 | H-15 | |
| 109-148 | H-16 | |
| 109-149 | H-17 | |
| 109-150 | H-18 | |
| 109-151 | H-13 | H-12 |
| 109-152 | H-14 | |
| 109-153 | H-15 | |
| 109-154 | H-16 | |
| 109-155 | H-17 | |
| 109-156 | H-18 | |
| 109-157 | H-14 | H-13 |
| 109-158 | H-15 | |
| 109-159 | H-16 | |
| 109-160 | H-17 | |
| 109-161 | H-18 | |
| 109-162 | H-15 | H-14 |
| 109-163 | H-16 | |
| 109-164 | H-17 | |
| 109-165 | H-18 | |
| 109-166 | H-16 | H-15 |
| 109-167 | H-17 | |
| 109-168 | H-18 | |
| 109-169 | H-17 | H-16 |
| 109-170 | H-18 | |
| 109-171 | H-18 | H-17 |
TABLE 110-1
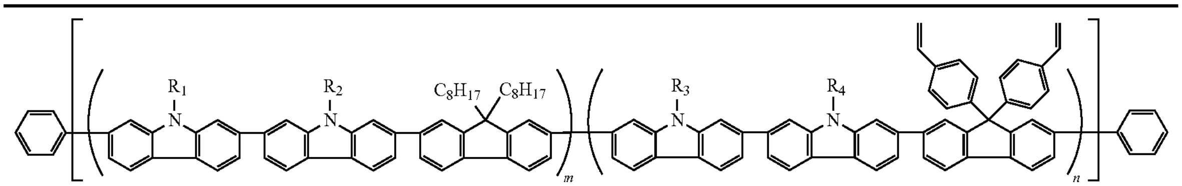
| Com. | R1 = R2 = R3 = R4 |
|---|---|
| 110-1 | H-1 |
| 110-2 | H-2 |
| 110-3 | H-3 |
| 110-4 | H-4 |
| 110-5 | H-5 |
| 110-6 | H-6 |
| 110-7 | H-7 |
| 110-8 | H-8 |
| 110-9 | H-9 |
| 110-10 | H-10 |
| 110-11 | H-11 |
| 110-12 | H-12 |
| 110-13 | H-13 |
| 110-14 | H-14 |
| 110-15 | H-15 |
| 110-16 | H-16 |

TABLE 110-1-continued
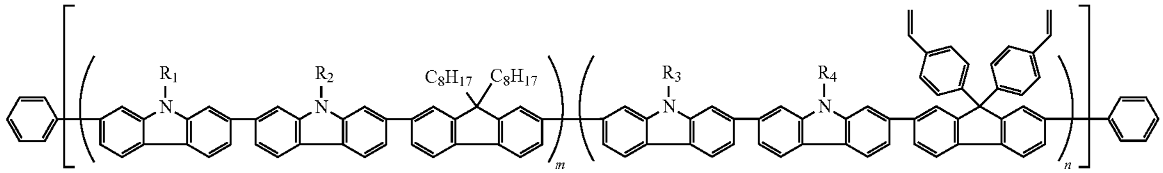
| | | |
|---|---|---|
| 110-17 | H-17 | |
| 110-18 | H-18 | |
| Com. | R1 = R3 | R2 = R4 |
|---|---|---|
| 110-19 | H-2 | H-1 |
| 110-20 | H-3 | |
| 110-21 | H-4 | |
| 110-22 | H-5 | |
| 110-23 | H-6 | |
| 110-24 | H-7 | |
| 110-25 | H-8 | |
| 110-26 | H-9 | |
| 110-27 | H-10 | |
| 110-28 | H-11 | |
| 110-29 | H-12 | |
| 110-30 | H-13 | |
| 110-31 | H-14 | |
| 110-32 | H-15 | |
| 110-33 | H-16 | |
| 110-34 | H-17 | |
| 110-35 | H-18 | |
| 110-36 | H-3 | H-2 |
| 110-37 | H-4 | |
| 110-38 | H-5 | |
| 110-39 | H-6 | |
| 110-40 | H-7 | |
| 110-41 | H-8 | |
| 110-42 | H-9 | |
| 110-43 | H-10 | |
| 110-44 | H-11 | |
| 110-45 | H-12 | |
| 110-46 | H-13 | |
| 110-47 | H-14 | |
| 110-48 | H-15 | |
| 110-49 | H-16 | |
| 110-50 | H-17 | |
| 110-51 | H-18 | |
| 110-52 | H-4 | H-3 |
| 110-53 | H-5 | |
| 110-54 | H-6 | |
| 110-55 | H-7 | |
| 110-56 | H-8 | |
| 110-57 | H-9 | |
| 110-58 | H-10 | |
| 110-59 | H-11 | |
| 110-60 | H-12 | |
| 110-61 | H-13 | |
| 110-62 | H-14 | |
| 110-63 | H-15 | |
| 110-64 | H-16 | |
| 110-65 | H-17 | |
| 110-66 | H-18 | |
| 110-67 | H-5 | H-4 |
| 110-68 | H-6 | |
| 110-69 | H-7 | |
| 110-70 | H-8 | |
| 110-71 | H-9 | |
| 110-72 | H-10 | |
| 110-73 | H-11 | |
| 110-74 | H-12 | |
| 110-75 | H-13 | |
| 110-76 | H-14 | |
| 110-77 | H-15 | |
| 110-78 | H-16 | |
| 110-79 | H-17 | |
| 110-80 | H-18 | |
| 110-81 | H-6 | H-5 |
| 110-82 | H-7 | |
| 110-83 | H-8 | |
| 110-84 | H-9 | |

TABLE 110-1-continued
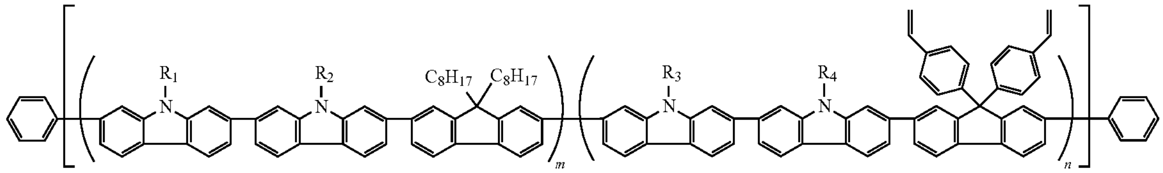
| | | |
|---|---|---|
| 110-85 | H-10 | |
| 110-86 | H-11 | |
| 110-87 | H-12 | |
| 110-88 | H-13 | |
| 110-89 | H-14 | |
| 110-90 | H-15 | |
| 110-91 | H-16 | |
| 110-92 | H-17 | |
| 110-93 | H-18 | |
| 110-94 | H-7 | H-6 |
| 110-95 | H-8 | |
| 110-96 | H-9 | |
| 110-97 | H-10 | |
| 110-98 | H-11 | |
| 110-99 | H-12 | |
| 110-100 | H-13 | |
| 110-101 | H-14 | |
| 110-102 | H-15 | |
| 110-103 | H-16 | |
| 110-104 | H-17 | |
| 110-105 | H-18 | |
| 110-106 | H-8 | H7 |
| 110-107 | H-9 | |
| 110-108 | H-10 | |
| 110-109 | H-11 | |
| 110-110 | H-12 | |
| 110-111 | H-13 | |
| 110-112 | H-14 | |
| 110-113 | H-15 | |
| 110-114 | H-16 | |
| 110-115 | H-17 | |
| 110-116 | H-18 | |
TABLE 110-2
| Com. | R1 = R3 | R2 = R4 |
|---|---|---|
| 110-117 | H-9 | H-8 |
| 110-118 | H-10 | |
| 110-119 | H-11 | |
| 110-120 | H-12 | |
| 110-121 | H-13 | |
| 110-122 | H-14 | |
| 110-123 | H-15 | |
| 110-124 | H-16 | |
| 110-125 | H-17 | |
| 110-126 | H-18 | |
| 110-127 | H-10 | H-9 |
| 110-128 | H-11 | |
| 110-129 | H-12 | |
| 110-130 | H-13 | |
| 110-131 | H-14 | |
| 110-132 | H-15 | |
| 110-133 | H-16 | |
| 110-134 | H-17 | |
| 110-135 | H-18 | |
| 110-136 | H-11 | H-10 |
| 110-137 | H-12 | |
| 110-138 | H-13 | |
| 110-139 | H-14 | |
| 110-140 | H-15 | |
| 110-141 | H-16 | |
| 110-142 | H-17 | |
| 110-143 | H-18 | |
| 110-144 | H-12 | H-11 |
| 110-145 | H-13 | |
| 110-146 | H-14 | |
| 110-147 | H-15 | |
TABLE 110-2-continued
| Com. | R1 = R3 | R2 = R4 |
|---|---|---|
| 110-148 | H-16 | |
| 110-149 | H-17 | |
| 110-150 | H-18 | |
| 110-151 | H-13 | H-12 |
| 110-152 | H-14 | |
| 110-153 | H-15 | |
| 110-154 | H-16 | |
| 110-155 | H-17 | |
| 110-156 | H-18 | |
| 110-157 | H-14 | H-13 |
| 110-158 | H-15 | |
| 110-159 | H-16 | |
| 110-160 | H-17 | |
| 110-161 | H-18 | |
| 110-162 | H-15 | H-14 |
| 110-163 | H-16 | |
| 110-164 | H-17 | |
| 110-165 | H-18 | |
| 110-166 | H-16 | H-15 |
| 110-167 | H-17 | |
| 110-168 | H-18 | |
| 110-169 | H-17 | H-16 |
| 110-170 | H-18 | |
| 110-171 | H-18 | H-17 |

TABLE 111-1
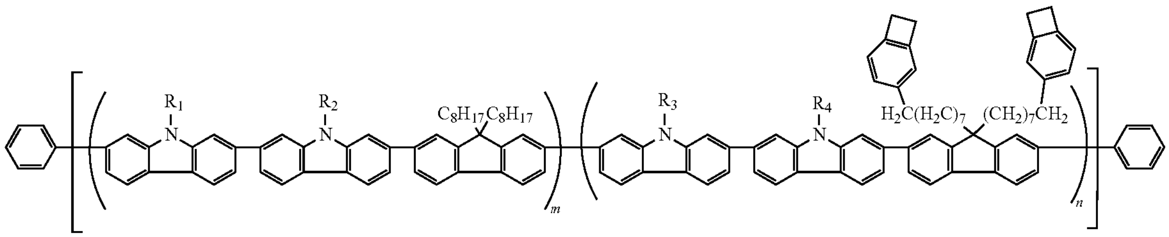
| Com. | R1 = R2 = R3 = R4 |
|---|---|
| 111-1 | H-1 |
| 111-2 | H-2 |
| 111-3 | H-3 |
| 111-4 | H-4 |
| 111-5 | H-5 |
| 111-6 | H-6 |
| 111-7 | H-7 |
| 111-8 | H-8 |
| 111-9 | H-9 |
| 111-10 | H-10 |
| 111-11 | H-11 |
| 111-12 | H-12 |
| 111-13 | H-13 |
| 111-14 | H-14 |
| 111-15 | H-15 |
| 111-16 | H-16 |
| 111-17 | H-17 |
| 111-18 | H-18 |
| Com. | R1 = R3 | R2 = R4 |
|---|---|---|
| 111-19 | H-2 | H-1 |
| 111-20 | H-3 | |
| 111-21 | H-4 | |
| 111-22 | H-5 | |
| 111-23 | H-6 | |
| 111-24 | H-7 | |
| 111-25 | H-8 | |
| 111-26 | H-9 | |
| 111-27 | H-10 | |
| 111-28 | H-11 | |
| 111-29 | H-12 | |
| 111-30 | H-13 | |
| 111-31 | H-14 | |
| 111-32 | H-15 | |
| 111-33 | H-16 | |
| 111-34 | H-17 | |
| 111-35 | H-18 | |
| 111-36 | H-3 | H-2 |
| 111-37 | H-4 | |
| 111-38 | H-5 | |
| 111-39 | H-6 | |
| 111-40 | H-7 | |
| 111-41 | H-8 | |
| 111-42 | H-9 | |
| 111-43 | H-10 | |
| 111-44 | H-11 | |
| 111-45 | H-12 | |
| 111-46 | H-13 | |
| 111-47 | H-14 | |
| 111-48 | H-15 | |
| 111-49 | H-16 | |
| 111-50 | H-17 | |
| 111-51 | H-18 | |
| 111-52 | H-4 | H-3 |
| 111-53 | H-5 | |
| 111-54 | H-6 | |
| 111-55 | H-7 | |
| 111-56 | H-8 | |
| 111-57 | H-9 | |
| 111-58 | H-10 | |
| 111-59 | H-11 | |
| 111-60 | H-12 | |
| 111-61 | H-13 | |
| 111-62 | H-14 | |
| 111-63 | H-15 | |

TABLE 111-1-continued
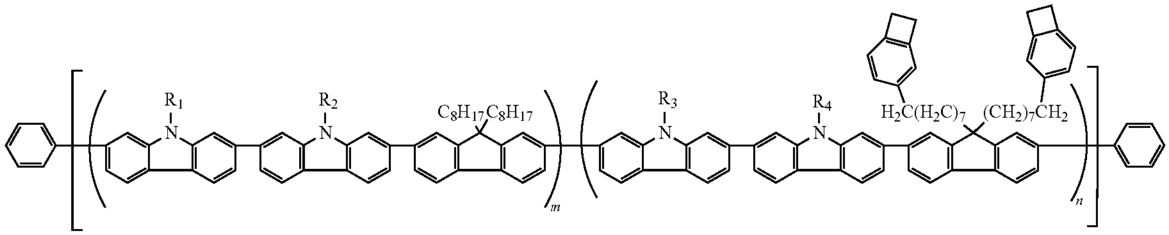
| | | |
|---|---|---|
| 111-64 | H-16 | |
| 111-65 | H-17 | |
| 111-66 | H-18 | |
| 111-67 | H-5 | H-4 |
| 111-68 | H-6 | |
| 111-69 | H-7 | |
| 111-70 | H-8 | |
| 111-71 | H-9 | |
| 111-72 | H-10 | |
| 111-73 | H-11 | |
| 111-74 | H-12 | |
| 111-75 | H-13 | |
| 111-76 | H-14 | |
| 111-77 | H-15 | |
| 111-78 | H-16 | |
| 111-79 | H-17 | |
| 111-80 | H-18 | |
| 111-81 | H-6 | H-5 |
| 111-82 | H-7 | |
| 111-83 | H-8 | |
| 111-84 | H-9 | |
| 111-85 | H-10 | |
| 111-86 | H-11 | |
| 111-87 | H-12 | |
| 111-88 | H-13 | |
| 111-89 | H-14 | |
| 111-90 | H-15 | |
| 111-91 | H-16 | |
| 111-92 | H-17 | |
| 111-93 | H-18 | |
| 111-94 | H-7 | H-6 |
| 111-95 | H-8 | |
| 111-96 | H-9 | |
| 111-97 | H-10 | |
| 111-98 | H-11 | |
| 111-99 | H-12 | |
| 111-100 | H-13 | |
| 111-101 | H-14 | |
| 111-102 | H-15 | |
| 111-103 | H-16 | |
| 111-104 | H-17 | |
| 111-105 | H-18 | |
| 111-106 | H-8 | H7 |
| 111-107 | H-9 | |
| 111-108 | H-10 | |
| 111-109 | H-11 | |
| 111-110 | H-12 | |
| 111-111 | H-13 | |
| 111-112 | H-14 | |
| 111-113 | H-15 | |
| 111-114 | H-16 | |
| 111-115 | H-17 | |
| 111-116 | H-18 | |
TABLE 111-2
| Com. | R1 = R3 | R2 = R4 |
|---|---|---|
| 111-117 | H-9 | H-8 |
| 111-118 | H-10 | |
| 111-119 | H-11 | |
| 111-120 | H-12 | |
| 111-121 | H-13 | |
| 111-122 | H-14 | |
| 111-123 | H-15 | |
TABLE 111-2-continued
| Com. | R1 = R3 | R2 = R4 |
|---|---|---|
| 111-124 | H-16 | |
| 111-125 | H-17 | |
| 111-126 | H-18 | |
| 111-127 | H-10 | H-9 |
| 111-128 | H-11 | |
| 111-129 | H-12 | |
| 111-130 | H-13 | |

TABLE 111-2-continued
| Com. | R1 = R3 | R2 = R4 |
|---|---|---|
| 111-131 | H-14 | |
| 111-132 | H-15 | |
| 111-133 | H-16 | |
| 111-134 | H-17 | |
| 111-135 | H-18 | |
| 111-136 | H-11 | H-10 |
| 111-137 | H-12 | |
| 111-138 | H-13 | |
| 111-139 | H-14 | |
| 111-140 | H-15 | |
| 111-141 | H-16 | |
| 111-142 | H-17 | |
| 111-143 | H-18 | |
| 111-144 | H-12 | H-11 |
| 111-145 | H-13 | |
| 111-146 | H-14 | |
| 111-147 | H-15 | |
| 111-148 | H-16 | |
| 111-149 | H-17 | |
| 111-150 | H-18 | |
| 111-151 | H-13 | H-12 |
| 111-152 | H-14 | |
| 111-153 | H-15 | |
| 111-154 | H-16 | |
| 111-155 | H-17 | |
| 111-156 | H-18 | |
| 111-157 | H-14 | H-13 |
| 111-158 | H-15 | |
| 111-159 | H-16 | |
| 111-160 | H-17 | |
| 111-161 | H-18 | |
| 111-162 | H-15 | H-14 |
| 111-163 | H-16 | |
| 111-164 | H-17 | |
| 111-165 | H-18 | |
| 111-166 | H-16 | H-15 |
| 111-167 | H-17 | |
| 111-168 | H-18 | |
| 111-169 | H-17 | H-16 |
| 111-170 | H-18 | |
| 111-171 | H-18 | H-17 |
TABLE 112-1
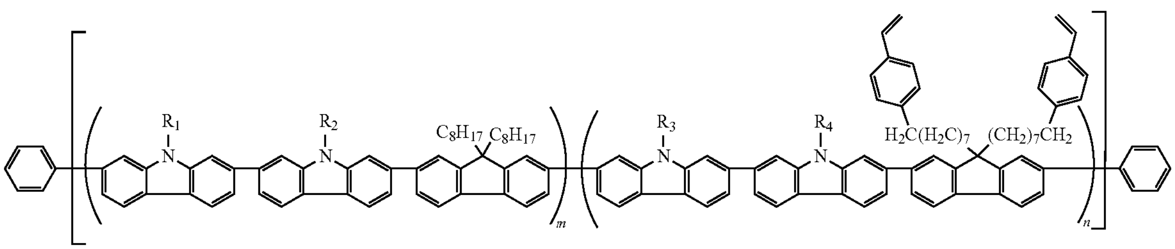
| Com. | R1 = R2 = R3 = R4 |
|---|---|
| 112-1 | H-1 |
| 112-2 | H-2 |
| 112-3 | H-3 |
| 112-4 | H-4 |
| 112-5 | H-5 |
| 112-6 | H-6 |
| 112-7 | H-7 |
| 112-8 | H-8 |
| 112-9 | H-9 |
| 112-10 | H-10 |
| 112-11 | H-11 |
| 112-12 | H-12 |
| 112-13 | H-13 |
| 112-14 | H-14 |
| 112-15 | H-15 |
| 112-16 | H-16 |
| 112-17 | H-17 |
| 112-18 | H-18 |
| Com. | R1 = R3 | R2 = R4 |
|---|---|---|
| 112-19 | H-2 | H-1 |
| 112-20 | H-3 | |
| 112-21 | H-4 | |
| 112-22 | H-5 | |
| 112-23 | H-6 | |
| 112-24 | H-7 | |
| 112-25 | H-8 | |
| 112-26 | H-9 | |
| 112-27 | H-10 | |
| 112-28 | H-11 | |
| 112-29 | H-12 | |
| 112-30 | H-13 | |

TABLE 112-1-continued
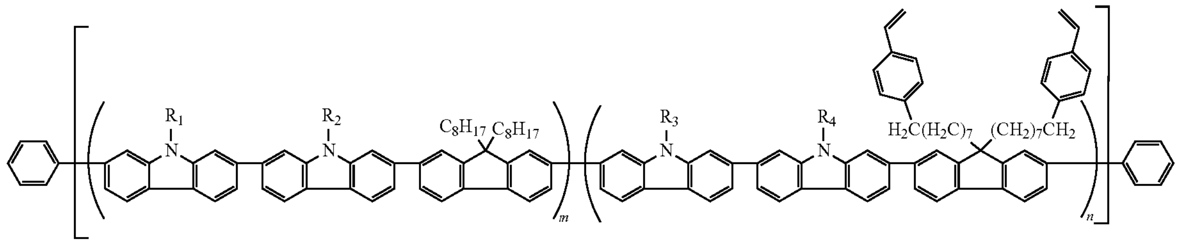
| | | |
|---|---|---|
| 112-31 | H-14 | |
| 112-32 | H-15 | |
| 112-33 | H-16 | |
| 112-34 | H-17 | |
| 112-35 | H-18 | |
| 112-36 | H-3 | H-2 |
| 112-37 | H-4 | |
| 112-38 | H-5 | |
| 112-39 | H-6 | |
| 112-40 | H-7 | |
| 112-41 | H-8 | |
| 112-42 | H-9 | |
| 112-43 | H-10 | |
| 112-44 | H-11 | |
| 112-45 | H-12 | |
| 112-46 | H-13 | |
| 112-47 | H-14 | |
| 112-48 | H-15 | |
| 112-49 | H-16 | |
| 112-50 | H-17 | |
| 112-51 | H-18 | |
| 112-52 | H-4 | H-3 |
| 112-53 | H-5 | |
| 112-54 | H-6 | |
| 112-55 | H-7 | |
| 112-56 | H-8 | |
| 112-57 | H-9 | |
| 112-58 | H-10 | |
| 112-59 | H-11 | |
| 112-60 | H-12 | |
| 112-61 | H-13 | |
| 112-62 | H-14 | |
| 112-63 | H-15 | |
| 112-64 | H-16 | |
| 112-65 | H-17 | |
| 112-66 | H-18 | |
| 112-67 | H-5 | H-4 |
| 112-68 | H-6 | |
| 112-69 | H-7 | |
| 112-70 | H-8 | |
| 112-71 | H-9 | |
| 112-72 | H-10 | |
| 112-73 | H-11 | |
| 112-74 | H-12 | |
| 112-75 | H-13 | |
| 112-76 | H-14 | |
| 112-77 | H-15 | |
| 112-78 | H-16 | |
| 112-79 | H-17 | |
| 112-80 | H-18 | |
| 112-81 | H-6 | H-5 |
| 112-82 | H-7 | |
| 112-83 | H-8 | |
| 112-84 | H-9 | |
| 112-85 | H-10 | |
| 112-86 | H-11 | |
| 112-87 | H-12 | |
| 112-88 | H-13 | |
| 112-89 | H-14 | |
| 112-90 | H-15 | |

TABLE 112-1-continued
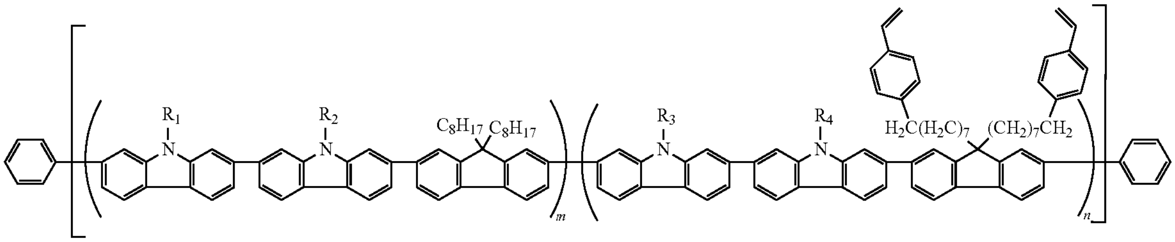
| | | |
|---|---|---|
| 112-91 | H-16 | |
| 112-92 | H-17 | |
| 112-93 | H-18 | |
| 112-94 | H-7 | H-6 |
| 112-95 | H-8 | |
| 112-96 | H-9 | |
| 112-97 | H-10 | |
| 112-98 | H-11 | |
| 112-99 | H-12 | |
| 112-100 | H-13 | |
| 112-101 | H-14 | |
| 112-102 | H-15 | |
| 112-103 | H-16 | |
| 112-104 | H-17 | |
| 112-105 | H-18 | |
| 112-106 | H-8 | H7 |
| 112-107 | H-9 | |
| 112-108 | H-10 | |
| 112-109 | H-11 | |
| 112-110 | H-12 | |
| 112-111 | H-13 | |
| 112-112 | H-14 | |
| 112-113 | H-15 | |
| 112-114 | H-16 | |
| 112-115 | H-17 | |
| 112-116 | H-18 | |
TABLE 112-2
| Com. | R1 = R3 | R2 = R4 |
|---|---|---|
| 112-117 | H-9 | H-8 |
| 112-118 | H-10 | |
| 112-119 | H-11 | |
| 112-120 | H-12 | |
| 112-121 | H-13 | |
| 112-122 | H-14 | |
| 112-123 | H-15 | |
| 112-124 | H-16 | |
| 112-125 | H-17 | |
| 112-126 | H-18 | |
| 112-127 | H-10 | H-9 |
| 112-128 | H-11 | |
| 112-129 | H-12 | |
| 112-130 | H-13 | |
| 112-131 | H-14 | |
| 112-132 | H-15 | |
| 112-133 | H-16 | |
| 112-134 | H-17 | |
| 112-135 | H-18 | |
| 112-136 | H-11 | H-10 |
| 112-137 | H-12 | |
| 112-138 | H-13 | |
| 112-139 | H-14 | |
| 112-140 | H-15 | |
| 112-141 | H-16 | |
| 112-142 | H-17 | |
| 112-143 | H-18 | |
| 112-144 | H-12 | H-11 |
| 112-145 | H-13 | |
| 112-146 | H-14 | |
| 112-147 | H-15 | |
| 112-148 | H-16 | |
| 112-149 | H-17 | |
| 112-150 | H-18 | |
TABLE 112-2-continued
| Com. | R1 = R3 | R2 = R4 |
|---|---|---|
| 112-151 | H-13 | H-12 |
| 112-152 | H-14 | |
| 112-153 | H-15 | |
| 112-154 | H-16 | |
| 112-155 | H-17 | |
| 112-156 | H-18 | |
| 112-157 | H-14 | H-13 |
| 112-158 | H-15 | |
| 112-159 | H-16 | |
| 112-160 | H-17 | |
| 112-161 | H-18 | |
| 112-162 | H-15 | H-14 |
| 112-163 | H-16 | |
| 112-164 | H-17 | |
| 112-165 | H-18 | |
| 112-166 | H-16 | H-15 |
| 112-167 | H-17 | |
| 112-168 | H-18 | |
| 112-169 | H-17 | H-16 |
| 112-170 | H-18 | |
| 112-171 | H-18 | H-17 |

TABLE 113
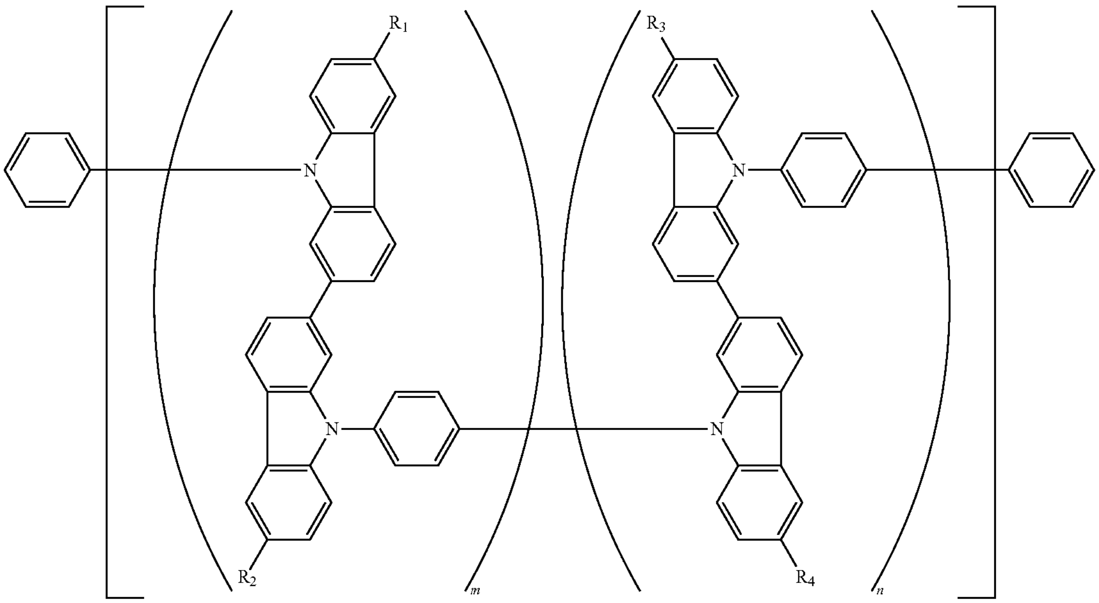
| Com. | R1 = R2 | R3 = R4 |
|---|---|---|
| 113-1 | H | H-29 |
| 113-2 | H-1 | |
| 113-3 | H-2 | |
| 113-4 | H-3 | |
| 113-5 | H-4 | |
| 113-6 | H-5 | |
| 113-7 | H-6 | |
| 113-8 | H-7 | |
| 113-9 | H-8 | |
| 113-10 | H-9 | |
| 113-11 | H-10 | |
| 113-12 | H-11 | |
| 113-13 | H-12 | |
| 113-14 | H-13 | |
| 113-15 | H-14 | |
| 113-16 | H-15 | |
| 113-17 | H-16 | |
| 113-18 | H-17 | |
| 113-19 | H-18 | |
| 113-20 | H | H-30 |
| 113-21 | H-1 | |
| 113-22 | H-2 | |
| 113-23 | H-3 | |
| 113-24 | H-4 | |
| 113-25 | H-5 | |
| 113-26 | H-6 | |
| 113-27 | H-7 | |
| 113-28 | H-8 | |
| 113-29 | H-9 | |
| 113-30 | H-10 | |
| 113-31 | H-11 | |
| 113-32 | H-12 | |
| 113-33 | H-13 | |
| 113-34 | H-14 | |
| 113-35 | H-15 | |
| 113-36 | H-16 | |
| 113-37 | H-17 | |
| 113-38 | H-18 | |

TABLE 114
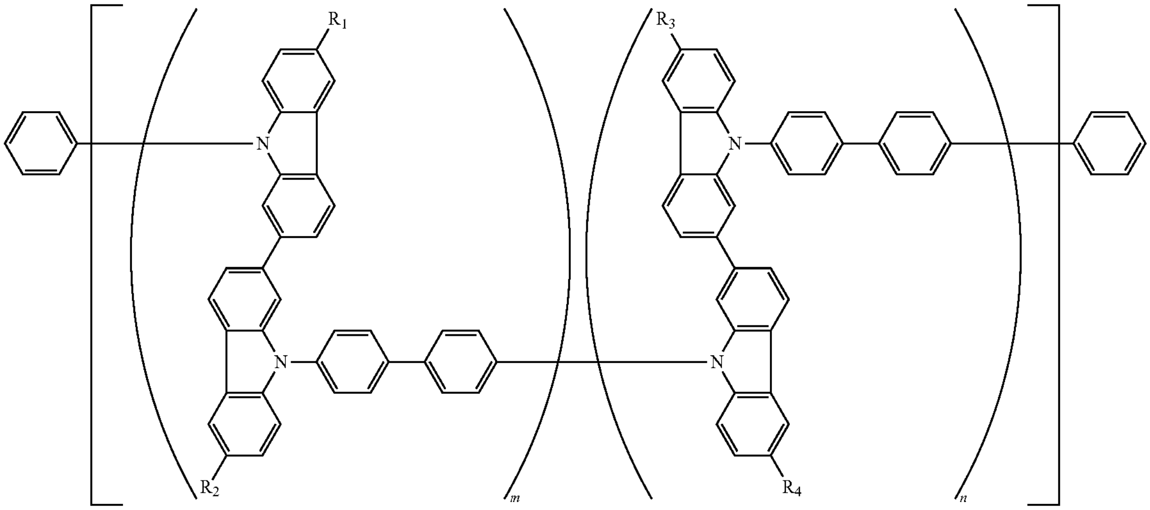
| Com. | R1 = R2 | R3 = R4 |
|---|---|---|
| 114-1 | H | H-29 |
| 114-2 | H-1 | |
| 114-3 | H-2 | |
| 114-4 | H-3 | |
| 114-5 | H-4 | |
| 114-6 | H-5 | |
| 114-7 | H-6 | |
| 114-8 | H-7 | |
| 114-9 | H-8 | |
| 114-10 | H-9 | |
| 114-11 | H-10 | |
| 114-12 | H-11 | |
| 114-13 | H-12 | |
| 114-14 | H-13 | |
| 114-15 | H-14 | |
| 114-16 | H-15 | |
| 114-17 | H-16 | |
| 114-18 | H-17 | |
| 114-19 | H-18 | |
| 114-20 | H | H-30 |
| 114-21 | H-1 | |
| 114-22 | H-2 | |
| 114-23 | H-3 | |
| 114-24 | H-4 | |
| 114-25 | H-5 | |
| 114-26 | H-6 | |
| 114-27 | H-7 | |
| 114-28 | H-8 | |
| 114-29 | H-9 | |
| 114-30 | H-10 | |
| 114-31 | H-11 | |
| 114-32 | H-12 | |
| 114-33 | H-13 | |
| 114-34 | H-14 | |
| 114-35 | H-15 | |
| 114-36 | H-16 | |
| 114-37 | H-17 | |
| 114-38 | H-18 | |

TABLE 115
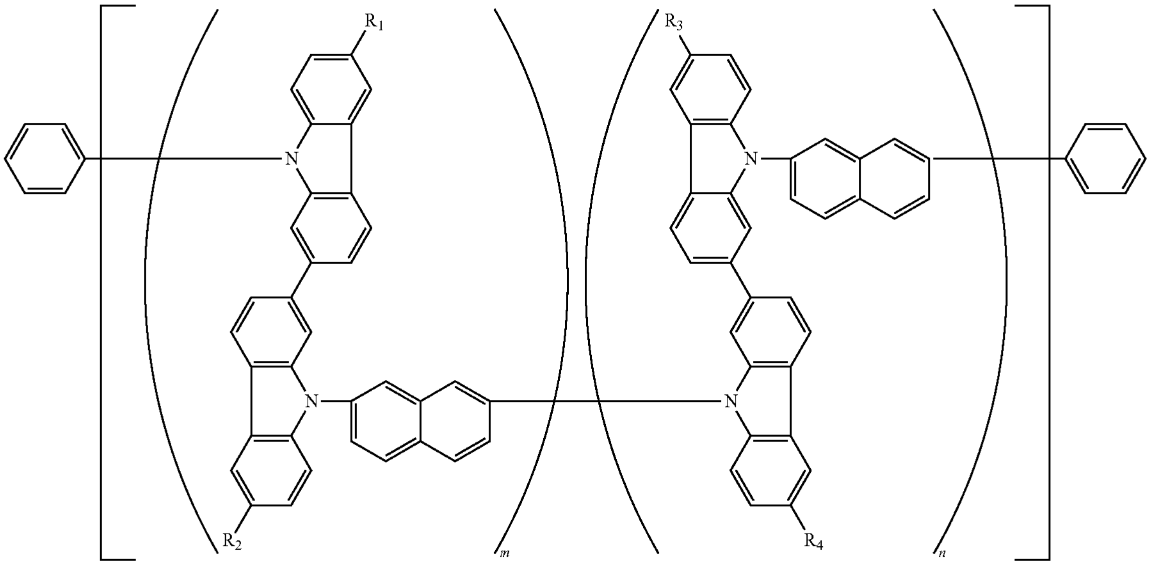
| Com. | R1 = R2 | R3 = R4 |
|---|---|---|
| 115-1 | H | H-29 |
| 115-2 | H-1 | |
| 115-3 | H-2 | |
| 115-4 | H-3 | |
| 115-5 | H-4 | |
| 115-6 | H-5 | |
| 115-7 | H-6 | |
| 115-8 | H-7 | |
| 115-9 | H-8 | |
| 115-10 | H-9 | |
| 115-11 | H-10 | |
| 115-12 | H-11 | |
| 115-13 | H-12 | |
| 115-14 | H-13 | |
| 115-15 | H-14 | |
| 115-16 | H-15 | |
| 115-17 | H-16 | |
| 115-18 | H-17 | |
| 115-19 | H-18 | |
| 115-20 | H | H-30 |
| 115-21 | H-1 | |
| 115-22 | H-2 | |
| 115-23 | H-3 | |
| 115-24 | H-4 | |
| 115-25 | H-5 | |
| 115-26 | H-6 | |
| 115-27 | H-7 | |
| 115-28 | H-8 | |
| 115-29 | H-9 | |
| 115-30 | H-10 | |
| 115-31 | H-11 | |
| 115-32 | H-12 | |
| 115-33 | H-13 | |
| 115-34 | H-14 | |
| 115-35 | H-15 | |
| 115-36 | H-16 | |
| 115-37 | H-17 | |
| 115-38 | H-18 | |

TABLE 116
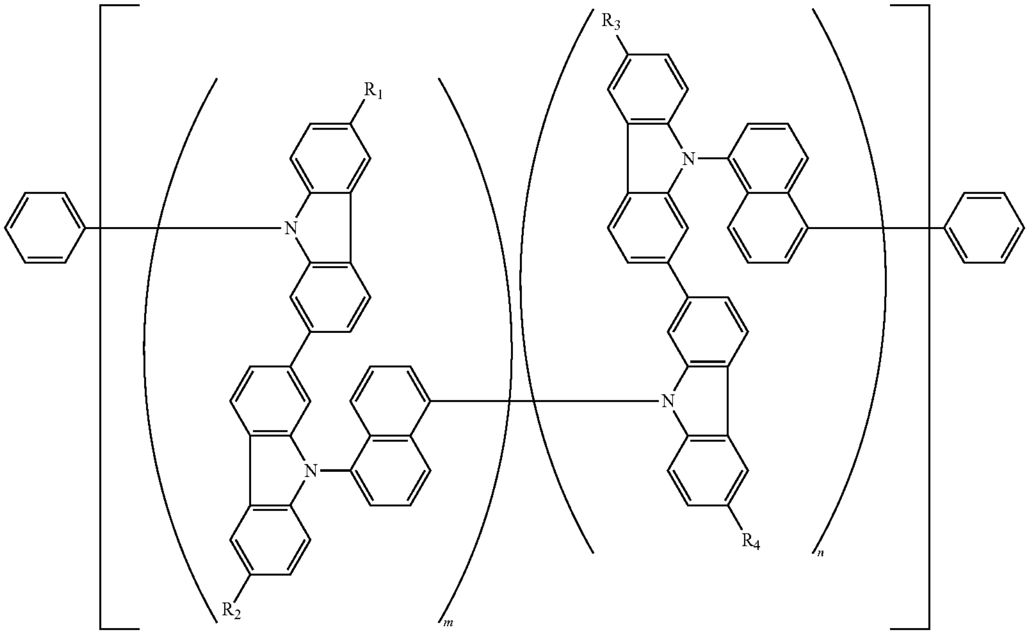
| Com. | R1 = R2 | R3 = R4 |
| --- | --- | --- |
| 116-1 | H | H-29 |
| 116-2 | H-1 | |
| 116-3 | H-2 | |
| 116-4 | H-3 | |
| 116-5 | H-4 | |
| 116-6 | H-5 | |
| 116-7 | H-6 | |
| 116-8 | H-7 | |
| 116-9 | H-8 | |
| 116-10 | H-9 | |
| 116-11 | H-10 | |
| 116-12 | H-11 | |
| 116-13 | H-12 | |
| 116-14 | H-13 | |
| 116-15 | H-14 | |
| 116-16 | H-15 | |
| 116-17 | H-16 | |
| 116-18 | H-17 | |
| 116-19 | H-18 | |
| 116-20 | H | H-30 |
| 116-21 | H-1 | |
| 116-22 | H-2 | |
| 116-23 | H-3 | |
| 116-24 | H-4 | |
| 116-25 | H-5 | |
| 116-26 | H-6 | |
| 116-27 | H-7 | |
| 116-28 | H-8 | |
| 116-29 | H-9 | |
| 116-30 | H-10 | |
| 116-31 | H-11 | |
| 116-32 | H-12 | |
| 116-33 | H-13 | |
| 116-34 | H-14 | |
| 116-35 | H-15 | |
| 116-36 | H-16 | |
| 116-37 | H-17 | |
| 116-38 | H-18 | |

TABLE 117
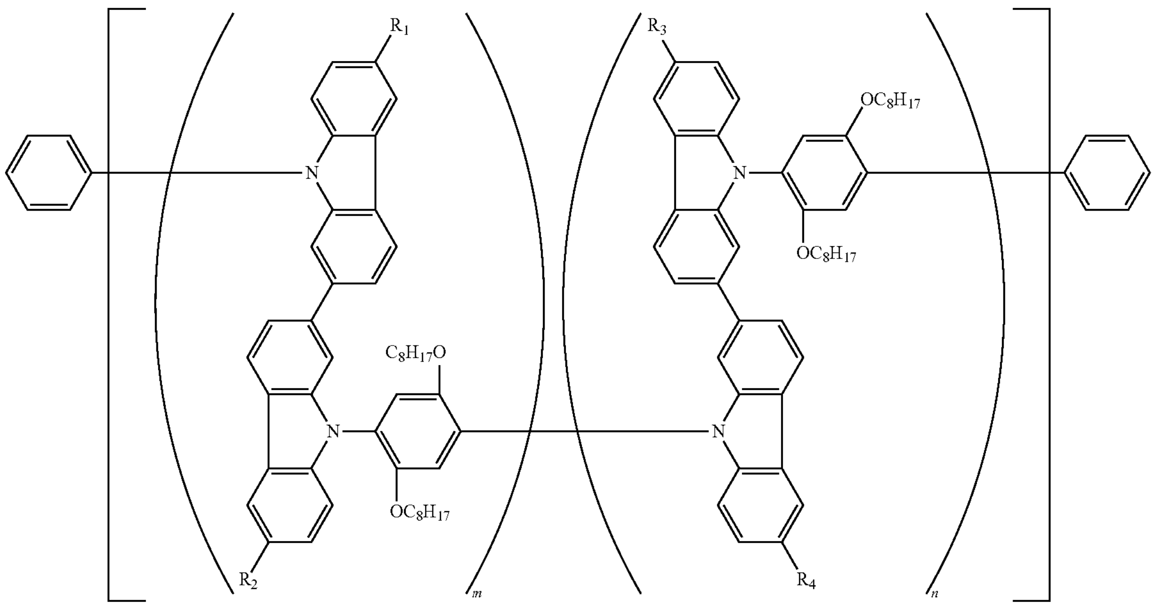
| Com. | R1 = R2 | R3 = R4 |
|---|---|---|
| 117-1 | H | H-29 |
| 117-2 | H-1 | |
| 117-3 | H-2 | |
| 117-4 | H-3 | |
| 117-5 | H-4 | |
| 117-6 | H-5 | |
| 117-7 | H-6 | |
| 117-8 | H-7 | |
| 117-9 | H-8 | |
| 117-10 | H-9 | |
| 117-11 | H-10 | |
| 117-12 | H-11 | |
| 117-13 | H-12 | |
| 117-14 | H-13 | |
| 117-15 | H-14 | |
| 117-16 | H-15 | |
| 117-17 | H-16 | |
| 117-18 | H-17 | |
| 117-19 | H-18 | |
| 117-20 | H | H-30 |
| 117-21 | H-1 | |
| 117-22 | H-2 | |
| 117-23 | H-3 | |
| 117-24 | H-4 | |
| 117-25 | H-5 | |
| 117-26 | H-6 | |
| 117-27 | H-7 | |
| 117-28 | H-8 | |
| 117-29 | H-9 | |
| 117-30 | H-10 | |
| 117-31 | H-11 | |
| 117-32 | H-12 | |
| 117-33 | H-13 | |
| 117-34 | H-14 | |
| 117-35 | H-15 | |
| 117-36 | H-16 | |
| 117-37 | H-17 | |
| 117-38 | H-18 | |

TABLE 118
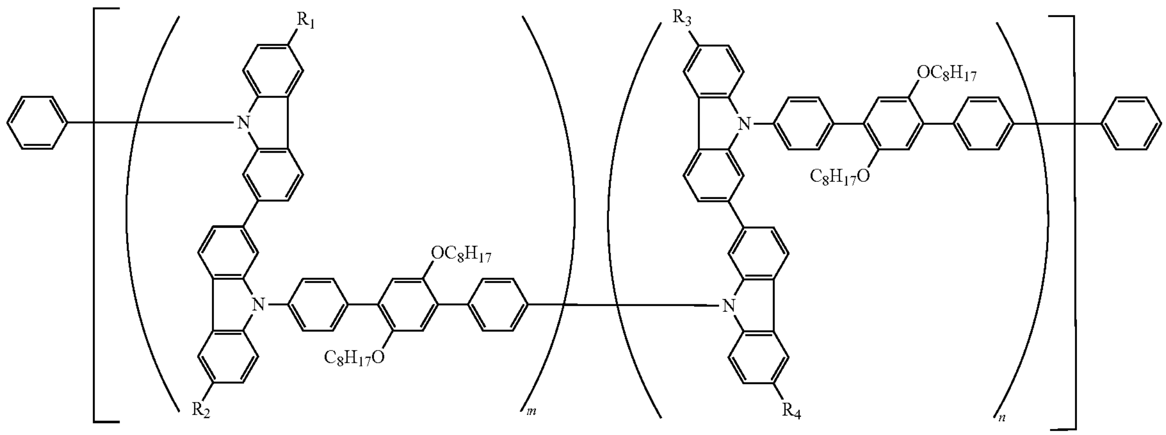
| Com. | R1 = R2 | R3 = R4 |
|---|---|---|
| 118-1 | H | H-29 |
| 118-2 | H-1 | |
| 118-3 | H-2 | |
| 118-4 | H-3 | |
| 118-5 | H-4 | |
| 118-6 | H-5 | |
| 118-7 | H-6 | |
| 118-8 | H-7 | |
| 118-9 | H-8 | |
| 118-10 | H-9 | |
| 118-11 | H-10 | |
| 118-12 | H-11 | |
| 118-13 | H-12 | |
| 118-14 | H-13 | |
| 118-15 | H-14 | |
| 118-16 | H-15 | |
| 118-17 | H-16 | |
| 118-18 | H-17 | |
| 118-19 | H-18 | |
| 118-20 | H | H-30 |
| 118-21 | H-1 | |
| 118-22 | H-2 | |
| 118-23 | H-3 | |
| 118-24 | H-4 | |
| 118-25 | H-5 | |
| 118-26 | H-6 | |
| 118-27 | H-7 | |
| 118-28 | H-8 | |
| 118-29 | H-9 | |
| 118-30 | H-10 | |
| 118-31 | H-11 | |
| 118-32 | H-12 | |
| 118-33 | H-13 | |
| 118-34 | H-14 | |
| 118-35 | H-15 | |
| 118-36 | H-16 | |
| 118-37 | H-17 | |
| 118-38 | H-18 | |

TABLE 119
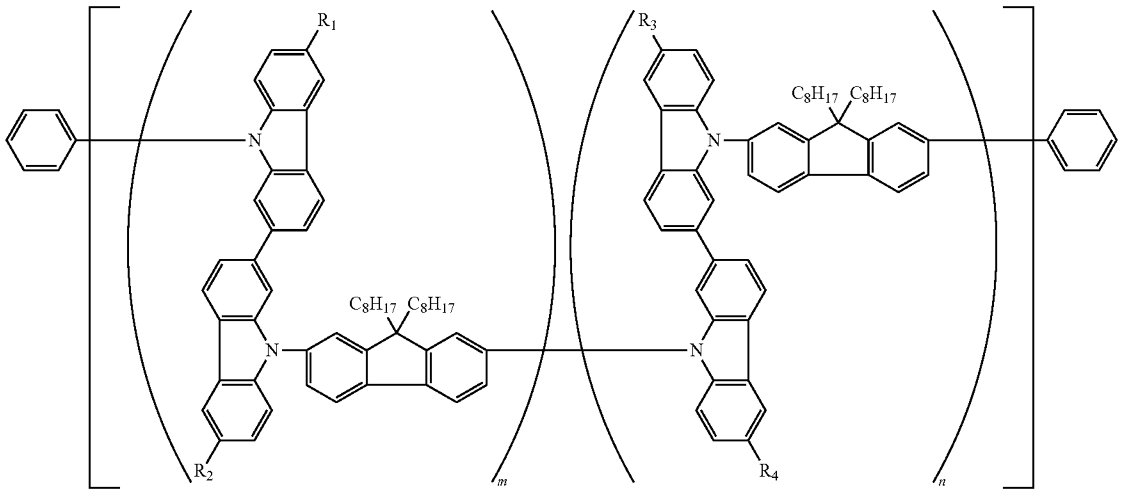
| Com. | R1 = R2 | R3 = R4 |
|---|---|---|
| 119-1 | H | H-29 |
| 119-2 | H-1 | |
| 119-3 | H-2 | |
| 119-4 | H-3 | |
| 119-5 | H-4 | |
| 119-6 | H-5 | |
| 119-7 | H-6 | |
| 119-8 | H-7 | |
| 119-9 | H-8 | |
| 119-10 | H-9 | |
| 119-11 | H-10 | |
| 119-12 | H-11 | |
| 119-13 | H-12 | |
| 119-14 | H-13 | |
| 119-15 | H-14 | |
| 119-16 | H-15 | |
| 119-17 | H-16 | |
| 119-18 | H-17 | |
| 119-19 | H-18 | |
| 119-20 | H | H-30 |
| 119-21 | H-1 | |
| 119-22 | H-2 | |
| 119-23 | H-3 | |
| 119-24 | H-4 | |
| 119-25 | H-5 | |
| 119-26 | H-6 | |
| 119-27 | H-7 | |
| 119-28 | H-8 | |
| 119-29 | H-9 | |
| 119-30 | H-10 | |
| 119-31 | H-11 | |
| 119-32 | H-12 | |
| 119-33 | H-13 | |
| 119-34 | H-14 | |
| 119-35 | H-15 | |
| 119-36 | H-16 | |
| 119-37 | H-17 | |
| 119-38 | H-18 | |

TABLE 120
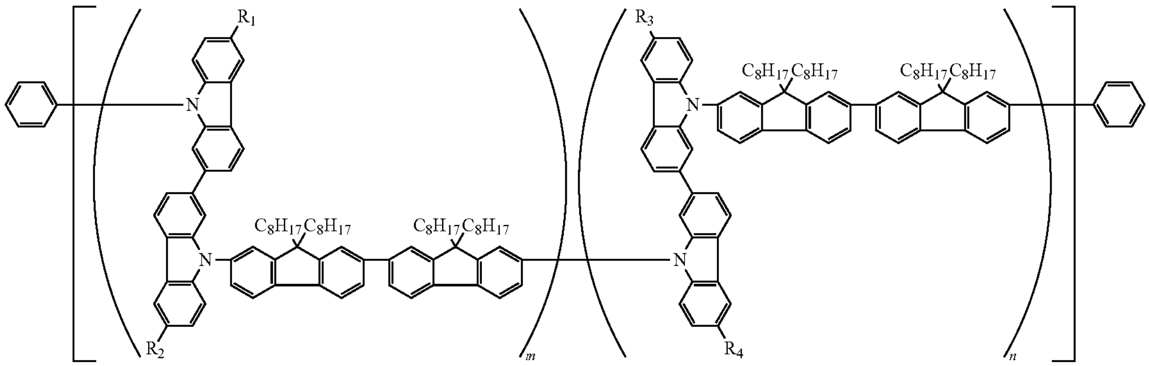
| Com. | R1 = R2 | R3 = R4 |
|---|---|---|
| 120-1 | H | H-29 |
| 120-2 | H-1 | |
| 120-3 | H-2 | |
| 120-4 | H-3 | |
| 120-5 | H-4 | |
| 120-6 | H-5 | |
| 120-7 | H-6 | |
| 120-8 | H-7 | |
| 120-9 | H-8 | |
| 120-10 | H-9 | |
| 120-11 | H-10 | |
| 120-12 | H-11 | |
| 120-13 | H-12 | |
| 120-14 | H-13 | |
| 120-15 | H-14 | |
| 120-16 | H-15 | |
| 120-17 | H-16 | |
| 120-18 | H-17 | |
| 120-19 | H-18 | |
| 120-20 | H | H-30 |
| 120-21 | H-1 | |
| 120-22 | H-2 | |
| 120-23 | H-3 | |
| 120-24 | H-4 | |
| 120-25 | H-5 | |
| 120-26 | H-6 | |
| 120-27 | H-7 | |
| 120-28 | H-8 | |
| 120-29 | H-9 | |
| 120-30 | H-10 | |
| 120-31 | H-11 | |
| 120-32 | H-12 | |
| 120-33 | H-13 | |
| 120-34 | H-14 | |
| 120-35 | H-15 | |
| 120-36 | H-16 | |
| 120-37 | H-17 | |
| 120-38 | H-18 | |

TABLE 121
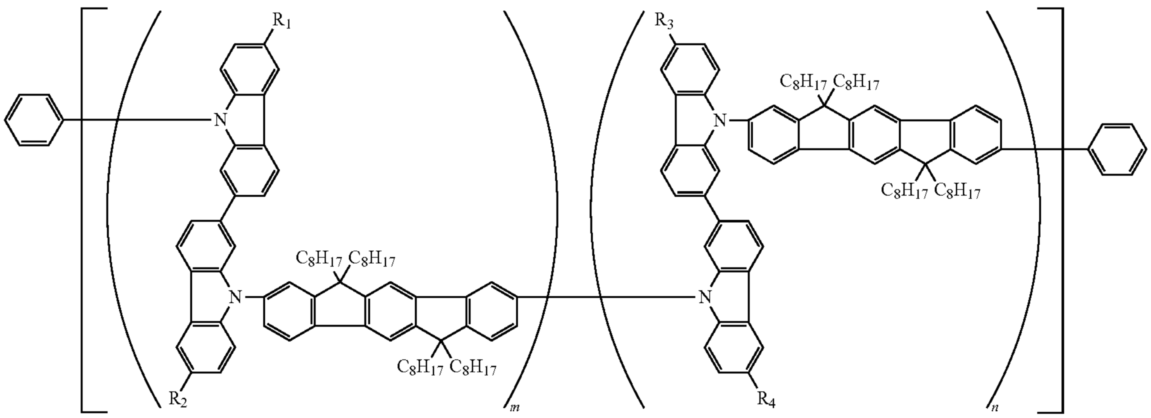
| Com. | R1 = R2 | R3 = R4 |
|---|---|---|
| 121-1 | H | H-29 |
| 121-2 | H-1 | |
| 121-3 | H-2 | |
| 121-4 | H-3 | |
| 121-5 | H-4 | |
| 121-6 | H-5 | |
| 121-7 | H-6 | |
| 121-8 | H-7 | |
| 121-9 | H-8 | |
| 121-10 | H-9 | |
| 121-11 | H-10 | |
| 121-12 | H-11 | |
| 121-13 | H-12 | |
| 121-14 | H-13 | |
| 121-15 | H-14 | |
| 121-16 | H-15 | |
| 121-17 | H-16 | |
| 121-18 | H-17 | |
| 121-19 | H-18 | |
| 121-20 | H | H-30 |
| 121-21 | H-1 | |
| 121-22 | H-2 | |
| 121-23 | H-3 | |
| 121-24 | H-4 | |
| 121-25 | H-5 | |
| 121-26 | H-6 | |
| 121-27 | H-7 | |
| 121-28 | H-8 | |
| 121-29 | H-9 | |
| 121-30 | H-10 | |
| 121-31 | H-11 | |
| 121-32 | H-12 | |
| 121-33 | H-13 | |
| 121-34 | H-14 | |
| 121-35 | H-15 | |
| 121-36 | H-16 | |
| 121-37 | H-17 | |
| 121-38 | H-18 | |

TABLE 122
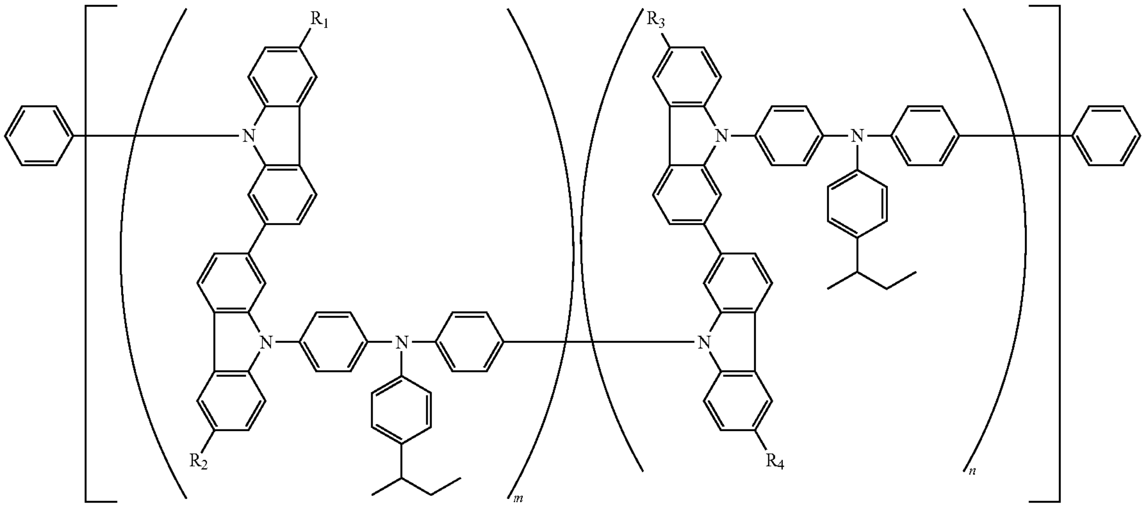
| Com. | R1 = R2 | R3 = R4 |
|---|---|---|
| 122-1 | H | H-29 |
| 122-2 | H-1 | |
| 122-3 | H-2 | |
| 122-4 | H-3 | |
| 122-5 | H-4 | |
| 122-6 | H-5 | |
| 122-7 | H-6 | |
| 122-8 | H-7 | |
| 122-9 | H-8 | |
| 122-10 | H-9 | |
| 122-11 | H-10 | |
| 122-12 | H-11 | |
| 122-13 | H-12 | |
| 122-14 | H-13 | |
| 122-15 | H-14 | |
| 122-16 | H-15 | |
| 122-17 | H-16 | |
| 122-18 | H-17 | |
| 122-19 | H-18 | |
| 122-20 | H | H-30 |
| 122-21 | H-1 | |
| 122-22 | H-2 | |
| 122-23 | H-3 | |
| 122-24 | H-4 | |
| 122-25 | H-5 | |
| 122-26 | H-6 | |
| 122-27 | H-7 | |
| 122-28 | H-8 | |
| 122-29 | H-9 | |
| 122-30 | H-10 | |
| 122-31 | H-11 | |
| 122-32 | H-12 | |
| 122-33 | H-13 | |
| 122-34 | H-14 | |
| 122-35 | H-15 | |
| 122-36 | H-16 | |
| 122-37 | H-17 | |
| 122-38 | H-18 | |

TABLE 123
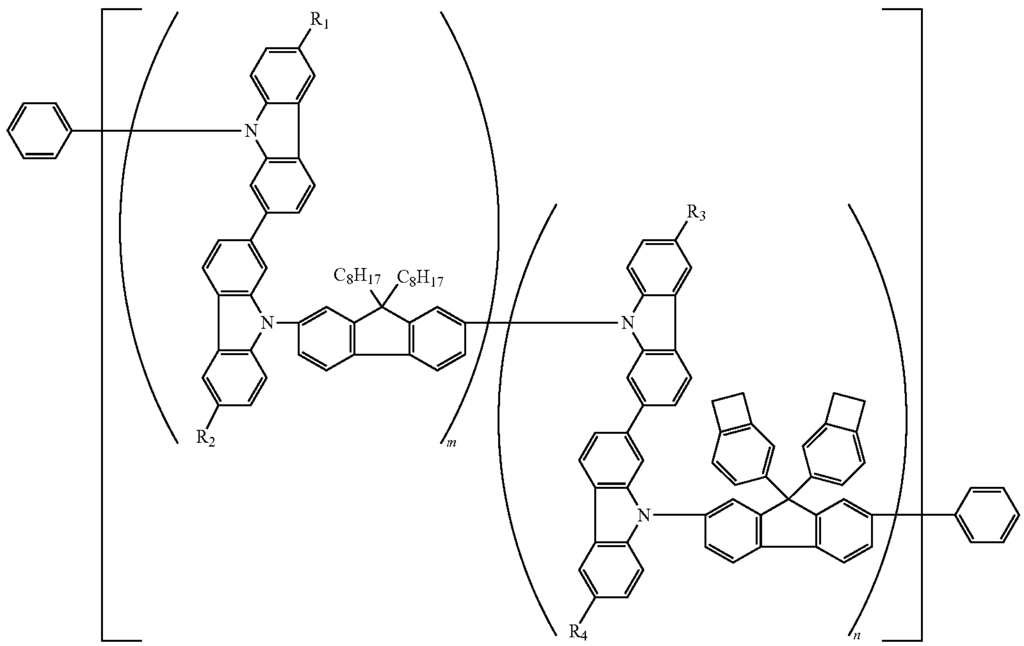
| Com. | R1 = R2 = R3 = R4 |
|---|---|
| 123-1 | H |
| 123-2 | H-1 |
| 123-3 | H-2 |
| 123-4 | H-3 |
| 123-5 | H-4 |
| 123-6 | H-5 |
| 123-7 | H-6 |
| 123-8 | H-7 |
| 123-9 | H-8 |
| 123-10 | H-9 |
| 123-11 | H-10 |
| 123-12 | H-11 |
| 123-13 | H-12 |
| 123-14 | H-13 |
| 123-15 | H-14 |
| 123-16 | H-15 |
| 123-17 | H-16 |
| 123-18 | H-17 |
| 123-19 | H-18 |

TABLE 124
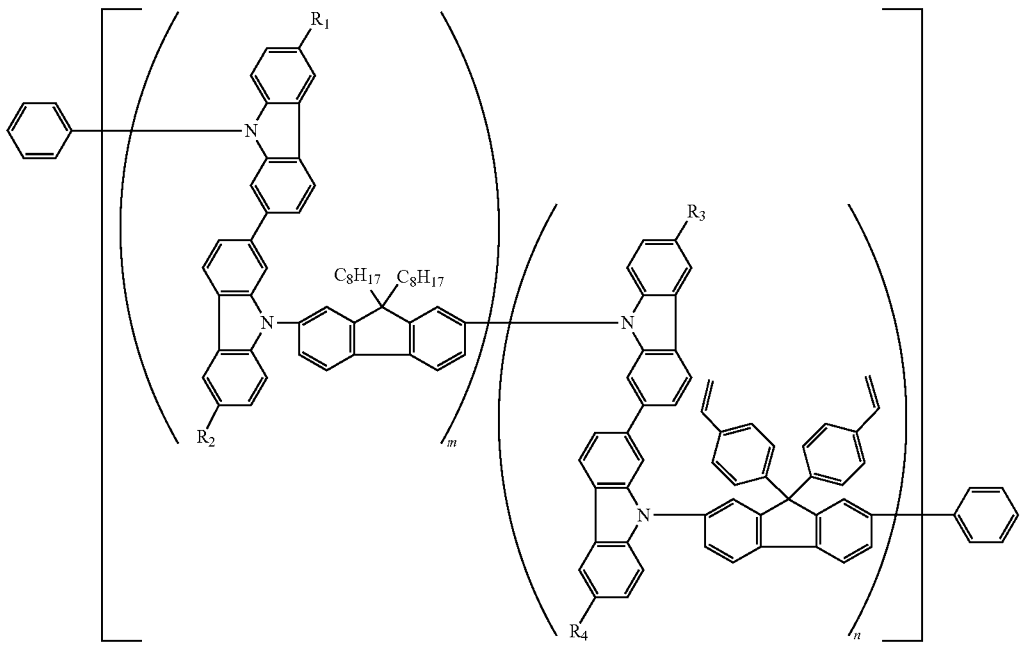
| Com. | R1 = R2 = R3 = R4 |
|---|---|
| 124-1 | H |
| 124-2 | H-1 |
| 124-3 | H-2 |
| 124-4 | H-3 |
| 124-5 | H-4 |
| 124-6 | H-5 |
| 124-7 | H-6 |
| 124-8 | H-7 |
| 124-9 | H-8 |
| 124-10 | H-9 |
| 124-11 | H-10 |
| 124-12 | H-11 |
| 124-13 | H-12 |
| 124-14 | H-13 |
| 124-15 | H-14 |
| 124-16 | H-15 |
| 124-17 | H-16 |
| 124-18 | H-17 |
| 124-19 | H-18 |

TABLE 125
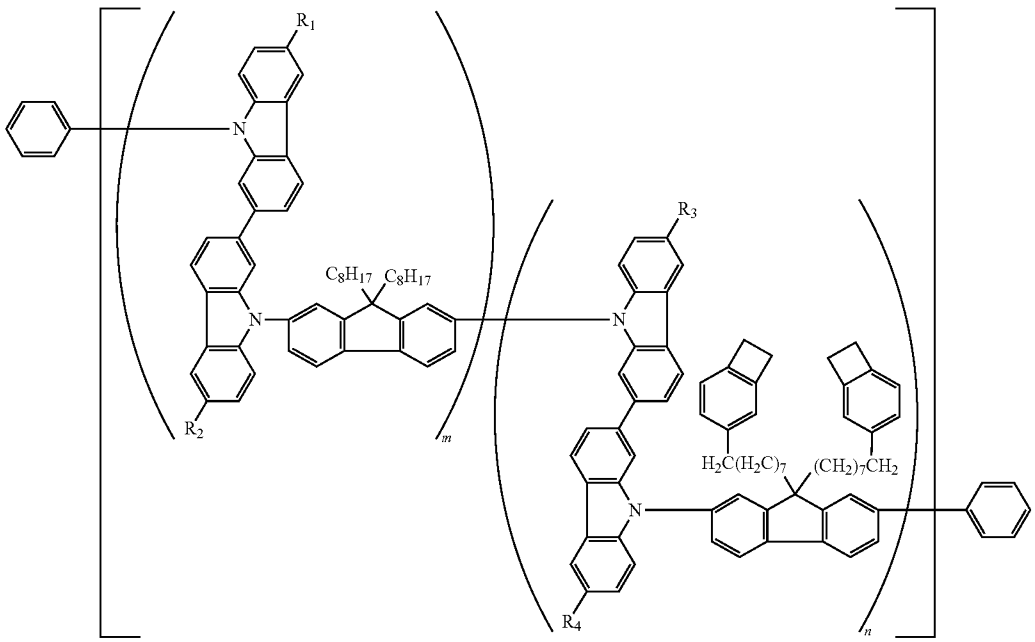
| Com. | R1 = R2 = R3 = R4 |
|---|---|
| 125-1 | H |
| 125-2 | H-1 |
| 125-3 | H-2 |
| 125-4 | H-3 |
| 125-5 | H-4 |
| 125-6 | H-5 |
| 125-7 | H-6 |
| 125-8 | H-7 |
| 125-9 | H-8 |
| 125-10 | H-9 |
| 125-11 | H-10 |
| 125-12 | H-11 |
| 125-13 | H-12 |
| 125-14 | H-13 |
| 125-15 | H-14 |
| 125-16 | H-15 |
| 125-17 | H-16 |
| 125-18 | H-17 |
| 125-19 | H-18 |

TABLE 126
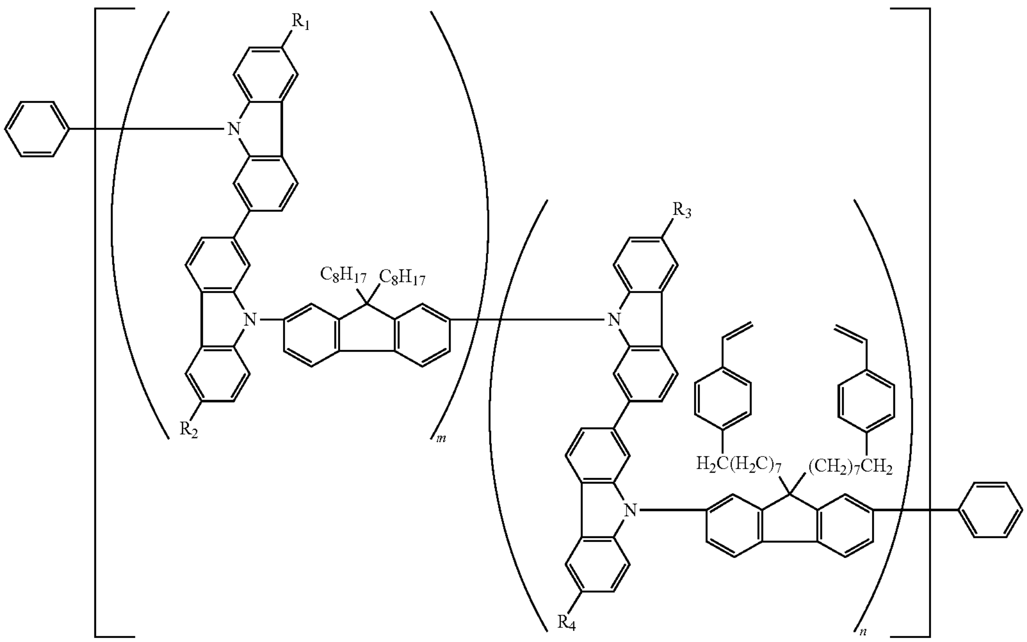
| Com. | R1 = R2 = R3 = R4 |
|---|---|
| 126-1 | H |
| 126-2 | H-1 |
| 126-3 | H-2 |
| 126-4 | H-3 |
| 126-5 | H-4 |
| 126-6 | H-5 |
| 126-7 | H-6 |
| 126-8 | H-7 |
| 126-9 | H-8 |
| 126-10 | H-9 |
| 126-11 | H-10 |
| 126-12 | H-11 |
| 126-13 | H-12 |
| 126-14 | H-13 |
| 126-15 | H-14 |
| 126-16 | H-15 |
| 126-17 | H-16 |
| 126-18 | H-17 |
| 126-19 | H-18 |

TABLE 127
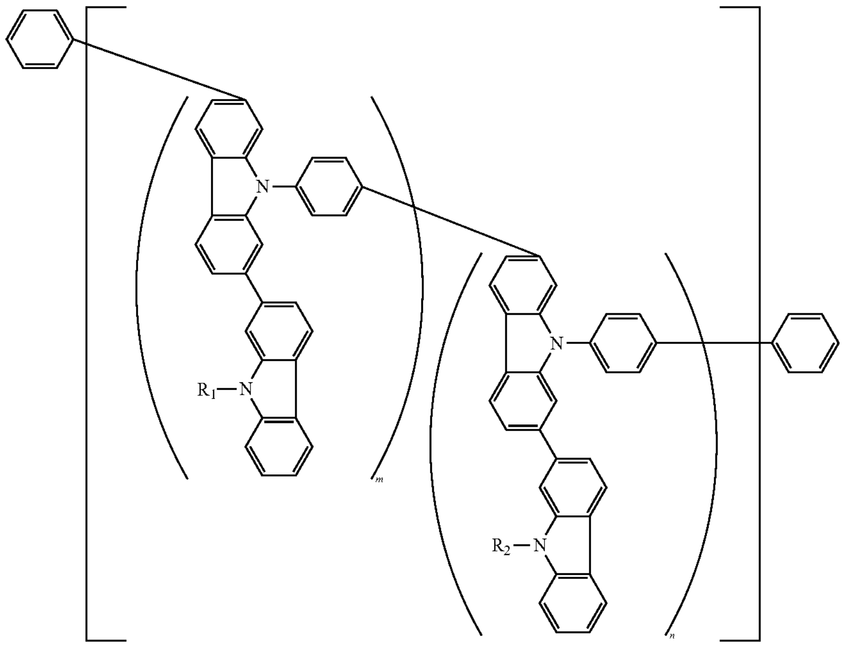
| Com. | R1 | R2 |
|---|---|---|
| 127-1 | H-1 | H-29 |
| 127-2 | H-2 | |
| 127-3 | H-3 | |
| 127-4 | H-4 | |
| 127-5 | H-5 | |
| 127-6 | H-6 | |
| 127-7 | H-7 | |
| 127-8 | H-8 | |
| 127-9 | H-9 | |
| 127-10 | H-10 | |
| 127-11 | H-11 | |
| 127-12 | H-12 | |
| 127-13 | H-13 | |
| 127-14 | H-14 | |
| 127-15 | H-15 | |
| 127-16 | H-16 | |
| 127-17 | H-17 | |
| 127-18 | H-18 | |
| 127-19 | H-1 | H-30 |
| 127-20 | H-2 | |
| 127-21 | H-3 | |
| 127-22 | H-4 | |
| 127-23 | H-5 | |
| 127-24 | H-6 | |
| 127-25 | H-7 | |
| 127-26 | H-8 | |
| 127-27 | H-9 | |
| 127-28 | H-10 | |
| 127-29 | H-11 | |
| 127-30 | H-12 | |
| 127-31 | H-13 | |
| 127-32 | H-14 | |
| 127-33 | H-15 | |
| 127-34 | H-16 | |
| 127-35 | H-17 | |
| 127-36 | H-18 | |

TABLE 128
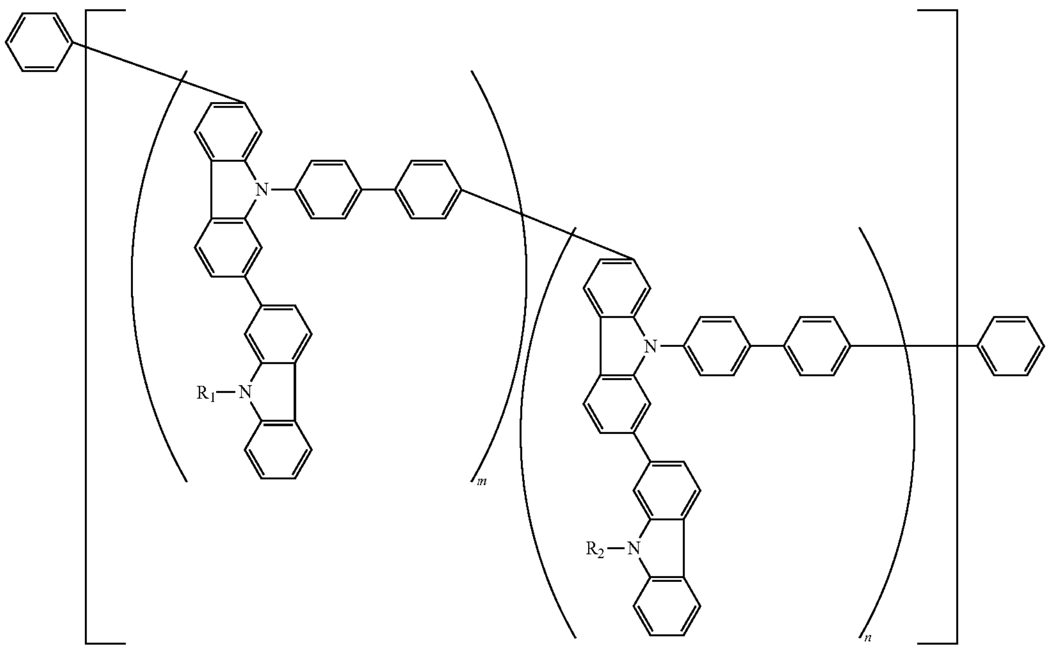
| Com. | R1 | R2 |
|---|---|---|
| 128-1 | H-1 | H-29 |
| 128-2 | H-2 | |
| 128-3 | H-3 | |
| 128-4 | H-4 | |
| 128-5 | H-5 | |
| 128-6 | H-6 | |
| 128-7 | H-7 | |
| 128-8 | H-8 | |
| 128-9 | H-9 | |
| 128-10 | H-10 | |
| 128-11 | H-11 | |
| 128-12 | H-12 | |
| 128-13 | H-13 | |
| 128-14 | H-14 | |
| 128-15 | H-15 | |
| 128-16 | H-16 | |
| 128-17 | H-17 | |
| 128-18 | H-18 | |
| 128-19 | H-1 | H-30 |
| 128-20 | H-2 | |
| 128-21 | H-3 | |
| 128-22 | H-4 | |
| 128-23 | H-5 | |
| 128-24 | H-6 | |
| 128-25 | H-7 | |
| 128-26 | H-8 | |
| 128-27 | H-9 | |
| 128-28 | H-10 | |
| 128-29 | H-11 | |
| 128-30 | H-12 | |
| 128-31 | H-13 | |
| 128-32 | H-14 | |
| 128-33 | H-15 | |
| 128-34 | H-16 | |
| 128-35 | H-17 | |
| 128-36 | H-18 | |

TABLE 129
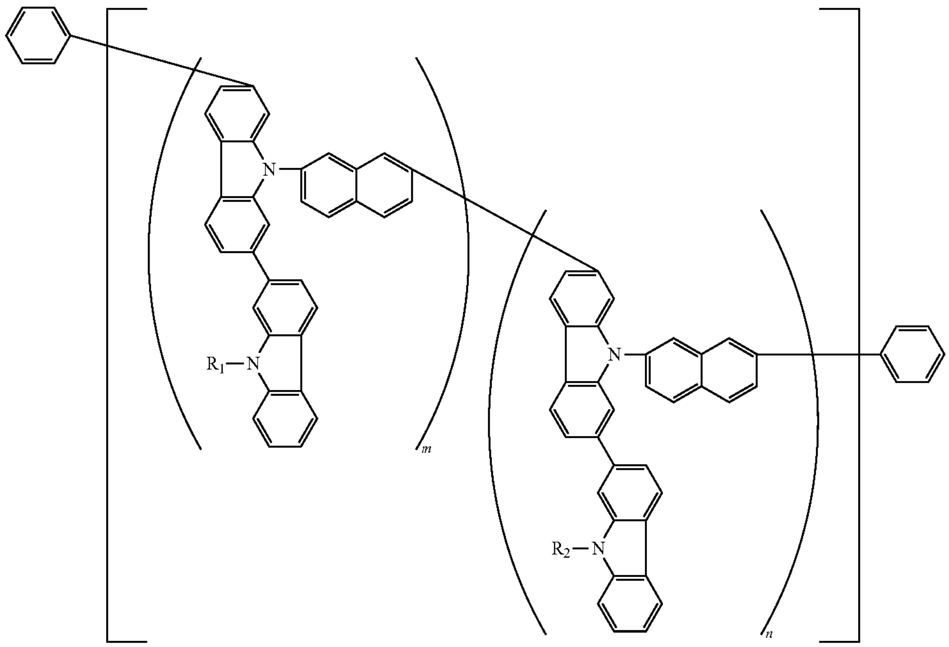
| Com. | R1 | R2 |
|---|---|---|
| 129-1 | H-1 | H-29 |
| 129-2 | H-2 | |
| 129-3 | H-3 | |
| 129-4 | H-4 | |
| 129-5 | H-5 | |
| 129-6 | H-6 | |
| 129-7 | H-7 | |
| 129-8 | H-8 | |
| 129-9 | H-9 | |
| 129-10 | H-10 | |
| 129-11 | H-11 | |
| 129-12 | H-12 | |
| 129-13 | H-13 | |
| 129-14 | H-14 | |
| 129-15 | H-15 | |
| 129-16 | H-16 | |
| 129-17 | H-17 | |
| 129-18 | H-18 | |
| 129-19 | H-1 | H-30 |
| 129-20 | H-2 | |
| 129-21 | H-3 | |
| 129-22 | H-4 | |
| 129-23 | H-5 | |
| 129-24 | H-6 | |
| 129-25 | H-7 | |
| 129-26 | H-8 | |
| 129-27 | H-9 | |
| 129-28 | H-10 | |
| 129-29 | H-11 | |
| 129-30 | H-12 | |
| 129-31 | H-13 | |
| 129-32 | H-14 | |
| 129-33 | H-15 | |
| 129-34 | H-16 | |
| 129-35 | H-17 | |
| 129-36 | H-18 | |

TABLE 130
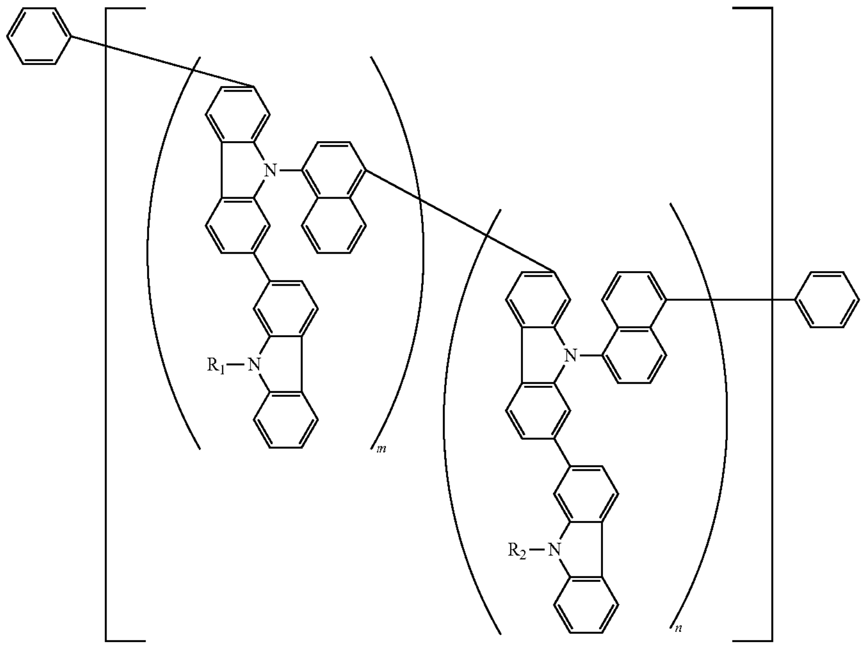
| Com. | R1 | R2 |
|---|---|---|
| 130-1 | H-1 | H-29 |
| 130-2 | H-2 | |
| 130-3 | H-3 | |
| 130-4 | H-4 | |
| 130-5 | H-5 | |
| 130-6 | H-6 | |
| 130-7 | H-7 | |
| 130-8 | H-8 | |
| 130-9 | H-9 | |
| 130-10 | H-10 | |
| 130-11 | H-11 | |
| 130-12 | H-12 | |
| 130-13 | H-13 | |
| 130-14 | H-14 | |
| 130-15 | H-15 | |
| 130-16 | H-16 | |
| 130-17 | H-17 | |
| 130-18 | H-18 | |
| 130-19 | H-1 | H-30 |
| 130-20 | H-2 | |
| 130-21 | H-3 | |
| 130-22 | H-4 | |
| 130-23 | H-5 | |
| 130-24 | H-6 | |
| 130-25 | H-7 | |
| 130-26 | H-8 | |
| 130-27 | H-9 | |
| 130-28 | H-10 | |
| 130-29 | H-11 | |
| 130-30 | H-12 | |
| 130-31 | H-13 | |
| 130-32 | H-14 | |
| 130-33 | H-15 | |
| 130-34 | H-16 | |
| 130-35 | H-17 | |
| 130-36 | H-18 | |

TABLE 131
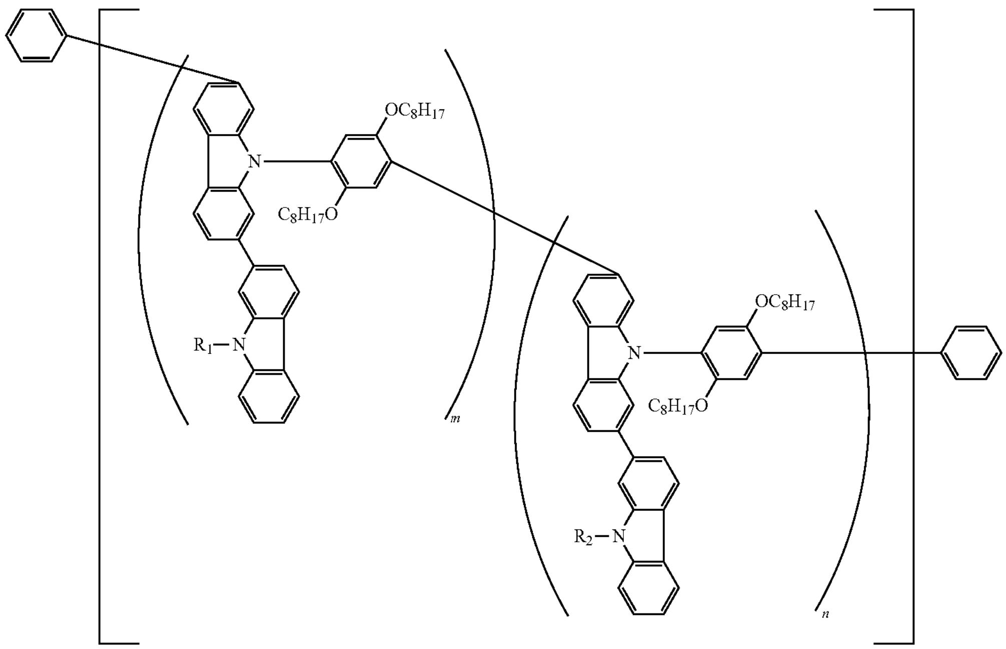
| Com. | R1 | R2 |
|---|---|---|
| 131-1 | H-1 | H-29 |
| 131-2 | H-2 | |
| 131-3 | H-3 | |
| 131-4 | H-4 | |
| 131-5 | H-5 | |
| 131-6 | H-6 | |
| 131-7 | H-7 | |
| 131-8 | H-8 | |
| 131-9 | H-9 | |
| 131-10 | H-10 | |
| 131-11 | H-11 | |
| 131-12 | H-12 | |
| 131-13 | H-13 | |
| 131-14 | H-14 | |
| 131-15 | H-15 | |
| 131-16 | H-16 | |
| 131-17 | H-17 | |
| 131-18 | H-18 | |
| 131-19 | H-1 | H-30 |
| 131-20 | H-2 | |
| 131-21 | H-3 | |
| 131-22 | H-4 | |
| 131-23 | H-5 | |
| 131-24 | H-6 | |
| 131-25 | H-7 | |
| 131-26 | H-8 | |
| 131-27 | H-9 | |
| 131-28 | H-10 | |
| 131-29 | H-11 | |
| 131-30 | H-12 | |
| 131-31 | H-13 | |
| 131-32 | H-14 | |
| 131-33 | H-15 | |
| 131-34 | H-16 | |
| 131-35 | H-17 | |
| 131-36 | H-18 | |

TABLE 132
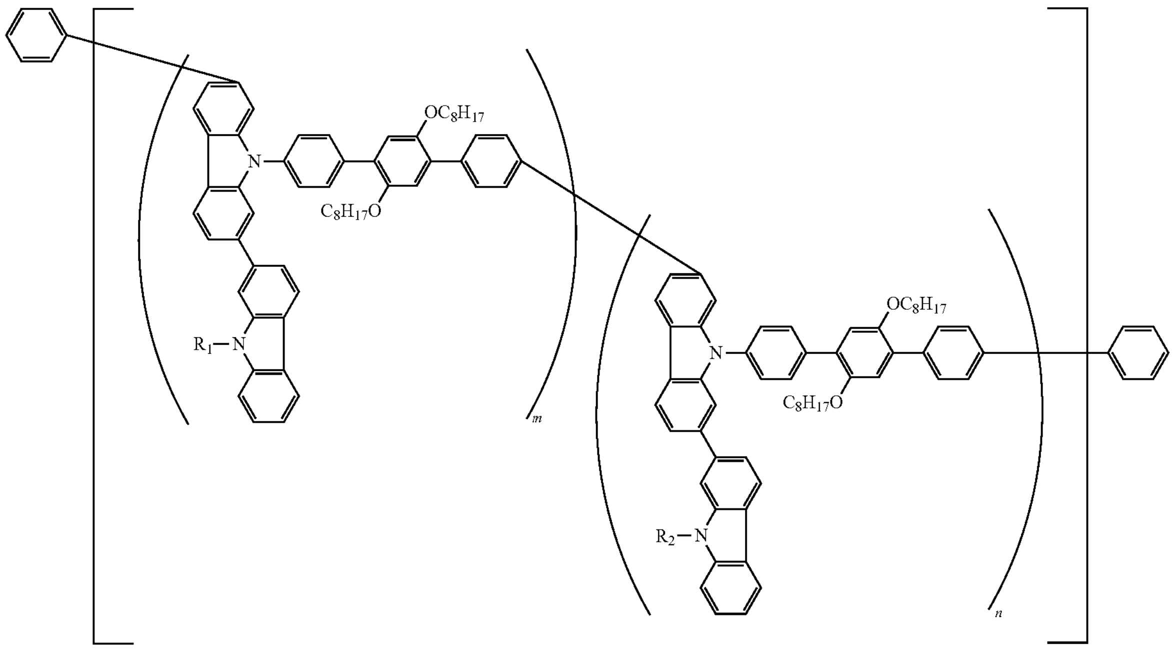
| Com. | R1 | R2 |
|---|---|---|
| 132-1 | H-1 | H-29 |
| 132-2 | H-2 | |
| 132-3 | H-3 | |
| 132-4 | H-4 | |
| 132-5 | H-5 | |
| 132-6 | H-6 | |
| 132-7 | H-7 | |
| 132-8 | H-8 | |
| 132-9 | H-9 | |
| 132-10 | H-10 | |
| 132-11 | H-11 | |
| 132-12 | H-12 | |
| 132-13 | H-13 | |
| 132-14 | H-14 | |
| 132-15 | H-15 | |
| 132-16 | H-16 | |
| 132-17 | H-17 | |
| 132-18 | H-18 | |
| 132-19 | H-1 | H-30 |
| 132-20 | H-2 | |
| 132-21 | H-3 | |
| 132-22 | H-4 | |
| 132-23 | H-5 | |
| 132-24 | H-6 | |
| 132-25 | H-7 | |
| 132-26 | H-8 | |
| 132-27 | H-9 | |
| 132-28 | H-10 | |
| 132-29 | H-11 | |
| 132-30 | H-12 | |
| 132-31 | H-13 | |
| 132-32 | H-14 | |
| 132-33 | H-15 | |
| 132-34 | H-16 | |
| 132-35 | H-17 | |
| 132-36 | H-18 | |

TABLE 133
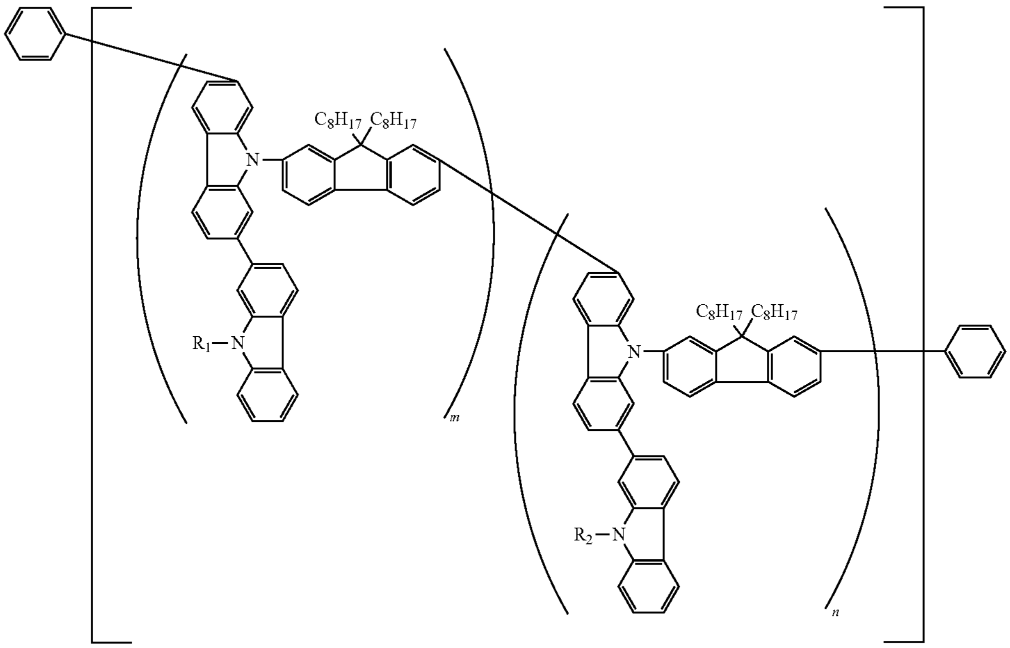
| Com. | R1 | R2 |
|---|---|---|
| 133-1 | H-1 | H-29 |
| 133-2 | H-2 | |
| 133-3 | H-3 | |
| 133-4 | H-4 | |
| 133-5 | H-5 | |
| 133-6 | H-6 | |
| 133-7 | H-7 | |
| 133-8 | H-8 | |
| 133-9 | H-9 | |
| 133-10 | H-10 | |
| 133-11 | H-11 | |
| 133-12 | H-12 | |
| 133-13 | H-13 | |
| 133-14 | H-14 | |
| 133-15 | H-15 | |
| 133-16 | H-16 | |
| 133-17 | H-17 | |
| 133-18 | H-18 | |
| 133-19 | H-1 | H-30 |
| 133-20 | H-2 | |
| 133-21 | H-3 | |
| 133-22 | H-4 | |
| 133-23 | H-5 | |
| 133-24 | H-6 | |
| 133-25 | H-7 | |
| 133-26 | H-8 | |
| 133-27 | H-9 | |
| 133-28 | H-10 | |
| 133-29 | H-11 | |
| 133-30 | H-12 | |
| 133-31 | H-13 | |
| 133-32 | H-14 | |
| 133-33 | H-15 | |
| 133-34 | H-16 | |
| 133-35 | H-17 | |
| 133-36 | H-18 | |

TABLE 134
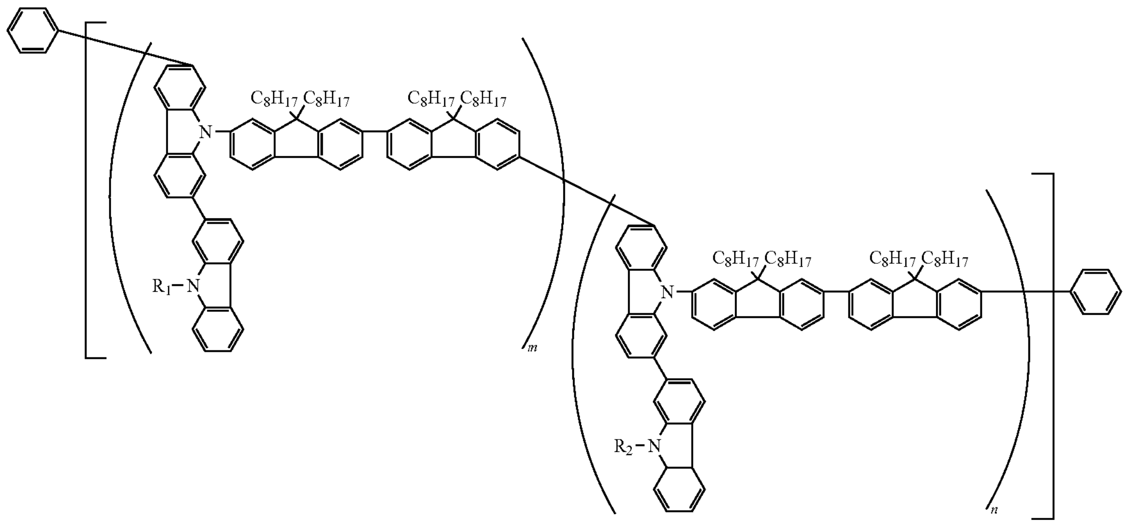
| Com. | R1 | R2 |
|---|---|---|
| 134-1 | H-1 | H-29 |
| 134-2 | H-2 | |
| 134-3 | H-3 | |
| 134-4 | H-4 | |
| 134-5 | H-5 | |
| 134-6 | H-6 | |
| 134-7 | H-7 | |
| 134-8 | H-8 | |
| 134-9 | H-9 | |
| 134-10 | H-10 | |
| 134-11 | H-11 | |
| 134-12 | H-12 | |
| 134-13 | H-13 | |
| 134-14 | H-14 | |
| 134-15 | H-15 | |
| 134-16 | H-16 | |
| 134-17 | H-17 | |
| 134-18 | H-18 | |
| 134-19 | H-1 | H-30 |
| 134-20 | H-2 | |
| 134-21 | H-3 | |
| 134-22 | H-4 | |
| 134-23 | H-5 | |
| 134-24 | H-6 | |
| 134-25 | H-7 | |
| 134-26 | H-8 | |
| 134-27 | H-9 | |
| 134-28 | H-10 | |
| 134-29 | H-11 | |
| 134-30 | H-12 | |
| 134-31 | H-13 | |
| 134-32 | H-14 | |
| 134-33 | H-15 | |
| 134-34 | H-16 | |
| 134-35 | H-17 | |
| 134-36 | H-18 | |

TABLE 135
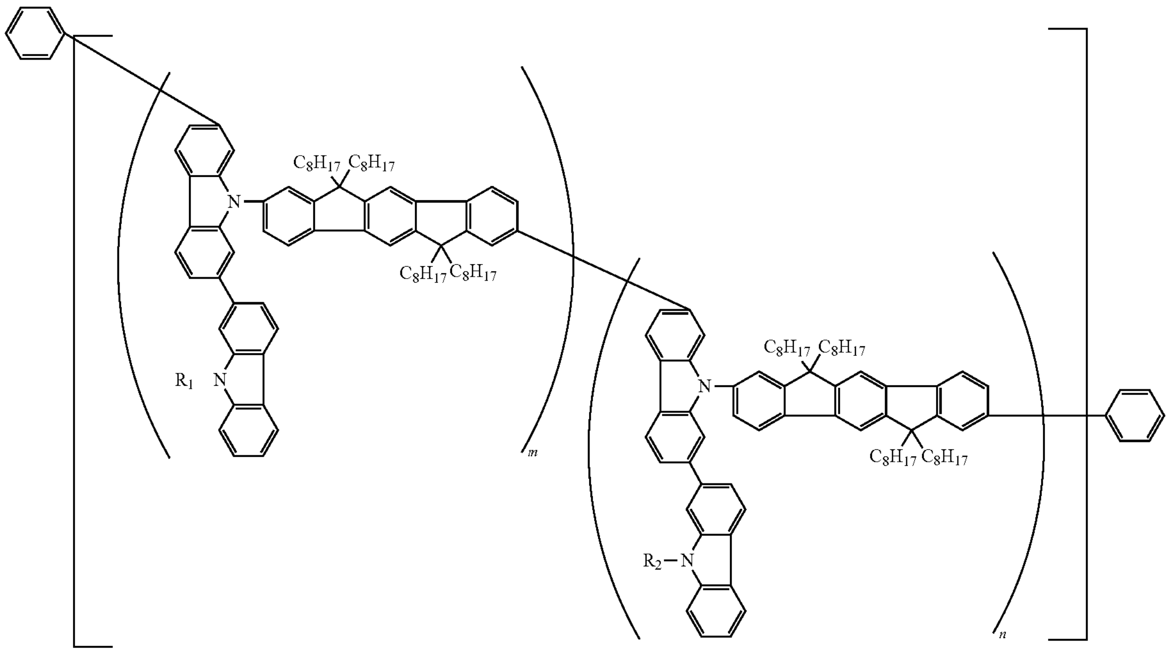
| Com. | R1 | R2 |
|---|---|---|
| 135-1 | H-1 | H-29 |
| 135-2 | H-2 | |
| 135-3 | H-3 | |
| 135-4 | H-4 | |
| 135-5 | H-5 | |
| 135-6 | H-6 | |
| 135-7 | H-7 | |
| 135-8 | H-8 | |
| 135-9 | H-9 | |
| 135-10 | H-10 | |
| 135-11 | H-11 | |
| 135-12 | H-12 | |
| 135-13 | H-13 | |
| 135-14 | H-14 | |
| 135-15 | H-15 | |
| 135-16 | H-16 | |
| 135-17 | H-17 | |
| 135-18 | H-18 | |
| 135-19 | H-1 | H-30 |
| 135-20 | H-2 | |
| 135-21 | H-3 | |
| 135-22 | H-4 | |
| 135-23 | H-5 | |
| 135-24 | H-6 | |
| 135-25 | H-7 | |
| 135-26 | H-8 | |
| 135-27 | H-9 | |
| 135-28 | H-10 | |
| 135-29 | H-11 | |
| 135-30 | H-12 | |
| 135-31 | H-13 | |
| 135-32 | H-14 | |
| 135-33 | H-15 | |
| 135-34 | H-16 | |
| 135-35 | H-17 | |
| 135-36 | H-18 | |

TABLE 136
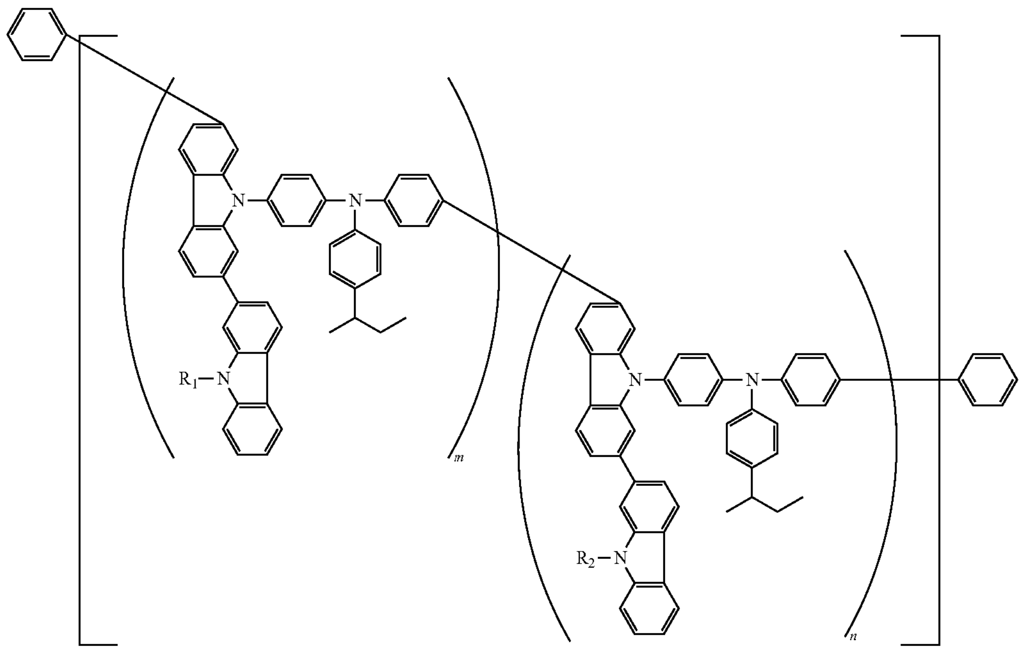
| Com. | R1 | R2 |
|---|---|---|
| 136-1 | H-1 | H-29 |
| 136-2 | H-2 | |
| 136-3 | H-3 | |
| 136-4 | H-4 | |
| 136-5 | H-5 | |
| 136-6 | H-6 | |
| 136-7 | H-7 | |
| 136-8 | H-8 | |
| 136-9 | H-9 | |
| 136-10 | H-10 | |
| 136-11 | H-11 | |
| 136-12 | H-12 | |
| 136-13 | H-13 | |
| 136-14 | H-14 | |
| 136-15 | H-15 | |
| 136-16 | H-16 | |
| 136-17 | H-17 | |
| 136-18 | H-18 | |
| 136-19 | H-1 | H-30 |
| 136-20 | H-2 | |
| 136-21 | H-3 | |
| 136-22 | H-4 | |
| 136-23 | H-5 | |
| 136-24 | H-6 | |
| 136-25 | H-7 | |
| 136-26 | H-8 | |
| 136-27 | H-9 | |
| 136-28 | H-10 | |
| 136-29 | H-11 | |
| 136-30 | H-12 | |
| 136-31 | H-13 | |
| 136-32 | H-14 | |
| 136-33 | H-15 | |
| 136-34 | H-16 | |
| 136-35 | H-17 | |
| 136-36 | H-18 | |

TABLE 137
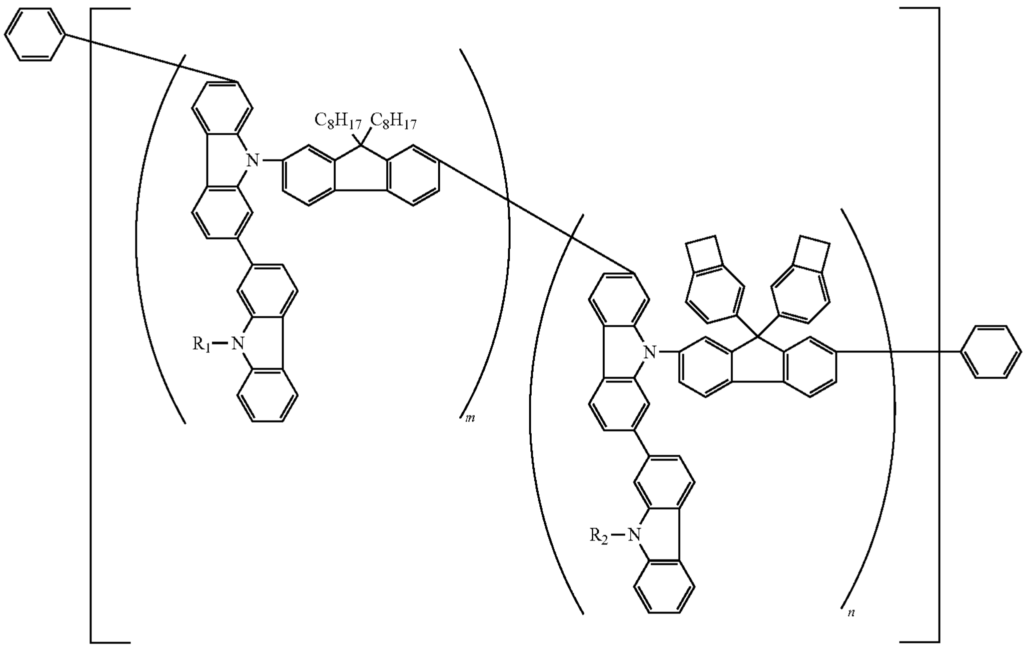
| Com. | R1 = R2 |
|---|---|
| 137-1 | H-1 |
| 137-2 | H-2 |
| 137-3 | H-3 |
| 137-4 | H-4 |
| 137-5 | H-5 |
| 137-6 | H-6 |
| 137-7 | H-7 |
| 137-8 | H-8 |
| 137-9 | H-9 |
| 137-10 | H-10 |
| 137-11 | H-11 |
| 137-12 | H-12 |
| 137-13 | H-13 |
| 137-14 | H-14 |
| 137-15 | H-15 |
| 137-16 | H-16 |
| 137-17 | H-17 |
| 137-18 | H-18 |

TABLE 138
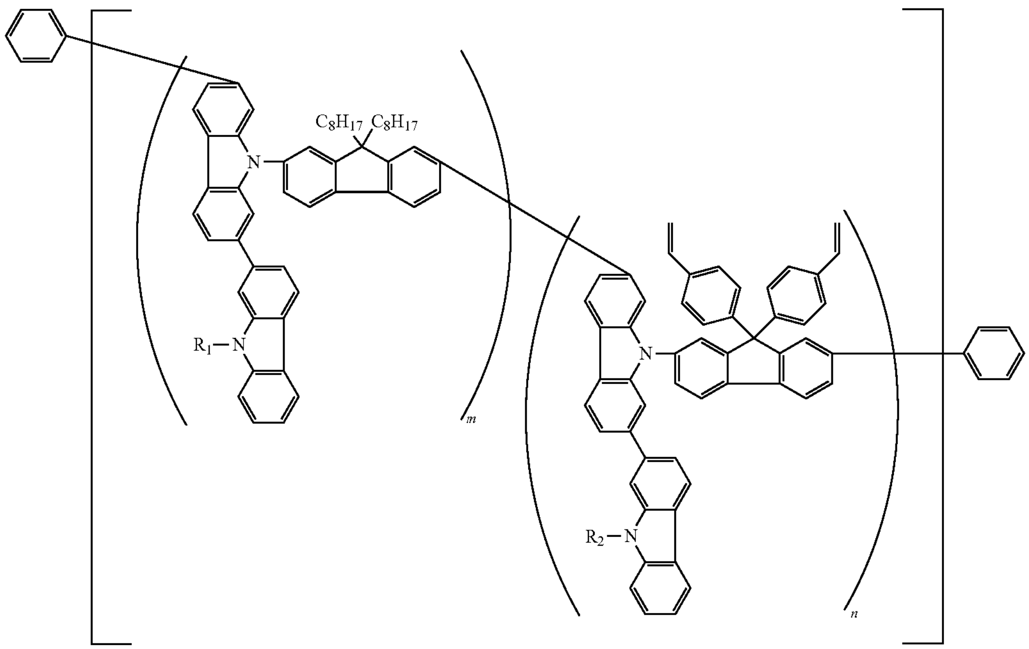
| Com. | R1 = R2 |
|---|---|
| 138-1 | H-1 |
| 138-2 | H-2 |
| 138-3 | H-3 |
| 138-4 | H-4 |
| 138-5 | H-5 |
| 138-6 | H-6 |
| 138-7 | H-7 |
| 138-8 | H-8 |
| 138-9 | H-9 |
| 138-10 | H-10 |
| 138-11 | H-11 |
| 138-12 | H-12 |
| 138-13 | H-13 |
| 138-14 | H-14 |
| 138-15 | H-15 |
| 138-16 | H-16 |
| 138-17 | H-17 |
| 138-18 | H-18 |

TABLE 139
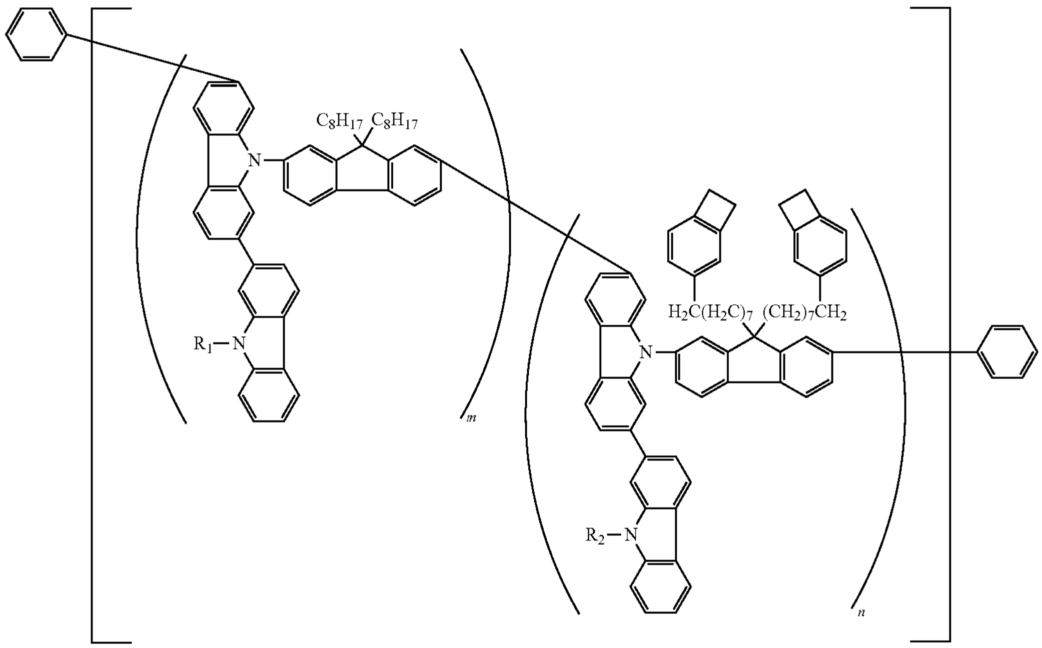
| Com. | R1 = R2 |
|---|---|
| 139-1 | H-1 |
| 139-2 | H-2 |
| 139-3 | H-3 |
| 139-4 | H-4 |
| 139-5 | H-5 |
| 139-6 | H-6 |
| 139-7 | H-7 |
| 139-8 | H-8 |
| 139-9 | H-9 |
| 139-10 | H-10 |
| 139-11 | H-11 |
| 139-12 | H-12 |
| 139-13 | H-13 |
| 139-14 | H-14 |
| 139-15 | H-15 |
| 139-16 | H-16 |
| 139-17 | H-17 |
| 139-18 | H-18 |

TABLE 140
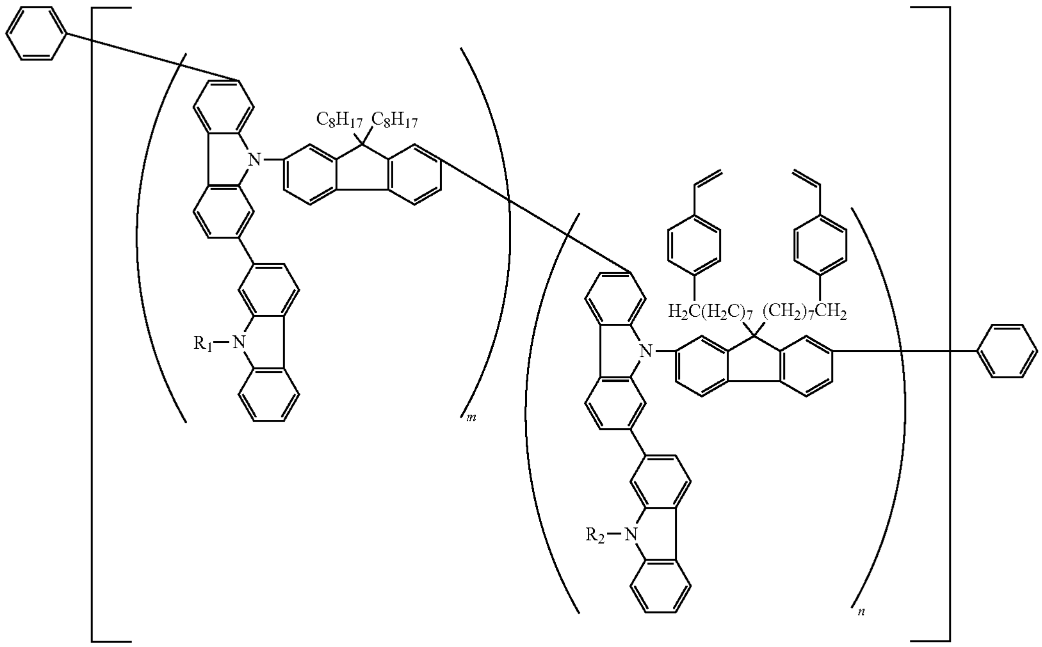
| Com. | R1 = R2 |
|---|---|
| 140-1 | H-1 |
| 140-2 | H-2 |
| 140-3 | H-3 |
| 140-4 | H-4 |
| 140-5 | H-5 |
| 140-6 | H-6 |
| 140-7 | H-7 |
| 140-8 | H-8 |
| 140-9 | H-9 |
| 140-10 | H-10 |
| 140-11 | H-11 |
| 140-12 | H-12 |
| 140-13 | H-13 |
| 140-14 | H-14 |
| 140-15 | H-15 |
| 140-16 | H-16 |
| 140-17 | H-17 |
| 140-18 | H-18 |
TABLE 141
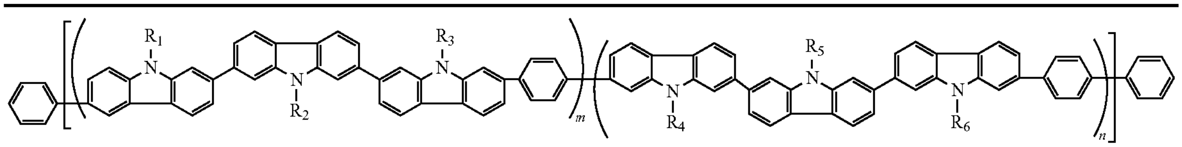
| Com. | R1 = R3 = R4 = R6 | R2 | R5 |
|---|---|---|---|
| 141-1 | H-1 | H-1 | H-29 |
| 141-2 | H-2 | | |
| 141-3 | H-3 | | |
| 141-4 | H-4 | | |
| 141-5 | H-5 | | |
| 141-6 | H-6 | | |
| 141-7 | H-7 | | |
| 141-8 | H-8 | | |
| 141-9 | H-9 | | |
| 141-10 | H-10 | | |
| 141-11 | H-11 | | |
| 141-12 | H-12 | | |
| 141-13 | H-13 | | |
| 141-14 | H-14 | | |

TABLE 141-continued
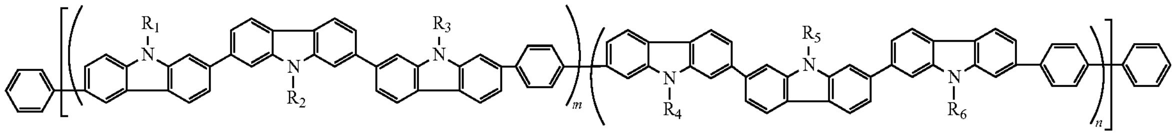
| Com. | R1 = R3 = R4 = R6 | R2 | R5 |
|---|---|---|---|
| 141-15 | H-15 | | |
| 141-16 | H-16 | | |
| 141-17 | H-17 | | |
| 141-18 | H-18 | | |
| 141-19 | H-1 | H-1 | H-30 |
| 141-20 | H-2 | | |
| 141-21 | H-3 | | |
| 141-22 | H-4 | | |
| 141-23 | H-5 | | |
| 141-24 | H-6 | | |
| 141-25 | H-7 | | |
| 141-26 | H-8 | | |
| 141-27 | H-9 | | |
| 141-28 | H-10 | | |
| 141-29 | H-11 | | |
| 141-30 | H-12 | | |
| 141-31 | H-13 | | |
| 141-32 | H-14 | | |
| 141-33 | H-15 | | |
| 141-34 | H-16 | | |
| 141-35 | H-17 | | |
| 141-36 | H-18 | | |
TABLE 142
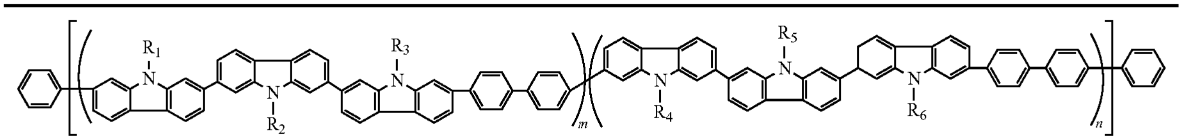
| Com. | R1 = R3 = R4 = R6 | R2 | R5 |
|---|---|---|---|
| 142-1 | H-1 | H-1 | H-29 |
| 142-2 | H-2 | | |
| 142-3 | H-3 | | |
| 142-4 | H-4 | | |
| 142-5 | H-5 | | |
| 142-6 | H-6 | | |
| 142-7 | H-7 | | |
| 142-8 | H-8 | | |
| 142-9 | H-9 | | |
| 142-10 | H-10 | | |
| 142-11 | H-11 | | |
| 142-12 | H-12 | | |
| 142-13 | H-13 | | |
| 142-14 | H-14 | | |
| 142-15 | H-15 | | |
| 142-16 | H-16 | | |
| 142-17 | H-17 | | |
| 142-18 | H-18 | | |
| 142-19 | H-1 | H-1 | H-30 |
| 142-20 | H-2 | | |
| 142-21 | H-3 | | |
| 142-22 | H-4 | | |
| 142-23 | H-5 | | |
| 142-24 | H-6 | | |
| 142-25 | H-7 | | |
| 142-26 | H-8 | | |
| 142-27 | H-9 | | |
| 142-28 | H-10 | | |
| 142-29 | H-11 | | |
| 142-30 | H-12 | | |
| 142-31 | H-13 | | |
| 142-32 | H-14 | | |
| 142-33 | H-15 | | |
| 142-34 | H-16 | | |

TABLE 142-continued
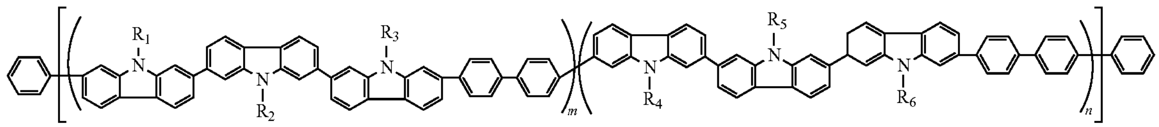
| Com. | R1 = R3 = R4 = R6 | R2 | R5 |
|---|---|---|---|
| 142-35 | H-17 | | |
| 142-36 | H-18 | | |
TABLE 143
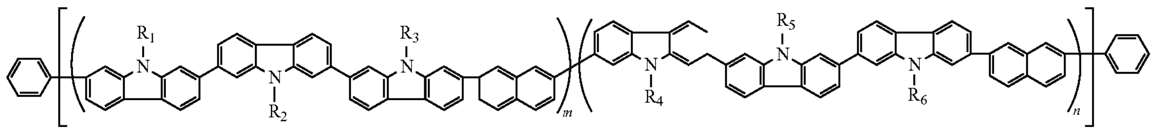
| Com. | R1 = R3 = R4 = R6 | R2 | R5 |
|---|---|---|---|
| 143-1 | H-1 | H-1 | H-29 |
| 143-2 | H-2 | | |
| 143-3 | H-3 | | |
| 143-4 | H-4 | | |
| 143-5 | H-5 | | |
| 143-6 | H-6 | | |
| 143-7 | H-7 | | |
| 143-8 | H-8 | | |
| 143-9 | H-9 | | |
| 143-10 | H-10 | | |
| 143-11 | H-11 | | |
| 143-12 | H-12 | | |
| 143-13 | H-13 | | |
| 143-14 | H-14 | | |
| 143-15 | H-15 | | |
| 143-16 | H-16 | | |
| 143-17 | H-17 | | |
| 143-18 | H-18 | | |
| 143-19 | H-1 | H-1 | H-30 |
| 143-20 | H-2 | | |
| 143-21 | H-3 | | |
| 143-22 | H-4 | | |
| 143-23 | H-5 | | |
| 143-24 | H-6 | | |
| 143-25 | H-7 | | |
| 143-26 | H-8 | | |
| 143-27 | H-9 | | |
| 143-28 | H-10 | | |
| 143-29 | H-11 | | |
| 143-30 | H-12 | | |
| 143-31 | H-13 | | |
| 143-32 | H-14 | | |
| 143-33 | H-15 | | |
| 143-34 | H-16 | | |
| 143-35 | H-17 | | |
| 143-36 | H-18 | | |
TABLE 144
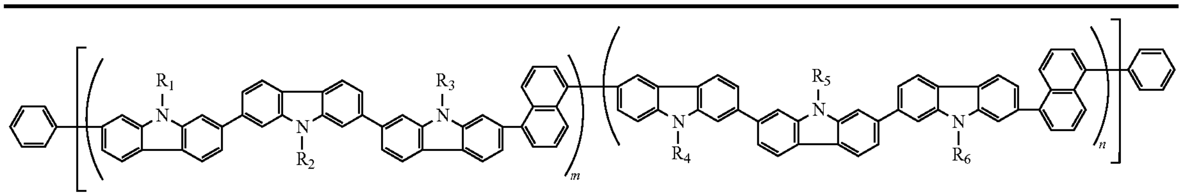
| Com. | R1 = R3 = R4 = R6 | R2 | R5 |
|---|---|---|---|
| 144-1 | H-1 | H-1 | H-29 |
| 144-2 | H-2 | | |

TABLE 144-continued
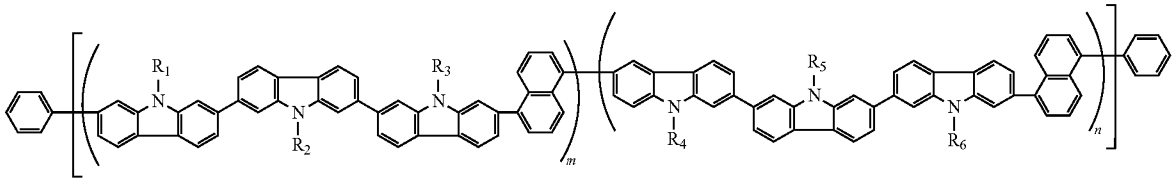
| Com. | R1 = R3 = R4 = R6 | R2 | R5 |
|---|---|---|---|
| 144-3 | H-3 | | |
| 144-4 | H-4 | | |
| 144-5 | H-5 | | |
| 144-6 | H-6 | | |
| 144-7 | H-7 | | |
| 144-8 | H-8 | | |
| 144-9 | H-9 | | |
| 144-10 | H-10 | | |
| 144-11 | H-11 | | |
| 144-12 | H-12 | | |
| 144-13 | H-13 | | |
| 144-14 | H-14 | | |
| 144-15 | H-15 | | |
| 144-16 | H-16 | | |
| 144-17 | H-17 | | |
| 144-18 | H-18 | | |
| 144-19 | H-1 | H-1 | H-30 |
| 144-20 | H-2 | | |
| 144-21 | H-3 | | |
| 144-22 | H-4 | | |
| 144-23 | H-5 | | |
| 144-24 | H-6 | | |
| 144-25 | H-7 | | |
| 144-26 | H-8 | | |
| 144-27 | H-9 | | |
| 144-28 | H-10 | | |
| 144-29 | H-11 | | |
| 144-30 | H-12 | | |
| 144-31 | H-13 | | |
| 144-32 | H-14 | | |
| 144-33 | H-15 | | |
| 144-34 | H-16 | | |
| 144-35 | H-17 | | |
| 144-36 | H-18 | | |
TABLE 145
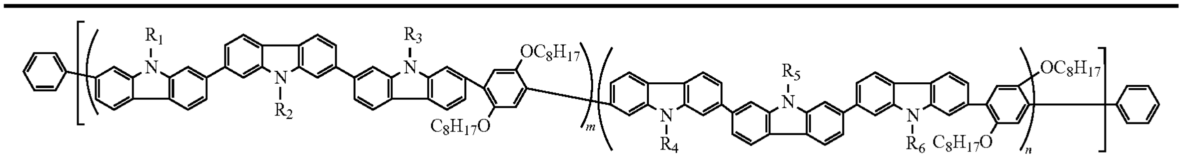
| Com. | R1 = R3 = R4 = R6 | R2 | R5 |
|---|---|---|---|
| 145-1 | H-1 | H-1 | H-29 |
| 145-2 | H-2 | | |
| 145-3 | H-3 | | |
| 145-4 | H-4 | | |
| 145-5 | H-5 | | |
| 145-6 | H-6 | | |
| 145-7 | H-7 | | |
| 145-8 | H-8 | | |
| 145-9 | H-9 | | |
| 145-10 | H-10 | | |
| 145-11 | H-11 | | |
| 145-12 | H-12 | | |
| 145-13 | H-13 | | |
| 145-14 | H-14 | | |
| 145-15 | H-15 | | |
| 145-16 | H-16 | | |
| 145-17 | H-17 | | |
| 145-18 | H-18 | | |

TABLE 145-continued
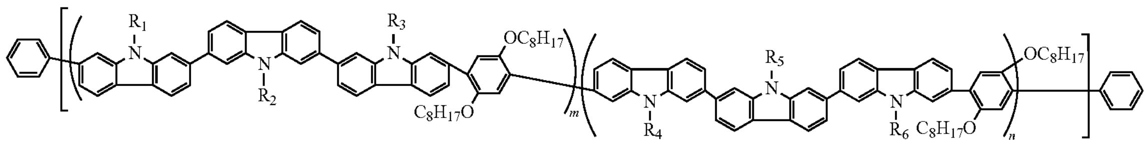
| Com. | R1 = R3 = R4 = R6 | R2 | R5 |
|---|---|---|---|
| 145-19 | H-1 | H-1 | H-30 |
| 145-20 | H-2 | | |
| 145-21 | H-3 | | |
| 145-22 | H-4 | | |
| 145-23 | H-5 | | |
| 145-24 | H-6 | | |
| 145-25 | H-7 | | |
| 145-26 | H-8 | | |
| 145-27 | H-9 | | |
| 145-28 | H-10 | | |
| 145-29 | H-11 | | |
| 145-30 | H-12 | | |
| 145-31 | H-13 | | |
| 145-32 | H-14 | | |
| 145-33 | H-15 | | |
| 145-34 | H-16 | | |
| 145-35 | H-17 | | |
| 145-36 | H-18 | | |
TABLE 146
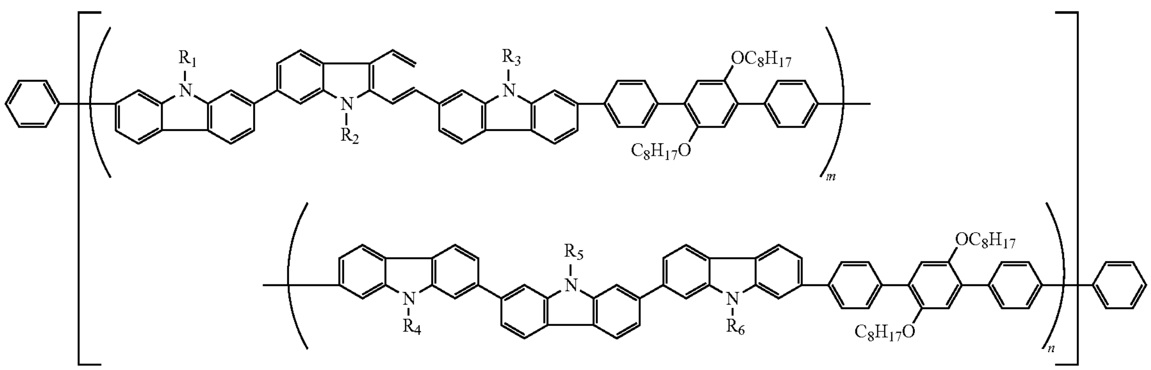
| Com. | R1 = R3 = R4 = R6 | R2 | R5 |
|---|---|---|---|
| 146-1 | H-1 | H-1 | H-29 |
| 146-2 | H-2 | | |
| 146-3 | H-3 | | |
| 146-4 | H-4 | | |
| 146-5 | H-5 | | |
| 146-6 | H-6 | | |
| 146-7 | H-7 | | |
| 146-8 | H-8 | | |
| 146-9 | H-9 | | |
| 146-10 | H-10 | | |
| 146-11 | H-11 | | |
| 146-12 | H-12 | | |
| 146-13 | H-13 | | |
| 146-14 | H-14 | | |
| 146-15 | H-15 | | |
| 146-16 | H-16 | | |
| 146-17 | H-17 | | |
| 146-18 | H-18 | | |
| 146-19 | H-1 | H-1 | H-30 |
| 146-20 | H-2 | | |
| 146-21 | H-3 | | |
| 146-22 | H-4 | | |
| 146-23 | H-5 | | |
| 146-24 | H-6 | | |
| 146-25 | H-7 | | |
| 146-26 | H-8 | | |
| 146-27 | H-9 | | |

TABLE 146-continued
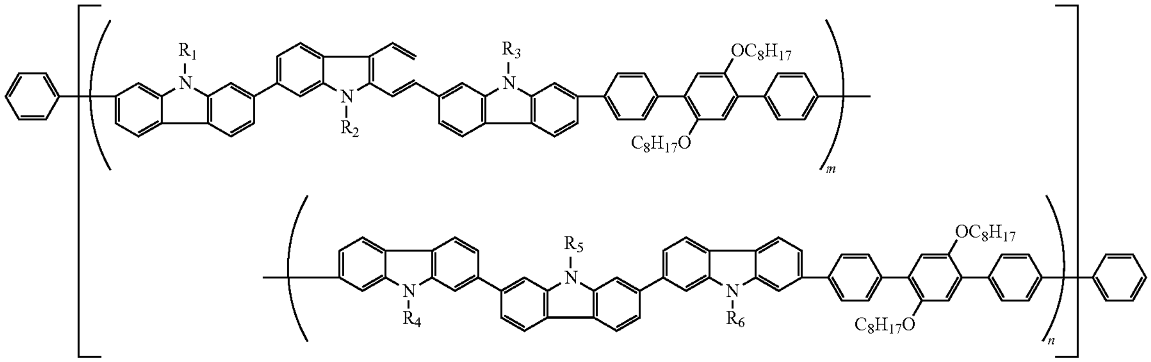
| Com. | R1 = R3 = R4 = R6 | R2 | R5 |
|---|---|---|---|
| 146-28 | H-10 | | |
| 146-29 | H-11 | | |
| 146-30 | H-12 | | |
| 146-31 | H-13 | | |
| 146-32 | H-14 | | |
| 146-33 | H-15 | | |
| 146-34 | H-16 | | |
| 146-35 | H-17 | | |
| 146-36 | H-18 | | |
TABLE 147
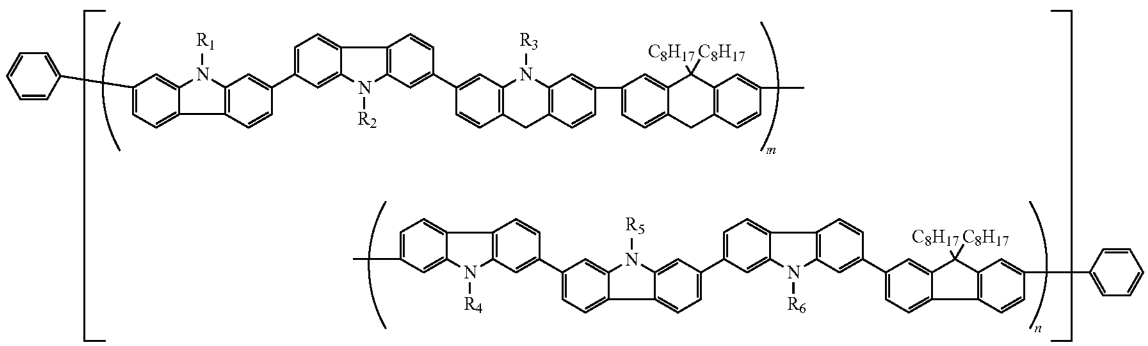
| Com. | R1 = R3 = R4 = R6 | R2 | R5 |
|---|---|---|---|
| 147-1 | H-1 | H-1 | H-29 |
| 147-2 | H-2 | | |
| 147-3 | H-3 | | |
| 147-4 | H-4 | | |
| 147-5 | H-5 | | |
| 147-6 | H-6 | | |
| 147-7 | H-7 | | |
| 147-8 | H-8 | | |
| 147-9 | H-9 | | |
| 147-10 | H-10 | | |
| 147-11 | H-11 | | |
| 147-12 | H-12 | | |
| 147-13 | H-13 | | |
| 147-14 | H-14 | | |
| 147-15 | H-15 | | |
| 147-16 | H-16 | | |
| 147-17 | H-17 | | |
| 147-18 | H-18 | | |
| 147-19 | H-1 | H-1 | H-30 |
| 147-20 | H-2 | | |
| 147-21 | H-3 | | |
| 147-22 | H-4 | | |
| 147-23 | H-5 | | |
| 147-24 | H-6 | | |
| 147-25 | H-7 | | |
| 147-26 | H-8 | | |
| 147-27 | H-9 | | |

TABLE 147-continued
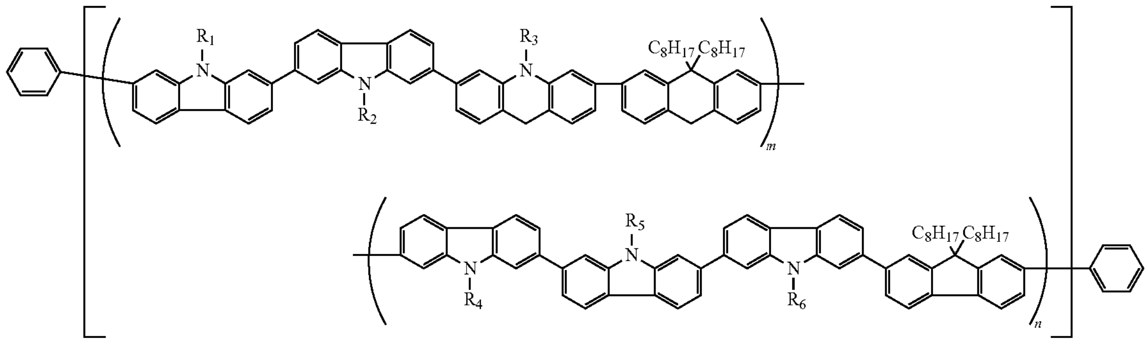
| Com. | R1 = R3 = R4 = R6 | R2 | R5 |
|---|---|---|---|
| 147-28 | H-10 | | |
| 147-29 | H-11 | | |
| 147-30 | H-12 | | |
| 147-31 | H-13 | | |
| 147-32 | H-14 | | |
| 147-33 | H-15 | | |
| 147-34 | H-16 | | |
| 147-35 | H-17 | | |
| 147-36 | H-18 | | |
TABLE 148
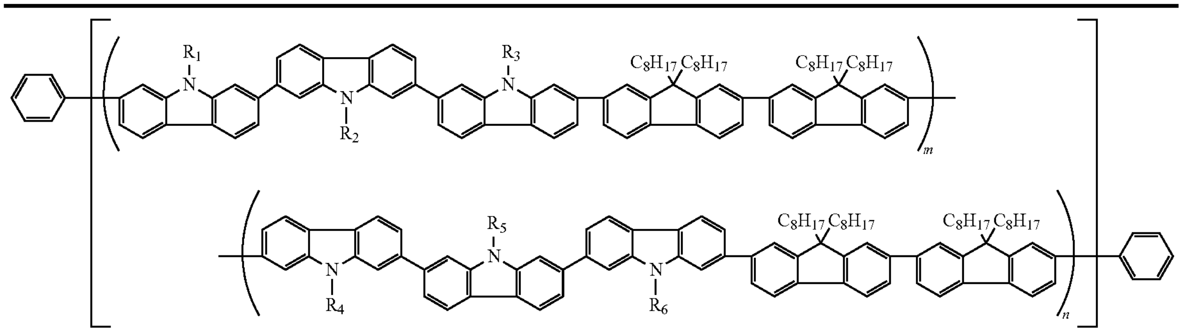
| Com. | R1 = R3 = R4 = R6 | R2 | R5 |
|---|---|---|---|
| 148-1 | H-1 | H-1 | H-29 |
| 148-2 | H-2 | | |
| 148-3 | H-3 | | |
| 148-4 | H-4 | | |
| 148-5 | H-5 | | |
| 148-6 | H-6 | | |
| 148-7 | H-7 | | |
| 148-8 | H-8 | | |
| 148-9 | H-9 | | |
| 148-10 | H-10 | | |
| 148-11 | H-11 | | |
| 148-12 | H-12 | | |
| 148-13 | H-13 | | |
| 148-14 | H-14 | | |
| 148-15 | H-15 | | |
| 148-16 | H-16 | | |
| 148-17 | H-17 | | |
| 148-18 | H-18 | | |
| 148-19 | H-1 | H-1 | H-30 |
| 148-20 | H-2 | | |
| 148-21 | H-3 | | |
| 148-22 | H-4 | | |
| 148-23 | H-5 | | |
| 148-24 | H-6 | | |
| 148-25 | H-7 | | |
| 148-26 | H-8 | | |
| 148-27 | H-9 | | |
| 148-28 | H-10 | | |
| 148-29 | H-11 | | |

TABLE 148-continued
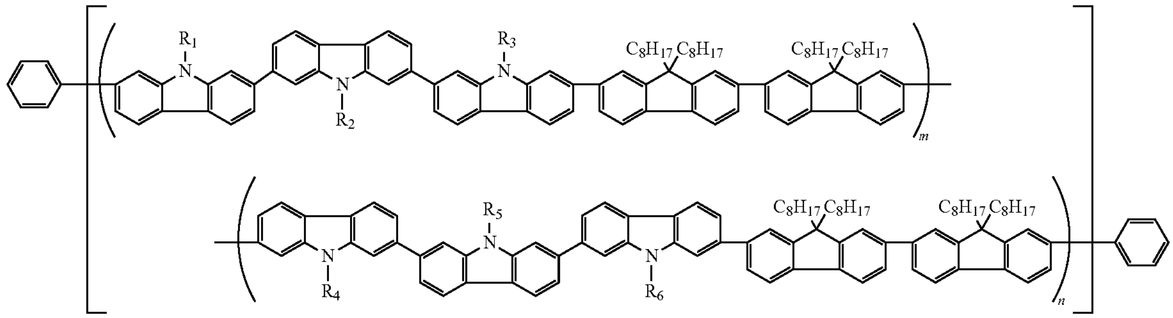
| Com. | R1 = R3 = R4 = R6 | R2 | R5 |
|---|---|---|---|
| 148-30 | H-12 | | |
| 148-31 | H-13 | | |
| 148-32 | H-14 | | |
| 148-33 | H-15 | | |
| 148-34 | H-16 | | |
| 148-35 | H-17 | | |
| 148-36 | H-18 | | |
TABLE 149
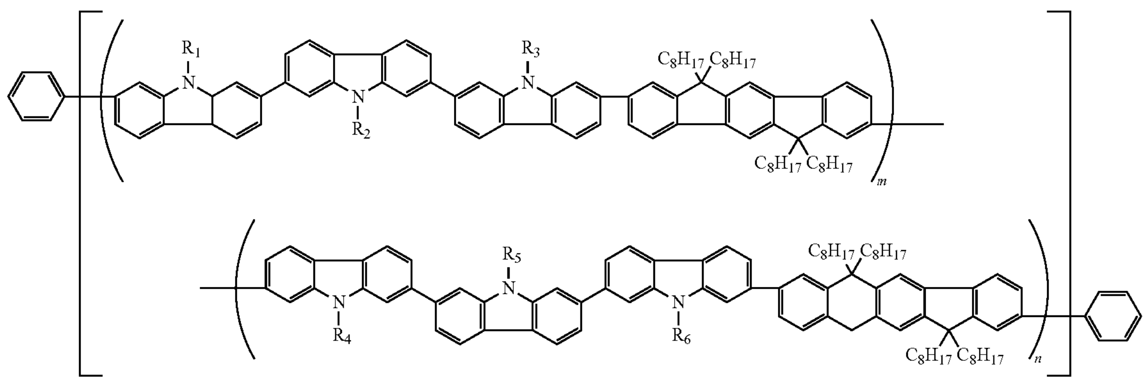
| Com. | R1 = R3 = R4 = R6 | R2 | R5 |
|---|---|---|---|
| 149-1 | H-1 | H-1 | H-29 |
| 149-2 | H-2 | | |
| 149-3 | H-3 | | |
| 149-4 | H-4 | | |
| 149-5 | H-5 | | |
| 149-6 | H-6 | | |
| 149-7 | H-7 | | |
| 149-8 | H-8 | | |
| 149-9 | H-9 | | |
| 149-10 | H-10 | | |
| 149-11 | H-11 | | |
| 149-12 | H-12 | | |
| 149-13 | H-13 | | |
| 149-14 | H-14 | | |
| 149-15 | H-15 | | |
| 149-16 | H-16 | | |
| 149-17 | H-17 | | |
| 149-18 | H-18 | | |
| 149-19 | H-1 | H-1 | H-30 |
| 149-20 | H-2 | | |
| 149-21 | H-3 | | |
| 149-22 | H-4 | | |
| 149-23 | H-5 | | |
| 149-24 | H-6 | | |
| 149-25 | H-7 | | |
| 149-26 | H-8 | | |
| 149-27 | H-9 | | |
| 149-28 | H-10 | | |
| 149-29 | H-11 | | |

TABLE 149-continued
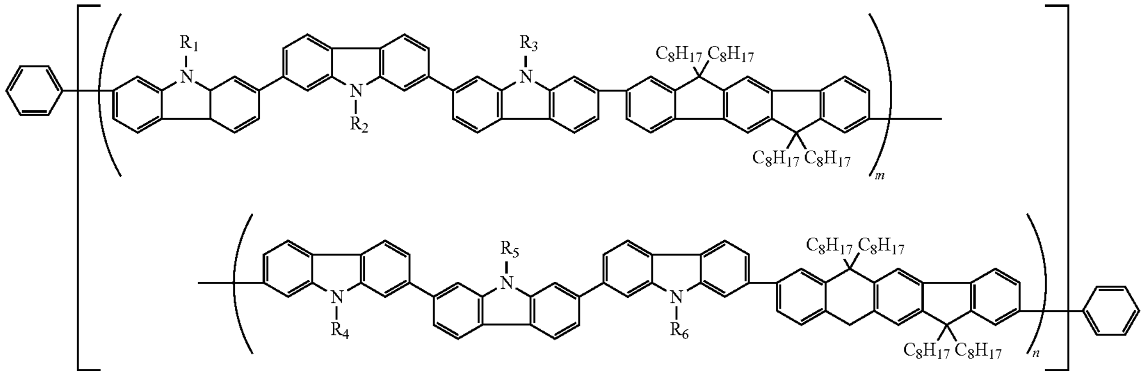
| Com. | R1 = R3 = R4 = R6 | R2 | R5 |
|---|---|---|---|
| 149-30 | H-12 | | |
| 149-31 | H-13 | | |
| 149-32 | H-14 | | |
| 149-33 | H-15 | | |
| 149-34 | H-16 | | |
| 149-35 | H-17 | | |
| 149-36 | H-18 | | |
TABLE 150
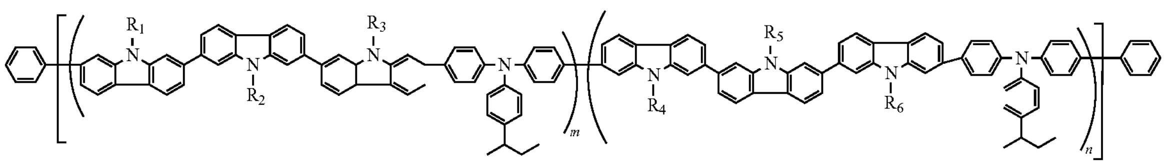
| Com. | R1 = R3 = R4 = R6 | R2 | R5 |
|---|---|---|---|
| 150-1 | H-1 | H-1 | H-29 |
| 150-2 | H-2 | | |
| 150-3 | H-3 | | |
| 150-4 | H-4 | | |
| 150-5 | H-5 | | |
| 150-6 | H-6 | | |
| 150-7 | H-7 | | |
| 150-8 | H-8 | | |
| 150-9 | H-9 | | |
| 150-10 | H-10 | | |
| 150-11 | H-11 | | |
| 150-12 | H-12 | | |
| 150-13 | H-13 | | |
| 150-14 | H-14 | | |
| 150-15 | H-15 | | |
| 150-16 | H-16 | | |
| 150-17 | H-17 | | |
| 150-18 | H-18 | | |
| 150-19 | H-1 | H-1 | H-30 |
| 150-20 | H-2 | | |
| 150-21 | H-3 | | |
| 150-22 | H-4 | | |
| 150-23 | H-5 | | |
| 150-24 | H-6 | | |
| 150-25 | H-7 | | |
| 150-26 | H-8 | | |
| 150-27 | H-9 | | |
| 150-28 | H-10 | | |
| 150-29 | H-11 | | |
| 150-30 | H-12 | | |
| 150-31 | H-13 | | |
| 150-32 | H-14 | | |
| 150-33 | H-15 | | |
| 150-34 | H-16 | | |
| 150-35 | H-17 | | |
| 150-36 | H-18 | | |

TABLE 151
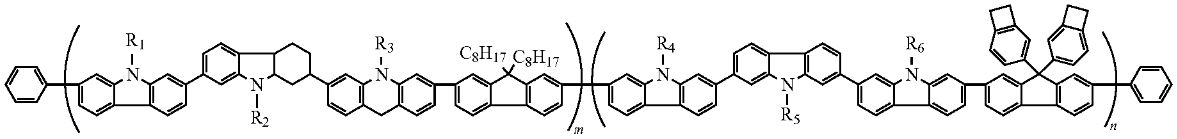
| Com. | R1 = R2 = R3 = R4 = R5 = R6 |
|---|---|
| 151-1 | H-1 |
| 151-2 | H-2 |
| 151-3 | H-3 |
| 151-4 | H-4 |
| 151-5 | H-5 |
| 151-6 | H-6 |
| 151-7 | H-7 |
| 151-8 | H-8 |
| 151-9 | H-9 |
| 151-10 | H-10 |
| 151-11 | H-11 |
| 151-12 | H-12 |
| 151-13 | H-13 |
| 151-14 | H-14 |
| 151-15 | H-15 |
| 151-16 | H-16 |
| 151-17 | H-17 |
| 151-18 | H-18 |
TABLE 152
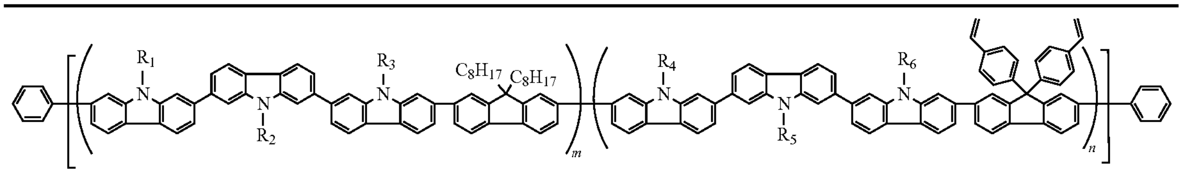
| Com. | R1 = R2 = R3 = R4 = R5 = R6 |
|---|---|
| 152-1 | H-1 |
| 152-2 | H-2 |
| 152-3 | H-3 |
| 152-4 | H-4 |
| 152-5 | H-5 |
| 152-6 | H-6 |
| 152-7 | H-7 |
| 152-8 | H-8 |
| 152-9 | H-9 |
| 152-10 | H-10 |
| 152-11 | H-11 |
| 152-12 | H-12 |
| 152-13 | H-13 |
| 152-14 | H-14 |
| 152-15 | H-15 |
| 152-16 | H-16 |
| 152-17 | H-17 |
| 152-18 | H-18 |
TABLE 153
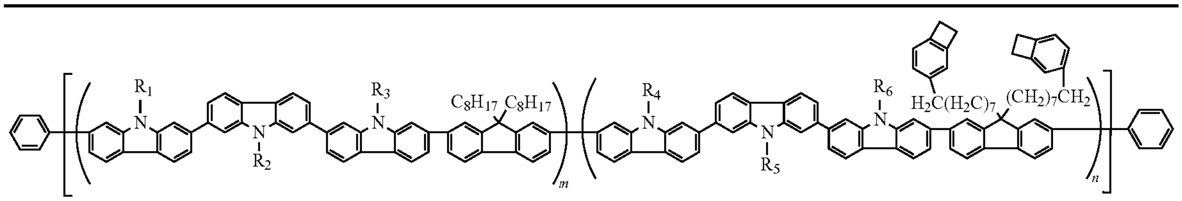
| Com. | R1 = R2 = R3 = R4 = R5 = R6 |
|---|---|
| 153-1 | H-1 |
| 153-2 | H-2 |

TABLE 153-continued
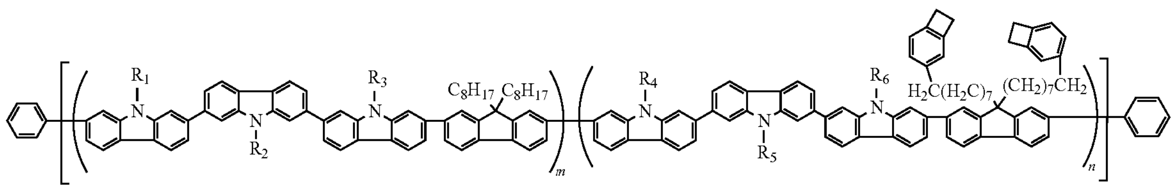
| Com. | R1 = R2 = R3 = R4 = R5 = R6 |
|---|---|
| 153-3 | H-3 |
| 153-4 | H-4 |
| 153-5 | H-5 |
| 153-6 | H-6 |
| 153-7 | H-7 |
| 153-8 | H-8 |
| 153-9 | H-9 |
| 153-10 | H-10 |
| 153-11 | H-11 |
| 153-12 | H-12 |
| 153-13 | H-13 |
| 153-14 | H-14 |
| 153-15 | H-15 |
| 153-16 | H-16 |
| 153-17 | H-17 |
| 153-18 | H-18 |
TABLE 154
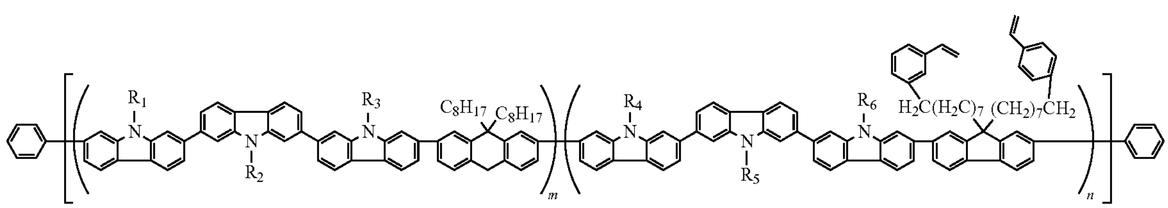
| Com. | R1 = R2 = R3 = R4 = R5 = R6 |
|---|---|
| 154-1 | H-1 |
| 154-2 | H-2 |
| 154-3 | H-3 |
| 154-4 | H-4 |
| 154-5 | H-5 |
| 154-6 | H-6 |
| 154-7 | H-7 |
| 154-8 | H-8 |
| 154-9 | H-9 |
| 154-10 | H-10 |
| 154-11 | H-11 |
| 154-12 | H-12 |
| 154-13 | H-13 |
| 154-14 | H-14 |
| 154-16 | H-15 |
| 154-17 | H-16 |
| 154-18 | H-17 |

TABLE 155
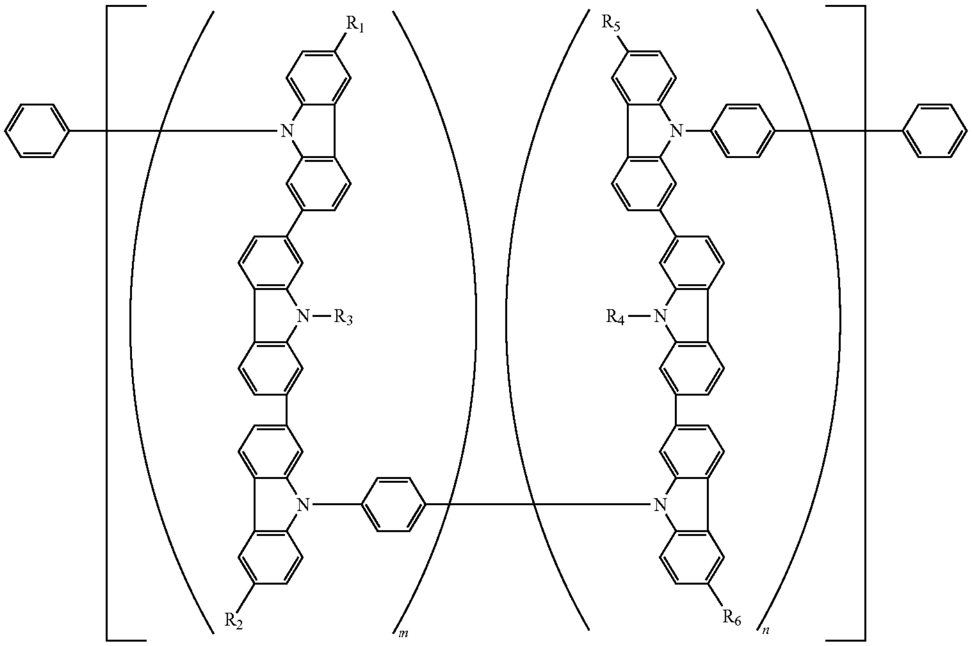
| Com. | R1 = R2 = R5 = R6 | R3 | R4 |
|---|---|---|---|
| 155-1 | H | H-1 | H-29 |
| 155-2 | | H-2 | |
| 155-3 | | H-3 | |
| 155-4 | | H-4 | |
| 155-5 | | H-5 | |
| 155-6 | | H-6 | |
| 155-7 | | H-7 | |
| 155-8 | | H-8 | |
| 155-9 | | H-9 | |
| 155-10 | | H-10 | |
| 155-11 | | H-11 | |
| 155-12 | | H-12 | |
| 155-13 | | H-13 | |
| 155-14 | | H-14 | |
| 155-15 | | H-15 | |
| 155-16 | | H-16 | |
| 155-17 | | H-17 | |
| 155-18 | | H-18 | |
| 155-19 | H | H-1 | H-29 |
| 155-20 | | H-2 | |
| 155-21 | | H-3 | |
| 155-22 | | H-4 | |
| 155-23 | | H-5 | |
| 155-24 | | H-6 | |
| 155-25 | | H-7 | |
| 155-26 | | H-8 | |
| 155-27 | | H-9 | |
| 155-28 | | H-10 | |
| 155-29 | | H-11 | |
| 155-30 | | H-12 | |
| 155-31 | | H-13 | |
| 155-32 | | H-14 | |
| 155-33 | | H-15 | |
| 155-34 | | H-16 | |
| 155-35 | | H-17 | |
| 155-36 | | H-18 | |

TABLE 156
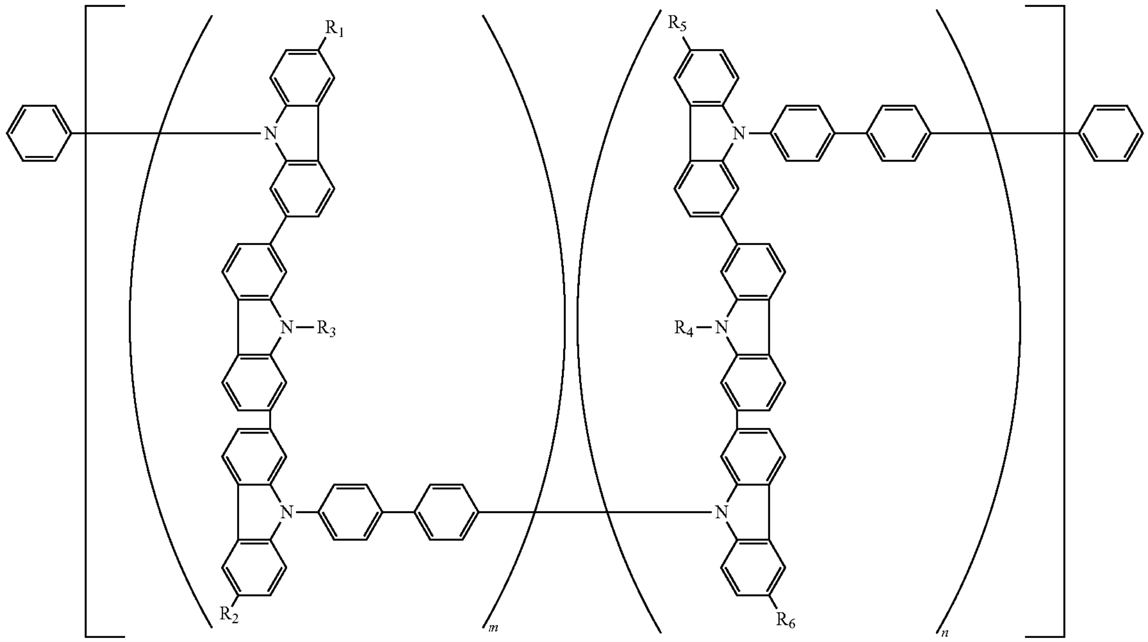
| Com. | R1 = R2 = R5 = R6 | R3 | R4 |
|---|---|---|---|
| 156-1 | H | H-1 | H-29 |
| 156-2 | | H-2 | |
| 156-3 | | H-3 | |
| 156-4 | | H-4 | |
| 156-5 | | H-5 | |
| 156-6 | | H-6 | |
| 156-7 | | H-7 | |
| 156-8 | | H-8 | |
| 156-9 | | H-9 | |
| 156-10 | | H-10 | |
| 156-11 | | H-11 | |
| 156-12 | | H-12 | |
| 156-13 | | H-13 | |
| 156-14 | | H-14 | |
| 156-15 | | H-15 | |
| 156-16 | | H-16 | |
| 156-17 | | H-17 | |
| 156-18 | | H-18 | |
| 156-19 | H | H-1 | H-29 |
| 156-20 | | H-2 | |
| 156-21 | | H-3 | |
| 156-22 | | H-4 | |
| 156-23 | | H-5 | |
| 156-24 | | H-6 | |
| 156-25 | | H-7 | |
| 156-26 | | H-8 | |
| 156-27 | | H-9 | |
| 156-28 | | H-10 | |
| 156-29 | | H-11 | |
| 156-30 | | H-12 | |
| 156-31 | | H-13 | |
| 156-32 | | H-14 | |
| 156-33 | | H-15 | |
| 156-34 | | H-16 | |
| 156-35 | | H-17 | |
| 156-36 | | H-18 | |

TABLE 157
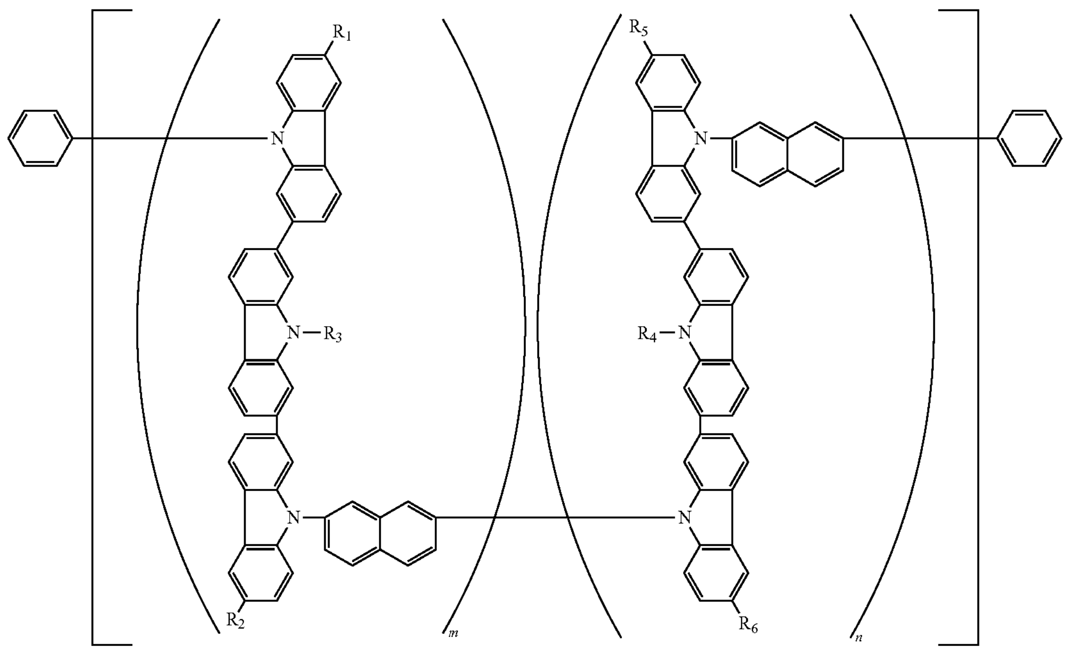
| Com. | R1 = R2 = R5 = R6 | R3 | R4 |
|---|---|---|---|
| 157-1 | H | H-1 | H-29 |
| 157-2 | | H-2 | |
| 157-3 | | H-3 | |
| 157-4 | | H-4 | |
| 157-5 | | H-5 | |
| 157-6 | | H-6 | |
| 157-7 | | H-7 | |
| 157-8 | | H-8 | |
| 157-9 | | H-9 | |
| 157-10 | | H-10 | |
| 157-11 | | H-11 | |
| 157-12 | | H-12 | |
| 157-13 | | H-13 | |
| 157-14 | | H-14 | |
| 157-15 | | H-15 | |
| 157-16 | | H-16 | |
| 157-17 | | H-17 | |
| 157-18 | | H-18 | |
| 157-19 | H | H-1 | H-29 |
| 157-20 | | H-2 | |
| 157-21 | | H-3 | |
| 157-22 | | H-4 | |
| 157-23 | | H-5 | |
| 157-24 | | H-6 | |
| 157-25 | | H-7 | |
| 157-26 | | H-8 | |
| 157-27 | | H-9 | |
| 157-28 | | H-10 | |
| 157-29 | | H-11 | |
| 157-30 | | H-12 | |
| 157-31 | | H-13 | |
| 157-32 | | H-14 | |
| 157-33 | | H-15 | |
| 157-34 | | H-16 | |
| 157-35 | | H-17 | |
| 157-36 | | H-18 | |

TABLE 158
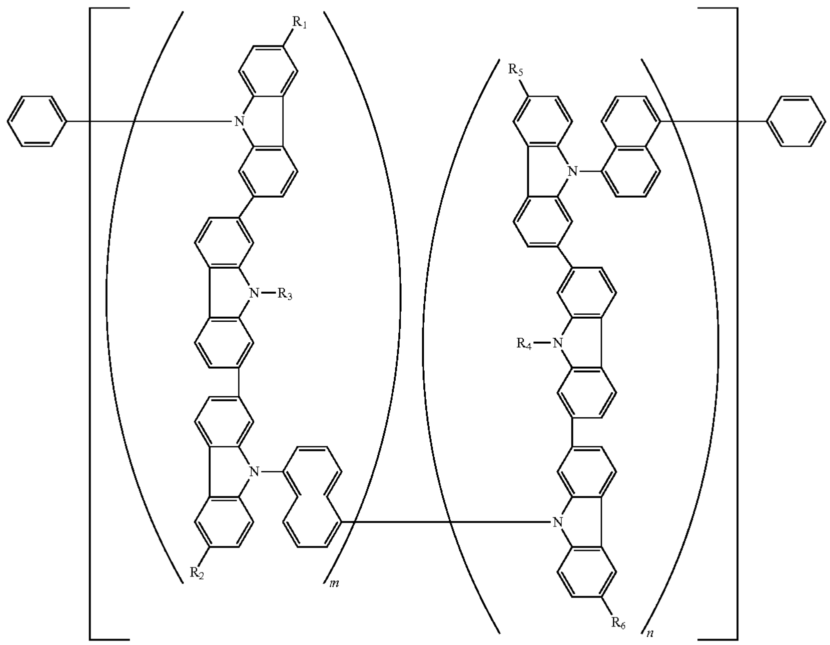
| Com. | R1 = R2 = R5 = R6 | R3 | R4 |
|---|---|---|---|
| 158-1 | H | H-1 | H-29 |
| 158-2 | | H-2 | |
| 158-3 | | H-3 | |
| 158-4 | | H-4 | |
| 158-5 | | H-5 | |
| 158-6 | | H-6 | |
| 158-7 | | H-7 | |
| 158-8 | | H-8 | |
| 158-9 | | H-9 | |
| 158-10 | | H-10 | |
| 158-11 | | H-11 | |
| 158-12 | | H-12 | |
| 158-13 | | H-13 | |
| 158-14 | | H-14 | |
| 158-15 | | H-15 | |
| 158-16 | | H-16 | |
| 158-17 | | H-17 | |
| 158-18 | | H-18 | |
| 158-19 | H | H-1 | H-29 |
| 158-20 | | H-2 | |
| 158-21 | | H-3 | |
| 158-22 | | H-4 | |
| 158-23 | | H-5 | |
| 158-24 | | H-6 | |
| 158-25 | | H-7 | |
| 158-26 | | H-8 | |
| 158-27 | | H-9 | |
| 158-28 | | H-10 | |
| 158-29 | | H-11 | |
| 158-30 | | H-12 | |
| 158-31 | | H-13 | |
| 158-32 | | H-14 | |
| 158-33 | | H-15 | |
| 158-34 | | H-16 | |
| 158-35 | | H-17 | |
| 158-36 | | H-18 | |

TABLE 159
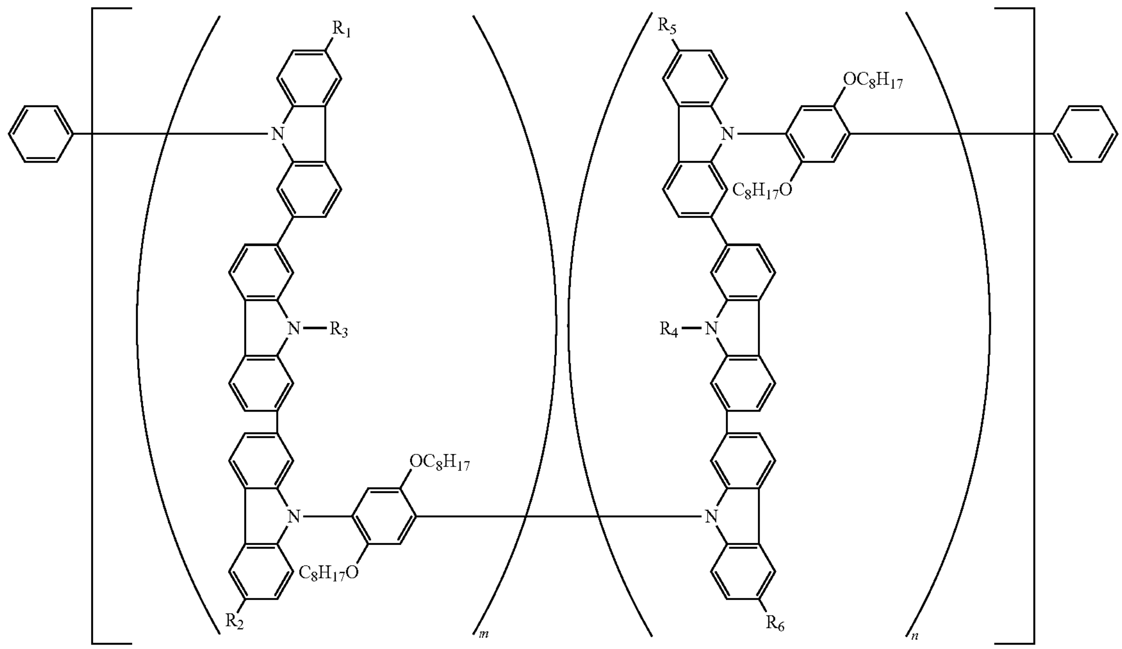
| Com. | R1 = R2 = R5 = R6 | R3 | R4 |
|---|---|---|---|
| 159-1 | H | H-1 | H-29 |
| 159-2 | | H-2 | |
| 159-3 | | H-3 | |
| 159-4 | | H-4 | |
| 159-5 | | H-5 | |
| 159-6 | | H-6 | |
| 159-7 | | H-7 | |
| 159-8 | | H-8 | |
| 159-9 | | H-9 | |
| 159-10 | | H-10 | |
| 159-11 | | H-11 | |
| 159-12 | | H-12 | |
| 159-13 | | H-13 | |
| 159-14 | | H-14 | |
| 159-15 | | H-15 | |
| 159-16 | | H-16 | |
| 159-17 | | H-17 | |
| 159-18 | | H-18 | |
| 159-19 | H | H-1 | H-29 |
| 159-20 | | H-2 | |
| 159-21 | | H-3 | |
| 159-22 | | H-4 | |
| 159-23 | | H-5 | |
| 159-24 | | H-6 | |
| 159-25 | | H-7 | |
| 159-26 | | H-8 | |
| 159-27 | | H-9 | |
| 159-28 | | H-10 | |
| 159-29 | | H-11 | |
| 159-30 | | H-12 | |
| 159-31 | | H-13 | |
| 159-32 | | H-14 | |
| 159-33 | | H-15 | |
| 159-34 | | H-16 | |
| 159-35 | | H-17 | |
| 159-36 | | H-18 | |

TABLE 160
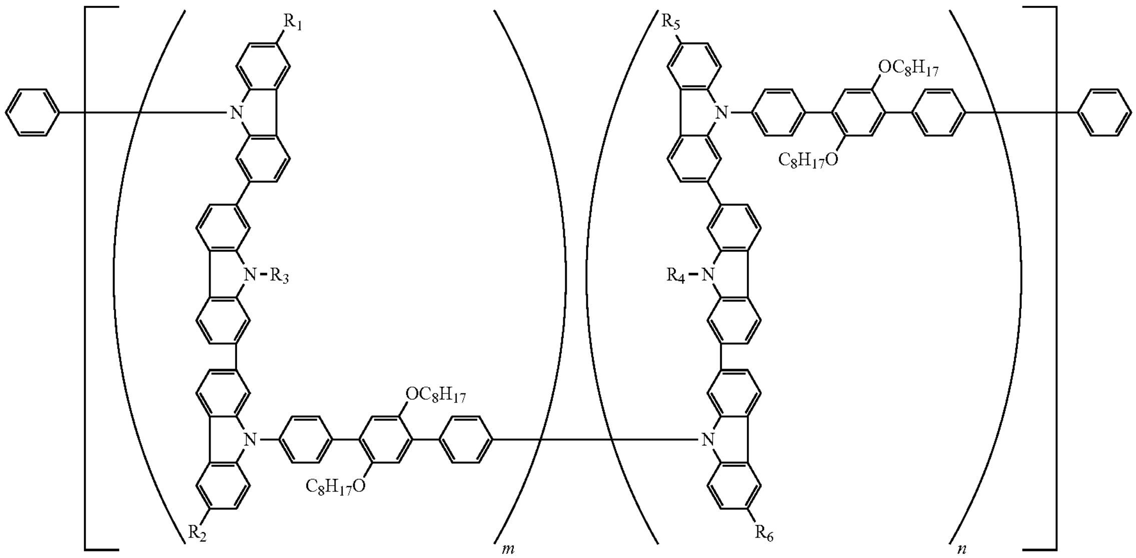
| Com. | R1 = R2 = R5 = R6 | R3 | R4 |
|---|---|---|---|
| 160-1 | H | H-1 | H-29 |
| 160-2 | | H-2 | |
| 160-3 | | H-3 | |
| 160-4 | | H-4 | |
| 160-5 | | H-5 | |
| 160-6 | | H-6 | |
| 160-7 | | H-7 | |
| 160-8 | | H-8 | |
| 160-9 | | H-9 | |
| 160-10 | | H-10 | |
| 160-11 | | H-11 | |
| 160-12 | | H-12 | |
| 160-13 | | H-13 | |
| 160-14 | | H-14 | |
| 160-15 | | H-15 | |
| 160-16 | | H-16 | |
| 160-17 | | H-17 | |
| 160-18 | | H-18 | |
| 160-19 | H | H-1 | H-29 |
| 160-20 | | H-2 | |
| 160-21 | | H-3 | |
| 160-22 | | H-4 | |
| 160-23 | | H-5 | |
| 160-24 | | H-6 | |
| 160-25 | | H-7 | |
| 160-26 | | H-8 | |
| 160-27 | | H-9 | |
| 160-28 | | H-10 | |
| 160-29 | | H-11 | |
| 160-30 | | H-12 | |
| 160-31 | | H-13 | |
| 160-32 | | H-14 | |
| 160-33 | | H-15 | |
| 160-34 | | H-16 | |
| 160-35 | | H-17 | |
| 160-36 | | H-18 | |

TABLE 161
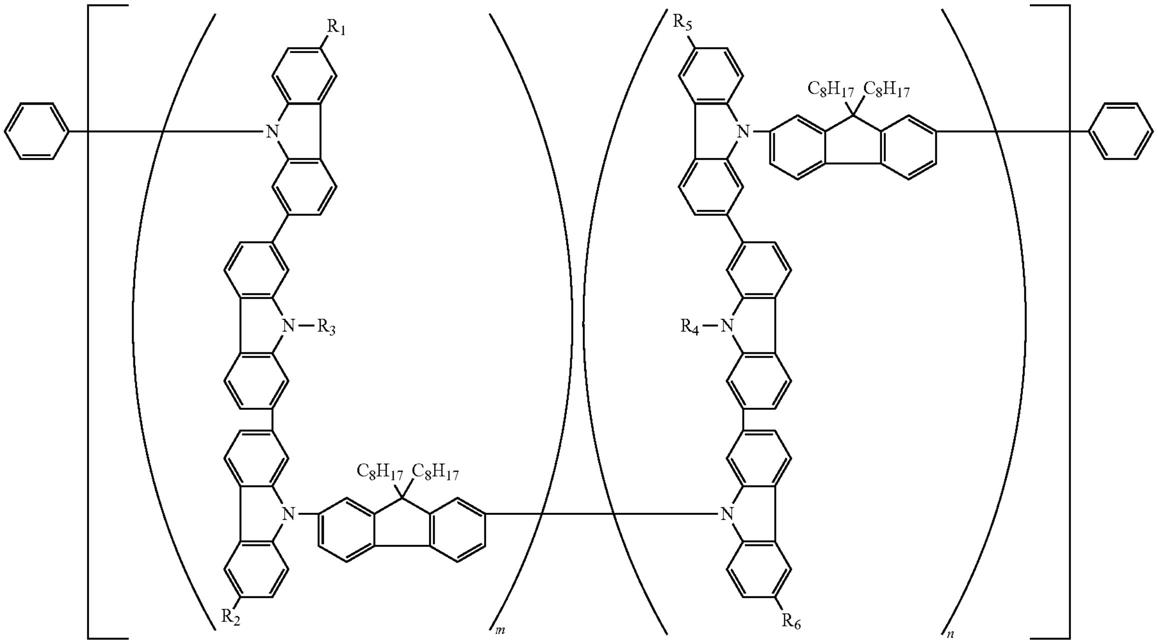
| Com. | R1 = R2 = R5 = R6 | R3 | R4 |
|---|---|---|---|
| 161-1 | H | H-1 | H-29 |
| 161-2 | | H-2 | |
| 161-3 | | H-3 | |
| 161-4 | | H-4 | |
| 161-5 | | H-5 | |
| 161-6 | | H-6 | |
| 161-7 | | H-7 | |
| 161-8 | | H-8 | |
| 161-9 | | H-9 | |
| 161-10 | | H-10 | |
| 161-11 | | H-11 | |
| 161-12 | | H-12 | |
| 161-13 | | H-13 | |
| 161-14 | | H-14 | |
| 161-15 | | H-15 | |
| 161-16 | | H-16 | |
| 161-17 | | H-17 | |
| 161-18 | | H-18 | |
| 161-19 | H | H-1 | H-29 |
| 161-20 | | H-2 | |
| 161-21 | | H-3 | |
| 161-22 | | H-4 | |
| 161-23 | | H-5 | |
| 161-24 | | H-6 | |
| 161-25 | | H-7 | |
| 161-26 | | H-8 | |
| 161-27 | | H-9 | |
| 161-28 | | H-10 | |
| 161-29 | | H-11 | |
| 161-30 | | H-12 | |
| 161-31 | | H-13 | |
| 161-32 | | H-14 | |
| 161-33 | | H-15 | |
| 161-34 | | H-16 | |
| 161-35 | | H-17 | |
| 161-36 | | H-18 | |

TABLE 162
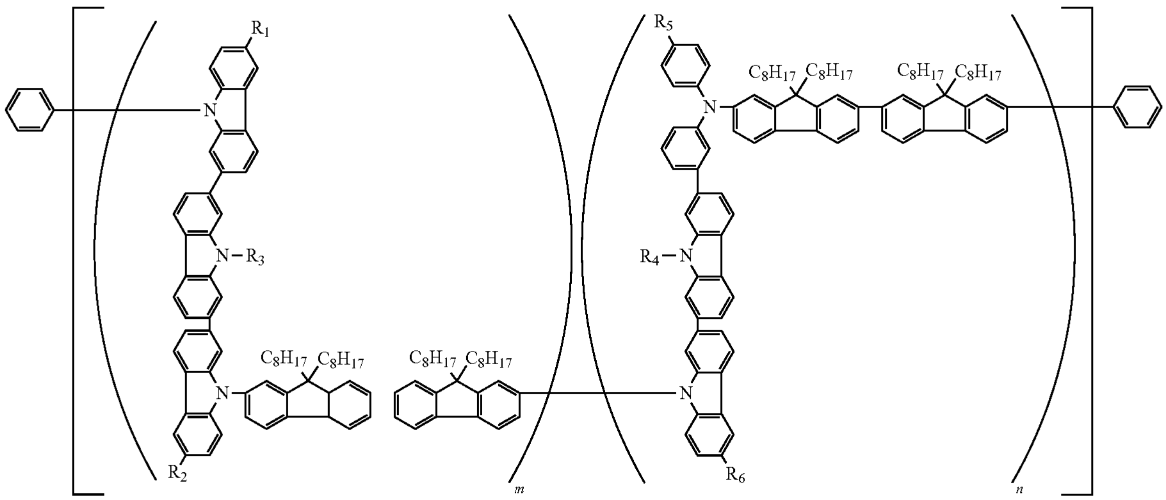
| Com. | R1 = R2 = R5 = R6 | R3 | R4 |
|---|---|---|---|
| 162-1 | H | H-1 | H-29 |
| 162-2 | | H-2 | |
| 162-3 | | H-3 | |
| 162-4 | | H-4 | |
| 162-5 | | H-5 | |
| 162-6 | | H-6 | |
| 162-7 | | H-7 | |
| 162-8 | | H-8 | |
| 162-9 | | H-9 | |
| 162-10 | | H-10 | |
| 162-11 | | H-11 | |
| 162-12 | | H-12 | |
| 162-13 | | H-13 | |
| 162-14 | | H-14 | |
| 162-15 | | H-15 | |
| 162-16 | | H-16 | |
| 162-17 | | H-17 | |
| 162-18 | | H-18 | |
| 162-19 | H | H-1 | H-29 |
| 162-20 | | H-2 | |
| 162-21 | | H-3 | |
| 162-22 | | H-4 | |
| 162-23 | | H-5 | |
| 162-24 | | H-6 | |
| 162-25 | | H-7 | |
| 162-26 | | H-8 | |
| 162-27 | | H-9 | |
| 162-28 | | H-10 | |
| 162-29 | | H-11 | |
| 162-30 | | H-12 | |
| 162-31 | | H-13 | |
| 162-32 | | H-14 | |
| 162-33 | | H-15 | |
| 162-34 | | H-16 | |
| 162-35 | | H-17 | |
| 162-36 | | H-18 | |

TABLE 163
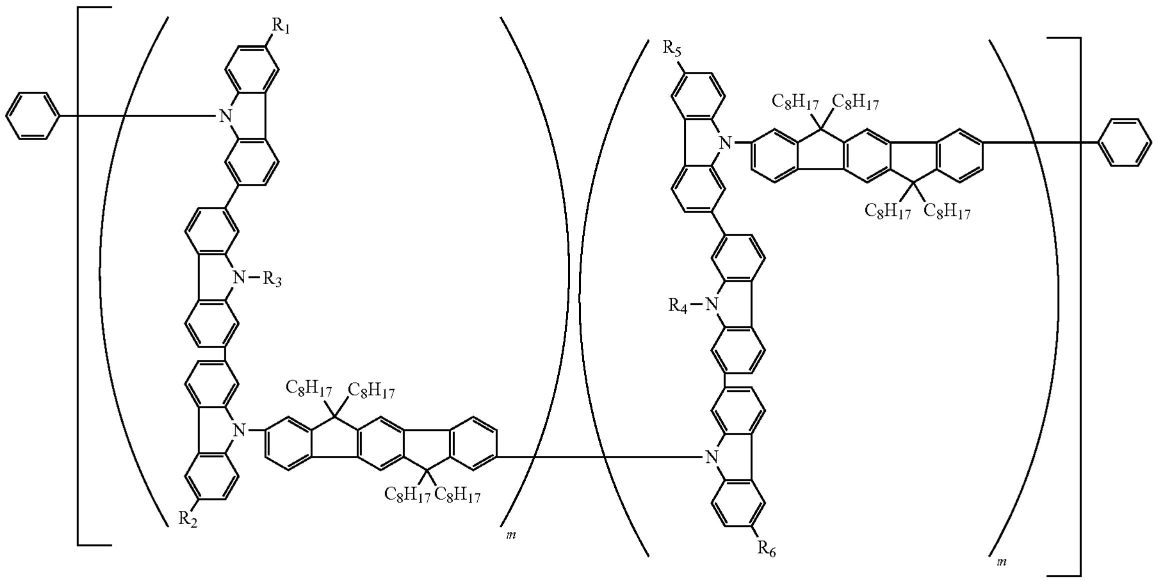
| Com. | R1 = R2 = R5 = R6 | R3 | R4 |
|---|---|---|---|
| 163-1 | H | H-1 | H-29 |
| 163-2 | | H-2 | |
| 163-3 | | H-3 | |
| 163-4 | | H-4 | |
| 163-5 | | H-5 | |
| 163-6 | | H-6 | |
| 163-7 | | H-7 | |
| 163-8 | | H-8 | |
| 163-9 | | H-9 | |
| 163-10 | | H-10 | |
| 163-11 | | H-11 | |
| 163-12 | | H-12 | |
| 163-13 | | H-13 | |
| 163-14 | | H-14 | |
| 163-15 | | H-15 | |
| 163-16 | | H-16 | |
| 163-17 | | H-17 | |
| 163-18 | | H-18 | |
| 163-19 | H | H-1 | H-29 |
| 163-20 | | H-2 | |
| 163-21 | | H-3 | |
| 163-22 | | H-4 | |
| 163-23 | | H-5 | |
| 163-24 | | H-6 | |
| 163-25 | | H-7 | |
| 163-26 | | H-8 | |
| 163-27 | | H-9 | |
| 163-28 | | H-10 | |
| 163-29 | | H-11 | |
| 163-30 | | H-12 | |
| 163-31 | | H-13 | |
| 163-32 | | H-14 | |
| 163-33 | | H-15 | |
| 163-34 | | H-16 | |
| 163-35 | | H-17 | |
| 163-36 | | H-18 | |

TABLE 164
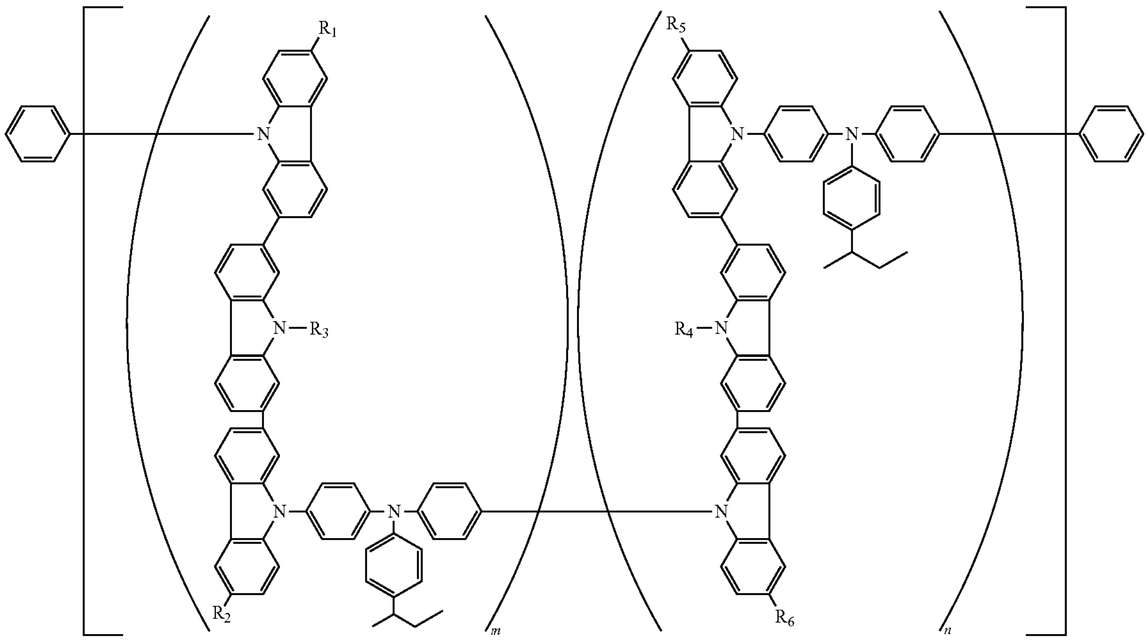
| Com. | R1 = R2 = R5 = R6 | R3 | R4 |
|---|---|---|---|
| 164-1 | H | H-1 | H-29 |
| 164-2 | | H-2 | |
| 164-3 | | H-3 | |
| 164-4 | | H-4 | |
| 164-5 | | H-5 | |
| 164-6 | | H-6 | |
| 164-7 | | H-7 | |
| 164-8 | | H-8 | |
| 164-9 | | H-9 | |
| 164-10 | | H-10 | |
| 164-11 | | H-11 | |
| 164-12 | | H-12 | |
| 164-13 | | H-13 | |
| 164-14 | | H-14 | |
| 164-15 | | H-15 | |
| 164-16 | | H-16 | |
| 164-17 | | H-17 | |
| 164-18 | | H-18 | |
| 164-19 | H | H-1 | H-29 |
| 164-20 | | H-2 | |
| 164-21 | | H-3 | |
| 164-22 | | H-4 | |
| 164-23 | | H-5 | |
| 164-24 | | H-6 | |
| 164-25 | | H-7 | |
| 164-26 | | H-8 | |
| 164-27 | | H-9 | |
| 164-28 | | H-10 | |
| 164-29 | | H-11 | |
| 164-30 | | H-12 | |
| 164-31 | | H-13 | |
| 164-32 | | H-14 | |
| 164-33 | | H-15 | |
| 164-34 | | H-16 | |
| 164-35 | | H-17 | |
| 164-36 | | H-18 | |

TABLE 165
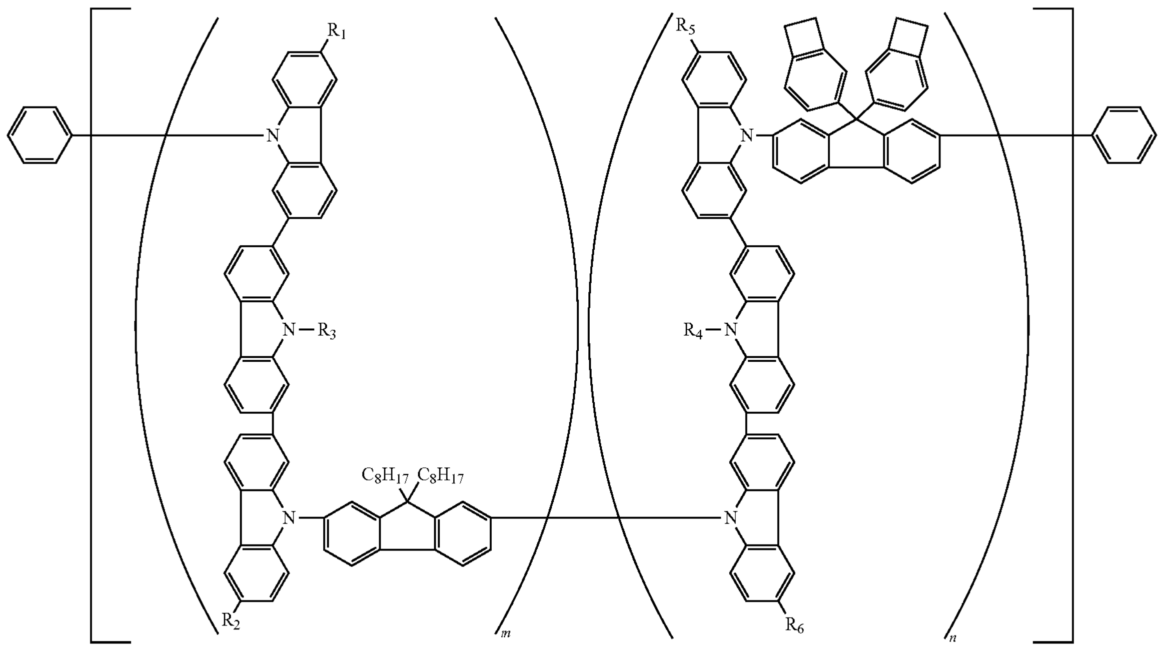
| Com. | R1 = R2 = R5 = R6 | R3 = R4 |
|---|---|---|
| 165-1 | H | H-1 |
| 165-2 | | H-2 |
| 165-3 | | H-3 |
| 165-4 | | H-4 |
| 165-5 | | H-5 |
| 165-6 | | H-6 |
| 165-7 | | H-7 |
| 165-8 | | H-8 |
| 165-9 | | H-9 |
| 165-10 | | H-10 |
| 165-11 | | H-11 |
| 165-12 | | H-12 |
| 165-13 | | H-13 |
| 165-14 | | H-14 |
| 165-15 | | H-15 |
| 165-16 | | H-16 |
| 165-17 | | H-17 |
| 165-18 | | H-18 |

TABLE 166
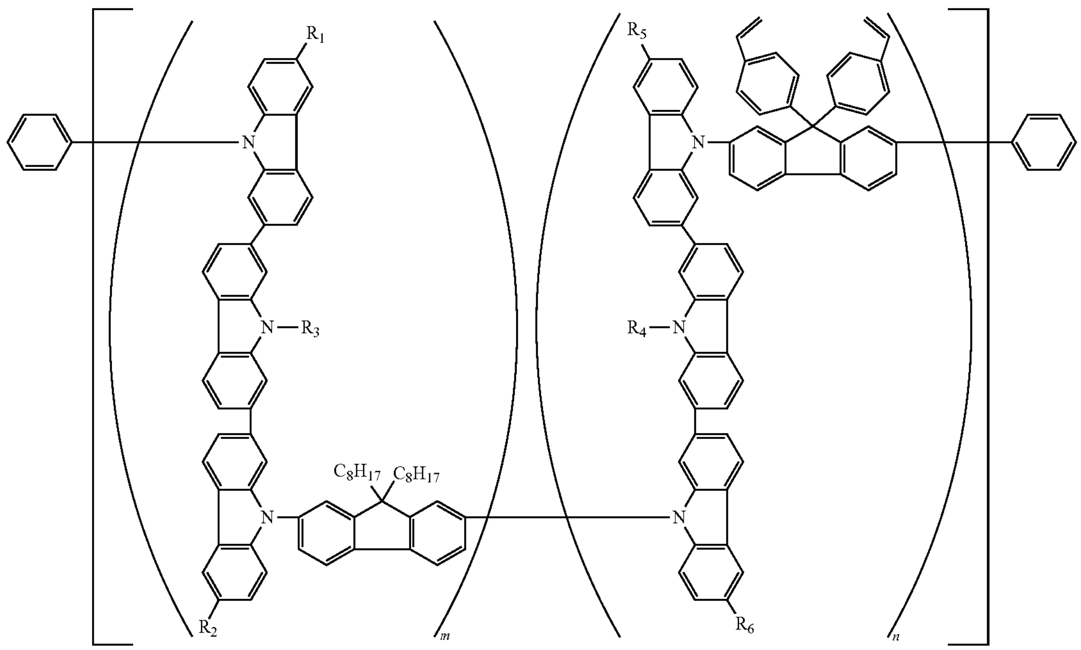
| Com. | R1 = R2 = R5 = R6 | R3 = R4 |
|---|---|---|
| 166-1 | H | H-1 |
| 166-2 | | H-2 |
| 166-3 | | H-3 |
| 166-4 | | H-4 |
| 166-5 | | H-5 |
| 166-6 | | H-6 |
| 166-7 | | H-7 |
| 166-8 | | H-8 |
| 166-9 | | H-9 |
| 166-10 | | H-10 |
| 166-11 | | H-11 |
| 166-12 | | H-12 |
| 166-13 | | H-13 |
| 166-14 | | H-14 |
| 166-15 | | H-15 |
| 166-16 | | H-16 |
| 166-17 | | H-17 |
| 166-18 | | H-18 |

TABLE 167
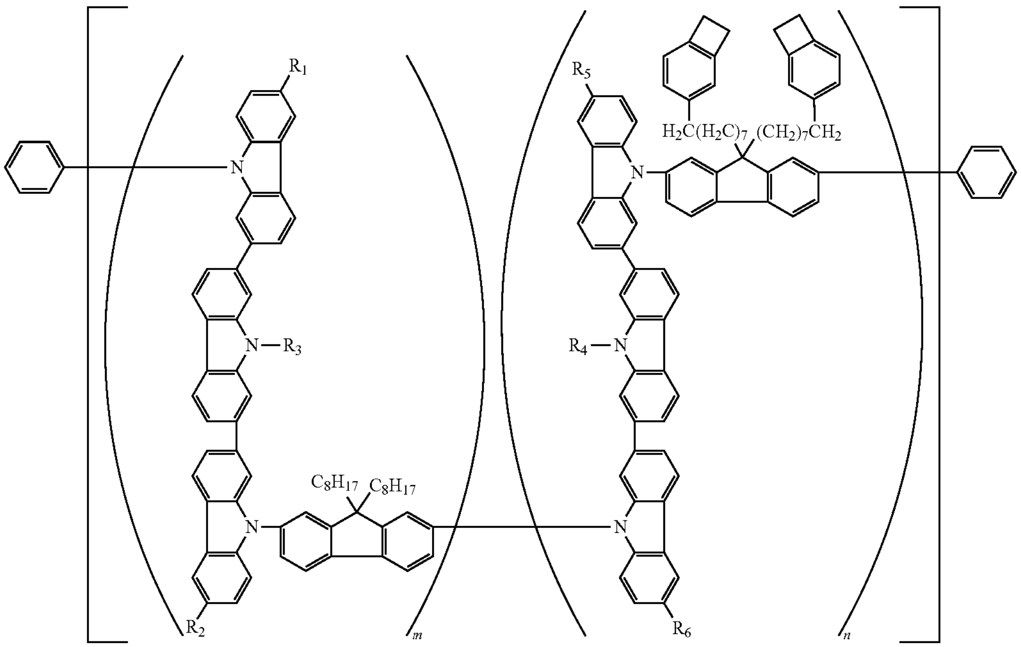
| Com. | R1 = R2 = R5 = R6 | R3 = R4 |
|---|---|---|
| 167-1 | H | H-1 |
| 167-2 | | H-2 |
| 167-3 | | H-3 |
| 167-4 | | H-4 |
| 167-5 | | H-5 |
| 167-6 | | H-6 |
| 167-7 | | H-7 |
| 167-8 | | H-8 |
| 167-9 | | H-9 |
| 167-10 | | H-10 |
| 167-11 | | H-11 |
| 167-12 | | H-12 |
| 167-13 | | H-13 |
| 167-14 | | H-14 |
| 167-15 | | H-15 |
| 167-16 | | H-16 |
| 167-17 | | H-17 |
| 167-18 | | H-18 |

TABLE 168
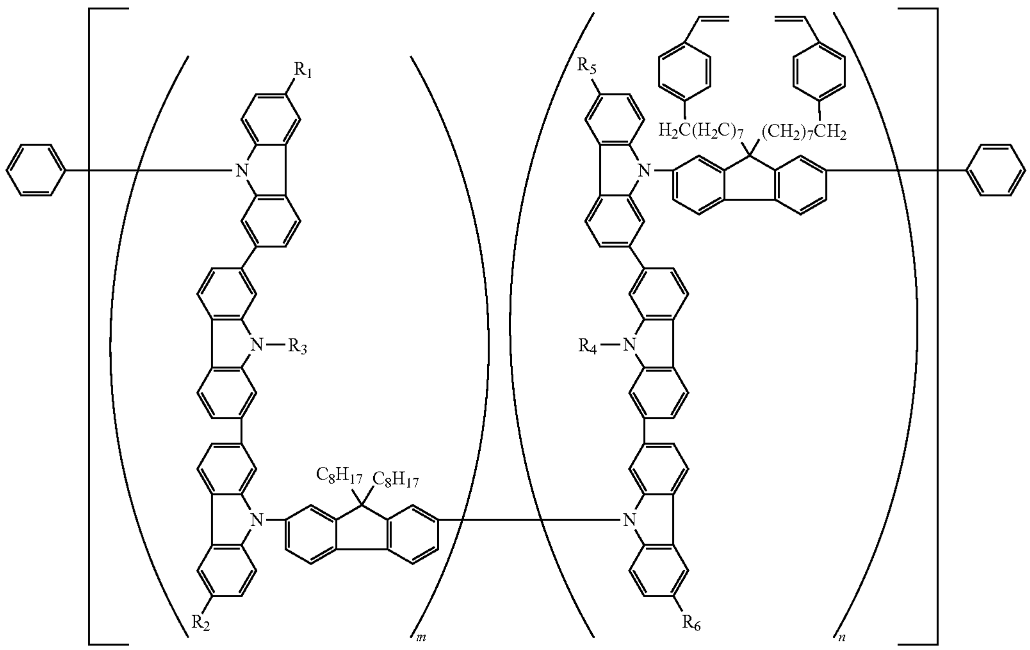
| Com. | R1 = R2 = R5 = R6 | R3 = R4 |
|---|---|---|
| 168-1 | H | H-1 |
| 168-2 | | H-2 |
| 168-3 | | H-3 |
| 168-4 | | H-4 |
| 168-5 | | H-5 |
| 168-6 | | H-6 |
| 168-7 | | H-7 |
| 168-8 | | H-8 |
| 168-9 | | H-9 |
| 168-10 | | H-10 |
| 168-11 | | H-11 |
| 168-12 | | H-12 |
| 168-13 | | H-13 |
| 168-14 | | H-14 |
| 168-15 | | H-15 |
| 168-16 | | H-16 |
| 168-17 | | H-17 |
| 168-18 | | H-18 |

TABLE 169
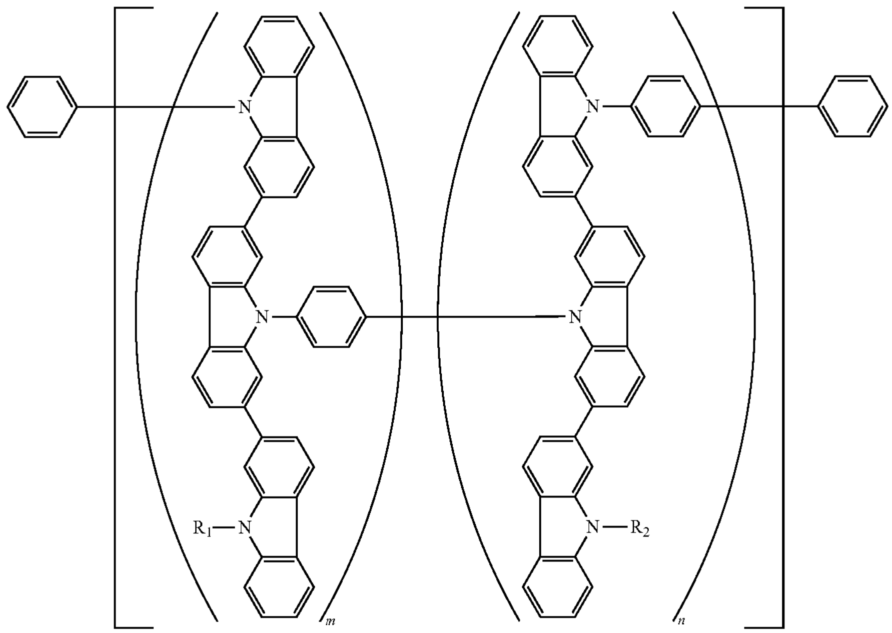
| Com. | R1 | R2 |
|---|---|---|
| 169-1 | H-1 | H-29 |
| 169-2 | H-2 | |
| 169-3 | H-3 | |
| 169-4 | H-4 | |
| 169-5 | H-5 | |
| 169-6 | H-6 | |
| 169-7 | H-7 | |
| 169-8 | H-8 | |
| 169-9 | H-9 | |
| 169-10 | H-10 | |
| 169-11 | H-11 | |
| 169-12 | H-12 | |
| 169-13 | H-13 | |
| 169-14 | H-14 | |
| 169-15 | H-15 | |
| 169-16 | H-16 | |
| 169-17 | H-17 | |
| 169-18 | H-18 | |
| 169-19 | H-1 | H-30 |
| 169-20 | H-2 | |
| 169-21 | H-3 | |
| 169-22 | H-4 | |
| 169-23 | H-5 | |
| 169-24 | H-6 | |
| 169-25 | H-7 | |
| 169-26 | H-8 | |
| 169-27 | H-9 | |
| 169-28 | H-10 | |
| 169-29 | H-11 | |
| 169-30 | H-12 | |
| 169-31 | H-13 | |
| 169-32 | H-14 | |
| 169-33 | H-15 | |
| 169-34 | H-16 | |
| 169-35 | H-17 | |
| 169-36 | H-18 | |

TABLE 170
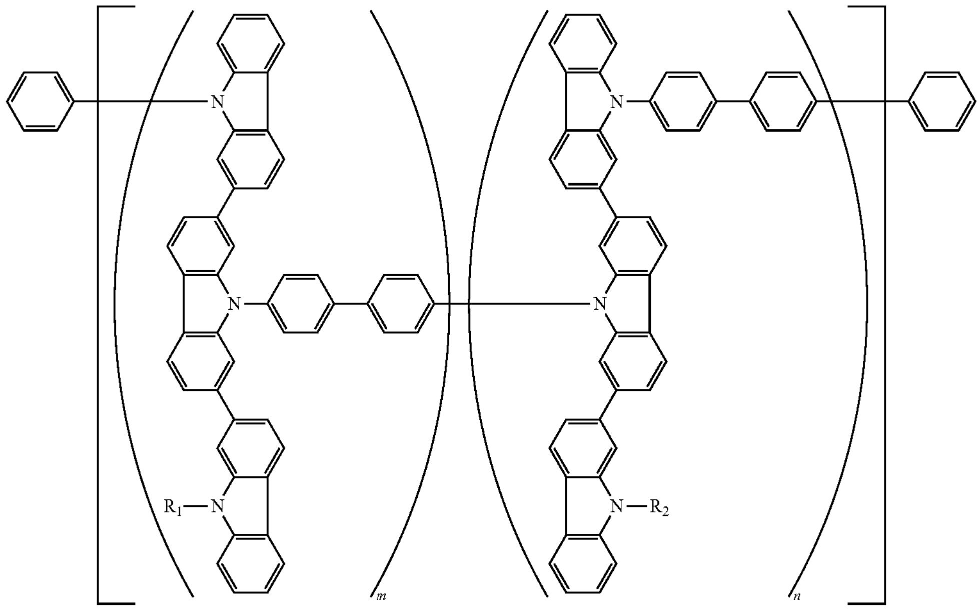
| Com. | R1 | R2 |
|---|---|---|
| 170-1 | H-1 | H-29 |
| 170-2 | H-2 | |
| 170-3 | H-3 | |
| 170-4 | H-4 | |
| 170-5 | H-5 | |
| 170-6 | H-6 | |
| 170-7 | H-7 | |
| 170-8 | H-8 | |
| 170-9 | H-9 | |
| 170-10 | H-10 | |
| 170-11 | H-11 | |
| 170-12 | H-12 | |
| 170-13 | H-13 | |
| 170-14 | H-14 | |
| 170-15 | H-15 | |
| 170-16 | H-16 | |
| 170-17 | H-17 | |
| 170-18 | H-18 | |
| 170-19 | H-1 | H-30 |
| 170-20 | H-2 | |
| 170-21 | H-3 | |
| 170-22 | H-4 | |
| 170-23 | H-5 | |
| 170-24 | H-6 | |
| 170-25 | H-7 | |
| 170-26 | H-8 | |
| 170-27 | H-9 | |
| 170-28 | H-10 | |
| 170-29 | H-11 | |
| 170-30 | H-12 | |
| 170-31 | H-13 | |
| 170-32 | H-14 | |
| 170-33 | H-15 | |
| 170-34 | H-16 | |
| 170-35 | H-17 | |
| 170-36 | H-18 | |

TABLE 171
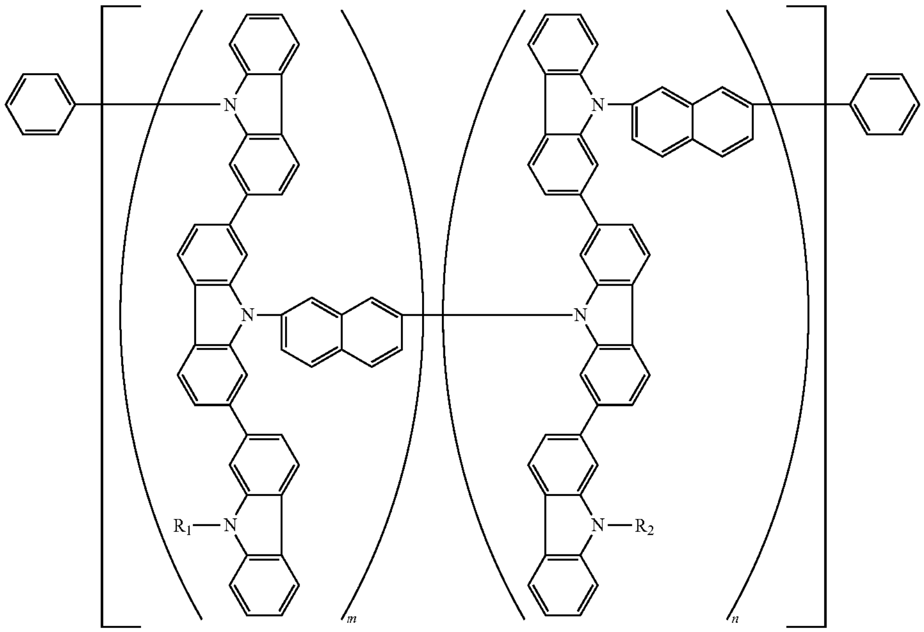
| Com. | R1 | R2 |
|---|---|---|
| 171-1 | H-1 | H-29 |
| 171-2 | H-2 | |
| 171-3 | H-3 | |
| 171-4 | H-4 | |
| 171-5 | H-5 | |
| 171-6 | H-6 | |
| 171-7 | H-7 | |
| 171-8 | H-8 | |
| 171-9 | H-9 | |
| 171-10 | H-10 | |
| 171-11 | H-11 | |
| 171-12 | H-12 | |
| 171-13 | H-13 | |
| 171-14 | H-14 | |
| 171-15 | H-15 | |
| 171-16 | H-16 | |
| 171-17 | H-17 | |
| 171-18 | H-18 | |
| 171-19 | H-1 | H-30 |
| 171-20 | H-2 | |
| 171-21 | H-3 | |
| 171-22 | H-4 | |
| 171-23 | H-5 | |
| 171-24 | H-6 | |
| 171-25 | H-7 | |
| 171-26 | H-8 | |
| 171-27 | H-9 | |
| 171-28 | H-10 | |
| 171-29 | H-11 | |
| 171-30 | H-12 | |
| 171-31 | H-13 | |
| 171-32 | H-14 | |
| 171-33 | H-15 | |
| 171-34 | H-16 | |
| 171-35 | H-17 | |
| 171-36 | H-18 | |

TABLE 172
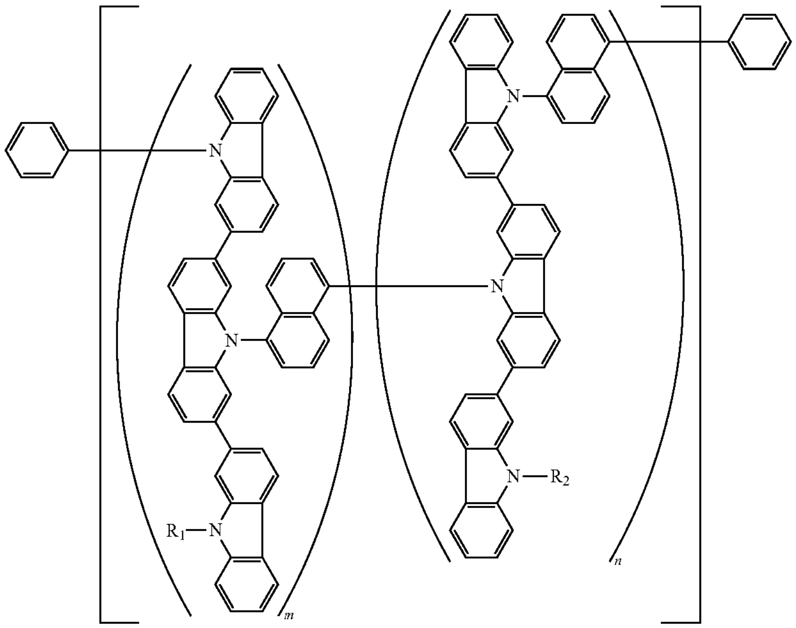
| Com. | R1 | R2 |
|---|---|---|
| 172-1 | H-1 | H-29 |
| 172-2 | H-2 | |
| 172-3 | H-3 | |
| 172-4 | H-4 | |
| 172-5 | H-5 | |
| 172-6 | H-6 | |
| 172-7 | H-7 | |
| 172-8 | H-8 | |
| 172-9 | H-9 | |
| 172-10 | H-10 | |
| 172-11 | H-11 | |
| 172-12 | H-12 | |
| 172-13 | H-13 | |
| 172-14 | H-14 | |
| 172-15 | H-15 | |
| 172-16 | H-16 | |
| 172-17 | H-17 | |
| 172-18 | H-18 | |
| 172-19 | H-1 | H-30 |
| 172-20 | H-2 | |
| 172-21 | H-3 | |
| 172-22 | H-4 | |
| 172-23 | H-5 | |
| 172-24 | H-6 | |
| 172-25 | H-7 | |
| 172-26 | H-8 | |
| 172-27 | H-9 | |
| 172-28 | H-10 | |
| 172-29 | H-11 | |
| 172-30 | H-12 | |
| 172-31 | H-13 | |
| 172-32 | H-14 | |
| 172-33 | H-15 | |
| 172-34 | H-16 | |
| 172-35 | H-17 | |
| 172-36 | H-18 | |

TABLE 173
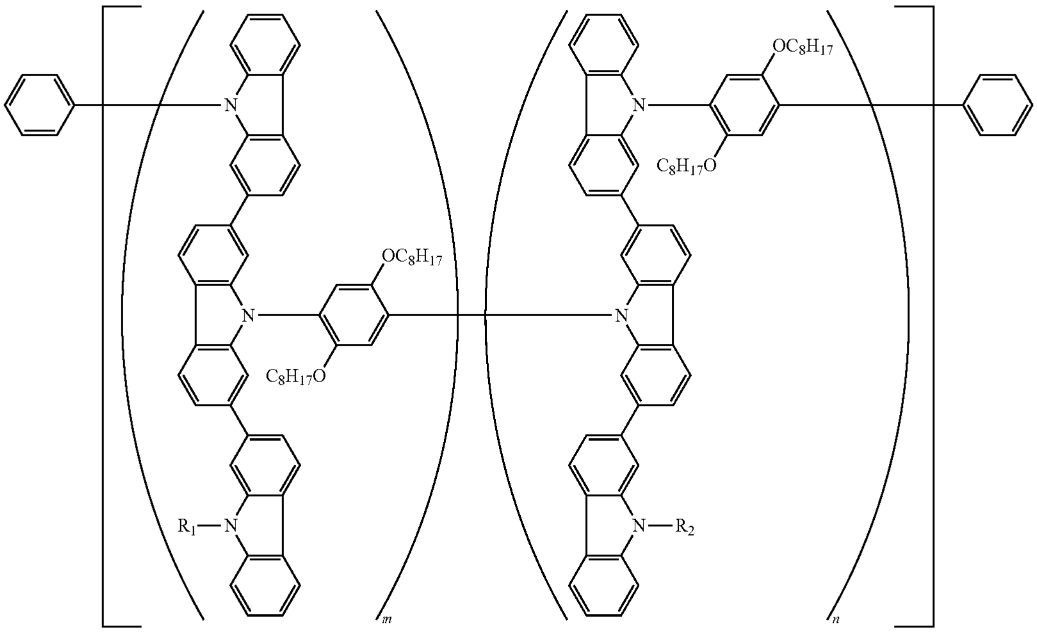
| Com. | R1 | R2 |
|---|---|---|
| 173-1 | H-1 | H-29 |
| 173-2 | H-2 | |
| 173-3 | H-3 | |
| 173-4 | H-4 | |
| 173-5 | H-5 | |
| 173-6 | H-6 | |
| 173-7 | H-7 | |
| 173-8 | H-8 | |
| 173-9 | H-9 | |
| 173-10 | H-10 | |
| 173-11 | H-11 | |
| 173-12 | H-12 | |
| 173-13 | H-13 | |
| 173-14 | H-14 | |
| 173-15 | H-15 | |
| 173-16 | H-16 | |
| 173-17 | H-17 | |
| 173-18 | H-18 | |
| 173-19 | H-1 | H-30 |
| 173-20 | H-2 | |
| 173-21 | H-3 | |
| 173-22 | H-4 | |
| 173-23 | H-5 | |
| 173-24 | H-6 | |
| 173-25 | H-7 | |
| 173-26 | H-8 | |
| 173-27 | H-9 | |
| 173-28 | H-10 | |
| 173-29 | H-11 | |
| 173-30 | H-12 | |
| 173-31 | H-13 | |
| 173-32 | H-14 | |
| 173-33 | H-15 | |
| 173-34 | H-16 | |
| 173-35 | H-17 | |
| 173-36 | H-18 | |

TABLE 174
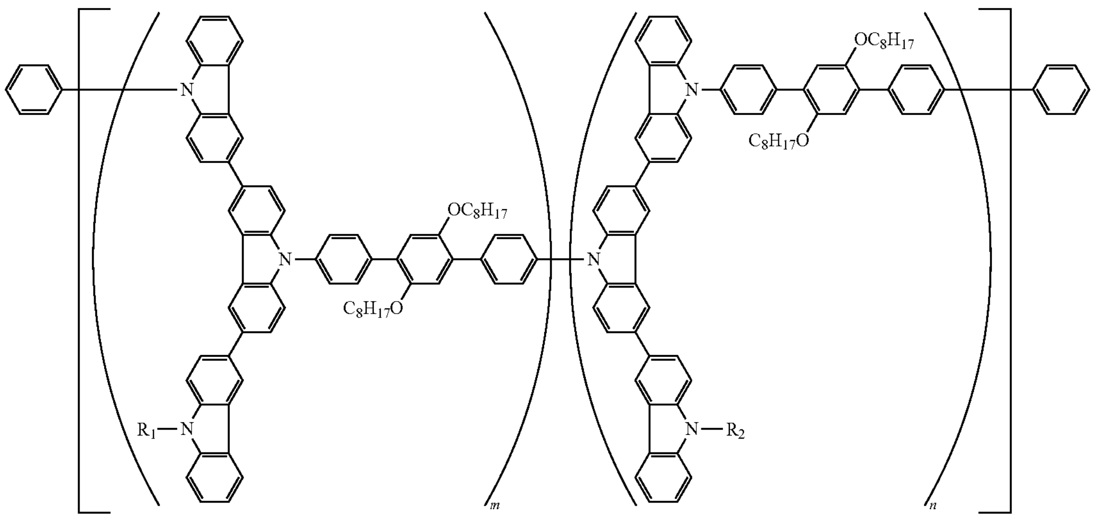
| Com. | R1 | R2 |
|---|---|---|
| 174-1 | H-1 | H-29 |
| 174-2 | H-2 | |
| 174-3 | H-3 | |
| 174-4 | H-4 | |
| 174-5 | H-5 | |
| 174-6 | H-6 | |
| 174-7 | H-7 | |
| 174-8 | H-8 | |
| 174-9 | H-9 | |
| 174-10 | H-10 | |
| 174-11 | H-11 | |
| 174-12 | H-12 | |
| 174-13 | H-13 | |
| 174-14 | H-14 | |
| 174-15 | H-15 | |
| 174-16 | H-16 | |
| 174-17 | H-17 | |
| 174-18 | H-18 | |
| 174-19 | H-1 | H-30 |
| 174-20 | H-2 | |
| 174-21 | H-3 | |
| 174-22 | H-4 | |
| 174-23 | H-5 | |
| 174-24 | H-6 | |
| 174-25 | H-7 | |
| 174-26 | H-8 | |
| 174-27 | H-9 | |
| 174-28 | H-10 | |
| 174-29 | H-11 | |
| 174-30 | H-12 | |
| 174-31 | H-13 | |
| 174-32 | H-14 | |
| 174-33 | H-15 | |
| 174-34 | H-16 | |
| 174-35 | H-17 | |
| 174-36 | H-18 | |

TABLE 175
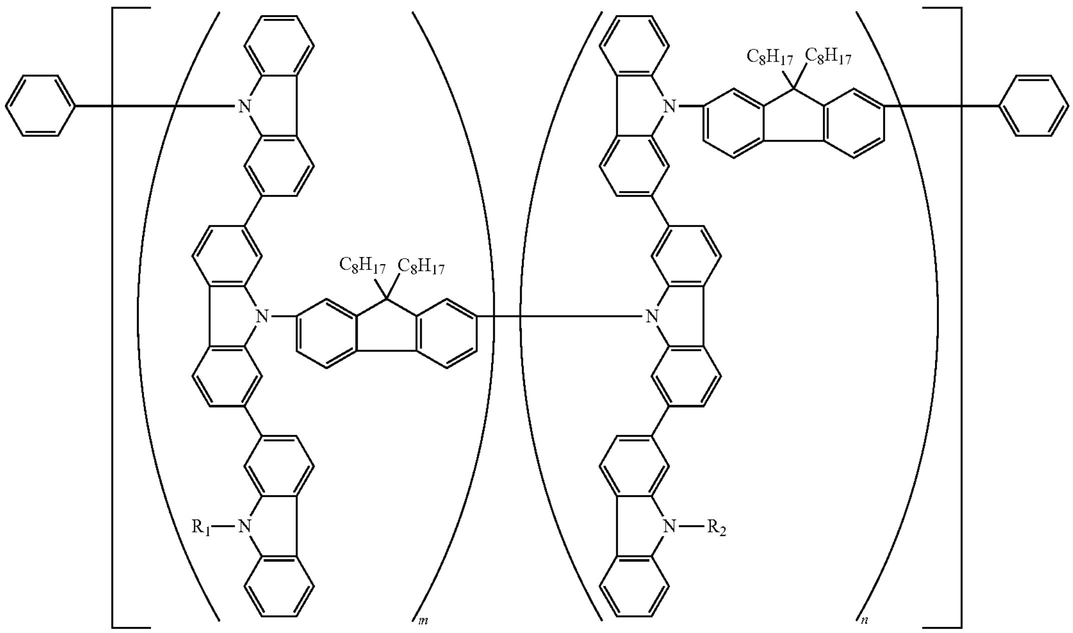
| Com. | R1 | R2 |
|---|---|---|
| 175-1 | H-1 | H-29 |
| 175-2 | H-2 | |
| 175-3 | H-3 | |
| 175-4 | H-4 | |
| 175-5 | H-5 | |
| 175-6 | H-6 | |
| 175-7 | H-7 | |
| 175-8 | H-8 | |
| 175-9 | H-9 | |
| 175-10 | H-10 | |
| 175-11 | H-11 | |
| 175-12 | H-12 | |
| 175-13 | H-13 | |
| 175-14 | H-14 | |
| 175-15 | H-15 | |
| 175-16 | H-16 | |
| 175-17 | H-17 | |
| 175-18 | H-18 | |
| 175-19 | H-1 | H-30 |
| 175-20 | H-2 | |
| 175-21 | H-3 | |
| 175-22 | H-4 | |
| 175-23 | H-5 | |
| 175-24 | H-6 | |
| 175-25 | H-7 | |
| 175-26 | H-8 | |
| 175-27 | H-9 | |
| 175-28 | H-10 | |
| 175-29 | H-11 | |
| 175-30 | H-12 | |
| 175-31 | H-13 | |
| 175-32 | H-14 | |
| 175-33 | H-15 | |
| 175-34 | H-16 | |
| 175-35 | H-17 | |
| 175-36 | H-18 | |

TABLE 176
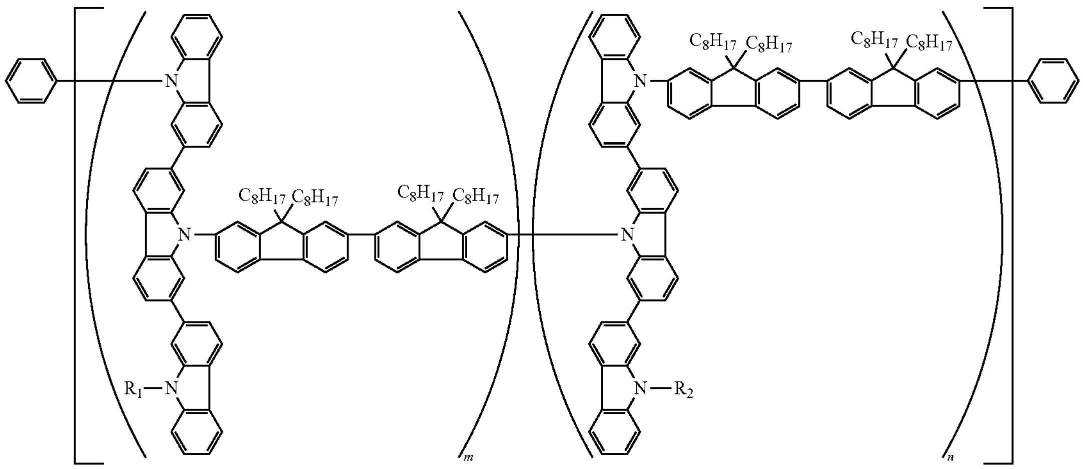
| Com. | R1 | R2 |
|---|---|---|
| 176-1 | H-1 | H-29 |
| 176-2 | H-2 | |
| 176-3 | H-3 | |
| 176-4 | H-4 | |
| 176-5 | H-5 | |
| 176-6 | H-6 | |
| 176-7 | H-7 | |
| 176-8 | H-8 | |
| 176-9 | H-9 | |
| 176-10 | H-10 | |
| 176-11 | H-11 | |
| 176-12 | H-12 | |
| 176-13 | H-13 | |
| 176-14 | H-14 | |
| 176-15 | H-15 | |
| 176-16 | H-16 | |
| 176-17 | H-17 | |
| 176-18 | H-18 | |
| 176-19 | H-1 | H-30 |
| 176-20 | H-2 | |
| 176-21 | H-3 | |
| 176-22 | H-4 | |
| 176-23 | H-5 | |
| 176-24 | H-6 | |
| 176-25 | H-7 | |
| 176-26 | H-8 | |
| 176-27 | H-9 | |
| 176-28 | H-10 | |
| 176-29 | H-11 | |
| 176-30 | H-12 | |
| 176-31 | H-13 | |
| 176-32 | H-14 | |
| 176-33 | H-15 | |
| 176-34 | H-16 | |
| 176-35 | H-17 | |
| 176-36 | H-18 | |

TABLE 177
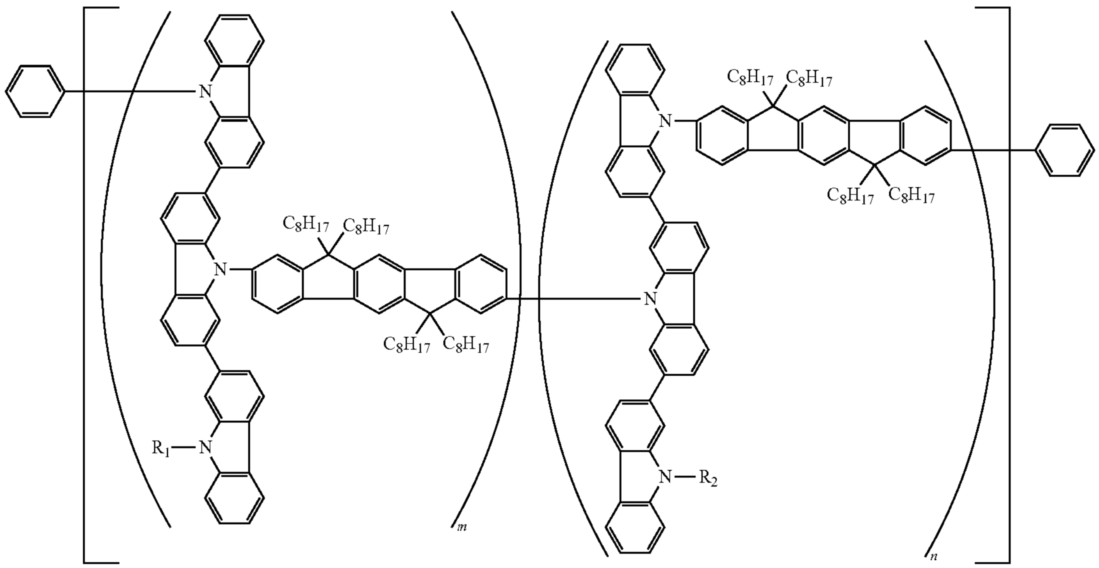
| Com. | R1 | R2 |
| --- | --- | --- |
| 177-1 | H-1 | H-29 |
| 177-2 | H-2 | |
| 177-3 | H-3 | |
| 177-4 | H-4 | |
| 177-5 | H-5 | |
| 177-6 | H-6 | |
| 177-7 | H-7 | |
| 177-8 | H-8 | |
| 177-9 | H-9 | |
| 177-10 | H-10 | |
| 177-11 | H-11 | |
| 177-12 | H-12 | |
| 177-13 | H-13 | |
| 177-14 | H-14 | |
| 177-15 | H-15 | |
| 177-16 | H-16 | |
| 177-17 | H-17 | |
| 177-18 | H-18 | |
| 177-19 | H-1 | H-30 |
| 177-20 | H-2 | |
| 177-21 | H-3 | |
| 177-22 | H-4 | |
| 177-23 | H-5 | |
| 177-24 | H-6 | |
| 177-25 | H-7 | |
| 177-26 | H-8 | |
| 177-27 | H-9 | |
| 177-28 | H-10 | |
| 177-29 | H-11 | |
| 177-30 | H-12 | |
| 177-31 | H-13 | |
| 177-32 | H-14 | |
| 177-33 | H-15 | |
| 177-34 | H-16 | |
| 177-35 | H-17 | |
| 177-36 | H-18 | |

TABLE 178
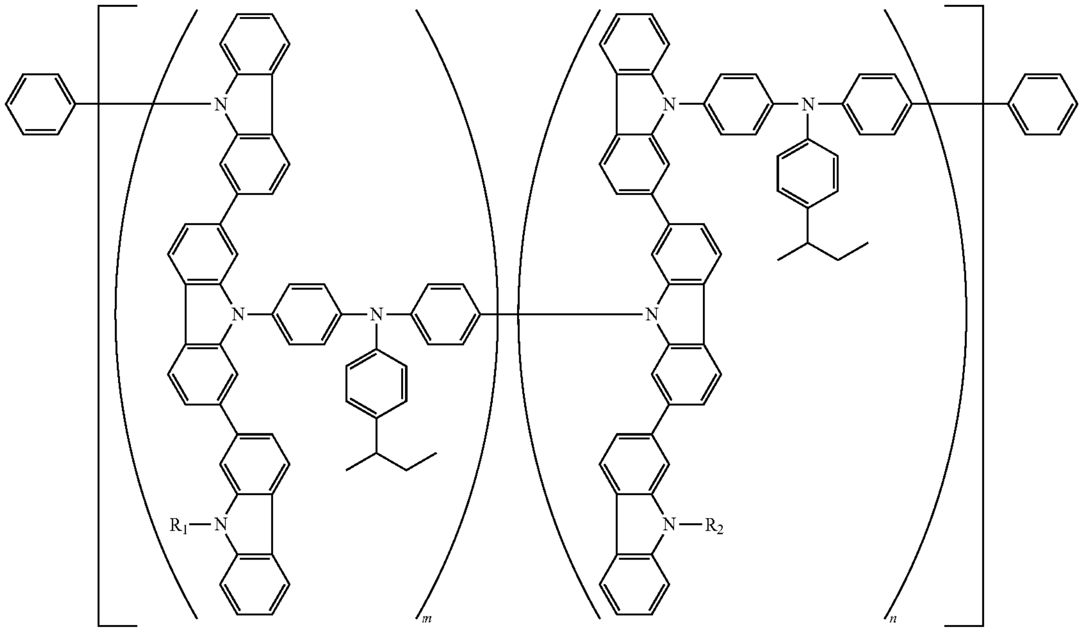
| Com. | R1 | R2 |
|---|---|---|
| 178-1 | H-1 | H-29 |
| 178-2 | H-2 | |
| 178-3 | H-3 | |
| 178-4 | H-4 | |
| 178-5 | H-5 | |
| 178-6 | H-6 | |
| 178-7 | H-7 | |
| 178-8 | H-8 | |
| 178-9 | H-9 | |
| 178-10 | H-10 | |
| 178-11 | H-11 | |
| 178-12 | H-12 | |
| 178-13 | H-13 | |
| 178-14 | H-14 | |
| 178-15 | H-15 | |
| 178-16 | H-16 | |
| 178-17 | H-17 | |
| 178-18 | H-18 | |
| 178-19 | H-1 | H-30 |
| 178-20 | H-2 | |
| 178-21 | H-3 | |
| 178-22 | H-4 | |
| 178-23 | H-5 | |
| 178-24 | H-6 | |
| 178-25 | H-7 | |
| 178-26 | H-8 | |
| 178-27 | H-9 | |
| 178-28 | H-10 | |
| 178-29 | H-11 | |
| 178-30 | H-12 | |
| 178-31 | H-13 | |
| 178-32 | H-14 | |
| 178-33 | H-15 | |
| 178-34 | H-16 | |
| 178-35 | H-17 | |
| 178-36 | H-18 | |

TABLE 179
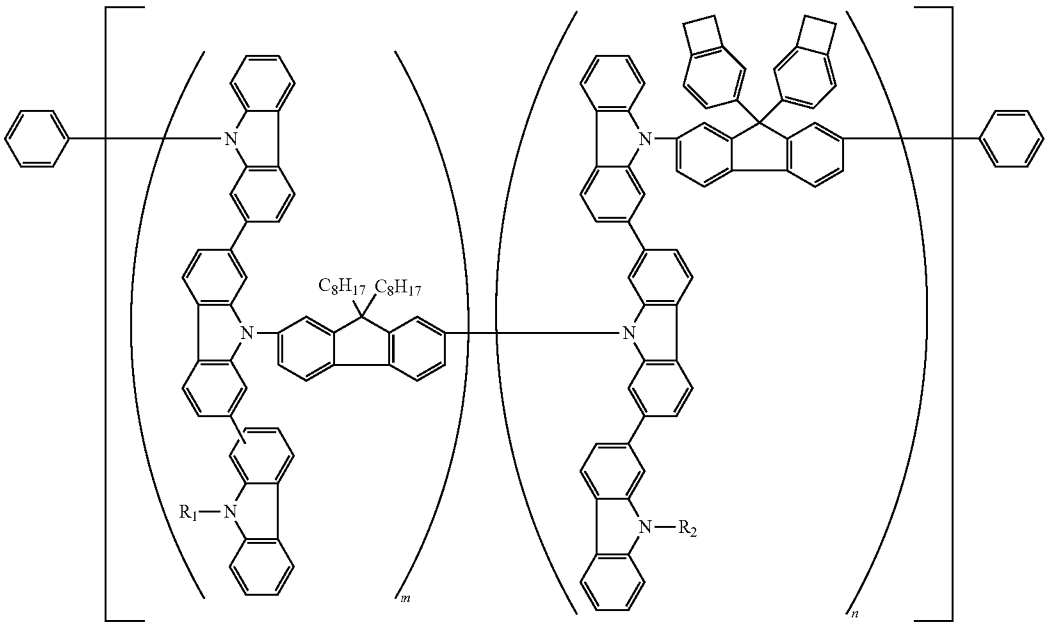
| Com. | R1 = R2 |
|---|---|
| 179-1 | H-1 |
| 179-2 | H-2 |
| 179-3 | H-3 |
| 179-4 | H-4 |
| 179-5 | H-5 |
| 179-6 | H-6 |
| 179-7 | H-7 |
| 179-8 | H-8 |
| 179-9 | H-9 |
| 179-10 | H-10 |
| 179-11 | H-11 |
| 179-12 | H-12 |
| 179-13 | H-13 |
| 179-14 | H-14 |
| 179-15 | H-15 |
| 179-16 | H-16 |
| 179-17 | H-17 |
| 179-18 | H-18 |

TABLE 180
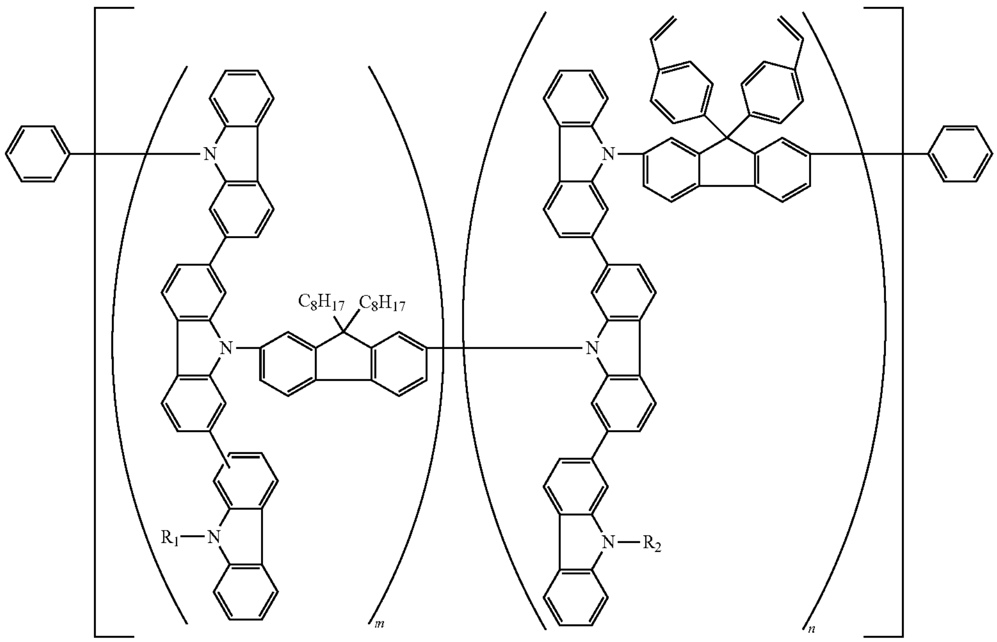
| Com. | R1 = R2 |
|---|---|
| 180-1 | H-1 |
| 180-2 | H-2 |
| 180-3 | H-3 |
| 180-4 | H-4 |
| 180-5 | H-5 |
| 180-6 | H-6 |
| 180-7 | H-7 |
| 180-8 | H-8 |
| 180-9 | H-9 |
| 180-10 | H-10 |
| 180-11 | H-11 |
| 180-12 | H-12 |
| 180-13 | H-13 |
| 180-14 | H-14 |
| 180-15 | H-15 |
| 180-16 | H-16 |
| 180-17 | H-17 |
| 180-18 | H-18 |

TABLE 181
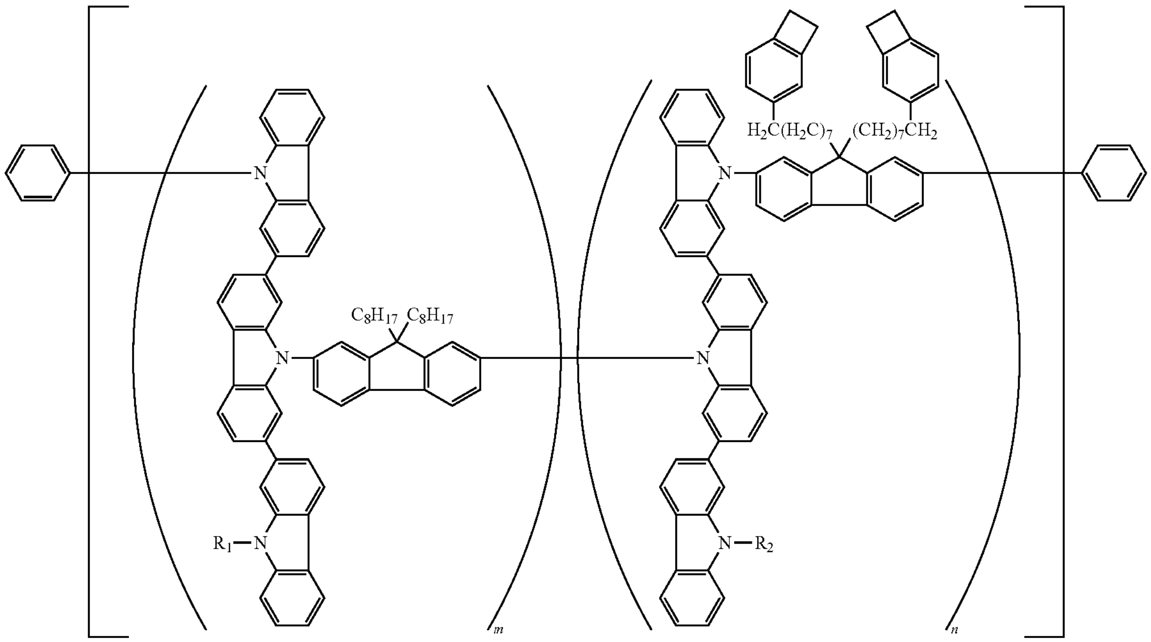
| Com. | R1 = R2 |
|---|---|
| 181-1 | H-1 |
| 181-2 | H-2 |
| 181-3 | H-3 |
| 181-4 | H-4 |
| 181-5 | H-5 |
| 181-6 | H-6 |
| 181-7 | H-7 |
| 181-8 | H-8 |
| 181-9 | H-9 |
| 181-10 | H-10 |
| 181-11 | H-11 |
| 181-12 | H-12 |
| 181-13 | H-13 |
| 181-14 | H-14 |
| 181-15 | H-15 |
| 181-16 | H-16 |
| 181-17 | H-17 |
| 181-18 | H-18 |

TABLE 182
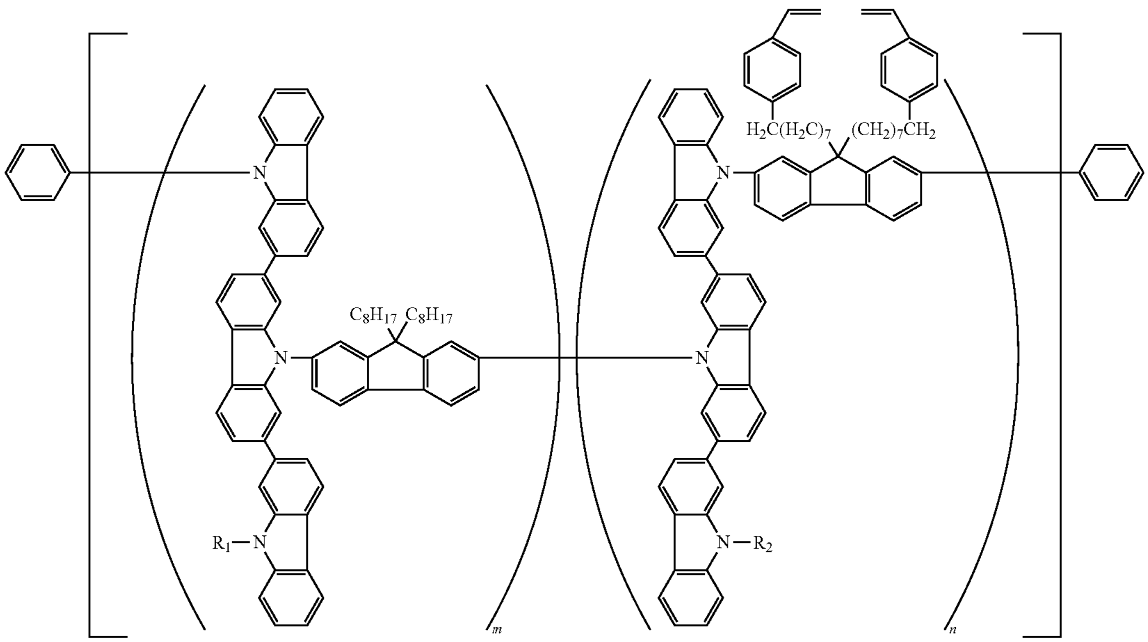
| Com. | R1 = R2 |
|---|---|
| 182-1 | H-1 |
| 182-2 | H-2 |
| 182-3 | H-3 |
| 182-4 | H-4 |
| 182-5 | H-5 |
| 182-6 | H-6 |
| 182-7 | H-7 |
| 182-8 | H-8 |
| 182-9 | H-9 |
| 182-10 | H-10 |
| 182-11 | H-11 |
| 182-12 | H-12 |
| 182-13 | H-13 |
| 182-14 | H-14 |
| 182-15 | H-15 |
| 182-16 | H-16 |
| 182-17 | H-17 |
| 182-18 | H-18 |

TABLE 183
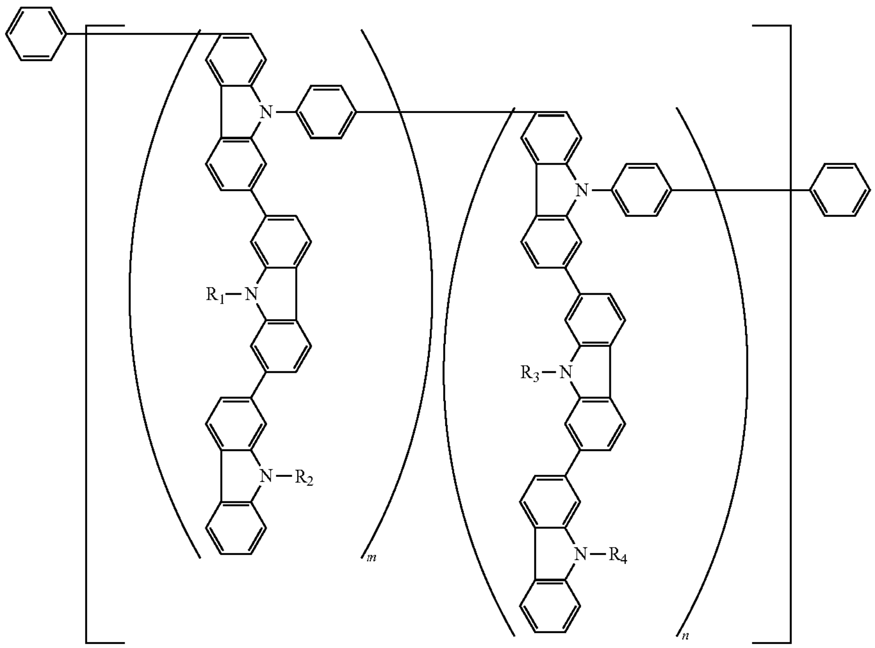
| Com. | R1 = R3 | R2 | R4 |
|---|---|---|---|
| 183-1 | H-1 | H-1 | H-29 |
| 183-2 | H-2 | | |
| 183-3 | H-3 | | |
| 183-4 | H-4 | | |
| 183-5 | H-5 | | |
| 183-6 | H-6 | | |
| 183-7 | H-7 | | |
| 183-8 | H-8 | | |
| 183-9 | H-9 | | |
| 183-10 | H-10 | | |
| 183-11 | H-11 | | |
| 183-12 | H-12 | | |
| 183-13 | H-13 | | |
| 183-14 | H-14 | | |
| 183-15 | H-15 | | |
| 183-16 | H-16 | | |
| 183-17 | H-17 | | |
| 183-18 | H-18 | | |
| 183-19 | H-1 | H-1 | H-30 |
| 183-20 | H-2 | | |
| 183-21 | H-3 | | |
| 183-22 | H-4 | | |
| 183-23 | H-5 | | |
| 183-24 | H-6 | | |
| 183-25 | H-7 | | |
| 183-26 | H-8 | | |
| 183-27 | H-9 | | |
| 183-28 | H-10 | | |
| 183-29 | H-11 | | |
| 183-30 | H-12 | | |
| 183-31 | H-13 | | |
| 183-32 | H-14 | | |
| 183-33 | H-15 | | |
| 183-34 | H-16 | | |
| 183-35 | H-17 | | |
| 183-36 | H-18 | | |

TABLE 184
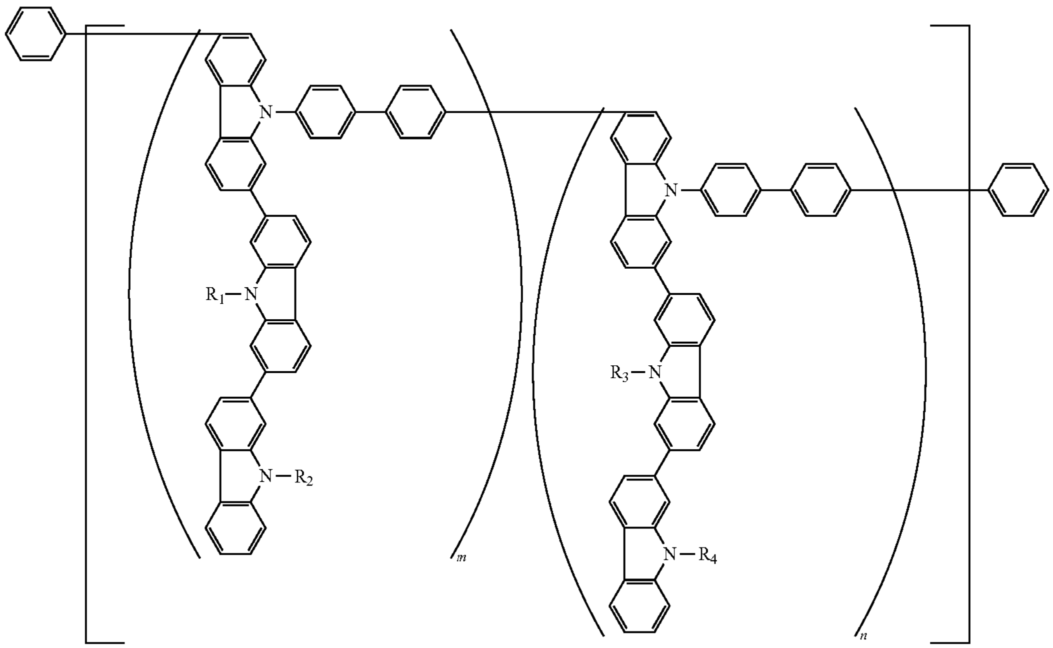
| Com. | R1 = R3 | R2 | R4 |
|---|---|---|---|
| 184-1 | H-1 | H-1 | H-29 |
| 184-2 | H-2 | | |
| 184-3 | H-3 | | |
| 184-4 | H-4 | | |
| 184-5 | H-5 | | |
| 184-6 | H-6 | | |
| 184-7 | H-7 | | |
| 184-8 | H-8 | | |
| 184-9 | H-9 | | |
| 184-10 | H-10 | | |
| 184-11 | H-11 | | |
| 184-12 | H-12 | | |
| 184-13 | H-13 | | |
| 184-14 | H-14 | | |
| 184-15 | H-15 | | |
| 184-16 | H-16 | | |
| 184-17 | H-17 | | |
| 184-18 | H-18 | | |
| 184-19 | H-1 | H-1 | H-30 |
| 184-20 | H-2 | | |
| 184-21 | H-3 | | |
| 184-22 | H-4 | | |
| 184-23 | H-5 | | |
| 184-24 | H-6 | | |
| 184-25 | H-7 | | |
| 184-26 | H-8 | | |
| 184-27 | H-9 | | |
| 184-28 | H-10 | | |
| 184-29 | H-11 | | |
| 184-30 | H-12 | | |
| 184-31 | H-13 | | |
| 184-32 | H-14 | | |
| 184-33 | H-15 | | |
| 184-34 | H-16 | | |
| 184-35 | H-17 | | |
| 184-36 | H-18 | | |

TABLE 185
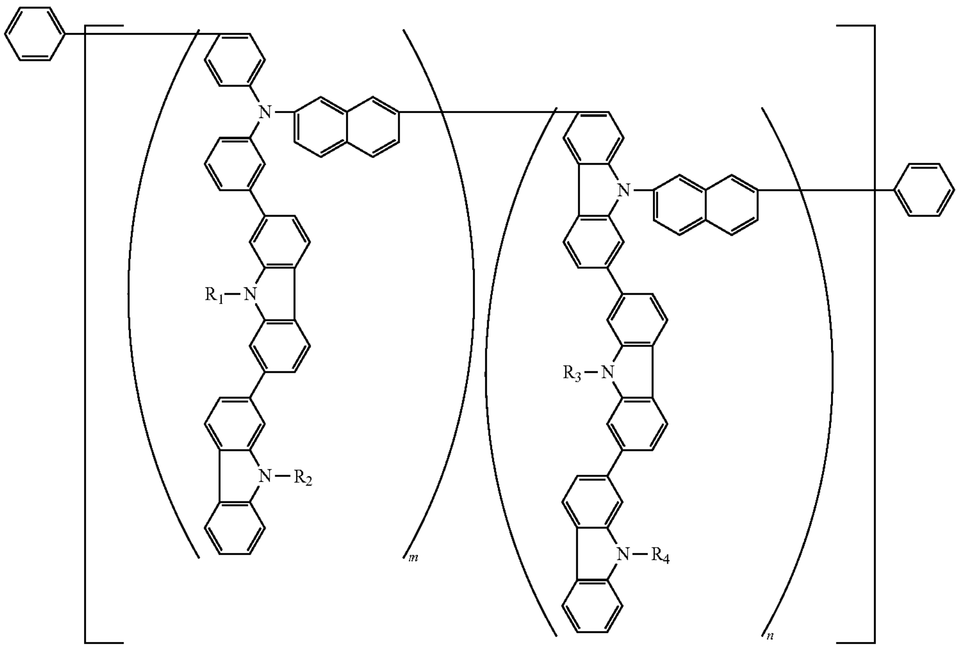
| Com. | R1 = R3 | R2 | R4 |
|---|---|---|---|
| 185-1 | H-1 | H-1 | H-29 |
| 185-2 | H-2 | | |
| 185-3 | H-3 | | |
| 185-4 | H-4 | | |
| 185-5 | H-5 | | |
| 185-6 | H-6 | | |
| 185-7 | H-7 | | |
| 185-8 | H-8 | | |
| 185-9 | H-9 | | |
| 185-10 | H-10 | | |
| 185-11 | H-11 | | |
| 185-12 | H-12 | | |
| 185-13 | H-13 | | |
| 185-14 | H-14 | | |
| 185-15 | H-15 | | |
| 185-16 | H-16 | | |
| 185-17 | H-17 | | |
| 185-18 | H-18 | | |
| 185-19 | H-1 | H-1 | H-30 |
| 185-20 | H-2 | | |
| 185-21 | H-3 | | |
| 185-22 | H-4 | | |
| 185-23 | H-5 | | |
| 185-24 | H-6 | | |
| 185-25 | H-7 | | |
| 185-26 | H-8 | | |
| 185-27 | H-9 | | |
| 185-28 | H-10 | | |
| 185-29 | H-11 | | |
| 185-30 | H-12 | | |
| 185-31 | H-13 | | |
| 185-32 | H-14 | | |
| 185-33 | H-15 | | |
| 185-34 | H-16 | | |
| 185-35 | H-17 | | |
| 185-36 | H-18 | | |

TABLE 186
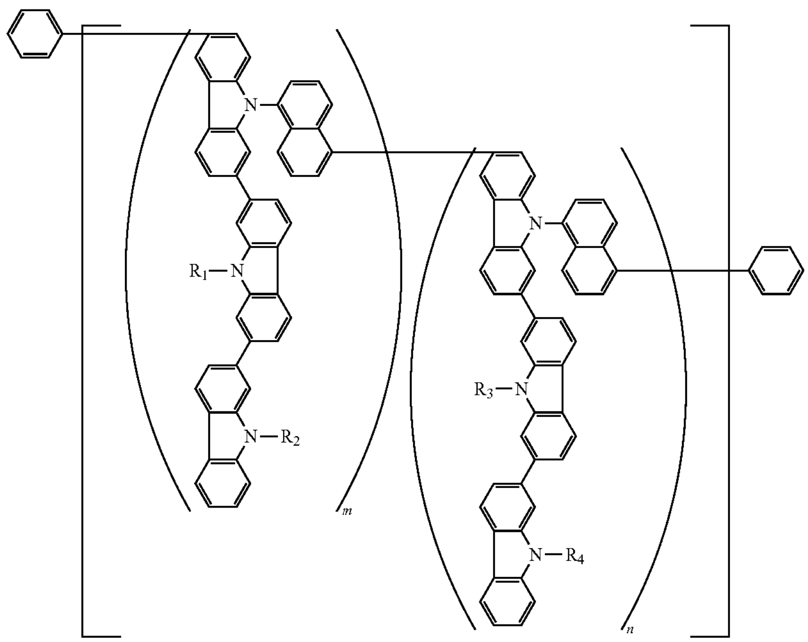
| Com. | R1 = R3 | R2 | R4 |
| --- | --- | --- | --- |
| 186-1 | H-1 | H-1 | H-29 |
| 186-2 | H-2 | | |
| 186-3 | H-3 | | |
| 186-4 | H-4 | | |
| 186-5 | H-5 | | |
| 186-6 | H-6 | | |
| 186-7 | H-7 | | |
| 186-8 | H-8 | | |
| 186-9 | H-9 | | |
| 186-10 | H-10 | | |
| 186-11 | H-11 | | |
| 186-12 | H-12 | | |
| 186-13 | H-13 | | |
| 186-14 | H-14 | | |
| 186-15 | H-15 | | |
| 186-16 | H-16 | | |
| 186-17 | H-17 | | |
| 186-18 | H-18 | | |
| 186-19 | H-1 | H-1 | H-30 |
| 186-20 | H-2 | | |
| 186-21 | H-3 | | |
| 186-22 | H-4 | | |
| 186-23 | H-5 | | |
| 186-24 | H-6 | | |
| 186-25 | H-7 | | |
| 186-26 | H-8 | | |
| 186-27 | H-9 | | |
| 186-28 | H-10 | | |
| 186-29 | H-11 | | |
| 186-30 | H-12 | | |
| 186-31 | H-13 | | |
| 186-32 | H-14 | | |
| 186-33 | H-15 | | |
| 186-34 | H-16 | | |
| 186-35 | H-17 | | |
| 186-36 | H-18 | | |

TABLE 187
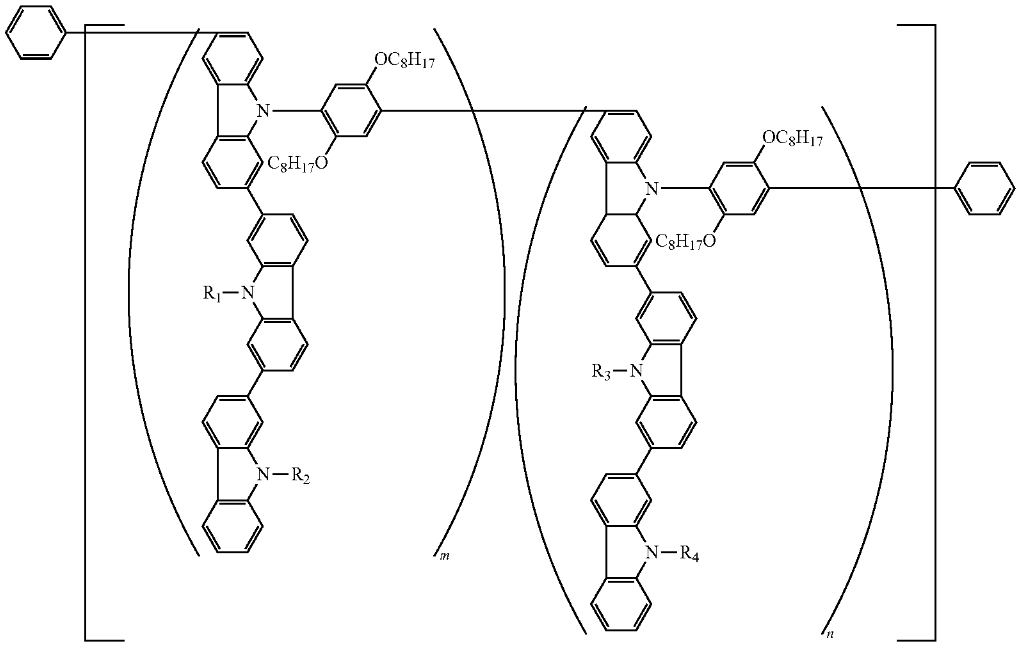
| Com. | R1 = R3 | R2 | R4 |
|---|---|---|---|
| 187-1 | H-1 | H-1 | H-29 |
| 187-2 | H-2 | | |
| 187-3 | H-3 | | |
| 187-4 | H-4 | | |
| 187-5 | H-5 | | |
| 187-6 | H-6 | | |
| 187-7 | H-7 | | |
| 187-8 | H-8 | | |
| 187-9 | H-9 | | |
| 187-10 | H-10 | | |
| 187-11 | H-11 | | |
| 187-12 | H-12 | | |
| 187-13 | H-13 | | |
| 187-14 | H-14 | | |
| 187-15 | H-15 | | |
| 187-16 | H-16 | | |
| 187-17 | H-17 | | |
| 187-18 | H-18 | | |
| 187-19 | H-1 | H-1 | H-30 |
| 187-20 | H-2 | | |
| 187-21 | H-3 | | |
| 187-22 | H-4 | | |
| 187-23 | H-5 | | |
| 187-24 | H-6 | | |
| 187-25 | H-7 | | |
| 187-26 | H-8 | | |
| 187-27 | H-9 | | |
| 187-28 | H-10 | | |
| 187-29 | H-11 | | |
| 187-30 | H-12 | | |
| 187-31 | H-13 | | |
| 187-32 | H-14 | | |
| 187-33 | H-15 | | |
| 187-34 | H-16 | | |
| 187-35 | H-17 | | |
| 187-36 | H-18 | | |

TABLE 188
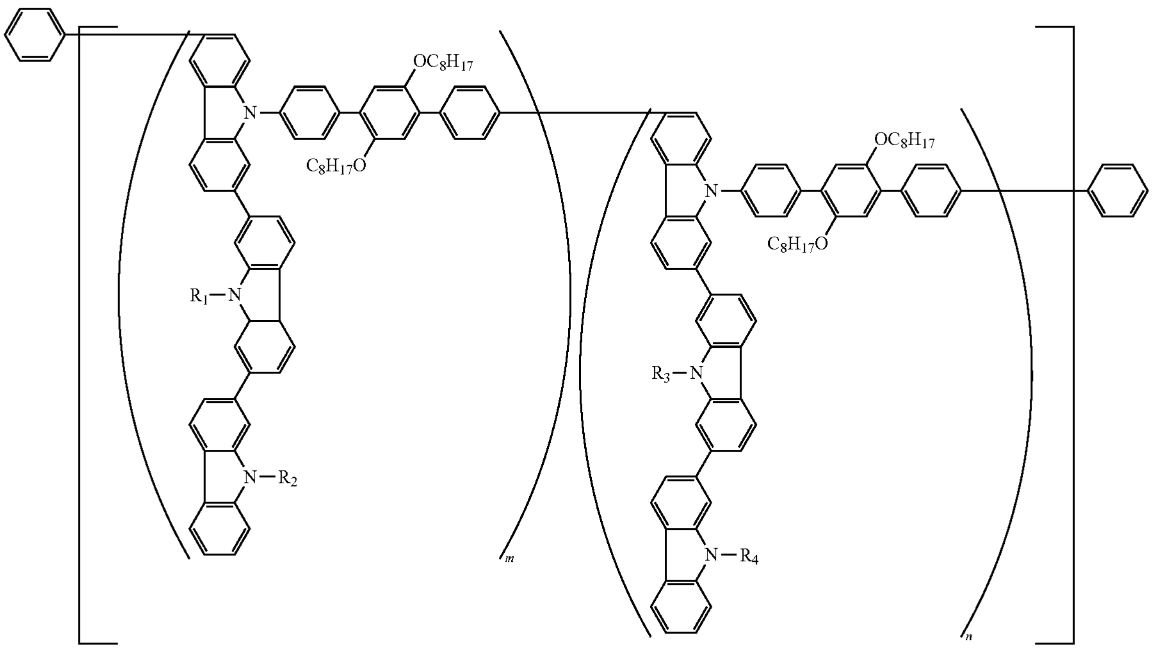
| Com. | R1 = R3 | R2 | R4 |
|---|---|---|---|
| 188-1 | H-1 | H-1 | H-29 |
| 188-2 | H-2 | | |
| 188-3 | H-3 | | |
| 188-4 | H-4 | | |
| 188-5 | H-5 | | |
| 188-6 | H-6 | | |
| 188-7 | H-7 | | |
| 188-8 | H-8 | | |
| 188-9 | H-9 | | |
| 188-10 | H-10 | | |
| 188-11 | H-11 | | |
| 188-12 | H-12 | | |
| 188-13 | H-13 | | |
| 188-14 | H-14 | | |
| 188-15 | H-15 | | |
| 188-16 | H-16 | | |
| 188-17 | H-17 | | |
| 188-18 | H-18 | | |
| 188-19 | H-1 | H-1 | H-30 |
| 188-20 | H-2 | | |
| 188-21 | H-3 | | |
| 188-22 | H-4 | | |
| 188-23 | H-5 | | |
| 188-24 | H-6 | | |
| 188-25 | H-7 | | |
| 188-26 | H-8 | | |
| 188-27 | H-9 | | |
| 188-28 | H-10 | | |
| 188-29 | H-11 | | |
| 188-30 | H-12 | | |
| 188-31 | H-13 | | |
| 188-32 | H-14 | | |
| 188-33 | H-15 | | |
| 188-34 | H-16 | | |
| 188-35 | H-17 | | |
| 188-36 | H-18 | | |

TABLE 189
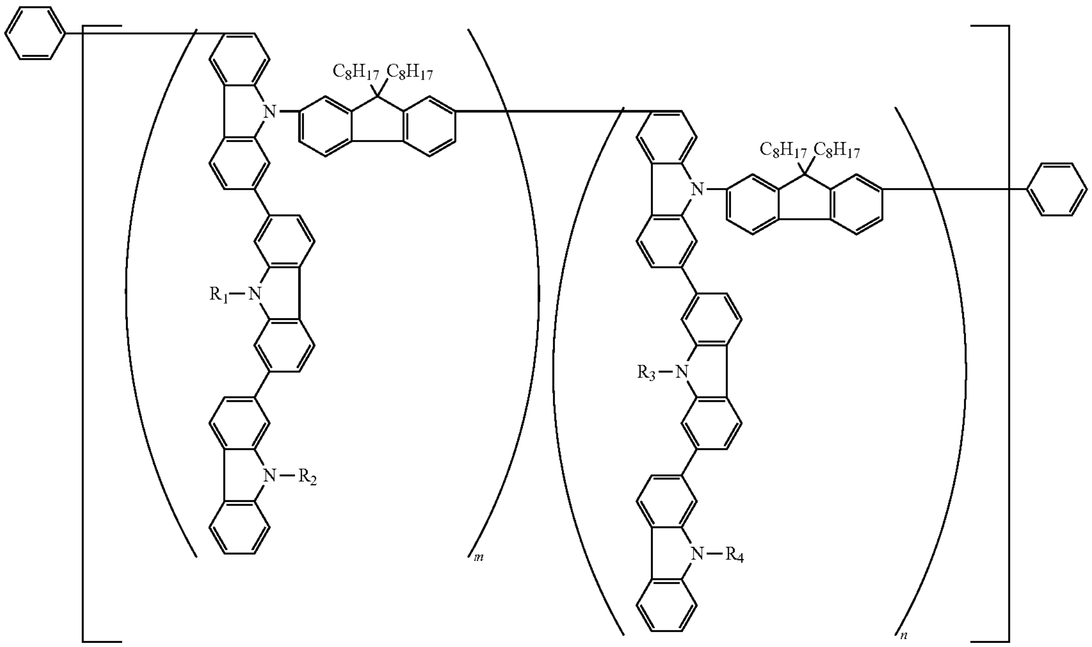
| Com. | R1 = R3 | R2 | R4 |
|---|---|---|---|
| 189-1 | H-1 | H-1 | H-29 |
| 189-2 | H-2 | | |
| 189-3 | H-3 | | |
| 189-4 | H-4 | | |
| 189-5 | H-5 | | |
| 189-6 | H-6 | | |
| 189-7 | H-7 | | |
| 189-8 | H-8 | | |
| 189-9 | H-9 | | |
| 189-10 | H-10 | | |
| 189-11 | H-11 | | |
| 189-12 | H-12 | | |
| 189-13 | H-13 | | |
| 189-14 | H-14 | | |
| 189-15 | H-15 | | |
| 189-16 | H-16 | | |
| 189-17 | H-17 | | |
| 189-18 | H-18 | | |
| 189-19 | H-1 | H-1 | H-30 |
| 189-20 | H-2 | | |
| 189-21 | H-3 | | |
| 189-22 | H-4 | | |
| 189-23 | H-5 | | |
| 189-24 | H-6 | | |
| 189-25 | H-7 | | |
| 189-26 | H-8 | | |
| 189-27 | H-9 | | |
| 189-28 | H-10 | | |
| 189-29 | H-11 | | |
| 189-30 | H-12 | | |
| 189-31 | H-13 | | |
| 189-32 | H-14 | | |
| 189-33 | H-15 | | |
| 189-34 | H-16 | | |
| 189-35 | H-17 | | |
| 189-36 | H-18 | | |

TABLE 190
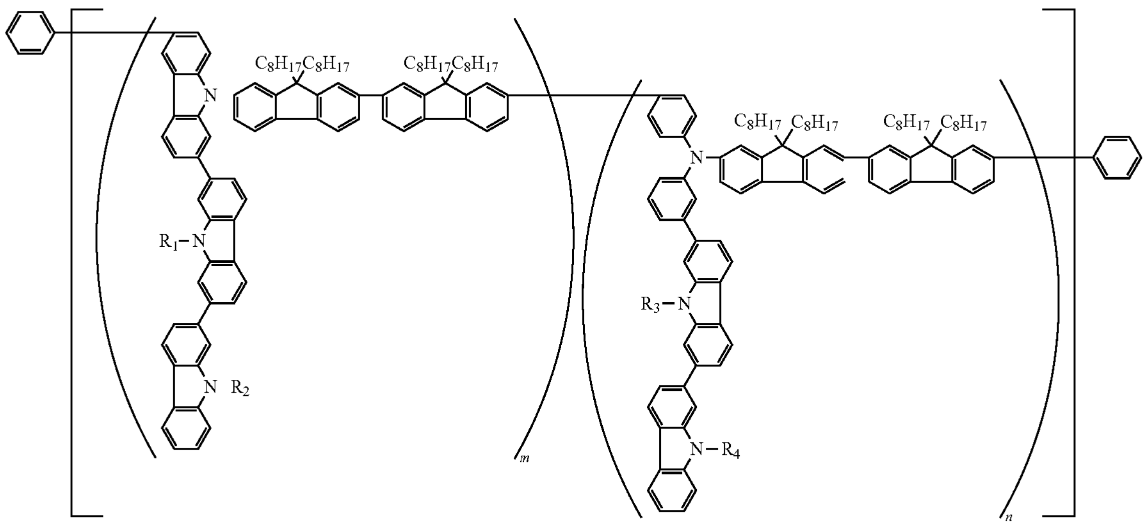
| Com. | R1 = R3 | R2 | R4 |
|---|---|---|---|
| 190-1 | H-1 | H-1 | H-29 |
| 190-2 | H-2 | | |
| 190-3 | H-3 | | |
| 190-4 | H-4 | | |
| 190-5 | H-5 | | |
| 190-6 | H-6 | | |
| 190-7 | H-7 | | |
| 190-8 | H-8 | | |
| 190-9 | H-9 | | |
| 190-10 | H-10 | | |
| 190-11 | H-11 | | |
| 190-12 | H-12 | | |
| 190-13 | H-13 | | |
| 190-14 | H-14 | | |
| 190-15 | H-15 | | |
| 190-16 | H-16 | | |
| 190-17 | H-17 | | |
| 190-18 | H-18 | | |
| 190-19 | H-1 | H-1 | H-30 |
| 190-20 | H-2 | | |
| 190-21 | H-3 | | |
| 190-22 | H-4 | | |
| 190-23 | H-5 | | |
| 190-24 | H-6 | | |
| 190-25 | H-7 | | |
| 190-26 | H-8 | | |
| 190-27 | H-9 | | |
| 190-28 | H-10 | | |
| 190-29 | H-11 | | |
| 190-30 | H-12 | | |
| 190-31 | H-13 | | |
| 190-32 | H-14 | | |
| 190-33 | H-15 | | |
| 190-34 | H-16 | | |
| 190-35 | H-17 | | |
| 190-36 | H-18 | | |

TABLE 191
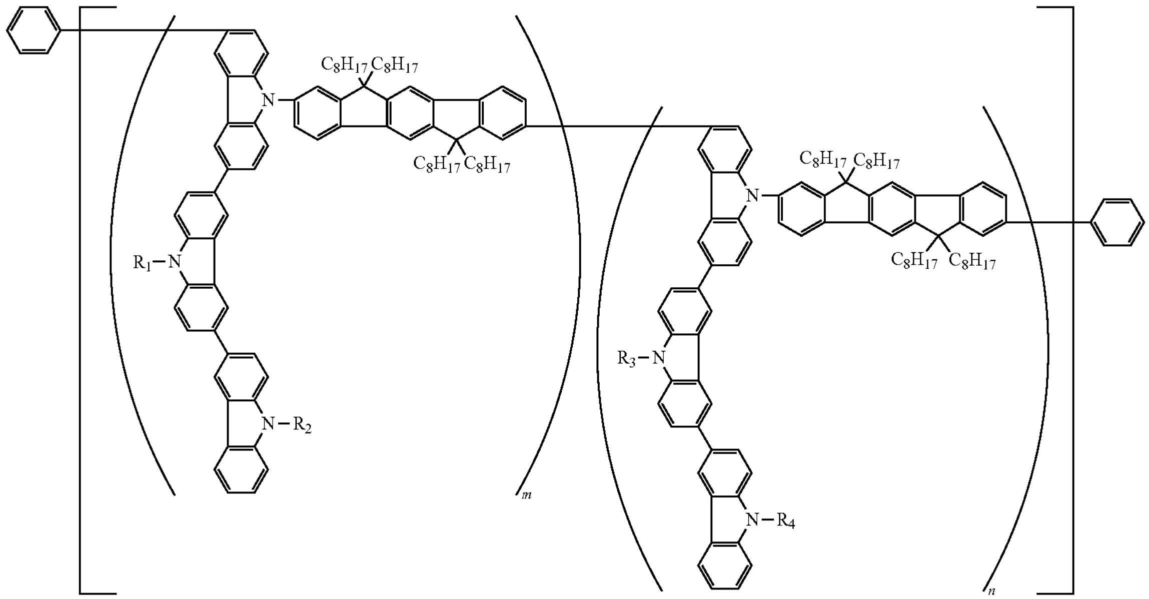
| Com. | R1 = R3 | R2 | R4 |
|---|---|---|---|
| 191-1 | H-1 | H-1 | H-29 |
| 191-2 | H-2 | | |
| 191-3 | H-3 | | |
| 191-4 | H-4 | | |
| 191-5 | H-5 | | |
| 191-6 | H-6 | | |
| 191-7 | H-7 | | |
| 191-8 | H-8 | | |
| 191-9 | H-9 | | |
| 191-10 | H-10 | | |
| 191-11 | H-11 | | |
| 191-12 | H-12 | | |
| 191-13 | H-13 | | |
| 191-14 | H-14 | | |
| 191-15 | H-15 | | |
| 191-16 | H-16 | | |
| 191-17 | H-17 | | |
| 191-18 | H-18 | | |
| 191-19 | H-1 | H-1 | H-30 |
| 191-20 | H-2 | | |
| 191-21 | H-3 | | |
| 191-22 | H-4 | | |
| 191-23 | H-5 | | |
| 191-24 | H-6 | | |
| 191-25 | H-7 | | |
| 191-26 | H-8 | | |
| 191-27 | H-9 | | |
| 191-28 | H-10 | | |
| 191-29 | H-11 | | |
| 191-30 | H-12 | | |
| 191-31 | H-13 | | |
| 191-32 | H-14 | | |
| 191-33 | H-15 | | |
| 191-34 | H-16 | | |
| 191-35 | H-17 | | |
| 191-36 | H-18 | | |

TABLE 192
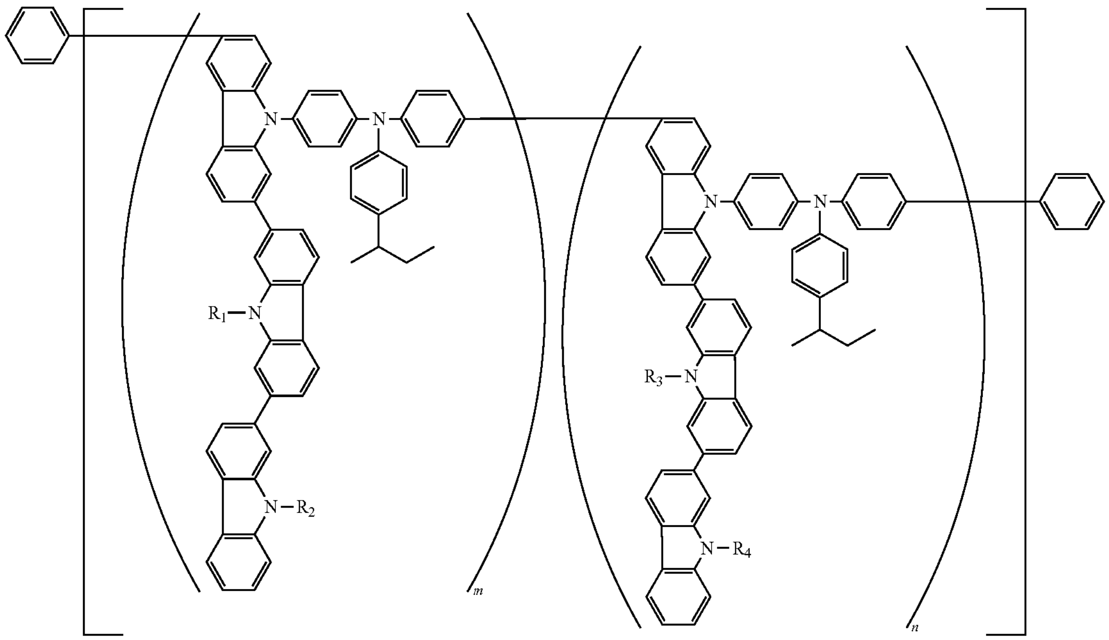
| Com. | R1 = R3 | R2 | R4 |
|---|---|---|---|
| 192-1 | H-1 | H-1 | H-29 |
| 192-2 | H-2 | | |
| 192-3 | H-3 | | |
| 192-4 | H-4 | | |
| 192-5 | H-5 | | |
| 192-6 | H-6 | | |
| 192-7 | H-7 | | |
| 192-8 | H-8 | | |
| 192-9 | H-9 | | |
| 192-10 | H-10 | | |
| 192-11 | H-11 | | |
| 192-12 | H-12 | | |
| 192-13 | H-13 | | |
| 192-14 | H-14 | | |
| 192-15 | H-15 | | |
| 192-16 | H-16 | | |
| 192-17 | H-17 | | |
| 192-18 | H-18 | | |
| 192-19 | H-1 | H-1 | H-30 |
| 192-20 | H-2 | | |
| 192-21 | H-3 | | |
| 192-22 | H-4 | | |
| 192-23 | H-5 | | |
| 192-24 | H-6 | | |
| 192-25 | H-7 | | |
| 192-26 | H-8 | | |
| 192-27 | H-9 | | |
| 192-28 | H-10 | | |
| 192-29 | H-11 | | |
| 192-30 | H-12 | | |
| 192-31 | H-13 | | |
| 192-32 | H-14 | | |
| 192-33 | H-15 | | |
| 192-34 | H-16 | | |
| 192-35 | H-17 | | |
| 192-36 | H-18 | | |

TABLE 193
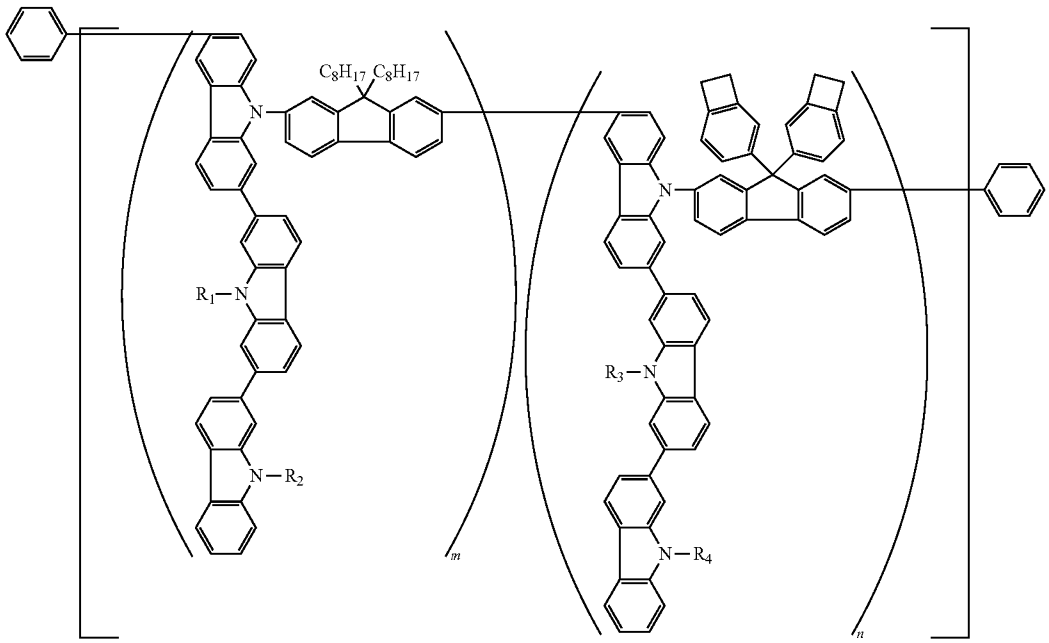
| Com. | R1 = R2 = R3 = R4 |
|---|---|
| 193-1 | H-1 |
| 193-2 | H-2 |
| 193-3 | H-3 |
| 193-4 | H-4 |
| 193-5 | H-5 |
| 193-6 | H-6 |
| 193-7 | H-7 |
| 193-8 | H-8 |
| 193-9 | H-9 |
| 193-10 | H-10 |
| 193-11 | H-11 |
| 193-12 | H-12 |
| 193-13 | H-13 |
| 193-14 | H-14 |
| 193-15 | H-15 |
| 193-16 | H-16 |
| 193-17 | H-17 |
| 193-18 | H-18 |

TABLE 194
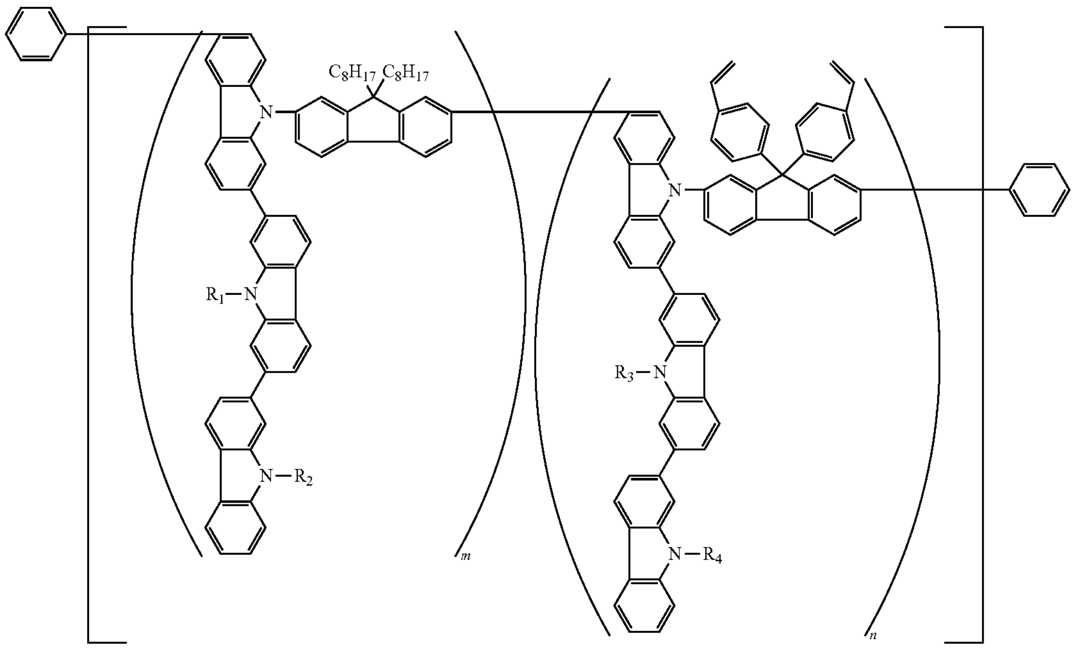
| Com. | R1 = R2 = R3 = R4 |
|---|---|
| 194-1 | H-1 |
| 194-2 | H-2 |
| 194-3 | H-3 |
| 194-4 | H-4 |
| 194-5 | H-5 |
| 194-6 | H-6 |
| 194-7 | H-7 |
| 194-8 | H-8 |
| 194-9 | H-9 |
| 194-10 | H-10 |
| 194-11 | H-11 |
| 194-12 | H-12 |
| 194-13 | H-13 |
| 194-14 | H-14 |
| 194-15 | H-15 |
| 194-16 | H-16 |
| 194-17 | H-17 |
| 194-18 | H-18 |

TABLE 195
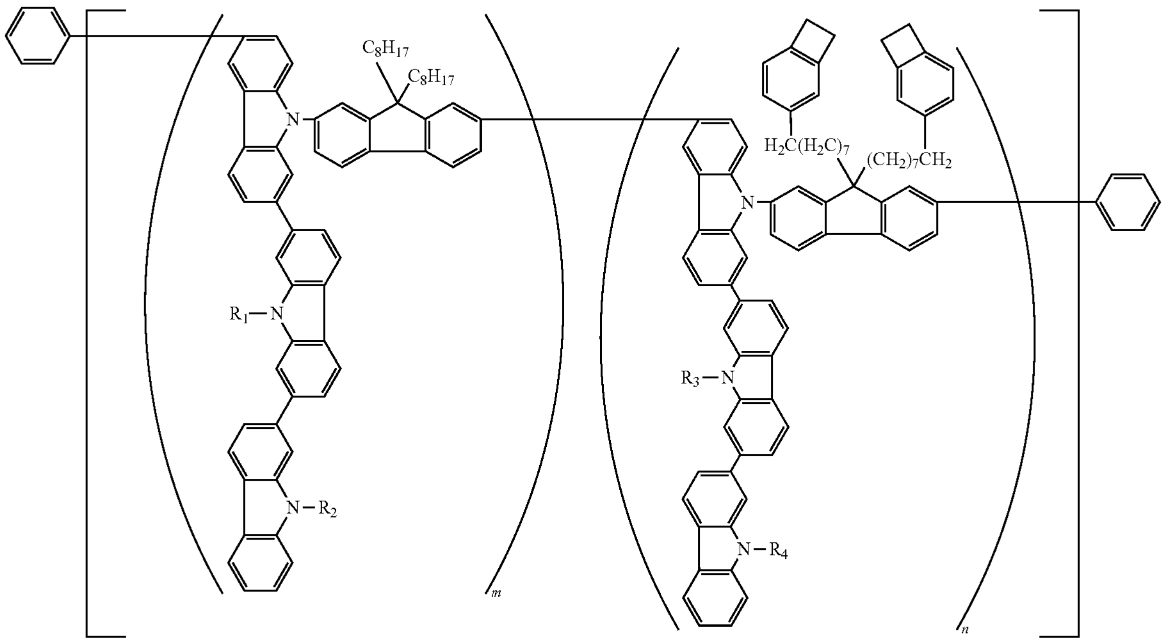
| Com. | R1 = R2 = R3 = R4 |
| --- | --- |
| 195-1 | H-1 |
| 195-2 | H-2 |
| 195-3 | H-3 |
| 195-4 | H-4 |
| 195-5 | H-5 |
| 195-6 | H-6 |
| 195-7 | H-7 |
| 195-8 | H-8 |
| 195-9 | H-9 |
| 195-10 | H-10 |
| 195-11 | H-11 |
| 195-12 | H-12 |
| 195-13 | H-13 |
| 195-14 | H-14 |
| 195-15 | H-15 |
| 195-16 | H-16 |
| 195-17 | H-17 |
| 195-18 | H-18 |

TABLE 196

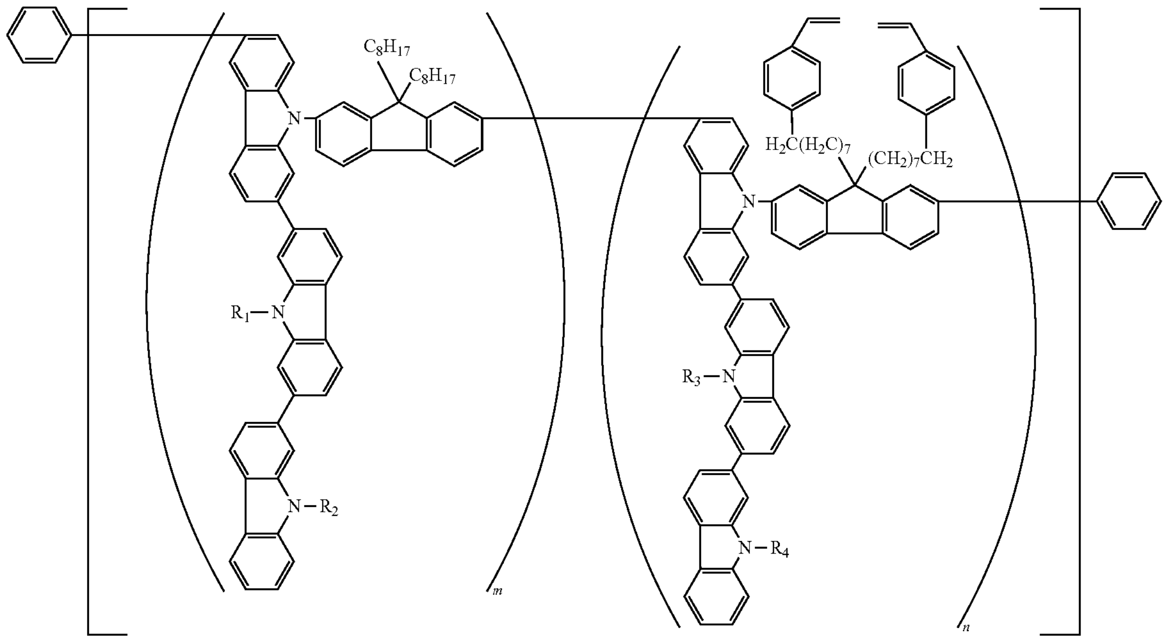

| Com. | R1 = R2 = R3 = R4 |
|---|---|
| 196-1 | H-1 |
| 196-2 | H-2 |
| 196-3 | H-3 |
| 196-4 | H-4 |
| 196-5 | H-5 |
| 196-6 | H-6 |
| 196-7 | H-7 |
| 196-8 | H-8 |
| 196-9 | H-9 |
| 196-10 | H-10 |
| 196-11 | H-11 |
| 196-12 | H-12 |
| 196-13 | H-13 |
| 196-14 | H-14 |
| 196-15 | H-15 |
| 196-16 | H-16 |
| 196-17 | H-17 |
| 196-18 | H-18 |

Second Invention

The polymer of the invention is a polymer represented by the following formula (C):

$$Y_1 \left( (P')_a - (L)_b \right)_m Y_2 \quad (C)$$

wherein P' is a group derived from a compound represented by the following formula (P').

L is a linkage group, and preferably is independently an alkylene group having 1 to 20 carbon atoms, a substituted or unsubstituted cycloalkylene group having 3 to 10 ring carbon atoms, a substituted or unsubstituted aromatic hydrocarbon group having 6 to 30 ring carbon atoms, a substituted or unsubstituted aromatic heterocyclic group having 3 to 30 ring atoms, a substituted or unsubstituted arylamine residue or a substituted or unsubstituted arylsilyl group; or a group obtained by bonding two or more of these groups. In this case, the groups may be the same or different.

a is an integer of 2 to 5, and (P')a means that "a"P's are bonded sequentially, "a"Ps are independent from each other, and the bonding position of P's is not limited.

b is an integer of 0 to 5, and (L)b means that, when b is 2 or more, "b"Ls are bonded sequentially. In this case, "b"Ls are independent from each other, and the bonding position of Ls is not limited. When b is 0, L is a single bond.

In the formula (C), the bonding position of P' and L is not limited.

m is a repeating unit.

$Y_1$ and $Y_2$ are independently a cross-linkable group.

(P')

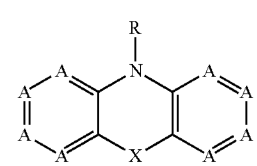

wherein As are independently a nitrogen atom or —C(R)—;

X is a single bond, —O—, —S—, —$C(R)_2$— or —N(R)—;

R is independently a hydrogen atom, a substituted or unsubstituted alkyl group having 1 to 20 carbon atoms, a substituted or unsubstituted cycloalkyl group having 3 to 10 ring carbon atoms, a substituted or unsubstituted aryl group having 6 to 30 ring carbon atoms, a substituted or unsubstituted heteroaryl group having 3 to 30 ring atoms, a substituted or unsubstituted arylamino group or a substituted or unsubstituted arylsily group.

The polymer of the invention is a polymer containing a nitrogen-containing ring in its main chain, and the number of substituents introduced into the nitrogen-containing ring and the substitution position can be selected widely. On the other hand, the polymer itself has a molecular weight as high as on the level of several tens of thousands, and hence, it can be cured readily. Therefore, the cross-linkable group does not affect the lowering of the properties of a raw material. Further, due to its wide range of selectivity, the flatness, adhesiveness and electronic properties of the resulting cured film can be controlled easily, whereby the hole-injecting property of the polymer itself can be improved.

In the formula (C), P' is preferably a substituted or unsubstituted carbazole residue, more preferably a substituted or unsubstituted carbazole residue in which “a”(P')as are bonded sequentially. The adjacent carbazole residues are respectively bonded with each other at the $3^{rd}$-$3^{rd}$ position, the $3^{rd}$-$2^{nd}$ position or the $2^{nd}$-the $2^{nd}$ position; and/or a carbazole residue is bonded with L at the $9^{th}$ position, the $3^{rd}$ position or the $2^{nd}$ position of the carbazole residue.

In the above, a state in which the adjacent carbazole residues are bonded at the $3^{rd}$-$3^{rd}$ position means the following state:

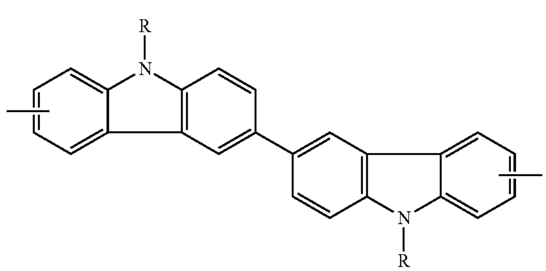

A state in which the adjacent carbozole residues are bonded at the $3^{rd}$-$2^{nd}$ position means the following state.

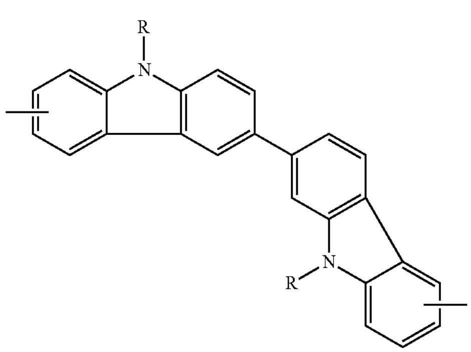

A state in which the adjacent carbozole residues are bonded at the $2^{nd}$-$2^{nd}$ position means the following state.

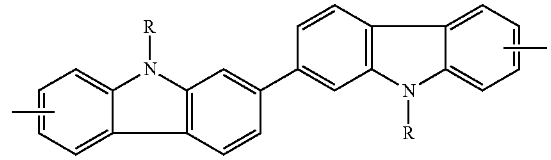

Similarly, in the above, the carbazole residue to be bonded with L is bonded with L at the $9^{th}$ position of the carbazole residue.

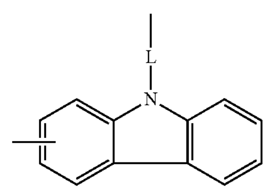

(in the above, R between the L and N is a hydrogen atom, and due to the bonding of L with the carbazole residue at the $9^{th}$ position of the carbazole residue, R is a single bond)

A state in which the carbazole residue is bonded with L at the $3^{rd}$ position of the carbazole residue means the following state.

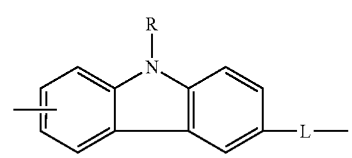

A state in which the carbozole residue is bonded with L at the $2^{nd}$ position of the carbazole residue means the following state.

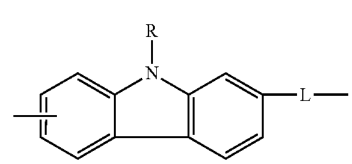

In the formula (C), a is preferably 2 or 3.

The polymer of the invention is preferably a polymer represented by any of the following formulas (101) to (107).

(101)
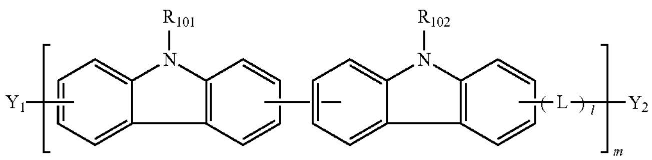
(102)
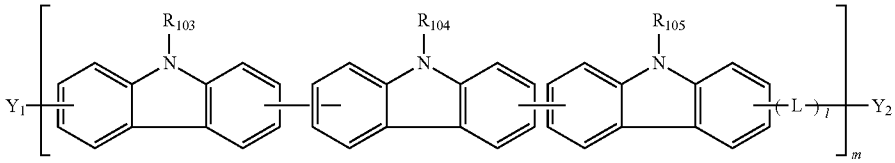
(103)
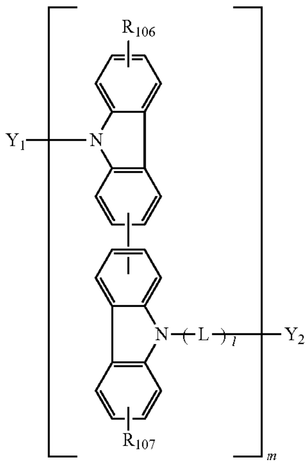
(104)
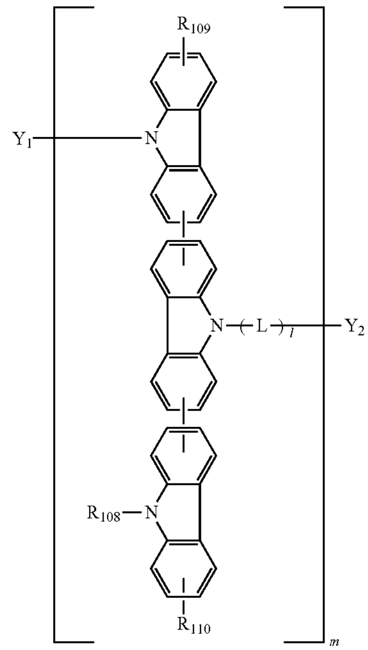
(105)
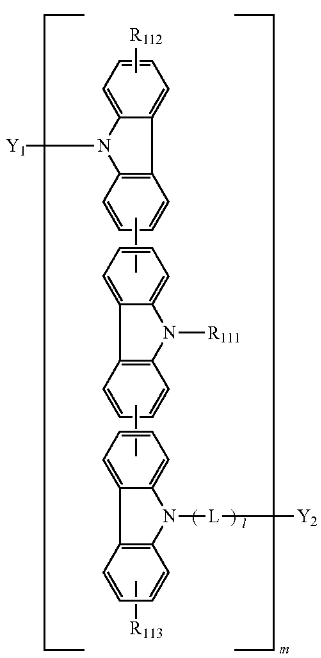
(106)
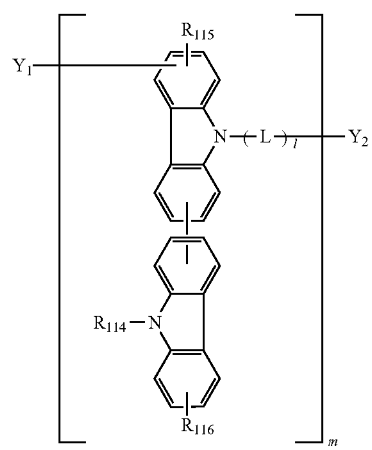

-continued (107)

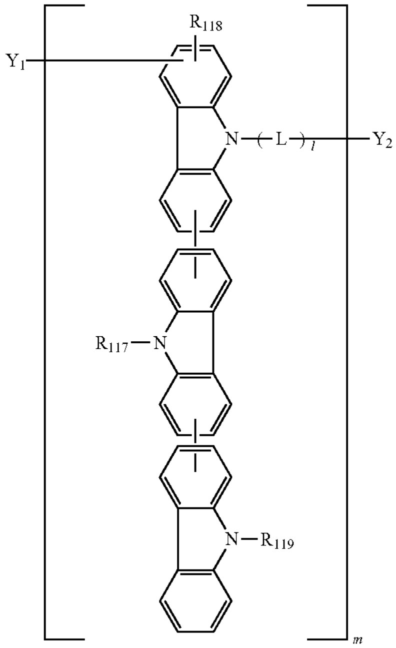

In the formula, $R_{101}$ to $R_{119}$ are independently a substituted or unsubstituted alkyl group having 1 to 20 carbon atoms, a substituted or unsubstituted cycloalkyl group having 3 to 10 ring carbon atoms, a substituted or unsubstituted aryl group having 6 to 30 ring carbon atoms, a substituted or unsubstituted heteroaryl group having 3 to 30 ring atoms, a substituted or unsubstituted arylamino group or a substituted or unsubstituted arylsily group.

l is an integer of 0 or 1.

$Y_1$, $Y_2$, L and m are as the same as those in the formula (C).

In the formulas (101) to (107), at least one of $R_{101}$ and $R_{102}$, at least one of $R_{103}$ to $R_{105}$, at least one of $R_{106}$ and $R_{107}$, at least one of $R_{108}$ to $R_{110}$, at least one of $R_{111}$ to $R_{113}$, at least one of $R_{114}$ to $R_{116}$ and at least one of $R_{117}$ to $R_{119}$ is preferably a group selected from the groups represented by the following formulas (51) to (55).

The substituent including a carbazole skeleton, a dibenzofuran skeleton, a dibenzothiophen skeleton or the like can improve the film adhesion between a layer comprising the polymer of the invention and adjacent layers.

(51)

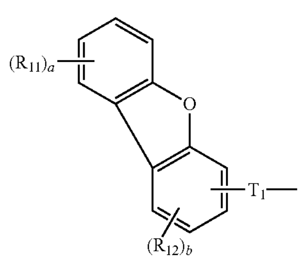

-continued (52)

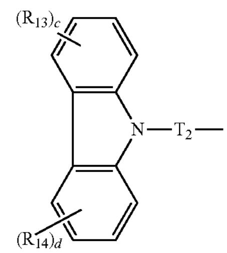

(53)

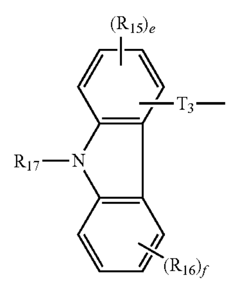

(54)

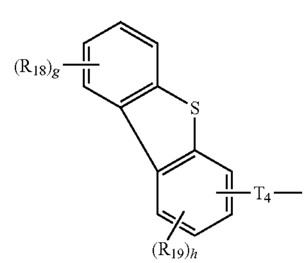

-continued (55)

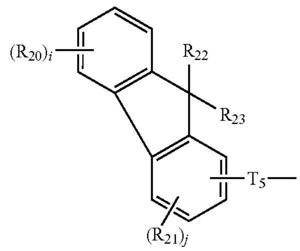

wherein $R_{11}$ to $R_{23}$ are independently an alkyl group having 1 to 20 carbon atoms, a substituted or unsubstituted cycloalkyl group having 3 to 10 ring carbon atoms, a substituted or unsubstituted aryl group having 6 to 30 ring carbon atoms, a substituted or unsubstituted alkoxy group having 1 to 20 carbon atoms, a substituted or unsubstituted cycloalkoxy group having 3 to 10 ring carbon atoms, a substituted or unsubstituted aryloxy group having 6 to 30 ring carbon atoms, a substituted or unsubstituted aralkyl group having 7 to 40 carbon atoms, a substituted or unsubstituted heteroaryl group having 3 to 30 ring atoms, a substituted amino group, a substituted silyl group, a halogen atom, a nitro group, a cyano group or a hydroxyl group;

a, c, d, f, g and i are independently an integer of 0 to 4;

b, e, h and j are independently an integer of 0 to 3; and $T_1$ to $T_5$ are independently a single bond, a substituted or unsubstituted aromatic hydrocarbon ring group having 6 to 50 ring carbon atoms or an aromatic heterocyclic group having 3 to 30 ring atoms.

$Y_1$ and $Y_2$ of the polymer of the invention is a cross-linkable group.

In the invention, the cross-linkable group means a group which has a "part which is cross-likable" by heat, light, an acid, an electron beam or the like (e.g. a known unsaturated double bond, an epoxy group, and oxetane). As the cross-linkable group, the following can be given, for example.

(X1)

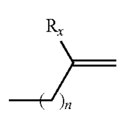

(X2)

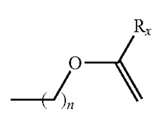

(X3)

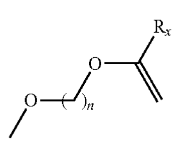

(X4)

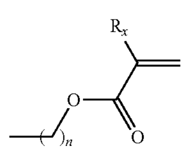

-continued (X5)

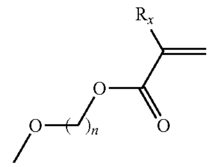

(X6)

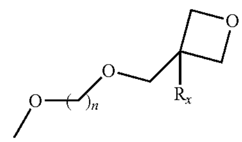

(X7)

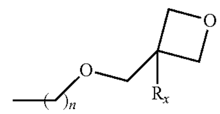

(X8)

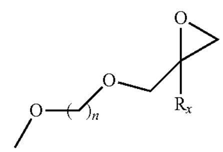

(X9)

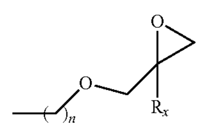

(X10)

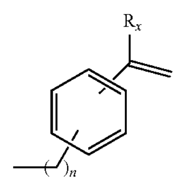

(X11)

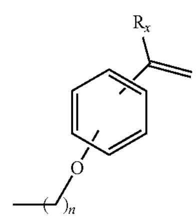

(X12)

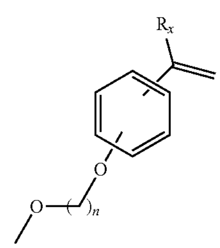

(X13)

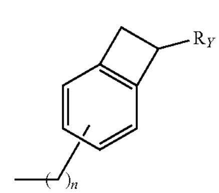

-continued (X14)

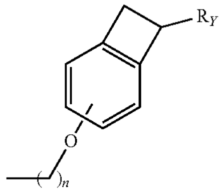

(X15)

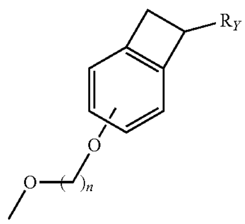

wherein n is an integer of 0 to 10.

Rx is independently a hydrogen atom, an alkyl group or a halogen atom. As the alkyl group, an alkyl group having 1 to 20 carbon atoms can be given, with an alkyl group having 1 to 4 carbon atoms being preferable.

$R_Y$ is independently an alkyl group, an amino group, an aryl group, a halogen atom, an amide group or a carbonyl group. As the alkyl group, alkyl group having 1 to 20 carbon atoms can be given, with an alkyl group having 1 to 4 carbon atoms being preferable.

It is preferred that $Y_1$ and $Y_2$ be independently a cross-linkable group represented by the following formulas (31) to (42).

(31)

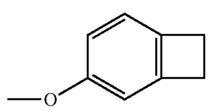

(32)

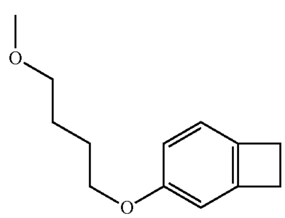

(33)

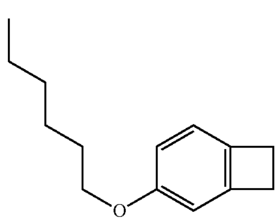

(34)

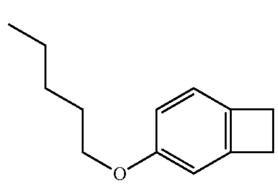

-continued (35)

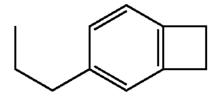

(36)

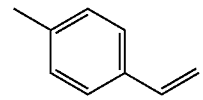

(37)

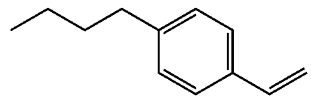

(38)

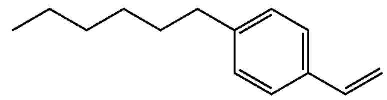

(39)

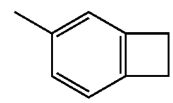

(40)

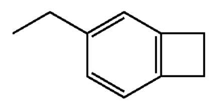

(41)

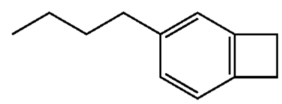

(42)

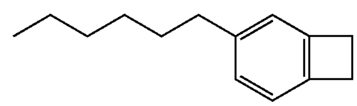

Hereinbelow, an explanation will be given on each of the above-mentioned substituents in the polymer of the invention.

The "hydrogen atom" in this application includes detrium and tritium. The "ring carbon atom" means carbon atoms that constitute a saturated ring, an unsaturated ring or an aromatic ring, and the "ring atom" means carbon atoms and hetero atoms that constitute a hetero ring (including a saturated ring, an unsaturated ring and an aromatic ring).

As the substituted or unsubstituted alkyl group having 1 to 20 carbon atoms, a methyl group, an ethyl group, a propyl group, an isopropyl group, an n-butyl group, an isobutyl group, a sec-butyl group, a tert-butyl group, an n-pentyl group, an n-hexyl group, an n-heptyl group, an n-octyl group, an n-nonyl group, an n-decanyl group, an n-undecanyl group, an n-dodecanyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group or the like can be given. Of these, a methyl group, an ethyl group, a propyl group, an isopropyl group, an n-butyl group, an isobutyl group, a sec-butyl group, a tert-butyl group, an n-pentyl group, an n-hexyl group, an n-heptyl group, an n-octyl group, an n-nonyl group can be given.

As the alkylene group (alkane residue), residues corresponding to the above-mentioned alkyl group can be given.

As the substituted or unsubstituted cycloalkyl group having 3 to 10 ring carbon atoms, a cyclopropyl group, a cyclobutyl group, a cyclopentyl group, a cyclohexyl group, a cyclopentylmethyl group, a cyclohexylmethyl group, a cyclohexylethyl group, a 4-fluorocyclohexyl group, a 1-adamantyl group, a 2-adamantyl group, a 1-norbornyl group, a 2-norbornyl group or the like can be given. Of these, a cyclopentyl group and a cyclohexyl group are preferable.

As the cycloalkylene group (cycloalkane residue), residues corresponding to the above-mentioned cycloalkyl group can be given.

As the substituted or unsubstituted aryl group (monovalent aromatic hydrocarbon group) having 6 to 50 (preferably 6 to 30) ring carbon atoms, a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenathryl group, a 1-naphthacenyl group, a 2-naphthacenyl group, a 9-naphthacenyl group, a 1-pyrenyl group, a 2-pyrenyl group, a 4-pyrenyl group, a biphenyl-2-yl group, a biphenyl-3-yl group, a biphenyl-4-yl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, a o-tolyl group, a m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenyl-4-yl group, a 4"-t-butyl-p-terphenyl-4-yl group, a fluorene-1-yl group, a fluorene-2-yl group, a fluorene-3-yl group, a fluorene-4-yl group or the like can be given.

Of these, a phenyl group, a 1-naphthyl group, a 2-naphthyl group, a 1-anthryl group, a 2-anthryl group, a 9-anthryl group, a biphenyl-2-yl group, a biphenyl-3-yl group, a biphenyl-4-yl group, a p-terphenyl-4-yl group, a p-terphenyl-3-yl group, a p-terphenyl-2-yl group, an o-tolyl group, an m-tolyl group, a p-tolyl group, a fluorene-2-yl group, and a fluorene-3-yl group are preferable. A phenyl group, a 1-naphthyl group, a 2-naphthyl group, an m-tolyl group, a p-tolyl group, a fluorene-2-yl group, and a fluorene-3-yl group are more preferable.

As the divalent or larger group of the aromatic hydrocarbon ring group, a group obtained by removing a hydrogen atom from the above-mentioned aryl group can be given.

As the substituted or unsubstituted heteroaryl group (monovalent aromatic heterocyclic group) having 3 to 30 ring atoms, a 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-dibenzofuranyl group, 4-dibenzofurnyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiadinyl group, 2-phenothiadinyl group, 3-phenothiadinyl group, 4-phenothiadinyl group, 10-phenothiadinyl group, 1-phenoxadinyl group, 2-phenoxadinyl group, 3-phenoxadinyl group, 4-phenoxadinyl group, 10-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group, 2-thienyl group, 3-thienyl group, 2-benzothiophenyl group, 3-thiophenyl group, 4-thiophenyl group, 5-thiophenyl group, 6-thiophenyl group, 7-thiophenyl group, 1-isothiophenyl group, 3-isothiophenyl group, 4-isothiophenyl group, 5-isothiophenyl group, 6-isothiophenyl group, 7-isothiophenyl group, 2-dibenzothiophenyl group, 4-dibenzothiophenyl group or the like can be given. Of these, a 1-pyrrolyl group, a 2-pyrrolyl group, a 3-pyrrolyl group, a 1-carbazolyl group, a 2-carbazolyl group, a 3-carbazolyl group, a 4-carbazolyl group, a 9-carbazolyl group, a 2-dibenzofuranyl group, a 4-dibenzofuranyl group, a 2-dibenzothiophenyl group and a 4-dibenzothiophenyl group are preferable.

As the divalent or larger group of the aromatic heterocyclic group, a group obtained by removing a hydrogen atom from the above-mentioned heteroaryl group can be given.

As the substituted amino group, a substituted or unsubstituted mono- or dialkylamino group or a substituted or unsubstituted mono- or diarylamino group can be given.

As the alkylamino group or the dialkylamino group, one of which the alkyl part is the above-mentioned alkyl group can be given.

As the arylamino group, a diarylamino group and an alkylarylamino group can be given. As examples of the alkyl group and the aryl group bonding to the nitrogen atom, the aryl group and the alkyl group mentioned above can be given.

As the arylamine residue, a triarylamine residue and an alkylarylamine residue can be given. As examples of the alkyl group and the aryl group bonding to the nitrogen atom, the aryl group and the alkyl group mentioned above can be given.

As the substituted silyl group, a silyl group substituted by an alkyl group and/or an aryl group can be given. As examples of the alkyl group and the aryl group bonding to the silicon atom, the aryl group and the alkyl group mentioned above can be given. The alkyl groups substituting the silyl group may be the same or different. Similarly, the aryl groups substituting the silyl group may be the same or different.

Specifically, as the trialkylsilyl group, a trimethylsilyl group, a vinyldimethylsilyl group, a triethylsilyl group, a tripropylsilyl group, a propyldimethylsilyl group, a tributylsilyl group, a t-butyldimethylsilyl group, a tripentylsilyl group, a triheptylsilyl group, a trihexylsilyl group or the like can be given. A trimethylsilyl group and a triethylsilyl group are preferable.

As the arylsilyl group, a triarylsilyl group can preferably be given. As the triarylsilyl group, a triphenylsilyl group, a trinaphthylsilyl group or the like can be given. Of these, a triphenylsilyl group is preferable.

As the alkylarylsilyl group, a dimethylphenylsilyl group, a diethylphenylsilyl group, a diphenylmethylsilyl group, an ethyldiphenylsilyl group or the like can be given. Of these, a diphenylmethylsilyl group and an ethyldiphenylsilyl group are preferable.

The alkoxy group having 1 to 20 carbon atoms is represented by —OY. As examples of Y, the above-mentioned examples of the alkyl group can be given. The alkoxy group is, a methoxy group or an ethoxy group, for example.

The cycloalkoxy group having 3 to 10 ring carbon atoms is represented by —OY. As examples of Y, the above-mentioned examples of the cycloalkyl group can be given. The cycloalkyl group is, for example, a cyclopentyloxy group or a cyclohexyloxy group.

The aryloxy group having 6 to 30 ring carbon atoms is represented by —OY. As examples of Y, the above-mentioned examples of the aromatic hydrocarbon ring can be given. The aryloxy group is, for example, a phenoxy group.

The aralkyl group having 7 to 40 carbon atoms is represented by —Y—Z. As examples of Y, the of the alkylene group corresponding to the above-mentioned examples of the alkyl group can be given. As examples of Z, the above-mentioned examples of the aryl group can be given. The aryl part of the aralkyl group has preferably 6 to 30 carbon atoms. It is preferred that the alkyl part have 1 to 10 carbon atoms, with 1 to 6 carbon atoms being particularly preferable. A benzyl group, a phenylethyl group and a 2-phenylpropane-2-yl group can be given, for example.

As the halogen atom, a fluorine atom, a chlorine atom and a bromine atom can be given, with a fluorine atom being preferable.

The substituents of the above-mentioned various groups are independently a linear or branched alkyl group having 1 to 20 carbon atoms, a linear or branched alkenyl group having 2 to 20 carbon atoms, a cycloalkyl group having 3 to 20 carbon atoms, a trialkylsilyl group having an alkyl group having 1 to 20 carbon atoms, a triarylsilyl group having an aryl group having 6 to 24 ring carbon atoms, an alkylarylsilyl group having an alkyl group having 1 to 20 carbon atoms and an aryl group having 6 to 24 ring carbon atoms, an aryl group having 6 to 24 ring carbon atoms, a heteroaryl group having 5 to 24 ring atoms, a halogen atom or a cyano group. Specifically, the aryl group, the alkyl group, the cycloalkyl group, the trialkylsilyl group, the triarylsilyl group, the alkylarylsilyl group, the heteroaryl group, the halogen atom or the cyano group as mentioned above can be given. Further, these groups may have the same substituents.

As the alkenyl group, a substituent having an unsaturated bond within the molecule of the above-mentioned alkyl group can be given.

No specific restrictions are imposed on the molecular weight of the polymer of the invention, and the polymer includes an oligomer (larger than a dimer) to an ultra-high molecular weight polymer.

The polymer has a number average molecular weight (Mn) of preferably $10^3$ to $10^8$, more preferably $5\times10^3$ to $10^6$. The polymer has a weight average molecular weight (Mw) of preferably $10^3$ to $10^8$, more preferably $5\times10^3$ to $10^6$. Further, the molecular distribution represented by Mw/Mn is not particularly restricted, but preferably 10 or less, with 3 or less being further preferable.

If the molecular weight of the polymer is too large, a homogenous film cannot be formed during device fabrication due to gelation. On the other hand, if the molecular weight is too small, control of solubility may become difficult.

The number average molecular weight and the weight average molecular weight can be obtained by using size exclusion chromatography (SEC) and by calibrating with standard polystyrene.

The polymer of the invention can be obtained by polymerizing the structural unit P, the structural unit L and the heat-cross-linkable group with a corresponding compound, respectively. In particular, since the polymer of the invention is a binary polymer of a nitrogen-containing ring as a main chain and a linkage group that is bonded to the nitrogen-containing ring, it can be synthesized easily. Normally, the terminal of the polymer is a terminal halogen, boronic acid, a boronic acid ester, or an amino group, and is substituted by a phenyl group, a biphenylamino group or the like. In the polymer of the invention, since the terminal is substituted by a cross-linkable group, the amount of a cross-linkable group to be introduced can be reduced.

No specific restrictions are imposed on the polymerization method, and a Suzuki polymerization method in which a dihalide derivative and a diboronic acid derivative or a boronic acid ester derivative corresponding to each group are subjected to a coupling reaction with a palladium catalyst is desirable. As for the halogen of the dihalide derivative, Br or I is more preferable as compared with Cl. The dehalide derivative is more preferably coupled to a boronic acid ester derivative than boronic acid. In particular, a boronic acid ester derivative, a dipinacol ester derivative and a di-1,3-propane diol derivative are preferable.

The specific examples of the polymer of the invention will be shown below. The substituents H-1 to H-18 and the cross-linkable groups H-29 and H-30 are the same groups as mentioned in the First Invention.

The specific examples of the polymer of the invention are given below. The polymer of the invention is not limited to those given below. In the table, if $R_1$ and $R_2$ are different, no limitations are imposed on which is $R_1$ and which is $R_2$.

Compound 1-X
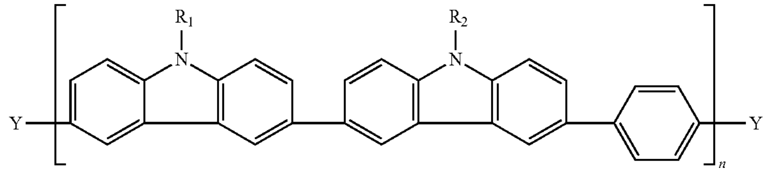
| Com. | R1 = R2 | Y |
|---|---|---|
| 1-1 | H-1 | H-29 |
| 1-2 | H-2 | |
| 1-3 | H-3 | |
| 1-4 | H-4 | |
| 1-5 | H-5 | |
| 1-6 | H-6 | |
| 1-7 | H-7 | |
| 1-8 | H-8 | |
| 1-9 | H-9 | |
| 1-10 | H-10 | |
| 1-11 | H-11 | |
| 1-12 | H-12 | |
| 1-13 | H-13 | |
| 1-14 | H-14 | |
| 1-15 | H-15 | |
| 1-16 | H-16 | |
| 1-17 | H-17 | |
| 1-18 | H-18 | |
| 1-19 | H-1 | H-30 |
| 1-20 | H-2 | |
| 1-21 | H-3 | |
| 1-22 | H-4 | |
| 1-23 | H-5 | |
| 1-24 | H-6 | |
| 1-25 | H-7 | |
| 1-26 | H-8 | |
| 1-27 | H-9 | |
| 1-28 | H-10 | |
| 1-29 | H-11 | |
| 1-30 | H-12 | |
| 1-31 | H-13 | |
| 1-32 | H-14 | |
| 1-33 | H-15 | |
| 1-34 | H-16 | |
| 1-35 | H-17 | |
| 1-36 | H-18 | |
| Com. | R1 | R2 | Y |
|---|---|---|---|
| 1-37 | H-2 | H-1 | H-29 |
| 1-38 | H-3 | | |
| 1-39 | H-4 | | |
| 1-40 | H-5 | | |
| 1-41 | H-6 | | |
| 1-42 | H-7 | | |
| 1-43 | H-8 | | |
| 1-44 | H-9 | | |
| 1-45 | H-10 | | |
| 1-46 | H-11 | | |
| 1-47 | H-12 | | |
| 1-48 | H-13 | | |
| 1-49 | H-14 | | |
| 1-50 | H-15 | | |
| 1-51 | H-16 | | |
| 1-52 | H-17 | | |
| 1-53 | H-18 | | |
| 1-54 | H-2 | H-1 | H-30 |
| 1-55 | H-3 | | |
| 1-56 | H-4 | | |
| 1-57 | H-5 | | |
| 1-58 | H-6 | | |
| 1-59 | H-7 | | |
| 1-60 | H-8 | | |
| 1-61 | H-9 | | |
| 1-62 | H-10 | | |
| 1-63 | H-11 | | |
| 1-64 | H-12 | | |
| 1-65 | H-13 | | |
| 1-66 | H-14 | | |

-continued
| | |
|---|---|
| 1-67 | H-15 |
| 1-68 | H-16 |
| 1-69 | H-17 |
| 1-70 | H-18 |
Compound 2-X
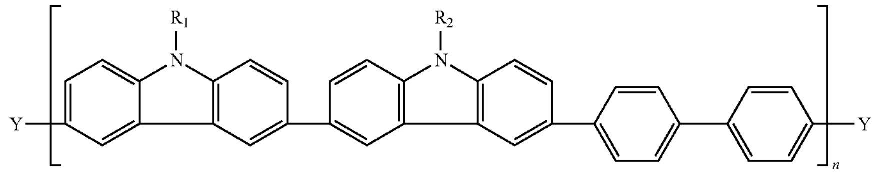
| Com. | R1 = R2 | Y |
|---|---|---|
| 2-1 | H-1 | H-29 |
| 2-2 | H-2 | |
| 2-3 | H-3 | |
| 2-4 | H-4 | |
| 2-5 | H-5 | |
| 2-6 | H-6 | |
| 2-7 | H-7 | |
| 2-8 | H-8 | |
| 2-9 | H-9 | |
| 2-10 | H-10 | |
| 2-11 | H-11 | |
| 2-12 | H-12 | |
| 2-13 | H-13 | |
| 2-14 | H-14 | |
| 2-15 | H-15 | |
| 2-16 | H-16 | |
| 2-17 | H-17 | |
| 2-18 | H-18 | |
| 2-19 | H-1 | H-30 |
| 2-20 | H-2 | |
| 2-21 | H-3 | |
| 2-22 | H-4 | |
| 2-23 | H-5 | |
| 2-24 | H-6 | |
| 2-25 | H-7 | |
| 2-26 | H-8 | |
| 2-27 | H-9 | |
| 2-28 | H-10 | |
| 2-29 | H-11 | |
| 2-30 | H-12 | |
| 2-31 | H-13 | |
| 2-32 | H-14 | |
| 2-33 | H-15 | |
| 2-34 | H-16 | |
| 2-35 | H-17 | |
| 2-36 | H-18 | |
| Com. | R1 | R2 | Y |
|---|---|---|---|
| 2-37 | H-2 | H-1 | H-29 |
| 2-38 | H-3 | | |
| 2-39 | H-4 | | |
| 2-40 | H-5 | | |
| 2-41 | H-6 | | |
| 2-42 | H-7 | | |
| 2-43 | H-8 | | |
| 2-44 | H-9 | | |
| 2-45 | H-10 | | |
| 2-46 | H-11 | | |
| 2-47 | H-12 | | |
| 2-48 | H-13 | | |
| 2-49 | H-14 | | |
| 2-50 | H-15 | | |
| 2-51 | H-16 | | |
| 2-52 | H-17 | | |
| 2-53 | H-18 | | |
| 2-54 | H-2 | H-1 | H-30 |
| 2-55 | H-3 | | |
| 2-56 | H-4 | | |
| 2-57 | H-5 | | |
| 2-58 | H-6 | | |
| 2-59 | H-7 | | |

-continued
| | |
|---|---|
| 2-60 | H-8 |
| 2-61 | H-9 |
| 2-62 | H-10 |
| 2-63 | H-11 |
| 2-64 | H-12 |
| 2-65 | H-13 |
| 2-66 | H-14 |
| 2-67 | H-15 |
| 2-68 | H-16 |
| 2-69 | H-17 |
| 2-70 | H-18 |
Compound 3-X
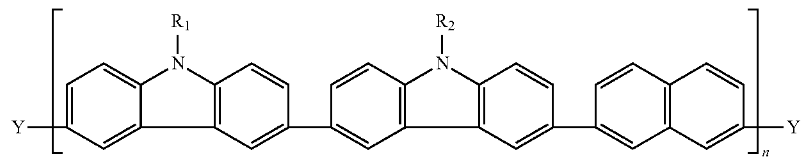
| Com. | R1 = R2 | Y |
|---|---|---|
| 3-1 | H-1 | H-29 |
| 3-2 | H-2 | |
| 3-3 | H-3 | |
| 3-4 | H-4 | |
| 3-5 | H-5 | |
| 3-6 | H-6 | |
| 3-7 | H-7 | |
| 3-8 | H-8 | |
| 3-9 | H-9 | |
| 3-10 | H-10 | |
| 3-11 | H-11 | |
| 3-12 | H-12 | |
| 3-13 | H-13 | |
| 3-14 | H-14 | |
| 3-15 | H-15 | |
| 3-16 | H-16 | |
| 3-17 | H-17 | |
| 3-18 | H-18 | |
| 3-19 | H-1 | H-30 |
| 3-20 | H-2 | |
| 3-21 | H-3 | |
| 3-22 | H-4 | |
| 3-23 | H-5 | |
| 3-24 | H-6 | |
| 3-25 | H-7 | |
| 3-26 | H-8 | |
| 3-27 | H-9 | |
| 3-28 | H-10 | |
| 3-29 | H-11 | |
| 3-30 | H-12 | |
| 3-31 | H-13 | |
| 3-32 | H-14 | |
| 3-33 | H-15 | |
| 3-34 | H-16 | |
| 3-35 | H-17 | |
| 3-36 | H-18 | |
| Com. | R1 | R2 | Y |
|---|---|---|---|
| 3-37 | H-2 | H-1 | H-29 |
| 3-38 | H-3 | | |
| 3-39 | H-4 | | |
| 3-40 | H-5 | | |
| 3-41 | H-6 | | |
| 3-42 | H-7 | | |
| 3-43 | H-8 | | |
| 3-44 | H-9 | | |
| 3-45 | H-10 | | |
| 3-46 | H-11 | | |
| 3-47 | H-12 | | |
| 3-48 | H-13 | | |
| 3-49 | H-14 | | |
| 3-50 | H-15 | | |
| 3-51 | H-16 | | |
| 3-52 | H-17 | | |
| 3-53 | H-18 | | |

-continued
| | | | |
|---|---|---|---|
| 3-54 | H-2 | H-1 | H-30 |
| 3-55 | H-3 | | |
| 3-56 | H-4 | | |
| 3-57 | H-5 | | |
| 3-58 | H-6 | | |
| 3-59 | H-7 | | |
| 3-60 | H-8 | | |
| 3-61 | H-9 | | |
| 3-62 | H-10 | | |
| 3-63 | H-11 | | |
| 3-64 | H-12 | | |
| 3-65 | H-13 | | |
| 3-66 | H-14 | | |
| 3-67 | H-15 | | |
| 3-68 | H-16 | | |
| 3-69 | H-17 | | |
| 3-70 | H-18 | | |
Compound 4-X
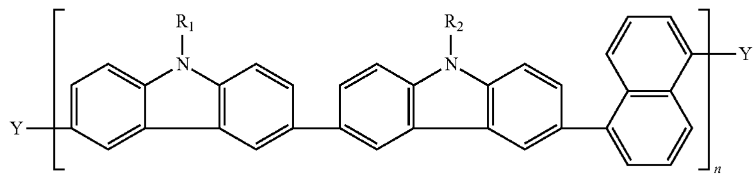
| Com. | R1 = R2 | Y |
|---|---|---|
| 4-1 | H-1 | H-29 |
| 4-2 | H-2 | |
| 4-3 | H-3 | |
| 4-4 | H-4 | |
| 4-5 | H-5 | |
| 4-6 | H-6 | |
| 4-7 | H-7 | |
| 4-8 | H-8 | |
| 4-9 | H-9 | |
| 4-10 | H-10 | |
| 4-11 | H-11 | |
| 4-12 | H-12 | |
| 4-13 | H-13 | |
| 4-14 | H-14 | |
| 4-15 | H-15 | |
| 4-16 | H-16 | |
| 4-17 | H-17 | |
| 4-18 | H-18 | |
| 4-19 | H-1 | H-30 |
| 4-20 | H-2 | |
| 4-21 | H-3 | |
| 4-22 | H-4 | |
| 4-23 | H-5 | |
| 4-24 | H-6 | |
| 4-25 | H-7 | |
| 4-26 | H-8 | |
| 4-27 | H-9 | |
| 4-28 | H-10 | |
| 4-29 | H-11 | |
| 4-30 | H-12 | |
| 4-31 | H-13 | |
| 4-32 | H-14 | |
| 4-33 | H-15 | |
| 4-34 | H-16 | |
| 4-35 | H-17 | |
| 4-36 | H-18 | |
| Com. | R1 | R2 | Y |
|---|---|---|---|
| 4-37 | H-2 | H-1 | H-29 |
| 4-38 | H-3 | | |
| 4-39 | H-4 | | |
| 4-40 | H-5 | | |
| 4-41 | H-6 | | |
| 4-42 | H-7 | | |
| 4-43 | H-8 | | |
| 4-44 | H-9 | | |
| 4-45 | H-10 | | |
| 4-46 | H-11 | | |

-continued
| | | | |
|---|---|---|---|
| 4-47 | H-12 | | |
| 4-48 | H-13 | | |
| 4-49 | H-14 | | |
| 4-50 | H-15 | | |
| 4-51 | H-16 | | |
| 4-52 | H-17 | | |
| 4-53 | H-18 | | |
| 4-54 | H-2 | H-1 | H-30 |
| 4-55 | H-3 | | |
| 4-56 | H-4 | | |
| 4-57 | H-5 | | |
| 4-58 | H-6 | | |
| 4-59 | H-7 | | |
| 4-60 | H-8 | | |
| 4-61 | H-9 | | |
| 4-62 | H-10 | | |
| 4-63 | H-11 | | |
| 4-64 | H-12 | | |
| 4-65 | H-13 | | |
| 4-66 | H-14 | | |
| 4-67 | H-15 | | |
| 4-68 | H-16 | | |
| 4-69 | H-17 | | |
| 4-70 | H-18 | | |
Compound 5-X
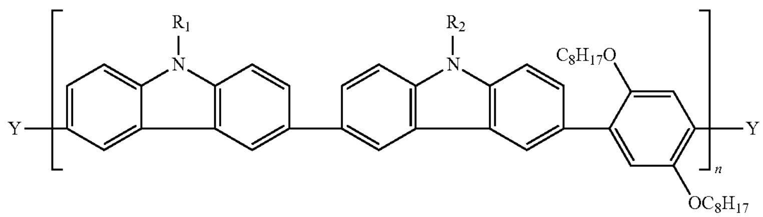
| Com. | R1 = R2 | Y |
|---|---|---|
| 5-1 | H-1 | H-29 |
| 5-2 | H-2 | |
| 5-3 | H-3 | |
| 5-4 | H-4 | |
| 5-5 | H-5 | |
| 5-6 | H-6 | |
| 5-7 | H-7 | |
| 5-8 | H-8 | |
| 5-9 | H-9 | |
| 5-10 | H-10 | |
| 5-11 | H-11 | |
| 5-12 | H-12 | |
| 5-13 | H-13 | |
| 5-14 | H-14 | |
| 5-15 | H-15 | |
| 5-16 | H-16 | |
| 5-17 | H-17 | |
| 5-18 | H-18 | |
| 5-19 | H-1 | H-30 |
| 5-20 | H-2 | |
| 5-21 | H-3 | |
| 5-22 | H-4 | |
| 5-23 | H-5 | |
| 5-24 | H-6 | |
| 5-25 | H-7 | |
| 5-26 | H-8 | |
| 5-27 | H-9 | |
| 5-28 | H-10 | |
| 5-29 | H-11 | |
| 5-30 | H-12 | |
| 5-31 | H-13 | |
| 5-32 | H-14 | |
| 5-33 | H-15 | |
| 5-34 | H-16 | |
| 5-35 | H-17 | |
| 5-36 | H-18 | |
| Com. | R1 | R2 | Y |
|---|---|---|---|
| 5-37 | H-2 | H-1 | H-29 |
| 5-38 | H-3 | | |

-continued
| | | | |
|---|---|---|---|
| 5-39 | H-4 | | |
| 5-40 | H-5 | | |
| 5-41 | H-6 | | |
| 5-42 | H-7 | | |
| 5-43 | H-8 | | |
| 5-44 | H-9 | | |
| 5-45 | H-10 | | |
| 5-46 | H-11 | | |
| 5-47 | H-12 | | |
| 5-48 | H-13 | | |
| 5-49 | H-14 | | |
| 5-50 | H-15 | | |
| 5-51 | H-16 | | |
| 5-52 | H-17 | | |
| 5-53 | H-18 | | |
| 5-54 | H-2 | H-1 | H-30 |
| 5-55 | H-3 | | |
| 5-56 | H-4 | | |
| 5-57 | H-5 | | |
| 5-58 | H-6 | | |
| 5-59 | H-7 | | |
| 5-60 | H-8 | | |
| 5-61 | H-9 | | |
| 5-62 | H-10 | | |
| 5-63 | H-11 | | |
| 5-64 | H-12 | | |
| 5-65 | H-13 | | |
| 5-66 | H-14 | | |
| 5-67 | H-15 | | |
| 5-68 | H-16 | | |
| 5-69 | H-17 | | |
| 5-70 | H-18 | | |
Compound 6-X
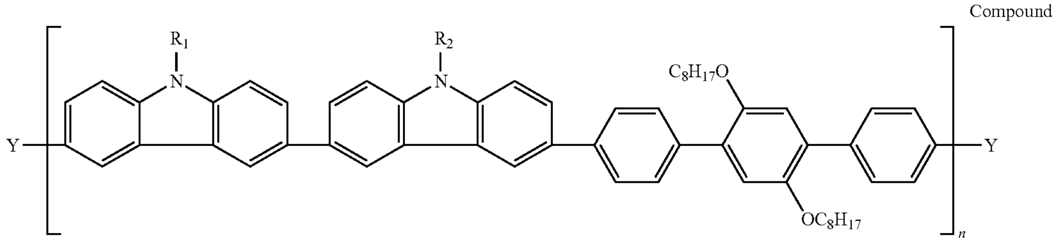
| Com. | R1 = R2 | Y |
|---|---|---|
| 6-1 | H-1 | H-29 |
| 6-2 | H-2 | |
| 6-3 | H-3 | |
| 6-4 | H-4 | |
| 6-5 | H-5 | |
| 6-6 | H-6 | |
| 6-7 | H-7 | |
| 6-8 | H-8 | |
| 6-9 | H-9 | |
| 6-10 | H-10 | |
| 6-11 | H-11 | |
| 6-12 | H-12 | |
| 6-13 | H-13 | |
| 6-14 | H-14 | |
| 6-15 | H-15 | |
| 6-16 | H-16 | |
| 6-17 | H-17 | |
| 6-18 | H-18 | |
| 6-19 | H-1 | H-30 |
| 6-20 | H-2 | |
| 6-21 | H-3 | |
| 6-22 | H-4 | |
| 6-23 | H-5 | |
| 6-24 | H-6 | |
| 6-25 | H-7 | |
| 6-26 | H-8 | |
| 6-27 | H-9 | |
| 6-28 | H-10 | |
| 6-29 | H-11 | |
| 6-30 | H-12 | |
| 6-31 | H-13 | |
| 6-32 | H-14 | |

-continued
| | | | |
|---|---|---|---|
| 6-33 | H-15 | | |
| 6-34 | H-16 | | |
| 6-35 | H-17 | | |
| 6-36 | H-18 | | |
| Com. | R1 | R2 | Y |
|---|---|---|---|
| 6-37 | H-2 | H-1 | H-29 |
| 6-38 | H-3 | | |
| 6-39 | H-4 | | |
| 6-40 | H-5 | | |
| 6-41 | H-6 | | |
| 6-42 | H-7 | | |
| 6-43 | H-8 | | |
| 6-44 | H-9 | | |
| 6-45 | H-10 | | |
| 6-46 | H-11 | | |
| 6-47 | H-12 | | |
| 6-48 | H-13 | | |
| 6-49 | H-14 | | |
| 6-50 | H-15 | | |
| 6-51 | H-16 | | |
| 6-52 | H-17 | | |
| 6-53 | H-18 | | |
| 6-54 | H-2 | H-1 | H-30 |
| 6-55 | H-3 | | |
| 6-56 | H-4 | | |
| 6-57 | H-5 | | |
| 6-58 | H-6 | | |
| 6-59 | H-7 | | |
| 6-60 | H-8 | | |
| 6-61 | H-9 | | |
| 6-62 | H-10 | | |
| 6-63 | H-11 | | |
| 6-64 | H-12 | | |
| 6-65 | H-13 | | |
| 6-66 | H-14 | | |
| 6-67 | H-15 | | |
| 6-68 | H-16 | | |
| 6-69 | H-17 | | |
| 6-70 | H-18 | | |
Compound 7-X
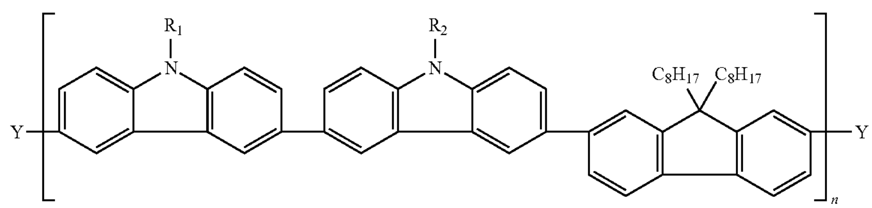
| Com. | R1 = R2 | Y |
|---|---|---|
| 7-1 | H-1 | H-29 |
| 7-2 | H-2 | |
| 7-3 | H-3 | |
| 7-4 | H-4 | |
| 7-5 | H-5 | |
| 7-6 | H-6 | |
| 7-7 | H-7 | |
| 7-8 | H-8 | |
| 7-9 | H-9 | |
| 7-10 | H-10 | |
| 7-11 | H-11 | |
| 7-12 | H-12 | |
| 7-13 | H-13 | |
| 7-14 | H-14 | |
| 7-15 | H-15 | |
| 7-16 | H-16 | |
| 7-17 | H-17 | |
| 7-18 | H-18 | |
| 7-19 | H-1 | H-30 |
| 7-20 | H-2 | |
| 7-21 | H-3 | |
| 7-22 | H-4 | |
| 7-23 | H-5 | |
| 7-24 | H-6 | |

-continued
| | | | |
|---|---|---|---|
| 7-25 | H-7 | | |
| 7-26 | H-8 | | |
| 7-27 | H-9 | | |
| 7-28 | H-10 | | |
| 7-29 | H-11 | | |
| 7-30 | H-12 | | |
| 7-31 | H-13 | | |
| 7-32 | H-14 | | |
| 7-33 | H-15 | | |
| 7-34 | H-16 | | |
| 7-35 | H-17 | | |
| 7-36 | H-18 | | |
| Com. | R1 | R2 | Y |
| 7-37 | H-2 | H-1 | H-29 |
| 7-38 | H-3 | | |
| 7-39 | H-4 | | |
| 7-40 | H-5 | | |
| 7-41 | H-6 | | |
| 7-42 | H-7 | | |
| 7-43 | H-8 | | |
| 7-44 | H-9 | | |
| 7-45 | H-10 | | |
| 7-46 | H-11 | | |
| 7-47 | H-12 | | |
| 7-48 | H-13 | | |
| 7-49 | H-14 | | |
| 7-50 | H-15 | | |
| 7-51 | H-16 | | |
| 7-52 | H-17 | | |
| 7-53 | H-18 | | |
| 7-54 | H-2 | H-1 | H-30 |
| 7-55 | H-3 | | |
| 7-56 | H-4 | | |
| 7-57 | H-5 | | |
| 7-58 | H-6 | | |
| 7-59 | H-7 | | |
| 7-60 | H-8 | | |
| 7-61 | H-9 | | |
| 7-62 | H-10 | | |
| 7-63 | H-11 | | |
| 7-64 | H-12 | | |
| 7-65 | H-13 | | |
| 7-66 | H-14 | | |
| 7-67 | H-15 | | |
| 7-68 | H-16 | | |
| 7-69 | H-17 | | |
| 7-70 | H-18 | | |
Compound 8-X
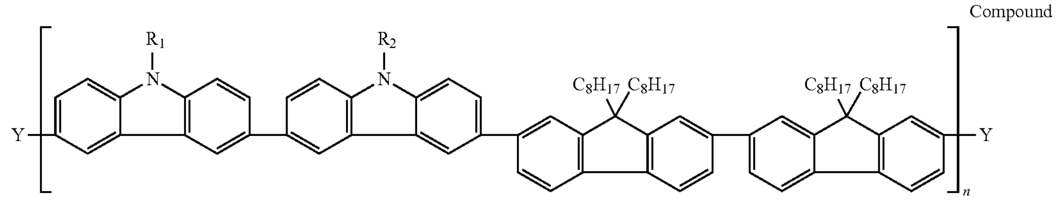
| Com. | R1 = R2 | Y |
|---|---|---|
| 8-1 | H-1 | H-29 |
| 8-2 | H-2 | |
| 8-3 | H-3 | |
| 8-4 | H-4 | |
| 8-5 | H-5 | |
| 8-6 | H-6 | |
| 8-7 | H-7 | |
| 8-8 | H-8 | |
| 8-9 | H-9 | |
| 8-10 | H-10 | |
| 8-11 | H-11 | |
| 8-12 | H-12 | |
| 8-13 | H-13 | |
| 8-14 | H-14 | |
| 8-15 | H-15 | |
| 8-16 | H-16 | |
| 8-17 | H-17 | |

-continued
| | | | |
|---|---|---|---|
| 8-18 | H-18 | | |
| 8-19 | H-1 | H-30 | |
| 8-20 | H-2 | | |
| 8-21 | H-3 | | |
| 8-22 | H-4 | | |
| 8-23 | H-5 | | |
| 8-24 | H-6 | | |
| 8-25 | H-7 | | |
| 8-26 | H-8 | | |
| 8-27 | H-9 | | |
| 8-28 | H-10 | | |
| 8-29 | H-11 | | |
| 8-30 | H-12 | | |
| 8-31 | H-13 | | |
| 8-32 | H-14 | | |
| 8-33 | H-15 | | |
| 8-34 | H-16 | | |
| 8-35 | H-17 | | |
| 8-36 | H-18 | | |
| Com. | R1 | R2 | Y |
|---|---|---|---|
| 8-37 | H-2 | H-1 | H-29 |
| 8-38 | H-3 | | |
| 8-39 | H-4 | | |
| 8-40 | H-5 | | |
| 8-41 | H-6 | | |
| 8-42 | H-7 | | |
| 8-43 | H-8 | | |
| 8-44 | H-9 | | |
| 8-45 | H-10 | | |
| 8-46 | H-11 | | |
| 8-47 | H-12 | | |
| 8-48 | H-13 | | |
| 8-49 | H-14 | | |
| 8-50 | H-15 | | |
| 8-51 | H-16 | | |
| 8-52 | H-17 | | |
| 8-53 | H-18 | | |
| 8-54 | H-2 | H-1 | H-30 |
| 8-55 | H-3 | | |
| 8-56 | H-4 | | |
| 8-57 | H-5 | | |
| 8-58 | H-6 | | |
| 8-59 | H-7 | | |
| 8-60 | H-8 | | |
| 8-61 | H-9 | | |
| 8-62 | H-10 | | |
| 8-63 | H-11 | | |
| 8-64 | H-12 | | |
| 8-65 | H-13 | | |
| 8-66 | H-14 | | |
| 8-67 | H-15 | | |
| 8-68 | H-16 | | |
| 8-69 | H-17 | | |
| 8-70 | H-18 | | |
Compound 9-X
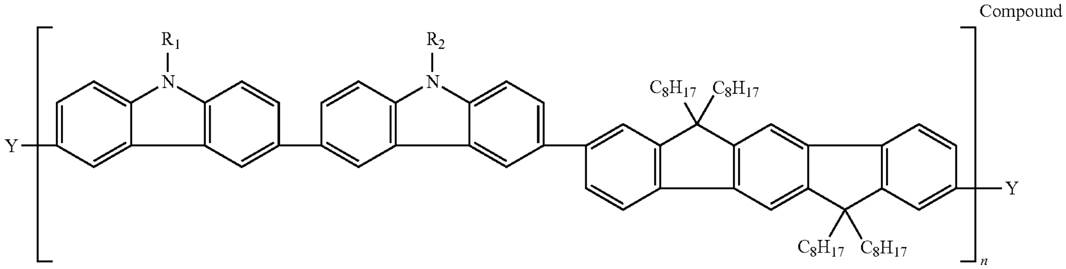
| Com. | R1 = R2 | Y |
|---|---|---|
| 9-1 | H-1 | H-29 |
| 9-2 | H-2 | |
| 9-3 | H-3 | |
| 9-4 | H-4 | |
| 9-5 | H-5 | |
| 9-6 | H-6 | |
| 9-7 | H-7 | |

-continued

| | | |
|---|---|---|
| 9-8 | H-8 | |
| 9-9 | H-9 | |
| 9-10 | H-10 | |
| 9-11 | H-11 | |
| 9-12 | H-12 | |
| 9-13 | H-13 | |
| 9-14 | H-14 | |
| 9-15 | H-15 | |
| 9-16 | H-16 | |
| 9-17 | H-17 | |
| 9-18 | H-18 | |
| 9-19 | H-1 | H-30 |
| 9-20 | H-2 | |
| 9-21 | H-3 | |
| 9-22 | H-4 | |
| 9-23 | H-5 | |
| 9-24 | H-6 | |
| 9-25 | H-7 | |
| 9-26 | H-8 | |
| 9-27 | H-9 | |
| 9-28 | H-10 | |
| 9-29 | H-11 | |
| 9-30 | H-12 | |
| 9-31 | H-13 | |
| 9-32 | H-14 | |
| 9-33 | H-15 | |
| 9-34 | H-16 | |
| 9-35 | H-17 | |
| 9-36 | H-18 | |

| Com. | R1 | R2 | Y |
|---|---|---|---|
| 9-37 | H-2 | H-1 | H-29 |
| 9-38 | H-3 | | |
| 9-39 | H-4 | | |
| 9-40 | H-5 | | |
| 9-41 | H-6 | | |
| 9-42 | H-7 | | |
| 9-43 | H-8 | | |
| 9-44 | H-9 | | |
| 9-45 | H-10 | | |
| 9-46 | H-11 | | |
| 9-47 | H-12 | | |
| 9-48 | H-13 | | |
| 9-49 | H-14 | | |
| 9-50 | H-15 | | |
| 9-51 | H-16 | | |
| 9-52 | H-17 | | |
| 9-53 | H-18 | | |
| 9-54 | H-2 | H-1 | H-30 |
| 9-55 | H-3 | | |
| 9-56 | H-4 | | |
| 9-57 | H-5 | | |
| 9-58 | H-6 | | |
| 9-59 | H-7 | | |
| 9-60 | H-8 | | |
| 9-61 | H-9 | | |
| 9-62 | H-10 | | |
| 9-63 | H-11 | | |
| 9-64 | H-12 | | |
| 9-65 | H-13 | | |
| 9-66 | H-14 | | |
| 9-67 | H-15 | | |
| 9-68 | H-16 | | |
| 9-69 | H-17 | | |
| 9-70 | H-18 | | |

-continued
Compound 10-X
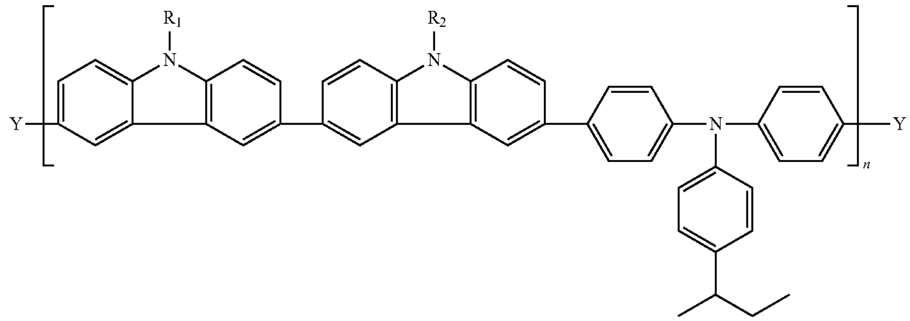
| Com. | R1 = R2 | Y |
|---|---|---|
| 10-1 | H-1 | H-29 |
| 10-2 | H-2 | |
| 10-3 | H-3 | |
| 10-4 | H-4 | |
| 10-5 | H-5 | |
| 10-6 | H-6 | |
| 10-7 | H-7 | |
| 10-8 | H-8 | |
| 10-9 | H-9 | |
| 10-10 | H-10 | |
| 10-11 | H-11 | |
| 10-12 | H-12 | |
| 10-13 | H-13 | |
| 10-14 | H-14 | |
| 10-15 | H-15 | |
| 10-16 | H-16 | |
| 10-17 | H-17 | |
| 10-18 | H-18 | |
| 10-19 | H-1 | H-30 |
| 10-20 | H-2 | |
| 10-21 | H-3 | |
| 10-22 | H-4 | |
| 10-23 | H-5 | |
| 10-24 | H-6 | |
| 10-25 | H-7 | |
| 10-26 | H-8 | |
| 10-27 | H-9 | |
| 10-28 | H-10 | |
| 10-29 | H-11 | |
| 10-30 | H-12 | |
| 10-31 | H-13 | |
| 10-32 | H-14 | |
| 10-33 | H-15 | |
| 10-34 | H-16 | |
| 10-35 | H-17 | |
| 10-36 | H-18 | |
| Com. | R1 | R2 | Y |
|---|---|---|---|
| 10-37 | H-2 | H-1 | H-29 |
| 10-38 | H-3 | | |
| 10-39 | H-4 | | |
| 10-40 | H-5 | | |
| 10-41 | H-6 | | |
| 10-42 | H-7 | | |
| 10-43 | H-8 | | |
| 10-44 | H-9 | | |
| 10-45 | H-10 | | |
| 10-46 | H-11 | | |
| 10-47 | H-12 | | |
| 10-48 | H-13 | | |
| 10-49 | H-14 | | |
| 10-50 | H-15 | | |
| 10-51 | H-16 | | |
| 10-52 | H-17 | | |
| 10-53 | H-18 | | |
| 10-54 | H-2 | H-1 | H-30 |
| 10-55 | H-3 | | |
| 10-56 | H-4 | | |
| 10-57 | H-5 | | |

-continued
| | |
|---|---|
| 10-58 | H-6 |
| 10-59 | H-7 |
| 10-60 | H-8 |
| 10-61 | H-9 |
| 10-62 | H-10 |
| 10-63 | H-11 |
| 10-64 | H-12 |
| 10-65 | H-13 |
| 10-66 | H-14 |
| 10-67 | H-15 |
| 10-68 | H-16 |
| 10-69 | H-17 |
| 10-70 | H-18 |
Compound 11-X
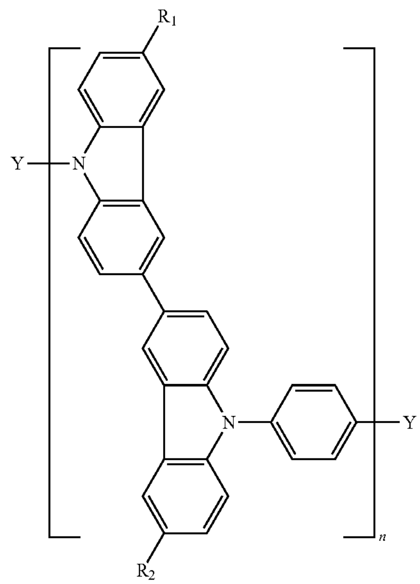
| Com. | R1 = R2 | Y |
|---|---|---|
| 11-1 | H-1 | H-29 |
| 11-2 | H-2 | |
| 11-3 | H-3 | |
| 11-4 | H-4 | |
| 11-5 | H-5 | |
| 11-6 | H-6 | |
| 11-7 | H-7 | |
| 11-8 | H-8 | |
| 11-9 | H-9 | |
| 11-10 | H-10 | |
| 11-11 | H-11 | |
| 11-12 | H-12 | |
| 11-13 | H-13 | |
| 11-14 | H-14 | |
| 11-15 | H-15 | |
| 11-16 | H-16 | |
| 11-17 | H-17 | |
| 11-18 | H-18 | |
| 11-19 | H-1 | H-30 |
| 11-20 | H-2 | |
| 11-21 | H-3 | |
| 11-22 | H-4 | |
| 11-23 | H-5 | |
| 11-24 | H-6 | |
| 11-25 | H-7 | |
| 11-26 | H-8 | |
| 11-27 | H-9 | |
| 11-28 | H-10 | |
| 11-29 | H-11 | |
| 11-30 | H-12 | |
| 11-31 | H-13 | |
| 11-32 | H-14 | |
| 11-33 | H-15 | |
| 11-34 | H-16 | |

-continued
| | |
|---|---|
| 11-35 | H-17 |
| 11-36 | H-18 |
Compound 12-X
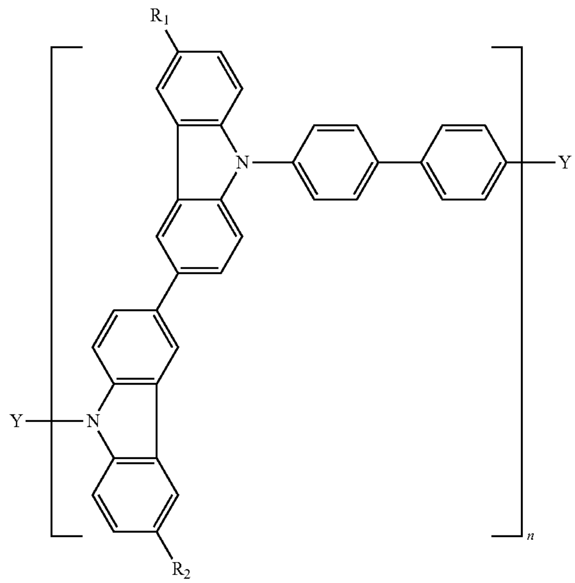
| Com. | R1 = R2 | Y |
|---|---|---|
| 12-1 | H-1 | H-29 |
| 12-2 | H-2 | |
| 12-3 | H-3 | |
| 12-4 | H-4 | |
| 12-5 | H-5 | |
| 12-6 | H-6 | |
| 12-7 | H-7 | |
| 12-8 | H-8 | |
| 12-9 | H-9 | |
| 12-10 | H-10 | |
| 12-11 | H-11 | |
| 12-12 | H-12 | |
| 12-13 | H-13 | |
| 12-14 | H-14 | |
| 12-15 | H-15 | |
| 12-16 | H-16 | |
| 12-17 | H-17 | |
| 12-18 | H-18 | |
| 12-19 | H-1 | H-30 |
| 12-20 | H-2 | |
| 12-21 | H-3 | |
| 12-22 | H-4 | |
| 12-23 | H-5 | |
| 12-24 | H-6 | |
| 12-25 | H-7 | |
| 12-26 | H-8 | |
| 12-27 | H-9 | |
| 12-28 | H-10 | |
| 12-29 | H-11 | |
| 12-30 | H-12 | |
| 12-31 | H-13 | |
| 12-32 | H-14 | |
| 12-33 | H-15 | |
| 12-34 | H-16 | |
| 12-35 | H-17 | |
| 12-36 | H-18 | |

-continued
Compound 13-X
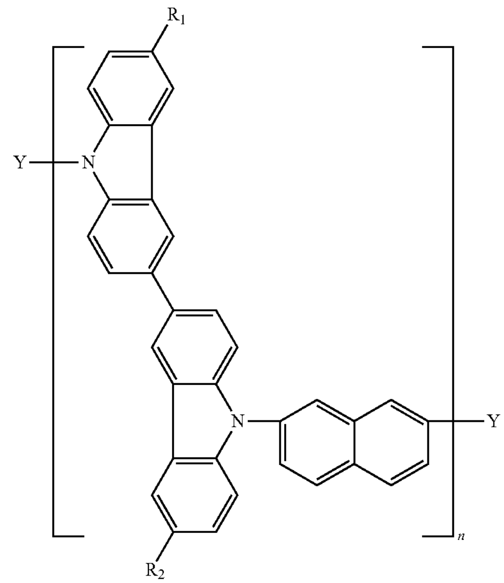
| Com. | R1 = R2 | Y |
|---|---|---|
| 13-1 | H-1 | H-29 |
| 13-2 | H-2 | |
| 13-3 | H-3 | |
| 13-4 | H-4 | |
| 13-5 | H-5 | |
| 13-6 | H-6 | |
| 13-7 | H-7 | |
| 13-8 | H-8 | |
| 13-9 | H-9 | |
| 13-10 | H-10 | |
| 13-11 | H-11 | |
| 13-12 | H-12 | |
| 13-13 | H-13 | |
| 13-14 | H-14 | |
| 13-15 | H-15 | |
| 13-16 | H-16 | |
| 13-17 | H-17 | |
| 13-18 | H-18 | |
| 13-19 | H-1 | H-30 |
| 13-20 | H-2 | |
| 13-21 | H-3 | |
| 13-22 | H-4 | |
| 13-23 | H-5 | |
| 13-24 | H-6 | |
| 13-25 | H-7 | |
| 13-26 | H-8 | |
| 13-27 | H-9 | |
| 13-28 | H-10 | |
| 13-29 | H-11 | |
| 13-30 | H-12 | |
| 13-31 | H-13 | |
| 13-32 | H-14 | |
| 13-33 | H-15 | |
| 13-34 | H-16 | |
| 13-35 | H-17 | |
| 13-36 | H-18 | |

-continued
Compound 14-X
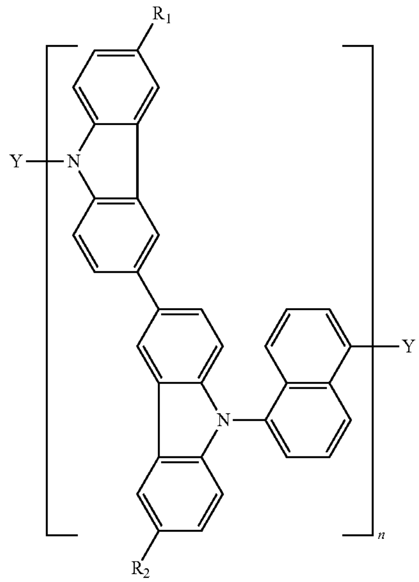
| Com. | R1 = R2 | Y |
|---|---|---|
| 14-1 | H-1 | H-29 |
| 14-2 | H-2 | |
| 14-3 | H-3 | |
| 14-4 | H-4 | |
| 14-5 | H-5 | |
| 14-6 | H-6 | |
| 14-7 | H-7 | |
| 14-8 | H-8 | |
| 14-9 | H-9 | |
| 14-10 | H-10 | |
| 14-11 | H-11 | |
| 14-12 | H-12 | |
| 14-13 | H-13 | |
| 14-14 | H-14 | |
| 14-15 | H-15 | |
| 14-16 | H-16 | |
| 14-17 | H-17 | |
| 14-18 | H-18 | |
| 14-19 | H-1 | H-30 |
| 14-20 | H-2 | |
| 14-21 | H-3 | |
| 14-22 | H-4 | |
| 14-23 | H-5 | |
| 14-24 | H-6 | |
| 14-25 | H-7 | |
| 14-26 | H-8 | |
| 14-27 | H-9 | |
| 14-28 | H-10 | |
| 14-29 | H-11 | |
| 14-30 | H-12 | |
| 14-31 | H-13 | |
| 14-32 | H-14 | |
| 14-33 | H-15 | |
| 14-34 | H-16 | |
| 14-35 | H-17 | |
| 14-36 | H-18 | |

-continued
Compound 15-X
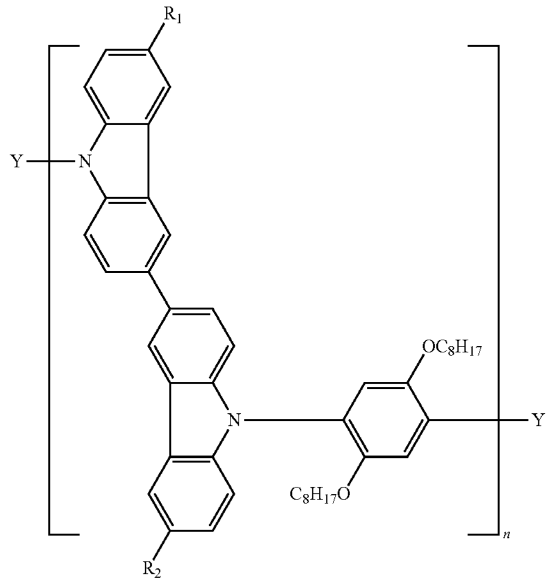
| Com. | R1 = R2 | Y |
|---|---|---|
| 15-1 | H-1 | H-29 |
| 15-2 | H-2 | |
| 15-3 | H-3 | |
| 15-4 | H-4 | |
| 15-5 | H-5 | |
| 15-6 | H-6 | |
| 15-7 | H-7 | |
| 15-8 | H-8 | |
| 15-9 | H-9 | |
| 15-10 | H-10 | |
| 15-11 | H-11 | |
| 15-12 | H-12 | |
| 15-13 | H-13 | |
| 15-14 | H-14 | |
| 15-15 | H-15 | |
| 15-16 | H-16 | |
| 15-17 | H-17 | |
| 15-18 | H-18 | |
| 15-19 | H-1 | H-30 |
| 15-20 | H-2 | |
| 15-21 | H-3 | |
| 15-22 | H-4 | |
| 15-23 | H-5 | |
| 15-24 | H-6 | |
| 15-25 | H-7 | |
| 15-26 | H-8 | |
| 15-27 | H-9 | |
| 15-28 | H-10 | |
| 15-29 | H-11 | |
| 15-30 | H-12 | |
| 15-31 | H-13 | |
| 15-32 | H-14 | |
| 15-33 | H-15 | |
| 15-34 | H-16 | |
| 15-35 | H-17 | |
| 15-36 | H-18 | |

-continued
Compound 16-X
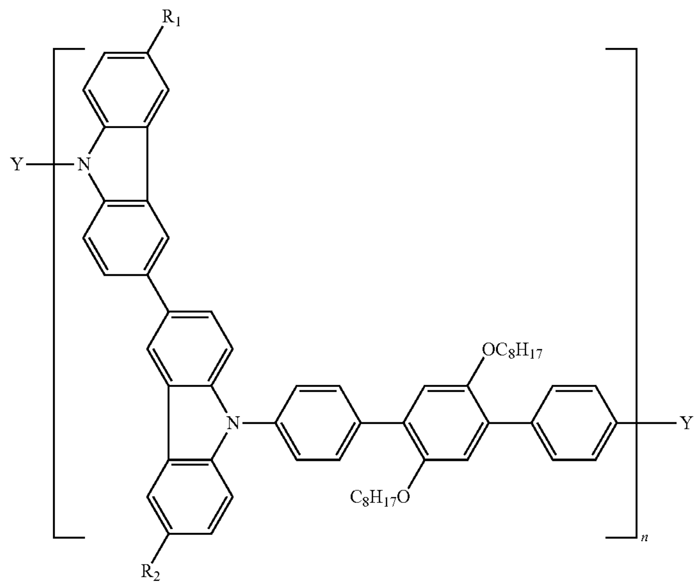
| Com. | R1 = R2 | Y |
|---|---|---|
| 16-1 | H-1 | H-29 |
| 16-2 | H-2 | |
| 16-3 | H-3 | |
| 16-4 | H-4 | |
| 16-5 | H-5 | |
| 16-6 | H-6 | |
| 16-7 | H-7 | |
| 16-8 | H-8 | |
| 16-9 | H-9 | |
| 16-10 | H-10 | |
| 16-11 | H-11 | |
| 16-12 | H-12 | |
| 16-13 | H-13 | |
| 16-14 | H-14 | |
| 16-15 | H-15 | |
| 16-16 | H-16 | |
| 16-17 | H-17 | |
| 16-18 | H-18 | |
| 16-19 | H-1 | H-30 |
| 16-20 | H-2 | |
| 16-21 | H-3 | |
| 16-22 | H-4 | |
| 16-23 | H-5 | |
| 16-24 | H-6 | |
| 16-25 | H-7 | |
| 16-26 | H-8 | |
| 16-27 | H-9 | |
| 16-28 | H-10 | |
| 16-29 | H-11 | |
| 16-30 | H-12 | |
| 16-31 | H-13 | |
| 16-32 | H-14 | |
| 16-33 | H-15 | |
| 16-34 | H-16 | |
| 16-35 | H-17 | |
| 16-36 | H-18 | |

-continued
Compound 17-X
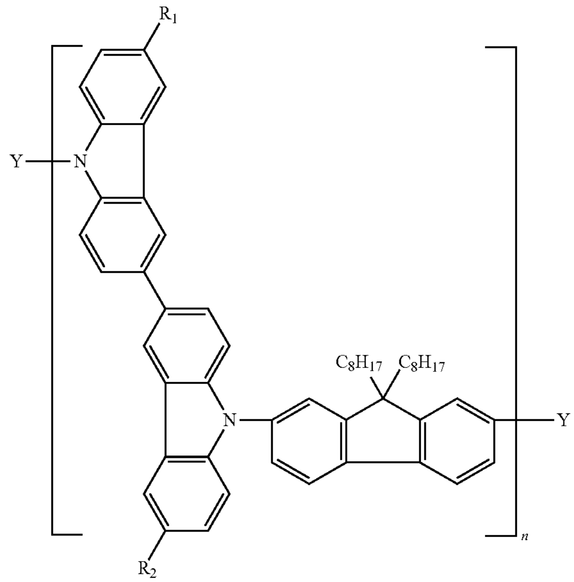
| Com. | R1 = R2 | Y |
|---|---|---|
| 17-1 | H-1 | H-29 |
| 17-2 | H-2 | |
| 17-3 | H-3 | |
| 17-4 | H-4 | |
| 17-5 | H-5 | |
| 17-6 | H-6 | |
| 17-7 | H-7 | |
| 17-8 | H-8 | |
| 17-9 | H-9 | |
| 17-10 | H-10 | |
| 17-11 | H-11 | |
| 17-12 | H-12 | |
| 17-13 | H-13 | |
| 17-14 | H-14 | |
| 17-15 | H-15 | |
| 17-16 | H-16 | |
| 17-17 | H-17 | |
| 17-18 | H-18 | |
| 17-19 | H-1 | H-30 |
| 17-20 | H-2 | |
| 17-21 | H-3 | |
| 17-22 | H-4 | |
| 17-23 | H-5 | |
| 17-24 | H-6 | |
| 17-25 | H-7 | |
| 17-26 | H-8 | |
| 17-27 | H-9 | |
| 17-28 | H-10 | |
| 17-29 | H-11 | |
| 17-30 | H-12 | |
| 17-31 | H-13 | |
| 17-32 | H-14 | |
| 17-33 | H-15 | |
| 17-34 | H-16 | |
| 17-35 | H-17 | |
| 17-36 | H-18 | |

-continued
Compound 18-X
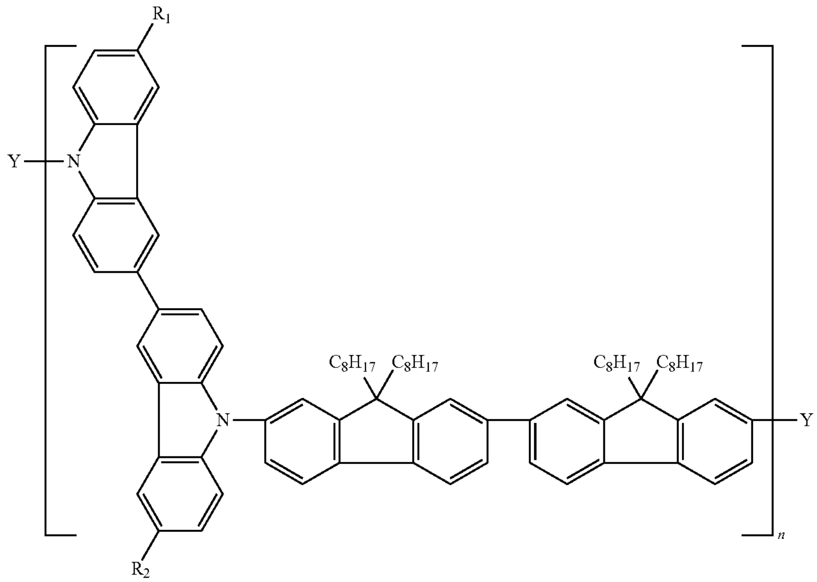
| Com. | R1 = R2 | Y |
|---|---|---|
| 18-1 | H-1 | H-29 |
| 18-2 | H-2 | |
| 18-3 | H-3 | |
| 18-4 | H-4 | |
| 18-5 | H-5 | |
| 18-6 | H-6 | |
| 18-7 | H-7 | |
| 18-8 | H-8 | |
| 18-9 | H-9 | |
| 18-10 | H-10 | |
| 18-11 | H-11 | |
| 18-12 | H-12 | |
| 18-13 | H-13 | |
| 18-14 | H-14 | |
| 18-15 | H-15 | |
| 18-16 | H-16 | |
| 18-17 | H-17 | |
| 18-18 | H-18 | |
| 18-19 | H-1 | H-30 |
| 18-20 | H-2 | |
| 18-21 | H-3 | |
| 18-22 | H-4 | |
| 18-23 | H-5 | |
| 18-24 | H-6 | |
| 18-25 | H-7 | |
| 18-26 | H-8 | |
| 18-27 | H-9 | |
| 18-28 | H-10 | |
| 18-29 | H-11 | |
| 18-30 | H-12 | |
| 18-31 | H-13 | |
| 18-32 | H-14 | |
| 18-33 | H-15 | |
| 18-34 | H-16 | |
| 18-35 | H-17 | |
| 18-36 | H-18 | |

-continued
Compound 19-X
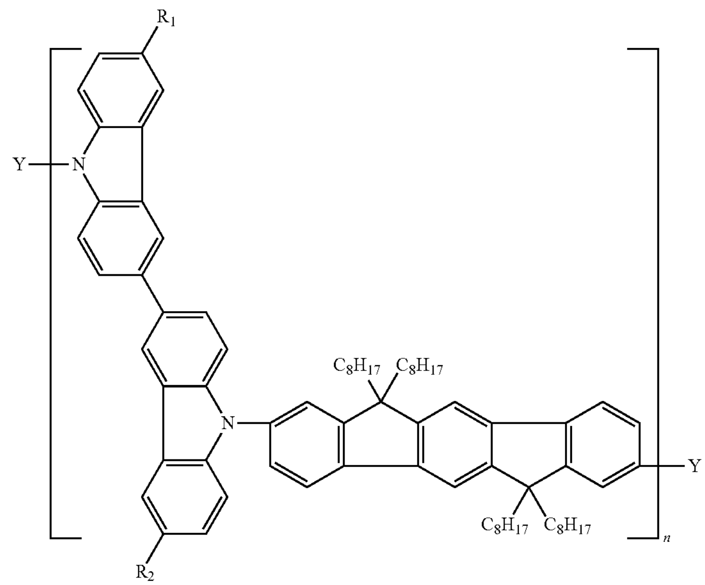
| Com. | R1 = R2 | Y |
|---|---|---|
| 19-1 | H-1 | H-29 |
| 19-2 | H-2 | |
| 19-3 | H-3 | |
| 19-4 | H-4 | |
| 19-5 | H-5 | |
| 19-6 | H-6 | |
| 19-7 | H-7 | |
| 19-8 | H-8 | |
| 19-9 | H-9 | |
| 19-10 | H-10 | |
| 19-11 | H-11 | |
| 19-12 | H-12 | |
| 19-13 | H-13 | |
| 19-14 | H-14 | |
| 19-15 | H-15 | |
| 19-16 | H-16 | |
| 19-17 | H-17 | |
| 19-18 | H-18 | |
| 19-19 | H-1 | H-30 |
| 19-20 | H-2 | |
| 19-21 | H-3 | |
| 19-22 | H-4 | |
| 19-23 | H-5 | |
| 19-24 | H-6 | |
| 19-25 | H-7 | |
| 19-26 | H-8 | |
| 19-27 | H-9 | |
| 19-28 | H-10 | |
| 19-29 | H-11 | |
| 19-30 | H-12 | |
| 19-31 | H-13 | |
| 19-32 | H-14 | |
| 19-33 | H-15 | |
| 19-34 | H-16 | |
| 19-35 | H-17 | |
| 19-36 | H-18 | |

-continued
Compound 20-X
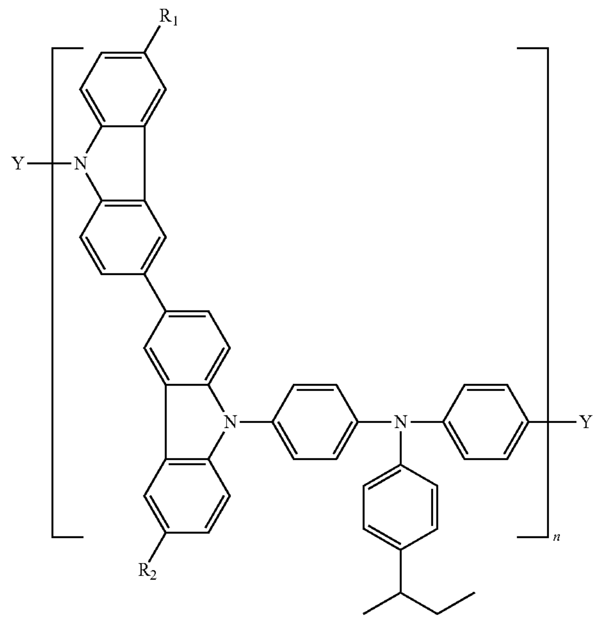
| Com. | R1 = R2 | Y |
|---|---|---|
| 20-1 | H-1 | H-29 |
| 20-2 | H-2 | |
| 20-3 | H-3 | |
| 20-4 | H-4 | |
| 20-5 | H-5 | |
| 20-6 | H-6 | |
| 20-7 | H-7 | |
| 20-8 | H-8 | |
| 20-9 | H-9 | |
| 20-10 | H-10 | |
| 20-11 | H-11 | |
| 20-12 | H-12 | |
| 20-13 | H-13 | |
| 20-14 | H-14 | |
| 20-15 | H-15 | |
| 20-16 | H-16 | |
| 20-17 | H-17 | |
| 20-18 | H-18 | |
| 20-19 | H-1 | H-30 |
| 20-20 | H-2 | |
| 20-21 | H-3 | |
| 20-22 | H-4 | |
| 20-23 | H-5 | |
| 20-24 | H-6 | |
| 20-25 | H-7 | |
| 20-26 | H-8 | |
| 20-27 | H-9 | |
| 20-28 | H-10 | |
| 20-29 | H-11 | |
| 20-30 | H-12 | |
| 20-31 | H-13 | |
| 20-32 | H-14 | |
| 20-33 | H-15 | |
| 20-34 | H-16 | |
| 20-35 | H-17 | |
| 20-36 | H-18 | |

-continued
Compound 21-X
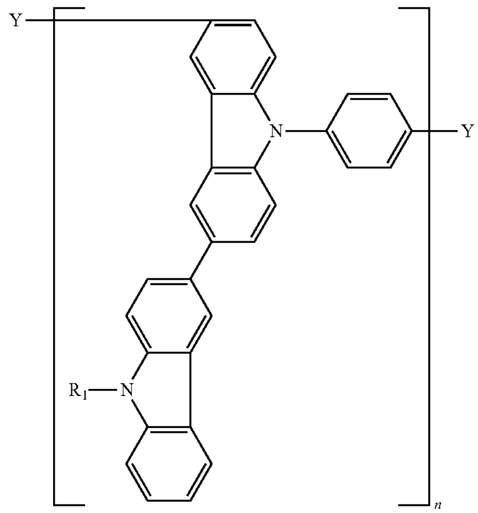
| Com. | R1 | Y |
|---|---|---|
| 21-1 | H-1 | H-29 |
| 21-2 | H-2 | |
| 21-3 | H-3 | |
| 21-4 | H-4 | |
| 21-5 | H-5 | |
| 21-6 | H-6 | |
| 21-7 | H-7 | |
| 21-8 | H-8 | |
| 21-9 | H-9 | |
| 21-10 | H-10 | |
| 21-11 | H-11 | |
| 21-12 | H-12 | |
| 21-13 | H-13 | |
| 21-14 | H-14 | |
| 21-15 | H-15 | |
| 21-16 | H-16 | |
| 21-17 | H-17 | |
| 21-18 | H-18 | |
| 21-19 | H-1 | H-30 |
| 21-20 | H-2 | |
| 21-21 | H-3 | |
| 21-22 | H-4 | |
| 21-23 | H-5 | |
| 21-24 | H-6 | |
| 21-25 | H-7 | |
| 21-26 | H-8 | |
| 21-27 | H-9 | |
| 21-28 | H-10 | |
| 21-29 | H-11 | |
| 21-30 | H-12 | |
| 21-31 | H-13 | |
| 21-32 | H-14 | |
| 21-33 | H-15 | |
| 21-34 | H-16 | |
| 21-35 | H-17 | |
| 21-36 | H-18 | |

-continued
Compound 22-X
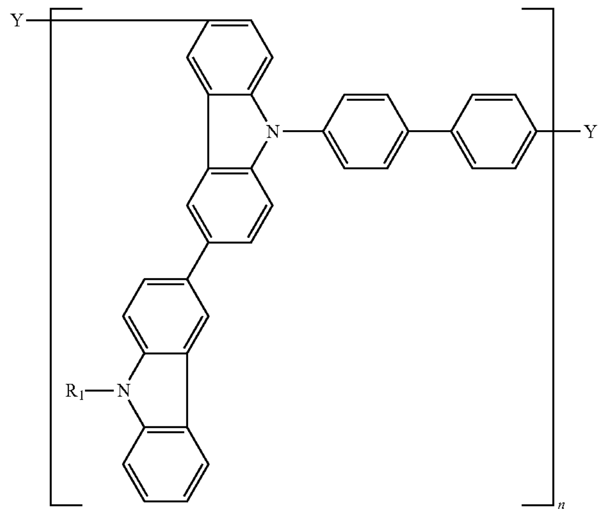
| Com. | R1 | Y |
|---|---|---|
| 22-1 | H-1 | H-29 |
| 22-2 | H-2 | |
| 22-3 | H-3 | |
| 22-4 | H-4 | |
| 22-5 | H-5 | |
| 22-6 | H-6 | |
| 22-7 | H-7 | |
| 22-8 | H-8 | |
| 22-9 | H-9 | |
| 22-10 | H-10 | |
| 22-11 | H-11 | |
| 22-12 | H-12 | |
| 22-13 | H-13 | |
| 22-14 | H-14 | |
| 22-15 | H-15 | |
| 22-16 | H-16 | |
| 22-17 | H-17 | |
| 22-18 | H-18 | |
| 22-19 | H-1 | H-30 |
| 22-20 | H-2 | |
| 22-21 | H-3 | |
| 22-22 | H-4 | |
| 22-23 | H-5 | |
| 22-24 | H-6 | |
| 22-25 | H-7 | |
| 22-26 | H-8 | |
| 22-27 | H-9 | |
| 22-28 | H-10 | |
| 22-29 | H-11 | |
| 22-30 | H-12 | |
| 22-31 | H-13 | |
| 22-32 | H-14 | |
| 22-33 | H-15 | |
| 22-34 | H-16 | |
| 22-35 | H-17 | |
| 22-36 | H-18 | |

-continued
Compound 23-X
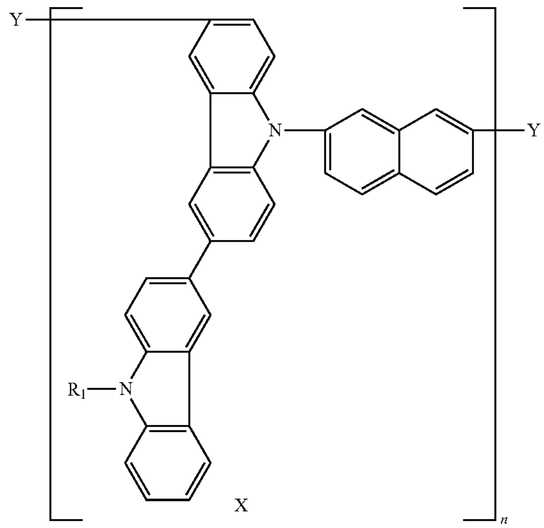
| Com. | R1 | Y |
|---|---|---|
| 23-1 | H-1 | H-29 |
| 23-2 | H-2 | |
| 23-3 | H-3 | |
| 23-4 | H-4 | |
| 23-5 | H-5 | |
| 23-6 | H-6 | |
| 23-7 | H-7 | |
| 23-8 | H-8 | |
| 23-9 | H-9 | |
| 23-10 | H-10 | |
| 23-11 | H-11 | |
| 23-12 | H-12 | |
| 23-13 | H-13 | |
| 23-14 | H-14 | |
| 23-15 | H-15 | |
| 23-16 | H-16 | |
| 23-17 | H-17 | |
| 23-18 | H-18 | |
| 23-19 | H-1 | H-30 |
| 23-20 | H-2 | |
| 23-21 | H-3 | |
| 23-22 | H-4 | |
| 23-23 | H-5 | |
| 23-24 | H-6 | |
| 23-25 | H-7 | |
| 23-26 | H-8 | |
| 23-27 | H-9 | |
| 23-28 | H-10 | |
| 23-29 | H-11 | |
| 23-30 | H-12 | |
| 23-31 | H-13 | |
| 23-32 | H-14 | |
| 23-33 | H-15 | |
| 23-34 | H-16 | |
| 23-35 | H-17 | |
| 23-36 | H-18 | |

-continued
Compound 24-X
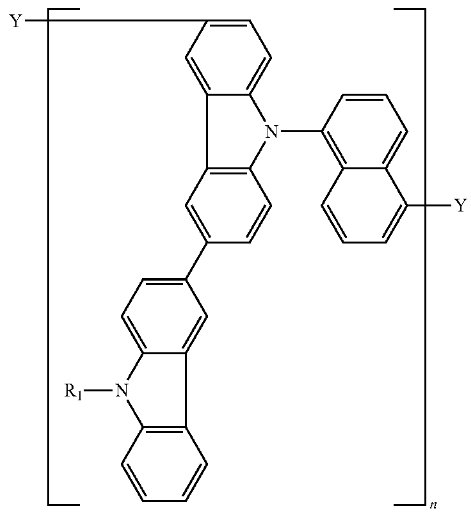
| Com. | R1 | Y |
|---|---|---|
| 24-1 | H-1 | H-29 |
| 24-2 | H-2 | |
| 24-3 | H-3 | |
| 24-4 | H-4 | |
| 24-5 | H-5 | |
| 24-6 | H-6 | |
| 24-7 | H-7 | |
| 24-8 | H-8 | |
| 24-9 | H-9 | |
| 24-10 | H-10 | |
| 24-11 | H-11 | |
| 24-12 | H-12 | |
| 24-13 | H-13 | |
| 24-14 | H-14 | |
| 24-15 | H-15 | |
| 24-16 | H-16 | |
| 24-17 | H-17 | |
| 24-18 | H-18 | |
| 24-19 | H-1 | H-30 |
| 24-20 | H-2 | |
| 24-21 | H-3 | |
| 24-22 | H-4 | |
| 24-23 | H-5 | |
| 24-24 | H-6 | |
| 24-25 | H-7 | |
| 24-26 | H-8 | |
| 24-27 | H-9 | |
| 24-28 | H-10 | |
| 24-29 | H-11 | |
| 24-30 | H-12 | |
| 24-31 | H-13 | |
| 24-32 | H-14 | |
| 24-33 | H-15 | |
| 24-34 | H-16 | |
| 24-35 | H-17 | |
| 24-36 | H-18 | |

-continued
Compound 25-X
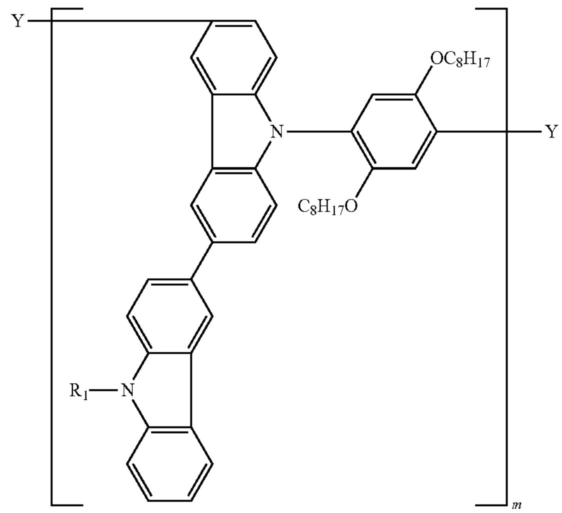
| Com. | R1 | Y |
|---|---|---|
| 25-1 | H-1 | H-29 |
| 25-2 | H-2 | |
| 25-3 | H-3 | |
| 25-4 | H-4 | |
| 25-5 | H-5 | |
| 25-6 | H-6 | |
| 25-7 | H-7 | |
| 25-8 | H-8 | |
| 25-9 | H-9 | |
| 25-10 | H-10 | |
| 25-11 | H-11 | |
| 25-12 | H-12 | |
| 25-13 | H-13 | |
| 25-14 | H-14 | |
| 25-15 | H-15 | |
| 25-16 | H-16 | |
| 25-17 | H-17 | |
| 25-18 | H-18 | |
| 25-19 | H-1 | H-30 |
| 25-20 | H-2 | |
| 25-21 | H-3 | |
| 25-22 | H-4 | |
| 25-23 | H-5 | |
| 25-24 | H-6 | |
| 25-25 | H-7 | |
| 25-26 | H-8 | |
| 25-27 | H-9 | |
| 25-28 | H-10 | |
| 25-29 | H-11 | |
| 25-30 | H-12 | |
| 25-31 | H-13 | |
| 25-32 | H-14 | |
| 25-33 | H-15 | |
| 25-34 | H-16 | |
| 25-35 | H-17 | |
| 25-36 | H-18 | |

-continued
Compound 26-X
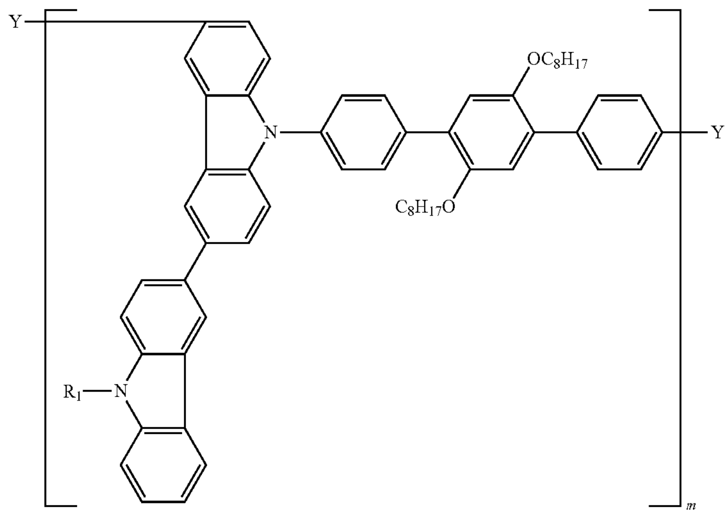
| Com. | R1 | Y |
|---|---|---|
| 26-1 | H-1 | H-29 |
| 26-2 | H-2 | |
| 26-3 | H-3 | |
| 26-4 | H-4 | |
| 26-5 | H-5 | |
| 26-6 | H-6 | |
| 26-7 | H-7 | |
| 26-8 | H-8 | |
| 26-9 | H-9 | |
| 26-10 | H-10 | |
| 26-11 | H-11 | |
| 26-12 | H-12 | |
| 26-13 | H-13 | |
| 26-14 | H-14 | |
| 26-15 | H-15 | |
| 26-16 | H-16 | |
| 26-17 | H-17 | |
| 26-18 | H-18 | |
| 26-19 | H-1 | H-30 |
| 26-20 | H-2 | |
| 26-21 | H-3 | |
| 26-22 | H-4 | |
| 26-23 | H-5 | |
| 26-24 | H-6 | |
| 26-25 | H-7 | |
| 26-26 | H-8 | |
| 26-27 | H-9 | |
| 26-28 | H-10 | |
| 26-29 | H-11 | |
| 26-30 | H-12 | |
| 26-31 | H-13 | |
| 26-32 | H-14 | |
| 26-33 | H-15 | |
| 26-34 | H-16 | |
| 26-35 | H-17 | |
| 26-36 | H-18 | |

-continued
Compound 27-X
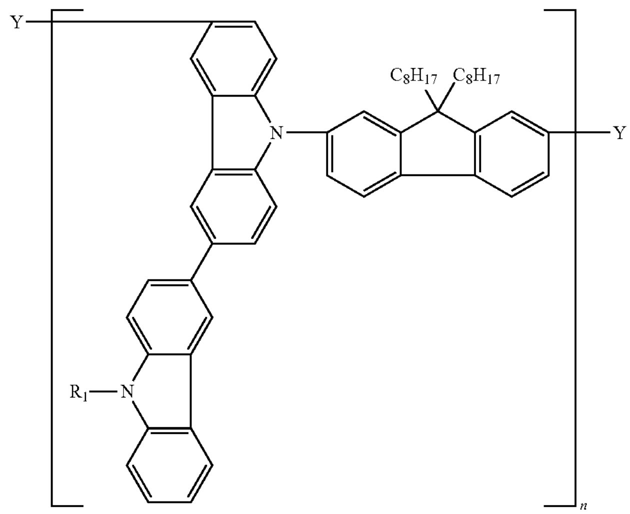
| Com. | R1 | Y |
|---|---|---|
| 27-1 | H-1 | H-29 |
| 27-2 | H-2 | |
| 27-3 | H-3 | |
| 27-4 | H-4 | |
| 27-5 | H-5 | |
| 27-6 | H-6 | |
| 27-7 | H-7 | |
| 27-8 | H-8 | |
| 27-9 | H-9 | |
| 27-10 | H-10 | |
| 27-11 | H-11 | |
| 27-12 | H-12 | |
| 27-13 | H-13 | |
| 27-14 | H-14 | |
| 27-15 | H-15 | |
| 27-16 | H-16 | |
| 27-17 | H-17 | |
| 27-18 | H-18 | |
| 27-19 | H-1 | H-30 |
| 27-20 | H-2 | |
| 27-21 | H-3 | |
| 27-22 | H-4 | |
| 27-23 | H-5 | |
| 27-24 | H-6 | |
| 27-25 | H-7 | |
| 27-26 | H-8 | |
| 27-27 | H-9 | |
| 27-28 | H-10 | |
| 27-29 | H-11 | |
| 27-30 | H-12 | |
| 27-31 | H-13 | |
| 27-32 | H-14 | |
| 27-33 | H-15 | |
| 27-34 | H-16 | |
| 27-35 | H-17 | |
| 27-36 | H-18 | |

-continued
Compound 28-X
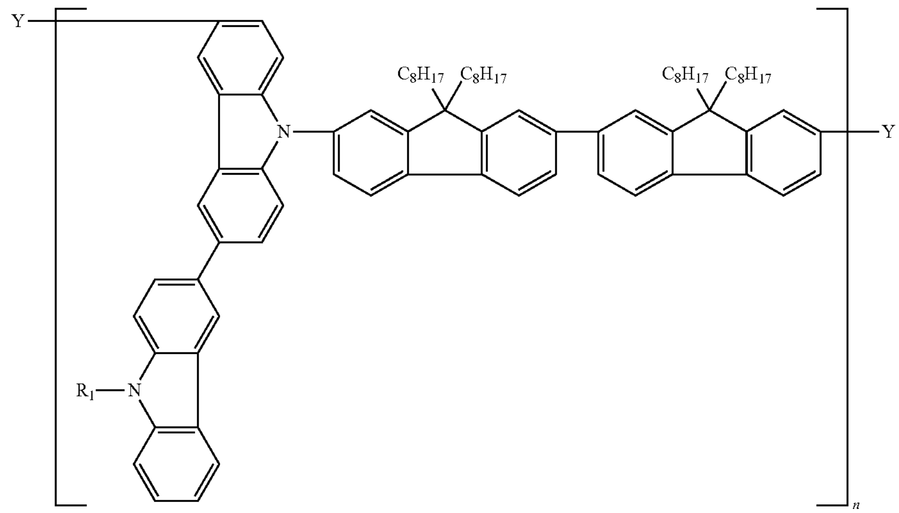
| Com. | R1 | Y |
|---|---|---|
| 28-1 | H-1 | H-29 |
| 28-2 | H-2 | |
| 28-3 | H-3 | |
| 28-4 | H-4 | |
| 28-5 | H-5 | |
| 28-6 | H-6 | |
| 28-7 | H-7 | |
| 28-8 | H-8 | |
| 28-9 | H-9 | |
| 28-10 | H-10 | |
| 28-11 | H-11 | |
| 28-12 | H-12 | |
| 28-13 | H-13 | |
| 28-14 | H-14 | |
| 28-15 | H-15 | |
| 28-16 | H-16 | |
| 28-17 | H-17 | |
| 28-18 | H-18 | |
| 28-19 | H-1 | H-30 |
| 28-20 | H-2 | |
| 28-21 | H-3 | |
| 28-22 | H-4 | |
| 28-23 | H-5 | |
| 28-24 | H-6 | |
| 28-25 | H-7 | |
| 28-26 | H-8 | |
| 28-27 | H-9 | |
| 28-28 | H-10 | |
| 28-29 | H-11 | |
| 28-30 | H-12 | |
| 28-31 | H-13 | |
| 28-32 | H-14 | |
| 28-33 | H-15 | |
| 28-34 | H-16 | |
| 28-35 | H-17 | |
| 28-36 | H-18 | |

-continued
Compound 29-X
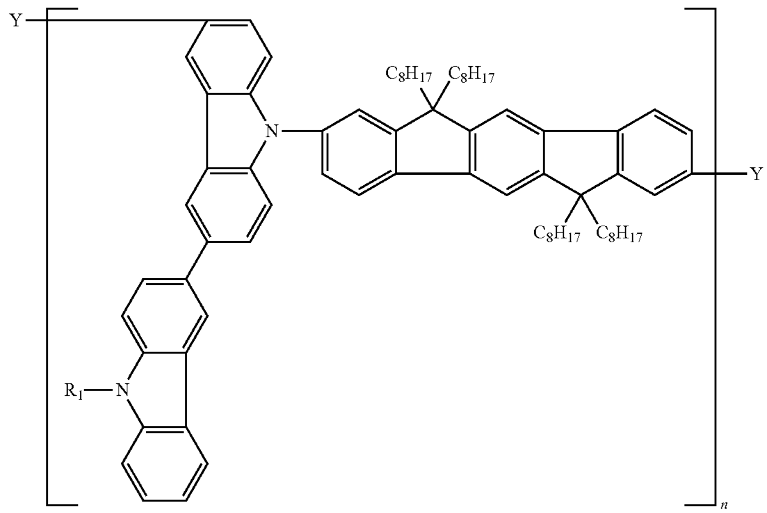
| Com. | R1 | Y |
|---|---|---|
| 29-1 | H-1 | H-29 |
| 29-2 | H-2 | |
| 29-3 | H-3 | |
| 29-4 | H-4 | |
| 29-5 | H-5 | |
| 29-6 | H-6 | |
| 29-7 | H-7 | |
| 29-8 | H-8 | |
| 29-9 | H-9 | |
| 29-10 | H-10 | |
| 29-11 | H-11 | |
| 29-12 | H-12 | |
| 29-13 | H-13 | |
| 29-14 | H-14 | |
| 29-15 | H-15 | |
| 29-16 | H-16 | |
| 29-17 | H-17 | |
| 29-18 | H-18 | |
| 29-19 | H-1 | H-30 |
| 29-20 | H-2 | |
| 29-21 | H-3 | |
| 29-22 | H-4 | |
| 29-23 | H-5 | |
| 29-24 | H-6 | |
| 29-25 | H-7 | |
| 29-26 | H-8 | |
| 29-27 | H-9 | |
| 29-28 | H-10 | |
| 29-29 | H-11 | |
| 29-30 | H-12 | |
| 29-31 | H-13 | |
| 29-32 | H-14 | |
| 29-33 | H-15 | |
| 29-34 | H-16 | |
| 29-35 | H-17 | |
| 29-36 | H-18 | |

-continued
Compound 30-X
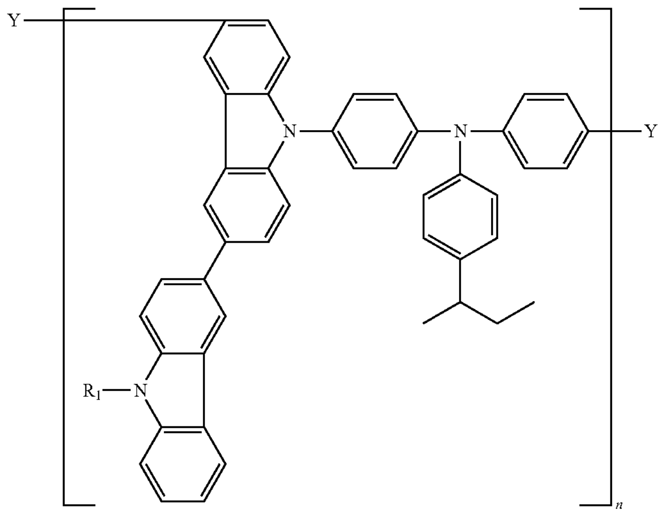
| Com. | R1 | Y |
|---|---|---|
| 30-1 | H-1 | H-29 |
| 30-2 | H-2 | |
| 30-3 | H-3 | |
| 30-4 | H-4 | |
| 30-5 | H-5 | |
| 30-6 | H-6 | |
| 30-7 | H-7 | |
| 30-8 | H-8 | |
| 30-9 | H-9 | |
| 30-10 | H-10 | |
| 30-11 | H-11 | |
| 30-12 | H-12 | |
| 30-13 | H-13 | |
| 30-14 | H-14 | |
| 30-15 | H-15 | |
| 30-16 | H-16 | |
| 30-17 | H-17 | |
| 30-18 | H-18 | |
| 30-19 | H-1 | H-30 |
| 30-20 | H-2 | |
| 30-21 | H-3 | |
| 30-22 | H-4 | |
| 30-23 | H-5 | |
| 30-24 | H-6 | |
| 30-25 | H-7 | |
| 30-26 | H-8 | |
| 30-27 | H-9 | |
| 30-28 | H-10 | |
| 30-29 | H-11 | |
| 30-30 | H-12 | |
| 30-31 | H-13 | |
| 30-32 | H-14 | |
| 30-33 | H-15 | |
| 30-34 | H-16 | |
| 30-35 | H-17 | |
| 30-36 | H-18 | |

-continued
Compound 31-X
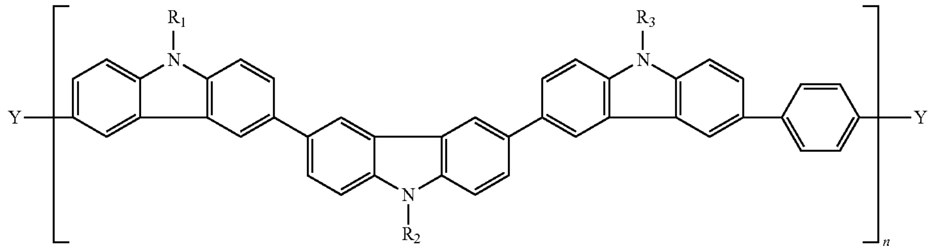
| Com. | R1 = R2 = R3 | Y |
|---|---|---|
| 31-1 | H-1 | H-29 |
| 31-2 | H-2 | |
| 31-3 | H-3 | |
| 31-4 | H-4 | |
| 31-5 | H-5 | |
| 31-6 | H-6 | |
| 31-7 | H-7 | |
| 31-8 | H-8 | |
| 31-9 | H-9 | |
| 31-10 | H-10 | |
| 31-11 | H-11 | |
| 31-12 | H-12 | |
| 31-13 | H-13 | |
| 31-14 | H-14 | |
| 31-15 | H-15 | |
| 31-16 | H-16 | |
| 31-17 | H-17 | |
| 31-18 | H-18 | |
| 31-19 | H-1 | H-30 |
| 31-20 | H-2 | |
| 31-21 | H-3 | |
| 31-22 | H-4 | |
| 31-23 | H-5 | |
| 31-24 | H-6 | |
| 31-25 | H-7 | |
| 31-26 | H-8 | |
| 31-27 | H-9 | |
| 31-28 | H-10 | |
| 31-29 | H-11 | |
| 31-30 | H-12 | |
| 31-31 | H-13 | |
| 31-32 | H-14 | |
| 31-33 | H-15 | |
| 31-34 | H-16 | |
| 31-35 | H-17 | |
| 31-36 | H-18 | |
| Com. | R1 = R3 | R2 | Y |
|---|---|---|---|
| 31-37 | H-1 | H-1 | H-29 |
| 31-38 | H-2 | | |
| 31-39 | H-3 | | |
| 31-40 | H-4 | | |
| 31-41 | H-5 | | |
| 31-42 | H-6 | | |
| 31-43 | H-7 | | |
| 31-44 | H-8 | | |
| 31-45 | H-9 | | |
| 31-46 | H-10 | | |
| 31-47 | H-11 | | |
| 31-48 | H-12 | | |
| 31-49 | H-13 | | |
| 31-50 | H-14 | | |
| 31-51 | H-15 | | |
| 31-52 | H-16 | | |
| 31-53 | H-17 | | |
| 31-54 | H-18 | | |
| 31-55 | H-1 | H-1 | H-30 |
| 31-56 | H-2 | | |
| 31-57 | H-3 | | |
| 31-58 | H-4 | | |
| 31-59 | H-5 | | |
| 31-60 | H-6 | | |
| 31-61 | H-7 | | |

-continued
| | |
|---|---|
| 31-62 | H-8 |
| 31-63 | H-9 |
| 31-64 | H-10 |
| 31-65 | H-11 |
| 31-66 | H-12 |
| 31-67 | H-13 |
| 31-68 | H-14 |
| 31-69 | H-15 |
| 31-70 | H-16 |
| 31-71 | H-17 |
| 31-72 | H-18 |
Compound 32-X
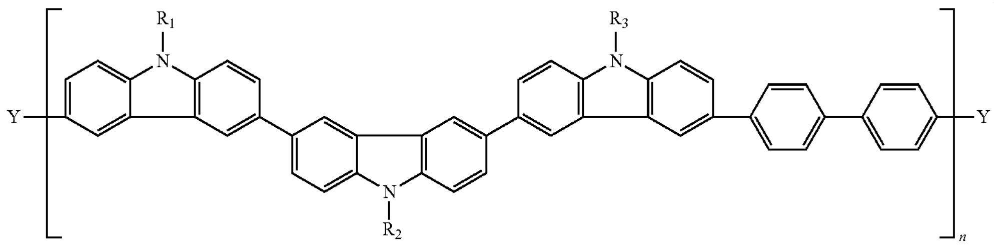
| Com. | R1 = R2 = R3 | Y |
|---|---|---|
| 32-1 | H-1 | H-29 |
| 32-2 | H-2 | |
| 32-3 | H-3 | |
| 32-4 | H-4 | |
| 32-5 | H-5 | |
| 32-6 | H-6 | |
| 32-7 | H-7 | |
| 32-8 | H-8 | |
| 32-9 | H-9 | |
| 32-10 | H-10 | |
| 32-11 | H-11 | |
| 32-12 | H-12 | |
| 32-13 | H-13 | |
| 32-14 | H-14 | |
| 32-15 | H-15 | |
| 32-16 | H-16 | |
| 32-17 | H-17 | |
| 32-18 | H-18 | |
| 32-19 | H-1 | H-30 |
| 32-20 | H-2 | |
| 32-21 | H-3 | |
| 32-22 | H-4 | |
| 32-23 | H-5 | |
| 32-24 | H-6 | |
| 32-25 | H-7 | |
| 32-26 | H-8 | |
| 32-27 | H-9 | |
| 32-28 | H-10 | |
| 32-29 | H-11 | |
| 32-30 | H-12 | |
| 32-31 | H-13 | |
| 32-32 | H-14 | |
| 32-33 | H-15 | |
| 32-34 | H-16 | |
| 32-35 | H-17 | |
| 32-36 | H-18 | |
| Com. | R1 = R3 | R2 | Y |
|---|---|---|---|
| 32-37 | H-1 | H-1 | H-29 |
| 32-38 | H-2 | | |
| 32-39 | H-3 | | |
| 32-40 | H-4 | | |
| 32-41 | H-5 | | |
| 32-42 | H-6 | | |
| 32-43 | H-7 | | |
| 32-44 | H-8 | | |
| 32-45 | H-9 | | |
| 32-46 | H-10 | | |
| 32-47 | H-11 | | |
| 32-48 | H-12 | | |
| 32-49 | H-13 | | |

-continued
| | | | |
|---|---|---|---|
| 32-50 | H-14 | | |
| 32-51 | H-15 | | |
| 32-52 | H-16 | | |
| 32-53 | H-17 | | |
| 32-54 | H-18 | | |
| 32-55 | H-1 | H-1 | H-30 |
| 32-56 | H-2 | | |
| 32-57 | H-3 | | |
| 32-58 | H-4 | | |
| 32-59 | H-5 | | |
| 32-60 | H-6 | | |
| 32-61 | H-7 | | |
| 32-62 | H-8 | | |
| 32-63 | H-9 | | |
| 32-64 | H-10 | | |
| 32-65 | H-11 | | |
| 32-66 | H-12 | | |
| 32-67 | H-13 | | |
| 32-68 | H-14 | | |
| 32-69 | H-15 | | |
| 32-70 | H-16 | | |
| 32-71 | H-17 | | |
| 32-72 | H-18 | | |
Compound 33-X
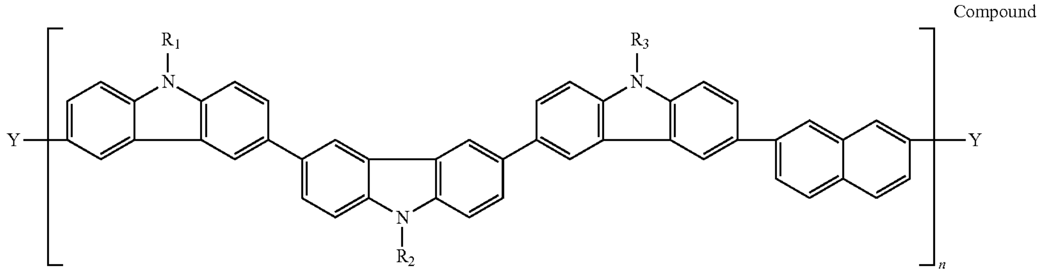
| Com. | R1 = R2 = R3 | Y |
|---|---|---|
| 33-1 | H-1 | H-29 |
| 33-2 | H-2 | |
| 33-3 | H-3 | |
| 33-4 | H-4 | |
| 33-5 | H-5 | |
| 33-6 | H-6 | |
| 33-7 | H-7 | |
| 33-8 | H-8 | |
| 33-9 | H-9 | |
| 33-10 | H-10 | |
| 33-11 | H-11 | |
| 33-12 | H-12 | |
| 33-13 | H-13 | |
| 33-14 | H-14 | |
| 33-15 | H-15 | |
| 33-16 | H-16 | |
| 33-17 | H-17 | |
| 33-18 | H-18 | |
| 33-19 | H-1 | H-30 |
| 33-20 | H-2 | |
| 33-21 | H-3 | |
| 33-22 | H-4 | |
| 33-23 | H-5 | |
| 33-24 | H-6 | |
| 33-25 | H-7 | |
| 33-26 | H-8 | |
| 33-27 | H-9 | |
| 33-28 | H-10 | |
| 33-29 | H-11 | |
| 33-30 | H-12 | |
| 33-31 | H-13 | |
| 33-32 | H-14 | |
| 33-33 | H-15 | |
| 33-34 | H-16 | |
| 33-35 | H-17 | |
| 33-36 | H-18 | |

-continued
| Com. | R1 = R3 | R2 | Y |
|---|---|---|---|
| 33-37 | H-1 | H-1 | H-29 |
| 33-38 | H-2 | | |
| 33-39 | H-3 | | |
| 33-40 | H-4 | | |
| 33-41 | H-5 | | |
| 33-42 | H-6 | | |
| 33-43 | H-7 | | |
| 33-44 | H-8 | | |
| 33-45 | H-9 | | |
| 33-46 | H-10 | | |
| 33-47 | H-11 | | |
| 33-48 | H-12 | | |
| 33-49 | H-13 | | |
| 33-50 | H-14 | | |
| 33-51 | H-15 | | |
| 33-52 | H-16 | | |
| 33-53 | H-17 | | |
| 33-54 | H-18 | | |
| 33-55 | H-1 | H-1 | H-30 |
| 33-56 | H-2 | | |
| 33-57 | H-3 | | |
| 33-58 | H-4 | | |
| 33-59 | H-5 | | |
| 33-60 | H-6 | | |
| 33-61 | H-7 | | |
| 33-62 | H-8 | | |
| 33-63 | H-9 | | |
| 33-64 | H-10 | | |
| 33-65 | H-11 | | |
| 33-66 | H-12 | | |
| 33-67 | H-13 | | |
| 33-68 | H-14 | | |
| 33-69 | H-15 | | |
| 33-70 | H-16 | | |
| 33-71 | H-17 | | |
| 33-72 | H-18 | | |
Compound 34-X
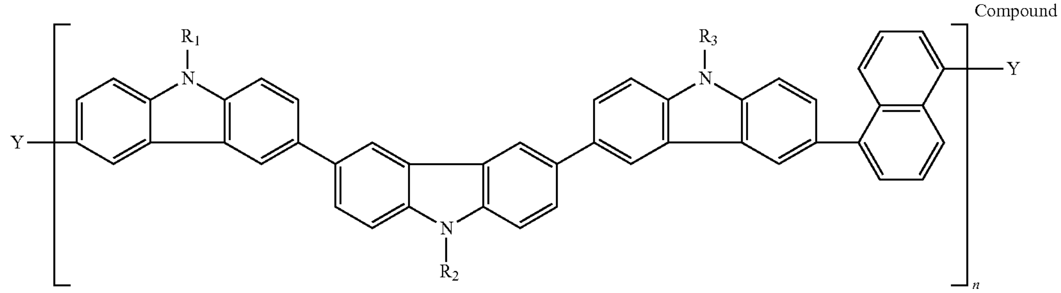
| Com. | R1 = R2 = R3 | Y |
|---|---|---|
| 34-1 | H-1 | H-29 |
| 34-2 | H-2 | |
| 34-3 | H-3 | |
| 34-4 | H-4 | |
| 34-5 | H-5 | |
| 34-6 | H-6 | |
| 34-7 | H-7 | |
| 34-8 | H-8 | |
| 34-9 | H-9 | |
| 34-10 | H-10 | |
| 34-11 | H-11 | |
| 34-12 | H-12 | |
| 34-13 | H-13 | |
| 34-14 | H-14 | |
| 34-15 | H-15 | |
| 34-16 | H-16 | |
| 34-17 | H-17 | |
| 34-18 | H-18 | |
| 34-19 | H-1 | H-30 |
| 34-20 | H-2 | |
| 34-21 | H-3 | |
| 34-22 | H-4 | |
| 34-23 | H-5 | |
| 34-24 | H-6 | |

-continued
| | | | |
|---|---|---|---|
| 34-25 | H-7 | | |
| 34-26 | H-8 | | |
| 34-27 | H-9 | | |
| 34-28 | H-10 | | |
| 34-29 | H-11 | | |
| 34-30 | H-12 | | |
| 34-31 | H-13 | | |
| 34-32 | H-14 | | |
| 34-33 | H-15 | | |
| 34-34 | H-16 | | |
| 34-35 | H-17 | | |
| 34-36 | H-18 | | |
| Com. | R1 = R3 | R2 | Y |
|---|---|---|---|
| 34-37 | H-1 | H-1 | H-29 |
| 34-38 | H-2 | | |
| 34-39 | H-3 | | |
| 34-40 | H-4 | | |
| 34-41 | H-5 | | |
| 34-42 | H-6 | | |
| 34-43 | H-7 | | |
| 34-44 | H-8 | | |
| 34-45 | H-9 | | |
| 34-46 | H-10 | | |
| 34-47 | H-11 | | |
| 34-48 | H-12 | | |
| 34-49 | H-13 | | |
| 34-50 | H-14 | | |
| 34-51 | H-15 | | |
| 34-52 | H-16 | | |
| 34-53 | H-17 | | |
| 34-54 | H-18 | | |
| 34-55 | H-1 | H-1 | H-30 |
| 34-56 | H-2 | | |
| 34-57 | H-3 | | |
| 34-58 | H-4 | | |
| 34-59 | H-5 | | |
| 34-60 | H-6 | | |
| 34-61 | H-7 | | |
| 34-62 | H-8 | | |
| 34-63 | H-9 | | |
| 34-64 | H-10 | | |
| 34-65 | H-11 | | |
| 34-66 | H-12 | | |
| 34-67 | H-13 | | |
| 34-68 | H-14 | | |
| 34-69 | H-15 | | |
| 34-70 | H-16 | | |
| 34-71 | H-17 | | |
| 34-72 | H-18 | | |
Compound 35-X
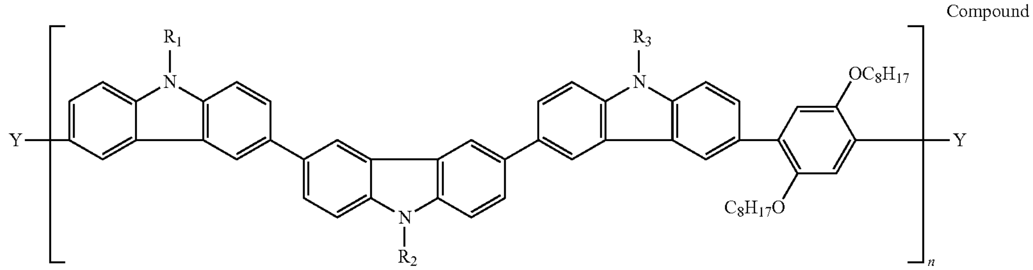
| Com. | R1 = R2 = R3 | Y |
|---|---|---|
| 35-1 | H-1 | H-29 |
| 35-2 | H-2 | |
| 35-3 | H-3 | |
| 35-4 | H-4 | |
| 35-5 | H-5 | |
| 35-6 | H-6 | |
| 35-7 | H-7 | |
| 35-8 | H-8 | |
| 35-9 | H-9 | |
| 35-10 | H-10 | |
| 35-11 | H-11 | |
| 35-12 | H-12 | |

-continued

| | | |
|---|---|---|
| 35-13 | H-13 | |
| 35-14 | H-14 | |
| 35-15 | H-15 | |
| 35-16 | H-16 | |
| 35-17 | H-17 | |
| 35-18 | H-18 | |
| 35-19 | H-1 | H-30 |
| 35-20 | H-2 | |
| 35-21 | H-3 | |
| 35-22 | H-4 | |
| 35-23 | H-5 | |
| 35-24 | H-6 | |
| 35-25 | H-7 | |
| 35-26 | H-8 | |
| 35-27 | H-9 | |
| 35-28 | H-10 | |
| 35-29 | H-11 | |
| 35-30 | H-12 | |
| 35-31 | H-13 | |
| 35-32 | H-14 | |
| 35-33 | H-15 | |
| 35-34 | H-16 | |
| 35-35 | H-17 | |
| 35-36 | H-18 | |

| Com. | R1 = R3 | R2 | Y |
|---|---|---|---|
| 35-37 | H-1 | H-1 | H-29 |
| 35-38 | H-2 | | |
| 35-39 | H-3 | | |
| 35-40 | H-4 | | |
| 35-41 | H-5 | | |
| 35-42 | H-6 | | |
| 35-43 | H-7 | | |
| 35-44 | H-8 | | |
| 35-45 | H-9 | | |
| 35-46 | H-10 | | |
| 35-47 | H-11 | | |
| 35-48 | H-12 | | |
| 35-49 | H-13 | | |
| 35-50 | H-14 | | |
| 35-51 | H-15 | | |
| 35-52 | H-16 | | |
| 35-53 | H-17 | | |
| 35-54 | H-18 | | |
| 35-55 | H-1 | H-1 | H-30 |
| 35-56 | H-2 | | |
| 35-57 | H-3 | | |
| 35-58 | H-4 | | |
| 35-59 | H-5 | | |
| 35-60 | H-6 | | |
| 35-61 | H-7 | | |
| 35-62 | H-8 | | |
| 35-63 | H-9 | | |
| 35-64 | H-10 | | |
| 35-65 | H-11 | | |
| 35-66 | H-12 | | |
| 35-67 | H-13 | | |
| 35-68 | H-14 | | |
| 35-69 | H-15 | | |
| 35-70 | H-16 | | |
| 35-71 | H-17 | | |
| 35-72 | H-18 | | |

-continued
Compound 36-X
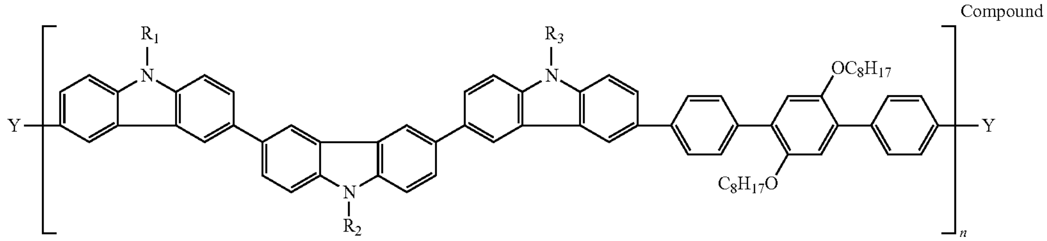
| Com. | R1 = R2 = R3 | Y |
|---|---|---|
| 36-1 | H-1 | H-29 |
| 36-2 | H-2 | |
| 36-3 | H-3 | |
| 36-4 | H-4 | |
| 36-5 | H-5 | |
| 36-6 | H-6 | |
| 36-7 | H-7 | |
| 36-8 | H-8 | |
| 36-9 | H-9 | |
| 36-10 | H-10 | |
| 36-11 | H-11 | |
| 36-12 | H-12 | |
| 36-13 | H-13 | |
| 36-14 | H-14 | |
| 36-15 | H-15 | |
| 36-16 | H-16 | |
| 36-17 | H-17 | |
| 36-18 | H-18 | |
| 36-19 | H-1 | H-30 |
| 36-20 | H-2 | |
| 36-21 | H-3 | |
| 36-22 | H-4 | |
| 36-23 | H-5 | |
| 36-24 | H-6 | |
| 36-25 | H-7 | |
| 36-26 | H-8 | |
| 36-27 | H-9 | |
| 36-28 | H-10 | |
| 36-29 | H-11 | |
| 36-30 | H-12 | |
| 36-31 | H-13 | |
| 36-32 | H-14 | |
| 36-33 | H-15 | |
| 36-34 | H-16 | |
| 36-35 | H-17 | |
| 36-36 | H-18 | |
| Com. | R1 = R3 | R2 | Y |
|---|---|---|---|
| 36-37 | H-1 | H-1 | H-29 |
| 36-38 | H-2 | | |
| 36-39 | H-3 | | |
| 36-40 | H-4 | | |
| 36-41 | H-5 | | |
| 36-42 | H-6 | | |
| 36-43 | H-7 | | |
| 36-44 | H-8 | | |
| 36-45 | H-9 | | |
| 36-46 | H-10 | | |
| 36-47 | H-11 | | |
| 36-48 | H-12 | | |
| 36-49 | H-13 | | |
| 36-50 | H-14 | | |
| 36-51 | H-15 | | |
| 36-52 | H-16 | | |
| 36-53 | H-17 | | |
| 36-54 | H-18 | | |
| 36-55 | H-1 | H-1 | H-30 |
| 36-56 | H-2 | | |
| 36-57 | H-3 | | |
| 36-58 | H-4 | | |
| 36-59 | H-5 | | |
| 36-60 | H-6 | | |
| 36-61 | H-7 | | |
| 36-62 | H-8 | | |

-continued
| | |
|---|---|
| 36-63 | H-9 |
| 36-64 | H-10 |
| 36-65 | H-11 |
| 36-66 | H-12 |
| 36-67 | H-13 |
| 36-68 | H-14 |
| 36-69 | H-15 |
| 36-70 | H-16 |
| 36-71 | H-17 |
| 36-72 | H-18 |
Compound 37-X
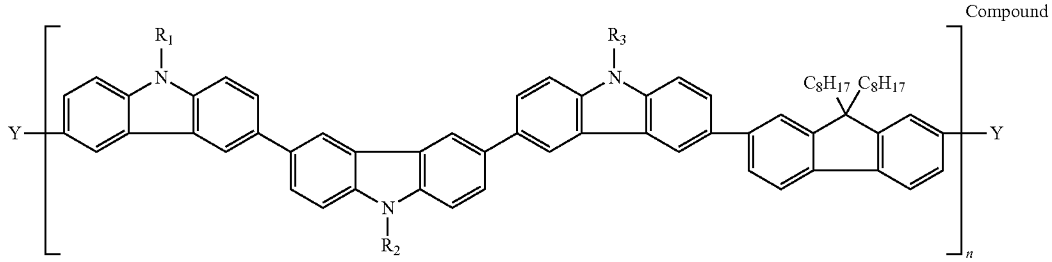
| Com. | R1 = R2 = R3 | Y |
|---|---|---|
| 37-1 | H-1 | H-29 |
| 37-2 | H-2 | |
| 37-3 | H-3 | |
| 37-4 | H-4 | |
| 37-5 | H-5 | |
| 37-6 | H-6 | |
| 37-7 | H-7 | |
| 37-8 | H-8 | |
| 37-9 | H-9 | |
| 37-10 | H-10 | |
| 37-11 | H-11 | |
| 37-12 | H-12 | |
| 37-13 | H-13 | |
| 37-14 | H-14 | |
| 37-15 | H-15 | |
| 37-16 | H-16 | |
| 37-17 | H-17 | |
| 37-18 | H-18 | |
| 37-19 | H-1 | H-30 |
| 37-20 | H-2 | |
| 37-21 | H-3 | |
| 37-22 | H-4 | |
| 37-23 | H-5 | |
| 37-24 | H-6 | |
| 37-25 | H-7 | |
| 37-26 | H-8 | |
| 37-27 | H-9 | |
| 37-28 | H-10 | |
| 37-29 | H-11 | |
| 37-30 | H-12 | |
| 37-31 | H-13 | |
| 37-32 | H-14 | |
| 37-33 | H-15 | |
| 37-34 | H-16 | |
| 37-35 | H-17 | |
| 37-36 | H-18 | |
| Com. | R1 = R3 | R2 | Y |
|---|---|---|---|
| 37-37 | H-1 | H-1 | H-29 |
| 37-38 | H-2 | | |
| 37-39 | H-3 | | |
| 37-40 | H-4 | | |
| 37-41 | H-5 | | |
| 37-42 | H-6 | | |
| 37-43 | H-7 | | |
| 37-44 | H-8 | | |
| 37-45 | H-9 | | |
| 37-46 | H-10 | | |
| 37-47 | H-11 | | |
| 37-48 | H-12 | | |
| 37-49 | H-13 | | |
| 37-50 | H-14 | | |

-continued
| | | | |
|---|---|---|---|
| 37-51 | H-15 | | |
| 37-52 | H-16 | | |
| 37-53 | H-17 | | |
| 37-54 | H-18 | | |
| 37-55 | H-1 | H-1 | H-30 |
| 37-56 | H-2 | | |
| 37-57 | H-3 | | |
| 37-58 | H-4 | | |
| 37-59 | H-5 | | |
| 37-60 | H-6 | | |
| 37-61 | H-7 | | |
| 37-62 | H-8 | | |
| 37-63 | H-9 | | |
| 37-64 | H-10 | | |
| 37-65 | H-11 | | |
| 37-66 | H-12 | | |
| 37-67 | H-13 | | |
| 37-68 | H-14 | | |
| 37-69 | H-15 | | |
| 37-70 | H-16 | | |
| 37-71 | H-17 | | |
| 37-72 | H-18 | | |
Compound 38-X
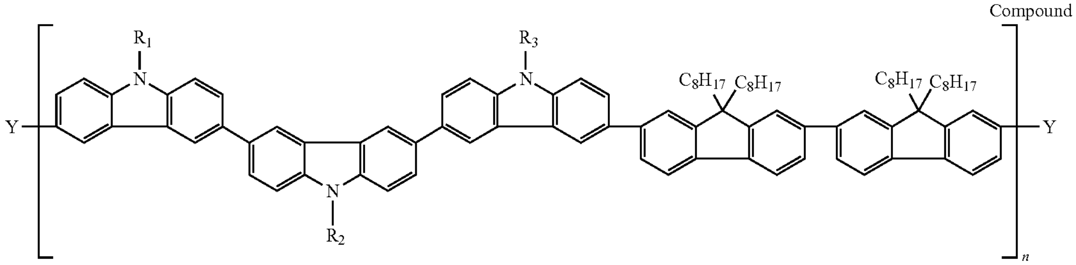
| Com. | R1 = R2 = R3 | Y |
|---|---|---|
| 38-1 | H-1 | H-29 |
| 38-2 | H-2 | |
| 38-3 | H-3 | |
| 38-4 | H-4 | |
| 38-5 | H-5 | |
| 38-6 | H-6 | |
| 38-7 | H-7 | |
| 38-8 | H-8 | |
| 38-9 | H-9 | |
| 38-10 | H-10 | |
| 38-11 | H-11 | |
| 38-12 | H-12 | |
| 38-13 | H-13 | |
| 38-14 | H-14 | |
| 38-15 | H-15 | |
| 38-16 | H-16 | |
| 38-17 | H-17 | |
| 38-18 | H-18 | |
| 38-19 | H-1 | H-30 |
| 38-20 | H-2 | |
| 38-21 | H-3 | |
| 38-22 | H-4 | |
| 38-23 | H-5 | |
| 38-24 | H-6 | |
| 38-25 | H-7 | |
| 38-26 | H-8 | |
| 38-27 | H-9 | |
| 38-28 | H-10 | |
| 38-29 | H-11 | |
| 38-30 | H-12 | |
| 38-31 | H-13 | |
| 38-32 | H-14 | |
| 38-33 | H-15 | |
| 38-34 | H-16 | |
| 38-35 | H-17 | |
| 38-36 | H-18 | |
| Com. | R1 = R3 | R2 | Y |
|---|---|---|---|
| 38-37 | H-1 | H-1 | H-29 |
| 38-38 | H-2 | | |

-continued
| | | | |
|---|---|---|---|
| 38-39 | H-3 | | |
| 38-40 | H-4 | | |
| 38-41 | H-5 | | |
| 38-42 | H-6 | | |
| 38-43 | H-7 | | |
| 38-44 | H-8 | | |
| 38-45 | H-9 | | |
| 38-46 | H-10 | | |
| 38-47 | H-11 | | |
| 38-48 | H-12 | | |
| 38-49 | H-13 | | |
| 38-50 | H-14 | | |
| 38-51 | H-15 | | |
| 38-52 | H-16 | | |
| 38-53 | H-17 | | |
| 38-54 | H-18 | | |
| 38-55 | H-1 | H-1 | H-30 |
| 38-56 | H-2 | | |
| 38-57 | H-3 | | |
| 38-58 | H-4 | | |
| 38-59 | H-5 | | |
| 38-60 | H-6 | | |
| 38-61 | H-7 | | |
| 38-62 | H-8 | | |
| 38-63 | H-9 | | |
| 38-64 | H-10 | | |
| 38-65 | H-11 | | |
| 38-66 | H-12 | | |
| 38-67 | H-13 | | |
| 38-68 | H-14 | | |
| 38-69 | H-15 | | |
| 38-70 | H-16 | | |
| 38-71 | H-17 | | |
| 38-72 | H-18 | | |
Compound 39-X
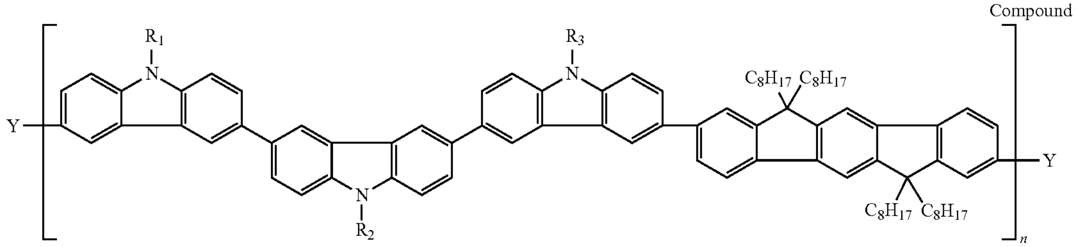
| Com. | R1 = R2 = R3 | Y |
|---|---|---|
| 39-1 | H-1 | H-29 |
| 39-2 | H-2 | |
| 39-3 | H-3 | |
| 39-4 | H-4 | |
| 39-5 | H-5 | |
| 39-6 | H-6 | |
| 39-7 | H-7 | |
| 39-8 | H-8 | |
| 39-9 | H-9 | |
| 39-10 | H-10 | |
| 39-11 | H-11 | |
| 39-12 | H-12 | |
| 39-13 | H-13 | |
| 39-14 | H-14 | |
| 39-15 | H-15 | |
| 39-16 | H-16 | |
| 39-17 | H-17 | |
| 39-18 | H-18 | |
| 39-19 | H-1 | H-30 |
| 39-20 | H-2 | |
| 39-21 | H-3 | |
| 39-22 | H-4 | |
| 39-23 | H-5 | |
| 39-24 | H-6 | |
| 39-25 | H-7 | |
| 39-26 | H-8 | |
| 39-27 | H-9 | |
| 39-28 | H-10 | |
| 39-29 | H-11 | |
| 39-30 | H-12 | |

-continued
| | | | |
|---|---|---|---|
| 39-31 | H-13 | | |
| 39-32 | H-14 | | |
| 39-33 | H-15 | | |
| 39-34 | H-16 | | |
| 39-35 | H-17 | | |
| 39-36 | H-18 | | |
| Com. | R1 = R3 | R2 | Y |
|---|---|---|---|
| 39-37 | H-1 | H-1 | H-29 |
| 39-38 | H-2 | | |
| 39-39 | H-3 | | |
| 39-40 | H-4 | | |
| 39-41 | H-5 | | |
| 39-42 | H-6 | | |
| 39-43 | H-7 | | |
| 39-44 | H-8 | | |
| 39-45 | H-9 | | |
| 39-46 | H-10 | | |
| 39-47 | H-11 | | |
| 39-48 | H-12 | | |
| 39-49 | H-13 | | |
| 39-50 | H-14 | | |
| 39-51 | H-15 | | |
| 39-52 | H-16 | | |
| 39-53 | H-17 | | |
| 39-54 | H-18 | | |
| 39-55 | H-1 | H-1 | H-30 |
| 39-56 | H-2 | | |
| 39-57 | H-3 | | |
| 39-58 | H-4 | | |
| 39-59 | H-5 | | |
| 39-60 | H-6 | | |
| 39-61 | H-7 | | |
| 39-62 | H-8 | | |
| 39-63 | H-9 | | |
| 39-64 | H-10 | | |
| 39-65 | H-11 | | |
| 39-66 | H-12 | | |
| 39-67 | H-13 | | |
| 39-68 | H-14 | | |
| 39-69 | H-15 | | |
| 39-70 | H-16 | | |
| 39-71 | H-17 | | |
| 39-72 | H-18 | | |
Compound 40-X
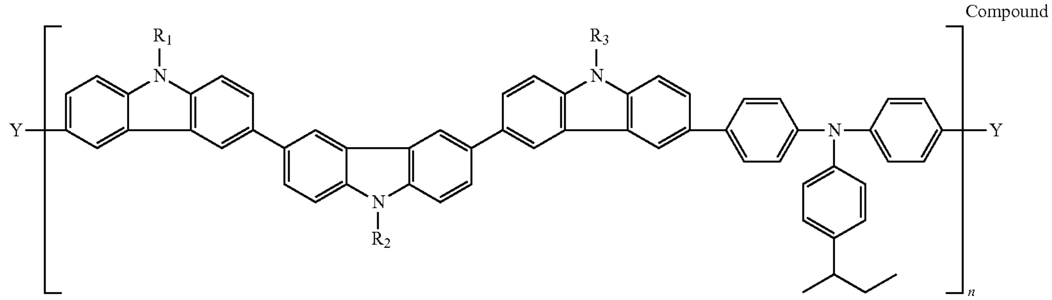
| Com. | R1 = R2 = R3 | Y |
|---|---|---|
| 40-1 | H-1 | H-29 |
| 40-2 | H-2 | |
| 40-3 | H-3 | |
| 40-4 | H-4 | |
| 40-5 | H-5 | |
| 40-6 | H-6 | |
| 40-7 | H-7 | |
| 40-8 | H-8 | |
| 40-9 | H-9 | |
| 40-10 | H-10 | |
| 40-11 | H-11 | |
| 40-12 | H-12 | |
| 40-13 | H-13 | |
| 40-14 | H-14 | |
| 40-15 | H-15 | |
| 40-16 | H-16 | |

-continued

| | | |
|---|---|---|
| 40-17 | H-17 | |
| 40-18 | H-18 | |
| 40-19 | H-1 | H-30 |
| 40-20 | H-2 | |
| 40-21 | H-3 | |
| 40-22 | H-4 | |
| 40-23 | H-5 | |
| 40-24 | H-6 | |
| 40-25 | H-7 | |
| 40-26 | H-8 | |
| 40-27 | H-9 | |
| 40-28 | H-10 | |
| 40-29 | H-11 | |
| 40-30 | H-12 | |
| 40-31 | H-13 | |
| 40-32 | H-14 | |
| 40-33 | H-15 | |
| 40-34 | H-16 | |
| 40-35 | H-17 | |
| 40-36 | H-18 | |

| Com. | R1 = R3 | R2 | Y |
|---|---|---|---|
| 40-37 | H-1 | H-1 | H-29 |
| 40-38 | H-2 | | |
| 40-39 | H-3 | | |
| 40-40 | H-4 | | |
| 40-41 | H-5 | | |
| 40-42 | H-6 | | |
| 40-43 | H-7 | | |
| 40-44 | H-8 | | |
| 40-45 | H-9 | | |
| 40-46 | H-10 | | |
| 40-47 | H-11 | | |
| 40-48 | H-12 | | |
| 40-49 | H-13 | | |
| 40-50 | H-14 | | |
| 40-51 | H-15 | | |
| 40-52 | H-16 | | |
| 40-53 | H-17 | | |
| 40-54 | H-18 | | |
| 40-55 | H-1 | H-1 | H-30 |
| 40-56 | H-2 | | |
| 40-57 | H-3 | | |
| 40-58 | H-4 | | |
| 40-59 | H-5 | | |
| 40-60 | H-6 | | |
| 40-61 | H-7 | | |
| 40-62 | H-8 | | |
| 40-63 | H-9 | | |
| 40-64 | H-10 | | |
| 40-65 | H-11 | | |
| 40-66 | H-12 | | |
| 40-67 | H-13 | | |
| 40-68 | H-14 | | |
| 40-69 | H-15 | | |
| 40-70 | H-16 | | |
| 40-71 | H-17 | | |
| 40-72 | H-18 | | |

-continued
Compound 41-X
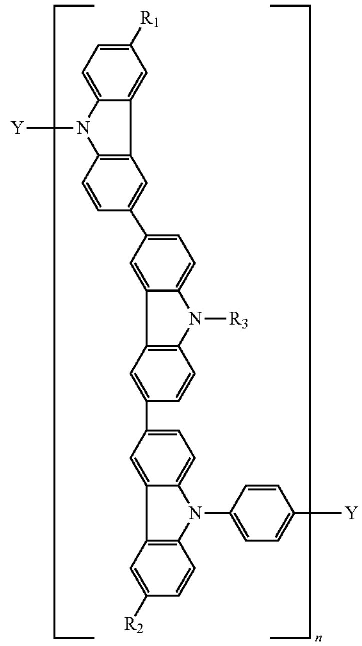
| Com. | R1 = R2 = R3 | Y |
|---|---|---|
| 41-1 | H-1 | H-29 |
| 41-2 | H-2 | |
| 41-3 | H-3 | |
| 41-4 | H-4 | |
| 41-5 | H-5 | |
| 41-6 | H-6 | |
| 41-7 | H-7 | |
| 41-8 | H-8 | |
| 41-9 | H-9 | |
| 41-10 | H-10 | |
| 41-11 | H-11 | |
| 41-12 | H-12 | |
| 41-13 | H-13 | |
| 41-14 | H-14 | |
| 41-15 | H-15 | |
| 41-16 | H-16 | |
| 41-17 | H-17 | |
| 41-18 | H-18 | |
| 41-19 | H-1 | H-30 |
| 41-20 | H-2 | |
| 41-21 | H-3 | |
| 41-22 | H-4 | |
| 41-23 | H-5 | |
| 41-24 | H-6 | |
| 41-25 | H-7 | |
| 41-26 | H-8 | |
| 41-27 | H-9 | |
| 41-28 | H-10 | |
| 41-29 | H-11 | |
| 41-30 | H-12 | |
| 41-31 | H-13 | |
| 41-32 | H-14 | |
| 41-33 | H-15 | |
| 41-34 | H-16 | |
| 41-35 | H-17 | |
| 41-36 | H-18 | |
| Com. | R1 = R2 | R3 | Y |
|---|---|---|---|
| 41-37 | H-1 | H-1 | H-29 |
| 41-38 | H-2 | | |
| 41-39 | H-3 | | |
| 41-40 | H-4 | | |
| 41-41 | H-5 | | |
| 41-42 | H-6 | | |

-continued
| | | | |
|---|---|---|---|
| 41-43 | H-7 | | |
| 41-44 | H-8 | | |
| 41-45 | H-9 | | |
| 41-46 | H-10 | | |
| 41-47 | H-11 | | |
| 41-48 | H-12 | | |
| 41-49 | H-13 | | |
| 41-50 | H-14 | | |
| 41-51 | H-15 | | |
| 41-52 | H-16 | | |
| 41-53 | H-17 | | |
| 41-54 | H-18 | | |
| 41-55 | H-1 | H-1 | H-30 |
| 41-56 | H-2 | | |
| 41-57 | H-3 | | |
| 41-58 | H-4 | | |
| 41-59 | H-5 | | |
| 41-60 | H-6 | | |
| 41-61 | H-7 | | |
| 41-62 | H-8 | | |
| 41-63 | H-9 | | |
| 41-64 | H-10 | | |
| 41-65 | H-11 | | |
| 41-66 | H-12 | | |
| 41-67 | H-13 | | |
| 41-68 | H-14 | | |
| 41-69 | H-15 | | |
| 41-70 | H-16 | | |
| 41-71 | H-17 | | |
| 41-72 | H-18 | | |
Compound 42-X
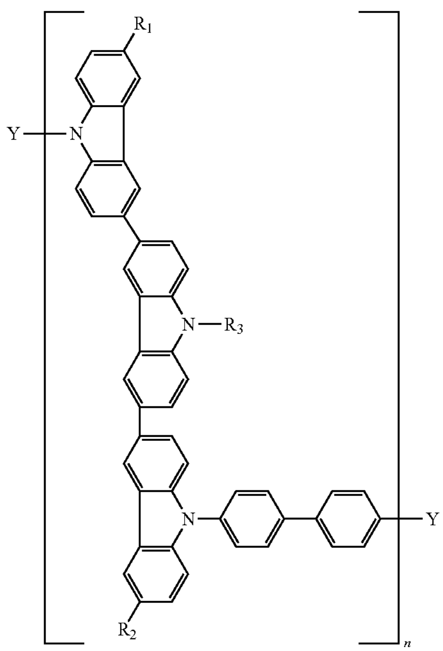
| Com. | R1 = R2 = R3 | Y |
|---|---|---|
| 42-1 | H-1 | H-29 |
| 42-2 | H-2 | |
| 42-3 | H-3 | |
| 42-4 | H-4 | |
| 42-5 | H-5 | |
| 42-6 | H-6 | |
| 42-7 | H-7 | |
| 42-8 | H-8 | |
| 42-9 | H-9 | |
| 42-10 | H-10 | |
| 42-11 | H-11 | |
| 42-12 | H-12 | |
| 42-13 | H-13 | |
| 42-14 | H-14 | |

-continued

| | | |
|---|---|---|
| 42-15 | H-15 | |
| 42-16 | H-16 | |
| 42-17 | H-17 | |
| 42-18 | H-18 | |
| 42-19 | H-1 | H-30 |
| 42-20 | H-2 | |
| 42-21 | H-3 | |
| 42-22 | H-4 | |
| 42-23 | H-5 | |
| 42-24 | H-6 | |
| 42-25 | H-7 | |
| 42-26 | H-8 | |
| 42-27 | H-9 | |
| 42-28 | H-10 | |
| 42-29 | H-11 | |
| 42-30 | H-12 | |
| 42-31 | H-13 | |
| 42-32 | H-14 | |
| 42-33 | H-15 | |
| 42-34 | H-16 | |
| 42-35 | H-17 | |
| 42-36 | H-18 | |

| Com. | R1 = R2 | R3 | Y |
|---|---|---|---|
| 42-37 | H-1 | H-1 | H-29 |
| 42-38 | H-2 | | |
| 42-39 | H-3 | | |
| 42-40 | H-4 | | |
| 42-41 | H-5 | | |
| 42-42 | H-6 | | |
| 42-43 | H-7 | | |
| 42-44 | H-8 | | |
| 42-45 | H-9 | | |
| 42-46 | H-10 | | |
| 42-47 | H-11 | | |
| 42-48 | H-12 | | |
| 42-49 | H-13 | | |
| 42-50 | H-14 | | |
| 42-51 | H-15 | | |
| 42-52 | H-16 | | |
| 42-53 | H-17 | | |
| 42-54 | H-18 | | |
| 42-55 | H-1 | H-1 | H-30 |
| 42-56 | H-2 | | |
| 42-57 | H-3 | | |
| 42-58 | H-4 | | |
| 42-59 | H-5 | | |
| 42-60 | H-6 | | |
| 42-61 | H-7 | | |
| 42-62 | H-8 | | |
| 42-63 | H-9 | | |
| 42-64 | H-10 | | |
| 42-65 | H-11 | | |
| 42-66 | H-12 | | |
| 42-67 | H-13 | | |
| 42-68 | H-14 | | |
| 42-69 | H-15 | | |
| 42-70 | H-16 | | |
| 42-71 | H-17 | | |
| 42-72 | H-18 | | |

-continued
Compound 43-X
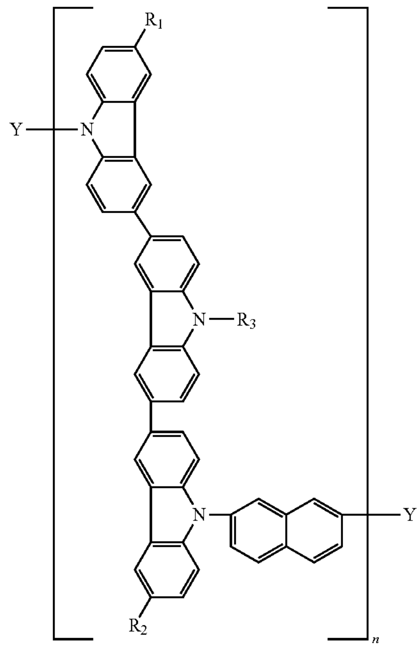
| Com. | R1 = R2 = R3 | Y |
|---|---|---|
| 43-1 | H-1 | H-29 |
| 43-2 | H-2 | |
| 43-3 | H-3 | |
| 43-4 | H-4 | |
| 43-5 | H-5 | |
| 43-6 | H-6 | |
| 43-7 | H-7 | |
| 43-8 | H-8 | |
| 43-9 | H-9 | |
| 43-10 | H-10 | |
| 43-11 | H-11 | |
| 43-12 | H-12 | |
| 43-13 | H-13 | |
| 43-14 | H-14 | |
| 43-15 | H-15 | |
| 43-16 | H-16 | |
| 43-17 | H-17 | |
| 43-18 | H-18 | |
| 43-19 | H-1 | H-30 |
| 43-20 | H-2 | |
| 43-21 | H-3 | |
| 43-22 | H-4 | |
| 43-23 | H-5 | |
| 43-24 | H-6 | |
| 43-25 | H-7 | |
| 43-26 | H-8 | |
| 43-27 | H-9 | |
| 43-28 | H-10 | |
| 43-29 | H-11 | |
| 43-30 | H-12 | |
| 43-31 | H-13 | |
| 43-32 | H-14 | |
| 43-33 | H-15 | |
| 43-34 | H-16 | |
| 43-35 | H-17 | |
| 43-36 | H-18 | |
| Com. | R1 = R2 | R3 | Y |
|---|---|---|---|
| 43-37 | H-1 | H-1 | H-29 |
| 43-38 | H-2 | | |
| 43-39 | H-3 | | |
| 43-40 | H-4 | | |
| 43-41 | H-5 | | |
| 43-42 | H-6 | | |

-continued
| | | | |
|---|---|---|---|
| 43-43 | H-7 | | |
| 43-44 | H-8 | | |
| 43-45 | H-9 | | |
| 43-46 | H-10 | | |
| 43-47 | H-11 | | |
| 43-48 | H-12 | | |
| 43-49 | H-13 | | |
| 43-50 | H-14 | | |
| 43-51 | H-15 | | |
| 43-52 | H-16 | | |
| 43-53 | H-17 | | |
| 43-54 | H-18 | | |
| 43-55 | H-1 | H-1 | H-30 |
| 43-56 | H-2 | | |
| 43-57 | H-3 | | |
| 43-58 | H-4 | | |
| 43-59 | H-5 | | |
| 43-60 | H-6 | | |
| 43-61 | H-7 | | |
| 43-62 | H-8 | | |
| 43-63 | H-9 | | |
| 43-64 | H-10 | | |
| 43-65 | H-11 | | |
| 43-66 | H-12 | | |
| 43-67 | H-13 | | |
| 43-68 | H-14 | | |
| 43-69 | H-15 | | |
| 43-70 | H-16 | | |
| 43-71 | H-17 | | |
| 43-72 | H-18 | | |
Compound 44-X
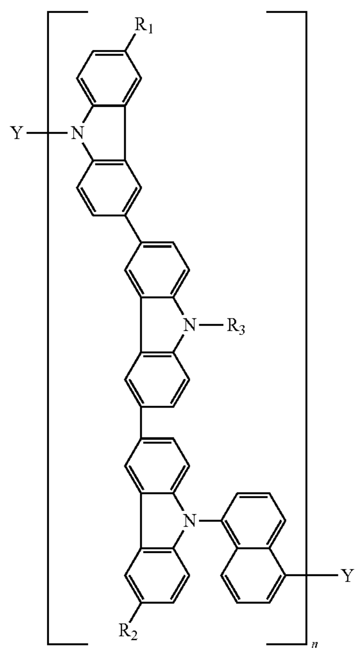
| Com. | R1 = R2 = R3 | Y |
|---|---|---|
| 44-1 | H-1 | H-29 |
| 44-2 | H-2 | |
| 44-3 | H-3 | |
| 44-4 | H-4 | |
| 44-5 | H-5 | |
| 44-6 | H-6 | |
| 44-7 | H-7 | |
| 44-8 | H-8 | |
| 44-9 | H-9 | |
| 44-10 | H-10 | |
| 44-11 | H-11 | |
| 44-12 | H-12 | |
| 44-13 | H-13 | |
| 44-14 | H-14 | |

-continued

| | | | |
|---|---|---|---|
| 44-15 | H-15 | | |
| 44-16 | H-16 | | |
| 44-17 | H-17 | | |
| 44-18 | H-18 | | |
| 44-19 | H-1 | H-30 | |
| 44-20 | H-2 | | |
| 44-21 | H-3 | | |
| 44-22 | H-4 | | |
| 44-23 | H-5 | | |
| 44-24 | H-6 | | |
| 44-25 | H-7 | | |
| 44-26 | H-8 | | |
| 44-27 | H-9 | | |
| 44-28 | H-10 | | |
| 44-29 | H-11 | | |
| 44-30 | H-12 | | |
| 44-31 | H-13 | | |
| 44-32 | H-14 | | |
| 44-33 | H-15 | | |
| 44-34 | H-16 | | |
| 44-35 | H-17 | | |
| 44-36 | H-18 | | |

| Com. | R1 = R2 | R3 | Y |
|---|---|---|---|
| 44-37 | H-1 | H-1 | H-29 |
| 44-38 | H-2 | | |
| 44-39 | H-3 | | |
| 44-40 | H-4 | | |
| 44-41 | H-5 | | |
| 44-42 | H-6 | | |
| 44-43 | H-7 | | |
| 44-44 | H-8 | | |
| 44-45 | H-9 | | |
| 44-46 | H-10 | | |
| 44-47 | H-11 | | |
| 44-48 | H-12 | | |
| 44-49 | H-13 | | |
| 44-50 | H-14 | | |
| 44-51 | H-15 | | |
| 44-52 | H-16 | | |
| 44-53 | H-17 | | |
| 44-54 | H-18 | | |
| 44-55 | H-1 | H-1 | H-30 |
| 44-56 | H-2 | | |
| 44-57 | H-3 | | |
| 44-58 | H-4 | | |
| 44-59 | H-5 | | |
| 44-60 | H-6 | | |
| 44-61 | H-7 | | |
| 44-62 | H-8 | | |
| 44-63 | H-9 | | |
| 44-64 | H-10 | | |
| 44-65 | H-11 | | |
| 44-66 | H-12 | | |
| 44-67 | H-13 | | |
| 44-68 | H-14 | | |
| 44-69 | H-15 | | |
| 44-70 | H-16 | | |
| 44-71 | H-17 | | |
| 44-72 | H-18 | | |

-continued
Compound 45-X
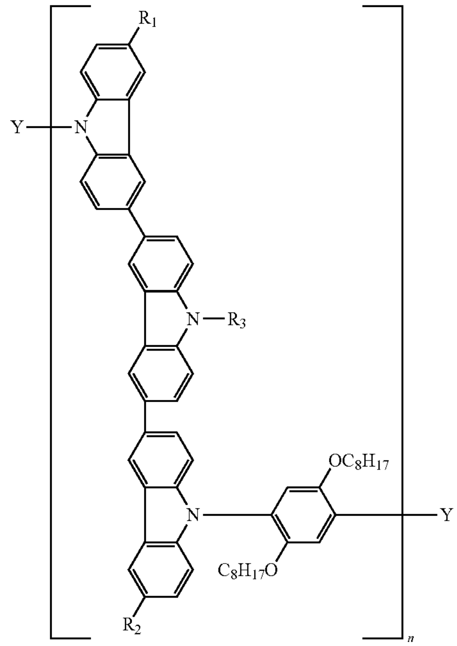
| Com. | R1 = R2 = R3 | Y |
|---|---|---|
| 45-1 | H-1 | H-29 |
| 45-2 | H-2 | |
| 45-3 | H-3 | |
| 45-4 | H-4 | |
| 45-5 | H-5 | |
| 45-6 | H-6 | |
| 45-7 | H-7 | |
| 45-8 | H-8 | |
| 45-9 | H-9 | |
| 45-10 | H-10 | |
| 45-11 | H-11 | |
| 45-12 | H-12 | |
| 45-13 | H-13 | |
| 45-14 | H-14 | |
| 45-15 | H-15 | |
| 45-16 | H-16 | |
| 45-17 | H-17 | |
| 45-18 | H-18 | |
| 45-19 | H-1 | H-30 |
| 45-20 | H-2 | |
| 45-21 | H-3 | |
| 45-22 | H-4 | |
| 45-23 | H-5 | |
| 45-24 | H-6 | |
| 45-25 | H-7 | |
| 45-26 | H-8 | |
| 45-27 | H-9 | |
| 45-28 | H-10 | |
| 45-29 | H-11 | |
| 45-30 | H-12 | |
| 45-31 | H-13 | |
| 45-32 | H-14 | |
| 45-33 | H-15 | |
| 45-34 | H-16 | |
| 45-35 | H-17 | |
| 45-36 | H-18 | |
| Com. | R1 = R2 | R3 | Y |
|---|---|---|---|
| 45-37 | H-1 | H-1 | H-29 |
| 45-38 | H-2 | | |
| 45-39 | H-3 | | |
| 45-40 | H-4 | | |
| 45-41 | H-5 | | |
| 45-42 | H-6 | | |

-continued
| | | | |
|---|---|---|---|
| 45-43 | H-7 | | |
| 45-44 | H-8 | | |
| 45-45 | H-9 | | |
| 45-46 | H-10 | | |
| 45-47 | H-11 | | |
| 45-48 | H-12 | | |
| 45-49 | H-13 | | |
| 45-50 | H-14 | | |
| 45-51 | H-15 | | |
| 45-52 | H-16 | | |
| 45-53 | H-17 | | |
| 45-54 | H-18 | | |
| 45-55 | H-1 | H-1 | H-30 |
| 45-56 | H-2 | | |
| 45-57 | H-3 | | |
| 45-58 | H-4 | | |
| 45-59 | H-5 | | |
| 45-60 | H-6 | | |
| 45-61 | H-7 | | |
| 45-62 | H-8 | | |
| 45-63 | H-9 | | |
| 45-64 | H-10 | | |
| 45-65 | H-11 | | |
| 45-66 | H-12 | | |
| 45-67 | H-13 | | |
| 45-68 | H-14 | | |
| 45-69 | H-15 | | |
| 45-70 | H-16 | | |
| 45-71 | H-17 | | |
| 45-72 | H-18 | | |
Compound 46-X
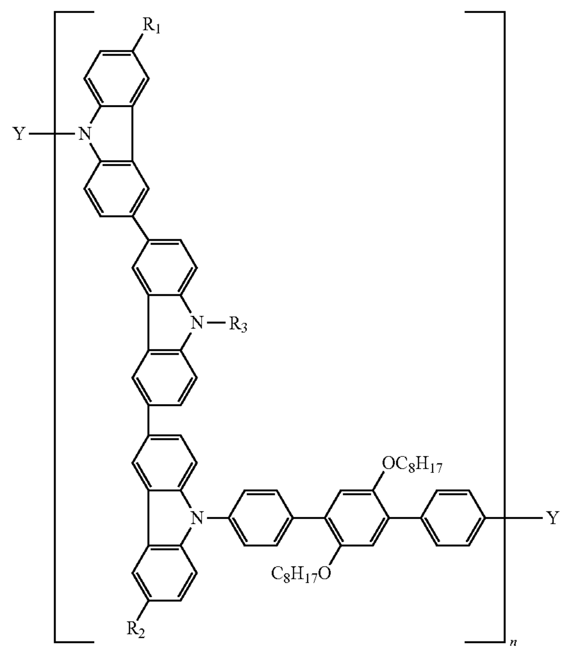
| Com. | R1 = R2 = R3 | Y |
|---|---|---|
| 46-1 | H-1 | H-29 |
| 46-2 | H-2 | |
| 46-3 | H-3 | |
| 46-4 | H-4 | |
| 46-5 | H-5 | |
| 46-6 | H-6 | |
| 46-7 | H-7 | |
| 46-8 | H-8 | |
| 46-9 | H-9 | |
| 46-10 | H-10 | |
| 46-11 | H-11 | |
| 46-12 | H-12 | |
| 46-13 | H-13 | |
| 46-14 | H-14 | |

-continued

| | | |
|---|---|---|
| 46-15 | H-15 | |
| 46-16 | H-16 | |
| 46-17 | H-17 | |
| 46-18 | H-18 | |
| 46-19 | H-1 | H-30 |
| 46-20 | H-2 | |
| 46-21 | H-3 | |
| 46-22 | H-4 | |
| 46-23 | H-5 | |
| 46-24 | H-6 | |
| 46-25 | H-7 | |
| 46-26 | H-8 | |
| 46-27 | H-9 | |
| 46-28 | H-10 | |
| 46-29 | H-11 | |
| 46-30 | H-12 | |
| 46-31 | H-13 | |
| 46-32 | H-14 | |
| 46-33 | H-15 | |
| 46-34 | H-16 | |
| 46-35 | H-17 | |
| 46-36 | H-18 | |

| Com. | R1 = R2 | R3 | Y |
|---|---|---|---|
| 46-37 | H-1 | H-1 | H-29 |
| 46-38 | H-2 | | |
| 46-39 | H-3 | | |
| 46-40 | H-4 | | |
| 46-41 | H-5 | | |
| 46-42 | H-6 | | |
| 46-43 | H-7 | | |
| 46-44 | H-8 | | |
| 46-45 | H-9 | | |
| 46-46 | H-10 | | |
| 46-47 | H-11 | | |
| 46-48 | H-12 | | |
| 46-49 | H-13 | | |
| 46-50 | H-14 | | |
| 46-51 | H-15 | | |
| 46-52 | H-16 | | |
| 46-53 | H-17 | | |
| 46-54 | H-18 | | |
| 46-55 | H-1 | H-1 | H-30 |
| 46-56 | H-2 | | |
| 46-57 | H-3 | | |
| 46-58 | H-4 | | |
| 46-59 | H-5 | | |
| 46-60 | H-6 | | |
| 46-61 | H-7 | | |
| 46-62 | H-8 | | |
| 46-63 | H-9 | | |
| 46-64 | H-10 | | |
| 46-65 | H-11 | | |
| 46-66 | H-12 | | |
| 46-67 | H-13 | | |
| 46-68 | H-14 | | |
| 46-69 | H-15 | | |
| 46-70 | H-16 | | |
| 46-71 | H-17 | | |
| 46-72 | H-18 | | |

-continued
Compound 47-X
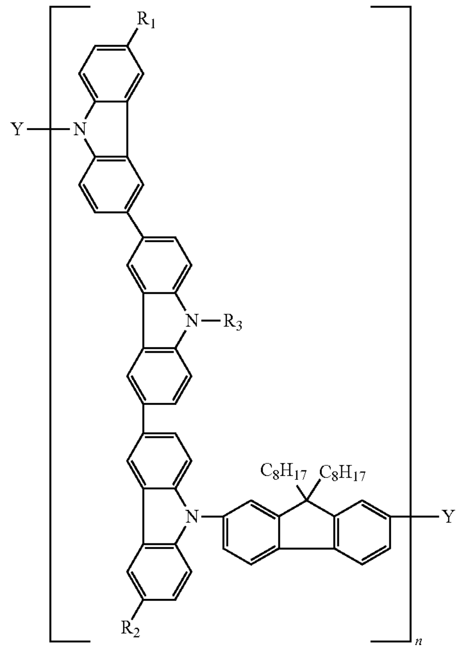
| Com. | R1 = R2 = R3 | Y |
|---|---|---|
| 47-1 | H-1 | H-29 |
| 47-2 | H-2 | |
| 47-3 | H-3 | |
| 47-4 | H-4 | |
| 47-5 | H-5 | |
| 47-6 | H-6 | |
| 47-7 | H-7 | |
| 47-8 | H-8 | |
| 47-9 | H-9 | |
| 47-10 | H-10 | |
| 47-11 | H-11 | |
| 47-12 | H-12 | |
| 47-13 | H-13 | |
| 47-14 | H-14 | |
| 47-15 | H-15 | |
| 47-16 | H-16 | |
| 47-17 | H-17 | |
| 47-18 | H-18 | |
| 47-19 | H-1 | H-30 |
| 47-20 | H-2 | |
| 47-21 | H-3 | |
| 47-22 | H-4 | |
| 47-23 | H-5 | |
| 47-24 | H-6 | |
| 47-25 | H-7 | |
| 47-26 | H-8 | |
| 47-27 | H-9 | |
| 47-28 | H-10 | |
| 47-29 | H-11 | |
| 47-30 | H-12 | |
| 47-31 | H-13 | |
| 47-32 | H-14 | |
| 47-33 | H-15 | |
| 47-34 | H-16 | |
| 47-35 | H-17 | |
| 47-36 | H-18 | |
| Com. | R1 = R2 | R3 | Y |
|---|---|---|---|
| 47-37 | H-1 | H-1 | H-29 |
| 47-38 | H-2 | | |
| 47-39 | H-3 | | |
| 47-40 | H-4 | | |
| 47-41 | H-5 | | |
| 47-42 | H-6 | | |

-continued
| | | | |
|---|---|---|---|
| 47-43 | H-7 | | |
| 47-44 | H-8 | | |
| 47-45 | H-9 | | |
| 47-46 | H-10 | | |
| 47-47 | H-11 | | |
| 47-48 | H-12 | | |
| 47-49 | H-13 | | |
| 47-50 | H-14 | | |
| 47-51 | H-15 | | |
| 47-52 | H-16 | | |
| 47-53 | H-17 | | |
| 47-54 | H-18 | | |
| 47-55 | H-1 | H-1 | H-30 |
| 47-56 | H-2 | | |
| 47-57 | H-3 | | |
| 47-58 | H-4 | | |
| 47-59 | H-5 | | |
| 47-60 | H-6 | | |
| 47-61 | H-7 | | |
| 47-62 | H-8 | | |
| 47-63 | H-9 | | |
| 47-64 | H-10 | | |
| 47-65 | H-11 | | |
| 47-66 | H-12 | | |
| 47-67 | H-13 | | |
| 47-68 | H-14 | | |
| 47-69 | H-15 | | |
| 47-70 | H-16 | | |
| 47-71 | H-17 | | |
| 47-72 | H-18 | | |
Compound 48-X
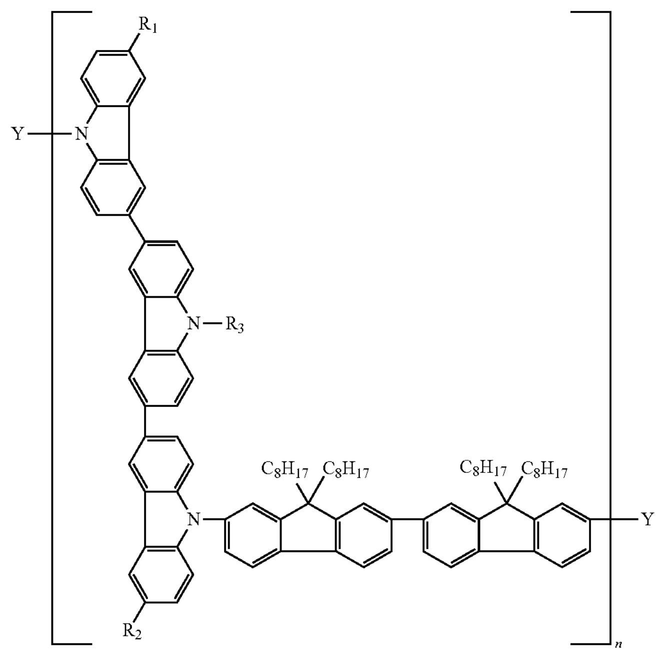
| Com. | R1 = R2 = R3 | Y |
|---|---|---|
| 48-1 | H-1 | H-29 |
| 48-2 | H-2 | |
| 48-3 | H-3 | |
| 48-4 | H-4 | |
| 48-5 | H-5 | |
| 48-6 | H-6 | |
| 48-7 | H-7 | |
| 48-8 | H-8 | |
| 48-9 | H-9 | |
| 48-10 | H-10 | |
| 48-11 | H-11 | |
| 48-12 | H-12 | |
| 48-13 | H-13 | |
| 48-14 | H-14 | |

-continued

| | | |
|---|---|---|
| 48-15 | H-15 | |
| 48-16 | H-16 | |
| 48-17 | H-17 | |
| 48-18 | H-18 | |
| 48-19 | H-1 | H-30 |
| 48-20 | H-2 | |
| 48-21 | H-3 | |
| 48-22 | H-4 | |
| 48-23 | H-5 | |
| 48-24 | H-6 | |
| 48-25 | H-7 | |
| 48-26 | H-8 | |
| 48-27 | H-9 | |
| 48-28 | H-10 | |
| 48-29 | H-11 | |
| 48-30 | H-12 | |
| 48-31 | H-13 | |
| 48-32 | H-14 | |
| 48-33 | H-15 | |
| 48-34 | H-16 | |
| 48-35 | H-17 | |
| 48-36 | H-18 | |

| Com. | R1 = R2 | R3 | Y |
|---|---|---|---|
| 48-37 | H-1 | H-1 | H-29 |
| 48-38 | H-2 | | |
| 48-39 | H-3 | | |
| 48-40 | H-4 | | |
| 48-41 | H-5 | | |
| 48-42 | H-6 | | |
| 48-43 | H-7 | | |
| 48-44 | H-8 | | |
| 48-45 | H-9 | | |
| 48-46 | H-10 | | |
| 48-47 | H-11 | | |
| 48-48 | H-12 | | |
| 48-49 | H-13 | | |
| 48-50 | H-14 | | |
| 48-51 | H-15 | | |
| 48-52 | H-16 | | |
| 48-53 | H-17 | | |
| 48-54 | H-18 | | |
| 48-55 | H-1 | H-1 | H-30 |
| 48-56 | H-2 | | |
| 48-57 | H-3 | | |
| 48-58 | H-4 | | |
| 48-59 | H-5 | | |
| 48-60 | H-6 | | |
| 48-61 | H-7 | | |
| 48-62 | H-8 | | |
| 48-63 | H-9 | | |
| 48-64 | H-10 | | |
| 48-65 | H-11 | | |
| 48-66 | H-12 | | |
| 48-67 | H-13 | | |
| 48-68 | H-14 | | |
| 48-69 | H-15 | | |
| 48-70 | H-16 | | |
| 48-71 | H-17 | | |
| 48-72 | H-18 | | |

-continued
Compound 49-X
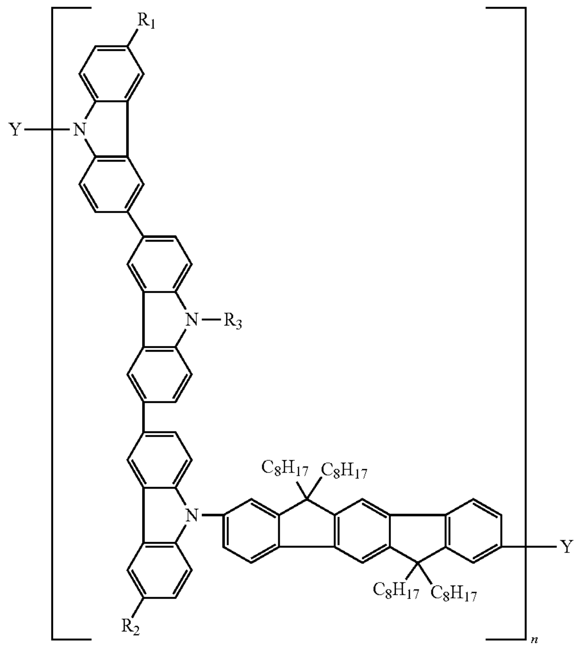
| Com. | R1 = R2 = R3 | Y |
|---|---|---|
| 49-1 | H-1 | H-29 |
| 49-2 | H-2 | |
| 49-3 | H-3 | |
| 49-4 | H-4 | |
| 49-5 | H-5 | |
| 49-6 | H-6 | |
| 49-7 | H-7 | |
| 49-8 | H-8 | |
| 49-9 | H-9 | |
| 49-10 | H-10 | |
| 49-11 | H-11 | |
| 49-12 | H-12 | |
| 49-13 | H-13 | |
| 49-14 | H-14 | |
| 49-15 | H-15 | |
| 49-16 | H-16 | |
| 49-17 | H-17 | |
| 49-18 | H-18 | |
| 49-19 | H-1 | H-30 |
| 49-20 | H-2 | |
| 49-21 | H-3 | |
| 49-22 | H-4 | |
| 49-23 | H-5 | |
| 49-24 | H-6 | |
| 49-25 | H-7 | |
| 49-26 | H-8 | |
| 49-27 | H-9 | |
| 49-28 | H-10 | |
| 49-29 | H-11 | |
| 49-30 | H-12 | |
| 49-31 | H-13 | |
| 49-32 | H-14 | |
| 49-33 | H-15 | |
| 49-34 | H-16 | |
| 49-35 | H-17 | |
| 49-36 | H-18 | |
| Com. | R1 = R2 | R3 | Y |
|---|---|---|---|
| 49-37 | H-1 | H-1 | H-29 |
| 49-38 | H-2 | | |
| 49-39 | H-3 | | |
| 49-40 | H-4 | | |
| 49-41 | H-5 | | |
| 49-42 | H-6 | | |

-continued
| | | | |
|---|---|---|---|
| 49-43 | H-7 | | |
| 49-44 | H-8 | | |
| 49-45 | H-9 | | |
| 49-46 | H-10 | | |
| 49-47 | H-11 | | |
| 49-48 | H-12 | | |
| 49-49 | H-13 | | |
| 49-50 | H-14 | | |
| 49-51 | H-15 | | |
| 49-52 | H-16 | | |
| 49-53 | H-17 | | |
| 49-54 | H-18 | | |
| 49-55 | H-1 | H-1 | H-30 |
| 49-56 | H-2 | | |
| 49-57 | H-3 | | |
| 49-58 | H-4 | | |
| 49-59 | H-5 | | |
| 49-60 | H-6 | | |
| 49-61 | H-7 | | |
| 49-62 | H-8 | | |
| 49-63 | H-9 | | |
| 49-64 | H-10 | | |
| 49-65 | H-11 | | |
| 49-66 | H-12 | | |
| 49-67 | H-13 | | |
| 49-68 | H-14 | | |
| 49-69 | H-15 | | |
| 49-70 | H-16 | | |
| 49-71 | H-17 | | |
| 49-72 | H-18 | | |
Compound 50-X
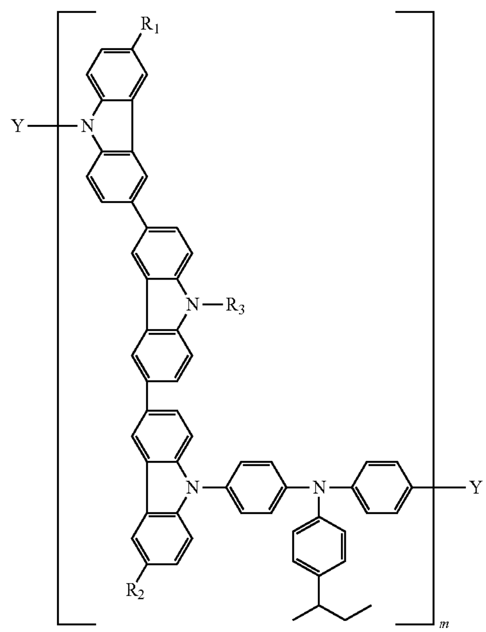
| Com. | R1 = R2 = R3 | Y |
|---|---|---|
| 50-1 | H-1 | H-29 |
| 50-2 | H-2 | |
| 50-3 | H-3 | |
| 50-4 | H-4 | |
| 50-5 | H-5 | |
| 50-6 | H-6 | |
| 50-7 | H-7 | |
| 50-8 | H-8 | |
| 50-9 | H-9 | |
| 50-10 | H-10 | |
| 50-11 | H-11 | |
| 50-12 | H-12 | |
| 50-13 | H-13 | |
| 50-14 | H-14 | |
| 50-15 | H-15 | |

-continued

| | | | |
|---|---|---|---|
| 50-16 | H-16 | | |
| 50-17 | H-17 | | |
| 50-18 | H-18 | | |
| 50-19 | H-1 | | H-30 |
| 50-20 | H-2 | | |
| 50-21 | H-3 | | |
| 50-22 | H-4 | | |
| 50-23 | H-5 | | |
| 50-24 | H-6 | | |
| 50-25 | H-7 | | |
| 50-26 | H-8 | | |
| 50-27 | H-9 | | |
| 50-28 | H-10 | | |
| 50-29 | H-11 | | |
| 50-30 | H-12 | | |
| 50-31 | H-13 | | |
| 50-32 | H-14 | | |
| 50-33 | H-15 | | |
| 50-34 | H-16 | | |
| 50-35 | H-17 | | |
| 50-36 | H-18 | | |

| Com. | R1 = R2 | R3 | Y |
|---|---|---|---|
| 50-37 | H-1 | H-1 | H-29 |
| 50-38 | H-2 | | |
| 50-39 | H-3 | | |
| 50-40 | H-4 | | |
| 50-41 | H-5 | | |
| 50-42 | H-6 | | |
| 50-43 | H-7 | | |
| 50-44 | H-8 | | |
| 50-45 | H-9 | | |
| 50-46 | H-10 | | |
| 50-47 | H-11 | | |
| 50-48 | H-12 | | |
| 50-49 | H-13 | | |
| 50-50 | H-14 | | |
| 50-51 | H-15 | | |
| 50-52 | H-16 | | |
| 50-53 | H-17 | | |
| 50-54 | H-18 | | |
| 50-55 | H-1 | H-1 | H-30 |
| 50-56 | H-2 | | |
| 50-57 | H-3 | | |
| 50-58 | H-4 | | |
| 50-59 | H-5 | | |
| 50-60 | H-6 | | |
| 50-61 | H-7 | | |
| 50-62 | H-8 | | |
| 50-63 | H-9 | | |
| 50-64 | H-10 | | |
| 50-65 | H-11 | | |
| 50-66 | H-12 | | |
| 50-67 | H-13 | | |
| 50-68 | H-14 | | |
| 50-69 | H-15 | | |
| 50-70 | H-16 | | |
| 50-71 | H-17 | | |
| 50-72 | H-18 | | |

-continued
Compound 51-X
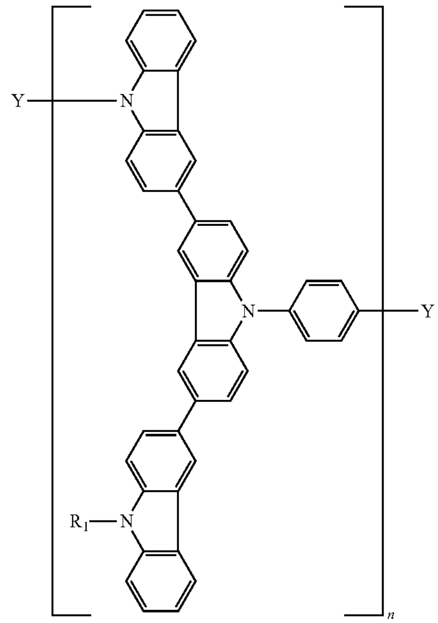
| Com. | R1 | Y |
|---|---|---|
| 51-1 | H-1 | H-29 |
| 51-2 | H-2 | |
| 51-3 | H-3 | |
| 51-4 | H-4 | |
| 51-5 | H-5 | |
| 51-6 | H-6 | |
| 51-7 | H-7 | |
| 51-8 | H-8 | |
| 51-9 | H-9 | |
| 51-10 | H-10 | |
| 51-11 | H-11 | |
| 51-12 | H-12 | |
| 51-13 | H-13 | |
| 51-14 | H-14 | |
| 51-15 | H-15 | |
| 51-16 | H-16 | |
| 51-17 | H-17 | |
| 51-18 | H-18 | |
| 51-19 | H-1 | H-30 |
| 51-20 | H-2 | |
| 51-21 | H-3 | |
| 51-22 | H-4 | |
| 51-23 | H-5 | |
| 51-24 | H-6 | |
| 51-25 | H-7 | |
| 51-26 | H-8 | |
| 51-27 | H-9 | |
| 51-28 | H-10 | |
| 51-29 | H-11 | |
| 51-30 | H-12 | |
| 51-31 | H-13 | |
| 51-32 | H-14 | |
| 51-33 | H-15 | |
| 51-34 | H-16 | |
| 51-35 | H-17 | |
| 51-36 | H-18 | |

-continued
Compound 52-X
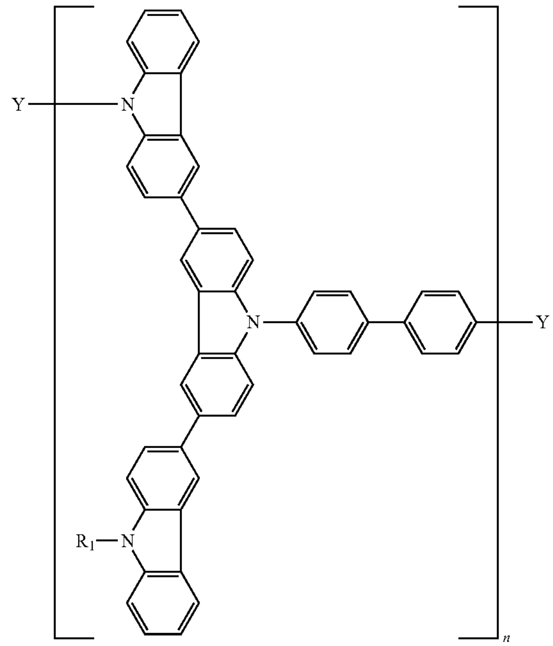
| Com. | R1 | Y |
|---|---|---|
| 52-1 | H-1 | H-29 |
| 52-2 | H-2 | |
| 52-3 | H-3 | |
| 52-4 | H-4 | |
| 52-5 | H-5 | |
| 52-6 | H-6 | |
| 52-7 | H-7 | |
| 52-8 | H-8 | |
| 52-9 | H-9 | |
| 52-10 | H-10 | |
| 52-11 | H-11 | |
| 52-12 | H-12 | |
| 52-13 | H-13 | |
| 52-14 | H-14 | |
| 52-15 | H-15 | |
| 52-16 | H-16 | |
| 52-17 | H-17 | |
| 52-18 | H-18 | |
| 52-19 | H-1 | H-30 |
| 52-20 | H-2 | |
| 52-21 | H-3 | |
| 52-22 | H-4 | |
| 52-23 | H-5 | |
| 52-24 | H-6 | |
| 52-25 | H-7 | |
| 52-26 | H-8 | |
| 52-27 | H-9 | |
| 52-28 | H-10 | |
| 52-29 | H-11 | |
| 52-30 | H-12 | |
| 52-31 | H-13 | |
| 52-32 | H-14 | |
| 52-33 | H-15 | |
| 52-34 | H-16 | |
| 52-35 | H-17 | |
| 52-36 | H-18 | |

-continued
Compound 53-X
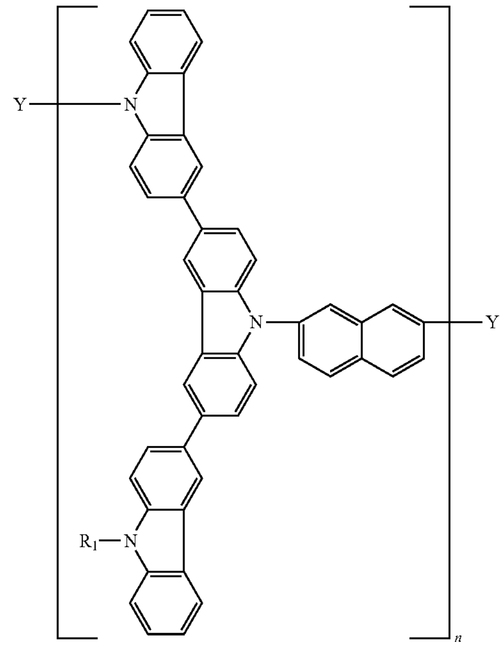
| Com. | R1 | Y |
|---|---|---|
| 53-1 | H-1 | H-29 |
| 53-2 | H-2 | |
| 53-3 | H-3 | |
| 53-4 | H-4 | |
| 53-5 | H-5 | |
| 53-6 | H-6 | |
| 53-7 | H-7 | |
| 53-8 | H-8 | |
| 53-9 | H-9 | |
| 53-10 | H-10 | |
| 53-11 | H-11 | |
| 53-12 | H-12 | |
| 53-13 | H-13 | |
| 53-14 | H-14 | |
| 53-15 | H-15 | |
| 53-16 | H-16 | |
| 53-17 | H-17 | |
| 53-18 | H-18 | |
| 53-19 | H-1 | H-30 |
| 53-20 | H-2 | |
| 53-21 | H-3 | |
| 53-22 | H-4 | |
| 53-23 | H-5 | |
| 53-24 | H-6 | |
| 53-25 | H-7 | |
| 53-26 | H-8 | |
| 53-27 | H-9 | |
| 53-28 | H-10 | |
| 53-29 | H-11 | |
| 53-30 | H-12 | |
| 53-31 | H-13 | |
| 53-32 | H-14 | |
| 53-33 | H-15 | |
| 53-34 | H-16 | |
| 53-35 | H-17 | |
| 53-36 | H-18 | |

-continued
Compound 54-X
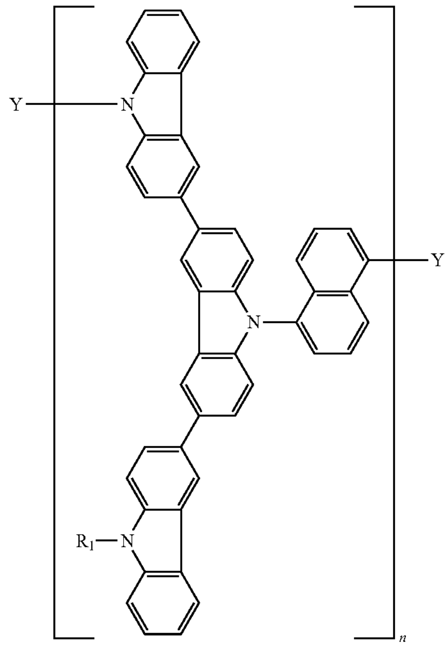
| Com. | R1 | Y |
|---|---|---|
| 54-1 | H-1 | H-29 |
| 54-2 | H-2 | |
| 54-3 | H-3 | |
| 54-4 | H-4 | |
| 54-5 | H-5 | |
| 54-6 | H-6 | |
| 54-7 | H-7 | |
| 54-8 | H-8 | |
| 54-9 | H-9 | |
| 54-10 | H-10 | |
| 54-11 | H-11 | |
| 54-12 | H-12 | |
| 54-13 | H-13 | |
| 54-14 | H-14 | |
| 54-15 | H-15 | |
| 54-16 | H-16 | |
| 54-17 | H-17 | |
| 54-18 | H-18 | |
| 54-19 | H-1 | H-30 |
| 54-20 | H-2 | |
| 54-21 | H-3 | |
| 54-22 | H-4 | |
| 54-23 | H-5 | |
| 54-24 | H-6 | |
| 54-25 | H-7 | |
| 54-26 | H-8 | |
| 54-27 | H-9 | |
| 54-28 | H-10 | |
| 54-29 | H-11 | |
| 54-30 | H-12 | |
| 54-31 | H-13 | |
| 54-32 | H-14 | |
| 54-33 | H-15 | |
| 54-34 | H-16 | |
| 54-35 | H-17 | |
| 54-36 | H-18 | |

-continued
Compound 55-X
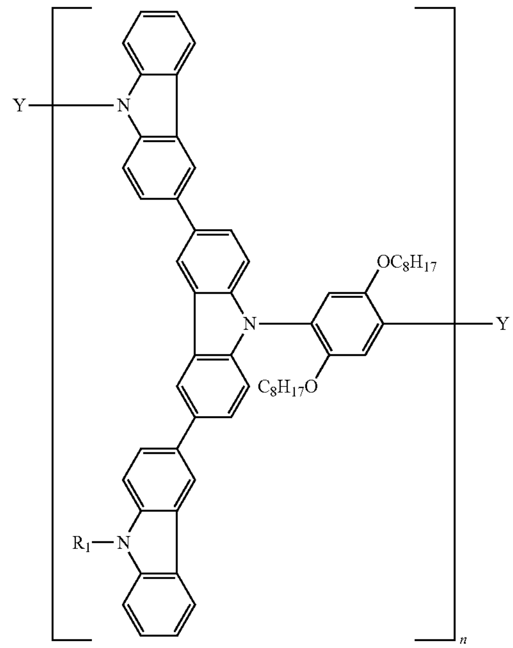
| Com. | R1 | Y |
|---|---|---|
| 55-1 | H-1 | H-29 |
| 55-2 | H-2 | |
| 55-3 | H-3 | |
| 55-4 | H-4 | |
| 55-5 | H-5 | |
| 55-6 | H-6 | |
| 55-7 | H-7 | |
| 55-8 | H-8 | |
| 55-9 | H-9 | |
| 55-10 | H-10 | |
| 55-11 | H-11 | |
| 55-12 | H-12 | |
| 55-13 | H-13 | |
| 55-14 | H-14 | |
| 55-15 | H-15 | |
| 55-16 | H-16 | |
| 55-17 | H-17 | |
| 55-18 | H-18 | |
| 55-19 | H-1 | H-30 |
| 55-20 | H-2 | |
| 55-21 | H-3 | |
| 55-22 | H-4 | |
| 55-23 | H-5 | |
| 55-24 | H-6 | |
| 55-25 | H-7 | |
| 55-26 | H-8 | |
| 55-27 | H-9 | |
| 55-28 | H-10 | |
| 55-29 | H-11 | |
| 55-30 | H-12 | |
| 55-31 | H-13 | |
| 55-32 | H-14 | |
| 55-33 | H-15 | |
| 55-34 | H-16 | |
| 55-35 | H-17 | |
| 55-36 | H-18 | |

-continued
Compound 56-X
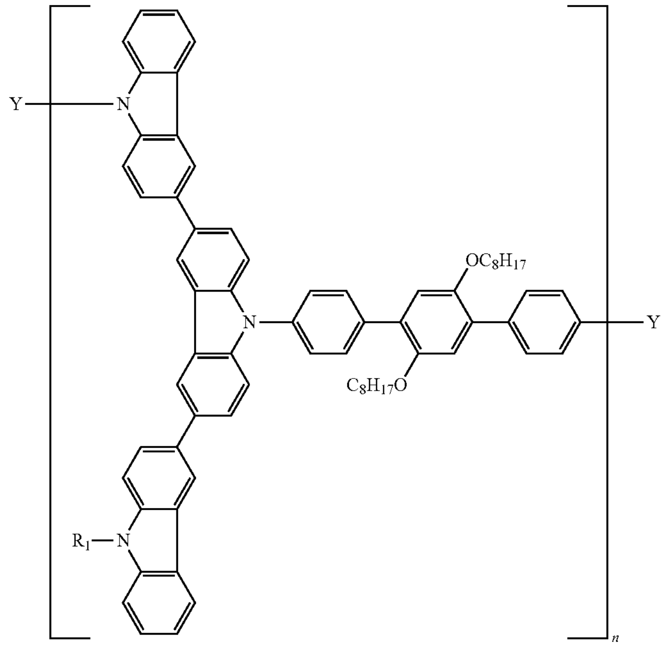
| Com. | R1 | Y |
|---|---|---|
| 56-1 | H-1 | H-29 |
| 56-2 | H-2 | |
| 56-3 | H-3 | |
| 56-4 | H-4 | |
| 56-5 | H-5 | |
| 56-6 | H-6 | |
| 56-7 | H-7 | |
| 56-8 | H-8 | |
| 56-9 | H-9 | |
| 56-10 | H-10 | |
| 56-11 | H-11 | |
| 56-12 | H-12 | |
| 56-13 | H-13 | |
| 56-14 | H-14 | |
| 56-15 | H-15 | |
| 56-16 | H-16 | |
| 56-17 | H-17 | |
| 56-18 | H-18 | |
| 56-19 | H-1 | H-30 |
| 56-20 | H-2 | |
| 56-21 | H-3 | |
| 56-22 | H-4 | |
| 56-23 | H-5 | |
| 56-24 | H-6 | |
| 56-25 | H-7 | |
| 56-26 | H-8 | |
| 56-27 | H-9 | |
| 56-28 | H-10 | |
| 56-29 | H-11 | |
| 56-30 | H-12 | |
| 56-31 | H-13 | |
| 56-32 | H-14 | |
| 56-33 | H-15 | |
| 56-34 | H-16 | |
| 56-35 | H-17 | |
| 56-36 | H-18 | |

-continued
Compound 57-X
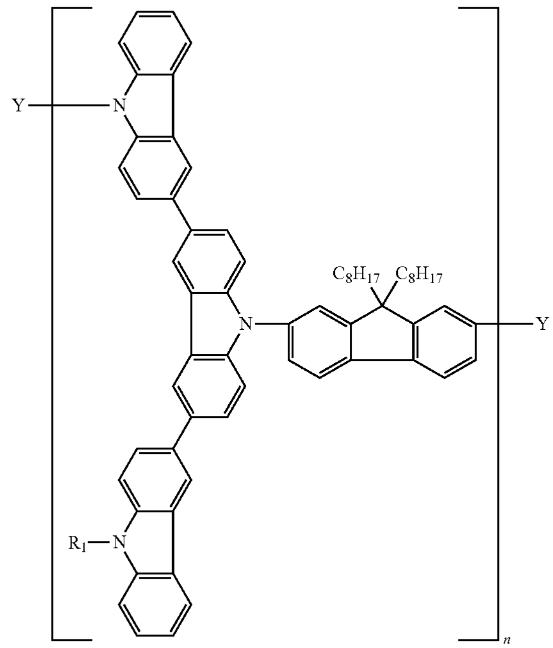
| Com. | R1 | Y |
|---|---|---|
| 57-1 | H-1 | H-29 |
| 57-2 | H-2 | |
| 57-3 | H-3 | |
| 57-4 | H-4 | |
| 57-5 | H-5 | |
| 57-6 | H-6 | |
| 57-7 | H-7 | |
| 57-8 | H-8 | |
| 57-9 | H-9 | |
| 57-10 | H-10 | |
| 57-11 | H-11 | |
| 57-12 | H-12 | |
| 57-13 | H-13 | |
| 57-14 | H-14 | |
| 57-15 | H-15 | |
| 57-16 | H-16 | |
| 57-17 | H-17 | |
| 57-18 | H-18 | |
| 57-19 | H-1 | H-30 |
| 57-20 | H-2 | |
| 57-21 | H-3 | |
| 57-22 | H-4 | |
| 57-23 | H-5 | |
| 57-24 | H-6 | |
| 57-25 | H-7 | |
| 57-26 | H-8 | |
| 57-27 | H-9 | |
| 57-28 | H-10 | |
| 57-29 | H-11 | |
| 57-30 | H-12 | |
| 57-31 | H-13 | |
| 57-32 | H-14 | |
| 57-33 | H-15 | |
| 57-34 | H-16 | |
| 57-35 | H-17 | |
| 57-36 | H-18 | |

-continued
Compound 58-X
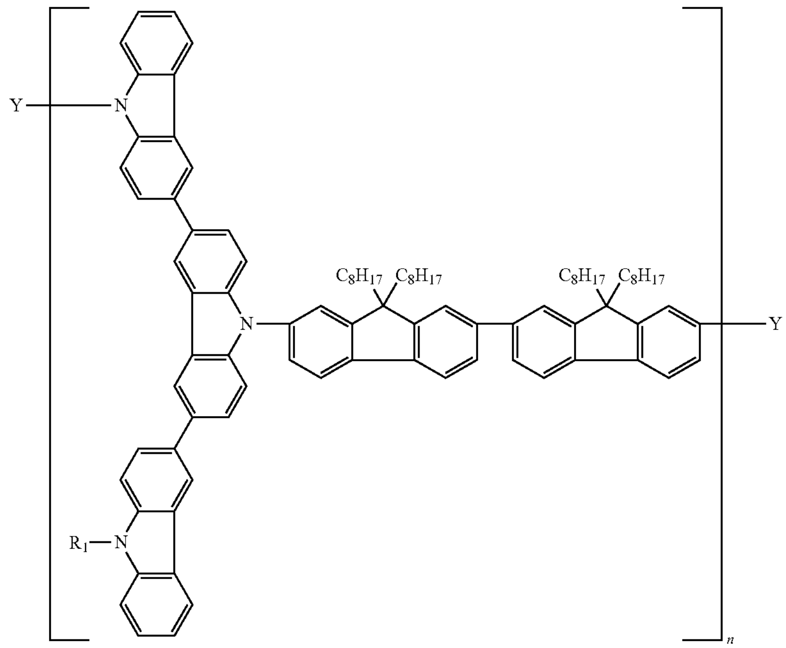
| Com. | R1 | Y |
|---|---|---|
| 58-1 | H-1 | H-29 |
| 58-2 | H-2 | |
| 58-3 | H-3 | |
| 58-4 | H-4 | |
| 58-5 | H-5 | |
| 58-6 | H-6 | |
| 58-7 | H-7 | |
| 58-8 | H-8 | |
| 58-9 | H-9 | |
| 58-10 | H-10 | |
| 58-11 | H-11 | |
| 58-12 | H-12 | |
| 58-13 | H-13 | |
| 58-14 | H-14 | |
| 58-15 | H-15 | |
| 58-16 | H-16 | |
| 58-17 | H-17 | |
| 58-18 | H-18 | |
| 58-19 | H-1 | H-30 |
| 58-20 | H-2 | |
| 58-21 | H-3 | |
| 58-22 | H-4 | |
| 58-23 | H-5 | |
| 58-24 | H-6 | |
| 58-25 | H-7 | |
| 58-26 | H-8 | |
| 58-27 | H-9 | |
| 58-28 | H-10 | |
| 58-29 | H-11 | |
| 58-30 | H-12 | |
| 58-31 | H-13 | |
| 58-32 | H-14 | |
| 58-33 | H-15 | |
| 58-34 | H-16 | |
| 58-35 | H-17 | |
| 58-36 | H-18 | |

-continued
Compound 59-X
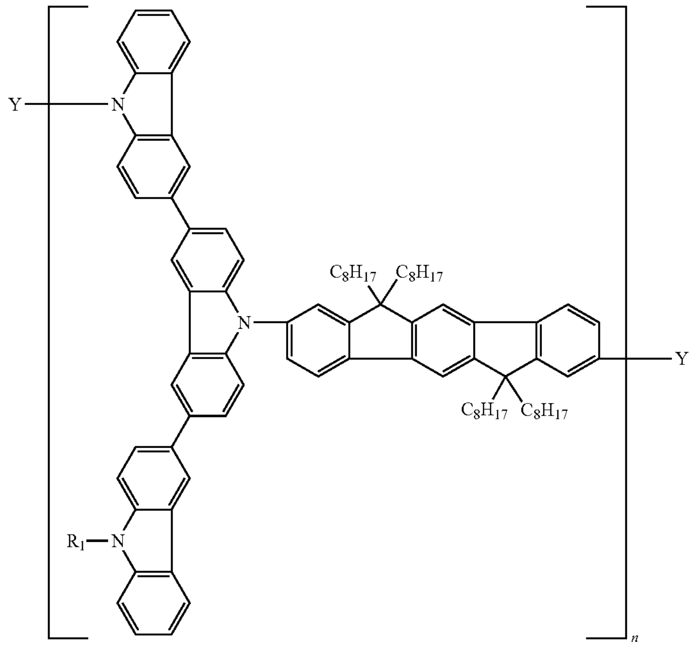
| Com. | R1 | Y |
|---|---|---|
| 59-1 | H-1 | H-29 |
| 59-2 | H-2 | |
| 59-3 | H-3 | |
| 59-4 | H-4 | |
| 59-5 | H-5 | |
| 59-6 | H-6 | |
| 59-7 | H-7 | |
| 59-8 | H-8 | |
| 59-9 | H-9 | |
| 59-10 | H-10 | |
| 59-11 | H-11 | |
| 59-12 | H-12 | |
| 59-13 | H-13 | |
| 59-14 | H-14 | |
| 59-15 | H-15 | |
| 59-16 | H-16 | |
| 59-17 | H-17 | |
| 59-18 | H-18 | |
| 59-19 | H-1 | H-30 |
| 59-20 | H-2 | |
| 59-21 | H-3 | |
| 59-22 | H-4 | |
| 59-23 | H-5 | |
| 59-24 | H-6 | |
| 59-25 | H-7 | |
| 59-26 | H-8 | |
| 59-27 | H-9 | |
| 59-28 | H-10 | |
| 59-29 | H-11 | |
| 59-30 | H-12 | |
| 59-31 | H-13 | |
| 59-32 | H-14 | |
| 59-33 | H-15 | |
| 59-34 | H-16 | |
| 59-35 | H-17 | |
| 59-36 | H-18 | |

-continued
Compound 60-X
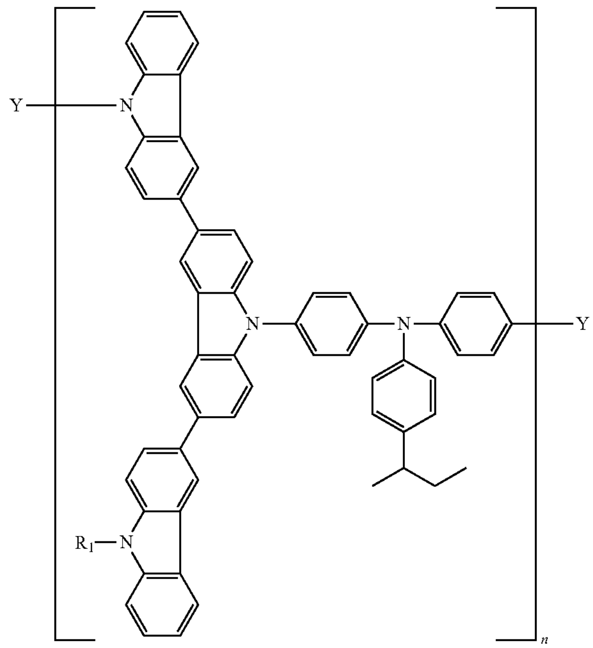
| Com. | R1 | Y |
|---|---|---|
| 60-1 | H-1 | H-29 |
| 60-2 | H-2 | |
| 60-3 | H-3 | |
| 60-4 | H-4 | |
| 60-5 | H-5 | |
| 60-6 | H-6 | |
| 60-7 | H-7 | |
| 60-8 | H-8 | |
| 60-9 | H-9 | |
| 60-10 | H-10 | |
| 60-11 | H-11 | |
| 60-12 | H-12 | |
| 60-13 | H-13 | |
| 60-14 | H-14 | |
| 60-15 | H-15 | |
| 60-16 | H-16 | |
| 60-17 | H-17 | |
| 60-18 | H-18 | |
| 60-19 | H-1 | H-30 |
| 60-20 | H-2 | |
| 60-21 | H-3 | |
| 60-22 | H-4 | |
| 60-23 | H-5 | |
| 60-24 | H-6 | |
| 60-25 | H-7 | |
| 60-26 | H-8 | |
| 60-27 | H-9 | |
| 60-28 | H-10 | |
| 60-29 | H-11 | |
| 60-30 | H-12 | |
| 60-31 | H-13 | |
| 60-32 | H-14 | |
| 60-33 | H-15 | |
| 60-34 | H-16 | |
| 60-35 | H-17 | |
| 60-36 | H-18 | |

-continued
Compound 61-X
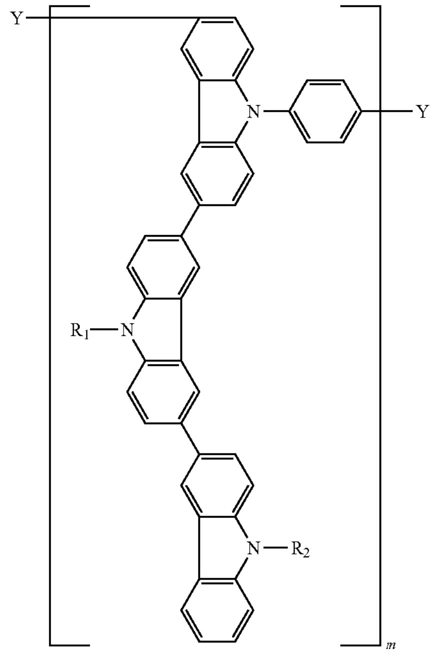
| Com. | R1 = R2 | Y |
|---|---|---|
| 61-1 | H-1 | H-29 |
| 61-2 | H-2 | |
| 61-3 | H-3 | |
| 61-4 | H-4 | |
| 61-5 | H-5 | |
| 61-6 | H-6 | |
| 61-7 | H-7 | |
| 61-8 | H-8 | |
| 61-9 | H-9 | |
| 61-10 | H-10 | |
| 61-11 | H-11 | |
| 61-12 | H-12 | |
| 61-13 | H-13 | |
| 61-14 | H-14 | |
| 61-15 | H-15 | |
| 61-16 | H-16 | |
| 61-17 | H-17 | |
| 61-18 | H-18 | |
| 61-19 | H-1 | H-30 |
| 61-20 | H-2 | |
| 61-21 | H-3 | |
| 61-22 | H-4 | |
| 61-23 | H-5 | |
| 61-24 | H-6 | |
| 61-25 | H-7 | |
| 61-26 | H-8 | |
| 61-27 | H-9 | |
| 61-28 | H-10 | |
| 61-29 | H-11 | |
| 61-30 | H-12 | |
| 61-31 | H-13 | |
| 61-32 | H-14 | |
| 61-33 | H-15 | |
| 61-34 | H-16 | |
| 61-35 | H-17 | |
| 61-36 | H-18 | |
| Com. | R1 | R2 | Y |
|---|---|---|---|
| 61-37 | H-2 | H-1 | H-29 |
| 61-38 | H-3 | | |
| 61-39 | H-4 | | |
| 61-40 | H-5 | | |
| 61-41 | H-6 | | |
| 61-42 | H-7 | | |

-continued
| | | | |
|---|---|---|---|
| 61-43 | H-8 | | |
| 61-44 | H-9 | | |
| 61-45 | H-10 | | |
| 61-46 | H-11 | | |
| 61-47 | H-12 | | |
| 61-48 | H-13 | | |
| 61-49 | H-14 | | |
| 61-50 | H-15 | | |
| 61-51 | H-16 | | |
| 61-52 | H-17 | | |
| 61-53 | H-18 | | |
| 61-54 | H-2 | H-1 | H-30 |
| 61-55 | H-3 | | |
| 61-56 | H-4 | | |
| 61-57 | H-5 | | |
| 61-58 | H-6 | | |
| 61-59 | H-7 | | |
| 61-60 | H-8 | | |
| 61-61 | H-9 | | |
| 61-62 | H-10 | | |
| 61-63 | H-11 | | |
| 61-64 | H-12 | | |
| 61-65 | H-13 | | |
| 61-66 | H-14 | | |
| 61-67 | H-15 | | |
| 61-68 | H-16 | | |
| 61-69 | H-17 | | |
| 61-70 | H-18 | | |
Compound 62-X
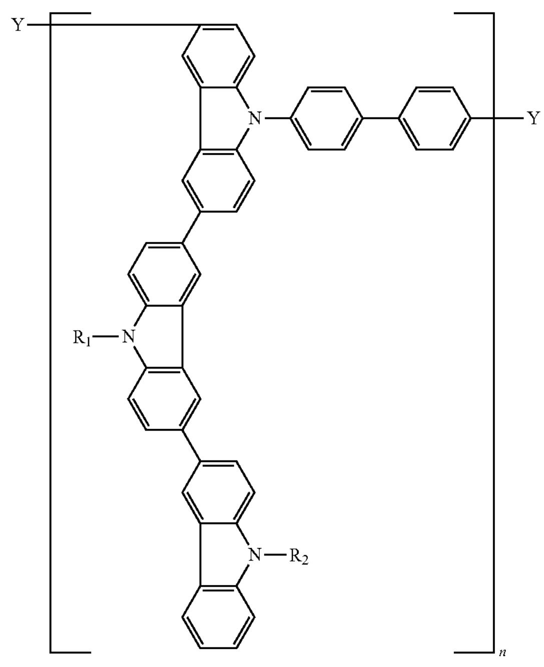
| Com. | R1 = R2 | Y |
|---|---|---|
| 62-1 | H-1 | H-29 |
| 62-2 | H-2 | |
| 62-3 | H-3 | |
| 62-4 | H-4 | |
| 62-5 | H-5 | |
| 62-6 | H-6 | |
| 62-7 | H-7 | |
| 62-8 | H-8 | |
| 62-9 | H-9 | |
| 62-10 | H-10 | |
| 62-11 | H-11 | |
| 62-12 | H-12 | |
| 62-13 | H-13 | |
| 62-14 | H-14 | |
| 62-15 | H-15 | |
| 62-16 | H-16 | |

-continued

| | | |
|---|---|---|
| 62-17 | H-17 | |
| 62-18 | H-18 | |
| 62-19 | H-1 | H-30 |
| 62-20 | H-2 | |
| 62-21 | H-3 | |
| 62-22 | H-4 | |
| 62-23 | H-5 | |
| 62-24 | H-6 | |
| 62-25 | H-7 | |
| 62-26 | H-8 | |
| 62-27 | H-9 | |
| 62-28 | H-10 | |
| 62-29 | H-11 | |
| 62-30 | H-12 | |
| 62-31 | H-13 | |
| 62-32 | H-14 | |
| 62-33 | H-15 | |
| 62-34 | H-16 | |
| 62-35 | H-17 | |
| 62-36 | H-18 | |

| Com. | R1 | R2 | Y |
|---|---|---|---|
| 62-37 | H-2 | H-1 | H-29 |
| 62-38 | H-3 | | |
| 62-39 | H-4 | | |
| 62-40 | H-5 | | |
| 62-41 | H-6 | | |
| 62-42 | H-7 | | |
| 62-43 | H-8 | | |
| 62-44 | H-9 | | |
| 62-45 | H-10 | | |
| 62-46 | H-11 | | |
| 62-47 | H-12 | | |
| 62-48 | H-13 | | |
| 62-49 | H-14 | | |
| 62-50 | H-15 | | |
| 62-51 | H-16 | | |
| 62-52 | H-17 | | |
| 62-53 | H-18 | | |
| 62-54 | H-2 | H-1 | H-30 |
| 62-55 | H-3 | | |
| 62-56 | H-4 | | |
| 62-57 | H-5 | | |
| 62-58 | H-6 | | |
| 62-59 | H-7 | | |
| 62-60 | H-8 | | |
| 62-61 | H-9 | | |
| 62-62 | H-10 | | |
| 62-63 | H-11 | | |
| 62-64 | H-12 | | |
| 62-65 | H-13 | | |
| 62-66 | H-14 | | |
| 62-67 | H-15 | | |
| 62-68 | H-16 | | |
| 62-69 | H-17 | | |
| 62-70 | H-18 | | |

-continued
Compound 63-X
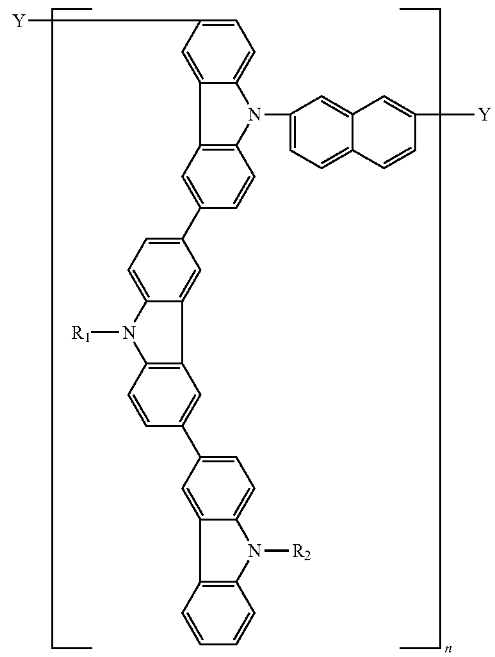
| Com. | R1 = R2 | Y |
|---|---|---|
| 63-1 | H-1 | H-29 |
| 63-2 | H-2 | |
| 63-3 | H-3 | |
| 63-4 | H-4 | |
| 63-5 | H-5 | |
| 63-6 | H-6 | |
| 63-7 | H-7 | |
| 63-8 | H-8 | |
| 63-9 | H-9 | |
| 63-10 | H-10 | |
| 63-11 | H-11 | |
| 63-12 | H-12 | |
| 63-13 | H-13 | |
| 63-14 | H-14 | |
| 63-15 | H-15 | |
| 63-16 | H-16 | |
| 63-17 | H-17 | |
| 63-18 | H-18 | |
| 63-19 | H-1 | H-30 |
| 63-20 | H-2 | |
| 63-21 | H-3 | |
| 63-22 | H-4 | |
| 63-23 | H-5 | |
| 63-24 | H-6 | |
| 63-25 | H-7 | |
| 63-26 | H-8 | |
| 63-27 | H-9 | |
| 63-28 | H-10 | |
| 63-29 | H-11 | |
| 63-30 | H-12 | |
| 63-31 | H-13 | |
| 63-32 | H-14 | |
| 63-33 | H-15 | |
| 63-34 | H-16 | |
| 63-35 | H-17 | |
| 63-36 | H-18 | |
| Com. | R1 | R2 | Y |
|---|---|---|---|
| 63-37 | H-2 | H-1 | H-29 |
| 63-38 | H-3 | | |
| 63-39 | H-4 | | |
| 63-40 | H-5 | | |
| 63-41 | H-6 | | |
| 63-42 | H-7 | | |

-continued
| | | | |
|---|---|---|---|
| 63-43 | H-8 | | |
| 63-44 | H-9 | | |
| 63-45 | H-10 | | |
| 63-46 | H-11 | | |
| 63-47 | H-12 | | |
| 63-48 | H-13 | | |
| 63-49 | H-14 | | |
| 63-50 | H-15 | | |
| 63-51 | H-16 | | |
| 63-52 | H-17 | | |
| 63-53 | H-18 | | |
| 63-54 | H-2 | H-1 | H-30 |
| 63-55 | H-3 | | |
| 63-56 | H-4 | | |
| 63-57 | H-5 | | |
| 63-58 | H-6 | | |
| 63-59 | H-7 | | |
| 63-60 | H-8 | | |
| 63-61 | H-9 | | |
| 63-62 | H-10 | | |
| 63-63 | H-11 | | |
| 63-64 | H-12 | | |
| 63-65 | H-13 | | |
| 63-66 | H-14 | | |
| 63-67 | H-15 | | |
| 63-68 | H-16 | | |
| 63-69 | H-17 | | |
| 63-70 | H-18 | | |
Compound 64-X
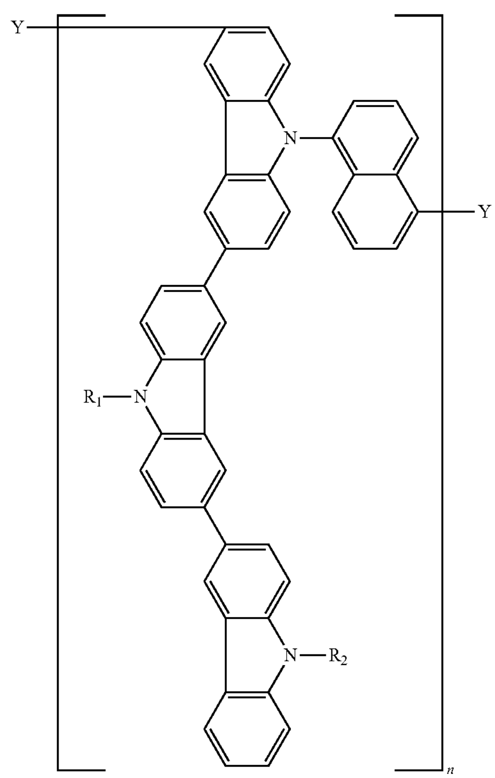
| Com. | R1 = R2 | Y |
|---|---|---|
| 64-1 | H-1 | H-29 |
| 64-2 | H-2 | |
| 64-3 | H-3 | |
| 64-4 | H-4 | |
| 64-5 | H-5 | |
| 64-6 | H-6 | |
| 64-7 | H-7 | |
| 64-8 | H-8 | |
| 64-9 | H-9 | |
| 64-10 | H-10 | |
| 64-11 | H-11 | |

-continued

| | | |
|---|---|---|
| 64-12 | H-12 | |
| 64-13 | H-13 | |
| 64-14 | H-14 | |
| 64-15 | H-15 | |
| 64-16 | H-16 | |
| 64-17 | H-17 | |
| 64-18 | H-18 | |
| 64-19 | H-1 | H-30 |
| 64-20 | H-2 | |
| 64-21 | H-3 | |
| 64-22 | H-4 | |
| 64-23 | H-5 | |
| 64-24 | H-6 | |
| 64-25 | H-7 | |
| 64-26 | H-8 | |
| 64-27 | H-9 | |
| 64-28 | H-10 | |
| 64-29 | H-11 | |
| 64-30 | H-12 | |
| 64-31 | H-13 | |
| 64-32 | H-14 | |
| 64-33 | H-15 | |
| 64-34 | H-16 | |
| 64-35 | H-17 | |
| 64-36 | H-18 | |

| Com. | R1 | R2 | Y |
|---|---|---|---|
| 64-37 | H-2 | H-1 | H-29 |
| 64-38 | H-3 | | |
| 64-39 | H-4 | | |
| 64-40 | H-5 | | |
| 64-41 | H-6 | | |
| 64-42 | H-7 | | |
| 64-43 | H-8 | | |
| 64-44 | H-9 | | |
| 64-45 | H-10 | | |
| 64-46 | H-11 | | |
| 64-47 | H-12 | | |
| 64-48 | H-13 | | |
| 64-49 | H-14 | | |
| 64-50 | H-15 | | |
| 64-51 | H-16 | | |
| 64-52 | H-17 | | |
| 64-53 | H-18 | | |
| 64-54 | H-2 | H-1 | H-30 |
| 64-55 | H-3 | | |
| 64-56 | H-4 | | |
| 64-57 | H-5 | | |
| 64-58 | H-6 | | |
| 64-59 | H-7 | | |
| 64-60 | H-8 | | |
| 64-61 | H-9 | | |
| 64-62 | H-10 | | |
| 64-63 | H-11 | | |
| 64-64 | H-12 | | |
| 64-65 | H-13 | | |
| 64-66 | H-14 | | |
| 64-67 | H-15 | | |
| 64-68 | H-16 | | |
| 64-69 | H-17 | | |
| 64-70 | H-18 | | |

-continued
Compound 65-X
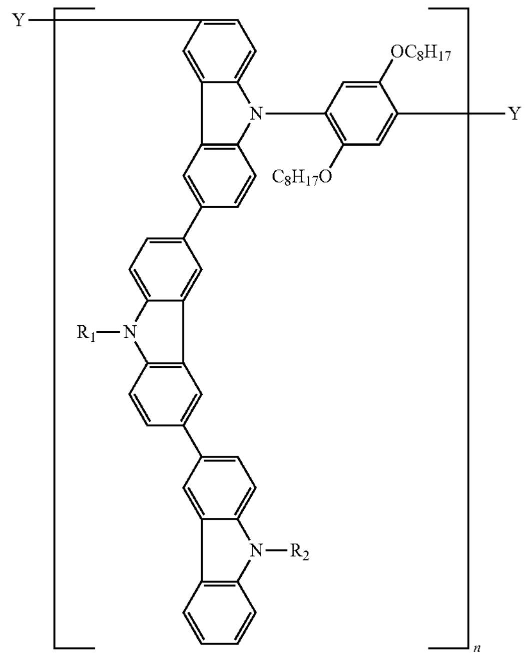
| Com. | R1 = R2 | Y |
|---|---|---|
| 65-1 | H-1 | H-29 |
| 65-2 | H-2 | |
| 65-3 | H-3 | |
| 65-4 | H-4 | |
| 65-5 | H-5 | |
| 65-6 | H-6 | |
| 65-7 | H-7 | |
| 65-8 | H-8 | |
| 65-9 | H-9 | |
| 65-10 | H-10 | |
| 65-11 | H-11 | |
| 65-12 | H-12 | |
| 65-13 | H-13 | |
| 65-14 | H-14 | |
| 65-15 | H-15 | |
| 65-16 | H-16 | |
| 65-17 | H-17 | |
| 65-18 | H-18 | |
| 65-19 | H-1 | H-30 |
| 65-20 | H-2 | |
| 65-21 | H-3 | |
| 65-22 | H-4 | |
| 65-23 | H-5 | |
| 65-24 | H-6 | |
| 65-25 | H-7 | |
| 65-26 | H-8 | |
| 65-27 | H-9 | |
| 65-28 | H-10 | |
| 65-29 | H-11 | |
| 65-30 | H-12 | |
| 65-31 | H-13 | |
| 65-32 | H-14 | |
| 65-33 | H-15 | |
| 65-34 | H-16 | |
| 65-35 | H-17 | |
| 65-36 | H-18 | |
| Com. | R1 | R2 | Y |
|---|---|---|---|
| 65-37 | H-2 | H-1 | H-29 |
| 65-38 | H-3 | | |
| 65-39 | H-4 | | |
| 65-40 | H-5 | | |
| 65-41 | H-6 | | |
| 65-42 | H-7 | | |

-continued
| | | | |
|---|---|---|---|
| 65-43 | H-8 | | |
| 65-44 | H-9 | | |
| 65-45 | H-10 | | |
| 65-46 | H-11 | | |
| 65-47 | H-12 | | |
| 65-48 | H-13 | | |
| 65-49 | H-14 | | |
| 65-50 | H-15 | | |
| 65-51 | H-16 | | |
| 65-52 | H-17 | | |
| 65-53 | H-18 | | |
| 65-54 | H-2 | H-1 | H-30 |
| 65-55 | H-3 | | |
| 65-56 | H-4 | | |
| 65-57 | H-5 | | |
| 65-58 | H-6 | | |
| 65-59 | H-7 | | |
| 65-60 | H-8 | | |
| 65-61 | H-9 | | |
| 65-62 | H-10 | | |
| 65-63 | H-11 | | |
| 65-64 | H-12 | | |
| 65-65 | H-13 | | |
| 65-66 | H-14 | | |
| 65-67 | H-15 | | |
| 65-68 | H-16 | | |
| 65-69 | H-17 | | |
| 65-70 | H-18 | | |
Compound 66-X
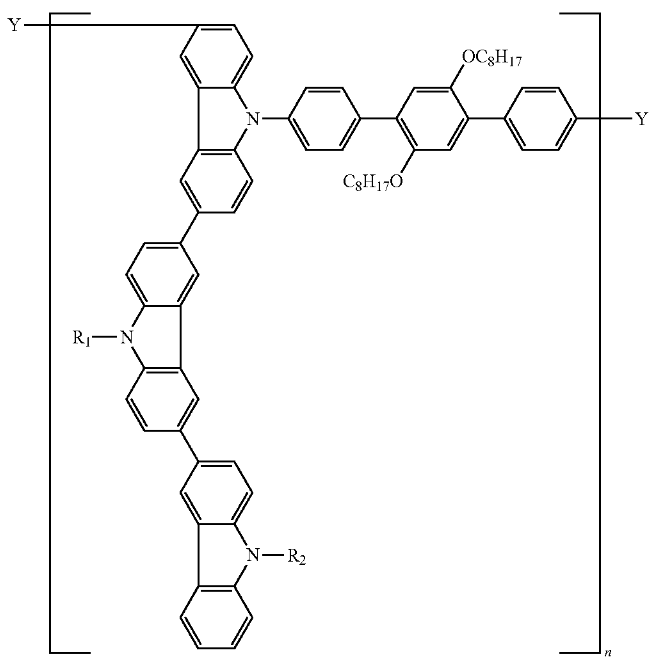
| Com. | R1 = R2 | Y |
|---|---|---|
| 66-1 | H-1 | H-29 |
| 66-2 | H-2 | |
| 66-3 | H-3 | |
| 66-4 | H-4 | |
| 66-5 | H-5 | |
| 66-6 | H-6 | |
| 66-7 | H-7 | |
| 66-8 | H-8 | |
| 66-9 | H-9 | |
| 66-10 | H-10 | |
| 66-11 | H-11 | |
| 66-12 | H-12 | |
| 66-13 | H-13 | |
| 66-14 | H-14 | |
| 66-15 | H-15 | |
| 66-16 | H-16 | |

-continued

| | | |
|---|---|---|
| 66-17 | H-17 | |
| 66-18 | H-18 | |
| 66-19 | H-1 | H-30 |
| 66-20 | H-2 | |
| 66-21 | H-3 | |
| 66-22 | H-4 | |
| 66-23 | H-5 | |
| 66-24 | H-6 | |
| 66-25 | H-7 | |
| 66-26 | H-8 | |
| 66-27 | H-9 | |
| 66-28 | H-10 | |
| 66-29 | H-11 | |
| 66-30 | H-12 | |
| 66-31 | H-13 | |
| 66-32 | H-14 | |
| 66-33 | H-15 | |
| 66-34 | H-16 | |
| 66-35 | H-17 | |
| 66-36 | H-18 | |

| Com. | R1 | R2 | Y |
|---|---|---|---|
| 66-37 | H-2 | H-1 | H-29 |
| 66-38 | H-3 | | |
| 66-39 | H-4 | | |
| 66-40 | H-5 | | |
| 66-41 | H-6 | | |
| 66-42 | H-7 | | |
| 66-43 | H-8 | | |
| 66-44 | H-9 | | |
| 66-45 | H-10 | | |
| 66-46 | H-11 | | |
| 66-47 | H-12 | | |
| 66-48 | H-13 | | |
| 66-49 | H-14 | | |
| 66-50 | H-15 | | |
| 66-51 | H-16 | | |
| 66-52 | H-17 | | |
| 66-53 | H-18 | | |
| 66-54 | H-2 | H-1 | H-30 |
| 66-55 | H-3 | | |
| 66-56 | H-4 | | |
| 66-57 | H-5 | | |
| 66-58 | H-6 | | |
| 66-59 | H-7 | | |
| 66-60 | H-8 | | |
| 66-61 | H-9 | | |
| 66-62 | H-10 | | |
| 66-63 | H-11 | | |
| 66-64 | H-12 | | |
| 66-65 | H-13 | | |
| 66-66 | H-14 | | |
| 66-67 | H-15 | | |
| 66-68 | H-16 | | |
| 66-69 | H-17 | | |
| 66-70 | H-18 | | |

-continued
Compound 67-X
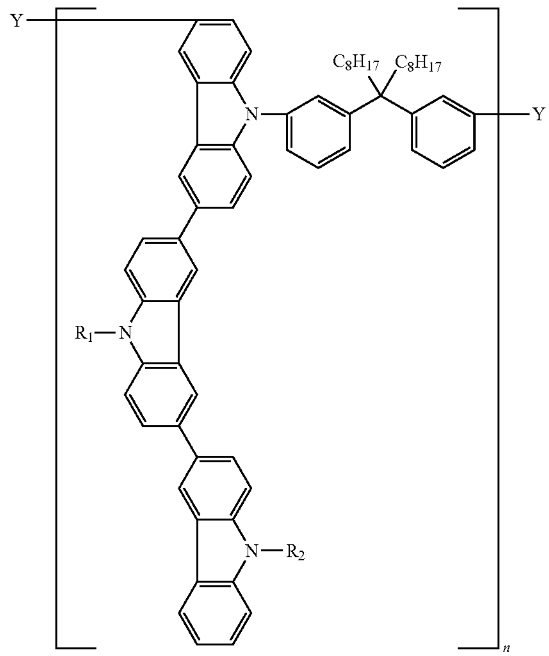
| Com. | R1 = R2 | Y |
|---|---|---|
| 67-1 | H-1 | H-29 |
| 67-2 | H-2 | |
| 67-3 | H-3 | |
| 67-4 | H-4 | |
| 67-5 | H-5 | |
| 67-6 | H-6 | |
| 67-7 | H-7 | |
| 67-8 | H-8 | |
| 67-9 | H-9 | |
| 67-10 | H-10 | |
| 67-11 | H-11 | |
| 67-12 | H-12 | |
| 67-13 | H-13 | |
| 67-14 | H-14 | |
| 67-15 | H-15 | |
| 67-16 | H-16 | |
| 67-17 | H-17 | |
| 67-18 | H-18 | |
| 67-19 | H-1 | H-30 |
| 67-20 | H-2 | |
| 67-21 | H-3 | |
| 67-22 | H-4 | |
| 67-23 | H-5 | |
| 67-24 | H-6 | |
| 67-25 | H-7 | |
| 67-26 | H-8 | |
| 67-27 | H-9 | |
| 67-28 | H-10 | |
| 67-29 | H-11 | |
| 67-30 | H-12 | |
| 67-31 | H-13 | |
| 67-32 | H-14 | |
| 67-33 | H-15 | |
| 67-34 | H-16 | |
| 67-35 | H-17 | |
| 67-36 | H-18 | |
| Com. | R1 | R2 | Y |
|---|---|---|---|
| 67-37 | H-2 | H-1 | H-29 |
| 67-38 | H-3 | | |
| 67-39 | H-4 | | |
| 67-40 | H-5 | | |
| 67-41 | H-6 | | |
| 67-42 | H-7 | | |

-continued
| | | | |
|---|---|---|---|
| 67-43 | H-8 | | |
| 67-44 | H-9 | | |
| 67-45 | H-10 | | |
| 67-46 | H-11 | | |
| 67-47 | H-12 | | |
| 67-48 | H-13 | | |
| 67-49 | H-14 | | |
| 67-50 | H-15 | | |
| 67-51 | H-16 | | |
| 67-52 | H-17 | | |
| 67-53 | H-18 | | |
| 67-54 | H-2 | H-1 | H-30 |
| 67-55 | H-3 | | |
| 67-56 | H-4 | | |
| 67-57 | H-5 | | |
| 67-58 | H-6 | | |
| 67-59 | H-7 | | |
| 67-60 | H-8 | | |
| 67-61 | H-9 | | |
| 67-62 | H-10 | | |
| 67-63 | H-11 | | |
| 67-64 | H-12 | | |
| 67-65 | H-13 | | |
| 67-66 | H-14 | | |
| 67-67 | H-15 | | |
| 67-68 | H-16 | | |
| 67-69 | H-17 | | |
| 67-70 | H-18 | | |
Compound 68-X
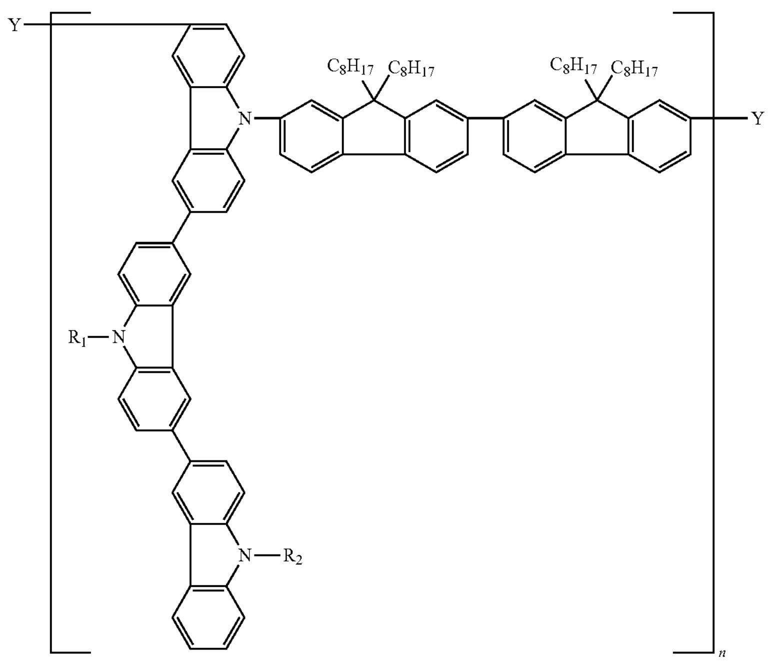
| Com. | R1 = R2 | Y |
|---|---|---|
| 68-1 | H-1 | H-29 |
| 68-2 | H-2 | |
| 68-3 | H-3 | |
| 68-4 | H-4 | |
| 68-5 | H-5 | |
| 68-6 | H-6 | |
| 68-7 | H-7 | |
| 68-8 | H-8 | |
| 68-9 | H-9 | |
| 68-10 | H-10 | |
| 68-11 | H-11 | |
| 68-12 | H-12 | |
| 68-13 | H-13 | |
| 68-14 | H-14 | |
| 68-15 | H-15 | |
| 68-16 | H-16 | |

-continued

| | | |
|---|---|---|
| 68-17 | H-17 | |
| 68-18 | H-18 | |
| 68-19 | H-1 | H-30 |
| 68-20 | H-2 | |
| 68-21 | H-3 | |
| 68-22 | H-4 | |
| 68-23 | H-5 | |
| 68-24 | H-6 | |
| 68-25 | H-7 | |
| 68-26 | H-8 | |
| 68-27 | H-9 | |
| 68-28 | H-10 | |
| 68-29 | H-11 | |
| 68-30 | H-12 | |
| 68-31 | H-13 | |
| 68-32 | H-14 | |
| 68-33 | H-15 | |
| 68-34 | H-16 | |
| 68-35 | H-17 | |
| 68-36 | H-18 | |

| Com. | R1 | R2 | Y |
|---|---|---|---|
| 68-37 | H-2 | H-1 | H-29 |
| 68-38 | H-3 | | |
| 68-39 | H-4 | | |
| 68-40 | H-5 | | |
| 68-41 | H-6 | | |
| 68-42 | H-7 | | |
| 68-43 | H-8 | | |
| 68-44 | H-9 | | |
| 68-45 | H-10 | | |
| 68-46 | H-11 | | |
| 68-47 | H-12 | | |
| 68-48 | H-13 | | |
| 68-49 | H-14 | | |
| 68-50 | H-15 | | |
| 68-51 | H-16 | | |
| 68-52 | H-17 | | |
| 68-53 | H-18 | | |
| 68-54 | H-2 | H-1 | H-30 |
| 68-55 | H-3 | | |
| 68-56 | H-4 | | |
| 68-57 | H-5 | | |
| 68-58 | H-6 | | |
| 68-59 | H-7 | | |
| 68-60 | H-8 | | |
| 68-61 | H-9 | | |
| 68-62 | H-10 | | |
| 68-63 | H-11 | | |
| 68-64 | H-12 | | |
| 68-65 | H-13 | | |
| 68-66 | H-14 | | |
| 68-67 | H-15 | | |
| 68-68 | H-16 | | |
| 68-69 | H-17 | | |
| 68-70 | H-18 | | |

-continued
Compound 69-X
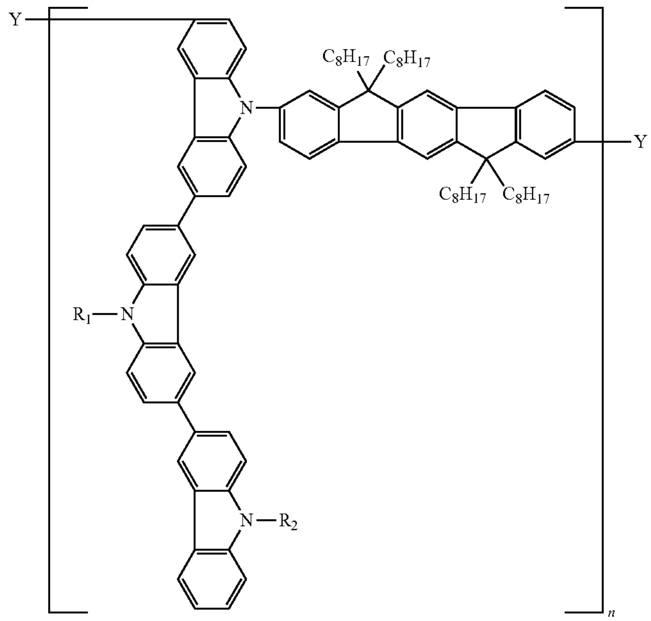
| Com. | R1 = R2 | Y |
|---|---|---|
| 69-1 | H-1 | H-29 |
| 69-2 | H-2 | |
| 69-3 | H-3 | |
| 69-4 | H-4 | |
| 69-5 | H-5 | |
| 69-6 | H-6 | |
| 69-7 | H-7 | |
| 69-8 | H-8 | |
| 69-9 | H-9 | |
| 69-10 | H-10 | |
| 69-11 | H-11 | |
| 69-12 | H-12 | |
| 69-13 | H-13 | |
| 69-14 | H-14 | |
| 69-15 | H-15 | |
| 69-16 | H-16 | |
| 69-17 | H-17 | |
| 69-18 | H-18 | |
| 69-19 | H-1 | H-30 |
| 69-20 | H-2 | |
| 69-21 | H-3 | |
| 69-22 | H-4 | |
| 69-23 | H-5 | |
| 69-24 | H-6 | |
| 69-25 | H-7 | |
| 69-26 | H-8 | |
| 69-27 | H-9 | |
| 69-28 | H-10 | |
| 69-29 | H-11 | |
| 69-30 | H-12 | |
| 69-31 | H-13 | |
| 69-32 | H-14 | |
| 69-33 | H-15 | |
| 69-34 | H-16 | |
| 69-35 | H-17 | |
| 69-36 | H-18 | |
| Com. | R1 | R2 | Y |
|---|---|---|---|
| 69-37 | H-2 | H-1 | H-29 |
| 69-38 | H-3 | | |
| 69-39 | H-4 | | |
| 69-40 | H-5 | | |
| 69-41 | H-6 | | |
| 69-42 | H-7 | | |
| 69-43 | H-8 | | |
| 69-44 | H-9 | | |

-continued
| | | | |
|---|---|---|---|
| 69-45 | H-10 | | |
| 69-46 | H-11 | | |
| 69-47 | H-12 | | |
| 69-48 | H-13 | | |
| 69-49 | H-14 | | |
| 69-50 | H-15 | | |
| 69-51 | H-16 | | |
| 69-52 | H-17 | | |
| 69-53 | H-18 | | |
| 69-54 | H-2 | H-1 | H-30 |
| 69-55 | H-3 | | |
| 69-56 | H-4 | | |
| 69-57 | H-5 | | |
| 69-58 | H-6 | | |
| 69-59 | H-7 | | |
| 69-60 | H-8 | | |
| 69-61 | H-9 | | |
| 69-62 | H-10 | | |
| 69-63 | H-11 | | |
| 69-64 | H-12 | | |
| 69-65 | H-13 | | |
| 69-66 | H-14 | | |
| 69-67 | H-15 | | |
| 69-68 | H-16 | | |
| 69-69 | H-17 | | |
| 69-70 | H-18 | | |
Compound 70-X
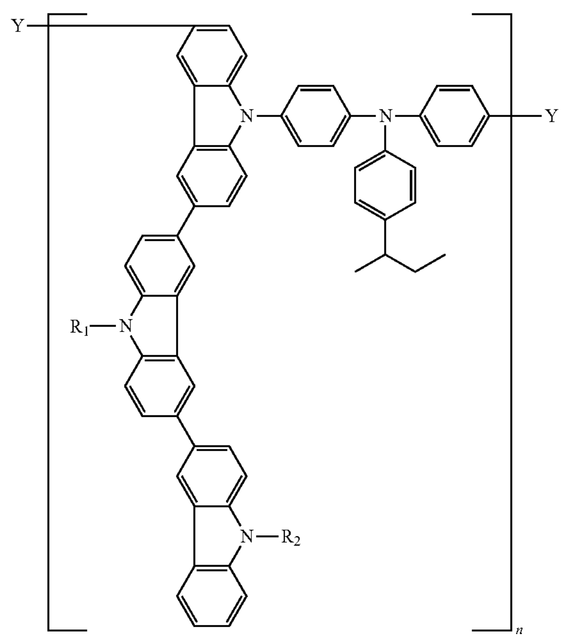
| Com. | R1 = R2 | Y |
|---|---|---|
| 70-1 | H-1 | H-29 |
| 70-2 | H-2 | |
| 70-3 | H-3 | |
| 70-4 | H-4 | |
| 70-5 | H-5 | |
| 70-6 | H-6 | |
| 70-7 | H-7 | |
| 70-8 | H-8 | |
| 70-9 | H-9 | |
| 70-10 | H-10 | |
| 70-11 | H-11 | |
| 70-12 | H-12 | |
| 70-13 | H-13 | |
| 70-14 | H-14 | |
| 70-15 | H-15 | |
| 70-16 | H-16 | |
| 70-17 | H-17 | |
| 70-18 | H-18 | |

-continued
| | | |
|---|---|---|
| 70-19 | H-1 | H-30 |
| 70-20 | H-2 | |
| 70-21 | H-3 | |
| 70-22 | H-4 | |
| 70-23 | H-5 | |
| 70-24 | H-6 | |
| 70-25 | H-7 | |
| 70-26 | H-8 | |
| 70-27 | H-9 | |
| 70-28 | H-10 | |
| 70-29 | H-11 | |
| 70-30 | H-12 | |
| 70-31 | H-13 | |
| 70-32 | H-14 | |
| 70-33 | H-15 | |
| 70-34 | H-16 | |
| 70-35 | H-17 | |
| 70-36 | H-18 | |
| Com. | R1 | R2 | Y |
|---|---|---|---|
| 70-37 | H-2 | H-1 | H-29 |
| 70-38 | H-3 | | |
| 70-39 | H-4 | | |
| 70-40 | H-5 | | |
| 70-41 | H-6 | | |
| 70-42 | H-7 | | |
| 70-43 | H-8 | | |
| 70-44 | H-9 | | |
| 70-45 | H-10 | | |
| 70-46 | H-11 | | |
| 70-47 | H-12 | | |
| 70-48 | H-13 | | |
| 70-49 | H-14 | | |
| 70-50 | H-15 | | |
| 70-51 | H-16 | | |
| 70-52 | H-17 | | |
| 70-53 | H-18 | | |
| 70-54 | H-2 | H-1 | H-30 |
| 70-55 | H-3 | | |
| 70-56 | H-4 | | |
| 70-57 | H-5 | | |
| 70-58 | H-6 | | |
| 70-59 | H-7 | | |
| 70-60 | H-8 | | |
| 70-61 | H-9 | | |
| 70-62 | H-10 | | |
| 70-63 | H-11 | | |
| 70-64 | H-12 | | |
| 70-65 | H-13 | | |
| 70-66 | H-14 | | |
| 70-67 | H-15 | | |
| 70-68 | H-16 | | |
| 70-69 | H-17 | | |
| 70-70 | H-18 | | |
Compound 71-X
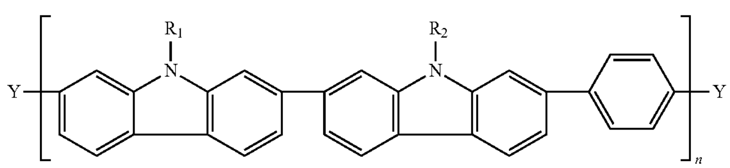
| Com. | R1 = R2 | Y |
|---|---|---|
| 71-1 | H-1 | H-29 |
| 71-2 | H-2 | |
| 71-3 | H-3 | |
| 71-4 | H-4 | |
| 71-5 | H-5 | |
| 71-6 | H-6 | |
| 71-7 | H-7 | |
| 71-8 | H-8 | |
| 71-9 | H-9 | |
| 71-10 | H-10 | |
| 71-11 | H-11 | |
| 71-12 | H-12 | |

-continued
| | | |
|---|---|---|
| 71-13 | H-13 | |
| 71-14 | H-14 | |
| 71-15 | H-15 | |
| 71-16 | H-16 | |
| 71-17 | H-17 | |
| 71-18 | H-18 | |
| 71-19 | H-1 | H-30 |
| 71-20 | H-2 | |
| 71-21 | H-3 | |
| 71-22 | H-4 | |
| 71-23 | H-5 | |
| 71-24 | H-6 | |
| 71-25 | H-7 | |
| 71-26 | H-8 | |
| 71-27 | H-9 | |
| 71-28 | H-10 | |
| 71-29 | H-11 | |
| 71-30 | H-12 | |
| 71-31 | H-13 | |
| 71-32 | H-14 | |
| 71-33 | H-15 | |
| 71-34 | H-16 | |
| 71-35 | H-17 | |
| 71-36 | H-18 | |
| Com. | R1 | R2 | Y |
|---|---|---|---|
| 71-37 | H-2 | H-1 | H-29 |
| 71-38 | H-3 | | |
| 71-39 | H-4 | | |
| 71-40 | H-5 | | |
| 71-41 | H-6 | | |
| 71-42 | H-7 | | |
| 71-43 | H-8 | | |
| 71-44 | H-9 | | |
| 71-45 | H-10 | | |
| 71-46 | H-11 | | |
| 71-47 | H-12 | | |
| 71-48 | H-13 | | |
| 71-49 | H-14 | | |
| 71-50 | H-15 | | |
| 71-51 | H-16 | | |
| 71-52 | H-17 | | |
| 71-53 | H-18 | | |
| 71-54 | H-2 | H-1 | H-30 |
| 71-55 | H-3 | | |
| 71-56 | H-4 | | |
| 71-57 | H-5 | | |
| 71-58 | H-6 | | |
| 71-59 | H-7 | | |
| 71-60 | H-8 | | |
| 71-61 | H-9 | | |
| 71-62 | H-10 | | |
| 71-63 | H-11 | | |
| 71-64 | H-12 | | |
| 71-65 | H-13 | | |
| 71-66 | H-14 | | |
| 71-67 | H-15 | | |
| 71-68 | H-16 | | |
| 71-69 | H-17 | | |
| 71-70 | H-18 | | |
Compound 72-X
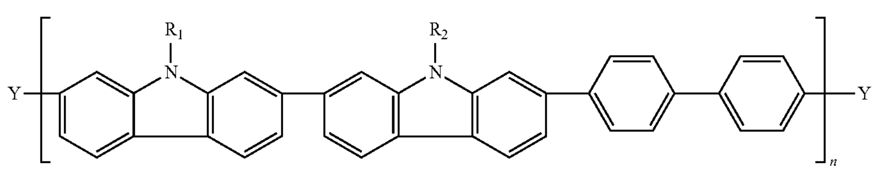
| Com. | R1 = R2 | Y |
|---|---|---|
| 72-1 | H-1 | H-29 |
| 72-2 | H-2 | |
| 72-3 | H-3 | |
| 72-4 | H-4 | |
| 72-5 | H-5 | |
| 72-6 | H-6 | |

-continued

| | | |
|---|---|---|
| 72-7 | H-7 | |
| 72-8 | H-8 | |
| 72-9 | H-9 | |
| 72-10 | H-10 | |
| 72-11 | H-11 | |
| 72-12 | H-12 | |
| 72-13 | H-13 | |
| 72-14 | H-14 | |
| 72-15 | H-15 | |
| 72-16 | H-16 | |
| 72-17 | H-17 | |
| 72-18 | H-18 | |
| 72-19 | H-1 | H-30 |
| 72-20 | H-2 | |
| 72-21 | H-3 | |
| 72-22 | H-4 | |
| 72-23 | H-5 | |
| 72-24 | H-6 | |
| 72-25 | H-7 | |
| 72-26 | H-8 | |
| 72-27 | H-9 | |
| 72-28 | H-10 | |
| 72-29 | H-11 | |
| 72-30 | H-12 | |
| 72-31 | H-13 | |
| 72-32 | H-14 | |
| 72-33 | H-15 | |
| 72-34 | H-16 | |
| 72-35 | H-17 | |
| 72-36 | H-18 | |

| Com. | R1 | R2 | Y |
|---|---|---|---|
| 72-37 | H-2 | H-1 | H-29 |
| 72-38 | H-3 | | |
| 72-39 | H-4 | | |
| 72-40 | H-5 | | |
| 72-41 | H-6 | | |
| 72-42 | H-7 | | |
| 72-43 | H-8 | | |
| 72-44 | H-9 | | |
| 72-45 | H-10 | | |
| 72-46 | H-11 | | |
| 72-47 | H-12 | | |
| 72-48 | H-13 | | |
| 72-49 | H-14 | | |
| 72-50 | H-15 | | |
| 72-51 | H-16 | | |
| 72-52 | H-17 | | |
| 72-53 | H-18 | | |
| 72-54 | H-2 | H-1 | H-30 |
| 72-55 | H-3 | | |
| 72-56 | H-4 | | |
| 72-57 | H-5 | | |
| 72-58 | H-6 | | |
| 72-59 | H-7 | | |
| 72-60 | H-8 | | |
| 72-61 | H-9 | | |
| 72-62 | H-10 | | |
| 72-63 | H-11 | | |
| 72-64 | H-12 | | |
| 72-65 | H-13 | | |
| 72-66 | H-14 | | |
| 72-67 | H-15 | | |
| 72-68 | H-16 | | |
| 72-69 | H-17 | | |
| 72-70 | H-18 | | |

-continued
Compound 73-X
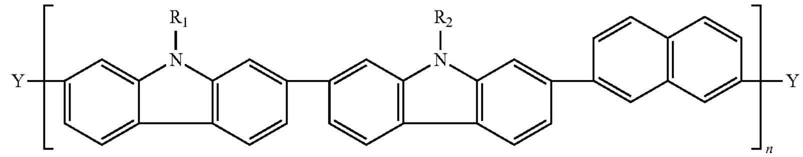
| Com. | R1 = R2 | Y |
|---|---|---|
| 73-1 | H-1 | H-29 |
| 73-2 | H-2 | |
| 73-3 | H-3 | |
| 73-4 | H-4 | |
| 73-5 | H-5 | |
| 73-6 | H-6 | |
| 73-7 | H-7 | |
| 73-8 | H-8 | |
| 73-9 | H-9 | |
| 73-10 | H-10 | |
| 73-11 | H-11 | |
| 73-12 | H-12 | |
| 73-13 | H-13 | |
| 73-14 | H-14 | |
| 73-15 | H-15 | |
| 73-16 | H-16 | |
| 73-17 | H-17 | |
| 73-18 | H-18 | |
| 73-19 | H-1 | H-30 |
| 73-20 | H-2 | |
| 73-21 | H-3 | |
| 73-22 | H-4 | |
| 73-23 | H-5 | |
| 73-24 | H-6 | |
| 73-25 | H-7 | |
| 73-26 | H-8 | |
| 73-27 | H-9 | |
| 73-28 | H-10 | |
| 73-29 | H-11 | |
| 73-30 | H-12 | |
| 73-31 | H-13 | |
| 73-32 | H-14 | |
| 73-33 | H-15 | |
| 73-34 | H-16 | |
| 73-35 | H-17 | |
| 73-36 | H-18 | |
| Com. | R1 | R2 | Y |
|---|---|---|---|
| 73-37 | H-2 | H-1 | H-29 |
| 73-38 | H-3 | | |
| 73-39 | H-4 | | |
| 73-40 | H-5 | | |
| 73-41 | H-6 | | |
| 73-42 | H-7 | | |
| 73-43 | H-8 | | |
| 73-44 | H-9 | | |
| 73-45 | H-10 | | |
| 73-46 | H-11 | | |
| 73-47 | H-12 | | |
| 73-48 | H-13 | | |
| 73-49 | H-14 | | |
| 73-50 | H-15 | | |
| 73-51 | H-16 | | |
| 73-52 | H-17 | | |
| 73-53 | H-18 | | |
| 73-54 | H-2 | H-1 | H-30 |
| 73-55 | H-3 | | |
| 73-56 | H-4 | | |
| 73-57 | H-5 | | |
| 73-58 | H-6 | | |
| 73-59 | H-7 | | |
| 73-60 | H-8 | | |
| 73-61 | H-9 | | |
| 73-62 | H-10 | | |
| 73-63 | H-11 | | |
| 73-64 | H-12 | | |
| 73-65 | H-13 | | |

-continued
| | |
|---|---|
| 73-66 | H-14 |
| 73-67 | H-15 |
| 73-68 | H-16 |
| 73-69 | H-17 |
| 73-70 | H-18 |
Compound 74-X
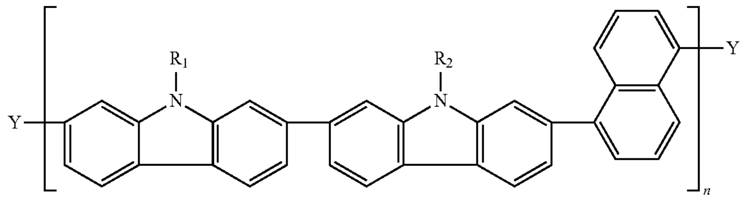
| Com. | R1 = R2 | Y |
|---|---|---|
| 74-1 | H-1 | H-29 |
| 74-2 | H-2 | |
| 74-3 | H-3 | |
| 74-4 | H-4 | |
| 74-5 | H-5 | |
| 74-6 | H-6 | |
| 74-7 | H-7 | |
| 74-8 | H-8 | |
| 74-9 | H-9 | |
| 74-10 | H-10 | |
| 74-11 | H-11 | |
| 74-12 | H-12 | |
| 74-13 | H-13 | |
| 74-14 | H-14 | |
| 74-15 | H-15 | |
| 74-16 | H-16 | |
| 74-17 | H-17 | |
| 74-18 | H-18 | |
| 74-19 | H-1 | H-30 |
| 74-20 | H-2 | |
| 74-21 | H-3 | |
| 74-22 | H-4 | |
| 74-23 | H-5 | |
| 74-24 | H-6 | |
| 74-25 | H-7 | |
| 74-26 | H-8 | |
| 74-27 | H-9 | |
| 74-28 | H-10 | |
| 74-29 | H-11 | |
| 74-30 | H-12 | |
| 74-31 | H-13 | |
| 74-32 | H-14 | |
| 74-33 | H-15 | |
| 74-34 | H-16 | |
| 74-35 | H-17 | |
| 74-36 | H-18 | |
| Com. | R1 | R2 | Y |
|---|---|---|---|
| 74-37 | H-2 | H-1 | H-29 |
| 74-38 | H-3 | | |
| 74-39 | H-4 | | |
| 74-40 | H-5 | | |
| 74-41 | H-6 | | |
| 74-42 | H-7 | | |
| 74-43 | H-8 | | |
| 74-44 | H-9 | | |
| 74-45 | H-10 | | |
| 74-46 | H-11 | | |
| 74-47 | H-12 | | |
| 74-48 | H-13 | | |
| 74-49 | H-14 | | |
| 74-50 | H-15 | | |
| 74-51 | H-16 | | |
| 74-52 | H-17 | | |
| 74-53 | H-18 | | |
| 74-54 | H-2 | H-1 | H-30 |
| 74-55 | H-3 | | |
| 74-56 | H-4 | | |
| 74-57 | H-5 | | |

-continued
| | |
|---|---|
| 74-58 | H-6 |
| 74-59 | H-7 |
| 74-60 | H-8 |
| 74-61 | H-9 |
| 74-62 | H-10 |
| 74-63 | H-11 |
| 74-64 | H-12 |
| 74-65 | H-13 |
| 74-66 | H-14 |
| 74-67 | H-15 |
| 74-68 | H-16 |
| 74-69 | H-17 |
| 74-70 | H-18 |
Compound 75-X
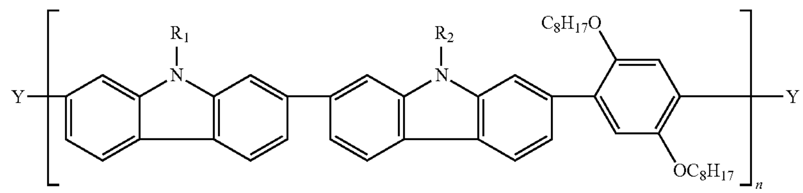
| Com. | R1 = R2 | Y |
|---|---|---|
| 75-1 | H-1 | H-29 |
| 75-2 | H-2 | |
| 75-3 | H-3 | |
| 75-4 | H-4 | |
| 75-5 | H-5 | |
| 75-6 | H-6 | |
| 75-7 | H-7 | |
| 75-8 | H-8 | |
| 75-9 | H-9 | |
| 75-10 | H-10 | |
| 75-11 | H-11 | |
| 75-12 | H-12 | |
| 75-13 | H-13 | |
| 75-14 | H-14 | |
| 75-15 | H-15 | |
| 75-16 | H-16 | |
| 75-17 | H-17 | |
| 75-18 | H-18 | |
| 75-19 | H-1 | H-30 |
| 75-20 | H-2 | |
| 75-21 | H-3 | |
| 75-22 | H-4 | |
| 75-23 | H-5 | |
| 75-24 | H-6 | |
| 75-25 | H-7 | |
| 75-26 | H-8 | |
| 75-27 | H-9 | |
| 75-28 | H-10 | |
| 75-29 | H-11 | |
| 75-30 | H-12 | |
| 75-31 | H-13 | |
| 75-32 | H-14 | |
| 75-33 | H-15 | |
| 75-34 | H-16 | |
| 75-35 | H-17 | |
| 75-36 | H-18 | |
| Com. | R1 | R2 | Y |
|---|---|---|---|
| 75-37 | H-2 | H-1 | H-29 |
| 75-38 | H-3 | | |
| 75-39 | H-4 | | |
| 75-40 | H-5 | | |
| 75-41 | H-6 | | |
| 75-42 | H-7 | | |
| 75-43 | H-8 | | |
| 75-44 | H-9 | | |
| 75-45 | H-10 | | |
| 75-46 | H-11 | | |
| 75-47 | H-12 | | |
| 75-48 | H-13 | | |
| 75-49 | H-14 | | |
| 75-50 | H-15 | | |

-continued
| | | | |
|---|---|---|---|
| 75-51 | H-16 | | |
| 75-52 | H-17 | | |
| 75-53 | H-18 | | |
| 75-54 | H-2 | H-1 | H-30 |
| 75-55 | H-3 | | |
| 75-56 | H-4 | | |
| 75-57 | H-5 | | |
| 75-58 | H-6 | | |
| 75-59 | H-7 | | |
| 75-60 | H-8 | | |
| 75-61 | H-9 | | |
| 75-62 | H-10 | | |
| 75-63 | H-11 | | |
| 75-64 | H-12 | | |
| 75-65 | H-13 | | |
| 75-66 | H-14 | | |
| 75-67 | H-15 | | |
| 75-68 | H-16 | | |
| 75-69 | H-17 | | |
| 75-70 | H-18 | | |
Compound 76-X
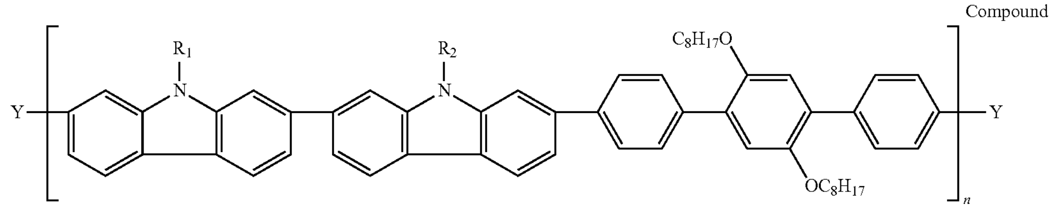
| Com. | R1 = R2 | Y |
|---|---|---|
| 76-1 | H-1 | H-29 |
| 76-2 | H-2 | |
| 76-3 | H-3 | |
| 76-4 | H-4 | |
| 76-5 | H-5 | |
| 76-6 | H-6 | |
| 76-7 | H-7 | |
| 76-8 | H-8 | |
| 76-9 | H-9 | |
| 76-10 | H-10 | |
| 76-11 | H-11 | |
| 76-12 | H-12 | |
| 76-13 | H-13 | |
| 76-14 | H-14 | |
| 76-15 | H-15 | |
| 76-16 | H-16 | |
| 76-17 | H-17 | |
| 76-18 | H-18 | |
| 76-19 | H-1 | H-30 |
| 76-20 | H-2 | |
| 76-21 | H-3 | |
| 76-22 | H-4 | |
| 76-23 | H-5 | |
| 76-24 | H-6 | |
| 76-25 | H-7 | |
| 76-26 | H-8 | |
| 76-27 | H-9 | |
| 76-28 | H-10 | |
| 76-29 | H-11 | |
| 76-30 | H-12 | |
| 76-31 | H-13 | |
| 76-32 | H-14 | |
| 76-33 | H-15 | |
| 76-34 | H-16 | |
| 76-35 | H-17 | |
| 76-36 | H-18 | |
| Com. | R1 | R2 | Y |
|---|---|---|---|
| 76-37 | H-2 | H-1 | H-29 |
| 76-38 | H-3 | | |
| 76-39 | H-4 | | |
| 76-40 | H-5 | | |
| 76-41 | H-6 | | |
| 76-42 | H-7 | | |
| 76-43 | H-8 | | |

-continued
| | | | |
|---|---|---|---|
| 76-44 | H-9 | | |
| 76-45 | H-10 | | |
| 76-46 | H-11 | | |
| 76-47 | H-12 | | |
| 76-48 | H-13 | | |
| 76-49 | H-14 | | |
| 76-50 | H-15 | | |
| 76-51 | H-16 | | |
| 76-52 | H-17 | | |
| 76-53 | H-18 | | |
| 76-54 | H-2 | H-1 | H-30 |
| 76-55 | H-3 | | |
| 76-56 | H-4 | | |
| 76-57 | H-5 | | |
| 76-58 | H-6 | | |
| 76-59 | H-7 | | |
| 76-60 | H-8 | | |
| 76-61 | H-9 | | |
| 76-62 | H-10 | | |
| 76-63 | H-11 | | |
| 76-64 | H-12 | | |
| 76-65 | H-13 | | |
| 76-66 | H-14 | | |
| 76-67 | H-15 | | |
| 76-68 | H-16 | | |
| 76-69 | H-17 | | |
| 76-70 | H-18 | | |
Compound 77-X
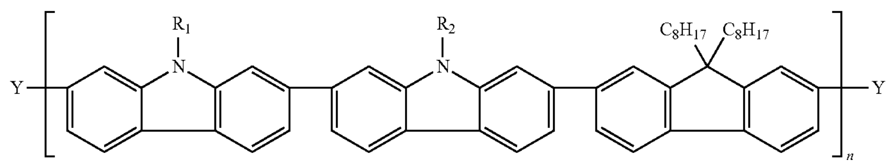
| Com. | R1 = R2 | Y |
|---|---|---|
| 77-1 | H-1 | H-29 |
| 77-2 | H-2 | |
| 77-3 | H-3 | |
| 77-4 | H-4 | |
| 77-5 | H-5 | |
| 77-6 | H-6 | |
| 77-7 | H-7 | |
| 77-8 | H-8 | |
| 77-9 | H-9 | |
| 77-10 | H-10 | |
| 77-11 | H-11 | |
| 77-12 | H-12 | |
| 77-13 | H-13 | |
| 77-14 | H-14 | |
| 77-15 | H-15 | |
| 77-16 | H-16 | |
| 77-17 | H-17 | |
| 77-18 | H-18 | |
| 77-19 | H-1 | H-30 |
| 77-20 | H-2 | |
| 77-21 | H-3 | |
| 77-22 | H-4 | |
| 77-23 | H-5 | |
| 77-24 | H-6 | |
| 77-25 | H-7 | |
| 77-26 | H-8 | |
| 77-27 | H-9 | |
| 77-28 | H-10 | |
| 77-29 | H-11 | |
| 77-30 | H-12 | |
| 77-31 | H-13 | |
| 77-32 | H-14 | |
| 77-33 | H-15 | |
| 77-34 | H-16 | |
| 77-35 | H-17 | |
| 77-36 | H-18 | |

-continued
| Com. | R1 | R2 | Y |
|---|---|---|---|
| 77-37 | H-2 | H-1 | H-29 |
| 77-38 | H-3 | | |
| 77-39 | H-4 | | |
| 77-40 | H-5 | | |
| 77-41 | H-6 | | |
| 77-42 | H-7 | | |
| 77-43 | H-8 | | |
| 77-44 | H-9 | | |
| 77-45 | H-10 | | |
| 77-46 | H-11 | | |
| 77-47 | H-12 | | |
| 77-48 | H-13 | | |
| 77-49 | H-14 | | |
| 77-50 | H-15 | | |
| 77-51 | H-16 | | |
| 77-52 | H-17 | | |
| 77-53 | H-18 | | |
| 77-54 | H-2 | H-1 | H-30 |
| 77-55 | H-3 | | |
| 77-56 | H-4 | | |
| 77-57 | H-5 | | |
| 77-58 | H-6 | | |
| 77-59 | H-7 | | |
| 77-60 | H-8 | | |
| 77-61 | H-9 | | |
| 77-62 | H-10 | | |
| 77-63 | H-11 | | |
| 77-64 | H-12 | | |
| 77-65 | H-13 | | |
| 77-66 | H-14 | | |
| 77-67 | H-15 | | |
| 77-68 | H-16 | | |
| 77-69 | H-17 | | |
| 77-70 | H-18 | | |
Compound 78-X
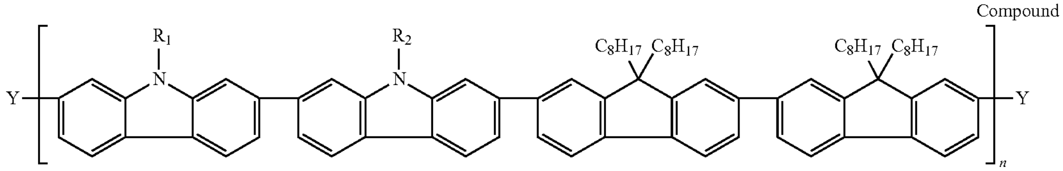
| Com. | R1 = R2 | Y |
|---|---|---|
| 78-1 | H-1 | H-29 |
| 78-2 | H-2 | |
| 78-3 | H-3 | |
| 78-4 | H-4 | |
| 78-5 | H-5 | |
| 78-6 | H-6 | |
| 78-7 | H-7 | |
| 78-8 | H-8 | |
| 78-9 | H-9 | |
| 78-10 | H-10 | |
| 78-11 | H-11 | |
| 78-12 | H-12 | |
| 78-13 | H-13 | |
| 78-14 | H-14 | |
| 78-15 | H-15 | |
| 78-16 | H-16 | |
| 78-17 | H-17 | |
| 78-18 | H-18 | |
| 78-19 | H-1 | H-30 |
| 78-20 | H-2 | |
| 78-21 | H-3 | |
| 78-22 | H-4 | |
| 78-23 | H-5 | |
| 78-24 | H-6 | |
| 78-25 | H-7 | |
| 78-26 | H-8 | |
| 78-27 | H-9 | |
| 78-28 | H-10 | |
| 78-29 | H-11 | |
| 78-30 | H-12 | |
| 78-31 | H-13 | |

-continued
| | |
|---|---|
| 78-32 | H-14 |
| 78-33 | H-15 |
| 78-34 | H-16 |
| 78-35 | H-17 |
| 78-36 | H-18 |
| Com. | R1 | R2 | Y |
|---|---|---|---|
| 78-37 | H-2 | H-1 | H-29 |
| 78-38 | H-3 | | |
| 78-39 | H-4 | | |
| 78-40 | H-5 | | |
| 78-41 | H-6 | | |
| 78-42 | H-7 | | |
| 78-43 | H-8 | | |
| 78-44 | H-9 | | |
| 78-45 | H-10 | | |
| 78-46 | H-11 | | |
| 78-47 | H-12 | | |
| 78-48 | H-13 | | |
| 78-49 | H-14 | | |
| 78-50 | H-15 | | |
| 78-51 | H-16 | | |
| 78-52 | H-17 | | |
| 78-53 | H-18 | | |
| 78-54 | H-2 | H-1 | H-30 |
| 78-55 | H-3 | | |
| 78-56 | H-4 | | |
| 78-57 | H-5 | | |
| 78-58 | H-6 | | |
| 78-59 | H-7 | | |
| 78-60 | H-8 | | |
| 78-61 | H-9 | | |
| 78-62 | H-10 | | |
| 78-63 | H-11 | | |
| 78-64 | H-12 | | |
| 78-65 | H-13 | | |
| 78-66 | H-14 | | |
| 78-67 | H-15 | | |
| 78-68 | H-16 | | |
| 78-69 | H-17 | | |
| 78-70 | H-18 | | |
Compound 79-X
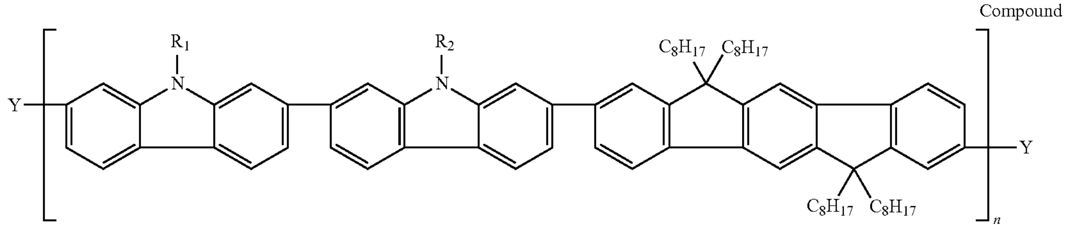
| Com. | R1 = R2 | Y |
|---|---|---|
| 79-1 | H-1 | H-29 |
| 79-2 | H-2 | |
| 79-3 | H-3 | |
| 79-4 | H-4 | |
| 79-5 | H-5 | |
| 79-6 | H-6 | |
| 79-7 | H-7 | |
| 79-8 | H-8 | |
| 79-9 | H-9 | |
| 79-10 | H-10 | |
| 79-11 | H-11 | |
| 79-12 | H-12 | |
| 79-13 | H-13 | |
| 79-14 | H-14 | |
| 79-15 | H-15 | |
| 79-16 | H-16 | |
| 79-17 | H-17 | |
| 79-18 | H-18 | |
| 79-19 | H-1 | H-30 |
| 79-20 | H-2 | |
| 79-21 | H-3 | |
| 79-22 | H-4 | |
| 79-23 | H-5 | |

-continued
| | | | |
|---|---|---|---|
| 79-24 | H-6 | | |
| 79-25 | H-7 | | |
| 79-26 | H-8 | | |
| 79-27 | H-9 | | |
| 79-28 | H-10 | | |
| 79-29 | H-11 | | |
| 79-30 | H-12 | | |
| 79-31 | H-13 | | |
| 79-32 | H-14 | | |
| 79-33 | H-15 | | |
| 79-34 | H-16 | | |
| 79-35 | H-17 | | |
| 79-36 | H-18 | | |
| Com. | R1 | R2 | Y |
|---|---|---|---|
| 79-37 | H-2 | H-1 | H-29 |
| 79-38 | H-3 | | |
| 79-39 | H-4 | | |
| 79-40 | H-5 | | |
| 79-41 | H-6 | | |
| 79-42 | H-7 | | |
| 79-43 | H-8 | | |
| 79-44 | H-9 | | |
| 79-45 | H-10 | | |
| 79-46 | H-11 | | |
| 79-47 | H-12 | | |
| 79-48 | H-13 | | |
| 79-49 | H-14 | | |
| 79-50 | H-15 | | |
| 79-51 | H-16 | | |
| 79-52 | H-17 | | |
| 79-53 | H-18 | | |
| 79-54 | H-2 | H-1 | H-30 |
| 79-55 | H-3 | | |
| 79-56 | H-4 | | |
| 79-57 | H-5 | | |
| 79-58 | H-6 | | |
| 79-59 | H-7 | | |
| 79-60 | H-8 | | |
| 79-61 | H-9 | | |
| 79-62 | H-10 | | |
| 79-63 | H-11 | | |
| 79-64 | H-12 | | |
| 79-65 | H-13 | | |
| 79-66 | H-14 | | |
| 79-67 | H-15 | | |
| 79-68 | H-16 | | |
| 79-69 | H-17 | | |
| 79-70 | H-18 | | |
Compound 80-X
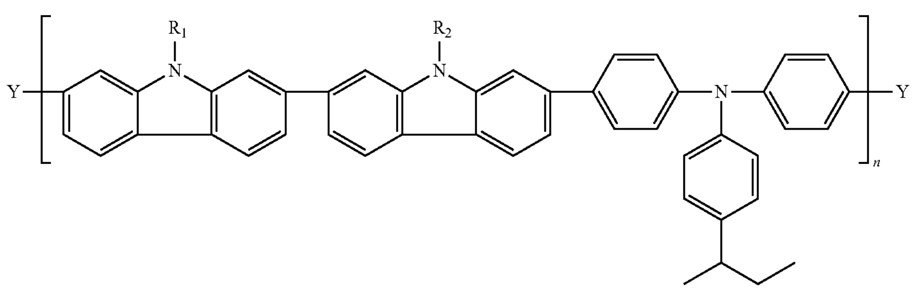
| Com. | R1 = R2 | Y |
|---|---|---|
| 80-1 | H-1 | H-29 |
| 80-2 | H-2 | |
| 80-3 | H-3 | |
| 80-4 | H-4 | |
| 80-5 | H-5 | |
| 80-6 | H-6 | |
| 80-7 | H-7 | |
| 80-8 | H-8 | |
| 80-9 | H-9 | |
| 80-10 | H-10 | |
| 80-11 | H-11 | |

-continued

| | | |
|---|---|---|
| 80-12 | H-12 | |
| 80-13 | H-13 | |
| 80-14 | H-14 | |
| 80-15 | H-15 | |
| 80-16 | H-16 | |
| 80-17 | H-17 | |
| 80-18 | H-18 | |
| 80-19 | H-1 | H-30 |
| 80-20 | H-2 | |
| 80-21 | H-3 | |
| 80-22 | H-4 | |
| 80-23 | H-5 | |
| 80-24 | H-6 | |
| 80-25 | H-7 | |
| 80-26 | H-8 | |
| 80-27 | H-9 | |
| 80-28 | H-10 | |
| 80-29 | H-11 | |
| 80-30 | H-12 | |
| 80-31 | H-13 | |
| 80-32 | H-14 | |
| 80-33 | H-15 | |
| 80-34 | H-16 | |
| 80-35 | H-17 | |
| 80-36 | H-18 | |

| Com. | R1 | R2 | Y |
|---|---|---|---|
| 80-37 | H-2 | H-1 | H-29 |
| 80-38 | H-3 | | |
| 80-39 | H-4 | | |
| 80-40 | H-5 | | |
| 80-41 | H-6 | | |
| 80-42 | H-7 | | |
| 80-43 | H-8 | | |
| 80-44 | H-9 | | |
| 80-45 | H-10 | | |
| 80-46 | H-11 | | |
| 80-47 | H-12 | | |
| 80-48 | H-13 | | |
| 80-49 | H-14 | | |
| 80-50 | H-15 | | |
| 80-51 | H-16 | | |
| 80-52 | H-17 | | |
| 80-53 | H-18 | | |
| 80-54 | H-2 | H-1 | H-30 |
| 80-55 | H-3 | | |
| 80-56 | H-4 | | |
| 80-57 | H-5 | | |
| 80-58 | H-6 | | |
| 80-59 | H-7 | | |
| 80-60 | H-8 | | |
| 80-61 | H-9 | | |
| 80-62 | H-10 | | |
| 80-63 | H-11 | | |
| 80-64 | H-12 | | |
| 80-65 | H-13 | | |
| 80-66 | H-14 | | |
| 80-67 | H-15 | | |
| 80-68 | H-16 | | |
| 80-69 | H-17 | | |
| 80-70 | H-18 | | |

-continued
Compound 81-X
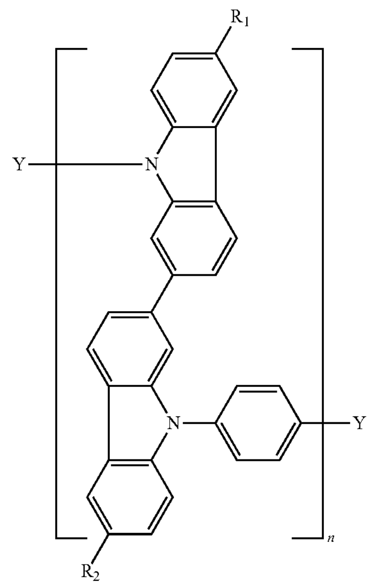
| Com. | R1 = R2 | Y |
|---|---|---|
| 81-1 | H-1 | H-29 |
| 81-2 | H-2 | |
| 81-3 | H-3 | |
| 81-4 | H-4 | |
| 81-5 | H-5 | |
| 81-6 | H-6 | |
| 81-7 | H-7 | |
| 81-8 | H-8 | |
| 81-9 | H-9 | |
| 81-10 | H-10 | |
| 81-11 | H-11 | |
| 81-12 | H-12 | |
| 81-13 | H-13 | |
| 81-14 | H-14 | |
| 81-15 | H-15 | |
| 81-16 | H-16 | |
| 81-17 | H-17 | |
| 81-18 | H-18 | |
| 81-19 | H-1 | H-30 |
| 81-20 | H-2 | |
| 81-21 | H-3 | |
| 81-22 | H-4 | |
| 81-23 | H-5 | |
| 81-24 | H-6 | |
| 81-25 | H-7 | |
| 81-26 | H-8 | |
| 81-27 | H-9 | |
| 81-28 | H-10 | |
| 81-29 | H-11 | |
| 81-30 | H-12 | |
| 81-31 | H-13 | |
| 81-32 | H-14 | |
| 81-33 | H-15 | |
| 81-34 | H-16 | |
| 81-35 | H-17 | |
| 81-36 | H-18 | |

-continued
Compound 82-X
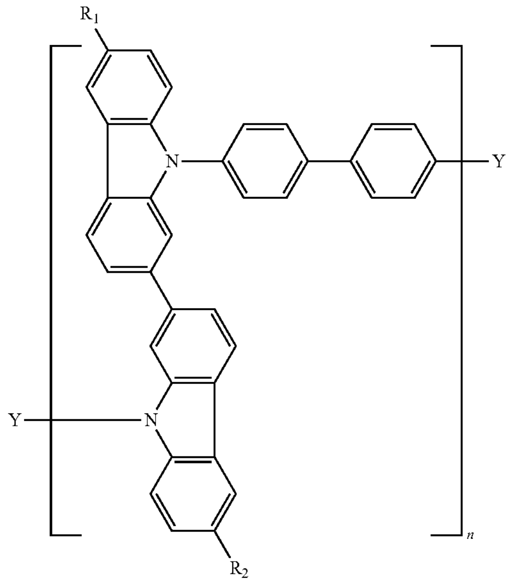
| Com. | R1 = R2 | Y |
| --- | --- | --- |
| 82-1 | H-1 | H-29 |
| 82-2 | H-2 | |
| 82-3 | H-3 | |
| 82-4 | H-4 | |
| 82-5 | H-5 | |
| 82-6 | H-6 | |
| 82-7 | H-7 | |
| 82-8 | H-8 | |
| 82-9 | H-9 | |
| 82-10 | H-10 | |
| 82-11 | H-11 | |
| 82-12 | H-12 | |
| 82-13 | H-13 | |
| 82-14 | H-14 | |
| 82-15 | H-15 | |
| 82-16 | H-16 | |
| 82-17 | H-17 | |
| 82-18 | H-18 | |
| 82-19 | H-1 | H-30 |
| 82-20 | H-2 | |
| 82-21 | H-3 | |
| 82-22 | H-4 | |
| 82-23 | H-5 | |
| 82-24 | H-6 | |
| 82-25 | H-7 | |
| 82-26 | H-8 | |
| 82-27 | H-9 | |
| 82-28 | H-10 | |
| 82-29 | H-11 | |
| 82-30 | H-12 | |
| 82-31 | H-13 | |
| 82-32 | H-14 | |
| 82-33 | H-15 | |
| 82-34 | H-16 | |
| 82-35 | H-17 | |
| 82-36 | H-18 | |

-continued
Compound 83-X
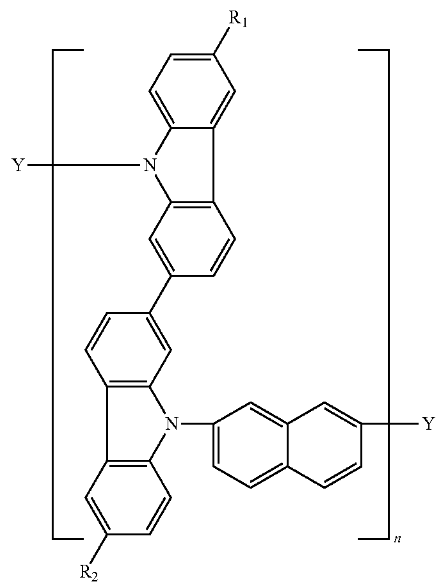
| Com. | R1 = R2 | Y |
|---|---|---|
| 83-1 | H-1 | H-29 |
| 83-2 | H-2 | |
| 83-3 | H-3 | |
| 83-4 | H-4 | |
| 83-5 | H-5 | |
| 83-6 | H-6 | |
| 83-7 | H-7 | |
| 83-8 | H-8 | |
| 83-9 | H-9 | |
| 83-10 | H-10 | |
| 83-11 | H-11 | |
| 83-12 | H-12 | |
| 83-13 | H-13 | |
| 83-14 | H-14 | |
| 83-15 | H-15 | |
| 83-16 | H-16 | |
| 83-17 | H-17 | |
| 83-18 | H-18 | |
| 83-19 | H-1 | H-30 |
| 83-20 | H-2 | |
| 83-21 | H-3 | |
| 83-22 | H-4 | |
| 83-23 | H-5 | |
| 83-24 | H-6 | |
| 83-25 | H-7 | |
| 83-26 | H-8 | |
| 83-27 | H-9 | |
| 83-28 | H-10 | |
| 83-29 | H-11 | |
| 83-30 | H-12 | |
| 83-31 | H-13 | |
| 83-32 | H-14 | |
| 83-33 | H-15 | |

-continued
| | |
|---|---|
| 83-34 | H-16 |
| 83-35 | H-17 |
| 83-36 | H-18 |
Compound 84-X
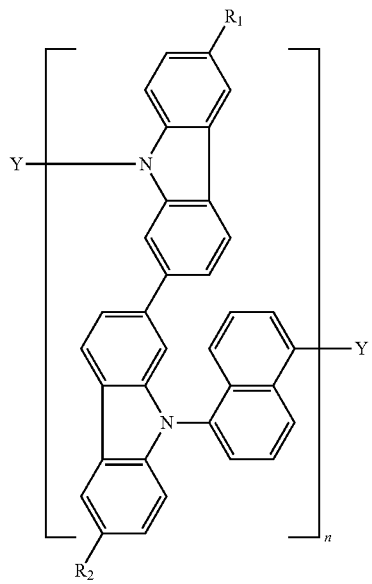
| Com. | R1 = R2 | Y |
|---|---|---|
| 84-1 | H-1 | H-29 |
| 84-2 | H-2 | |
| 84-3 | H-3 | |
| 84-4 | H-4 | |
| 84-5 | H-5 | |
| 84-6 | H-6 | |
| 84-7 | H-7 | |
| 84-8 | H-8 | |
| 84-9 | H-9 | |
| 84-10 | H-10 | |
| 84-11 | H-11 | |
| 84-12 | H-12 | |
| 84-13 | H-13 | |
| 84-14 | H-14 | |
| 84-15 | H-15 | |
| 84-16 | H-16 | |
| 84-17 | H-17 | |
| 84-18 | H-18 | |
| 84-19 | H-1 | H-30 |
| 84-20 | H-2 | |
| 84-21 | H-3 | |
| 84-22 | H-4 | |
| 84-23 | H-5 | |
| 84-24 | H-6 | |
| 84-25 | H-7 | |
| 84-26 | H-8 | |
| 84-27 | H-9 | |
| 84-28 | H-10 | |
| 84-29 | H-11 | |
| 84-30 | H-12 | |
| 84-31 | H-13 | |
| 84-32 | H-14 | |
| 84-33 | H-15 | |

-continued
| | |
|---|---|
| 84-34 | H-16 |
| 84-35 | H-17 |
| 84-36 | H-18 |
Compound 85-X
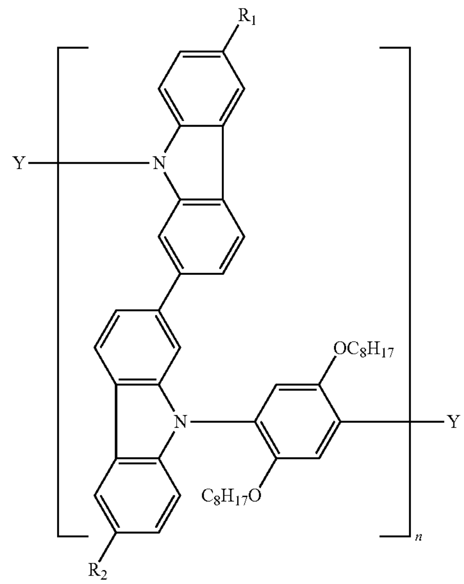
| Com. | R1 = R2 | Y |
|---|---|---|
| 85-1 | H-1 | H-29 |
| 85-2 | H-2 | |
| 85-3 | H-3 | |
| 85-4 | H-4 | |
| 85-5 | H-5 | |
| 85-6 | H-6 | |
| 85-7 | H-7 | |
| 85-8 | H-8 | |
| 85-9 | H-9 | |
| 85-10 | H-10 | |
| 85-11 | H-11 | |
| 85-12 | H-12 | |
| 85-13 | H-13 | |
| 85-14 | H-14 | |
| 85-15 | H-15 | |
| 85-16 | H-16 | |
| 85-17 | H-17 | |
| 85-18 | H-18 | |
| 85-19 | H-1 | H-30 |
| 85-20 | H-2 | |
| 85-21 | H-3 | |
| 85-22 | H-4 | |
| 85-23 | H-5 | |
| 85-24 | H-6 | |
| 85-25 | H-7 | |
| 85-26 | H-8 | |
| 85-27 | H-9 | |
| 85-28 | H-10 | |
| 85-29 | H-11 | |
| 85-30 | H-12 | |
| 85-31 | H-13 | |
| 85-32 | H-14 | |
| 85-33 | H-15 | |
| 85-34 | H-16 | |
| 85-35 | H-17 | |
| 85-36 | H-18 | |

-continued
Compound 86-X
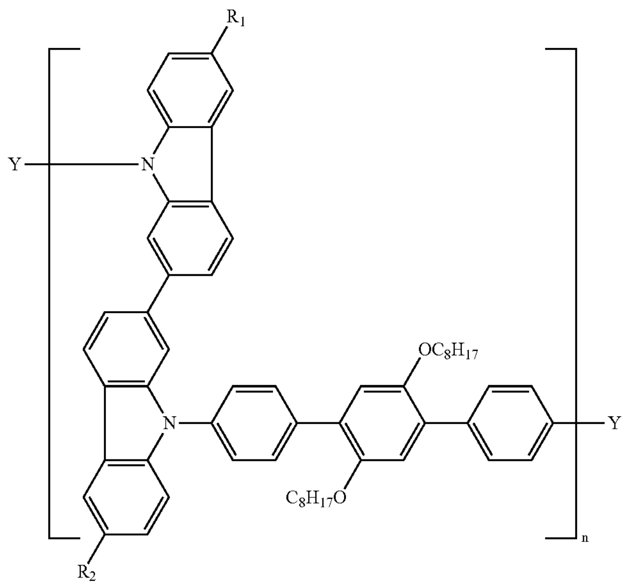
| Com. | R1 = R2 | Y |
|---|---|---|
| 86-1 | H-1 | H-29 |
| 86-2 | H-2 | |
| 86-3 | H-3 | |
| 86-4 | H-4 | |
| 86-5 | H-5 | |
| 86-6 | H-6 | |
| 86-7 | H-7 | |
| 86-8 | H-8 | |
| 86-9 | H-9 | |
| 86-10 | H-10 | |
| 86-11 | H-11 | |
| 86-12 | H-12 | |
| 86-13 | H-13 | |
| 86-14 | H-14 | |
| 86-15 | H-15 | |
| 86-16 | H-16 | |
| 86-17 | H-17 | |
| 86-18 | H-18 | |
| 86-19 | H-1 | H-30 |
| 86-20 | H-2 | |
| 86-21 | H-3 | |
| 86-22 | H-4 | |
| 86-23 | H-5 | |
| 86-24 | H-6 | |
| 86-25 | H-7 | |
| 86-26 | H-8 | |
| 86-27 | H-9 | |
| 86-28 | H-10 | |
| 86-29 | H-11 | |
| 86-30 | H-12 | |
| 86-31 | H-13 | |
| 86-32 | H-14 | |
| 86-33 | H-15 | |
| 86-34 | H-16 | |
| 86-35 | H-17 | |
| 86-36 | H-18 | |

-continued
Compound 87-X
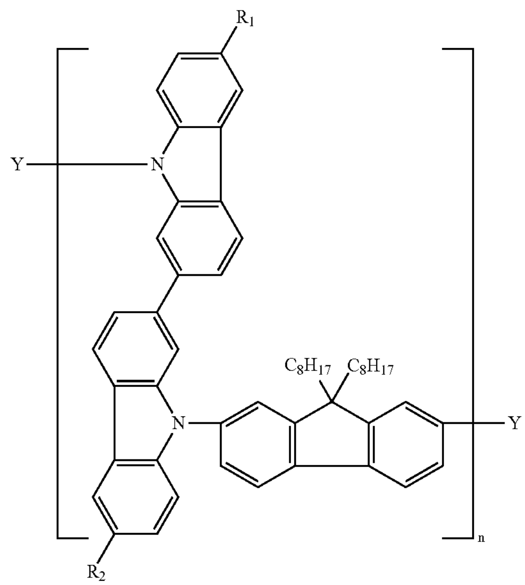
| Com. | R1 = R2 | Y |
|---|---|---|
| 87-1 | H-1 | H-29 |
| 87-2 | H-2 | |
| 87-3 | H-3 | |
| 87-4 | H-4 | |
| 87-5 | H-5 | |
| 87-6 | H-6 | |
| 87-7 | H-7 | |
| 87-8 | H-8 | |
| 87-9 | H-9 | |
| 87-10 | H-10 | |
| 87-11 | H-11 | |
| 87-12 | H-12 | |
| 87-13 | H-13 | |
| 87-14 | H-14 | |
| 87-15 | H-15 | |
| 87-16 | H-16 | |
| 87-17 | H-17 | |
| 87-18 | H-18 | |
| 87-19 | H-1 | H-30 |
| 87-20 | H-2 | |
| 87-21 | H-3 | |
| 87-22 | H-4 | |
| 87-23 | H-5 | |
| 87-24 | H-6 | |
| 87-25 | H-7 | |
| 87-26 | H-8 | |
| 87-27 | H-9 | |
| 87-28 | H-10 | |
| 87-29 | H-11 | |
| 87-30 | H-12 | |
| 87-31 | H-13 | |
| 87-32 | H-14 | |
| 87-33 | H-15 | |
| 87-34 | H-16 | |
| 87-35 | H-17 | |
| 87-36 | H-18 | |

-continued
Compound 88-X
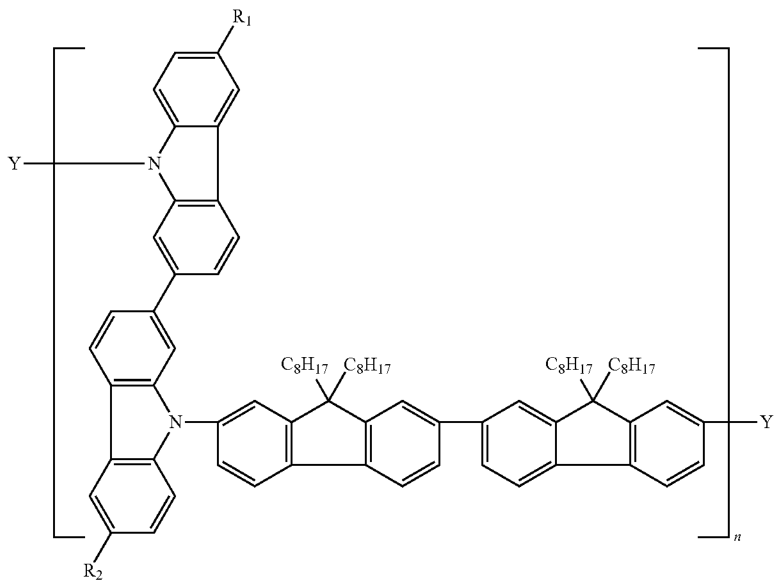
| Com. | R1 = R2 | Y |
|---|---|---|
| 88-1 | H-1 | H-29 |
| 88-2 | H-2 | |
| 88-3 | H-3 | |
| 88-4 | H-4 | |
| 88-5 | H-5 | |
| 88-6 | H-6 | |
| 88-7 | H-7 | |
| 88-8 | H-8 | |
| 88-9 | H-9 | |
| 88-10 | H-10 | |
| 88-11 | H-11 | |
| 88-12 | H-12 | |
| 88-13 | H-13 | |
| 88-14 | H-14 | |
| 88-15 | H-15 | |
| 88-16 | H-16 | |
| 88-17 | H-17 | |
| 88-18 | H-18 | |
| 88-19 | H-1 | H-30 |
| 88-20 | H-2 | |
| 88-21 | H-3 | |
| 88-22 | H-4 | |
| 88-23 | H-5 | |
| 88-24 | H-6 | |
| 88-25 | H-7 | |
| 88-26 | H-8 | |
| 88-27 | H-9 | |
| 88-28 | H-10 | |
| 88-29 | H-11 | |
| 88-30 | H-12 | |
| 88-31 | H-13 | |
| 88-32 | H-14 | |
| 88-33 | H-15 | |
| 88-34 | H-16 | |
| 88-35 | H-17 | |
| 88-36 | H-18 | |

-continued
Compound 89-X
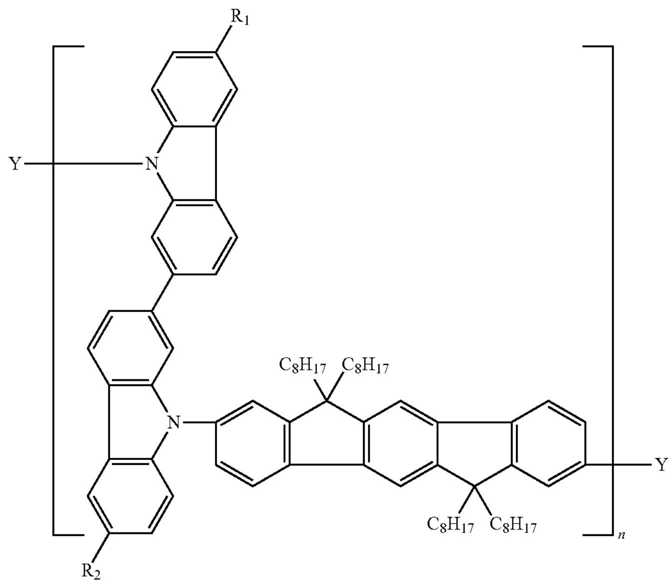
| Com. | R1 = R2 | Y |
|---|---|---|
| 89-1 | H-1 | H-29 |
| 89-2 | H-2 | |
| 89-3 | H-3 | |
| 89-4 | H-4 | |
| 89-5 | H-5 | |
| 89-6 | H-6 | |
| 89-7 | H-7 | |
| 89-8 | H-8 | |
| 89-9 | H-9 | |
| 89-10 | H-10 | |
| 89-11 | H-11 | |
| 89-12 | H-12 | |
| 89-13 | H-13 | |
| 89-14 | H-14 | |
| 89-15 | H-15 | |
| 89-16 | H-16 | |
| 89-17 | H-17 | |
| 89-18 | H-18 | |
| 89-19 | H-1 | H-30 |
| 89-20 | H-2 | |
| 89-21 | H-3 | |
| 89-22 | H-4 | |
| 89-23 | H-5 | |
| 89-24 | H-6 | |
| 89-25 | H-7 | |
| 89-26 | H-8 | |
| 89-27 | H-9 | |
| 89-28 | H-10 | |
| 89-29 | H-11 | |
| 89-30 | H-12 | |
| 89-31 | H-13 | |
| 89-32 | H-14 | |
| 89-33 | H-15 | |
| 89-34 | H-16 | |
| 89-35 | H-17 | |
| 89-36 | H-18 | |

-continued
Compound 90-X
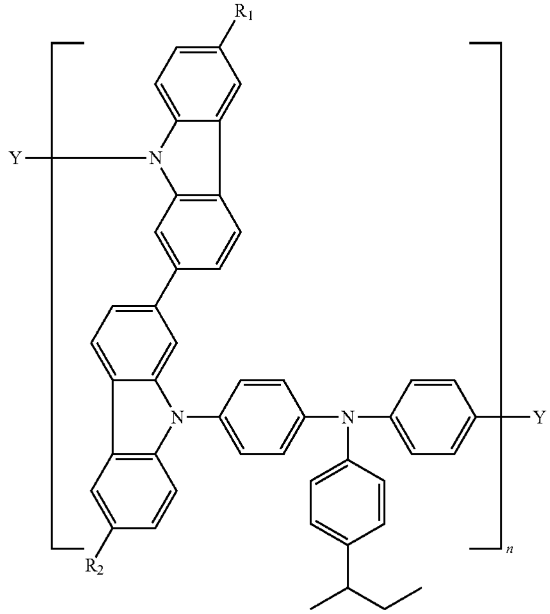
| Com. | R1 = R2 | Y |
|---|---|---|
| 90-1 | H-1 | H-29 |
| 90-2 | H-2 | |
| 90-3 | H-3 | |
| 90-4 | H-4 | |
| 90-5 | H-5 | |
| 90-6 | H-6 | |
| 90-7 | H-7 | |
| 90-8 | H-8 | |
| 90-9 | H-9 | |
| 90-10 | H-10 | |
| 90-11 | H-11 | |
| 90-12 | H-12 | |
| 90-13 | H-13 | |
| 90-14 | H-14 | |
| 90-15 | H-15 | |
| 90-16 | H-16 | |
| 90-17 | H-17 | |
| 90-18 | H-18 | |
| 90-19 | H-1 | H-30 |
| 90-20 | H-2 | |
| 90-21 | H-3 | |
| 90-22 | H-4 | |
| 90-23 | H-5 | |
| 90-24 | H-6 | |
| 90-25 | H-7 | |
| 90-26 | H-8 | |
| 90-27 | H-9 | |
| 90-28 | H-10 | |
| 90-29 | H-11 | |
| 90-30 | H-12 | |
| 90-31 | H-13 | |
| 90-32 | H-14 | |
| 90-33 | H-15 | |
| 90-34 | H-16 | |
| 90-35 | H-17 | |
| 90-36 | H-18 | |

-continued
Compound 91-X
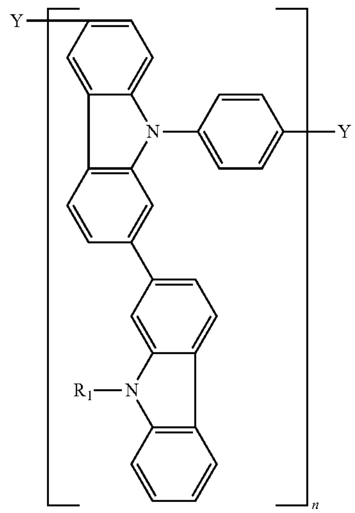
| Com. | R1 | Y |
|---|---|---|
| 91-1 | H-1 | H-29 |
| 91-2 | H-2 | |
| 91-3 | H-3 | |
| 91-4 | H-4 | |
| 91-5 | H-5 | |
| 91-6 | H-6 | |
| 91-7 | H-7 | |
| 91-8 | H-8 | |
| 91-9 | H-9 | |
| 91-10 | H-10 | |
| 91-11 | H-11 | |
| 91-12 | H-12 | |
| 91-13 | H-13 | |
| 91-14 | H-14 | |
| 91-15 | H-15 | |
| 91-16 | H-16 | |
| 91-17 | H-17 | |
| 91-18 | H-18 | |
| 91-19 | H-1 | H-30 |
| 91-20 | H-2 | |
| 91-21 | H-3 | |
| 91-22 | H-4 | |
| 91-23 | H-5 | |
| 91-24 | H-6 | |
| 91-25 | H-7 | |
| 91-26 | H-8 | |
| 91-27 | H-9 | |
| 91-28 | H-10 | |
| 91-29 | H-11 | |
| 91-30 | H-12 | |
| 91-31 | H-13 | |
| 91-32 | H-14 | |
| 91-33 | H-15 | |
| 91-34 | H-16 | |
| 91-35 | H-17 | |
| 91-36 | H-18 | |

-continued
Compound 92-X
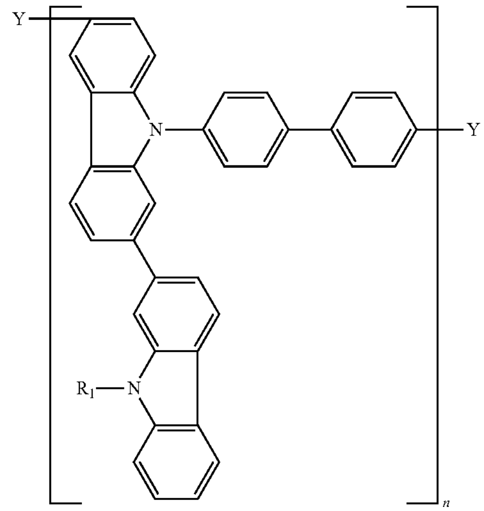
| Com. | R1 | Y |
|---|---|---|
| 92-1 | H-1 | H-29 |
| 92-2 | H-2 | |
| 92-3 | H-3 | |
| 92-4 | H-4 | |
| 92-5 | H-5 | |
| 92-6 | H-6 | |
| 92-7 | H-7 | |
| 92-8 | H-8 | |
| 92-9 | H-9 | |
| 92-10 | H-10 | |
| 92-11 | H-11 | |
| 92-12 | H-12 | |
| 92-13 | H-13 | |
| 92-14 | H-14 | |
| 92-15 | H-15 | |
| 92-16 | H-16 | |
| 92-17 | H-17 | |
| 92-18 | H-18 | |
| 92-19 | H-1 | H-30 |
| 92-20 | H-2 | |
| 92-21 | H-3 | |
| 92-22 | H-4 | |
| 92-23 | H-5 | |
| 92-24 | H-6 | |
| 92-25 | H-7 | |
| 92-26 | H-8 | |
| 92-27 | H-9 | |
| 92-28 | H-10 | |
| 92-29 | H-11 | |
| 92-30 | H-12 | |
| 92-31 | H-13 | |
| 92-32 | H-14 | |
| 92-33 | H-15 | |
| 92-34 | H-16 | |
| 92-35 | H-17 | |
| 92-36 | H-18 | |

-continued
Compound 93-X
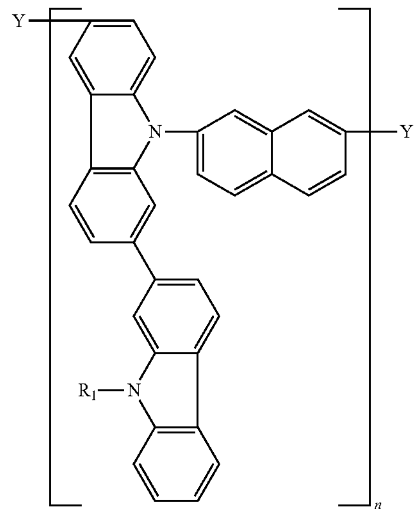
| Com. | R1 | Y |
|---|---|---|
| 93-1 | H-1 | H-29 |
| 93-2 | H-2 | |
| 93-3 | H-3 | |
| 93-4 | H-4 | |
| 93-5 | H-5 | |
| 93-6 | H-6 | |
| 93-7 | H-7 | |
| 93-8 | H-8 | |
| 93-9 | H-9 | |
| 93-10 | H-10 | |
| 93-11 | H-11 | |
| 93-12 | H-12 | |
| 93-13 | H-13 | |
| 93-14 | H-14 | |
| 93-15 | H-15 | |
| 93-16 | H-16 | |
| 93-17 | H-17 | |
| 93-18 | H-18 | |
| 93-19 | H-1 | H-30 |
| 93-20 | H-2 | |
| 93-21 | H-3 | |
| 93-22 | H-4 | |
| 93-23 | H-5 | |
| 93-24 | H-6 | |
| 93-25 | H-7 | |
| 93-26 | H-8 | |
| 93-27 | H-9 | |
| 93-28 | H-10 | |
| 93-29 | H-11 | |
| 93-30 | H-12 | |
| 93-31 | H-13 | |
| 93-32 | H-14 | |
| 93-33 | H-15 | |
| 93-34 | H-16 | |
| 93-35 | H-17 | |
| 93-36 | H-18 | |

-continued
Compound 94-X
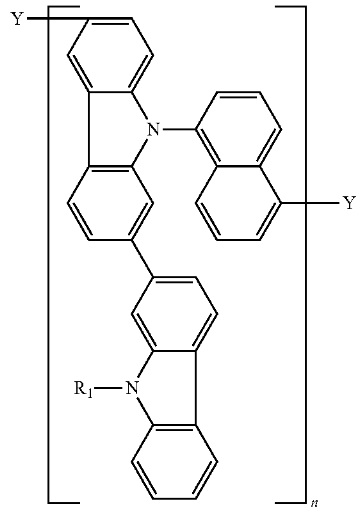
| Com. | R1 | Y |
|---|---|---|
| 94-1 | H-1 | H-29 |
| 94-2 | H-2 | |
| 94-3 | H-3 | |
| 94-4 | H-4 | |
| 94-5 | H-5 | |
| 94-6 | H-6 | |
| 94-7 | H-7 | |
| 94-8 | H-8 | |
| 94-9 | H-9 | |
| 94-10 | H-10 | |
| 94-11 | H-11 | |
| 94-12 | H-12 | |
| 94-13 | H-13 | |
| 94-14 | H-14 | |
| 94-15 | H-15 | |
| 94-16 | H-16 | |
| 94-17 | H-17 | |
| 94-18 | H-18 | |
| 94-19 | H-1 | H-30 |
| 94-20 | H-2 | |
| 94-21 | H-3 | |
| 94-22 | H-4 | |
| 94-23 | H-5 | |
| 94-24 | H-6 | |
| 94-25 | H-7 | |
| 94-26 | H-8 | |
| 94-27 | H-9 | |
| 94-28 | H-10 | |
| 94-29 | H-11 | |
| 94-30 | H-12 | |
| 94-31 | H-13 | |
| 94-32 | H-14 | |
| 94-33 | H-15 | |
| 94-34 | H-16 | |
| 94-35 | H-17 | |
| 94-36 | H-18 | |

-continued
Compound 95-X
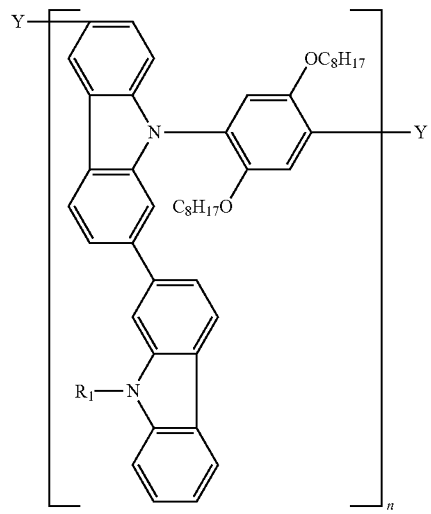
| Com. | R1 | Y |
|---|---|---|
| 95-1 | H-1 | H-29 |
| 95-2 | H-2 | |
| 95-3 | H-3 | |
| 95-4 | H-4 | |
| 95-5 | H-5 | |
| 95-6 | H-6 | |
| 95-7 | H-7 | |
| 95-8 | H-8 | |
| 95-9 | H-9 | |
| 95-10 | H-10 | |
| 95-11 | H-11 | |
| 95-12 | H-12 | |
| 95-13 | H-13 | |
| 95-14 | H-14 | |
| 95-15 | H-15 | |
| 95-16 | H-16 | |
| 95-17 | H-17 | |
| 95-18 | H-18 | |
| 95-19 | H-1 | H-30 |
| 95-20 | H-2 | |
| 95-21 | H-3 | |
| 95-22 | H-4 | |
| 95-23 | H-5 | |
| 95-24 | H-6 | |
| 95-25 | H-7 | |
| 95-26 | H-8 | |
| 95-27 | H-9 | |
| 95-28 | H-10 | |
| 95-29 | H-11 | |
| 95-30 | H-12 | |
| 95-31 | H-13 | |
| 95-32 | H-14 | |
| 95-33 | H-15 | |
| 95-34 | H-16 | |
| 95-35 | H-17 | |
| 95-36 | H-18 | |

-continued
Compound 96-X
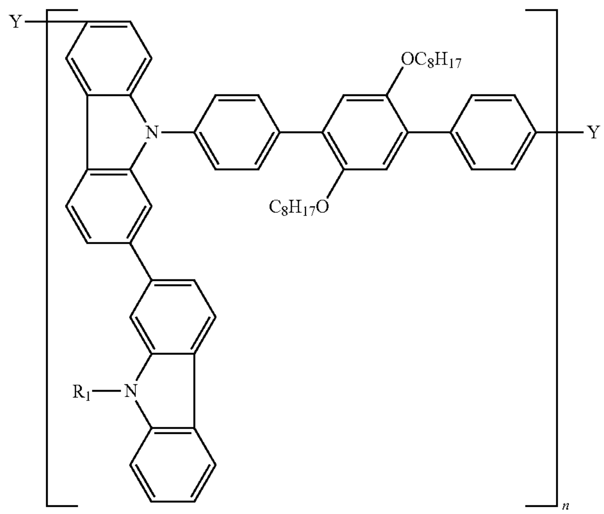
| Com. | R1 | Y |
|---|---|---|
| 96-1 | H-1 | H-29 |
| 96-2 | H-2 | |
| 96-3 | H-3 | |
| 96-4 | H-4 | |
| 96-5 | H-5 | |
| 96-6 | H-6 | |
| 96-7 | H-7 | |
| 96-8 | H-8 | |
| 96-9 | H-9 | |
| 96-10 | H-10 | |
| 96-11 | H-11 | |
| 96-12 | H-12 | |
| 96-13 | H-13 | |
| 96-14 | H-14 | |
| 96-15 | H-15 | |
| 96-16 | H-16 | |
| 96-17 | H-17 | |
| 96-18 | H-18 | |
| 96-19 | H-1 | H-30 |
| 96-20 | H-2 | |
| 96-21 | H-3 | |
| 96-22 | H-4 | |
| 96-23 | H-5 | |
| 96-24 | H-6 | |
| 96-25 | H-7 | |
| 96-26 | H-8 | |
| 96-27 | H-9 | |
| 96-28 | H-10 | |
| 96-29 | H-11 | |
| 96-30 | H-12 | |
| 96-31 | H-13 | |
| 96-32 | H-14 | |
| 96-33 | H-15 | |
| 96-34 | H-16 | |
| 96-35 | H-17 | |
| 96-36 | H-18 | |

-continued
Compound 97-X
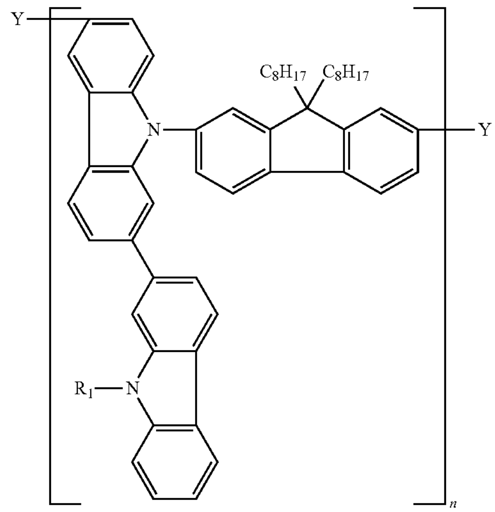
| Com. | R1 | Y |
|---|---|---|
| 97-1 | H-1 | H-29 |
| 97-2 | H-2 | |
| 97-3 | H-3 | |
| 97-4 | H-4 | |
| 97-5 | H-5 | |
| 97-6 | H-6 | |
| 97-7 | H-7 | |
| 97-8 | H-8 | |
| 97-9 | H-9 | |
| 97-10 | H-10 | |
| 97-11 | H-11 | |
| 97-12 | H-12 | |
| 97-13 | H-13 | |
| 97-14 | H-14 | |
| 97-15 | H-15 | |
| 97-16 | H-16 | |
| 97-17 | H-17 | |
| 97-18 | H-18 | |
| 97-19 | H-1 | H-30 |
| 97-20 | H-2 | |
| 97-21 | H-3 | |
| 97-22 | H-4 | |
| 97-23 | H-5 | |
| 97-24 | H-6 | |
| 97-25 | H-7 | |
| 97-26 | H-8 | |
| 97-27 | H-9 | |
| 97-28 | H-10 | |
| 97-29 | H-11 | |
| 97-30 | H-12 | |
| 97-31 | H-13 | |
| 97-32 | H-14 | |
| 97-33 | H-15 | |
| 97-34 | H-16 | |
| 97-35 | H-17 | |
| 97-36 | H-18 | |

-continued
Compound 98-X
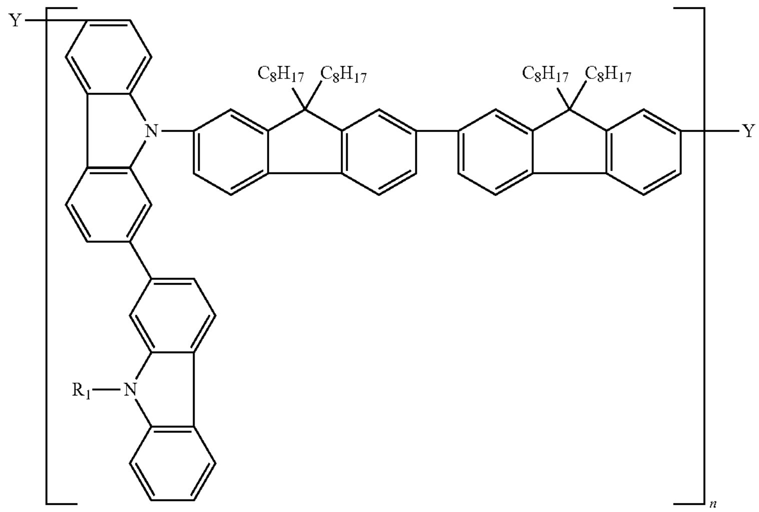
| Com. | R1 | Y |
|---|---|---|
| 98-1 | H-1 | H-29 |
| 98-2 | H-2 | |
| 98-3 | H-3 | |
| 98-4 | H-4 | |
| 98-5 | H-5 | |
| 98-6 | H-6 | |
| 98-7 | H-7 | |
| 98-8 | H-8 | |
| 98-9 | H-9 | |
| 98-10 | H-10 | |
| 98-11 | H-11 | |
| 98-12 | H-12 | |
| 98-13 | H-13 | |
| 98-14 | H-14 | |
| 98-15 | H-15 | |
| 98-16 | H-16 | |
| 98-17 | H-17 | |
| 98-18 | H-18 | |
| 98-19 | H-1 | H-30 |
| 98-20 | H-2 | |
| 98-21 | H-3 | |
| 98-22 | H-4 | |
| 98-23 | H-5 | |
| 98-24 | H-6 | |
| 98-25 | H-7 | |
| 98-26 | H-8 | |
| 98-27 | H-9 | |
| 98-28 | H-10 | |
| 98-29 | H-11 | |
| 98-30 | H-12 | |
| 98-31 | H-13 | |
| 98-32 | H-14 | |
| 98-33 | H-15 | |
| 98-34 | H-16 | |
| 98-35 | H-17 | |
| 98-36 | H-18 | |

-continued
Compound 99-X
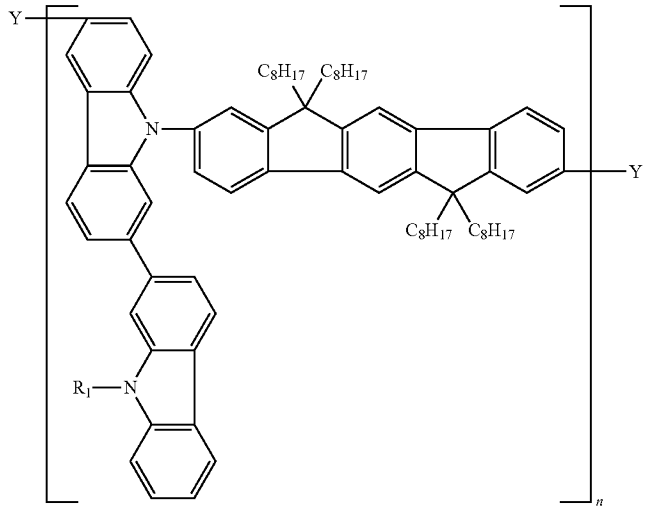
| Com. | R1 | Y |
|---|---|---|
| 99-1 | H-1 | H-29 |
| 99-2 | H-2 | |
| 99-3 | H-3 | |
| 99-4 | H-4 | |
| 99-5 | H-5 | |
| 99-6 | H-6 | |
| 99-7 | H-7 | |
| 99-8 | H-8 | |
| 99-9 | H-9 | |
| 99-10 | H-10 | |
| 99-11 | H-11 | |
| 99-12 | H-12 | |
| 99-13 | H-13 | |
| 99-14 | H-14 | |
| 99-15 | H-15 | |
| 99-16 | H-16 | |
| 99-17 | H-17 | |
| 99-18 | H-18 | |
| 99-19 | H-1 | H-30 |
| 99-20 | H-2 | |
| 99-21 | H-3 | |
| 99-22 | H-4 | |
| 99-23 | H-5 | |
| 99-24 | H-6 | |
| 99-25 | H-7 | |
| 99-26 | H-8 | |
| 99-27 | H-9 | |
| 99-28 | H-10 | |
| 99-29 | H-11 | |
| 99-30 | H-12 | |
| 99-31 | H-13 | |
| 99-32 | H-14 | |
| 99-33 | H-15 | |
| 99-34 | H-16 | |
| 99-35 | H-17 | |
| 99-36 | H-18 | |

-continued
Compound 100-X
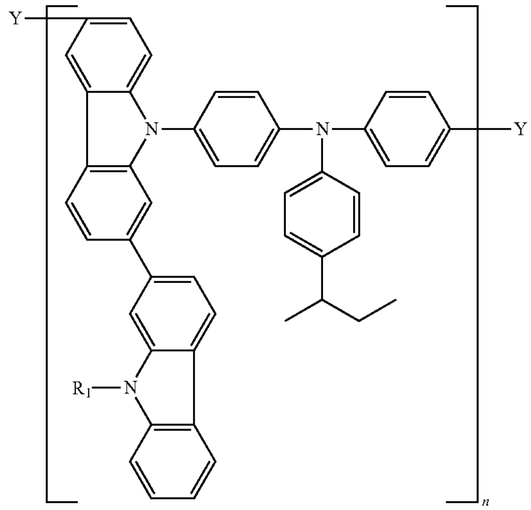
| Com. | R1 | Y |
|---|---|---|
| 100-1 | H-1 | H-29 |
| 100-2 | H-2 | |
| 100-3 | H-3 | |
| 100-4 | H-4 | |
| 100-5 | H-5 | |
| 100-6 | H-6 | |
| 100-7 | H-7 | |
| 100-8 | H-8 | |
| 100-9 | H-9 | |
| 100-10 | H-10 | |
| 100-11 | H-11 | |
| 100-12 | H-12 | |
| 100-13 | H-13 | |
| 100-14 | H-14 | |
| 100-15 | H-15 | |
| 100-16 | H-16 | |
| 100-17 | H-17 | |
| 100-18 | H-18 | |
| 100-19 | H-1 | H-30 |
| 100-20 | H-2 | |
| 100-21 | H-3 | |
| 100-22 | H-4 | |
| 100-23 | H-5 | |
| 100-24 | H-6 | |
| 100-25 | H-7 | |
| 100-26 | H-8 | |
| 100-27 | H-9 | |
| 100-28 | H-10 | |
| 100-29 | H-11 | |
| 100-30 | H-12 | |
| 100-31 | H-13 | |
| 100-32 | H-14 | |
| 100-33 | H-15 | |
| 100-34 | H-16 | |
| 100-35 | H-17 | |
| 100-36 | H-18 | |
Compound 101-X
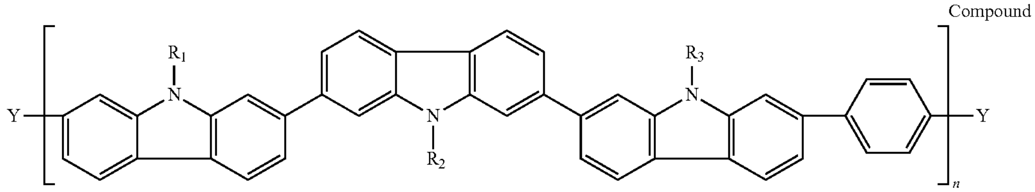
| Com. | R1 = R2 = R3 | Y |
|---|---|---|
| 101-1 | H-1 | H-29 |
| 101-2 | H-2 | |
| 101-3 | H-3 | |

-continued

| | | |
|---|---|---|
| 101-4 | H-4 | |
| 101-5 | H-5 | |
| 101-6 | H-6 | |
| 101-7 | H-7 | |
| 101-8 | H-8 | |
| 101-9 | H-9 | |
| 101-10 | H-10 | |
| 101-11 | H-11 | |
| 101-12 | H-12 | |
| 101-13 | H-13 | |
| 101-14 | H-14 | |
| 101-15 | H-15 | |
| 101-16 | H-16 | |
| 101-17 | H-17 | |
| 101-18 | H-18 | |
| 101-19 | H-1 | H-30 |
| 101-20 | H-2 | |
| 101-21 | H-3 | |
| 101-22 | H-4 | |
| 101-23 | H-5 | |
| 101-24 | H-6 | |
| 101-25 | H-7 | |
| 101-26 | H-8 | |
| 101-27 | H-9 | |
| 101-28 | H-10 | |
| 101-29 | H-11 | |
| 101-30 | H-12 | |
| 101-31 | H-13 | |
| 101-32 | H-14 | |
| 101-33 | H-15 | |
| 101-34 | H-16 | |
| 101-35 | H-17 | |
| 101-36 | H-18 | |

| Com. | R1 = R3 | R2 | Y |
|---|---|---|---|
| 101-37 | H-1 | H-1 | H-29 |
| 101-38 | H-2 | | |
| 101-39 | H-3 | | |
| 101-40 | H-4 | | |
| 101-41 | H-5 | | |
| 101-42 | H-6 | | |
| 101-43 | H-7 | | |
| 101-44 | H-8 | | |
| 101-45 | H-9 | | |
| 101-46 | H-10 | | |
| 101-47 | H-11 | | |
| 101-48 | H-12 | | |
| 101-49 | H-13 | | |
| 101-50 | H-14 | | |
| 101-51 | H-15 | | |
| 101-52 | H-16 | | |
| 101-53 | H-17 | | |
| 101-54 | H-18 | | |
| 101-55 | H-1 | H-1 | H-30 |
| 101-56 | H-2 | | |
| 101-57 | H-3 | | |
| 101-58 | H-4 | | |
| 101-59 | H-5 | | |
| 101-60 | H-6 | | |
| 101-61 | H-7 | | |
| 101-62 | H-8 | | |
| 101-63 | H-9 | | |
| 101-64 | H-10 | | |
| 101-65 | H-11 | | |
| 101-66 | H-12 | | |
| 101-67 | H-13 | | |
| 101-68 | H-14 | | |
| 101-69 | H-15 | | |
| 101-70 | H-16 | | |
| 101-71 | H-17 | | |
| 101-72 | H-18 | | |

-continued
Compound 102-X
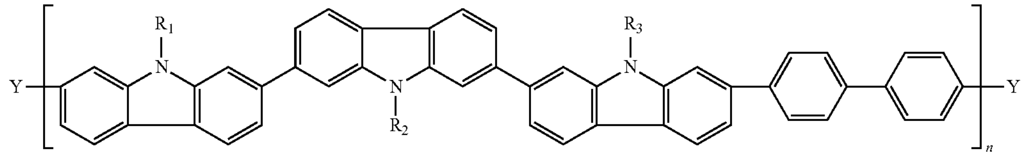
| Com. | R1 = R2 = R3 | Y |
|---|---|---|
| 102-1 | H-1 | H-29 |
| 102-2 | H-2 | |
| 102-3 | H-3 | |
| 102-4 | H-4 | |
| 102-5 | H-5 | |
| 102-6 | H-6 | |
| 102-7 | H-7 | |
| 102-8 | H-8 | |
| 102-9 | H-9 | |
| 102-10 | H-10 | |
| 102-11 | H-11 | |
| 102-12 | H-12 | |
| 102-13 | H-13 | |
| 102-14 | H-14 | |
| 102-15 | H-15 | |
| 102-16 | H-16 | |
| 102-17 | H-17 | |
| 102-18 | H-18 | |
| 102-19 | H-1 | H-30 |
| 102-20 | H-2 | |
| 102-21 | H-3 | |
| 102-22 | H-4 | |
| 102-23 | H-5 | |
| 102-24 | H-6 | |
| 102-25 | H-7 | |
| 102-26 | H-8 | |
| 102-27 | H-9 | |
| 102-28 | H-10 | |
| 102-29 | H-11 | |
| 102-30 | H-12 | |
| 102-31 | H-13 | |
| 102-32 | H-14 | |
| 102-33 | H-15 | |
| 102-34 | H-16 | |
| 102-35 | H-17 | |
| 102-36 | H-18 | |
| Com. | R1 = R3 | R2 | Y |
|---|---|---|---|
| 102-37 | H-1 | H-1 | H-29 |
| 102-38 | H-2 | | |
| 102-39 | H-3 | | |
| 102-40 | H-4 | | |
| 102-41 | H-5 | | |
| 102-42 | H-6 | | |
| 102-43 | H-7 | | |
| 102-44 | H-8 | | |
| 102-45 | H-9 | | |
| 102-46 | H-10 | | |
| 102-47 | H-11 | | |
| 102-48 | H-12 | | |
| 102-49 | H-13 | | |
| 102-50 | H-14 | | |
| 102-51 | H-15 | | |
| 102-52 | H-16 | | |
| 102-53 | H-17 | | |
| 102-54 | H-18 | | |
| 102-55 | H-1 | H-1 | H-30 |
| 102-56 | H-2 | | |
| 102-57 | H-3 | | |
| 102-58 | H-4 | | |
| 102-59 | H-5 | | |
| 102-60 | H-6 | | |
| 102-61 | H-7 | | |
| 102-62 | H-8 | | |
| 102-63 | H-9 | | |
| 102-64 | H-10 | | |
| 102-65 | H-11 | | |

-continued
| | |
|---|---|
| 102-66 | H-12 |
| 102-67 | H-13 |
| 102-68 | H-14 |
| 102-69 | H-15 |
| 102-70 | H-16 |
| 102-71 | H-17 |
| 102-72 | H-18 |
Compound 103-X
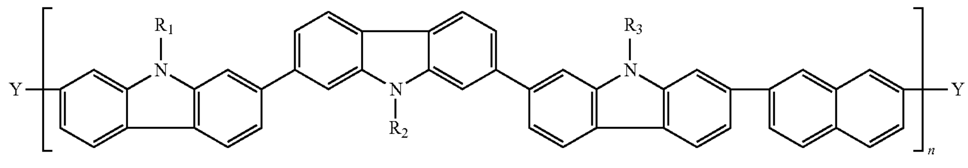
| Com. | R1 = R2 = R3 | Y |
|---|---|---|
| 103-1 | H-1 | H-29 |
| 103-2 | H-2 | |
| 103-3 | H-3 | |
| 103-4 | H-4 | |
| 103-5 | H-5 | |
| 103-6 | H-6 | |
| 103-7 | H-7 | |
| 103-8 | H-8 | |
| 103-9 | H-9 | |
| 103-10 | H-10 | |
| 103-11 | H-11 | |
| 103-12 | H-12 | |
| 103-13 | H-13 | |
| 103-14 | H-14 | |
| 103-15 | H-15 | |
| 103-16 | H-16 | |
| 103-17 | H-17 | |
| 103-18 | H-18 | |
| 103-19 | H-1 | H-30 |
| 103-20 | H-2 | |
| 103-21 | H-3 | |
| 103-22 | H-4 | |
| 103-23 | H-5 | |
| 103-24 | H-6 | |
| 103-25 | H-7 | |
| 103-26 | H-8 | |
| 103-27 | H-9 | |
| 103-28 | H-10 | |
| 103-29 | H-11 | |
| 103-30 | H-12 | |
| 103-31 | H-13 | |
| 103-32 | H-14 | |
| 103-33 | H-15 | |
| 103-34 | H-16 | |
| 103-35 | H-17 | |
| 103-36 | H-18 | |
| Com. | R1 = R3 | R2 | Y |
|---|---|---|---|
| 103-37 | H-1 | H-1 | H-29 |
| 103-38 | H-2 | | |
| 103-39 | H-3 | | |
| 103-40 | H-4 | | |
| 103-41 | H-5 | | |
| 103-42 | H-6 | | |
| 103-43 | H-7 | | |
| 103-44 | H-8 | | |
| 103-45 | H-9 | | |
| 103-46 | H-10 | | |
| 103-47 | H-11 | | |
| 103-48 | H-12 | | |
| 103-49 | H-13 | | |
| 103-50 | H-14 | | |
| 103-51 | H-15 | | |
| 103-52 | H-16 | | |
| 103-53 | H-17 | | |
| 103-54 | H-18 | | |
| 103-55 | H-1 | H-1 | H-30 |
| 103-56 | H-2 | | |
| 103-57 | H-3 | | |

-continued
| | |
|---|---|
| 103-58 | H-4 |
| 103-59 | H-5 |
| 103-60 | H-6 |
| 103-61 | H-7 |
| 103-62 | H-8 |
| 103-63 | H-9 |
| 103-64 | H-10 |
| 103-65 | H-11 |
| 103-66 | H-12 |
| 103-67 | H-13 |
| 103-68 | H-14 |
| 103-69 | H-15 |
| 103-70 | H-16 |
| 103-71 | H-17 |
| 103-72 | H-18 |
Compound 104-X
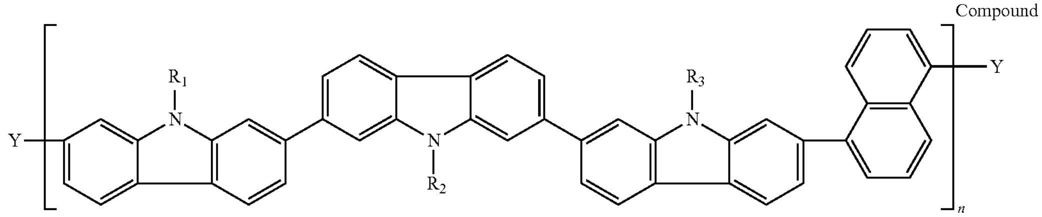
| Com. | R1 = R2 = R3 | Y |
|---|---|---|
| 104-1 | H-1 | H-29 |
| 104-2 | H-2 | |
| 104-3 | H-3 | |
| 104-4 | H-4 | |
| 104-5 | H-5 | |
| 104-6 | H-6 | |
| 104-7 | H-7 | |
| 104-8 | H-8 | |
| 104-9 | H-9 | |
| 104-10 | H-10 | |
| 104-11 | H-11 | |
| 104-12 | H-12 | |
| 104-13 | H-13 | |
| 104-14 | H-14 | |
| 104-15 | H-15 | |
| 104-16 | H-16 | |
| 104-17 | H-17 | |
| 104-18 | H-18 | |
| 104-19 | H-1 | H-30 |
| 104-20 | H-2 | |
| 104-21 | H-3 | |
| 104-22 | H-4 | |
| 104-23 | H-5 | |
| 104-24 | H-6 | |
| 104-25 | H-7 | |
| 104-26 | H-8 | |
| 104-27 | H-9 | |
| 104-28 | H-10 | |
| 104-29 | H-11 | |
| 104-30 | H-12 | |
| 104-31 | H-13 | |
| 104-32 | H-14 | |
| 104-33 | H-15 | |
| 104-34 | H-16 | |
| 104-35 | H-17 | |
| 104-36 | H-18 | |
| Com. | R1 = R3 | R2 | Y |
|---|---|---|---|
| 104-37 | H-1 | H-1 | H-29 |
| 104-38 | H-2 | | |
| 104-39 | H-3 | | |
| 104-40 | H-4 | | |
| 104-41 | H-5 | | |
| 104-42 | H-6 | | |
| 104-43 | H-7 | | |
| 104-44 | H-8 | | |
| 104-45 | H-9 | | |
| 104-46 | H-10 | | |
| 104-47 | H-11 | | |

-continued
| | | | |
|---|---|---|---|
| 104-48 | H-12 | | |
| 104-49 | H-13 | | |
| 104-50 | H-14 | | |
| 104-51 | H-15 | | |
| 104-52 | H-16 | | |
| 104-53 | H-17 | | |
| 104-54 | H-18 | | |
| 104-55 | H-1 | H-1 | H-30 |
| 104-56 | H-2 | | |
| 104-57 | H-3 | | |
| 104-58 | H-4 | | |
| 104-59 | H-5 | | |
| 104-60 | H-6 | | |
| 104-61 | H-7 | | |
| 104-62 | H-8 | | |
| 104-63 | H-9 | | |
| 104-64 | H-10 | | |
| 104-65 | H-11 | | |
| 104-66 | H-12 | | |
| 104-67 | H-13 | | |
| 104-68 | H-14 | | |
| 104-69 | H-15 | | |
| 104-70 | H-16 | | |
| 104-71 | H-17 | | |
| 104-72 | H-18 | | |
Compound 105-X
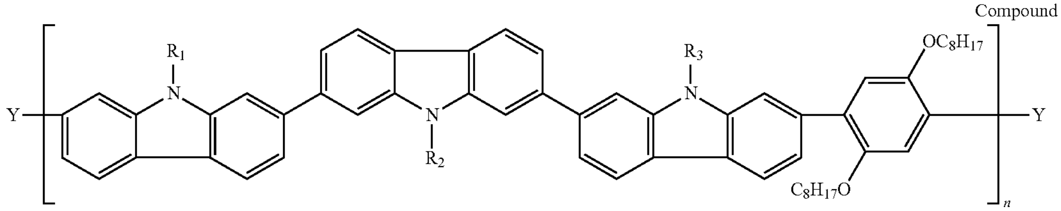
| Com. | R1 = R2 = R3 | Y |
|---|---|---|
| 105-1 | H-1 | H-29 |
| 105-2 | H-2 | |
| 105-3 | H-3 | |
| 105-4 | H-4 | |
| 105-5 | H-5 | |
| 105-6 | H-6 | |
| 105-7 | H-7 | |
| 105-8 | H-8 | |
| 105-9 | H-9 | |
| 105-10 | H-10 | |
| 105-11 | H-11 | |
| 105-12 | H-12 | |
| 105-13 | H-13 | |
| 105-14 | H-14 | |
| 105-15 | H-15 | |
| 105-16 | H-16 | |
| 105-17 | H-17 | |
| 105-18 | H-18 | |
| 105-19 | H-1 | H-30 |
| 105-20 | H-2 | |
| 105-21 | H-3 | |
| 105-22 | H-4 | |
| 105-23 | H-5 | |
| 105-24 | H-6 | |
| 105-25 | H-7 | |
| 105-26 | H-8 | |
| 105-27 | H-9 | |
| 105-28 | H-10 | |
| 105-29 | H-11 | |
| 105-30 | H-12 | |
| 105-31 | H-13 | |
| 105-32 | H-14 | |
| 105-33 | H-15 | |
| 105-34 | H-16 | |
| 105-35 | H-17 | |
| 105-36 | H-18 | |
| Com. | R1 = R3 | R2 | Y |
|---|---|---|---|
| 105-37 | H-1 | H-1 | H-29 |
| 105-38 | H-2 | | |

-continued
| | | | |
|---|---|---|---|
| 105-39 | H-3 | | |
| 105-40 | H-4 | | |
| 105-41 | H-5 | | |
| 105-42 | H-6 | | |
| 105-43 | H-7 | | |
| 105-44 | H-8 | | |
| 105-45 | H-9 | | |
| 105-46 | H-10 | | |
| 105-47 | H-11 | | |
| 105-48 | H-12 | | |
| 105-49 | H-13 | | |
| 105-50 | H-14 | | |
| 105-51 | H-15 | | |
| 105-52 | H-16 | | |
| 105-53 | H-17 | | |
| 105-54 | H-18 | | |
| 105-55 | H-1 | H-1 | H-30 |
| 105-56 | H-2 | | |
| 105-57 | H-3 | | |
| 105-58 | H-4 | | |
| 105-59 | H-5 | | |
| 105-60 | H-6 | | |
| 105-61 | H-7 | | |
| 105-62 | H-8 | | |
| 105-63 | H-9 | | |
| 105-64 | H-10 | | |
| 105-65 | H-11 | | |
| 105-66 | H-12 | | |
| 105-67 | H-13 | | |
| 105-68 | H-14 | | |
| 105-69 | H-15 | | |
| 105-70 | H-16 | | |
| 105-71 | H-17 | | |
| 105-72 | H-18 | | |
Compound 106-X
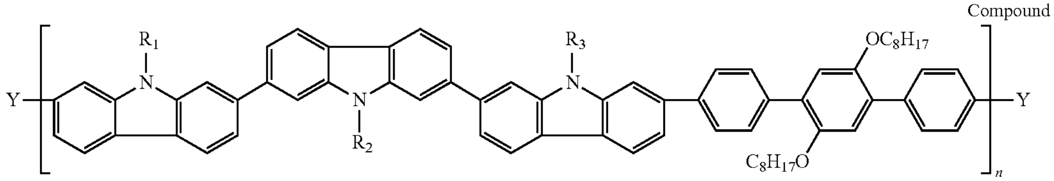
| Com. | R1 = R2 = R3 | Y |
|---|---|---|
| 106-1 | H-1 | H-29 |
| 106-2 | H-2 | |
| 106-3 | H-3 | |
| 106-4 | H-4 | |
| 106-5 | H-5 | |
| 106-6 | H-6 | |
| 106-7 | H-7 | |
| 106-8 | H-8 | |
| 106-9 | H-9 | |
| 106-10 | H-10 | |
| 106-11 | H-11 | |
| 106-12 | H-12 | |
| 106-13 | H-13 | |
| 106-14 | H-14 | |
| 106-15 | H-15 | |
| 106-16 | H-16 | |
| 106-17 | H-17 | |
| 106-18 | H-18 | |
| 106-19 | H-1 | H-30 |
| 106-20 | H-2 | |
| 106-21 | H-3 | |
| 106-22 | H-4 | |
| 106-23 | H-5 | |
| 106-24 | H-6 | |
| 106-25 | H-7 | |
| 106-26 | H-8 | |
| 106-27 | H-9 | |
| 106-28 | H-10 | |
| 106-29 | H-11 | |
| 106-30 | H-12 | |
| 106-31 | H-13 | |
| 106-32 | H-14 | |
| 106-33 | H-15 | |

-continued
| | | | |
|---|---|---|---|
| 106-34 | H-16 | | |
| 106-35 | H-17 | | |
| 106-36 | H-18 | | |
| Com. | R1 = R3 | R2 | Y |
|---|---|---|---|
| 106-37 | H-1 | H-1 | H-29 |
| 106-38 | H-2 | | |
| 106-39 | H-3 | | |
| 106-40 | H-4 | | |
| 106-41 | H-5 | | |
| 106-42 | H-6 | | |
| 106-43 | H-7 | | |
| 106-44 | H-8 | | |
| 106-45 | H-9 | | |
| 106-46 | H-10 | | |
| 106-47 | H-11 | | |
| 106-48 | H-12 | | |
| 106-49 | H-13 | | |
| 106-50 | H-14 | | |
| 106-51 | H-15 | | |
| 106-52 | H-16 | | |
| 106-53 | H-17 | | |
| 106-54 | H-18 | | |
| 106-55 | H-1 | H-1 | H-30 |
| 106-56 | H-2 | | |
| 106-57 | H-3 | | |
| 106-58 | H-4 | | |
| 106-59 | H-5 | | |
| 106-60 | H-6 | | |
| 106-61 | H-7 | | |
| 106-62 | H-8 | | |
| 106-63 | H-9 | | |
| 106-64 | H-10 | | |
| 106-65 | H-11 | | |
| 106-66 | H-12 | | |
| 106-67 | H-13 | | |
| 106-68 | H-14 | | |
| 106-69 | H-15 | | |
| 106-70 | H-16 | | |
| 106-71 | H-17 | | |
| 106-72 | H-18 | | |
Compound 107-X
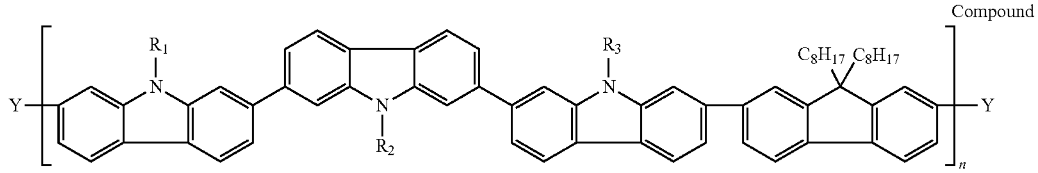
| Com. | R1 = R2 = R3 | Y |
|---|---|---|
| 107-1 | H-1 | H-29 |
| 107-2 | H-2 | |
| 107-3 | H-3 | |
| 107-4 | H-4 | |
| 107-5 | H-5 | |
| 107-6 | H-6 | |
| 107-7 | H-7 | |
| 107-8 | H-8 | |
| 107-9 | H-9 | |
| 107-10 | H-10 | |
| 107-11 | H-11 | |
| 107-12 | H-12 | |
| 107-13 | H-13 | |
| 107-14 | H-14 | |
| 107-15 | H-15 | |
| 107-16 | H-16 | |
| 107-17 | H-17 | |
| 107-18 | H-18 | |
| 107-19 | H-1 | H-30 |
| 107-20 | H-2 | |
| 107-21 | H-3 | |
| 107-22 | H-4 | |
| 107-23 | H-5 | |
| 107-24 | H-6 | |
| 107-25 | H-7 | |

-continued
| | | | |
|---|---|---|---|
| 107-26 | H-8 | | |
| 107-27 | H-9 | | |
| 107-28 | H-10 | | |
| 107-29 | H-11 | | |
| 107-30 | H-12 | | |
| 107-31 | H-13 | | |
| 107-32 | H-14 | | |
| 107-33 | H-15 | | |
| 107-34 | H-16 | | |
| 107-35 | H-17 | | |
| 107-36 | H-18 | | |
| Com. | R1 = R3 | R2 | Y |
|---|---|---|---|
| 107-37 | H-1 | H-1 | H-29 |
| 107-38 | H-2 | | |
| 107-39 | H-3 | | |
| 107-40 | H-4 | | |
| 107-41 | H-5 | | |
| 107-42 | H-6 | | |
| 107-43 | H-7 | | |
| 107-44 | H-8 | | |
| 107-45 | H-9 | | |
| 107-46 | H-10 | | |
| 107-47 | H-11 | | |
| 107-48 | H-12 | | |
| 107-49 | H-13 | | |
| 107-50 | H-14 | | |
| 107-51 | H-15 | | |
| 107-52 | H-16 | | |
| 107-53 | H-17 | | |
| 107-54 | H-18 | | |
| 107-55 | H-1 | H-1 | H-30 |
| 107-56 | H-2 | | |
| 107-57 | H-3 | | |
| 107-58 | H-4 | | |
| 107-59 | H-5 | | |
| 107-60 | H-6 | | |
| 107-61 | H-7 | | |
| 107-62 | H-8 | | |
| 107-63 | H-9 | | |
| 107-64 | H-10 | | |
| 107-65 | H-11 | | |
| 107-66 | H-12 | | |
| 107-67 | H-13 | | |
| 107-68 | H-14 | | |
| 107-69 | H-15 | | |
| 107-70 | H-16 | | |
| 107-71 | H-17 | | |
| 107-72 | H-18 | | |
Compound 108-X
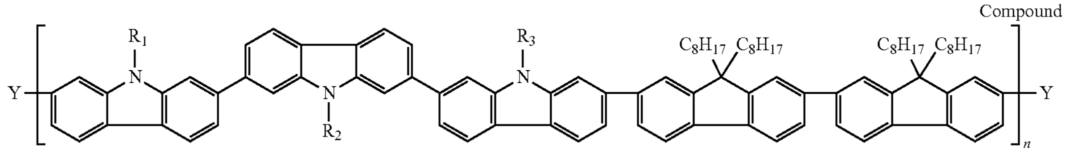
| Com. | R1 = R2 = R3 | Y |
|---|---|---|
| 108-1 | H-1 | H-29 |
| 108-2 | H-2 | |
| 108-3 | H-3 | |
| 108-4 | H-4 | |
| 108-5 | H-5 | |
| 108-6 | H-6 | |
| 108-7 | H-7 | |
| 108-8 | H-8 | |
| 108-9 | H-9 | |
| 108-10 | H-10 | |
| 108-11 | H-11 | |
| 108-12 | H-12 | |
| 108-13 | H-13 | |
| 108-14 | H-14 | |
| 108-15 | H-15 | |
| 108-16 | H-16 | |
| 108-17 | H-17 | |
| 108-18 | H-18 | |

-continued
| | | |
|---|---|---|
| 108-19 | H-1 | H-30 |
| 108-20 | H-2 | |
| 108-21 | H-3 | |
| 108-22 | H-4 | |
| 108-23 | H-5 | |
| 108-24 | H-6 | |
| 108-25 | H-7 | |
| 108-26 | H-8 | |
| 108-27 | H-9 | |
| 108-28 | H-10 | |
| 108-29 | H-11 | |
| 108-30 | H-12 | |
| 108-31 | H-13 | |
| 108-32 | H-14 | |
| 108-33 | H-15 | |
| 108-34 | H-16 | |
| 108-35 | H-17 | |
| 108-36 | H-18 | |
| Com. | R1 = R3 | R2 | Y |
|---|---|---|---|
| 108-37 | H-1 | H-1 | H-29 |
| 108-38 | H-2 | | |
| 108-39 | H-3 | | |
| 108-40 | H-4 | | |
| 108-41 | H-5 | | |
| 108-42 | H-6 | | |
| 108-43 | H-7 | | |
| 108-44 | H-8 | | |
| 108-45 | H-9 | | |
| 108-46 | H-10 | | |
| 108-47 | H-11 | | |
| 108-48 | H-12 | | |
| 108-49 | H-13 | | |
| 108-50 | H-14 | | |
| 108-51 | H-15 | | |
| 108-52 | H-16 | | |
| 108-53 | H-17 | | |
| 108-54 | H-18 | | |
| 108-55 | H-1 | H-1 | H-30 |
| 108-56 | H-2 | | |
| 108-57 | H-3 | | |
| 108-58 | H-4 | | |
| 108-59 | H-5 | | |
| 108-60 | H-6 | | |
| 108-61 | H-7 | | |
| 108-62 | H-8 | | |
| 108-63 | H-9 | | |
| 108-64 | H-10 | | |
| 108-65 | H-11 | | |
| 108-66 | H-12 | | |
| 108-67 | H-13 | | |
| 108-68 | H-14 | | |
| 108-69 | H-15 | | |
| 108-70 | H-16 | | |
| 108-71 | H-17 | | |
| 108-72 | H-18 | | |
Compound 109-X
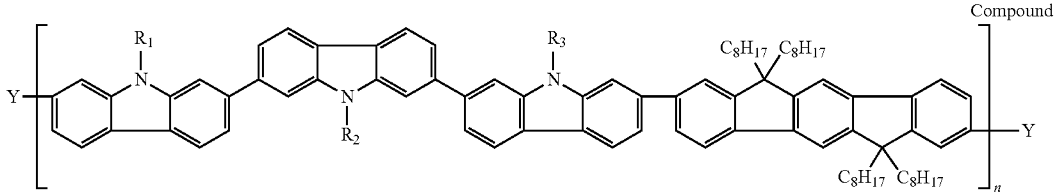
| Com. | R1 = R2 = R3 | Y |
|---|---|---|
| 109-1 | H-1 | H-29 |
| 109-2 | H-2 | |
| 109-3 | H-3 | |
| 109-4 | H-4 | |
| 109-5 | H-5 | |
| 109-6 | H-6 | |
| 109-7 | H-7 | |
| 109-8 | H-8 | |
| 109-9 | H-9 | |

-continued

| | | |
|---|---|---|
| 109-10 | H-10 | |
| 109-11 | H-11 | |
| 109-12 | H-12 | |
| 109-13 | H-13 | |
| 109-14 | H-14 | |
| 109-15 | H-15 | |
| 109-16 | H-16 | |
| 109-17 | H-17 | |
| 109-18 | H-18 | |
| 109-19 | H-1 | H-30 |
| 109-20 | H-2 | |
| 109-21 | H-3 | |
| 109-22 | H-4 | |
| 109-23 | H-5 | |
| 109-24 | H-6 | |
| 109-25 | H-7 | |
| 109-26 | H-8 | |
| 109-27 | H-9 | |
| 109-28 | H-10 | |
| 109-29 | H-11 | |
| 109-30 | H-12 | |
| 109-31 | H-13 | |
| 109-32 | H-14 | |
| 109-33 | H-15 | |
| 109-34 | H-16 | |
| 109-35 | H-17 | |
| 109-36 | H-18 | |

| Com. | R1 = R3 | R2 | Y |
|---|---|---|---|
| 109-37 | H-1 | H-1 | H-29 |
| 109-38 | H-2 | | |
| 109-39 | H-3 | | |
| 109-40 | H-4 | | |
| 109-41 | H-5 | | |
| 109-42 | H-6 | | |
| 109-43 | H-7 | | |
| 109-44 | H-8 | | |
| 109-45 | H-9 | | |
| 109-46 | H-10 | | |
| 109-47 | H-11 | | |
| 109-48 | H-12 | | |
| 109-49 | H-13 | | |
| 109-50 | H-14 | | |
| 109-51 | H-15 | | |
| 109-52 | H-16 | | |
| 109-53 | H-17 | | |
| 109-54 | H-18 | | |
| 109-55 | H-1 | H-1 | H-30 |
| 109-56 | H-2 | | |
| 109-57 | H-3 | | |
| 109-58 | H-4 | | |
| 109-59 | H-5 | | |
| 109-60 | H-6 | | |
| 109-61 | H-7 | | |
| 109-62 | H-8 | | |
| 109-63 | H-9 | | |
| 109-64 | H-10 | | |
| 109-65 | H-11 | | |
| 109-66 | H-12 | | |
| 109-67 | H-13 | | |
| 109-68 | H-14 | | |
| 109-69 | H-15 | | |
| 109-70 | H-16 | | |
| 109-71 | H-17 | | |
| 109-72 | H-18 | | |

-continued
Compound 110-X
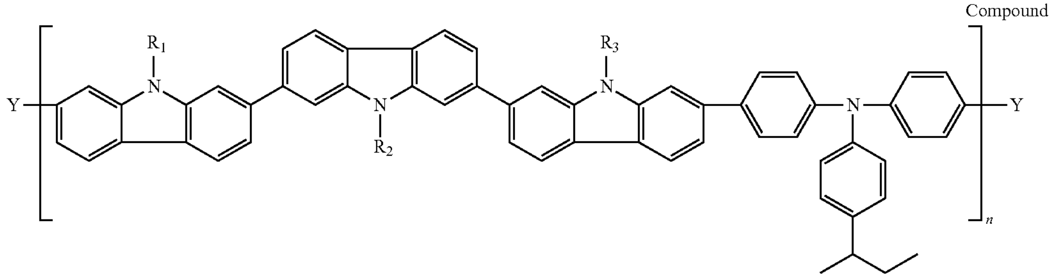
| Com. | R1 = R2 = R3 | Y |
|---|---|---|
| 110-1 | H-1 | H-29 |
| 110-2 | H-2 | |
| 110-3 | H-3 | |
| 110-4 | H-4 | |
| 110-5 | H-5 | |
| 110-6 | H-6 | |
| 110-7 | H-7 | |
| 110-8 | H-8 | |
| 110-9 | H-9 | |
| 110-10 | H-10 | |
| 110-11 | H-11 | |
| 110-12 | H-12 | |
| 110-13 | H-13 | |
| 110-14 | H-14 | |
| 110-15 | H-15 | |
| 110-16 | H-16 | |
| 110-17 | H-17 | |
| 110-18 | H-18 | |
| 110-19 | H-1 | H-30 |
| 110-20 | H-2 | |
| 110-21 | H-3 | |
| 110-22 | H-4 | |
| 110-23 | H-5 | |
| 110-24 | H-6 | |
| 110-25 | H-7 | |
| 110-26 | H-8 | |
| 110-27 | H-9 | |
| 110-28 | H-10 | |
| 110-29 | H-11 | |
| 110-30 | H-12 | |
| 110-31 | H-13 | |
| 110-32 | H-14 | |
| 110-33 | H-15 | |
| 110-34 | H-16 | |
| 110-35 | H-17 | |
| 110-36 | H-18 | |
| Com. | R1 = R3 | R2 | Y |
|---|---|---|---|
| 110-37 | H-1 | H-1 | H-29 |
| 110-38 | H-2 | | |
| 110-39 | H-3 | | |
| 110-40 | H-4 | | |
| 110-41 | H-5 | | |
| 110-42 | H-6 | | |
| 110-43 | H-7 | | |
| 110-44 | H-8 | | |
| 110-45 | H-9 | | |
| 110-46 | H-10 | | |
| 110-47 | H-11 | | |
| 110-48 | H-12 | | |
| 110-49 | H-13 | | |
| 110-50 | H-14 | | |
| 110-51 | H-15 | | |
| 110-52 | H-16 | | |
| 110-53 | H-17 | | |
| 110-54 | H-18 | | |
| 110-55 | H-1 | H-1 | H-30 |
| 110-56 | H-2 | | |
| 110-57 | H-3 | | |
| 110-58 | H-4 | | |
| 110-59 | H-5 | | |
| 110-60 | H-6 | | |

-continued
| | |
|---|---|
| 110-61 | H-7 |
| 110-62 | H-8 |
| 110-63 | H-9 |
| 110-64 | H-10 |
| 110-65 | H-11 |
| 110-66 | H-12 |
| 110-67 | H-13 |
| 110-68 | H-14 |
| 110-69 | H-15 |
| 110-70 | H-16 |
| 110-71 | H-17 |
| 110-72 | H-18 |
Compound 111-X
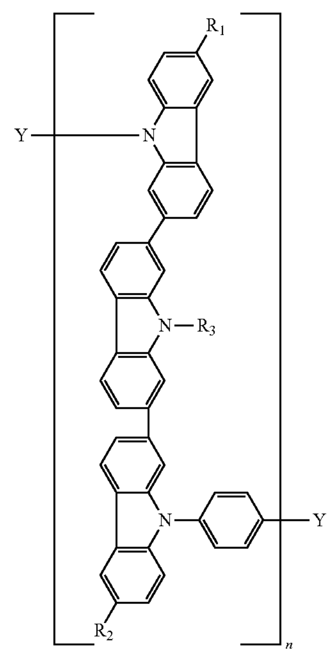
| Com. | R1 = R2 = R3 | Y |
|---|---|---|
| 111-1 | H-1 | H-29 |
| 111-2 | H-2 | |
| 111-3 | H-3 | |
| 111-4 | H-4 | |
| 111-5 | H-5 | |
| 111-6 | H-6 | |
| 111-7 | H-7 | |
| 111-8 | H-8 | |
| 111-9 | H-9 | |
| 111-10 | H-10 | |
| 111-11 | H-11 | |
| 111-12 | H-12 | |
| 111-13 | H-13 | |
| 111-14 | H-14 | |
| 111-15 | H-15 | |
| 111-16 | H-16 | |
| 111-17 | H-17 | |
| 111-18 | H-18 | |

-continued

| | | |
|---|---|---|
| 111-19 | H-1 | H-30 |
| 111-20 | H-2 | |
| 111-21 | H-3 | |
| 111-22 | H-4 | |
| 111-23 | H-5 | |
| 111-24 | H-6 | |
| 111-25 | H-7 | |
| 111-26 | H-8 | |
| 111-27 | H-9 | |
| 111-28 | H-10 | |
| 111-29 | H-11 | |
| 111-30 | H-12 | |
| 111-31 | H-13 | |
| 111-32 | H-14 | |
| 111-33 | H-15 | |
| 111-34 | H-16 | |
| 111-35 | H-17 | |
| 111-36 | H-18 | |

| Com. | R1 = R2 | R3 | Y |
|---|---|---|---|
| 111-37 | H-1 | H-1 | H-29 |
| 111-38 | H-2 | | |
| 111-39 | H-3 | | |
| 111-40 | H-4 | | |
| 111-41 | H-5 | | |
| 111-42 | H-6 | | |
| 111-43 | H-7 | | |
| 111-44 | H-8 | | |
| 111-45 | H-9 | | |
| 111-46 | H-10 | | |
| 111-47 | H-11 | | |
| 111-48 | H-12 | | |
| 111-49 | H-13 | | |
| 111-50 | H-14 | | |
| 111-51 | H-15 | | |
| 111-52 | H-16 | | |
| 111-53 | H-17 | | |
| 111-54 | H-18 | | |
| 111-55 | H-1 | H-1 | H-30 |
| 111-56 | H-2 | | |
| 111-57 | H-3 | | |
| 111-58 | H-4 | | |
| 111-59 | H-5 | | |
| 111-60 | H-6 | | |
| 111-61 | H-7 | | |
| 111-62 | H-8 | | |
| 111-63 | H-9 | | |
| 111-64 | H-10 | | |
| 111-65 | H-11 | | |
| 111-66 | H-12 | | |
| 111-67 | H-13 | | |
| 111-68 | H-14 | | |
| 111-69 | H-15 | | |
| 111-70 | H-16 | | |
| 111-71 | H-17 | | |
| 111-72 | H-18 | | |

-continued
Compound 112-X
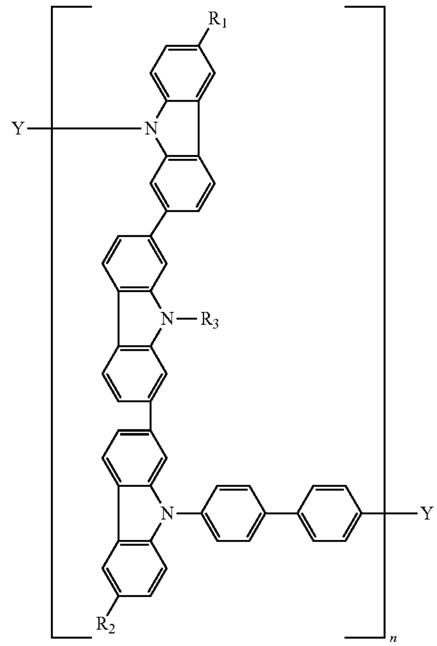
| Com. | R1 = R2 = R3 | Y |
|---|---|---|
| 112-1 | H-1 | H-29 |
| 112-2 | H-2 | |
| 112-3 | H-3 | |
| 112-4 | H-4 | |
| 112-5 | H-5 | |
| 112-6 | H-6 | |
| 112-7 | H-7 | |
| 112-8 | H-8 | |
| 112-9 | H-9 | |
| 112-10 | H-10 | |
| 112-11 | H-11 | |
| 112-12 | H-12 | |
| 112-13 | H-13 | |
| 112-14 | H-14 | |
| 112-15 | H-15 | |
| 112-16 | H-16 | |
| 112-17 | H-17 | |
| 112-18 | H-18 | |
| 112-19 | H-1 | H-30 |
| 112-20 | H-2 | |
| 112-21 | H-3 | |
| 112-22 | H-4 | |
| 112-23 | H-5 | |
| 112-24 | H-6 | |
| 112-25 | H-7 | |
| 112-26 | H-8 | |
| 112-27 | H-9 | |
| 112-28 | H-10 | |
| 112-29 | H-11 | |
| 112-30 | H-12 | |
| 112-31 | H-13 | |
| 112-32 | H-14 | |
| 112-33 | H-15 | |
| 112-34 | H-16 | |
| 112-35 | H-17 | |
| 112-36 | H-18 | |
| Com. | R1 = R2 | R3 | Y |
|---|---|---|---|
| 112-37 | H-1 | H-1 | H-29 |
| 112-38 | H-2 | | |
| 112-39 | H-3 | | |
| 112-40 | H-4 | | |
| 112-41 | H-5 | | |
| 112-42 | H-6 | | |

-continued
| | | | |
|---|---|---|---|
| 112-43 | H-7 | | |
| 112-44 | H-8 | | |
| 112-45 | H-9 | | |
| 112-46 | H-10 | | |
| 112-47 | H-11 | | |
| 112-48 | H-12 | | |
| 112-49 | H-13 | | |
| 112-50 | H-14 | | |
| 112-51 | H-15 | | |
| 112-52 | H-16 | | |
| 112-53 | H-17 | | |
| 112-54 | H-18 | | |
| 112-55 | H-1 | H-1 | H-30 |
| 112-56 | H-2 | | |
| 112-57 | H-3 | | |
| 112-58 | H-4 | | |
| 112-59 | H-5 | | |
| 112-60 | H-6 | | |
| 112-61 | H-7 | | |
| 112-62 | H-8 | | |
| 112-63 | H-9 | | |
| 112-64 | H-10 | | |
| 112-65 | H-11 | | |
| 112-66 | H-12 | | |
| 112-67 | H-13 | | |
| 112-68 | H-14 | | |
| 112-69 | H-15 | | |
| 112-70 | H-16 | | |
| 112-71 | H-17 | | |
| 112-72 | H-18 | | |
Compound 113-X
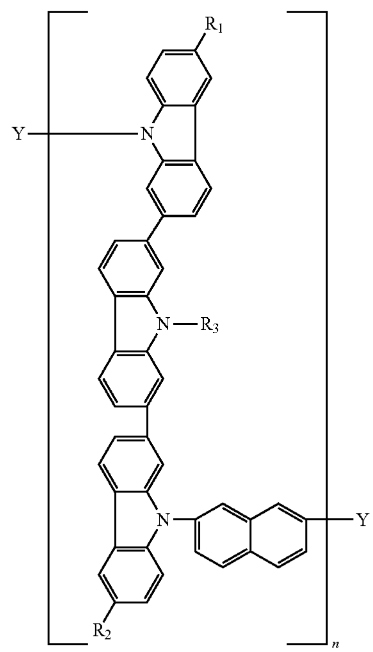
| Com. | R1 = R2 = R3 | Y |
|---|---|---|
| 113-1 | H-1 | H-29 |
| 113-2 | H-2 | |
| 113-3 | H-3 | |
| 113-4 | H-4 | |
| 113-5 | H-5 | |
| 113-6 | H-6 | |
| 113-7 | H-7 | |
| 113-8 | H-8 | |
| 113-9 | H-9 | |
| 113-10 | H-10 | |
| 113-11 | H-11 | |
| 113-12 | H-12 | |
| 113-13 | H-13 | |
| 113-14 | H-14 | |

-continued

| | | |
|---|---|---|
| 113-15 | H-15 | |
| 113-16 | H-16 | |
| 113-17 | H-17 | |
| 113-18 | H-18 | |
| 113-19 | H-1 | H-30 |
| 113-20 | H-2 | |
| 113-21 | H-3 | |
| 113-22 | H-4 | |
| 113-23 | H-5 | |
| 113-24 | H-6 | |
| 113-25 | H-7 | |
| 113-26 | H-8 | |
| 113-27 | H-9 | |
| 113-28 | H-10 | |
| 113-29 | H-11 | |
| 113-30 | H-12 | |
| 113-31 | H-13 | |
| 113-32 | H-14 | |
| 113-33 | H-15 | |
| 113-34 | H-16 | |
| 113-35 | H-17 | |
| 113-36 | H-18 | |

| Com. | R1 = R2 | R3 | Y |
|---|---|---|---|
| 113-37 | H-1 | H-1 | H-29 |
| 113-38 | H-2 | | |
| 113-39 | H-3 | | |
| 113-40 | H-4 | | |
| 113-41 | H-5 | | |
| 113-42 | H-6 | | |
| 113-43 | H-7 | | |
| 113-44 | H-8 | | |
| 113-45 | H-9 | | |
| 113-46 | H-10 | | |
| 113-47 | H-11 | | |
| 113-48 | H-12 | | |
| 113-49 | H-13 | | |
| 113-50 | H-14 | | |
| 113-51 | H-15 | | |
| 113-52 | H-16 | | |
| 113-53 | H-17 | | |
| 113-54 | H-18 | | |
| 113-55 | H-1 | H-1 | H-30 |
| 113-56 | H-2 | | |
| 113-57 | H-3 | | |
| 113-58 | H-4 | | |
| 113-59 | H-5 | | |
| 113-60 | H-6 | | |
| 113-61 | H-7 | | |
| 113-62 | H-8 | | |
| 113-63 | H-9 | | |
| 113-64 | H-10 | | |
| 113-65 | H-11 | | |
| 113-66 | H-12 | | |
| 113-67 | H-13 | | |
| 113-68 | H-14 | | |
| 113-69 | H-15 | | |
| 113-70 | H-16 | | |
| 113-71 | H-17 | | |
| 113-72 | H-18 | | |

-continued
Compound 114-X
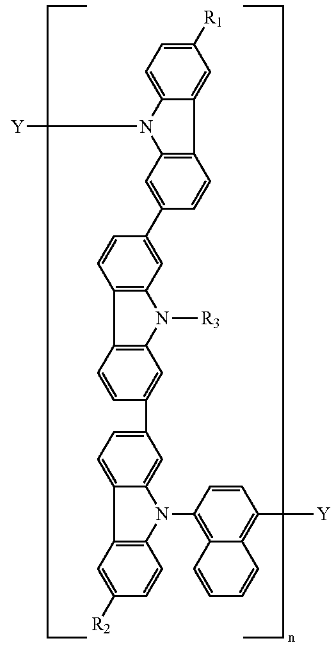
| Com. | R1 = R2 = R3 | Y |
|---|---|---|
| 114-1 | H-1 | H-29 |
| 114-2 | H-2 | |
| 114-3 | H-3 | |
| 114-4 | H-4 | |
| 114-5 | H-5 | |
| 114-6 | H-6 | |
| 114-7 | H-7 | |
| 114-8 | H-8 | |
| 114-9 | H-9 | |
| 114-10 | H-10 | |
| 114-11 | H-11 | |
| 114-12 | H-12 | |
| 114-13 | H-13 | |
| 114-14 | H-14 | |
| 114-15 | H-15 | |
| 114-16 | H-16 | |
| 114-17 | H-17 | |
| 114-18 | H-18 | |
| 114-19 | H-1 | H-30 |
| 114-20 | H-2 | |
| 114-21 | H-3 | |
| 114-22 | H-4 | |
| 114-23 | H-5 | |
| 114-24 | H-6 | |
| 114-25 | H-7 | |
| 114-26 | H-8 | |
| 114-27 | H-9 | |
| 114-28 | H-10 | |
| 114-29 | H-11 | |
| 114-30 | H-12 | |
| 114-31 | H-13 | |
| 114-32 | H-14 | |
| 114-33 | H-15 | |
| 114-34 | H-16 | |
| 114-35 | H-17 | |
| 114-36 | H-18 | |
| Com. | R1 = R2 | R3 | Y |
|---|---|---|---|
| 114-37 | H-1 | H-1 | H-29 |
| 114-38 | H-2 | | |
| 114-39 | H-3 | | |
| 114-40 | H-4 | | |
| 114-41 | H-5 | | |
| 114-42 | H-6 | | |

-continued
| | | | |
|---|---|---|---|
| 114-43 | H-7 | | |
| 114-44 | H-8 | | |
| 114-45 | H-9 | | |
| 114-46 | H-10 | | |
| 114-47 | H-11 | | |
| 114-48 | H-12 | | |
| 114-49 | H-13 | | |
| 114-50 | H-14 | | |
| 114-51 | H-15 | | |
| 114-52 | H-16 | | |
| 114-53 | H-17 | | |
| 114-54 | H-18 | | |
| 114-55 | H-1 | H-1 | H-30 |
| 114-56 | H-2 | | |
| 114-57 | H-3 | | |
| 114-58 | H-4 | | |
| 114-59 | H-5 | | |
| 114-60 | H-6 | | |
| 114-61 | H-7 | | |
| 114-62 | H-8 | | |
| 114-63 | H-9 | | |
| 114-64 | H-10 | | |
| 114-65 | H-11 | | |
| 114-66 | H-12 | | |
| 114-67 | H-13 | | |
| 114-68 | H-14 | | |
| 114-69 | H-15 | | |
| 114-70 | H-16 | | |
| 114-71 | H-17 | | |
| 114-72 | H-18 | | |
Compound 115-X
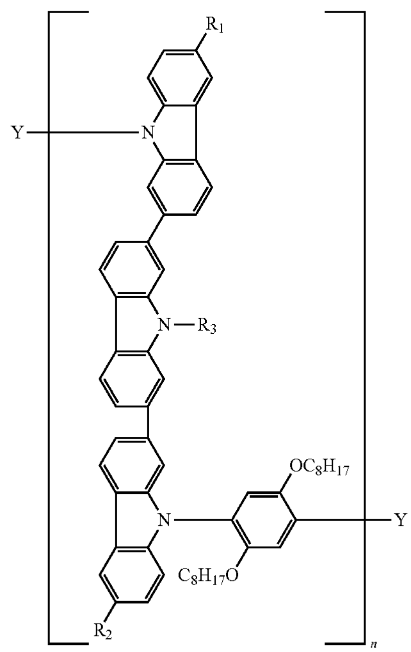
| Com. | R1 = R2 = R3 | Y |
|---|---|---|
| 115-1 | H-1 | H-29 |
| 115-2 | H-2 | |
| 115-3 | H-3 | |
| 115-4 | H-4 | |
| 115-5 | H-5 | |
| 115-6 | H-6 | |
| 115-7 | H-7 | |
| 115-8 | H-8 | |
| 115-9 | H-9 | |
| 115-10 | H-10 | |
| 115-11 | H-11 | |
| 115-12 | H-12 | |
| 115-13 | H-13 | |
| 115-14 | H-14 | |

-continued

| | | |
|---|---|---|
| 115-15 | H-15 | |
| 115-16 | H-16 | |
| 115-17 | H-17 | |
| 115-18 | H-18 | |
| 115-19 | H-1 | H-30 |
| 115-20 | H-2 | |
| 115-21 | H-3 | |
| 115-22 | H-4 | |
| 115-23 | H-5 | |
| 115-24 | H-6 | |
| 115-25 | H-7 | |
| 115-26 | H-8 | |
| 115-27 | H-9 | |
| 115-28 | H-10 | |
| 115-29 | H-11 | |
| 115-30 | H-12 | |
| 115-31 | H-13 | |
| 115-32 | H-14 | |
| 115-33 | H-15 | |
| 115-34 | H-16 | |
| 115-35 | H-17 | |
| 115-36 | H-18 | |

| Com. | R1 = R2 | R3 | Y |
|---|---|---|---|
| 115-37 | H-1 | H-1 | H-29 |
| 115-38 | H-2 | | |
| 115-39 | H-3 | | |
| 115-40 | H-4 | | |
| 115-41 | H-5 | | |
| 115-42 | H-6 | | |
| 115-43 | H-7 | | |
| 115-44 | H-8 | | |
| 115-45 | H-9 | | |
| 115-46 | H-10 | | |
| 115-47 | H-11 | | |
| 115-48 | H-12 | | |
| 115-49 | H-13 | | |
| 115-50 | H-14 | | |
| 115-51 | H-15 | | |
| 115-52 | H-16 | | |
| 115-53 | H-17 | | |
| 115-54 | H-18 | | |
| 115-55 | H-1 | H-1 | H-30 |
| 115-56 | H-2 | | |
| 115-57 | H-3 | | |
| 115-58 | H-4 | | |
| 115-59 | H-5 | | |
| 115-60 | H-6 | | |
| 115-61 | H-7 | | |
| 115-62 | H-8 | | |
| 115-63 | H-9 | | |
| 115-64 | H-10 | | |
| 115-65 | H-11 | | |
| 115-66 | H-12 | | |
| 115-67 | H-13 | | |
| 115-68 | H-14 | | |
| 115-69 | H-15 | | |
| 115-70 | H-16 | | |
| 115-71 | H-17 | | |
| 115-72 | H-18 | | |

-continued
Compound 116-X
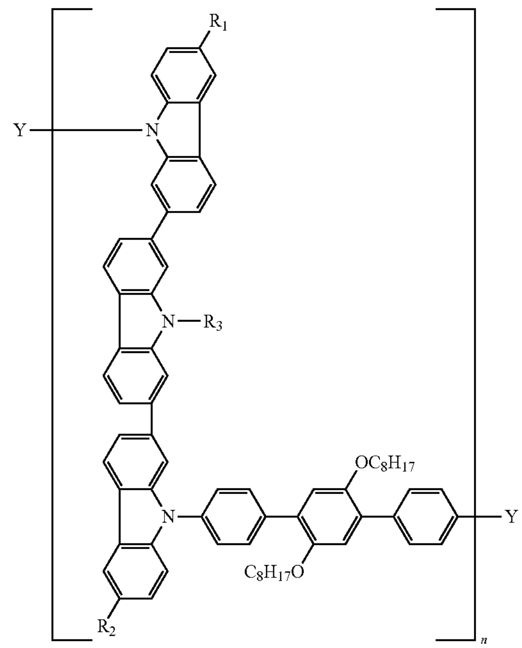
| Com. | R1 = R2 = R3 | Y |
|---|---|---|
| 116-1 | H-1 | H-29 |
| 116-2 | H-2 | |
| 116-3 | H-3 | |
| 116-4 | H-4 | |
| 116-5 | H-5 | |
| 116-6 | H-6 | |
| 116-7 | H-7 | |
| 116-8 | H-8 | |
| 116-9 | H-9 | |
| 116-10 | H-10 | |
| 116-11 | H-11 | |
| 116-12 | H-12 | |
| 116-13 | H-13 | |
| 116-14 | H-14 | |
| 116-15 | H-15 | |
| 116-16 | H-16 | |
| 116-17 | H-17 | |
| 116-18 | H-18 | |
| 116-19 | H-1 | H-30 |
| 116-20 | H-2 | |
| 116-21 | H-3 | |
| 116-22 | H-4 | |
| 116-23 | H-5 | |
| 116-24 | H-6 | |
| 116-25 | H-7 | |
| 116-26 | H-8 | |
| 116-27 | H-9 | |
| 116-28 | H-10 | |
| 116-29 | H-11 | |
| 116-30 | H-12 | |
| 116-31 | H-13 | |
| 116-32 | H-14 | |
| 116-33 | H-15 | |
| 116-34 | H-16 | |
| 116-35 | H-17 | |
| 116-36 | H-18 | |
| Com. | R1 = R2 | R3 | Y |
|---|---|---|---|
| 116-37 | H-1 | H-1 | H-29 |
| 116-38 | H-2 | | |
| 116-39 | H-3 | | |
| 116-40 | H-4 | | |
| 116-41 | H-5 | | |
| 116-42 | H-6 | | |

-continued
| | | | |
|---|---|---|---|
| 116-43 | H-7 | | |
| 116-44 | H-8 | | |
| 116-45 | H-9 | | |
| 116-46 | H-10 | | |
| 116-47 | H-11 | | |
| 116-48 | H-12 | | |
| 116-49 | H-13 | | |
| 116-50 | H-14 | | |
| 116-51 | H-15 | | |
| 116-52 | H-16 | | |
| 116-53 | H-17 | | |
| 116-54 | H-18 | | |
| 116-55 | H-1 | H-1 | H-30 |
| 116-56 | H-2 | | |
| 116-57 | H-3 | | |
| 116-58 | H-4 | | |
| 116-59 | H-5 | | |
| 116-60 | H-6 | | |
| 116-61 | H-7 | | |
| 116-62 | H-8 | | |
| 116-63 | H-9 | | |
| 116-64 | H-10 | | |
| 116-65 | H-11 | | |
| 116-66 | H-12 | | |
| 116-67 | H-13 | | |
| 116-68 | H-14 | | |
| 116-69 | H-15 | | |
| 116-70 | H-16 | | |
| 116-71 | H-17 | | |
| 116-72 | H-18 | | |
Compound 117-X
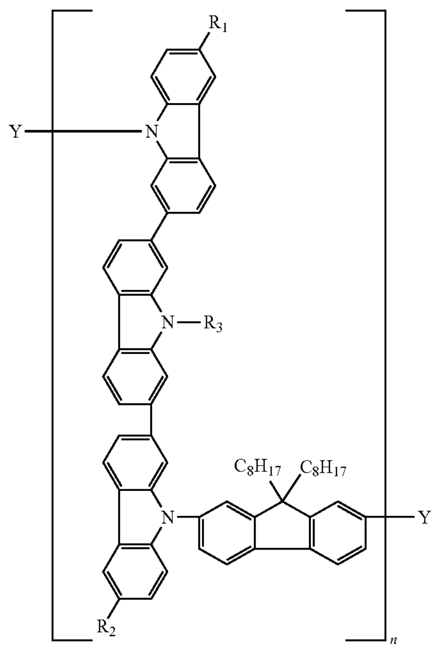
| Com. | R1 = R2 = R3 | Y |
|---|---|---|
| 117-1 | H-1 | H-29 |
| 117-2 | H-2 | |
| 117-3 | H-3 | |
| 117-4 | H-4 | |
| 117-5 | H-5 | |
| 117-6 | H-6 | |
| 117-7 | H-7 | |
| 117-8 | H-8 | |
| 117-9 | H-9 | |
| 117-10 | H-10 | |
| 117-11 | H-11 | |
| 117-12 | H-12 | |
| 117-13 | H-13 | |
| 117-14 | H-14 | |

-continued

| | | |
|---|---|---|
| 117-15 | H-15 | |
| 117-16 | H-16 | |
| 117-17 | H-17 | |
| 117-18 | H-18 | |
| 117-19 | H-1 | H-30 |
| 117-20 | H-2 | |
| 117-21 | H-3 | |
| 117-22 | H-4 | |
| 117-23 | H-5 | |
| 117-24 | H-6 | |
| 117-25 | H-7 | |
| 117-26 | H-8 | |
| 117-27 | H-9 | |
| 117-28 | H-10 | |
| 117-29 | H-11 | |
| 117-30 | H-12 | |
| 117-31 | H-13 | |
| 117-32 | H-14 | |
| 117-33 | H-15 | |
| 117-34 | H-16 | |
| 117-35 | H-17 | |
| 117-36 | H-18 | |

| Com. | R1 = R2 | R3 | Y |
|---|---|---|---|
| 117-37 | H-1 | H-1 | H-29 |
| 117-38 | H-2 | | |
| 117-39 | H-3 | | |
| 117-40 | H-4 | | |
| 117-41 | H-5 | | |
| 117-42 | H-6 | | |
| 117-43 | H-7 | | |
| 117-44 | H-8 | | |
| 117-45 | H-9 | | |
| 117-46 | H-10 | | |
| 117-47 | H-11 | | |
| 117-48 | H-12 | | |
| 117-49 | H-13 | | |
| 117-50 | H-14 | | |
| 117-51 | H-15 | | |
| 117-52 | H-16 | | |
| 117-53 | H-17 | | |
| 117-54 | H-18 | | |
| 117-55 | H-1 | H-1 | H-30 |
| 117-56 | H-2 | | |
| 117-57 | H-3 | | |
| 117-58 | H-4 | | |
| 117-59 | H-5 | | |
| 117-60 | H-6 | | |
| 117-61 | H-7 | | |
| 117-62 | H-8 | | |
| 117-63 | H-9 | | |
| 117-64 | H-10 | | |
| 117-65 | H-11 | | |
| 117-66 | H-12 | | |
| 117-67 | H-13 | | |
| 117-68 | H-14 | | |
| 117-69 | H-15 | | |
| 117-70 | H-16 | | |
| 117-71 | H-17 | | |
| 117-72 | H-18 | | |

-continued
Compound 118-X
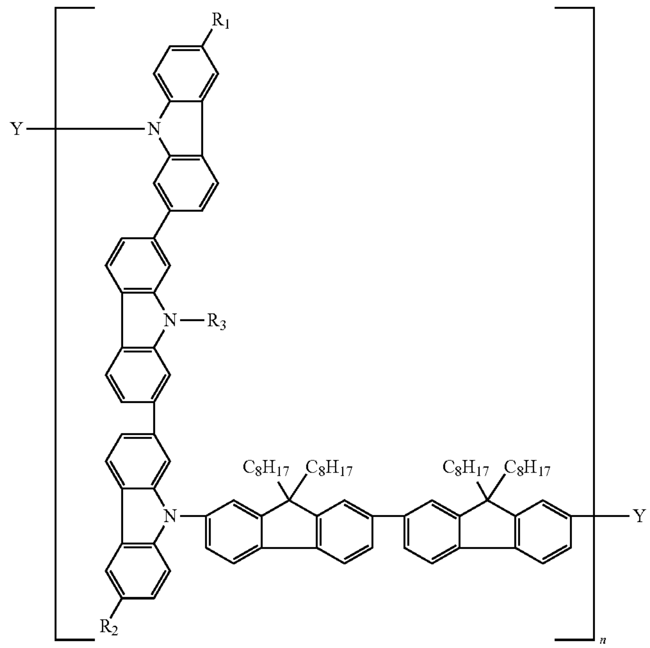
| Com. | R1 = R2 = R3 | Y |
|---|---|---|
| 118-1 | H-1 | H-29 |
| 118-2 | H-2 | |
| 118-3 | H-3 | |
| 118-4 | H-4 | |
| 118-5 | H-5 | |
| 118-6 | H-6 | |
| 118-7 | H-7 | |
| 118-8 | H-8 | |
| 118-9 | H-9 | |
| 118-10 | H-10 | |
| 118-11 | H-11 | |
| 118-12 | H-12 | |
| 118-13 | H-13 | |
| 118-14 | H-14 | |
| 118-15 | H-15 | |
| 118-16 | H-16 | |
| 118-17 | H-17 | |
| 118-18 | H-18 | |
| 118-19 | H-1 | H-30 |
| 118-20 | H-2 | |
| 118-21 | H-3 | |
| 118-22 | H-4 | |
| 118-23 | H-5 | |
| 118-24 | H-6 | |
| 118-25 | H-7 | |
| 118-26 | H-8 | |
| 118-27 | H-9 | |
| 118-28 | H-10 | |
| 118-29 | H-11 | |
| 118-30 | H-12 | |
| 118-31 | H-13 | |
| 118-32 | H-14 | |
| 118-33 | H-15 | |
| 118-34 | H-16 | |
| 118-35 | H-17 | |
| 118-36 | H-18 | |
| Com. | R1 = R2 | R3 | Y |
|---|---|---|---|
| 118-37 | H-1 | H-1 | H-29 |
| 118-38 | H-2 | | |
| 118-39 | H-3 | | |
| 118-40 | H-4 | | |
| 118-41 | H-5 | | |
| 118-42 | H-6 | | |

-continued
| | | | |
|---|---|---|---|
| 118-43 | H-7 | | |
| 118-44 | H-8 | | |
| 118-45 | H-9 | | |
| 118-46 | H-10 | | |
| 118-47 | H-11 | | |
| 118-48 | H-12 | | |
| 118-49 | H-13 | | |
| 118-50 | H-14 | | |
| 118-51 | H-15 | | |
| 118-52 | H-16 | | |
| 118-53 | H-17 | | |
| 118-54 | H-18 | | |
| 118-55 | H-1 | H-1 | H-30 |
| 118-56 | H-2 | | |
| 118-57 | H-3 | | |
| 118-58 | H-4 | | |
| 118-59 | H-5 | | |
| 118-60 | H-6 | | |
| 118-61 | H-7 | | |
| 118-62 | H-8 | | |
| 118-63 | H-9 | | |
| 118-64 | H-10 | | |
| 118-65 | H-11 | | |
| 118-66 | H-12 | | |
| 118-67 | H-13 | | |
| 118-68 | H-14 | | |
| 118-69 | H-15 | | |
| 118-70 | H-16 | | |
| 118-71 | H-17 | | |
| 118-72 | H-18 | | |
Compound 119-X
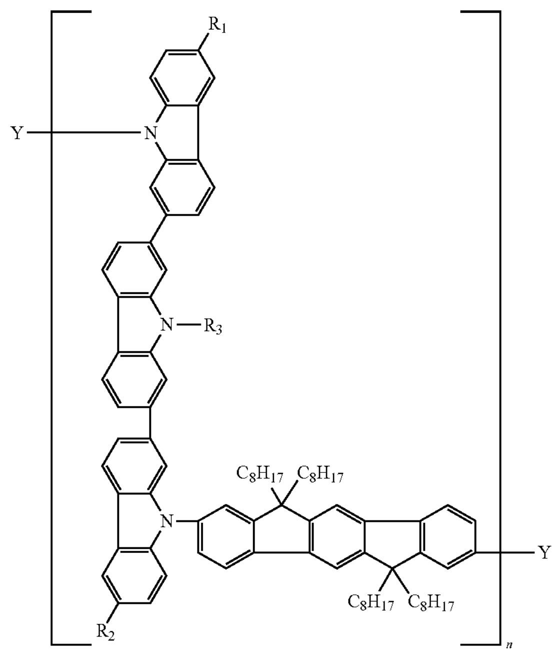
| Com. | R1 = R2 = R3 | Y |
|---|---|---|
| 119-1 | H-1 | H-29 |
| 119-2 | H-2 | |
| 119-3 | H-3 | |
| 119-4 | H-4 | |
| 119-5 | H-5 | |
| 119-6 | H-6 | |
| 119-7 | H-7 | |
| 119-8 | H-8 | |
| 119-9 | H-9 | |
| 119-10 | H-10 | |
| 119-11 | H-11 | |
| 119-12 | H-12 | |
| 119-13 | H-13 | |
| 119-14 | H-14 | |

-continued

| | | |
|---|---|---|
| 119-15 | H-15 | |
| 119-16 | H-16 | |
| 119-17 | H-17 | |
| 119-18 | H-18 | |
| 119-19 | H-1 | H-30 |
| 119-20 | H-2 | |
| 119-21 | H-3 | |
| 119-22 | H-4 | |
| 119-23 | H-5 | |
| 119-24 | H-6 | |
| 119-25 | H-7 | |
| 119-26 | H-8 | |
| 119-27 | H-9 | |
| 119-28 | H-10 | |
| 119-29 | H-11 | |
| 119-30 | H-12 | |
| 119-31 | H-13 | |
| 119-32 | H-14 | |
| 119-33 | H-15 | |
| 119-34 | H-16 | |
| 119-35 | H-17 | |
| 119-36 | H-18 | |

| Com. | R1 = R2 | R3 | Y |
|---|---|---|---|
| 119-37 | H-1 | H-1 | H-29 |
| 119-38 | H-2 | | |
| 119-39 | H-3 | | |
| 119-40 | H-4 | | |
| 119-41 | H-5 | | |
| 119-42 | H-6 | | |
| 119-43 | H-7 | | |
| 119-44 | H-8 | | |
| 119-45 | H-9 | | |
| 119-46 | H-10 | | |
| 119-47 | H-11 | | |
| 119-48 | H-12 | | |
| 119-49 | H-13 | | |
| 119-50 | H-14 | | |
| 119-51 | H-15 | | |
| 119-52 | H-16 | | |
| 119-53 | H-17 | | |
| 119-54 | H-18 | | |
| 119-55 | H-1 | H-1 | H-30 |
| 119-56 | H-2 | | |
| 119-57 | H-3 | | |
| 119-58 | H-4 | | |
| 119-59 | H-5 | | |
| 119-60 | H-6 | | |
| 119-61 | H-7 | | |
| 119-62 | H-8 | | |
| 119-63 | H-9 | | |
| 119-64 | H-10 | | |
| 119-65 | H-11 | | |
| 119-66 | H-12 | | |
| 119-67 | H-13 | | |
| 119-68 | H-14 | | |
| 119-69 | H-15 | | |
| 119-70 | H-16 | | |
| 119-71 | H-17 | | |
| 119-72 | H-18 | | |

Compound 120-X

-continued
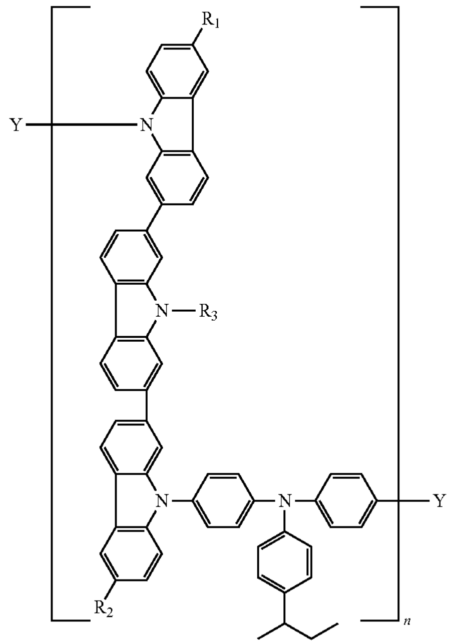
| Com. | R1 = R2 = R3 | Y |
|---|---|---|
| 120-1 | H-1 | H-29 |
| 120-2 | H-2 | |
| 120-3 | H-3 | |
| 120-4 | H-4 | |
| 120-5 | H-5 | |
| 120-6 | H-6 | |
| 120-7 | H-7 | |
| 120-8 | H-8 | |
| 120-9 | H-9 | |
| 120-10 | H-10 | |
| 120-11 | H-11 | |
| 120-12 | H-12 | |
| 120-13 | H-13 | |
| 120-14 | H-14 | |
| 120-15 | H-15 | |
| 120-16 | H-16 | |
| 120-17 | H-17 | |
| 120-18 | H-18 | |
| 120-19 | H-1 | H-30 |
| 120-20 | H-2 | |
| 120-21 | H-3 | |
| 120-22 | H-4 | |
| 120-23 | H-5 | |
| 120-24 | H-6 | |
| 120-25 | H-7 | |
| 120-26 | H-8 | |
| 120-27 | H-9 | |
| 120-28 | H-10 | |
| 120-29 | H-11 | |
| 120-30 | H-12 | |
| 120-31 | H-13 | |
| 120-32 | H-14 | |
| 120-33 | H-15 | |
| 120-34 | H-16 | |
| 120-35 | H-17 | |
| 120-36 | H-18 | |
| Com. | R1 = R2 | R3 | Y |
|---|---|---|---|
| 120-37 | H-1 | H-1 | H-29 |
| 120-38 | H-2 | | |
| 120-39 | H-3 | | |
| 120-40 | H-4 | | |
| 120-41 | H-5 | | |
| 120-42 | H-6 | | |
| 120-43 | H-7 | | |

-continued
| | | | |
|---|---|---|---|
| 120-44 | H-8 | | |
| 120-45 | H-9 | | |
| 120-46 | H-10 | | |
| 120-47 | H-11 | | |
| 120-48 | H-12 | | |
| 120-49 | H-13 | | |
| 120-50 | H-14 | | |
| 120-51 | H-15 | | |
| 120-52 | H-16 | | |
| 120-53 | H-17 | | |
| 120-54 | H-18 | | |
| 120-55 | H-1 | H-1 | H-30 |
| 120-56 | H-2 | | |
| 120-57 | H-3 | | |
| 120-58 | H-4 | | |
| 120-59 | H-5 | | |
| 120-60 | H-6 | | |
| 120-61 | H-7 | | |
| 120-62 | H-8 | | |
| 120-63 | H-9 | | |
| 120-64 | H-10 | | |
| 120-65 | H-11 | | |
| 120-66 | H-12 | | |
| 120-67 | H-13 | | |
| 120-68 | H-14 | | |
| 120-69 | H-15 | | |
| 120-70 | H-16 | | |
| 120-71 | H-17 | | |
| 120-72 | H-18 | | |
Compound 121-X
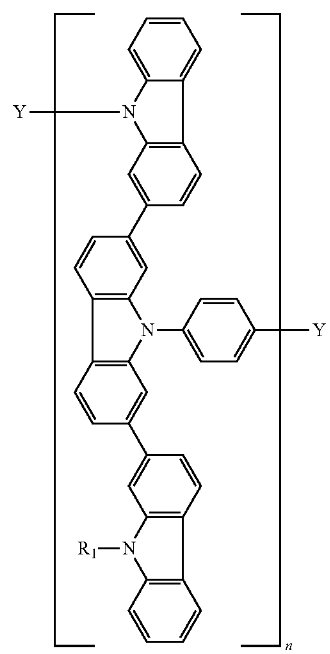
| Com. | R1 | Y |
|---|---|---|
| 121-1 | H-1 | H-29 |
| 121-2 | H-2 | |
| 121-3 | H-3 | |
| 121-4 | H-4 | |
| 121-5 | H-5 | |
| 121-6 | H-6 | |
| 121-7 | H-7 | |
| 121-8 | H-8 | |
| 121-9 | H-9 | |
| 121-10 | H-10 | |
| 121-11 | H-11 | |
| 121-12 | H-12 | |
| 121-13 | H-13 | |
| 121-14 | H-14 | |
| 121-15 | H-15 | |

-continued
| | | |
|---|---|---|
| 121-16 | H-16 | |
| 121-17 | H-17 | |
| 121-18 | H-18 | |
| 121-19 | H-1 | H-30 |
| 121-20 | H-2 | |
| 121-21 | H-3 | |
| 121-22 | H-4 | |
| 121-23 | H-5 | |
| 121-24 | H-6 | |
| 121-25 | H-7 | |
| 121-26 | H-8 | |
| 121-27 | H-9 | |
| 121-28 | H-10 | |
| 121-29 | H-11 | |
| 121-30 | H-12 | |
| 121-31 | H-13 | |
| 121-32 | H-14 | |
| 121-33 | H-15 | |
| 121-34 | H-16 | |
| 121-35 | H-17 | |
| 121-36 | H-18 | |
Compound 122-X
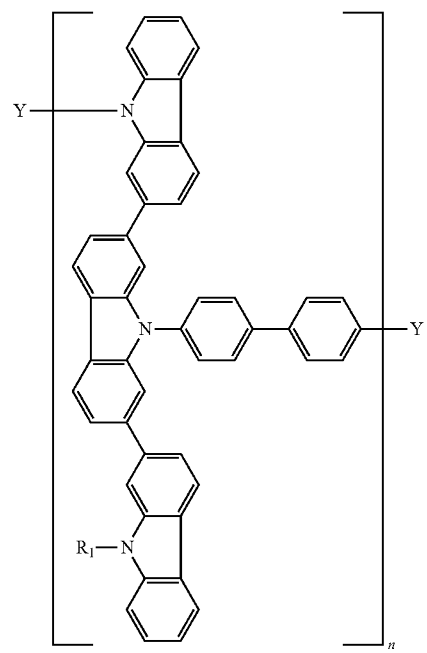
| Com. | R1 | Y |
|---|---|---|
| 122-1 | H-1 | H-29 |
| 122-2 | H-2 | |
| 122-3 | H-3 | |
| 122-4 | H-4 | |
| 122-5 | H-5 | |
| 122-6 | H-6 | |
| 122-7 | H-7 | |
| 122-8 | H-8 | |
| 122-9 | H-9 | |
| 122-10 | H-10 | |
| 122-11 | H-11 | |
| 122-12 | H-12 | |
| 122-13 | H-13 | |
| 122-14 | H-14 | |
| 122-15 | H-15 | |
| 122-16 | H-16 | |
| 122-17 | H-17 | |
| 122-18 | H-18 | |
| 122-19 | H-1 | H-30 |
| 122-20 | H-2 | |
| 122-21 | H-3 | |
| 122-22 | H-4 | |
| 122-23 | H-5 | |

-continued
| | | |
|---|---|---|
| 122-24 | H-6 | |
| 122-25 | H-7 | |
| 122-26 | H-8 | |
| 122-27 | H-9 | |
| 122-28 | H-10 | |
| 122-29 | H-11 | |
| 122-30 | H-12 | |
| 122-31 | H-13 | |
| 122-32 | H-14 | |
| 122-33 | H-15 | |
| 122-34 | H-16 | |
| 122-35 | H-17 | |
| 122-36 | H-18 | |
Compound 123-X
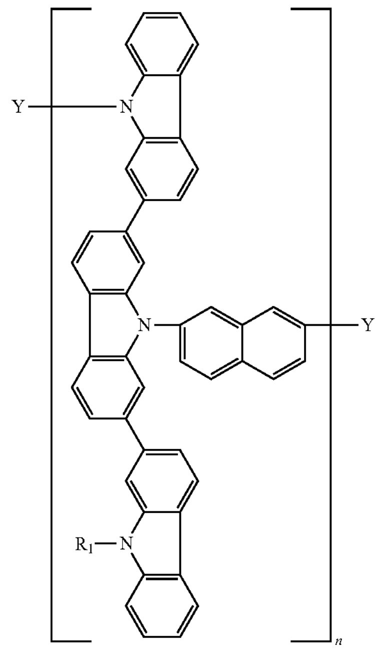
| Com. | R1 | Y |
|---|---|---|
| 123-1 | H-1 | H-29 |
| 123-2 | H-2 | |
| 123-3 | H-3 | |
| 123-4 | H-4 | |
| 123-5 | H-5 | |
| 123-6 | H-6 | |
| 123-7 | H-7 | |
| 123-8 | H-8 | |
| 123-9 | H-9 | |
| 123-10 | H-10 | |
| 123-11 | H-11 | |
| 123-12 | H-12 | |
| 123-13 | H-13 | |
| 123-14 | H-14 | |
| 123-15 | H-15 | |
| 123-16 | H-16 | |
| 123-17 | H-17 | |
| 123-18 | H-18 | |
| 123-19 | H-1 | H-30 |
| 123-20 | H-2 | |
| 123-21 | H-3 | |
| 123-22 | H-4 | |
| 123-23 | H-5 | |
| 123-24 | H-6 | |
| 123-25 | H-7 | |
| 123-26 | H-8 | |
| 123-27 | H-9 | |
| 123-28 | H-10 | |
| 123-29 | H-11 | |
| 123-30 | H-12 | |
| 123-31 | H-13 | |

-continued
| | |
|---|---|
| 123-32 | H-14 |
| 123-33 | H-15 |
| 123-34 | H-16 |
| 123-35 | H-17 |
| 123-36 | H-18 |
Compound 124-X
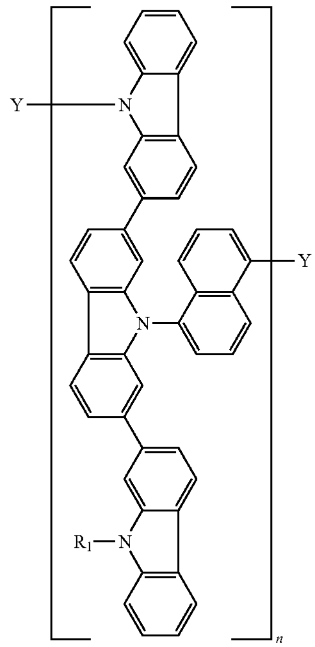
| Com. | R1 | Y |
|---|---|---|
| 124-1 | H-1 | H-29 |
| 124-2 | H-2 | |
| 124-3 | H-3 | |
| 124-4 | H-4 | |
| 124-5 | H-5 | |
| 124-6 | H-6 | |
| 124-7 | H-7 | |
| 124-8 | H-8 | |
| 124-9 | H-9 | |
| 124-10 | H-10 | |
| 124-11 | H-11 | |
| 124-12 | H-12 | |
| 124-13 | H-13 | |
| 124-14 | H-14 | |
| 124-15 | H-15 | |
| 124-16 | H-16 | |
| 124-17 | H-17 | |
| 124-18 | H-18 | |
| 124-19 | H-1 | H-30 |
| 124-20 | H-2 | |
| 124-21 | H-3 | |
| 124-22 | H-4 | |
| 124-23 | H-5 | |
| 124-24 | H-6 | |
| 124-25 | H-7 | |
| 124-26 | H-8 | |
| 124-27 | H-9 | |
| 124-28 | H-10 | |
| 124-29 | H-11 | |
| 124-30 | H-12 | |
| 124-31 | H-13 | |
| 124-32 | H-14 | |
| 124-33 | H-15 | |
| 124-34 | H-16 | |
| 124-35 | H-17 | |
| 124-36 | H-18 | |

-continued
Compound 125-X
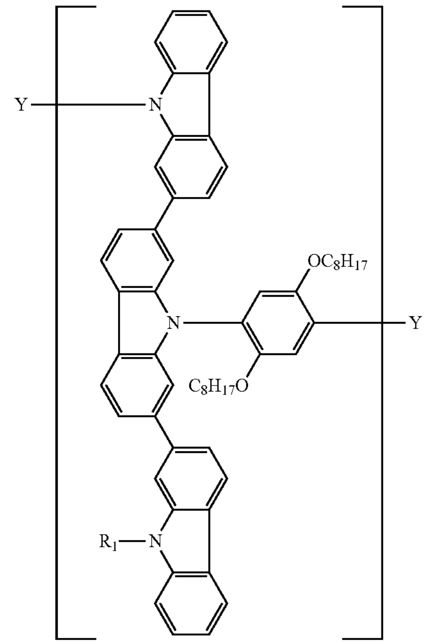
| Com. | R1 | Y |
|---|---|---|
| 125-1 | H-1 | H-29 |
| 125-2 | H-2 | |
| 125-3 | H-3 | |
| 125-4 | H-4 | |
| 125-5 | H-5 | |
| 125-6 | H-6 | |
| 125-7 | H-7 | |
| 125-8 | H-8 | |
| 125-9 | H-9 | |
| 125-10 | H-10 | |
| 125-11 | H-11 | |
| 125-12 | H-12 | |
| 125-13 | H-13 | |
| 125-14 | H-14 | |
| 125-15 | H-15 | |
| 125-16 | H-16 | |
| 125-17 | H-17 | |
| 125-18 | H-18 | |
| 125-19 | H-1 | H-30 |
| 125-20 | H-2 | |
| 125-21 | H-3 | |
| 125-22 | H-4 | |
| 125-23 | H-5 | |
| 125-24 | H-6 | |
| 125-25 | H-7 | |
| 125-26 | H-8 | |
| 125-27 | H-9 | |
| 125-28 | H-10 | |
| 125-29 | H-11 | |
| 125-30 | H-12 | |
| 125-31 | H-13 | |
| 125-32 | H-14 | |
| 125-33 | H-15 | |
| 125-34 | H-16 | |
| 125-35 | H-17 | |
| 125-36 | H-18 | |

-continued
Compound 126-X
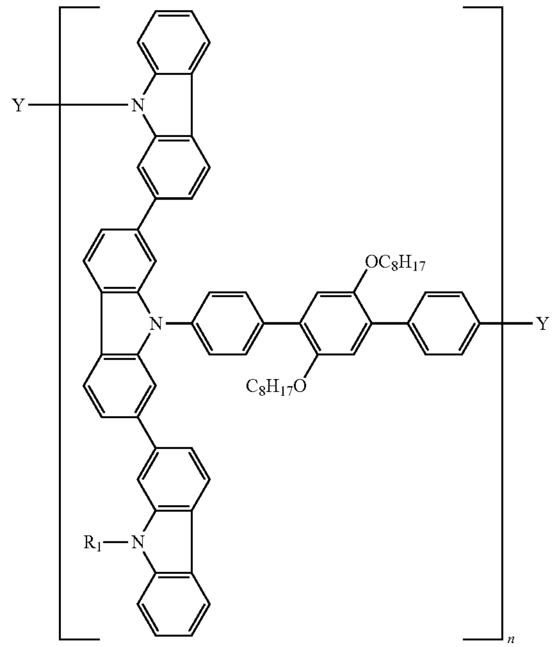
| Com. | R1 | Y |
|---|---|---|
| 126-1 | H-1 | H-29 |
| 126-2 | H-2 | |
| 126-3 | H-3 | |
| 126-4 | H-4 | |
| 126-5 | H-5 | |
| 126-6 | H-6 | |
| 126-7 | H-7 | |
| 126-8 | H-8 | |
| 126-9 | H-9 | |
| 126-10 | H-10 | |
| 126-11 | H-11 | |
| 126-12 | H-12 | |
| 126-13 | H-13 | |
| 126-14 | H-14 | |
| 126-15 | H-15 | |
| 126-16 | H-16 | |
| 126-17 | H-17 | |
| 126-18 | H-18 | |
| 126-19 | H-1 | H-30 |
| 126-20 | H-2 | |
| 126-21 | H-3 | |
| 126-22 | H-4 | |
| 126-23 | H-5 | |
| 126-24 | H-6 | |
| 126-25 | H-7 | |
| 126-26 | H-8 | |
| 126-27 | H-9 | |
| 126-28 | H-10 | |
| 126-29 | H-11 | |
| 126-30 | H-12 | |
| 126-31 | H-13 | |
| 126-32 | H-14 | |
| 126-33 | H-15 | |
| 126-34 | H-16 | |
| 126-35 | H-17 | |
| 126-36 | H-18 | |

-continued
Compound 127-X
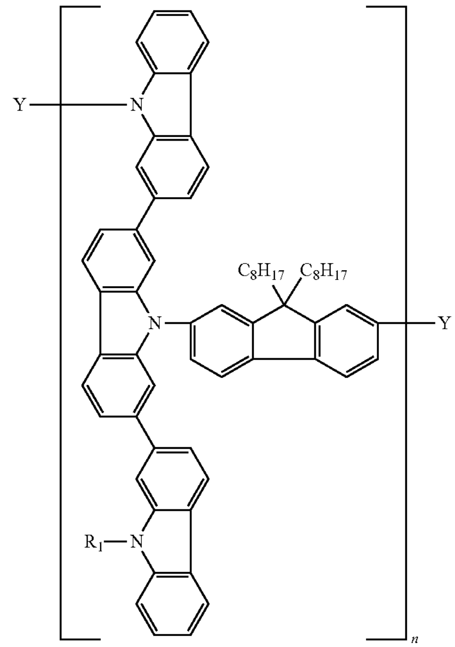
| Com. | R1 | Y |
|---|---|---|
| 127-1 | H-1 | H-29 |
| 127-2 | H-2 | |
| 127-3 | H-3 | |
| 127-4 | H-4 | |
| 127-5 | H-5 | |
| 127-6 | H-6 | |
| 127-7 | H-7 | |
| 127-8 | H-8 | |
| 127-9 | H-9 | |
| 127-10 | H-10 | |
| 127-11 | H-11 | |
| 127-12 | H-12 | |
| 127-13 | H-13 | |
| 127-14 | H-14 | |
| 127-15 | H-15 | |
| 127-16 | H-16 | |
| 127-17 | H-17 | |
| 127-18 | H-18 | |
| 127-19 | H-1 | H-30 |
| 127-20 | H-2 | |
| 127-21 | H-3 | |
| 127-22 | H-4 | |
| 127-23 | H-5 | |
| 127-24 | H-6 | |
| 127-25 | H-7 | |
| 127-26 | H-8 | |
| 127-27 | H-9 | |
| 127-28 | H-10 | |
| 127-29 | H-11 | |
| 127-30 | H-12 | |
| 127-31 | H-13 | |
| 127-32 | H-14 | |
| 127-33 | H-15 | |
| 127-34 | H-16 | |
| 127-35 | H-17 | |
| 127-36 | H-18 | |

-continued
Compound 128-X
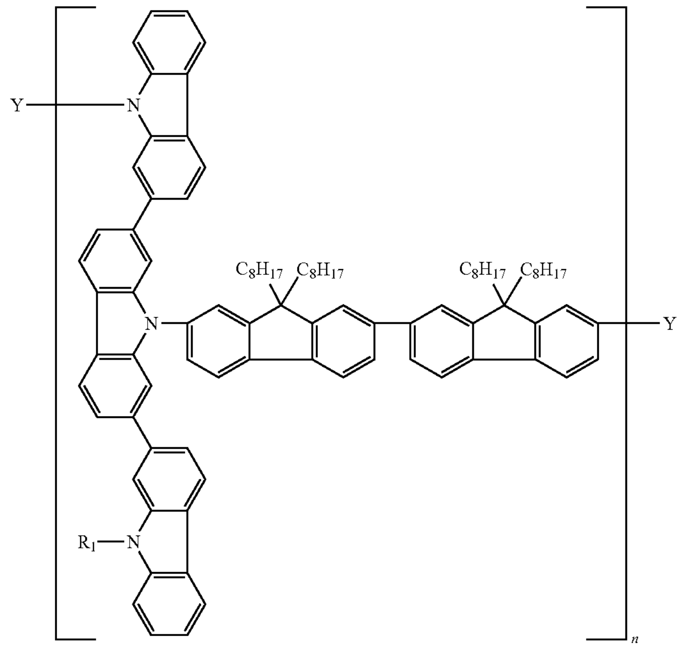
| Com. | R1 | Y |
|---|---|---|
| 128-1 | H-1 | H-29 |
| 128-2 | H-2 | |
| 128-3 | H-3 | |
| 128-4 | H-4 | |
| 128-5 | H-5 | |
| 128-6 | H-6 | |
| 128-7 | H-7 | |
| 128-8 | H-8 | |
| 128-9 | H-9 | |
| 128-10 | H-10 | |
| 128-11 | H-11 | |
| 128-12 | H-12 | |
| 128-13 | H-13 | |
| 128-14 | H-14 | |
| 128-15 | H-15 | |
| 128-16 | H-16 | |
| 128-17 | H-17 | |
| 128-18 | H-18 | |
| 128-19 | H-1 | H-30 |
| 128-20 | H-2 | |
| 128-21 | H-3 | |
| 128-22 | H-4 | |
| 128-23 | H-5 | |
| 128-24 | H-6 | |
| 128-25 | H-7 | |
| 128-26 | H-8 | |
| 128-27 | H-9 | |
| 128-28 | H-10 | |
| 128-29 | H-11 | |
| 128-30 | H-12 | |
| 128-31 | H-13 | |
| 128-32 | H-14 | |
| 128-33 | H-15 | |
| 128-34 | H-16 | |
| 128-35 | H-17 | |
| 128-36 | H-18 | |

-continued
Compound 129-X
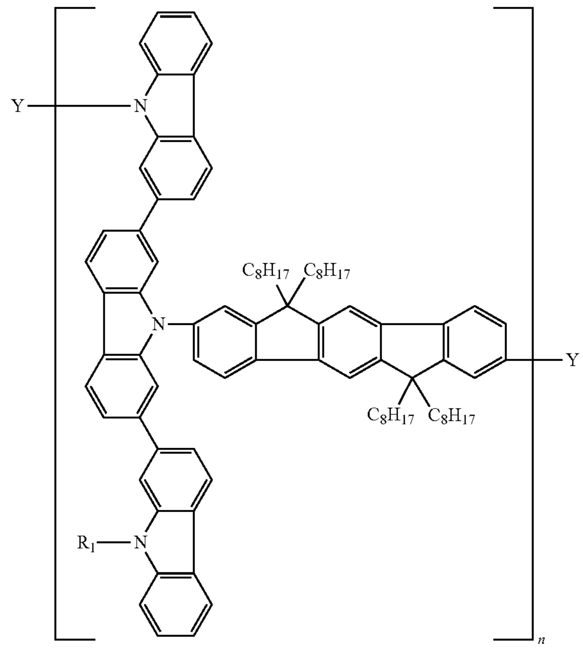
| Com. | R1 | Y |
|---|---|---|
| 129-1 | H-1 | H-29 |
| 129-2 | H-2 | |
| 129-3 | H-3 | |
| 129-4 | H-4 | |
| 129-5 | H-5 | |
| 129-6 | H-6 | |
| 129-7 | H-7 | |
| 129-8 | H-8 | |
| 129-9 | H-9 | |
| 129-10 | H-10 | |
| 129-11 | H-11 | |
| 129-12 | H-12 | |
| 129-13 | H-13 | |
| 129-14 | H-14 | |
| 129-15 | H-15 | |
| 129-16 | H-16 | |
| 129-17 | H-17 | |
| 129-18 | H-18 | |
| 129-19 | H-1 | H-30 |
| 129-20 | H-2 | |
| 129-21 | H-3 | |
| 129-22 | H-4 | |
| 129-23 | H-5 | |
| 129-24 | H-6 | |
| 129-25 | H-7 | |
| 129-26 | H-8 | |
| 129-27 | H-9 | |
| 129-28 | H-10 | |
| 129-29 | H-11 | |
| 129-30 | H-12 | |
| 129-31 | H-13 | |
| 129-32 | H-14 | |
| 129-33 | H-15 | |
| 129-34 | H-16 | |
| 129-35 | H-17 | |
| 129-36 | H-18 | |

-continued
Compound 130-X
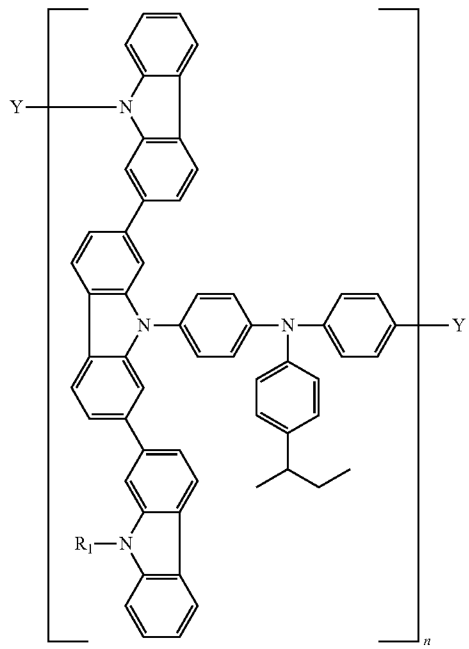
| Com. | R1 | Y |
|---|---|---|
| 130-1 | H-1 | H-29 |
| 130-2 | H-2 | |
| 130-3 | H-3 | |
| 130-4 | H-4 | |
| 130-5 | H-5 | |
| 130-6 | H-6 | |
| 130-7 | H-7 | |
| 130-8 | H-8 | |
| 130-9 | H-9 | |
| 130-10 | H-10 | |
| 130-11 | H-11 | |
| 130-12 | H-12 | |
| 130-13 | H-13 | |
| 130-14 | H-14 | |
| 130-15 | H-15 | |
| 130-16 | H-16 | |
| 130-17 | H-17 | |
| 130-18 | H-18 | |
| 130-19 | H-1 | H-30 |
| 130-20 | H-2 | |
| 130-21 | H-3 | |
| 130-22 | H-4 | |
| 130-23 | H-5 | |
| 130-24 | H-6 | |
| 130-25 | H-7 | |
| 130-26 | H-8 | |
| 130-27 | H-9 | |
| 130-28 | H-10 | |
| 130-29 | H-11 | |
| 130-30 | H-12 | |
| 130-31 | H-13 | |
| 130-32 | H-14 | |
| 130-33 | H-15 | |
| 130-34 | H-16 | |
| 130-35 | H-17 | |
| 130-36 | H-18 | |

-continued
Compound 131-X
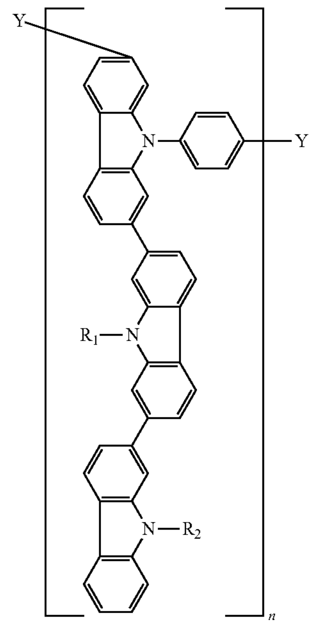
| Com. | R1 = R2 | Y |
|---|---|---|
| 131-1 | H-1 | H-29 |
| 131-2 | H-2 | |
| 131-3 | H-3 | |
| 131-4 | H-4 | |
| 131-5 | H-5 | |
| 131-6 | H-6 | |
| 131-7 | H-7 | |
| 131-8 | H-8 | |
| 131-9 | H-9 | |
| 131-10 | H-10 | |
| 131-11 | H-11 | |
| 131-12 | H-12 | |
| 131-13 | H-13 | |
| 131-14 | H-14 | |
| 131-15 | H-15 | |
| 131-16 | H-16 | |
| 131-17 | H-17 | |
| 131-18 | H-18 | |
| 131-19 | H-1 | H-30 |
| 131-20 | H-2 | |
| 131-21 | H-3 | |
| 131-22 | H-4 | |
| 131-23 | H-5 | |
| 131-24 | H-6 | |
| 131-25 | H-7 | |
| 131-26 | H-8 | |
| 131-27 | H-9 | |
| 131-28 | H-10 | |
| 131-29 | H-11 | |
| 131-30 | H-12 | |
| 131-31 | H-13 | |
| 131-32 | H-14 | |
| 131-33 | H-15 | |
| 131-34 | H-16 | |
| 131-35 | H-17 | |
| 131-36 | H-18 | |
| Com. | R1 | R2 | Y |
|---|---|---|---|
| 131-37 | H-2 | H-1 | H-29 |
| 131-38 | H-3 | | |
| 131-39 | H-4 | | |
| 131-40 | H-5 | | |
| 131-41 | H-6 | | |
| 131-42 | H-7 | | |
| 131-43 | H-8 | | |

-continued
| | | | |
|---|---|---|---|
| 131-44 | H-9 | | |
| 131-45 | H-10 | | |
| 131-46 | H-11 | | |
| 131-47 | H-12 | | |
| 131-48 | H-13 | | |
| 131-49 | H-14 | | |
| 131-50 | H-15 | | |
| 131-51 | H-16 | | |
| 131-52 | H-17 | | |
| 131-53 | H-18 | | |
| 131-54 | H-2 | H-1 | H-30 |
| 131-55 | H-3 | | |
| 131-56 | H-4 | | |
| 131-57 | H-5 | | |
| 131-58 | H-6 | | |
| 131-59 | H-7 | | |
| 131-60 | H-8 | | |
| 131-61 | H-9 | | |
| 131-62 | H-10 | | |
| 131-63 | H-11 | | |
| 131-64 | H-12 | | |
| 131-65 | H-13 | | |
| 131-66 | H-14 | | |
| 131-67 | H-15 | | |
| 131-68 | H-16 | | |
| 131-69 | H-17 | | |
| 131-70 | H-18 | | |
Compound 132-X
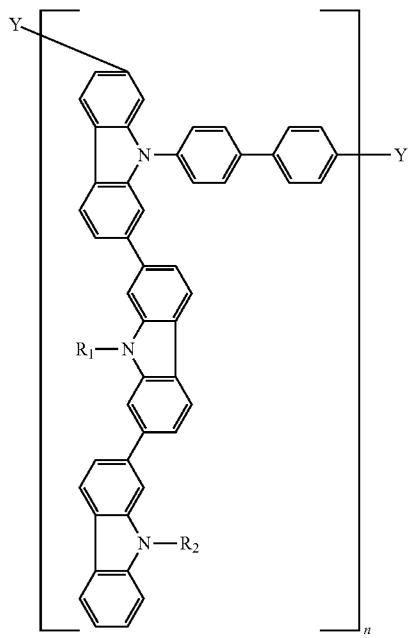
| Com. | R1 = R2 | Y |
|---|---|---|
| 132-1 | H-1 | H-29 |
| 132-2 | H-2 | |
| 132-3 | H-3 | |
| 132-4 | H-4 | |
| 132-5 | H-5 | |
| 132-6 | H-6 | |
| 132-7 | H-7 | |
| 132-8 | H-8 | |
| 132-9 | H-9 | |
| 132-10 | H-10 | |
| 132-11 | H-11 | |
| 132-12 | H-12 | |
| 132-13 | H-13 | |
| 132-14 | H-14 | |
| 132-15 | H-15 | |
| 132-16 | H-16 | |
| 132-17 | H-17 | |
| 132-18 | H-18 | |

-continued

| | | |
|---|---|---|
| 132-19 | H-1 | H-30 |
| 132-20 | H-2 | |
| 132-21 | H-3 | |
| 132-22 | H-4 | |
| 132-23 | H-5 | |
| 132-24 | H-6 | |
| 132-25 | H-7 | |
| 132-26 | H-8 | |
| 132-27 | H-9 | |
| 132-28 | H-10 | |
| 132-29 | H-11 | |
| 132-30 | H-12 | |
| 132-31 | H-13 | |
| 132-32 | H-14 | |
| 132-33 | H-15 | |
| 132-34 | H-16 | |
| 132-35 | H-17 | |
| 132-36 | H-18 | |

| Com. | R1 | R2 | Y |
|---|---|---|---|
| 132-37 | H-2 | H-1 | H-29 |
| 132-38 | H-3 | | |
| 132-39 | H-4 | | |
| 132-40 | H-5 | | |
| 132-41 | H-6 | | |
| 132-42 | H-7 | | |
| 132-43 | H-8 | | |
| 132-44 | H-9 | | |
| 132-45 | H-10 | | |
| 132-46 | H-11 | | |
| 132-47 | H-12 | | |
| 132-48 | H-13 | | |
| 132-49 | H-14 | | |
| 132-50 | H-15 | | |
| 132-51 | H-16 | | |
| 132-52 | H-17 | | |
| 132-53 | H-18 | | |
| 132-54 | H-2 | H-1 | H-30 |
| 132-55 | H-3 | | |
| 132-56 | H-4 | | |
| 132-57 | H-5 | | |
| 132-58 | H-6 | | |
| 132-59 | H-7 | | |
| 132-60 | H-8 | | |
| 132-61 | H-9 | | |
| 132-62 | H-10 | | |
| 132-63 | H-11 | | |
| 132-64 | H-12 | | |
| 132-65 | H-13 | | |
| 132-66 | H-14 | | |
| 132-67 | H-15 | | |
| 132-68 | H-16 | | |
| 132-69 | H-17 | | |
| 132-70 | H-18 | | |

-continued
Compound 133-X
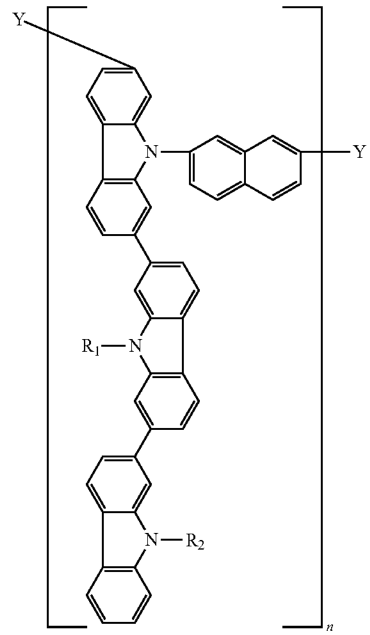
| Com. | R1 = R2 | Y |
|---|---|---|
| 133-1 | H-1 | H-29 |
| 133-2 | H-2 | |
| 133-3 | H-3 | |
| 133-4 | H-4 | |
| 133-5 | H-5 | |
| 133-6 | H-6 | |
| 133-7 | H-7 | |
| 133-8 | H-8 | |
| 133-9 | H-9 | |
| 133-10 | H-10 | |
| 133-11 | H-11 | |
| 133-12 | H-12 | |
| 133-13 | H-13 | |
| 133-14 | H-14 | |
| 133-15 | H-15 | |
| 133-16 | H-16 | |
| 133-17 | H-17 | |
| 133-18 | H-18 | |
| 133-19 | H-1 | H-30 |
| 133-20 | H-2 | |
| 133-21 | H-3 | |
| 133-22 | H-4 | |
| 133-23 | H-5 | |
| 133-24 | H-6 | |
| 133-25 | H-7 | |
| 133-26 | H-8 | |
| 133-27 | H-9 | |
| 133-28 | H-10 | |
| 133-29 | H-11 | |
| 133-30 | H-12 | |
| 133-31 | H-13 | |
| 133-32 | H-14 | |
| 133-33 | H-15 | |
| 133-34 | H-16 | |
| 133-35 | H-17 | |
| 133-36 | H-18 | |
| Com. | R1 | R2 | Y |
|---|---|---|---|
| 133-37 | H-2 | H-1 | H-29 |
| 133-38 | H-3 | | |
| 133-39 | H-4 | | |
| 133-40 | H-5 | | |
| 133-41 | H-6 | | |
| 133-42 | H-7 | | |
| 133-43 | H-8 | | |

-continued
| | | | |
|---|---|---|---|
| 133-44 | H-9 | | |
| 133-45 | H-10 | | |
| 133-46 | H-11 | | |
| 133-47 | H-12 | | |
| 133-48 | H-13 | | |
| 133-49 | H-14 | | |
| 133-50 | H-15 | | |
| 133-51 | H-16 | | |
| 133-52 | H-17 | | |
| 133-53 | H-18 | | |
| 133-54 | H-2 | H-1 | H-30 |
| 133-55 | H-3 | | |
| 133-56 | H-4 | | |
| 133-57 | H-5 | | |
| 133-58 | H-6 | | |
| 133-59 | H-7 | | |
| 133-60 | H-8 | | |
| 133-61 | H-9 | | |
| 133-62 | H-10 | | |
| 133-63 | H-11 | | |
| 133-64 | H-12 | | |
| 133-65 | H-13 | | |
| 133-66 | H-14 | | |
| 133-67 | H-15 | | |
| 133-68 | H-16 | | |
| 133-69 | H-17 | | |
| 133-70 | H-18 | | |
Compound 134-X
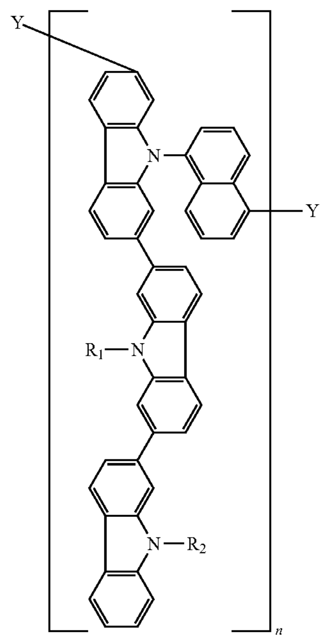
| Com. | R1 = R2 | Y |
|---|---|---|
| 134-1 | H-1 | H-29 |
| 134-2 | H-2 | |
| 134-3 | H-3 | |
| 134-4 | H-4 | |
| 134-5 | H-5 | |
| 134-6 | H-6 | |
| 134-7 | H-7 | |
| 134-8 | H-8 | |
| 134-9 | H-9 | |
| 134-10 | H-10 | |
| 134-11 | H-11 | |
| 134-12 | H-12 | |
| 134-13 | H-13 | |
| 134-14 | H-14 | |
| 134-15 | H-15 | |
| 134-16 | H-16 | |
| 134-17 | H-17 | |
| 134-18 | H-18 | |

-continued

| | | |
|---|---|---|
| 134-19 | H-1 | H-30 |
| 134-20 | H-2 | |
| 134-21 | H-3 | |
| 134-22 | H-4 | |
| 134-23 | H-5 | |
| 134-24 | H-6 | |
| 134-25 | H-7 | |
| 134-26 | H-8 | |
| 134-27 | H-9 | |
| 134-28 | H-10 | |
| 134-29 | H-11 | |
| 134-30 | H-12 | |
| 134-31 | H-13 | |
| 134-32 | H-14 | |
| 134-33 | H-15 | |
| 134-34 | H-16 | |
| 134-35 | H-17 | |
| 134-36 | H-18 | |

| Com. | R1 | R2 | Y |
|---|---|---|---|
| 134-37 | H-2 | H-1 | H-29 |
| 134-38 | H-3 | | |
| 134-39 | H-4 | | |
| 134-40 | H-5 | | |
| 134-41 | H-6 | | |
| 134-42 | H-7 | | |
| 134-43 | H-8 | | |
| 134-44 | H-9 | | |
| 134-45 | H-10 | | |
| 134-46 | H-11 | | |
| 134-47 | H-12 | | |
| 134-48 | H-13 | | |
| 134-49 | H-14 | | |
| 134-50 | H-15 | | |
| 134-51 | H-16 | | |
| 134-52 | H-17 | | |
| 134-53 | H-18 | | |
| 134-54 | H-2 | H-1 | H-30 |
| 134-55 | H-3 | | |
| 134-56 | H-4 | | |
| 134-57 | H-5 | | |
| 134-58 | H-6 | | |
| 134-59 | H-7 | | |
| 134-60 | H-8 | | |
| 134-61 | H-9 | | |
| 134-62 | H-10 | | |
| 134-63 | H-11 | | |
| 134-64 | H-12 | | |
| 134-65 | H-13 | | |
| 134-66 | H-14 | | |
| 134-67 | H-15 | | |
| 134-68 | H-16 | | |
| 134-69 | H-17 | | |
| 134-70 | H-18 | | |

-continued
Compound 135-X
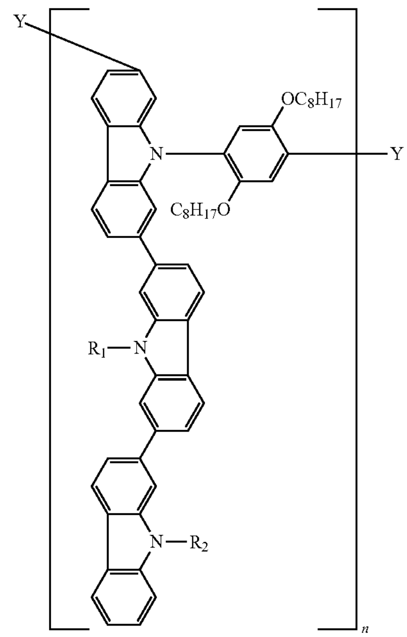
| Com. | R1 = R2 | Y |
| --- | --- | --- |
| 135-1 | H-1 | H-29 |
| 135-2 | H-2 | |
| 135-3 | H-3 | |
| 135-4 | H-4 | |
| 135-5 | H-5 | |
| 135-6 | H-6 | |
| 135-7 | H-7 | |
| 135-8 | H-8 | |
| 135-9 | H-9 | |
| 135-10 | H-10 | |
| 135-11 | H-11 | |
| 135-12 | H-12 | |
| 135-13 | H-13 | |
| 135-14 | H-14 | |
| 135-15 | H-15 | |
| 135-16 | H-16 | |
| 135-17 | H-17 | |
| 135-18 | H-18 | |
| 135-19 | H-1 | H-30 |
| 135-20 | H-2 | |
| 135-21 | H-3 | |
| 135-22 | H-4 | |
| 135-23 | H-5 | |
| 135-24 | H-6 | |
| 135-25 | H-7 | |
| 135-26 | H-8 | |
| 135-27 | H-9 | |
| 135-28 | H-10 | |
| 135-29 | H-11 | |
| 135-30 | H-12 | |
| 135-31 | H-13 | |
| 135-32 | H-14 | |
| 135-33 | H-15 | |
| 135-34 | H-16 | |
| 135-35 | H-17 | |
| 135-36 | H-18 | |
| Com. | R1 | R2 | Y |
| --- | --- | --- | --- |
| 135-37 | H-2 | H-1 | H-29 |
| 135-38 | H-3 | | |
| 135-39 | H-4 | | |
| 135-40 | H-5 | | |
| 135-41 | H-6 | | |
| 135-42 | H-7 | | |
| 135-43 | H-8 | | |

-continued
| | | | |
|---|---|---|---|
| 135-44 | H-9 | | |
| 135-45 | H-10 | | |
| 135-46 | H-11 | | |
| 135-47 | H-12 | | |
| 135-48 | H-13 | | |
| 135-49 | H-14 | | |
| 135-50 | H-15 | | |
| 135-51 | H-16 | | |
| 135-52 | H-17 | | |
| 135-53 | H-18 | | |
| 135-54 | H-2 | H-1 | H-30 |
| 135-55 | H-3 | | |
| 135-56 | H-4 | | |
| 135-57 | H-5 | | |
| 135-58 | H-6 | | |
| 135-59 | H-7 | | |
| 135-60 | H-8 | | |
| 135-61 | H-9 | | |
| 135-62 | H-10 | | |
| 135-63 | H-11 | | |
| 135-64 | H-12 | | |
| 135-65 | H-13 | | |
| 135-66 | H-14 | | |
| 135-67 | H-15 | | |
| 135-68 | H-16 | | |
| 135-69 | H-17 | | |
| 135-70 | H-18 | | |
Compound 136-X
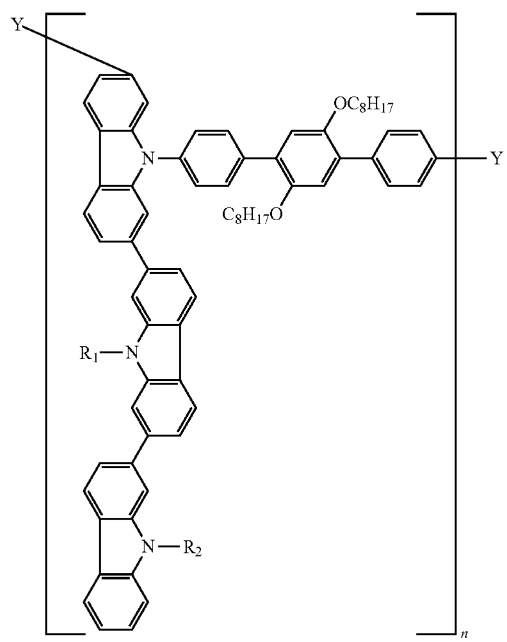
| Com. | R1 = R2 | Y |
|---|---|---|
| 136-1 | H-1 | H-29 |
| 136-2 | H-2 | |
| 136-3 | H-3 | |
| 136-4 | H-4 | |
| 136-5 | H-5 | |
| 136-6 | H-6 | |
| 136-7 | H-7 | |
| 136-8 | H-8 | |
| 136-9 | H-9 | |
| 136-10 | H-10 | |
| 136-11 | H-11 | |
| 136-12 | H-12 | |
| 136-13 | H-13 | |
| 136-14 | H-14 | |
| 136-15 | H-15 | |
| 136-16 | H-16 | |
| 136-17 | H-17 | |
| 136-18 | H-18 | |

-continued

| | | |
|---|---|---|
| 136-19 | H-1 | H-30 |
| 136-20 | H-2 | |
| 136-21 | H-3 | |
| 136-22 | H-4 | |
| 136-23 | H-5 | |
| 136-24 | H-6 | |
| 136-25 | H-7 | |
| 136-26 | H-8 | |
| 136-27 | H-9 | |
| 136-28 | H-10 | |
| 136-29 | H-11 | |
| 136-30 | H-12 | |
| 136-31 | H-13 | |
| 136-32 | H-14 | |
| 136-33 | H-15 | |
| 136-34 | H-16 | |
| 136-35 | H-17 | |
| 136-36 | H-18 | |

| Com. | R1 | R2 | Y |
|---|---|---|---|
| 136-37 | H-2 | H-1 | H-29 |
| 136-38 | H-3 | | |
| 136-39 | H-4 | | |
| 136-40 | H-5 | | |
| 136-41 | H-6 | | |
| 136-42 | H-7 | | |
| 136-43 | H-8 | | |
| 136-44 | H-9 | | |
| 136-45 | H-10 | | |
| 136-46 | H-11 | | |
| 136-47 | H-12 | | |
| 136-48 | H-13 | | |
| 136-49 | H-14 | | |
| 136-50 | H-15 | | |
| 136-51 | H-16 | | |
| 136-52 | H-17 | | |
| 136-53 | H-18 | | |
| 136-54 | H-2 | H-1 | H-30 |
| 136-55 | H-3 | | |
| 136-56 | H-4 | | |
| 136-57 | H-5 | | |
| 136-58 | H-6 | | |
| 136-59 | H-7 | | |
| 136-60 | H-8 | | |
| 136-61 | H-9 | | |
| 136-62 | H-10 | | |
| 136-63 | H-11 | | |
| 136-64 | H-12 | | |
| 136-65 | H-13 | | |
| 136-66 | H-14 | | |
| 136-67 | H-15 | | |
| 136-68 | H-16 | | |
| 136-69 | H-17 | | |
| 136-70 | H-18 | | |

-continued
Compound 137-X
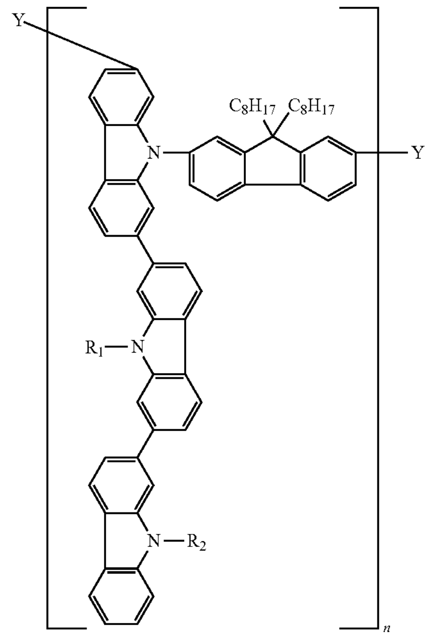
| Com. | R1 = R2 | Y |
|---|---|---|
| 137-1 | H-1 | H-29 |
| 137-2 | H-2 | |
| 137-3 | H-3 | |
| 137-4 | H-4 | |
| 137-5 | H-5 | |
| 137-6 | H-6 | |
| 137-7 | H-7 | |
| 137-8 | H-8 | |
| 137-9 | H-9 | |
| 137-10 | H-10 | |
| 137-11 | H-11 | |
| 137-12 | H-12 | |
| 137-13 | H-13 | |
| 137-14 | H-14 | |
| 137-15 | H-15 | |
| 137-16 | H-16 | |
| 137-17 | H-17 | |
| 137-18 | H-18 | |
| 137-19 | H-1 | H-30 |
| 137-20 | H-2 | |
| 137-21 | H-3 | |
| 137-22 | H-4 | |
| 137-23 | H-5 | |
| 137-24 | H-6 | |
| 137-25 | H-7 | |
| 137-26 | H-8 | |
| 137-27 | H-9 | |
| 137-28 | H-10 | |
| 137-29 | H-11 | |
| 137-30 | H-12 | |
| 137-31 | H-13 | |
| 137-32 | H-14 | |
| 137-33 | H-15 | |
| 137-34 | H-16 | |
| 137-35 | H-17 | |
| 137-36 | H-18 | |
| Com. | R1 | R2 | Y |
|---|---|---|---|
| 137-37 | H-2 | H-1 | H-29 |
| 137-38 | H-3 | | |
| 137-39 | H-4 | | |
| 137-40 | H-5 | | |
| 137-41 | H-6 | | |
| 137-42 | H-7 | | |
| 137-43 | H-8 | | |

-continued
| | | | |
|---|---|---|---|
| 137-44 | H-9 | | |
| 137-45 | H-10 | | |
| 137-46 | H-11 | | |
| 137-47 | H-12 | | |
| 137-48 | H-13 | | |
| 137-49 | H-14 | | |
| 137-50 | H-15 | | |
| 137-51 | H-16 | | |
| 137-52 | H-17 | | |
| 137-53 | H-18 | | |
| 137-54 | H-2 | H-1 | H-30 |
| 137-55 | H-3 | | |
| 137-56 | H-4 | | |
| 137-57 | H-5 | | |
| 137-58 | H-6 | | |
| 137-59 | H-7 | | |
| 137-60 | H-8 | | |
| 137-61 | H-9 | | |
| 137-62 | H-10 | | |
| 137-63 | H-11 | | |
| 137-64 | H-12 | | |
| 137-65 | H-13 | | |
| 137-66 | H-14 | | |
| 137-67 | H-15 | | |
| 137-68 | H-16 | | |
| 137-69 | H-17 | | |
| 137-70 | H-18 | | |
Compound 138-X
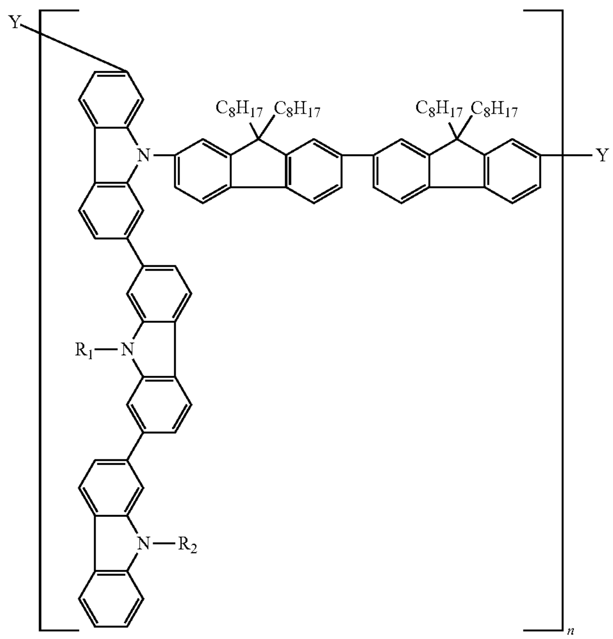
| Com. | R1 = R2 | Y |
|---|---|---|
| 138-1 | H-1 | H-29 |
| 138-2 | H-2 | |
| 138-3 | H-3 | |
| 138-4 | H-4 | |
| 138-5 | H-5 | |
| 138-6 | H-6 | |
| 138-7 | H-7 | |
| 138-8 | H-8 | |
| 138-9 | H-9 | |
| 138-10 | H-10 | |
| 138-11 | H-11 | |
| 138-12 | H-12 | |
| 138-13 | H-13 | |
| 138-14 | H-14 | |
| 138-15 | H-15 | |
| 138-16 | H-16 | |
| 138-17 | H-17 | |
| 138-18 | H-18 | |

-continued

| | | | |
|---|---|---|---|
| 138-19 | H-1 | | H-30 |
| 138-20 | H-2 | | |
| 138-21 | H-3 | | |
| 138-22 | H-4 | | |
| 138-23 | H-5 | | |
| 138-24 | H-6 | | |
| 138-25 | H-7 | | |
| 138-26 | H-8 | | |
| 138-27 | H-9 | | |
| 138-28 | H-10 | | |
| 138-29 | H-11 | | |
| 138-30 | H-12 | | |
| 138-31 | H-13 | | |
| 138-32 | H-14 | | |
| 138-33 | H-15 | | |
| 138-34 | H-16 | | |
| 138-35 | H-17 | | |
| 138-36 | H-18 | | |

| Com. | R1 | R2 | Y |
|---|---|---|---|
| 138-37 | H-2 | H-1 | H-29 |
| 138-38 | H-3 | | |
| 138-39 | H-4 | | |
| 138-40 | H-5 | | |
| 138-41 | H-6 | | |
| 138-42 | H-7 | | |
| 138-43 | H-8 | | |
| 138-44 | H-9 | | |
| 138-45 | H-10 | | |
| 138-46 | H-11 | | |
| 138-47 | H-12 | | |
| 138-48 | H-13 | | |
| 138-49 | H-14 | | |
| 138-50 | H-15 | | |
| 138-51 | H-16 | | |
| 138-52 | H-17 | | |
| 138-53 | H-18 | | |
| 138-54 | H-2 | H-1 | H-30 |
| 138-55 | H-3 | | |
| 138-56 | H-4 | | |
| 138-57 | H-5 | | |
| 138-58 | H-6 | | |
| 138-59 | H-7 | | |
| 138-60 | H-8 | | |
| 138-61 | H-9 | | |
| 138-62 | H-10 | | |
| 138-63 | H-11 | | |
| 138-64 | H-12 | | |
| 138-65 | H-13 | | |
| 138-66 | H-14 | | |
| 138-67 | H-15 | | |
| 138-68 | H-16 | | |
| 138-69 | H-17 | | |
| 138-70 | H-18 | | |

-continued
Compound 139-X
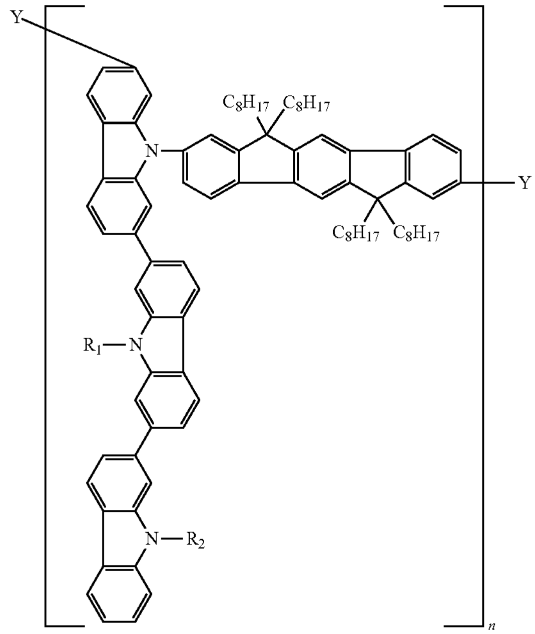
| Com. | R1 = R2 | Y |
|---|---|---|
| 139-1 | H-1 | H-29 |
| 139-2 | H-2 | |
| 139-3 | H-3 | |
| 139-4 | H-4 | |
| 139-5 | H-5 | |
| 139-6 | H-6 | |
| 139-7 | H-7 | |
| 139-8 | H-8 | |
| 139-9 | H-9 | |
| 139-10 | H-10 | |
| 139-11 | H-11 | |
| 139-12 | H-12 | |
| 139-13 | H-13 | |
| 139-14 | H-14 | |
| 139-15 | H-15 | |
| 139-16 | H-16 | |
| 139-17 | H-17 | |
| 139-18 | H-18 | |
| 139-19 | H-1 | H-30 |
| 139-20 | H-2 | |
| 139-21 | H-3 | |
| 139-22 | H-4 | |
| 139-23 | H-5 | |
| 139-24 | H-6 | |
| 139-25 | H-7 | |
| 139-26 | H-8 | |
| 139-27 | H-9 | |
| 139-28 | H-10 | |
| 139-29 | H-11 | |
| 139-30 | H-12 | |
| 139-31 | H-13 | |
| 139-32 | H-14 | |
| 139-33 | H-15 | |
| 139-34 | H-16 | |
| 139-35 | H-17 | |
| 139-36 | H-18 | |
| Com. | R1 | R2 | Y |
|---|---|---|---|
| 139-37 | H-2 | H-1 | H-29 |
| 139-38 | H-3 | | |
| 139-39 | H-4 | | |
| 139-40 | H-5 | | |
| 139-41 | H-6 | | |
| 139-42 | H-7 | | |
| 139-43 | H-8 | | |

-continued
| | | | |
|---|---|---|---|
| 139-44 | H-9 | | |
| 139-45 | H-10 | | |
| 139-46 | H-11 | | |
| 139-47 | H-12 | | |
| 139-48 | H-13 | | |
| 139-49 | H-14 | | |
| 139-50 | H-15 | | |
| 139-51 | H-16 | | |
| 139-52 | H-17 | | |
| 139-53 | H-18 | | |
| 139-54 | H-2 | H-1 | H-30 |
| 139-55 | H-3 | | |
| 139-56 | H-4 | | |
| 139-57 | H-5 | | |
| 139-58 | H-6 | | |
| 139-59 | H-7 | | |
| 139-60 | H-8 | | |
| 139-61 | H-9 | | |
| 139-62 | H-10 | | |
| 139-63 | H-11 | | |
| 139-64 | H-12 | | |
| 139-65 | H-13 | | |
| 139-66 | H-14 | | |
| 139-67 | H-15 | | |
| 139-68 | H-16 | | |
| 139-69 | H-17 | | |
| 139-70 | H-18 | | |
Compound 140-X
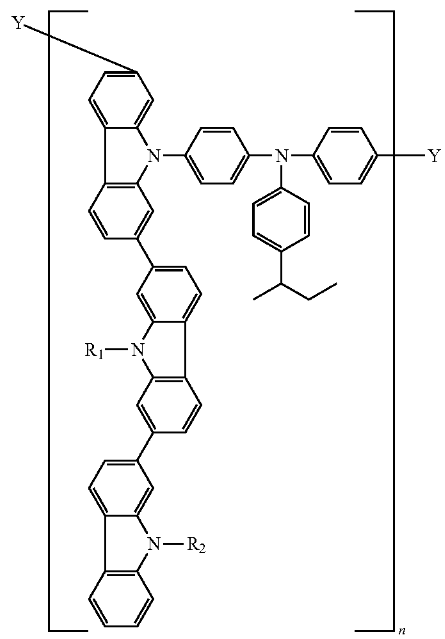
| Com. | R1 = R2 | Y |
|---|---|---|
| 140-1 | H-1 | H-29 |
| 140-2 | H-2 | |
| 140-3 | H-3 | |
| 140-4 | H-4 | |
| 140-5 | H-5 | |
| 140-6 | H-6 | |
| 140-7 | H-7 | |
| 140-8 | H-8 | |
| 140-9 | H-9 | |
| 140-10 | H-10 | |
| 140-11 | H-11 | |
| 140-12 | H-12 | |
| 140-13 | H-13 | |
| 140-14 | H-14 | |
| 140-15 | H-15 | |
| 140-16 | H-16 | |
| 140-17 | H-17 | |
| 140-18 | H-18 | |

-continued

| | | | |
|---|---|---|---|
| 140-19 | H-1 | | H-30 |
| 140-20 | H-2 | | |
| 140-21 | H-3 | | |
| 140-22 | H-4 | | |
| 140-23 | H-5 | | |
| 140-24 | H-6 | | |
| 140-25 | H-7 | | |
| 140-26 | H-8 | | |
| 140-27 | H-9 | | |
| 140-28 | H-10 | | |
| 140-29 | H-11 | | |
| 140-30 | H-12 | | |
| 140-31 | H-13 | | |
| 140-32 | H-14 | | |
| 140-33 | H-15 | | |
| 140-34 | H-16 | | |
| 140-35 | H-17 | | |
| 140-36 | H-18 | | |

| Com. | R1 | R2 | Y |
|---|---|---|---|
| 140-37 | H-2 | H-1 | H-29 |
| 140-38 | H-3 | | |
| 140-39 | H-4 | | |
| 140-40 | H-5 | | |
| 140-41 | H-6 | | |
| 140-42 | H-7 | | |
| 140-43 | H-8 | | |
| 140-44 | H-9 | | |
| 140-45 | H-10 | | |
| 140-46 | H-11 | | |
| 140-47 | H-12 | | |
| 140-48 | H-13 | | |
| 140-49 | H-14 | | |
| 140-50 | H-15 | | |
| 140-51 | H-16 | | |
| 140-52 | H-17 | | |
| 140-53 | H-18 | | |
| 140-54 | H-2 | H-1 | H-30 |
| 140-55 | H-3 | | |
| 140-56 | H-4 | | |
| 140-57 | H-5 | | |
| 140-58 | H-6 | | |
| 140-59 | H-7 | | |
| 140-60 | H-8 | | |
| 140-61 | H-9 | | |
| 140-62 | H-10 | | |
| 140-63 | H-11 | | |
| 140-64 | H-12 | | |
| 140-65 | H-13 | | |
| 140-66 | H-14 | | |
| 140-67 | H-15 | | |
| 140-68 | H-16 | | |
| 140-69 | H-17 | | |
| 140-70 | H-18 | | |

The polymer of the invention can be formed into a thin film by a coating method. As a coating method, wet film forming methods can be suitably used. Specifically, a thin film can be formed by a relief printing method, a intaglio printing method, a planographic printing method, a stencil printing method, and the combination of these and an offset printing method, and an inkjet printing method, a dispenser spin coating method, a bar coating method, a dip coating method, a spray coating method, a slit coating method, a roll coating method, a cap coating method, a gravure roll coating method and a meniscus coating method. In particular, when a fine patterning is desired, a relief printing method, a intaglio printing method, a planographic printing method, a stencil printing method, and the combination of these and an offset printing method, and an inkjet printing method, a dispenser spin coating method and the like are preferable. In addition, a method in which after the polymer is formed on a thin film on a precursor substrate before transcription by the above-mentioned dry or wet film forming methods, patterns are printed on an intended wiring substrate with electrodes by using laser beam or hot press, can be used. The film formation by these methods can be conducted under conditions known to one skilled in the art, and the details thereof are omitted.

An applying liquid used in a coating method contains the polymer of the invention and a solvent. The polymer contained in the applying liquid may be either dissolved or dispersed in the solvent.

The solvent is preferably an organic solvent. Examples of the organic solvent include chlorine-based solvents such as chloroform, chlorobenzene, chlorotoluene, chloroxylene, chloroanisole, dichloromethane, dichlorobenzene, dichlorotoluene, dichloroethane, trichloroethane, trichlorobenzene, trichloromethylbenzene, bromobenzene, dibromobenzene and bromoanisole, ether-based solvents such as tetrahydrofuran, dioxane, dioxolan, oxazole, methylbenzoxazole, benzisoxazole, furan, furazan, benzofuran and dihydrobenzofuran, aromatic hydrocarbon-based solvents such as ethylbenzene, diethylbenzene, triethylbenzene, trimethylbenzene, trimethoxybenzene, propylbenzene, isopropylbenzene, diisopropylbenzene, dibutylbenzene, amylbenzene, dihexylbenzene, cyclohexylbenzene, tetramethylbenzene, dodecylbenzene, benzonitrile, acetophenone, methyl acetophenone, methoxy acetophenone, toluic acid ethyl ester, toluene, ethyltoluene, methoxytoluene, dimethoxytoluene, trimethoxytoluene, isopropyltoluene, xylene, butylxylene, isopropylxylene, anisole, ethylanisole, dimethylanisole, trimethylanisole, propylanisole, isopropylanisole, butylanisole, methylethylanisole, anethole anisyl alcohol, methyl benzoate, ethyl benzoate, propyl benzoate, butyl benzoate, diphenyl ether, butylphenyl ether, benzylmethyl ether, benzylethyl ether, methylenedioxybenzene, methylnaphthalene, tetrahydronaphthalene, aniline, methylaniline, ethylaniline, butylaniline, biphenyl, methylbiphenyl and isopropylbiphenyl, aliphatic hydrocarbon-based solvents such as cyclohexane, methylcyclohexane, n-pentane, n-hexane, n-heptane, n-octane, n-nonane, n-decane, tetradecane, decalin and isopropylcyclohexane, ketone-based solvents such as acetone, metylethylketone, cyclohexanone and acetophenone, ester-based solvents such as ethyl acetate, butyl acetate, ethyl cellosolve acetate, methyl benzoate and phenyl acetate, polyalcohols such as ethylene glycol, ethylene glycol monobutyl ether, ethylene glycol monoethyl ether, ethylene glycol monomethyl ether, dimethoxyethane, propylene glycol, diethoxyethane, triethylene glycol monoethyl ether, glycerin and 1,2-hexanediol and derivatives thereof, alcohol-based solvents such as methanol, ethanol, propanol, isopropanol and cyclohexanol, sulfoxide-based solvents such as dimethyl sulfoxide, and amide-based solvents such as N-methyl-2-pyrrolidone and N,N-dimethylformamide. Further, these organic solvents may be used singly or in combination of two or more.

Of these, in respect of solubility, uniform film formation, viscosity or the like, it is preferred that the solvent contain at least one of toluene, xylene, ethylbenzene, amylbenzene, anisole, 4-methoxytoluene, 2-methoxytoluene, 1,2-dimethoxybenzene, mesitylene, tetrahydronaphthalene, cyclohexylbenzene, 2,3-dihydrobenzofuran, cyclohexanone and methylcyclohexanone.

Further, to the solution for film-formation, if needed, a viscosity modifier, a regulator of surface tension, a crosslinking reaction initiator, and a crosslinking reaction catalyst can be added. As the viscosity modifier, regulator of surface tension, crosslinking reaction initiator, and crosslinking reaction catalyst, it is preferred that one which exerts no adverse effect on the device characteristics even if it remains in a film or one which can be removed from a film during film formation be selected.

In the invention, a dispersion or a solution obtained by dispersing or dissolving at least one polymer contained in a solvent can be preferably used.

After film formation, a thin film of the polymer can be formed by drying in vacuum or with heating to remove a solvent. The thin film can become completely insoluble through the crosslinking of the polymer by exposing to light or heating (about 250° C., for example).

Meanwhile, during formation of a thin film, an antioxidant such as a phosphate antioxidant, which has no adverse effect on the performance of an organic EL device, and an initiator such as a polymeric initiator may be mixed. In addition, other compounds (acceptor materials described later, for example) and the like may be mixed depending on the intended use.

As a method for hardening a polymer by crosslinking (polymerization), a radical polymerization method, an ion polymerization method, a living polymerization method, a radical living polymerization method, a coordination polymerization method or the like can be given, although not being limited to them.

As an initiator of a radical polymerization method, an azo compound, a peroxide or the like can be given. Azobisisobutyronitrile (AIBN), an azobis isobutyl acid diester derivative, and benzoyl peroxide (BPO) are preferable.

As an initiator of a cation polymerization, various strong acids (p-toluenesulfonic acid, trifluoromethanesufonic acid and the like) and a Lewis acid are preferable.

Further, the polymerization can be conducted by light irradiation and/or heat treatment.

The polymer of the invention can be formed into a thin film by a coating method. The resulting film exhibits hole-transporting properties. Therefore, it is useful as a material for electronics. For example, it can be used as an electronic element such as an electroluminescence device, a photoelectric conversion element or a transistor.

In particular, it is suitable for a material for an organic electroluminescence device, particularly a material used in a hole-transporting region between an anode and an emitting layer (a hole-transporting layer, a hole-injecting layer or the like).

The organic EL device of the invention comprises one or more organic thin film layers comprising at least an emitting layer between a cathode and an anode. At least one of the organic thin film layers comprises the polymer of the invention.

In the invention, it is preferred that an organic thin film layer be disposed between an anode and an emitting layer, and the polymer of the invention be contained in the organic thin film layer. As a layer formed in a hole-transporting region, a hole-transporting layer or a hole-injecting layer can be given.

In addition, the hole-injecting layer or hole-transporting layer is preferably in contact with the emitting layer. In this case, subsequent to the formation of the hole-injecting layer or the hole-transporting layer, an emitting layer can be formed by a wet film formation method.

In the invention, it is preferred that the above-mentioned polymer be contained in at least one of the hole-transporting layer and the hole-injecting layer as a main component. Specifically, the hole-transporting layer or the hole-injecting layer preferably contains the polymer of the invention in an amount of 51 to 100 wt %.

Further, it is preferred that at least one of the hole-transporting layer and the hole-injecting layer contain an acceptor material. In particular, it is preferred that the layer that be in contact with an anode contain an acceptor material. By allowing an acceptor material to be contained, the hole density in a hole-injecting/transporting layer is increased or the hole mobility is improved. Hence, the resulting organic EL device can be driven at a lower voltage, and the carrier balance can be improved, thereby leading to a prolonged life.

The acceptor material is preferably an organic compound including an electron-attracting substituent or an electron-deficient ring.

As the electron-attracting substituent, halogen, CN—, a carbonyl group, an aryl boron group or the like can be given.

The electron-deficient ring includes, but not limited to, a compound or the like selected from the group consisting of 2-pyridyl, 3-pyridyl, 4-pyridyl, 2-quinolyl, 3-quinolyl, 4-quinolyl, 2-imidazole, 4-imidazole, 3-pyrazole, 4-pyrazole, pyridazine, pyrimidine, pyrazine, cinnoline, phthalazine, quinazoline, quinoxaline, 3-(1,2,4-N)-triazolyl, 5-(1,2,4-N)-triazolyl, 5-tetrazolyl, 4-(1-O,3-N)-oxazole, 5-(1-O,3-N)-oxazole, 4-(1-S,3-N)-thiazole, 5-(1-S,3-N)-thiazole, 2-benzoxazole, 2-benzothiazole, 4-(1,2,3-N)-benzotriazole and benzimidazole.

As a representative device configuration of an organic EL device of the invention, the following configurations (1) to (13) can be given.

(1) Anode/emitting layer/cathode
(2) Anode/hole-injecting layer/emitting layer/cathode
(3) Anode/emitting layer/electron-injecting layer/cathode
(4) Anode/hole-injecting layer/emitting layer/electron-injecting layer/cathode
(5) Anode/organic semiconductor layer/emitting layer/cathode
(6) Anode/organic semiconductor layer/electron blocking layer/emitting layer/cathode
(7) Anode/organic semiconductor layer/emitting layer/adhesion improving layer/cathode
(8) Anode/hole-injecting layer/hole-transporting layer/emitting layer/electron injecting layer/cathode
(9) Anode/insulating layer/emitting layer/insulating layer/cathode
(10) Anode/inorganic semiconductor layer/insulating layer/emitting layer/insulating layer/cathode
(11) Anode/organic semiconductor layer/insulating layer/emitting layer/insulating layer/cathode
(12) Anode/insulating layer/hole-injecting layer/hole-transporting layer/emitting layer/insulating layer/cathode
(13) Anode/insulating layer/hole-injecting layer/hole-transporting layer/emitting layer/electron injecting layer/cathode Of these, normally, the configuration (8) is preferably used. However, the device configuration is not limited to these.

In an organic EL device of the invention, for other constituent elements than an organic thin film layer comprising a polymer of the invention, known materials can be used. For example, an emitting layer preferably comprises a styrylamine compound, an arylamine compound or a fluoranthene-based compound.

The layers which are not the organic thin film layer comprising the polymer of the invention can be formed by known methods including dry film forming methods such as vacuum vapor deposition, sputtering or plasma ion-plating, and wet film forming methods such as coating or printing. Although the film thickness of each layer is not particularly restricted, it is required to be a proper value. If the film thickness is too large, a large applied voltage is required for a predetermined light output, thereby causing efficiency to be lowered. If the film thickness is too small, pinholes and the like are generated, whereby sufficient luminance can hardly be obtained when an electric field is impressed. The film thickness is normally in a range from 5 nm to 10 μm, further preferably in a range from 10 nm to 0.2 μm.

When a top layer is stacked after making a polymer of the invention insoluble, both of dry and wet film forming methods can be used as described above. In particular, wet film forming methods can be suitably used. As the methods for stacking the top layer, a relief printing method, a intaglio printing method, a planographic printing method, a stencil printing method, and the combination of these and an offset printing method, and an inkjet printing method, a dispenser spin coating method, a bar coating method, a dip coating method, a spray coating method, a slit coating method, a roll coating method, a cap coating method, a gravure roll coating method and a meniscus coating method can be applied.

By the above-mentioned various materials and methods for forming a layer, an anode, an emitting layer, if needed, a hole-injecting/transporting layer and, if needed, an electron-injecting/transporting layer are formed and further a cathode is formed, whereby an organic EL device can be fabricated. From a cathode to an anode, an organic EL device can be fabricated in the reverse order of the above-mentioned order.

EXAMPLES

First Invention

Example 1

The following polymer P1-1 was synthesized.

P1-1
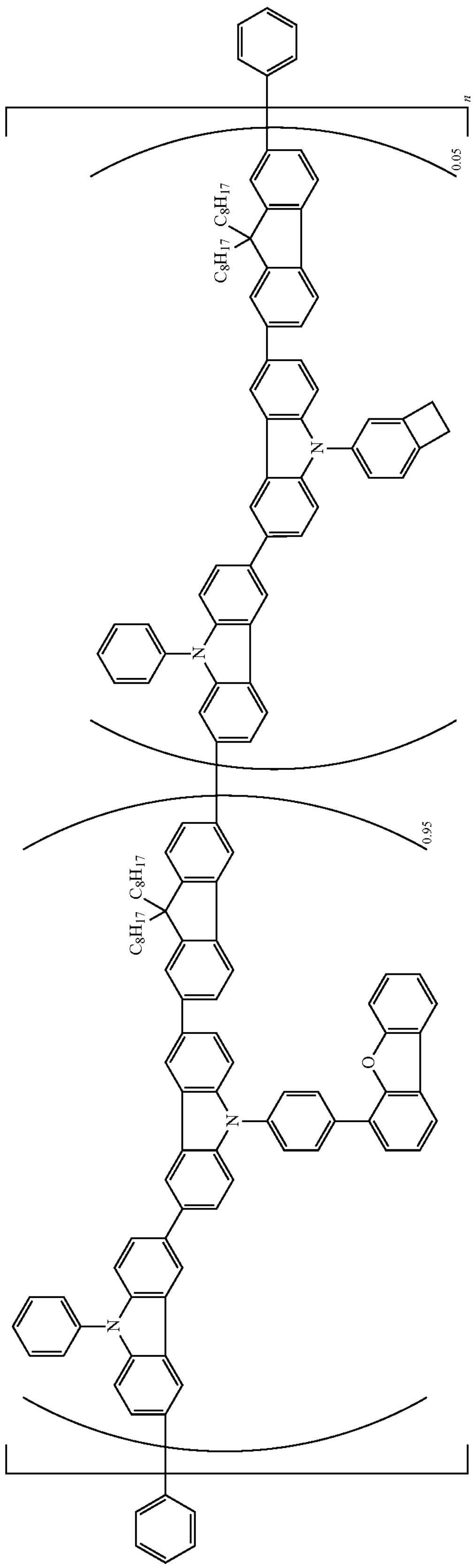

(1) Synthesis of Monomer M-1
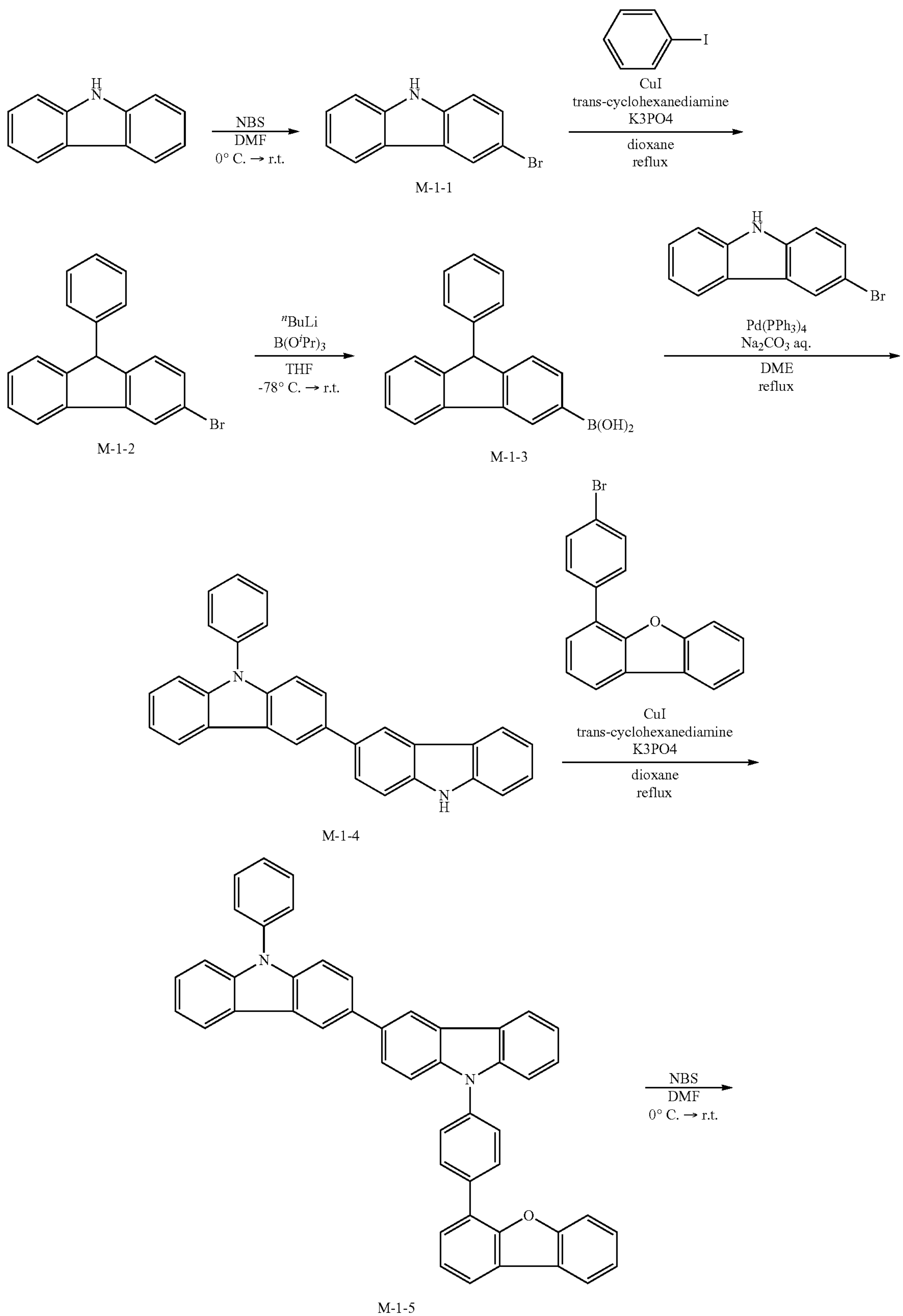

-continued

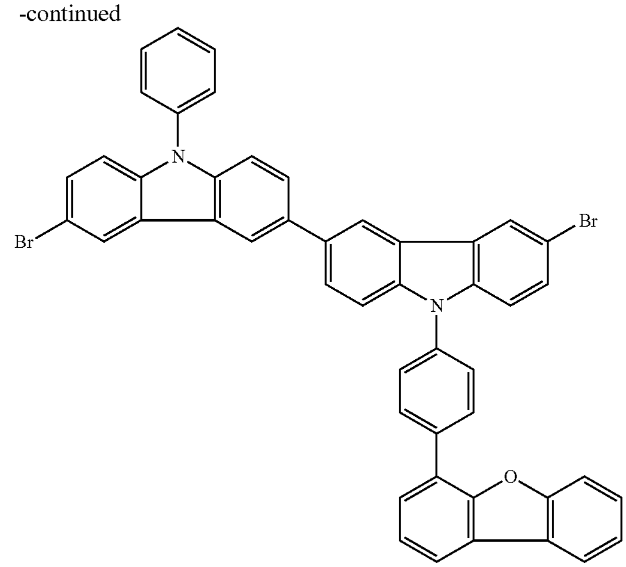

M-1

(a) Synthesis of Intermediate M-1-1

Under a nitrogen atmosphere, 10.0 g (59.8 mmol) of carbazole and 100 mL of N,N-dimethylformamide (DMF) were placed in a 500 mL three-necked flask equipped with a cooling tube. The mixture was cooled to 0° C. in an ice water bath. After cooling, a solution obtained by dissolving 10.6 g (59.8 mmol) of N-bromosuccinimide (NBS) in 100 mL of DMF was added dropwise slowly. After completion of the addition, the flask was taken from the ice water bath, returned to room temperature and stirred for 8 hours.

A reaction liquid was dropped in water to precipitate solids. By filtration, a precipitate was obtained. The resulting crude product was purified by means of silica-gel chromatography (toluene). The resulting solids were dried under reduced pressure to obtain 12.2 g of white solids (yield: 83%).

By $^{1}$H-NMR spectrum and Field Desorption Mass Spectrometry (hereinafter referred to as FD-MS) analysis, the white powder obtained was confirmed to be the intermediate M-1-1.

(b) Synthesis of Intermediate M-1-2

Under a nitrogen atmosphere, 6.0 g (24.3 mmol) of M-1-1, 5.4 g (26.7 mmol) of iodobenzene, 1.4 g (7.29 mmol) of CuI, 0.8 g (7.29 mmol) of trans-cyclohexanediamine, 10.3 g (48.6 mmol) of potassium phosphate and 120 mL of dioxane were placed in a 300 mL three-necked flask equipped with a cooling tube. The mixture was heated under reflux for 8 hours.

After completion of the reaction, a solvent was removed under reduced pressure. Then, 100 mL of dichloromethane and 100 mL of water were added to extract an intended substance to take out an organic layer. $MgSO_4$ was added to the organic layer thus taken out for drying. $MgSO_4$ was removed by filtration. A solvent was removed under reduced pressure, and the crude product obtained was purified by means of silica-gel chromatography (toluene:hexane=1:10). The resulting solids were dried under reduced pressure to obtain 6.7 g of white solids (yield: 85%).

By $^{1}$H-NMR spectrum and FD-MS analysis, the white powder obtained was confirmed to be the intermediate M-1-2.

(C) Synthesis of Intermediate M-1-3

Under a nitrogen atmosphere, 4.0 g (12.5 mmol) of M-1-2, 2.8 g (15.0 mmol) of triisopropyl borate and 60 mL of dehydrated tetrahydrofuran (THF) were placed in a 300 mL three-necked flask equipped with a cooling tube. The mixture was stirred and cooled to −78° C. in a methanol/dry ice bath. After cooling, 38 mL (60.9 mmol) of a solution of n-butyllithium (1.61M) was added dropwise slowly. After the dropwise addition, the mixture was cooled and stirred for an hour. Then, the mixture was returned to room temperature and stirred for 7 hours. After completion of the reaction, 10 mL of methanol was added dropwise, and further 30 mL of a 1N aqueous solution of HCl was added dropwise. By adding methylene chloride and water, an intended substance was extracted to take out an organic phase. $MgSO_4$ was added to the organic phase thus taken out for drying. $MgSO_4$ was removed by filtration. A solvent was removed under reduced pressure and isolated by means of column chromatography to obtain 2.1 g of white solids (yield: 60%). By $^{1}$H-NMR spectrum and FD-MS analysis, the white powder obtained was confirmed to be the intermediate M-1-3.

(d) Synthesis of Intermediate M-1-4

Under a nitrogen atmosphere, 4 g (10.0 mmol) of M-1-1, 3.7 g (10.0 mmol) of M-1-3, 0.2 g (0.2 mol) of $Pd(PPh_3)_4$, 2.1 g (20.0 mmol) of sodium carbonate, 40 mL of dimethyl ether (DME) and 20 mL of water were placed in a 300 mL three-necked flask equipped with a cooling tube. The mixture was under reflux heated and stirred for 8 hours. After completion of the reaction, a solvent was removed under reduced pressure. Then, 100 mL of dichloromethane and 100 mL of water were added to extract an intended substance to take out an organic phase. $MgSO_4$ was added to the organic phase thus taken out for drying. $MgSO_4$ was removed by filtration. A solvent was removed under reduced pressure, and the crude product obtained was purified by means of silica-gel chromatography. The resulting solids were dried under reduced pressure to obtain 3.0 g of white solids (yield: 74%).

By $^{1}$H-NMR spectrum and FD-MS analysis, the white powder obtained was confirmed to be the intermediate M-1-4.

(e) Synthesis of Intermediate M-1-5

Under a nitrogen atmosphere, 2.5 g (6.1 mmol) of M-1-4, 2.0 g (6.1 mmol) of 4-(4-bromophenyl)-dibenzofuran, 0.4 g (1.8 mmol) of CuI, trans-cyclohexanediamine, 2.6 g (12.2 mmol) of potassium phosphate and 30 mL of dioxane were mixed, and heated under reflux for 8 hours.

After completion of the reaction, the solvent was removed under reduced pressure. Then, 100 mL of dichloromethane and 100 mL of water were added to extract an intended substance to take out an organic phase. $MgSO_4$ was added to the organic phase thus taken out for drying. $MgSO_4$ was removed by filtration. The solvent was removed under reduced pressure, and a crude product obtained was purified by means of silica-gel chromatography. The resulting solids were dried under reduced pressure to obtain 2.8 g of white solids (yield: 70%).

By $^{1}$H-NMR spectrum and FD-MS analysis, the white powder obtained was confirmed to be the intermediate M-1-5.

(f) Synthesis of M-1

Under a nitrogen atmosphere, 2.5 g (3.8 mmol) of M-1-5 and 40 mL of DMF were mixed and cooled to 0° C. in an ice water bath.

After cooling, a solution obtained by dissolving 1.4 g (8.0 mmol) of N-bromosuccinimide in 40 mL of DMF was added dropwise slowly. After completion of the addition, the flask was taken from the ice water bath, returned to room temperature and stirred for 8 hours. A reaction liquid was dropped in water to precipitate solids. The resulting solids were collected by suction filtration.

The resulting crude product was purified by means of silica-gel chromatography. The resulting solids were dried under reduced pressure to obtain 2.5 g of white solids (yield: 80%).

By $^{1}$H-NMR spectrum and FD-MS analysis, the white powder obtained was confirmed to be M-1.

(2) Synthesis of Monomer M-2

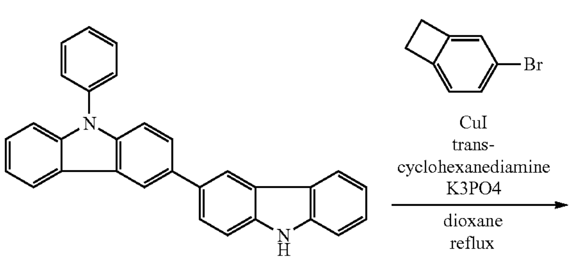

-continued

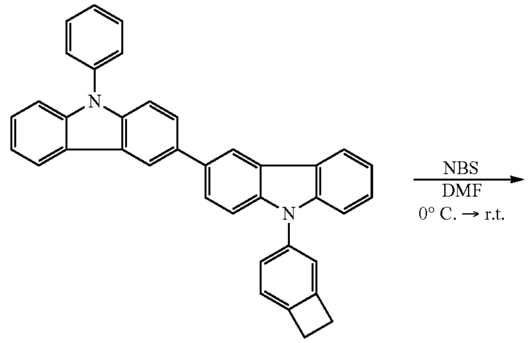

M-2-1

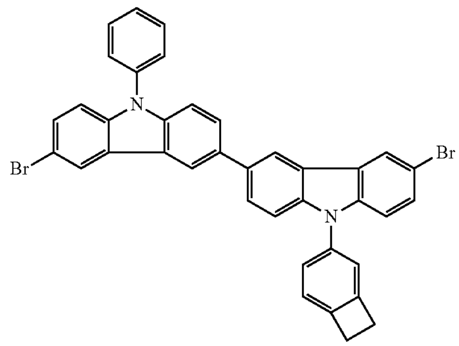

M-2

(a) Synthesis of Intermediate M-2-1

The intermediate M-2-1 was synthesized by using the intermediate M-1-4 and 4-bromo-1,2-dihydoro cyclobutabenzene in the same manner as in the synthesis of intermediate M-1-2. 5.6 g of an intended substance was obtained (yield: 86%). By $^{1}$H-NMR spectrum and FD-MS analysis, the substance obtained was confirmed to be M-2-1.

(b) Synthesis of M-2

M-2 was synthesized by using the intermediate M-2-1 in the same manner as in the synthesis of the intermediate M-1. 4.4 g of an intended substance was obtained (yield: 78%). By $^{1}$H-NMR spectrum and FD-MS analysis, the substance obtained was confirmed to be M-2.

(3) Synthesis of Polymer P1-1

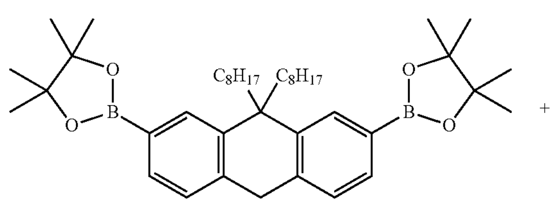

-continued

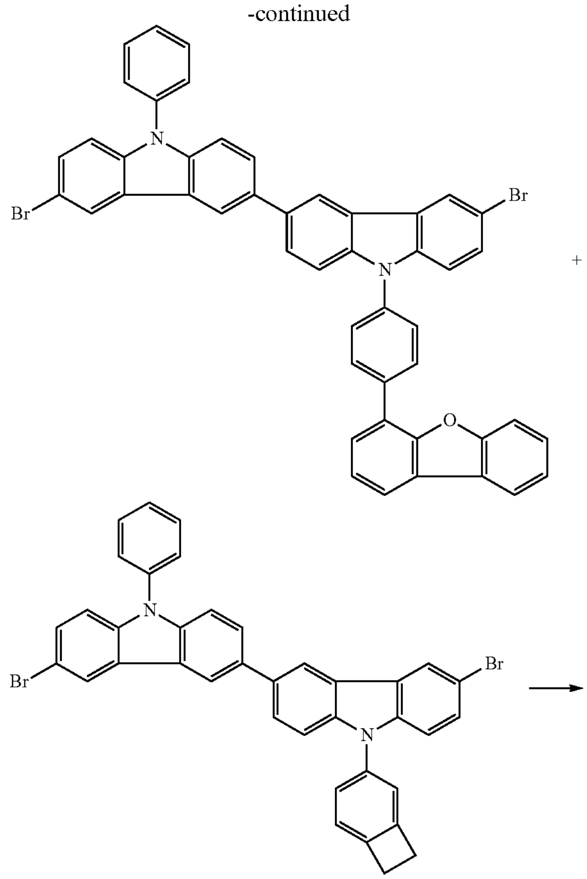

P1-1

Under a nitrogen atmosphere, 4.1 g (6.2 mmol) of 2,7-bis(4,4,5,5-tetramethyl-1,3,2-dioxaborolane-2-yl)-9,9-di-n-octylfluorene, 5.0 g (6.2 mmol) of M-1, 0.2 g (0.3 mmol) of M-2, 0.01 g (0.04 mmol) of palladium acetate [$Pd(OAc)_2$], 0.06 g (0.2 mmol) of tri(o-tolyl)phosphine [$P(o\text{-}Tol)_3$], 6.6 g (30.9 mmol) of potassium phosphate, 50 mL of dioxane, 12 mL of toluene and 11 mL of water were mixed and heated under reflux for 16 hours.

After completion of the reaction, the solvent was removed under reduced pressure. By addition of 150 mL of toluene and 100 mL of water, an intended substance was extracted to take out an organic phase. $MgSO_4$ was added to the organic phase thus taken out for drying. $MgSO_4$ was removed by filtration. The solvent was concentrated under reduced pressure to obtain a concentrated liquid. Filtration was conducted by passing the concentrated liquid through silica gel. The collected solution was concentrated under reduced pressure. The concentrated liquid was added drop-wise to methanol to precipitate solids. The solids were filtered and dried under reduced pressure.

Under a nitrogen atmosphere, the resulting crude product, 0.3 g (1.9 mmol) of bromobenzene, 0.03 g (0.04 mmol) of $Pd(OAc)_2$, 0.01 g (0.05 mmol) of $P(t\text{-}Bu)_3$, 2.0 g (9.5 mmol) of potassium phosphate and 50 mL of toluene were mixed, and heated under reflux for 8 hours. Next, 0.2 g (1.9 mmol) of phenylboronic acid was added followed by heating further for 8 hours.

After completion of the reaction, an intended substance was extracted by adding 100 mL of water to take out an organic phase. $MgSO_4$ was added to the organic phase thus taken out for drying. $MgSO_4$ was removed by filtration. The collected filtrate was filtered through silica gel. The collected solution was concentrated, followed by addition of an aqueous solution of diethyldithiacarbamate. The mixture was stirred at 80° C. for 8 hours. After cooling, an organic phase was washed with water. The resulting solution was dropped in methanol to obtain a precipitate by filtration.

The precipitate was dissolved in toluene and purified through a silica-gel column. The solution obtained was dropped in methanol and stirred. Then, the precipitate obtained was filtered and dried to obtain 5.3 g of polymer P1-1.

P1-1 had a number average molecular weight of $7.8\times10^3$ in terms of polystyrene and a weight average molecular weight of $2.4\times10^4$ in terms of polystyrene.

The molecular weight and molecular weight distribution in the invention were measured under the following conditions.

10 mg of a sample was dissolved in 10 ml of THF. 100 μl of the solution thus obtained was injected into a column, and the measurement was conducted. The flow rate was set to 1 ml per minute. The column temperature was set to 40° C. As a size exclusion chromatography (SEC) apparatus, HLC-8220 manufactured by TOSO CORPORATION was used. As a detector, a refractive index (RI) detector or an ultra-violet-visible (UV) detector was used. As for columns, 2 of TSKgel GMH-XL and 1 of TSKgel G2000-XL manufactured by TOSO CORPORATION were used. As a standard sample, TSK standard polystyrene manufactured by TOSO CORPORATION was used.

Example 2

The following polymer P1-2 was synthesized.

P1-2
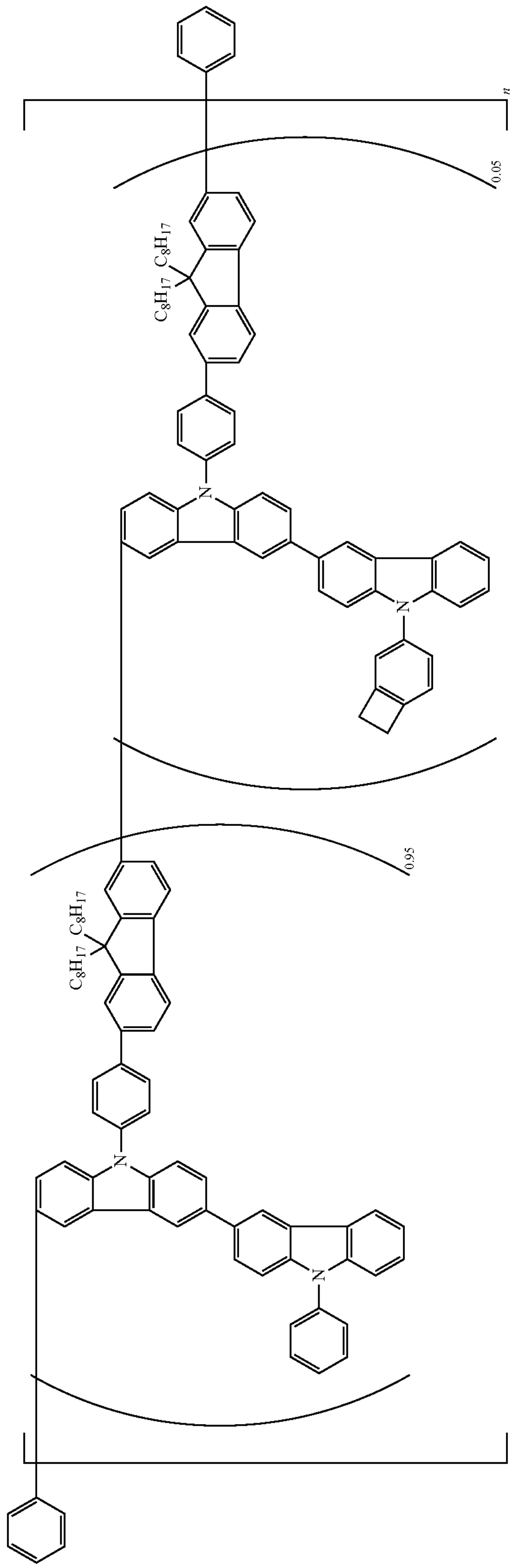

(1) Synthesis of Monomer M-3

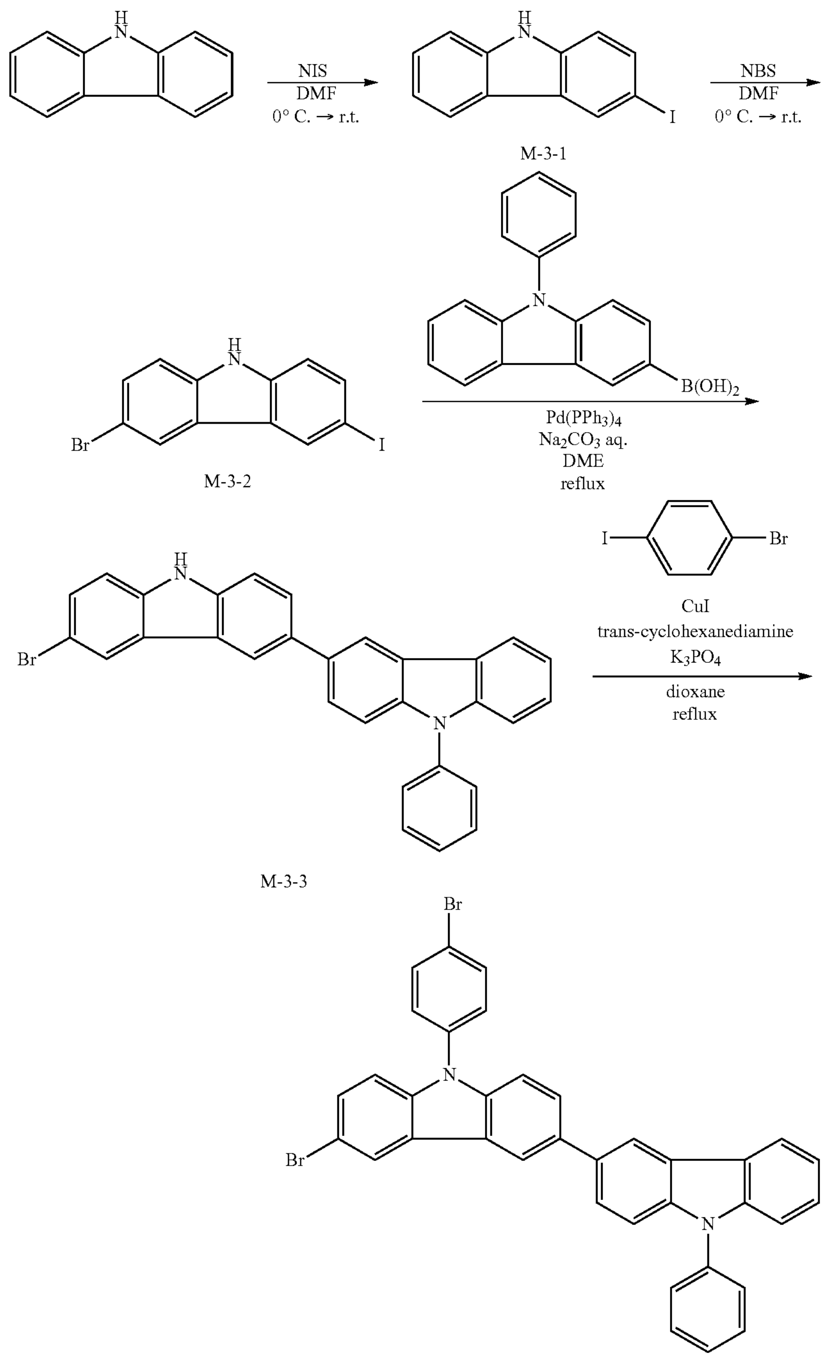

M-3

(a) Synthesis of Intermediate M-3-1

The intermediate M-3-1 was synthesized in the same manner as in the synthesis of the intermediate M-1-1, except that N-iodosuccinimide (NIS) was used instead of NBS. 5.6 g of an intended substance was obtained (yield: 79%). By $^{1}$H-NMR spectrum and FD-MS analysis, the substance obtained was confirmed to be M-3-1.

(b) Synthesis of Intermediate M-3-2

The intermediate M-3-2 was synthesized in the same manner as in the synthesis of the intermediate M-1-1, except that the intermediate M-3-1 was used. 3.7 g of an intended substance was obtained (yield: 82%). By $^{1}$H-NMR spectrum and FD-MS analysis, the substance obtained was confirmed to be M-3-2.

(c) Synthesis of Intermediate M-3-3

The intermediate M-3-3 was synthesized by using the intermediate M-3-2 and the intermediate M-1-3 in the same manner as in the synthesis of intermediate M-1-4. 5.2 g of an intended substance was obtained (yield: 76%). By $^{1}$H-NMR spectrum and FD-MS analysis, the substance obtained was confirmed to be M-3-3.

(d) Synthesis of M-3

M-3 was synthesized by using the intermediate M-3-3 and 1-bromo-4-iodobenzene in the same manner as in the synthesis of the intermediate M-1-2. 4.9 g of an intended substance was obtained (yield: 66%). By $^{1}$H-NMR spectrum and FD-MS analysis, the substance obtained was confirmed to be M-3.

(2) Synthesis of Monomer M-4

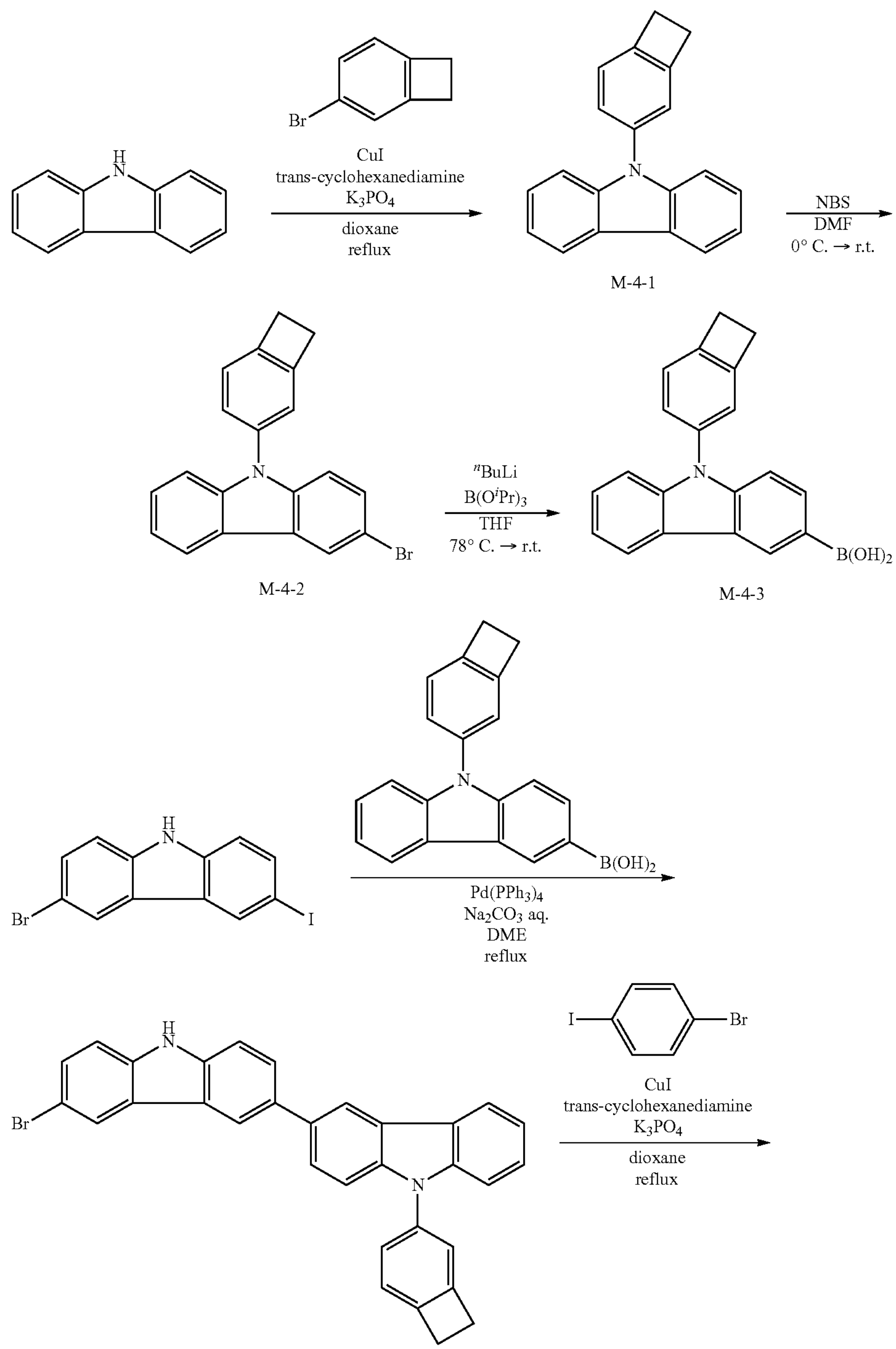

M-4-4

-continued

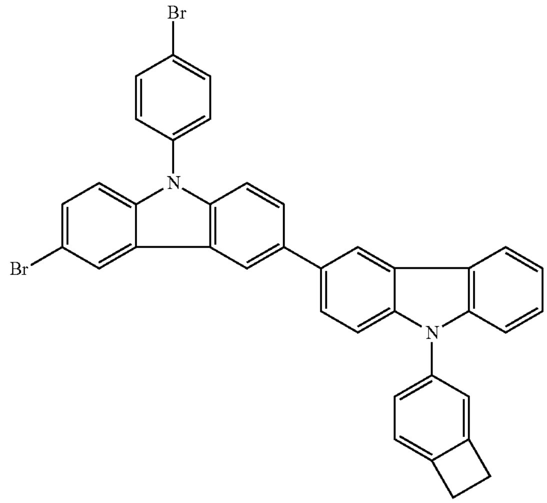

M-4

(a) Synthesis of Intermediate M-4-1

The intermediate M-4-1 was synthesized by using carbazole and bromocyclobutabenzene in the same manner as in the synthesis of the intermediate M-1-2. 7.9 g of an intended substance was obtained (yield: 90%). By $^{1}$H-NMR spectrum and FD-MS analysis, the substance obtained was confirmed to be M-4-1.

(b) Synthesis of Intermediate M-4-2

The intermediate M-4-2 was synthesized by using the intermediate M-4-1 in the same manner as in the synthesis of the intermediate M-1-1. 6.8 g of an intended substance was obtained (yield: 77%). By $^{1}$H-NMR spectrum and FD-MS analysis, the substance obtained was confirmed to be M-4-2.

(c) Synthesis of Intermediate M-4-3

The intermediate M-4-3 was synthesized by using the intermediate M-4-2 in the same manner as in the synthesis of the intermediate M-1-3. 5.5 g of an intended substance was obtained (yield: 75%). By $^{1}$H-NMR spectrum and FD-MS analysis, the substance obtained was confirmed to be M-4-3.

(d) Synthesis of Intermediate M-4-4

The intermediate M-4-4 was synthesized by using the intermediates M-3-2 and the intermediate M-4-3 in the same manner as in the synthesis of the intermediate M-1-4. 6.1 g of an intended substance was obtained (yield: 60%). By $^{1}$H-NMR spectrum and FD-MS analysis, the substance obtained was confirmed to be M-4-4.

(e) Synthesis of M-4

M-4 was synthesized by using the intermediates M-4-4 and 1-bromo-4-iodobenzene in the same manner as in the synthesis of intermediate M-1-2. 5.3 g of an intended substance was obtained (yield: 77%). By $^{1}$H-NMR spectrum and FD-MS analysis, the substance obtained was confirmed to be M-4.

(3) Synthesis of Polymer P1-2

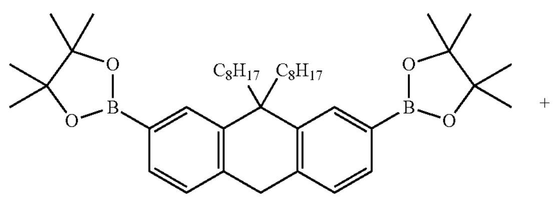

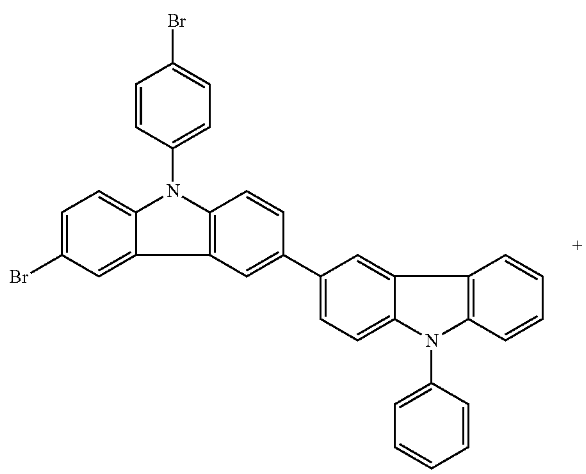

-continued

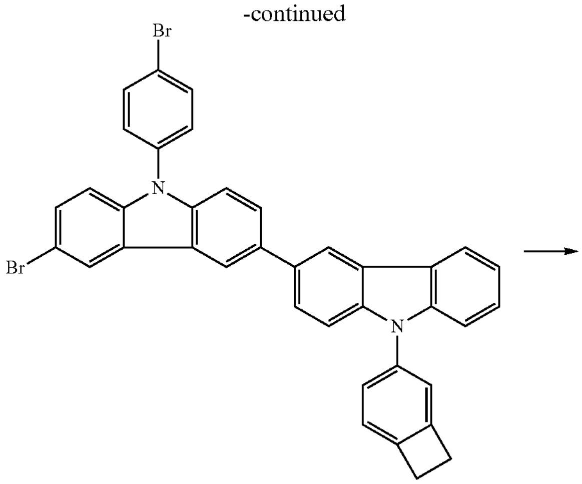

P1-2

The polymer P1-2 was synthesized by using 2,7-bis(4,4,5,5-tetramethyl-1,3,2-dioxaborolane-2-yl)-9,9-di-n-octyl-fluorene, M-3 and M-4 in the same manner as in the synthesis of P1-1. 5.2 g of an intended substance was obtained. P1-2 had a number average molecular weight of $1.2\times10^4$ in terms of polystyrene and a weight average molecular weight of $3.5\times10^4$ in terms of polystyrene.

Example 3

The following polymer P1-3 was synthesized.

P1-3
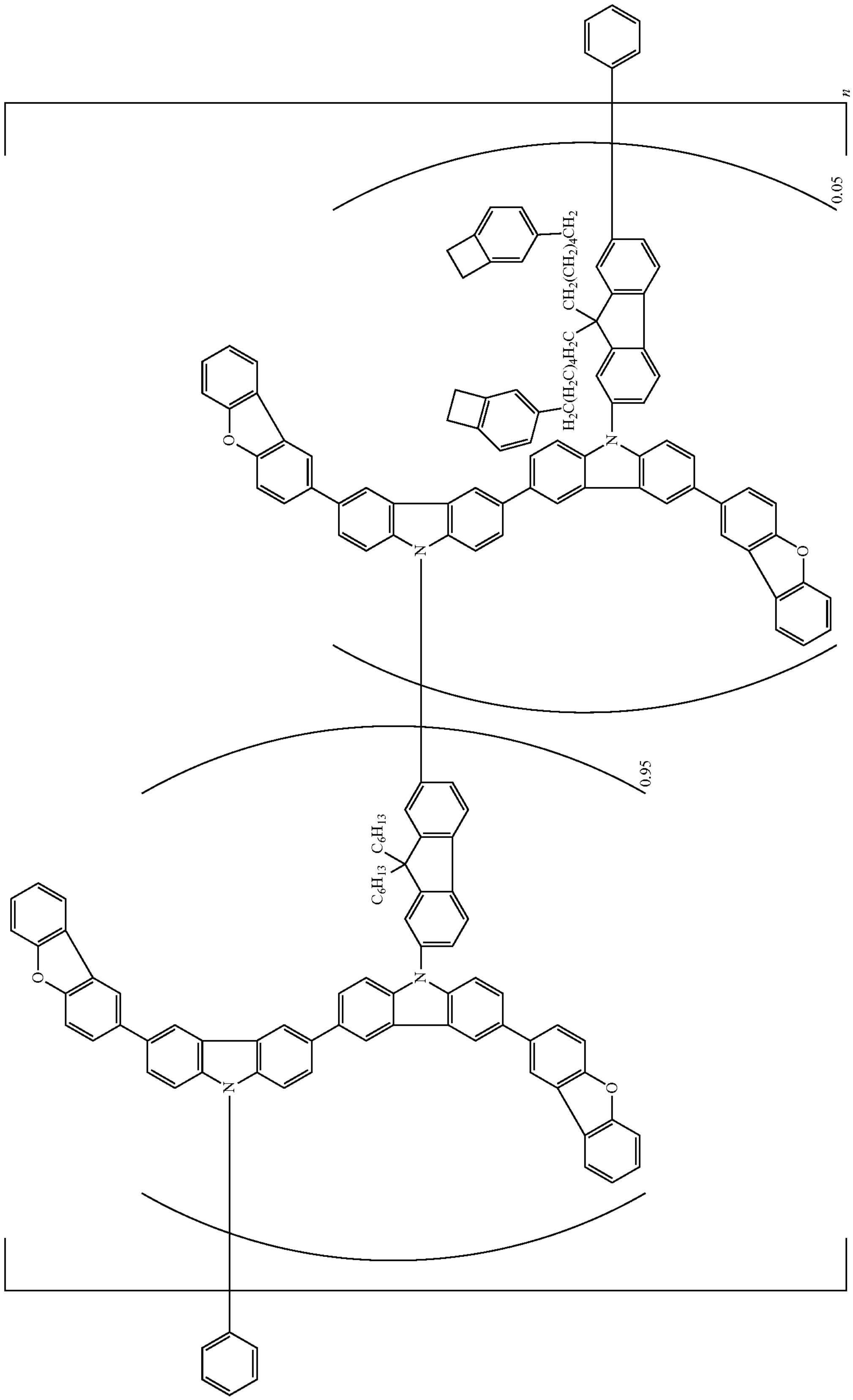

(1) Synthesis of Monomer M-5

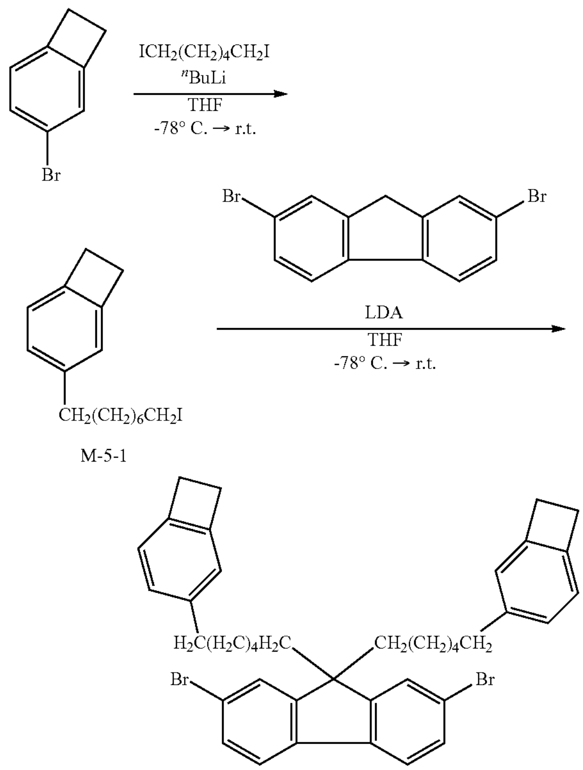

M-5-1

M-5

(a) Synthesis of Intermediate M-5-1

Under a nitrogen atmosphere, 18.3 g (100 mmol) of 4-bromo-1,2-dihydrocyclobutabenzene and 300 mL of dehydrated THF were mixed and cooled to −78° C. 130 mL of an n-butyllithium hexane solution (1.58M) was added to the mixture dropwise. After stirring for an hour, 16.5 mL of 1,6-diiodehexane was added dropwise slowly. Then the mixture was heated to room temperature for an hour and reacted further for 2 hours. By adding a 10% dilute hydrochloric acid solution and stirring, an organic phase was extracted. After washing with a saturated salt solution, the organic phase was dried with anhydrous magnesium sulfate, filtered, and then concentrated. The solids obtained were purified by silica-gel chromatography and dried under reduced pressure to obtain 12.6 g of a colorless liquid (yield: 37%). By $^{1}$H-NMR spectrum and FD-MS analysis, the liquid was confirmed to be M-5-1.

(b) Synthesis of M-5

Under a nitrogen atmosphere, 12.5 g (38.6 mmol) of 2,7-dibromofluorene and 120 mL of dehydrated THF were mixed and cooled to −78° C. 77 mL of an LDA hexane/THF solution (1.11M) was added to the mixture dropwise. After stirring for an hour, 21.7 g of M-5-1 dissolved in 60 mL of dehydrated THF was added dropwise slowly. Then the mixture was heated to room temperature for an hour and reacted further for 2 hours.

After adding a 10% dilute hydrochloric acid solution and stirring, methylene chloride was added to extract an intended substance to take out an organic phase. The organic phase thus taken out was dried with $MgSO_4$. $MgSO_4$ was removed by filtration. The solvent was removed under reduced pressure. 12.2 g of white solids were obtained by isolating by means of column chromatography (yield: 45%). By $^{1}$H-NMR spectrum and FD-MS analysis, the white powder obtained was confirmed to be M-5.

(2) Synthesis of Monomer M-6

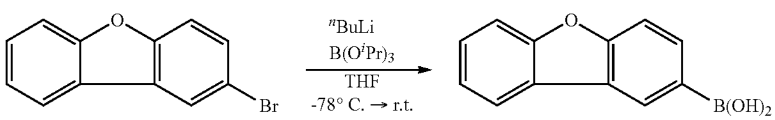

M-6-1

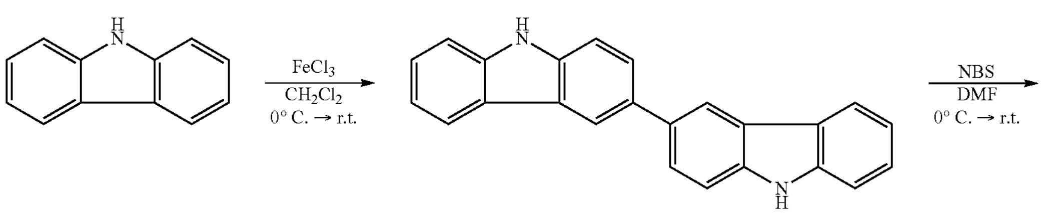

M-6-2

-continued

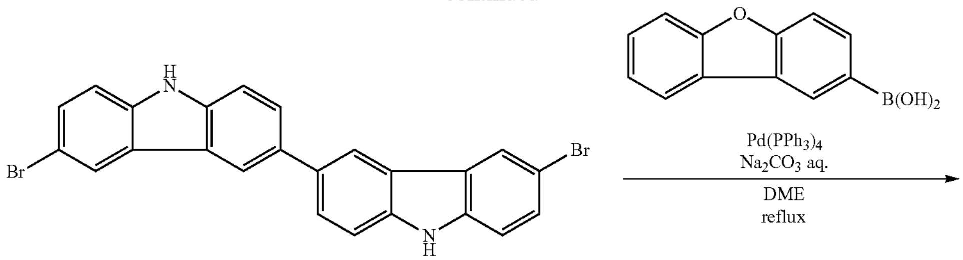

M-6-3

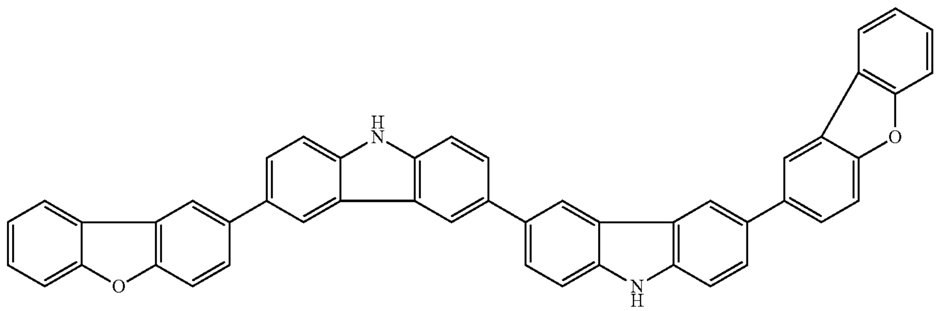

M-6

(a) Synthesis of Intermediate M-6-1

The intermediate M-6-1 was synthesized by using 2-bromo-dibenzofuran in the same manner as in the synthesis of the intermediate M-1-3. 6.1 g of an intended substance was obtained (yield: 63%). By $^{1}$H-NMR spectrum and FD-MS analysis, it was confirmed to be M-6-1.

(b) Synthesis of Intermediate M-6-2

Under a nitrogen atmosphere, a solution obtained by dissolving 10 g (59.8 mmol) of 9-H-carbazole in 75 ml of chloroform was cooled to 0° C. in an ice water bath. Next, a solution obtained by dispersing 38.8 g (239.2 mmol) of $FeCl_3$ in about 60 ml of chloroform was added dropwise slowly. After the addition, the resulting mixture was returned to room temperature, and stirred for 24 hours. The reaction liquid was added to a large quantity of methanol dropwise to precipitate solids. The solids were filtered and collected. Then, the collected solids were washed with a large quantity of methanol and water repeatedly to obtain 7.8 g of solids by filtration (yield: 82%). By $^{1}$H-NMR spectrum and FD-MS analysis, the white powder obtained was confirmed to be M-6-2.

(c) Synthesis of Intermediate M-6-3

The intermediate M-6-3 was synthesized by using the intermediate M-6-2 in the same manner as in the synthesis of the intermediate M-2. 4.1 g of an intended substance was obtained (yield: 56%). By $^{1}$H-NMR spectrum and FD-MS analysis, it was confirmed to be M-6-3.

(d) Synthesis of M-6

M-6 was synthesized by using the intermediate M-6-1 and the intermediate M-6-3 in the same manner as in the synthesis of the intermediate M-1-4. 3.4 g of an intended substance was obtained (yield: 48%). By $^{1}$H-NMR spectrum and FD-MS analysis, it was confirmed to be M-6.

(3) Synthesis of Polymer P1-3

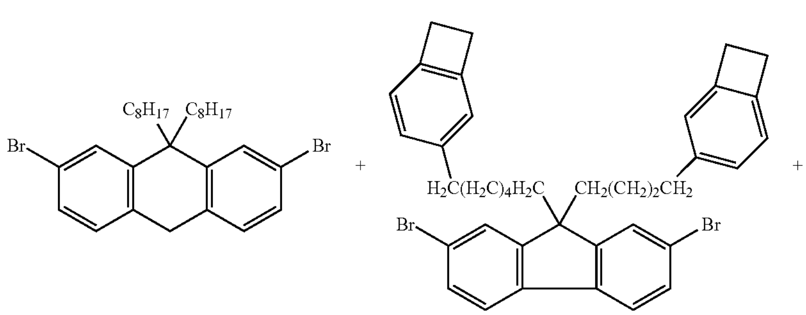

-continued

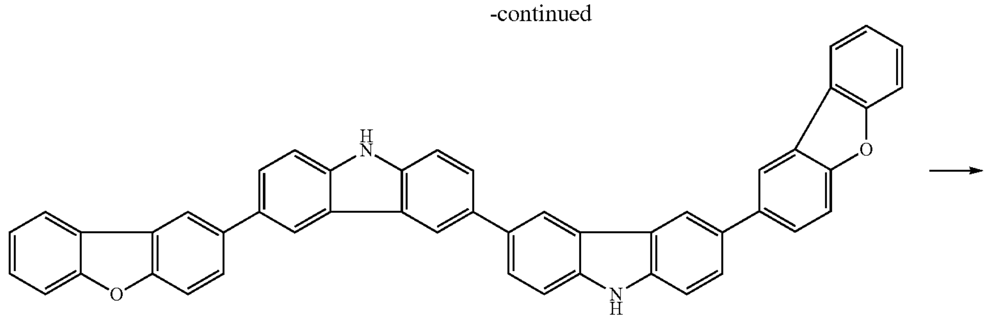

Under a nitrogen atmosphere, 5.8 g (10.0 mmol) of 9,9-dioctyl-2,7-dibromofluorene, 0.4 g (0.5 mmol) of M-5, 7.0 g (10.5 mmol) of M-6, 0.2 g (0.2 mmol) of tris(dibenzylideneacetone)dipalladium(0)[$Pd_2(dba)_3$], 0.06 g (0.3 mmol) of $P(t\text{-}Bu)_3$, 3.0 g (31.5 mmol) of sodium-t-butoxide and 40 mL of xylene were mixed. The mixture was heated under reflux for 20 hours.

After completion of the reaction, the solvent was removed under reduced pressure. An intended substance was extracted by adding 100 mL of water to take out an organic phase. The organic phase thus taken out was dried by adding $MgSO_4$. $MgSO_4$ was removed by filtration. The solvent was concentrated under reduced pressure. The concentrated liquid was filtered through silica gel. The collected solution was concentrated under reduced pressure. The concentrated solution was added to methanol dropwise to precipitate solids. The solids were collected by suction filtration and dried under reduced pressure.

Under a nitrogen atmosphere, the crude product, 0.5 g (3.2 mmol) of bromobenzene, 0.04 g (0.2 mmol) of $Pd(OAc)_2$, 0.06 g (0.3 mmol) of $P(t\text{-}Bu)_3$, 1.1 g (5.2 mmol) of potassium phosphate and 40 mL of toluene were mixed. The mixture was heated for 8 hours under reflux. Next, 0.4 g (3.2 mmol) of phenyl boronic acid was added thereto, and heated further for 8 hours.

After completion of the reaction, an intended substance was extracted by adding 100 mL of water to take out an organic phase. $MgSO_4$ was added to the organic phase thus taken out for drying. $MgSO_4$ was removed by filtration. The collected filtrate was filtered through silica gel. A collected solution was concentrated, followed by addition of an aqueous solution of sodium diethyldithiacarbamate. The mixture was stirred at 80° C. for 2 hours. After cooling, an organic phase was washed with water. The solution obtained was added to methanol dropwise to obtain a precipitate by filtration.

The precipitate was dissolved in toluene and purified through a silica-gel column. The solution obtained was added to methanol dropwise and stirred. Then, the precipitate obtained was filtered and dried to obtain 7.3 g of polymer P1-3. P1-3 had a number average molecular weight of $0.9\times10^4$ in terms of polystyrene and a weight average molecular weight of $2.8\times10^4$ in terms of polystyrene.

Example 4

The following polymer P1-4 was synthesized.

P1-4
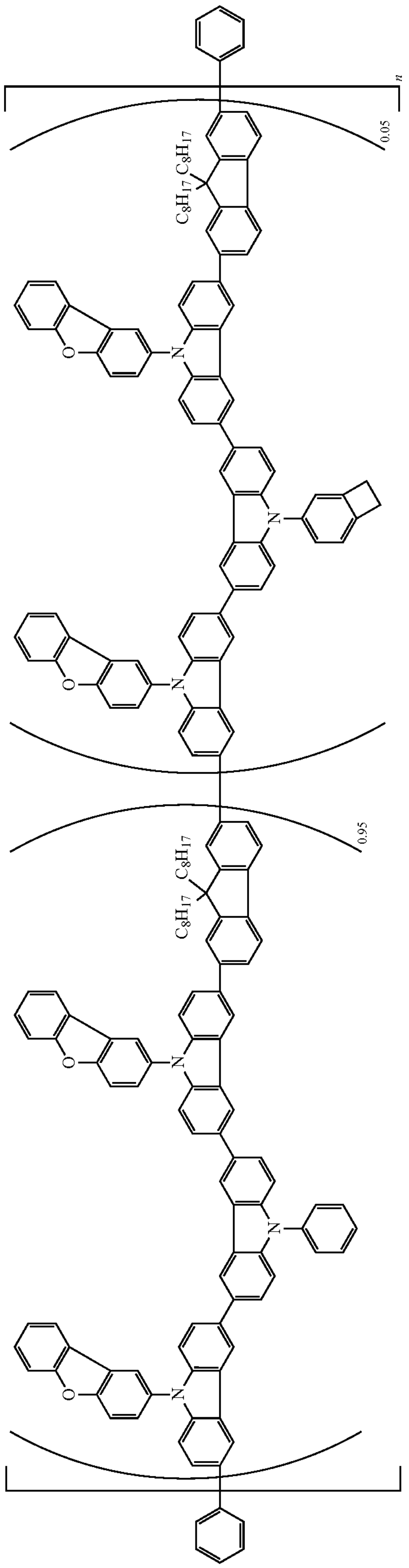

(1) Synthesis of Monomer M-7
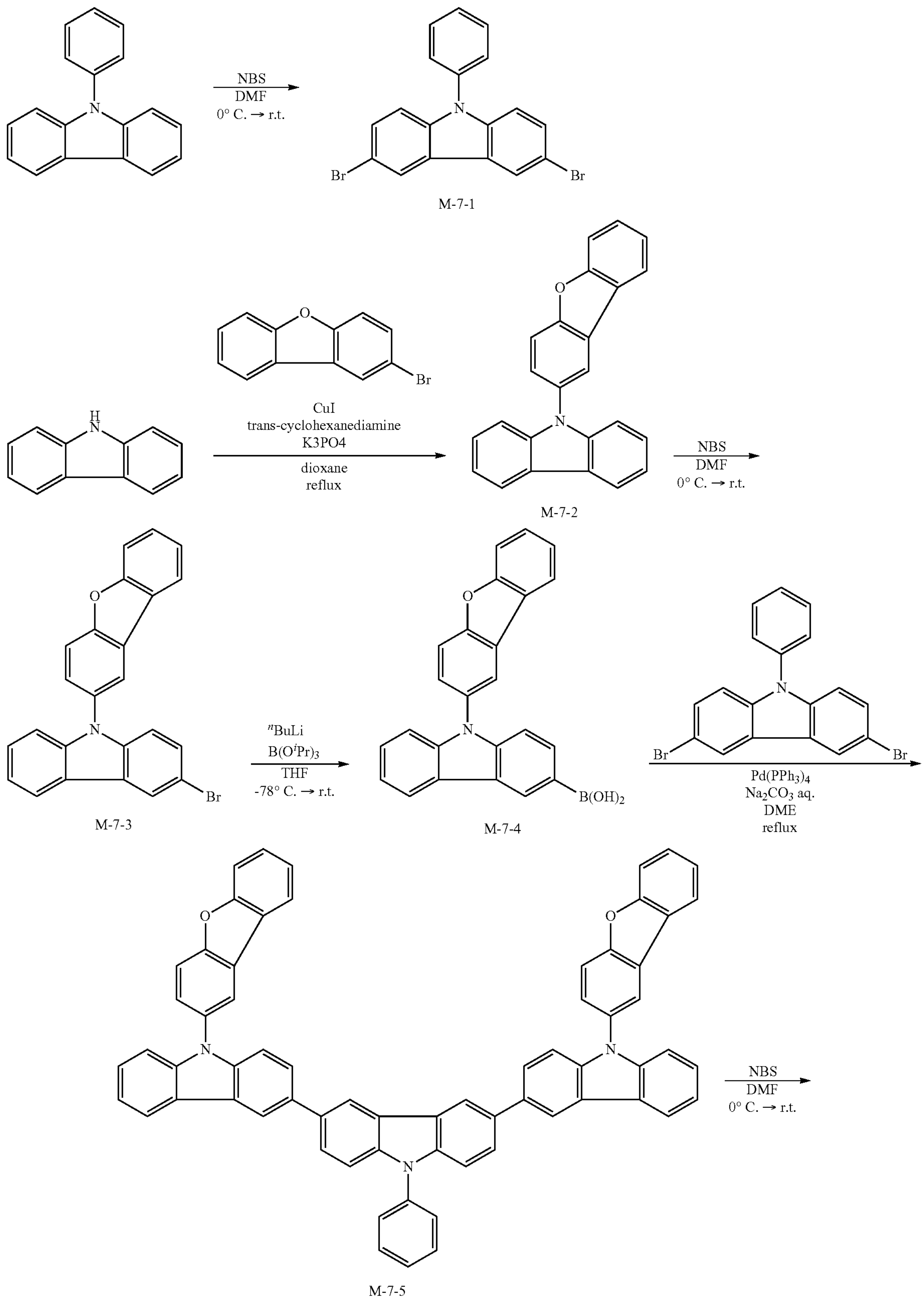

-continued

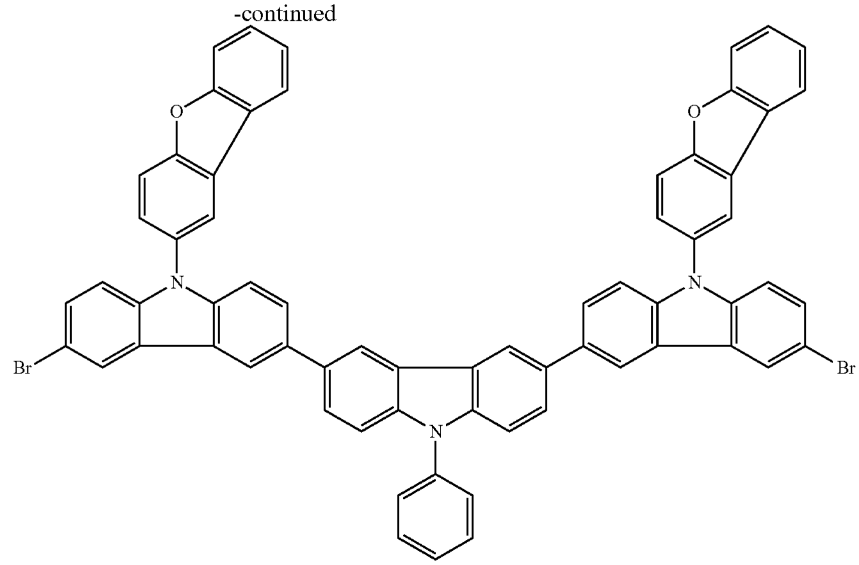

M-7

(a) Synthesis of Intermediate M-7-1

The intermediate M-7-1 was synthesized by using 9-phenylcarbazole in the same manner as in the synthesis of M-2. 2.9 g of an intended substance was obtained (yield: 73%). By $^{1}$H-NMR spectrum and FD-MS analysis, it was confirmed to be M-7-1.

(b) Synthesis of Intermediate M-7-2

The intermediate M-7-2 was synthesized by using carbazole and 2-bromo-dibenzofuran in the same manner as in the synthesis of the intermediate M-1-2. 4.0 g of an intended substance was obtained (yield: 68%). By $^{1}$H-NMR spectrum and FD-MS analysis, it was confirmed to be M-7-2.

(c) Synthesis of Intermediate M-7-3

The intermediate M-7-3 was synthesized by using the intermediate M-7-2 in the same manner as in the synthesis of M-1-1. 3.2 g of an intended substance was obtained (yield: 59%). By $^{1}$H-NMR spectrum and FD-MS analysis, it was confirmed to be M-7-3.

(d) Synthesis of Intermediate M-7-4

The intermediate M-7-4 was synthesized by using the intermediate M-7-3 in the same manner as in the synthesis of M-1-3. 5.4 g of an intended substance was obtained (yield: 66%). By $^{1}$H-NMR spectrum and FD-MS analysis, it was confirmed to be M-7-4.

(e) Synthesis of Intermediate M-7-5

The intermediate M-7-5 was synthesized by using the intermediate M-7-4 and the intermediate M-7-1 in the same manner as in the synthesis of M-1-4. 2.7 g of an intended substance was obtained (yield: 61%). By $^{1}$H-NMR spectrum and FD-MS analysis, it was confirmed to be M-7-5.

(f) Synthesis of M-7

M-7 was synthesized by using the intermediate M-7-5 in the same manner as in the synthesis of the monomer M-2. 3.9 g of an intended substance was obtained (yield: 56%). By $^{1}$H-NMR spectrum and FD-MS analysis, it was confirmed to be M-7.

(2) Synthesis of Monomer M-8

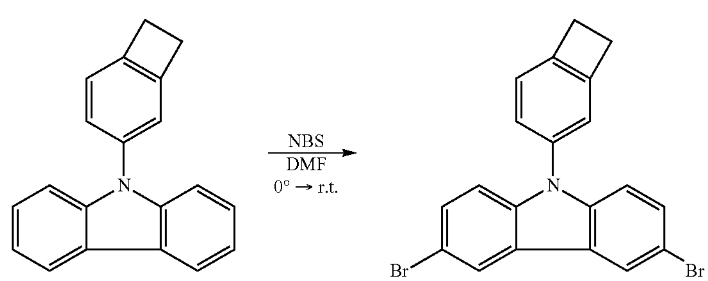

M-8-1

-continued
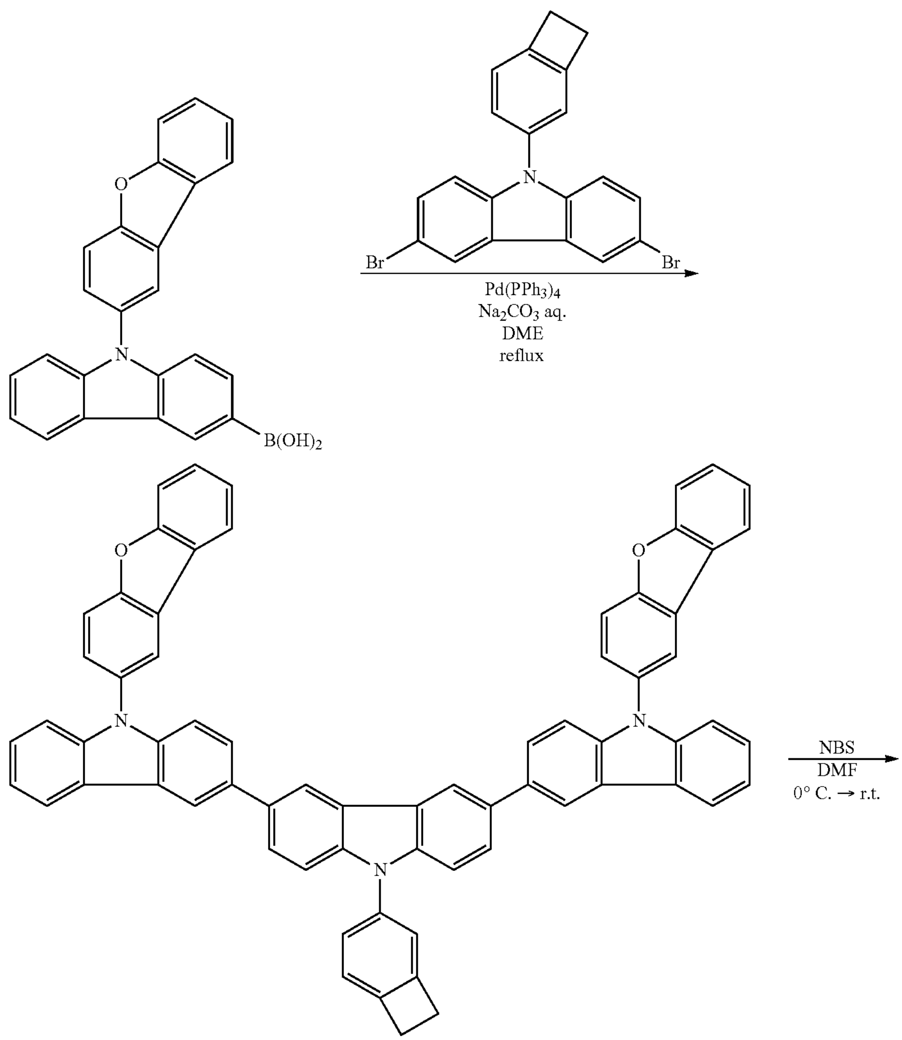
M-8-2
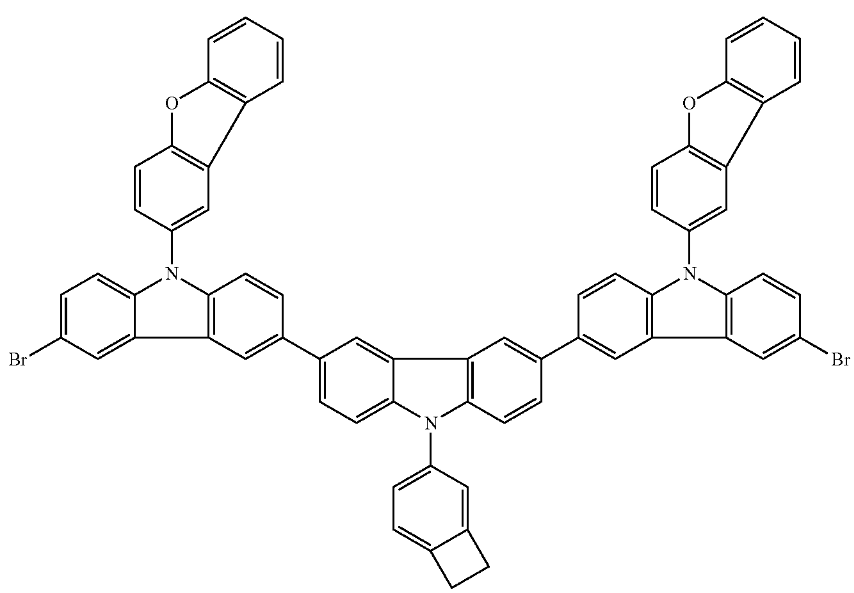
M-8

(a) Synthesis of Intermediate M-8-1

The intermediate M-8-1 was synthesized by using the intermediate M-4-1 in the same manner as in the synthesis of the monomer M-2. 5.3 g of an intended substance was obtained (yield: 85%). By $^{1}$H-NMR spectrum and FD-MS analysis, it was confirmed to be M-8-1.

(b) Synthesis of Intermediate M-8-2

The intermediate M-8-2 was synthesized by using the intermediate M-8-1 and the intermediate M-7-4 in the same manner as in the synthesis of the intermediate M-1-4. 3.8 g of an intended substance was obtained (yield: 58%). By $^{1}$H-NMR spectrum and FD-MS analysis, it was confirmed to be M-8-2.

(c) Synthesis of M-8

M-8 was synthesized by using the intermediate M-8-2 in the same manner as in the synthesis of M-2. 4.2 g of an intended substance was obtained (yield: 60%). By $^{1}$H-NMR spectrum and FD-MS analysis, it was confirmed to be M-8.

(3) Synthesis of Polymer P1-4

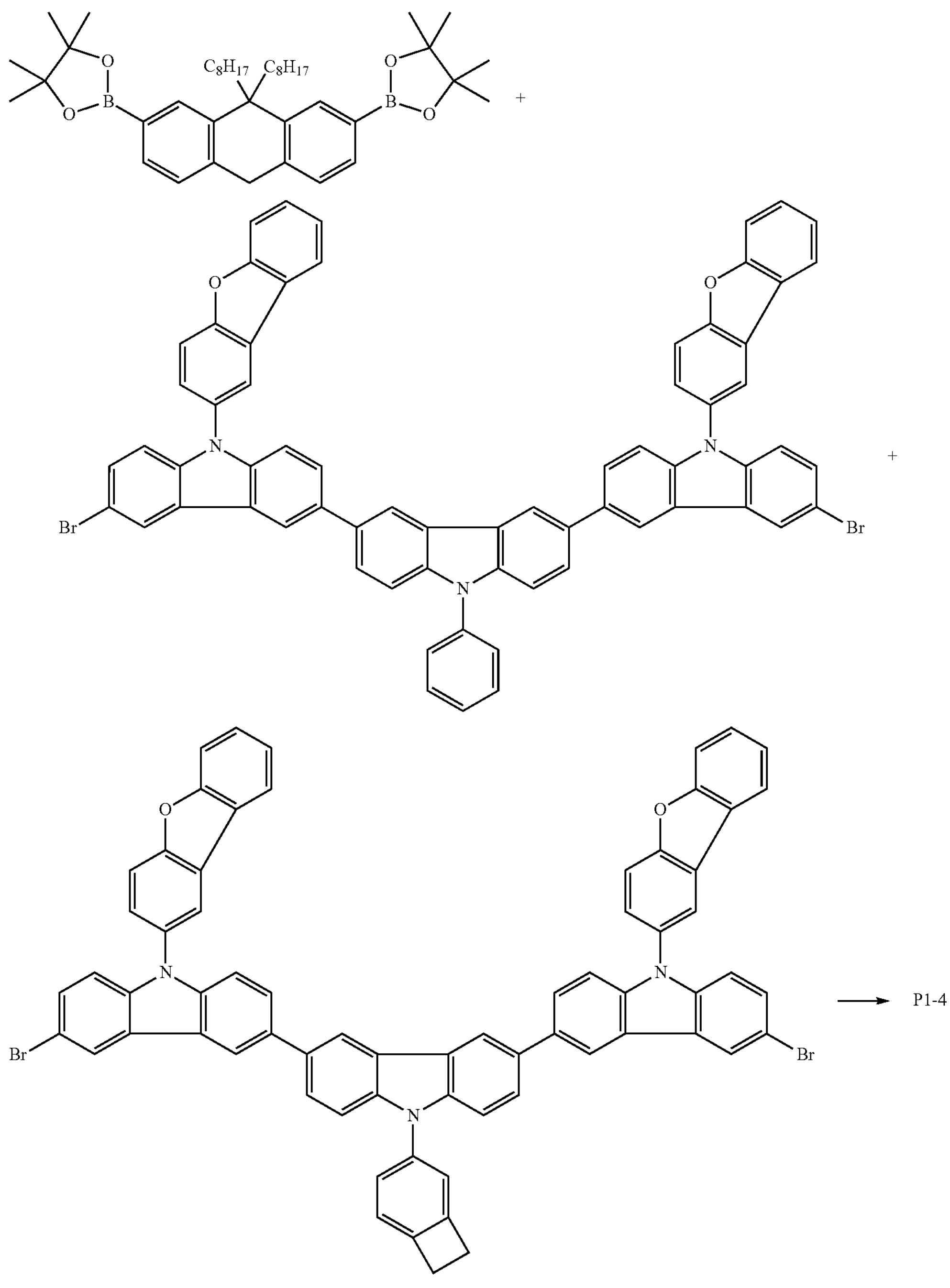

The polymer P1-4 was synthesized by using 2,7-bis(4,4,5,5-tetramethyl-1,3,2-dioxaborolane-2-yl)-9,9-di-n-octylfluorene, M-7 and M-8 in the same manner as in the synthesis of P1-1. 3.3 g of an intended substance was obtained. The polymer P-4 had a number average molecular weight of $1.8\times10^4$ in terms of polystyrene and a weight average molecular weight of $4.0\times10^4$ in terms of polystyrene.

Example 5

The following polymer P1-5 was synthesized.

P1-5

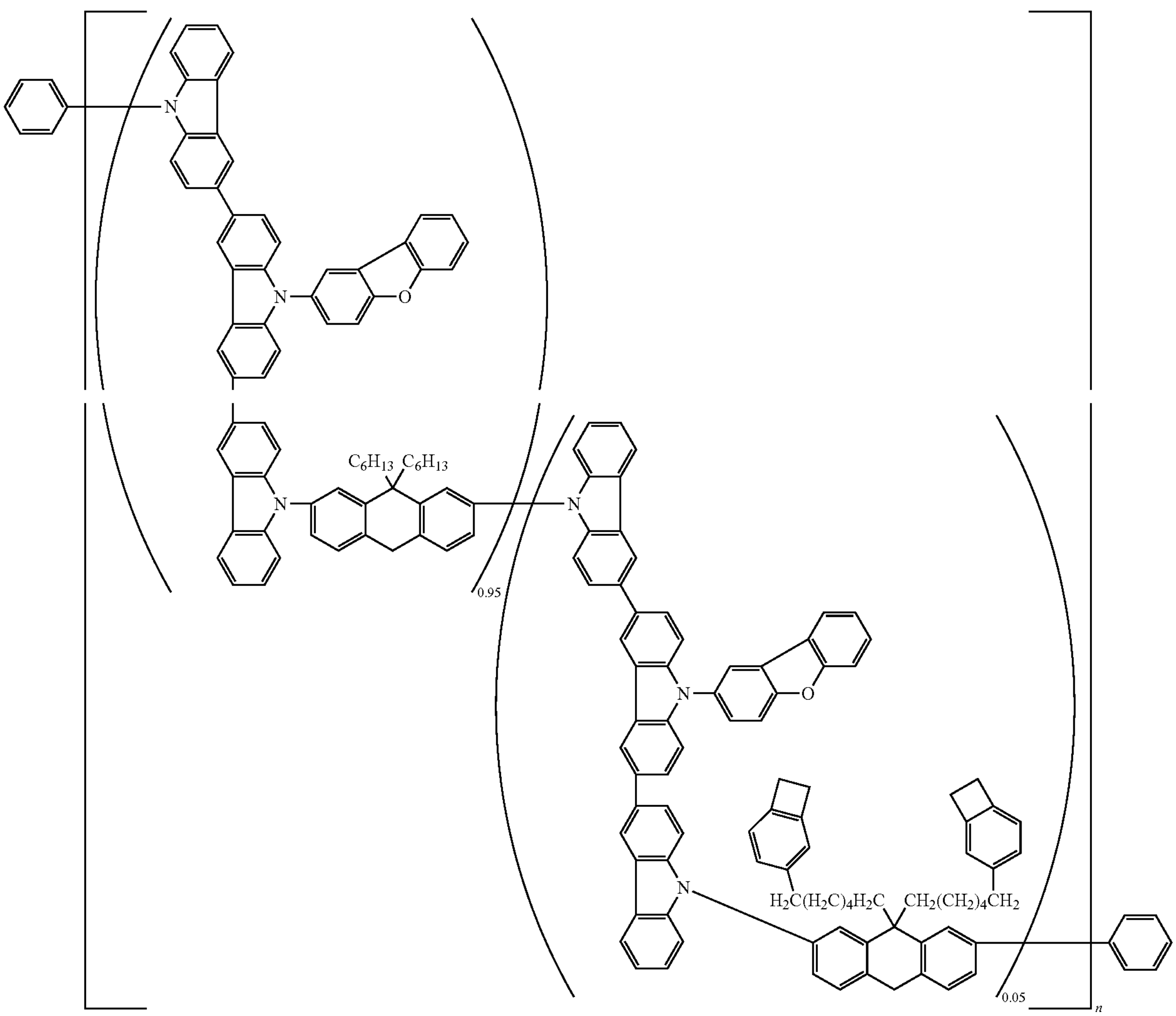

(1) Synthesis of Monomer M-9

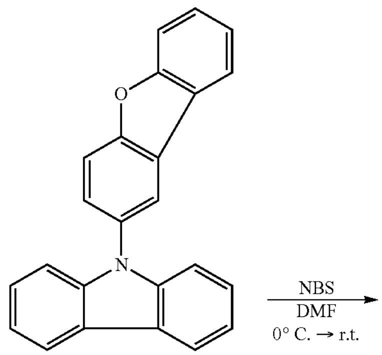

M-9-0

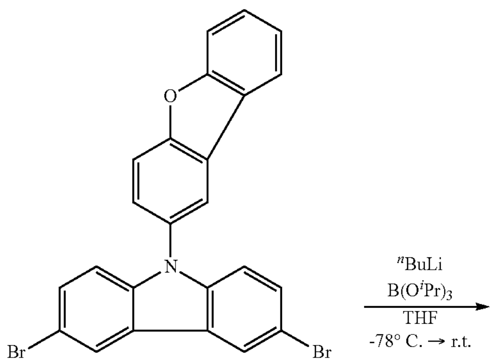

M-9-1

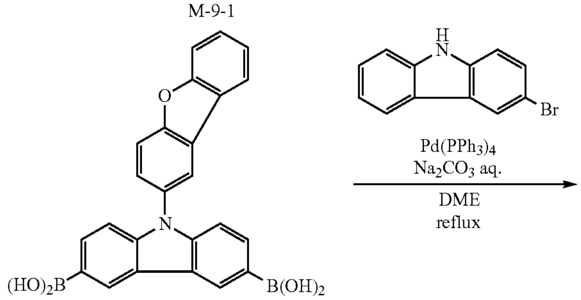

M-9-2

-continued

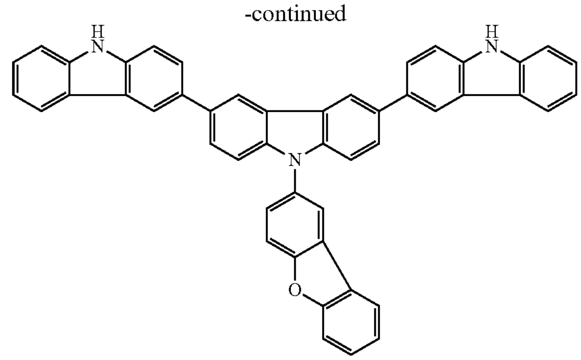

M-9

(a) Synthesis of Intermediate M-9-1

The intermediate M-9-0 was synthesized by using carbazole and 3-bromo-dibenzofuran in the same manner as in the synthesis of the intermediate M-1-2. The intermediate M-9-1 was synthesis by using the intermediate M-9-0 in the same manner as in the synthesis of M-2. 4.6 g of an intended substance was obtained (yield: 87%). By $^{1}$H-NMR spectrum and FD-MS analysis, it was confirmed to be M-9-1.

(b) Synthesis of Intermediate M-9-2

The intermediate M-9-2 was synthesized by using the intermediate M-9-1 in the same manner as in the synthesis of M-1-3. 1.9 g of an intended substance was obtained (yield: 43%). By $^{1}$H-NMR spectrum and FD-MS analysis, it was confirmed to be M-9-2.

(c) Synthesis of Intermediate M-9

The intermediate M-9 was synthesized by using the intermediate M-9-2 in the same manner as in the synthesis of M-1-4. 3.5 g of an intended substance was obtained (yield: 56%). By $^{1}$H-NMR spectrum and FD-MS analysis, it was confirmed to be M-9.

(2) Synthesis of Polymer P1-5

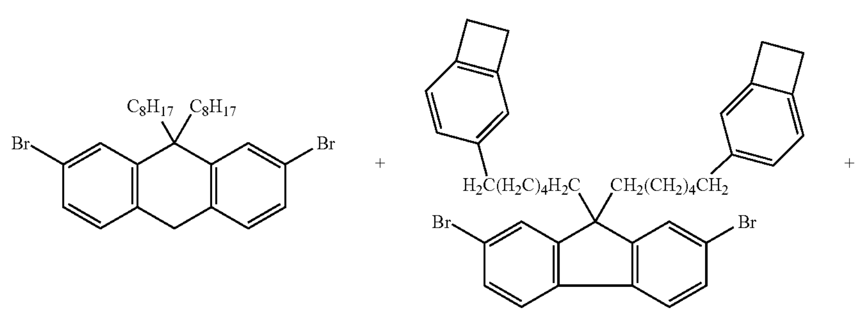

-continued

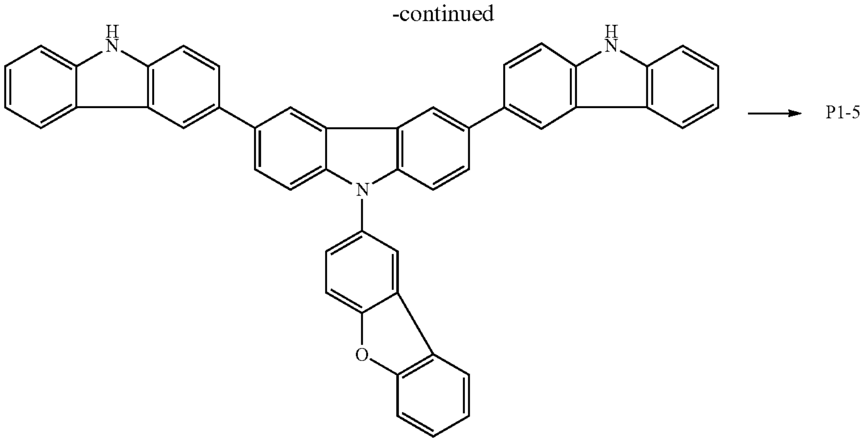

The polymer P1-5 was synthesized by using 2,7-dibromo-9,9-di-n-octylfluorene, M-5 and M-9 in the same manner as in the synthesis of P1-3. 6.2 g of an intended substance was obtained. The polymer P-5 had a number average molecular weight of $1.9\times10^4$ in terms of polystyrene and a weight average molecular weight of $3.8\times10^4$ in terms of polystyrene.

Example 6

The following polymer P1-6 was synthesized.

P1-6

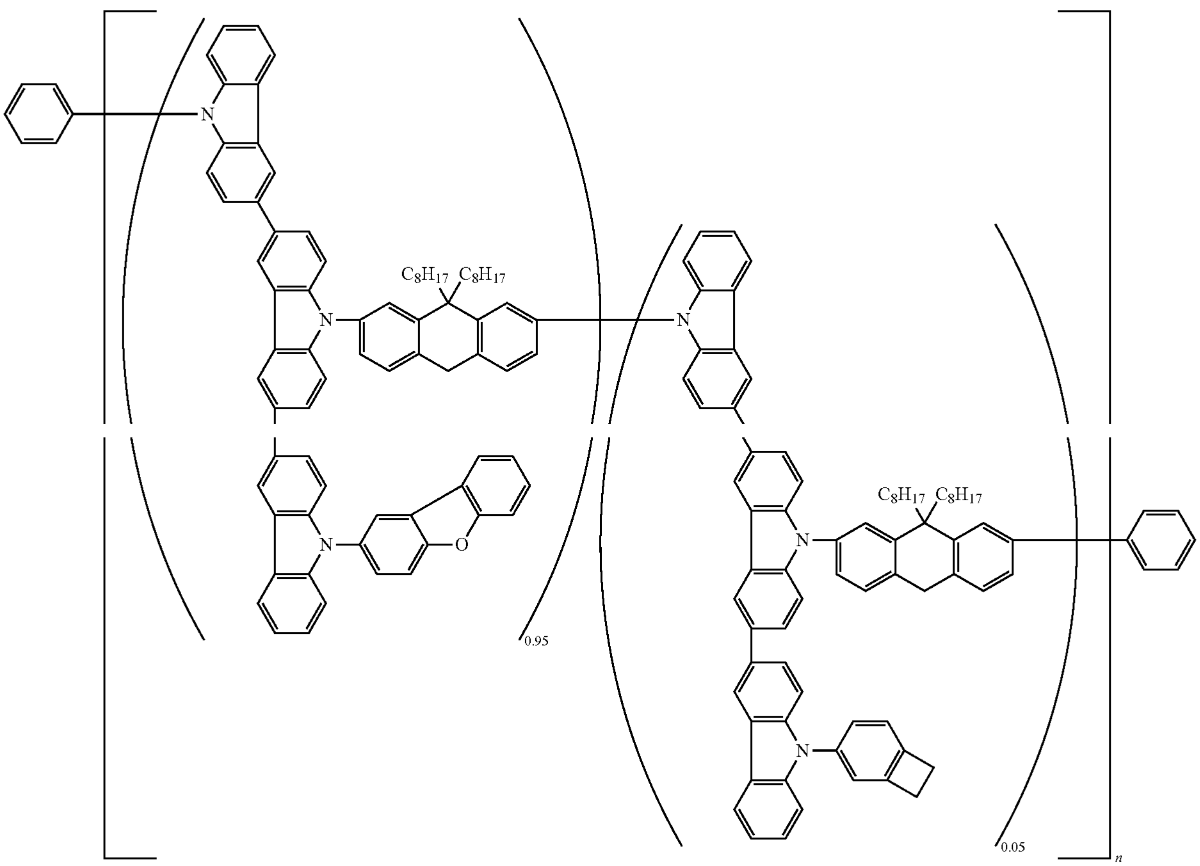

(1) Synthesis of Monomer M-10

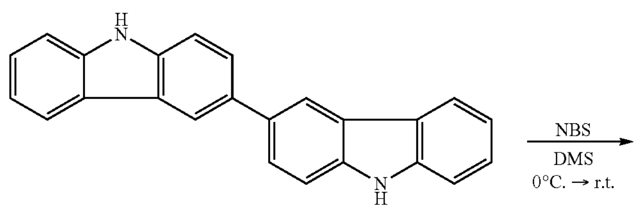

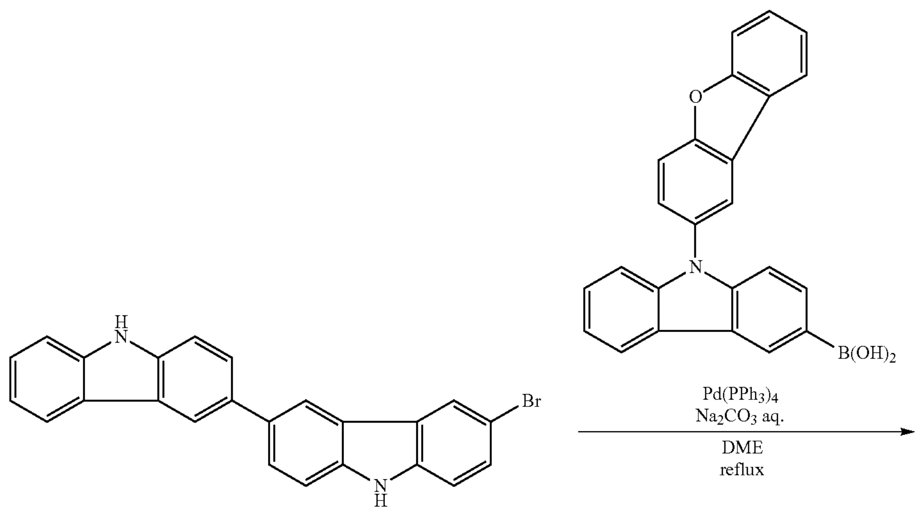

M-10-1

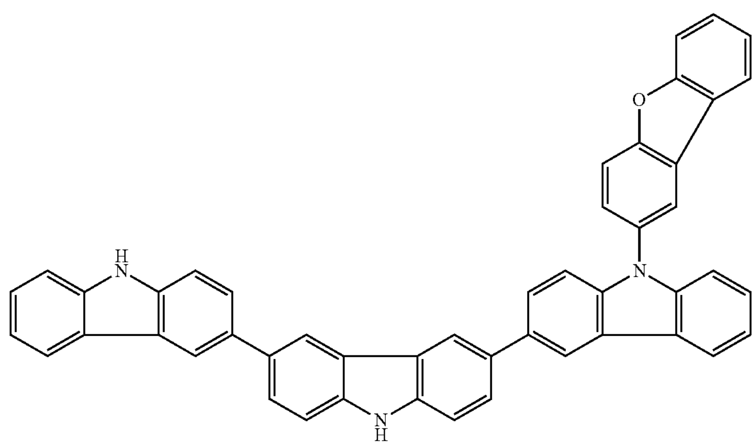

M-10

(a) Synthesis of Intermediate M-10-1

The intermediate M-10-1 was synthesized by using the intermediate M-6-2 in the same manner as in the synthesis of the intermediate M-1-1. 3.5 g of an intended substance was obtained (yield: 66%). By $^{1}$H-NMR spectrum and FD-MS analysis, it was confirmed to be M-10-1.

(b) Synthesis of M-10

The intermediate M-10 was synthesized by using the intermediate M-10-1 and the intermediate M-7-4 in the same manner as in the synthesis of intermediate M-1-4. 4.9 g of an intended substance was obtained (yield: 72%). By $^{1}$H-NMR spectrum and FD-MS analysis, it was confirmed to be M-10.

(2) Synthesis of Monomer M-11

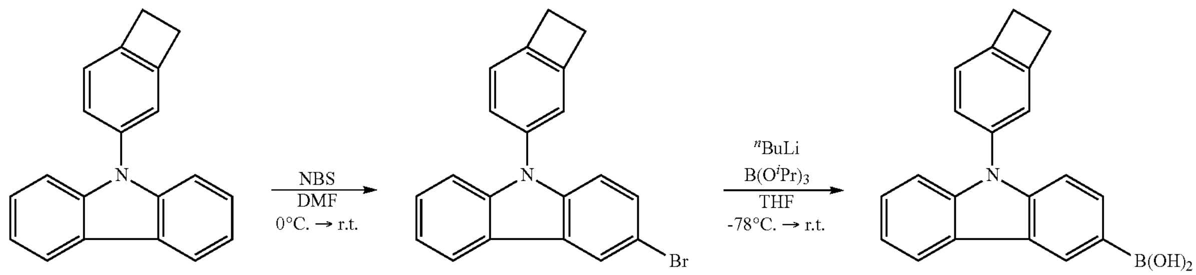

M-11-1

M-11-2

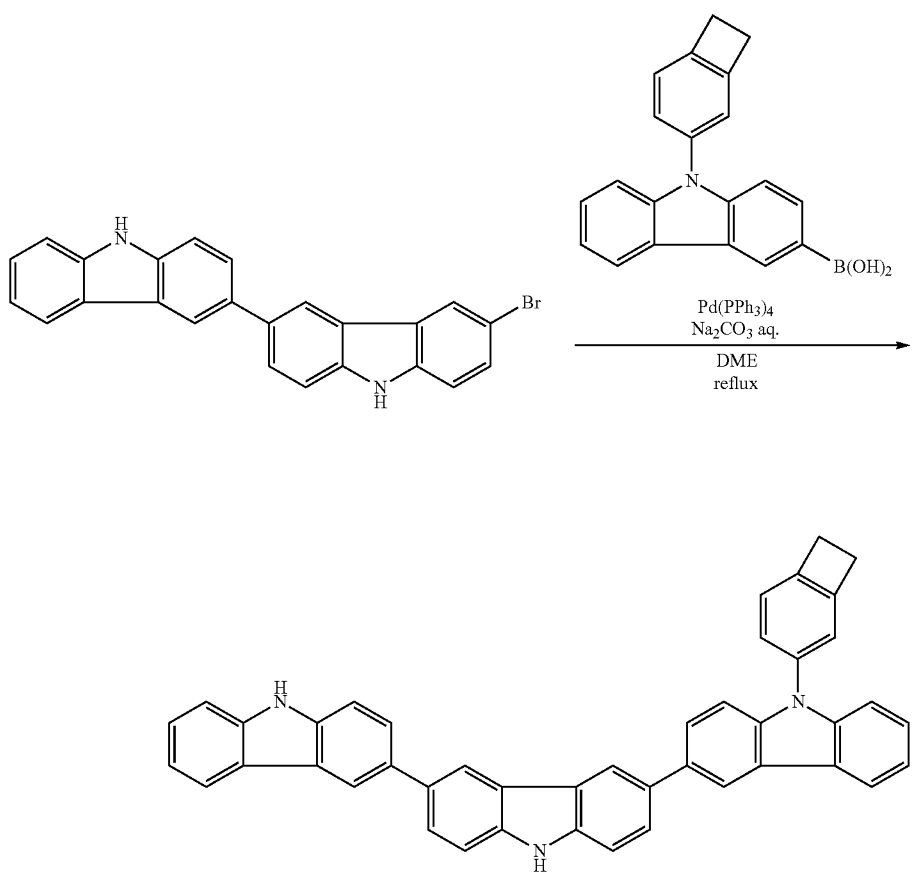

M-11

(a) Synthesis of Intermediate M-11-1

The intermediate M-11-1 was synthesized by using the intermediate M-4-1 in the same manner as in the synthesis of intermediate M-1-1. 3.9 g of an intended substance was obtained (yield: 70%). By $^{1}$H-NMR spectrum and FD-MS analysis, it was confirmed to be M-11-1.

(b) Synthesis of Intermediate M-11-2

The intermediate M-11-2 was synthesized by using the intermediate M-11-1 in the same manner as in the synthesis of the intermediate M-1-3. 4.4 g of an intended substance was obtained (yield: 52%). By $^{1}$H-NMR spectrum and FD-MS analysis, it was confirmed to be M-11-2.

(c) Synthesis of M-11

M-11 was synthesized by using the intermediate M-10-1 and the intermediate M-11-2 in the same manner as in the synthesis of intermediate M-1-4. 2.3 g of an intended substance was obtained (yield: 67%). By $^{1}$H-NMR spectrum and FD-MS analysis, it was confirmed to be M-11.

(3) Synthesis of Polymer P1-6

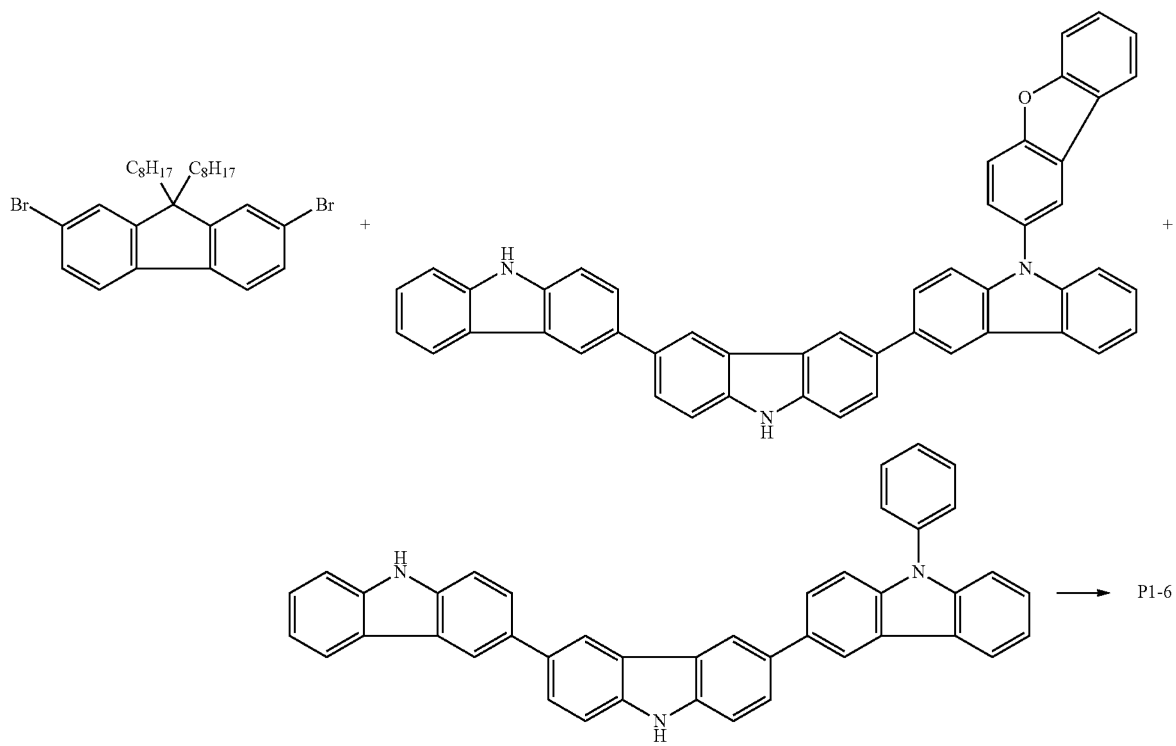

The polymer P1-6 was synthesized by using 2,7-dibromo-9,9-di-n-octylfluorene, M-10 and M-11 in the same manner as in the synthesis of P-3. 4.6 g of an intended substance was obtained. The polymer P-6 had a number average molecular weight of $1.5\times10^4$ in terms of polystyrene and a weight average molecular weight of $3.3\times10^4$ in terms of polystyrene.

Example 7

The following polymer P1-7 was synthesized.

P1-7
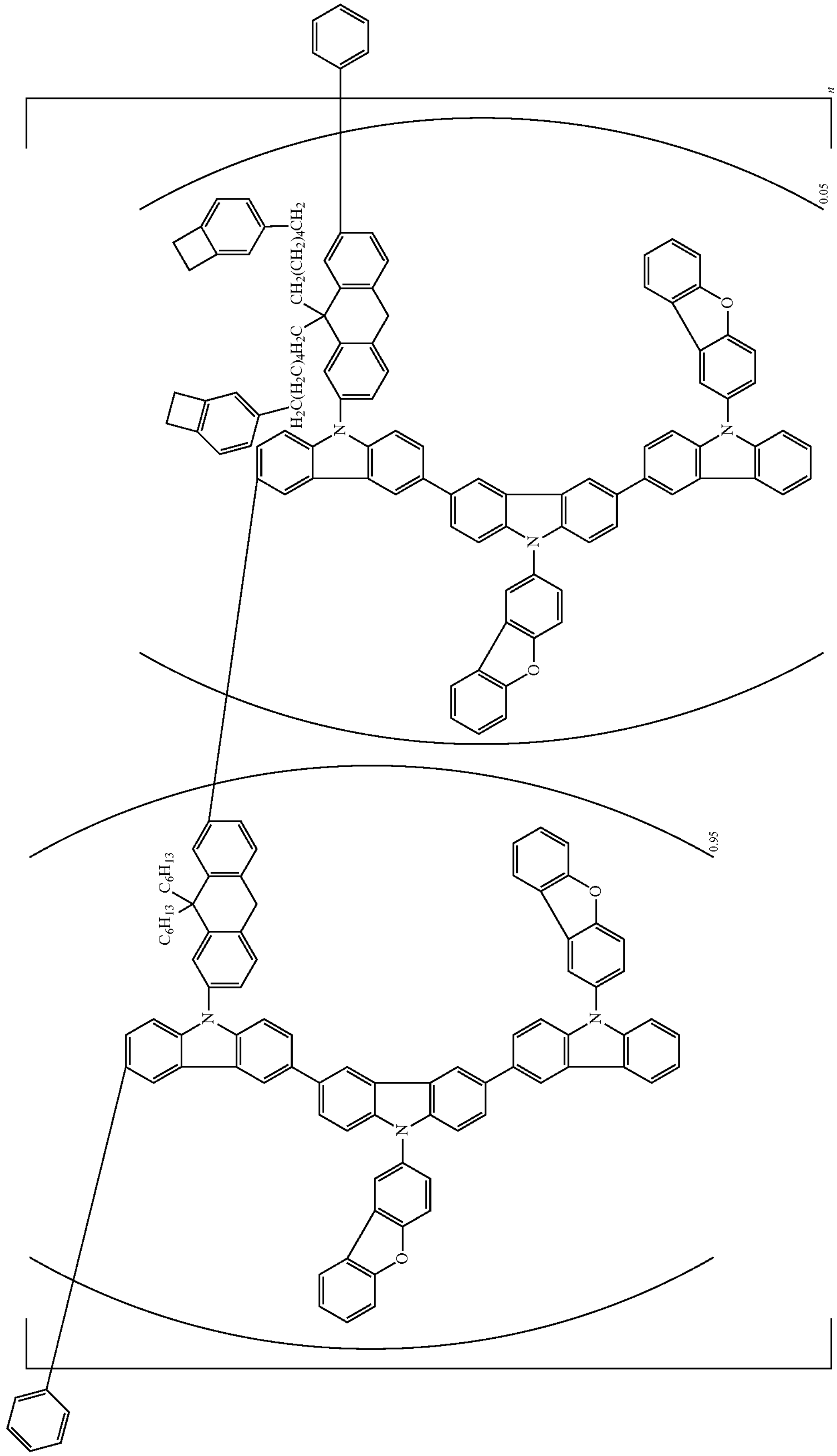

(1) Synthesis of Monomer M-12
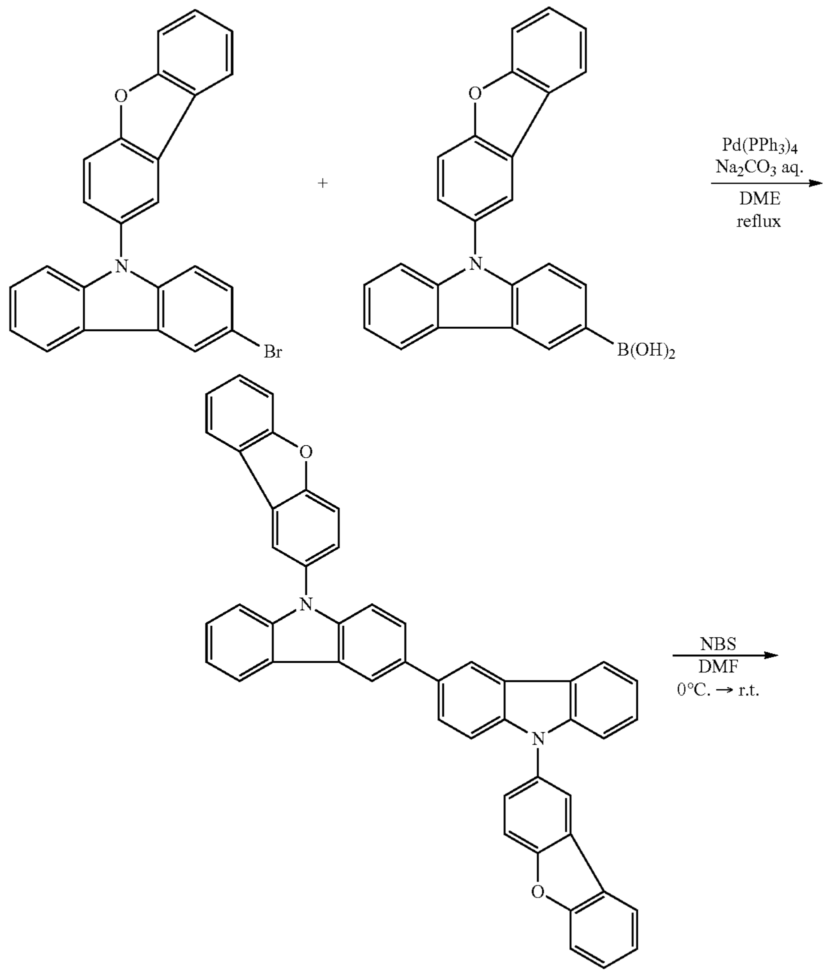
M-12-1
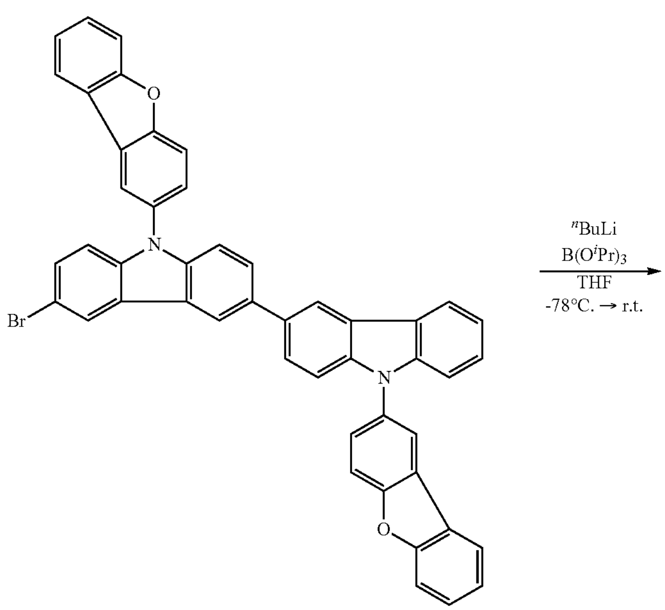
M-12-2

-continued
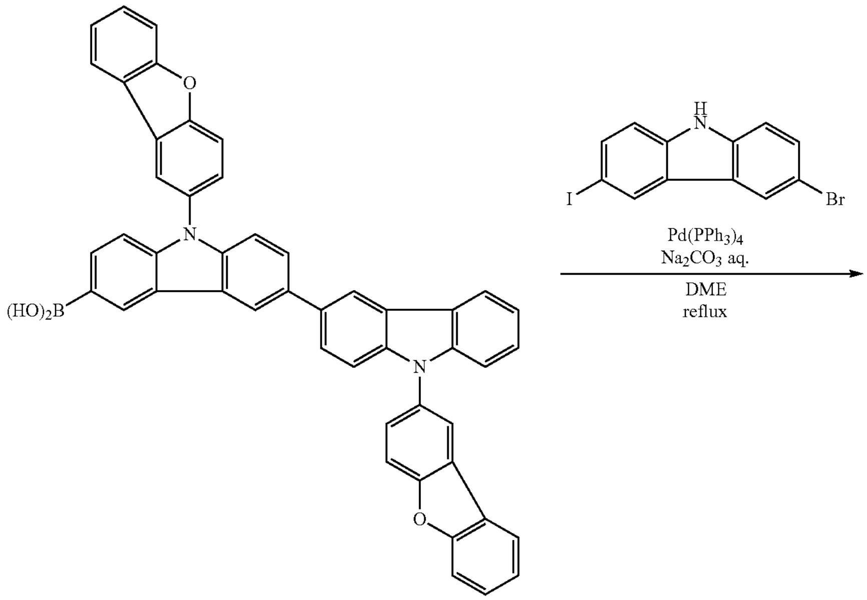
M-12-3
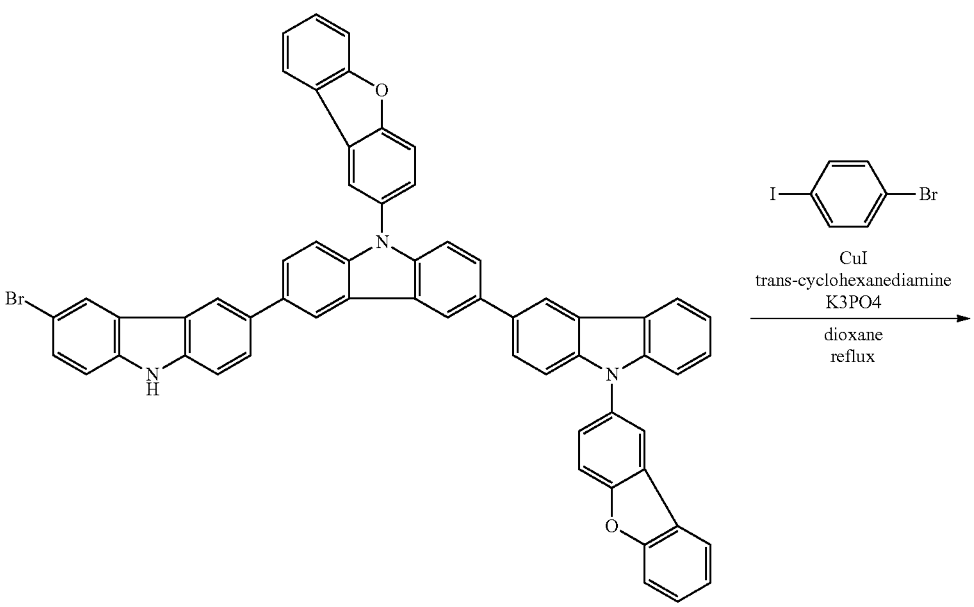
M-12-4

-continued

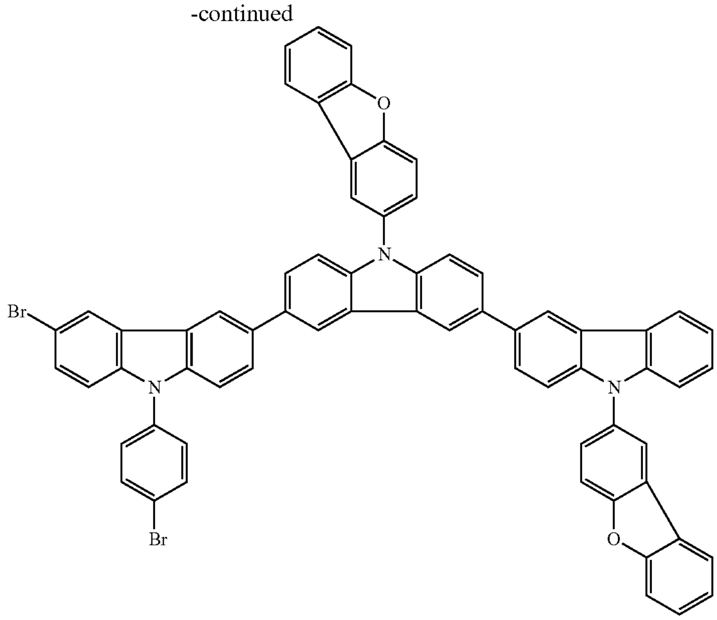

M-12

(a) Synthesis of Intermediate M-12-1

The intermediate M-12-1 was synthesized by using the intermediate M-7-3 and the intermediate M-7-4 in the same manner as in the synthesis of intermediate M-1-4. 3.6 g of an intended substance was obtained (yield: 82%). By $^{1}$H-NMR spectrum and FD-MS analysis, it was confirmed to be M-12-1.

(b) Synthesis of Intermediate M-12-2

The intermediate M-12-2 was synthesized by using the intermediate M-12-1 in the same manner as in the synthesis of intermediate M-1-1. 3.5 g of an intended substance was obtained (yield: 66%). By $^{1}$H-NMR spectrum and FD-MS analysis, it was confirmed to be M-12-2.

(c) Synthesis of Intermediate M-12-3

The intermediate M-12-3 was synthesized by using the intermediate M-12-2 in the same manner as in the synthesis of the intermediate M-1-2. 4.1 g of an intended substance was obtained (yield: 62%). By $^{1}$H-NMR spectrum and FD-MS analysis, it was confirmed to be M-12-3.

(d) Synthesis of Intermediate M-12-4

The intermediate M-12-4 was synthesized by using the intermediate M-12-3 and the intermediate M-3-2 in the same manner as in the synthesis of intermediate M-1-4. 1.8 g of an intended substance was obtained (yield: 76%). By $^{1}$H-NMR spectrum and FD-MS analysis, it was confirmed to be M-12-4.

(e) Synthesis of M-12

M-12 was synthesized by using the intermediate M-12-4 and 1-bromo-4-iodobenzene in the same manner as in the synthesis of intermediate M-1-2. 2.7 g of an intended substance was obtained (yield: 70%). By $^{1}$H-NMR spectrum and FD-MS analysis, it was confirmed to be M-12.

(2) Synthesis of Monomer M-13

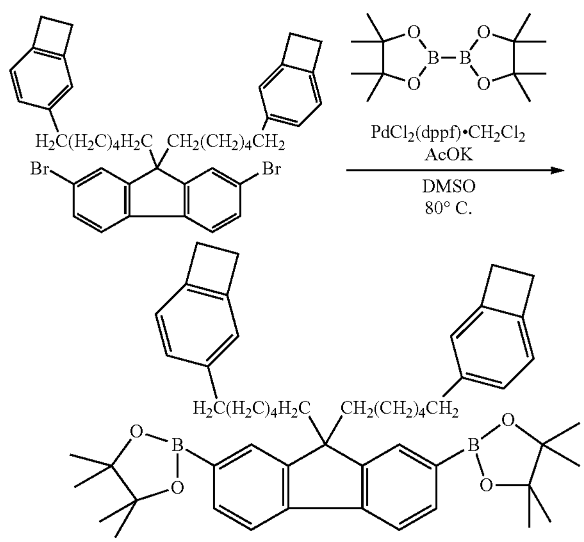

M-13

Under a nitrogen atmosphere, 3.7 g (5.3 mmol) of M-5, 4.1 g (31.8 mmol) of bis(pinacolato)diboron, 0.5 g (0.6 mmol) of 1,1'-bis(diphenylphosphino)ferrocene-palladium (II)dichloride-dichloromethane complex[$PdCl_2$(dppf)·$CH_2Cl_2$], 3.1 g (31.8 mmol) of potassium acetate and dehydrated DMSO were mixed and reacted under reflux at 80° C. for 28 hours. After cooling, an intended substance was extracted by adding 25 mL of water to take out an organic phase. The organic phase thus taken out was dried with $MgSO_4$. $MgSO_4$ was removed by filtration. The solvent was removed under reduced pressure. The resulting crude product was purified by means of silica-gel chromatography. The resulting solids were dried under reduced pressure to obtain 2.7 g of white solids (yield: 64%). By $^{1}$H-NMR spectrum and FD-MS analysis, it was confirmed to be M-13.

(3) Synthesis of Polymer P1-7

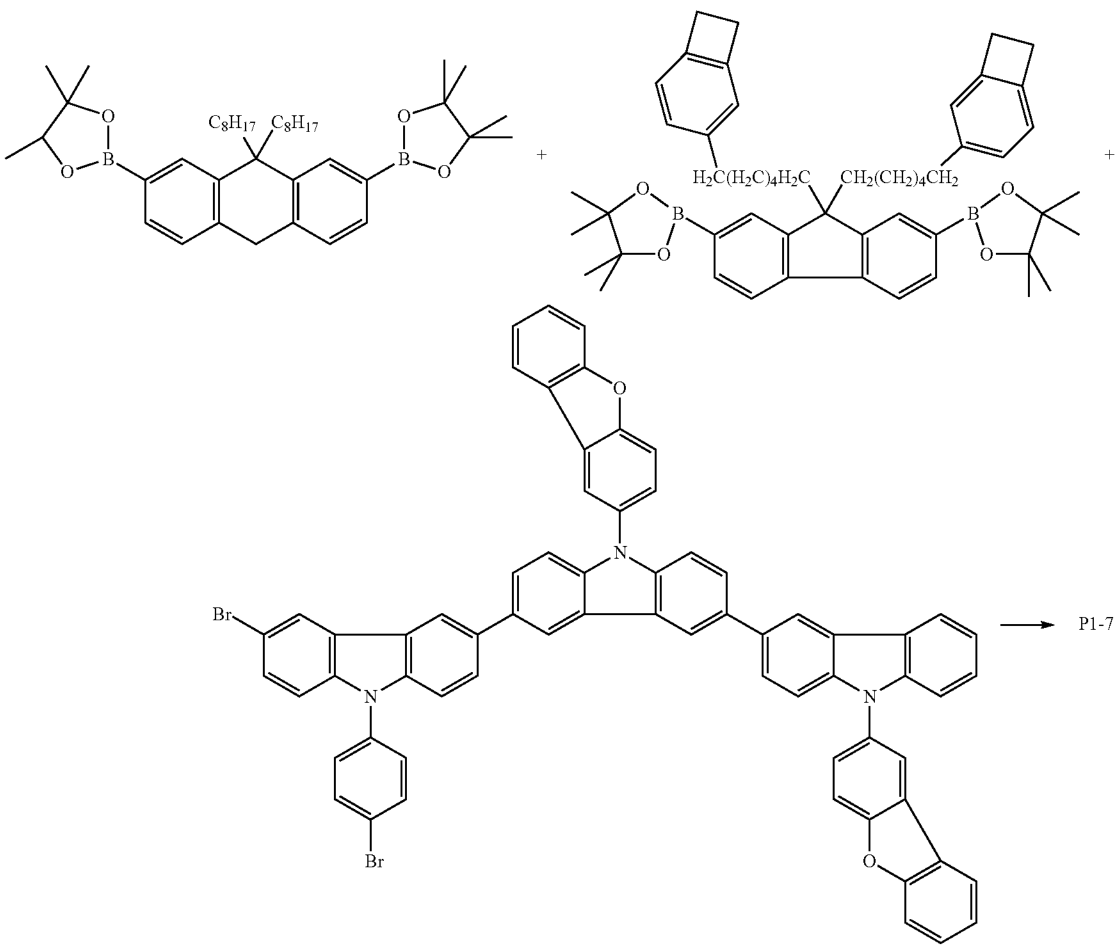

The polymer P1-7 was synthesized by using 2,7-bis(4,4,5,5-tetramethyl-1,3,2-dioxaborolan-2-yl)-9,9-di-n-octylfluorene, M-12 and M-13 in the same manner as in the synthesis of P1-1. 5.5 g of an intended substance was obtained. The polymer P1-7 had a number average molecular weight of $1.0\times10^4$ in terms of polystyrene and a weight average molecular weight of $2.5\times10^4$ in terms of polystyrene.

Example 8

Polymer P1-8 was synthesized according to the following scheme.

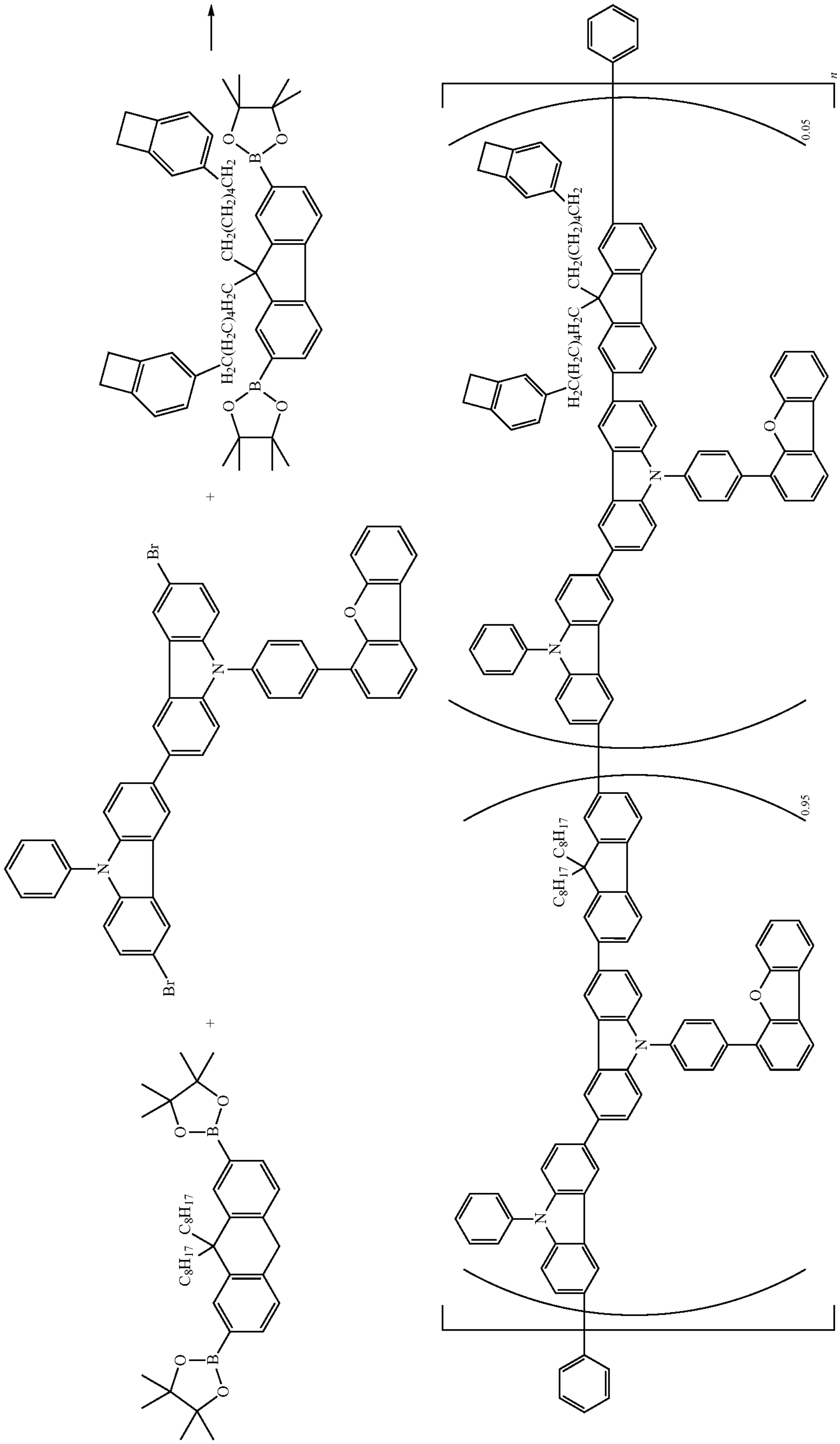
P1-8

The polymer P1-8 was synthesized by using 2,7-bis(4,4,5,5-tetramethyl-1,3,2-dioxaborolan-2-yl)-9,9-di-n-octylfluorene, M-1 and M-13 in the same manner as in the synthesis of P1-1. 5.2 g of an intended substance was obtained. The polymer P1-8 had a number average molecular weight of $3.8\times10^4$ in terms of polystyrene and a weight average molecular weight of $1.6\times10^4$ in terms of polystyrene.

Comparative Example 1

Polymer P1-9 was synthesized according to the following scheme.

(1) Synthesis of Monomer M-14

(a) Synthesis of Intermediate M-14-1

Under a nitrogen atmosphere, 6.0 g (35.4 mmol) of diphenylamine, 6.5 g (35.4 mmol) of bromobenzocyclobutene, 0.2 g (0.9 mmol) of $Pd(OAc)_2$, 0.3 g (1.4 mmol) of $P(t\text{-}Bu)_3$, 6.8 g (70.8 mmol) of sodium-t-butoxide and 100 mL of toluene were placed in a 300 mL three-necked flask equipped with a cooling tube. The mixture was heated under reflux for 8 hours.

After completion of the reaction, the solvent was removed under reduced pressure. Then, by adding 100 mL of dichlo-

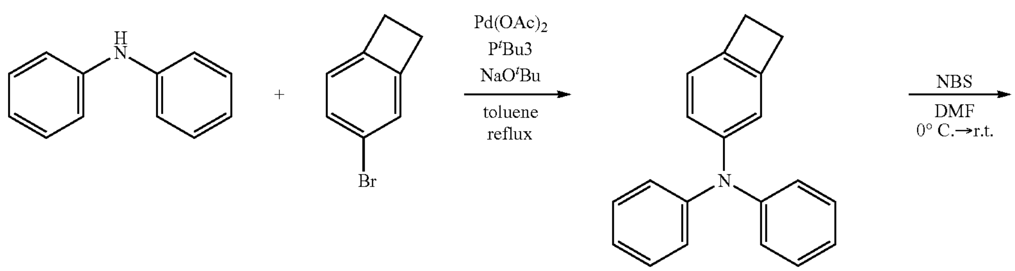

M-14-1

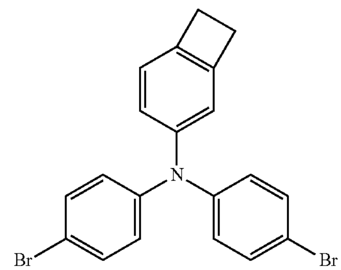

M-14

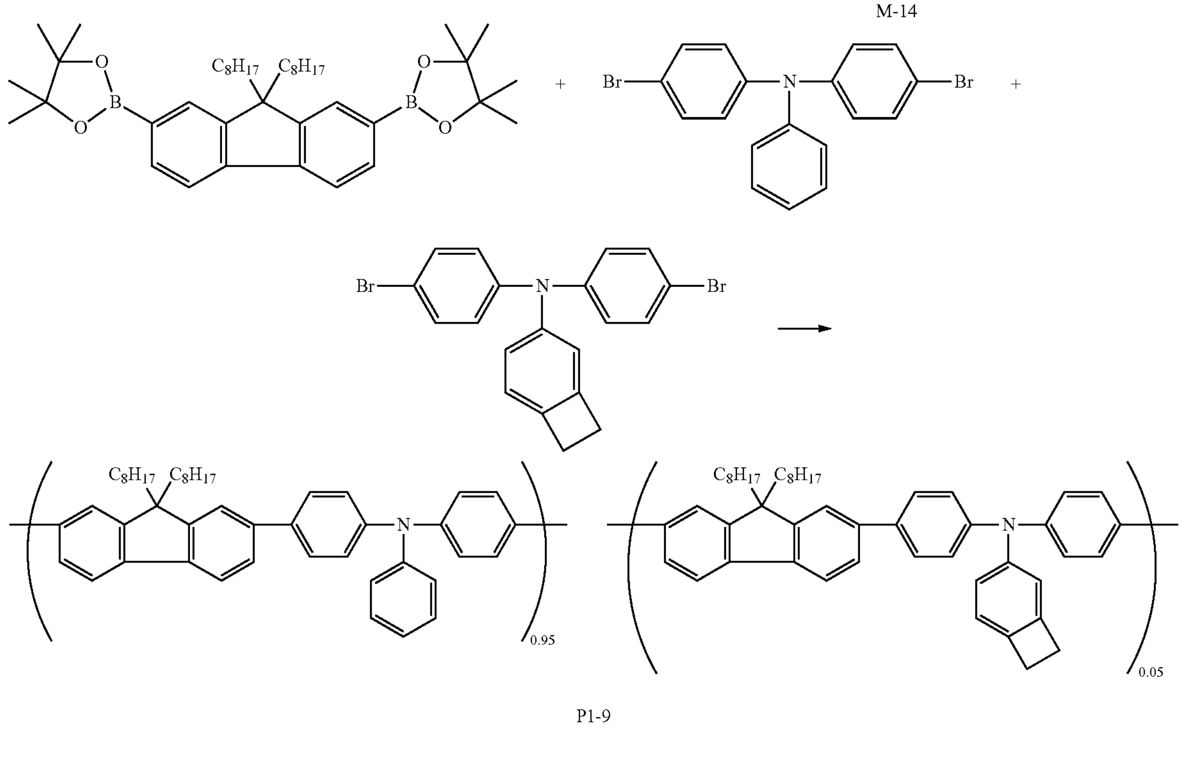

P1-9 romethane and 100 mL of water thereto, an intended substance was extracted to take out an organic phase. $MgSO_4$ was added to the organic phase thus taken out for drying. $MgSO_4$ was removed by filtration. The solvent was removed under reduced pressure, and the resulting crude product was purified by means of silica-gel chromatography. The resulting solids were dried under reduced pressure to obtain 7.2 g of white solids (yield: 88%).

By $^1$H-NMR spectrum and FD-MS analysis, the white powder obtained was confirmed to be the intermediate M-14-1.

(b) Synthesis of M-14

M-14 was synthesized by using the intermediate M-14-1 in the same manner as in the synthesis of intermediate M-1-1. 4.8 g of an intended substance was obtained (yield: 68%). By $^1$H-NMR spectrum and FD-MS analysis, it was confirmed to be M-14.

(2) Synthesis of P1-9

P1-9 was synthesized by using 2,7-bis(4,4,5,5-tetramethyl-1,3,2-dioxaborolane-2-yl)-9,9-di-n-octylfluorene, di(4-bromophenyl)phenylamine and M-14 in the same manner as in the synthesis of P1-1. 5.6 g of an intended substance was obtained. The polymer P1-9 had a number average molecular weight of $7.8\times10^3$ in terms of polystyrene and a weight average molecular weight of $2.4\times10^4$ in terms of polystyrene.

Comparative Example 2

The following polymer P1-10 was synthesized.

P1-10

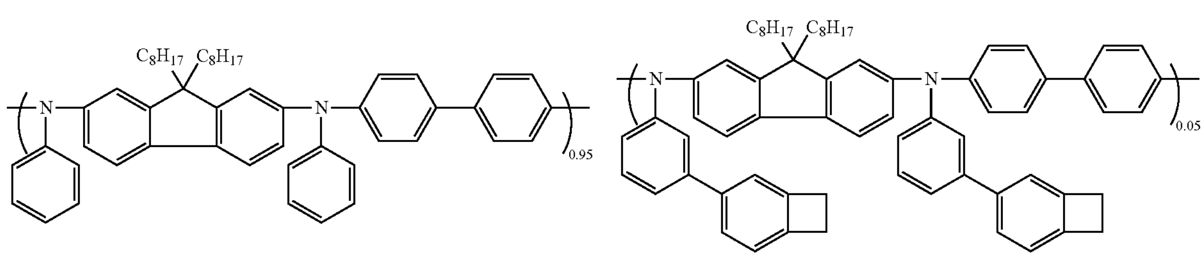

(1) Synthesis of Monomer M-16

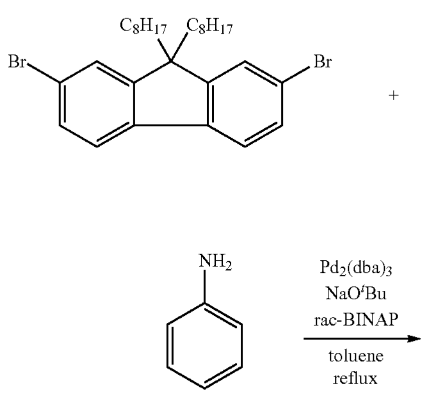

-continued

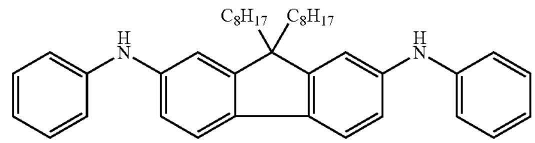

M-16

Under a nitrogen atmosphere, 10.0 g (18.2 mmol) of 9,9-dioctyl-2,7-dibromofluorene, 1.7 g (18.2 mmol) of aniline, 30.6 g (0.6 mmol) of $Pd_2$(dba), 1.7 g (0.8 mmol) of (±)-2,2'-bis(diphenylphosphino)-1,1'-binaphthyl(rac-BINAP), 5.0 g (72.8 mmol) of sodium-t-butoxide and 500 mL of toluene were mixed. The mixture was heated under reflux for 16 hours.

After completion of the reaction, the solvent was removed under reduced pressure. Then, by adding 100 mL of water thereto, an intended substance was extracted to take out an organic phase. $MgSO_4$ was added to the organic phase thus taken out for drying. $MgSO_4$ was removed by filtration. The solvent was removed under reduced pressure, and the resulting crude product was purified by means of silica-gel chromatography. The resulting solids were dried under reduced pressure to obtain 6.8 g of white solids (yield: 65%). By $^1$H-NMR spectrum and FD-MS analysis, the white powder obtained was confirmed to be the intermediate M-16.

(2) Synthesis of Monomer M-17

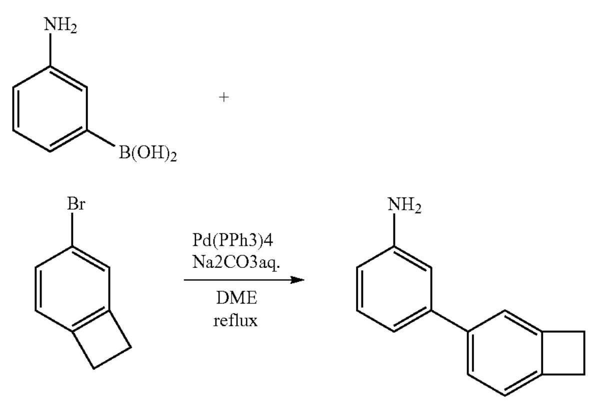

M-17-1

-continued

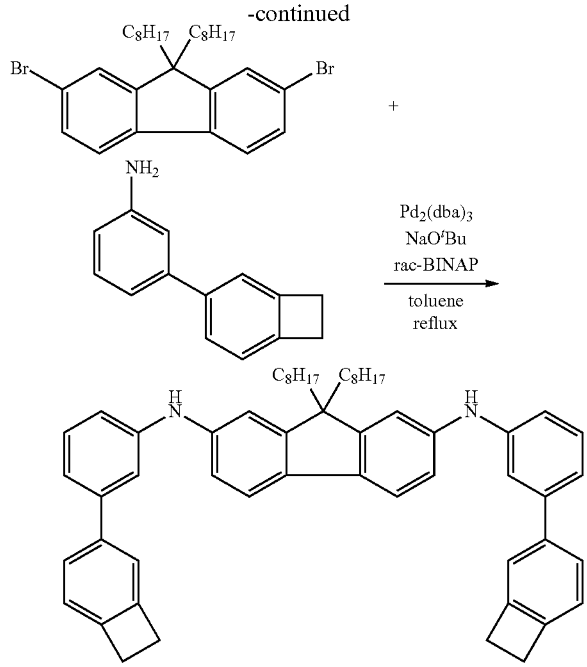

M-17

(2) Synthesis of Monomer M-17

(a) Synthesis of Intermediate M-17-1

The intermediate M-17-1 was synthesized by using the above-mentioned compounds in the same manner as in the synthesis of intermediate M-1-4. 7.8 g of an intended substance was obtained (yield: 68%). By $^1$H-NMR spectrum and FD-MS analysis, it was confirmed to be M-17-1.

(b) Synthesis of M-17

M-17 was synthesized by using the intermediate M-17-1 in the same manner as in the synthesis of the intermediate M-16. 5.8 g of an intended substance was obtained (yield: 63%). By $^1$H-NMR spectrum and FD-MS analysis, it was confirmed to be M-17.

(3) Synthesis of Polymer P1-10

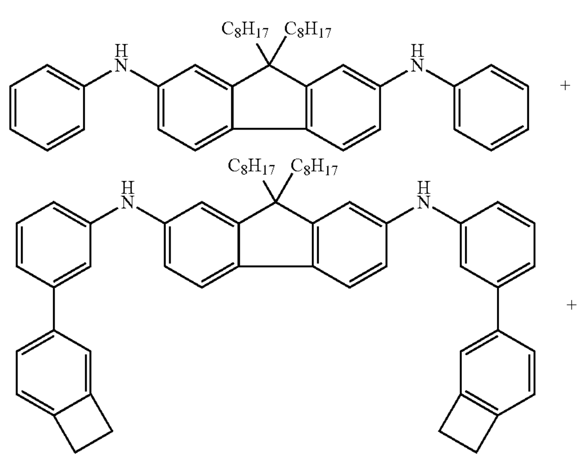

-continued

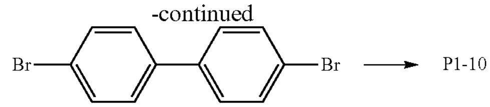

The polymer P1-10 was synthesized by using 4,4-dibromobiphenyl, M-16 and M-17 in the same manner as in the synthesis of P1-3. 4.5 g of an intended substance was obtained. The polymer P1-10 had a number average molecular weight of $1.3\times10^4$ in terms of polystyrene and a weight average molecular weight of $3.6\times10^4$ in terms of polystyrene.

Example 9

Fabrication and Evaluation of Organic EL Device

A glass substrate, measuring 25 mm×75 mm×1.1 mm thick, with an ITO transparent electrode (manufactured by Geomatics Co.) was subjected to ultrasonic cleaning in isopropyl alcohol for 5 minutes and then UV ozone cleaning for 30 minutes. On the cleaned glass substrate with a transparent electrode, a mixture of polyethylenedioxythiophene/polystyrenesulfonate (PEDOT:PSS) was formed into a 10 nm-thick film as a hole-injecting layer by spin coating (PSS: acceptor).

Subsequently, a xylene solution (1.0% by weight) of the polymer P1-1 obtained in Example 1 was formed into a 25 nm-thick film by spin coating. Next, the resulting thin film was dried under reduced pressure at 120° C. for an hour to form a hole-transporting layer.

Further, the following compound EM1 was formed into a 40 nm-thick film by deposition. At the same time, as light emitting molecules, the following amine compound D1 including a styryl group was deposited such that the weight ratio of EM1 to D1 became 95:5 to form an emitting layer. On the film obtained, the following Alq was deposited to form a 10 nm-thick film. The layer obtained served as an electron-injecting layer.

Subsequently, Li as a reducing dopant (Li source: manufactured by SAES Getters Co., Ltd.) and Alq were co-deposited to form an Alq:Li film (film thickness: 10 nm) as an electron-injecting layer (cathode). On the Alq:Li film, metal Al was deposited to form a metallic cathode. Glass sealing was conducted in nitrogen to fabricate an organic EL device.

EM1

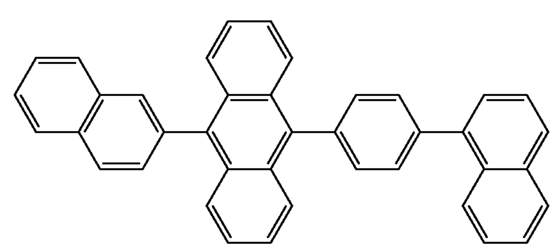

-continued

D1

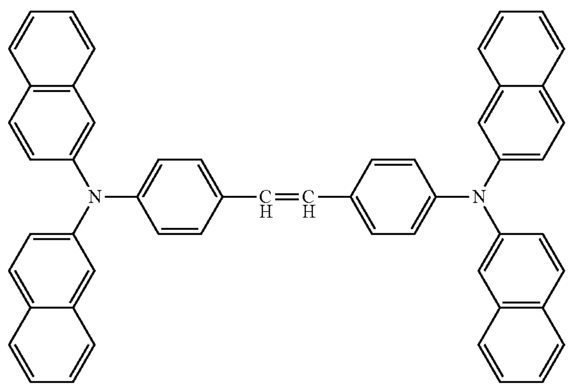

Alq

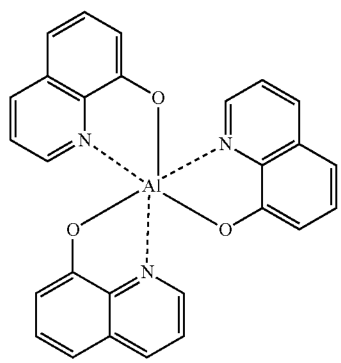

The fabricated organic EL device was evaluated by applying an electric current. The results are shown in Table 197.

Example 10

An organic EL device was fabricated and evaluated in the same manner as in Example 9, except that the following arylamine compound D2 was used instead of the amine compound D1 including a styryl group as a material for an emitting layer. The results are shown in Table 197.

D2

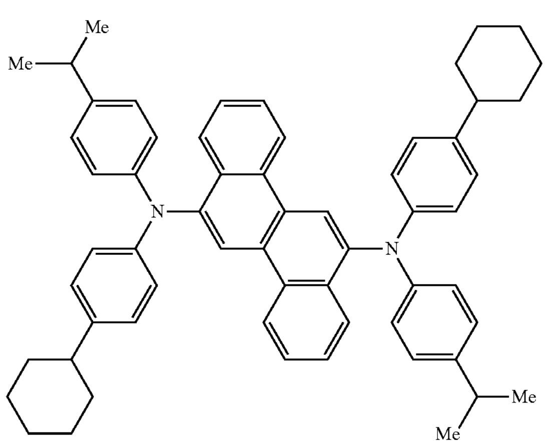

(Me: Methyl)

Comparative Example 3

An organic EL device was fabricated and evaluated in the same manner as in Example 9, except that P1-9 obtained in Comparative Example 1 was used instead of P1-1 as a hole-transporting material. The results are shown in Table 197.

Comparative Example 4

An organic EL device was fabricated and evaluated in the same manner as in Example 9, except that P1-10 obtained in Comparative Example 2 was used instead of P1-1 as a hole-transporting material. The results are shown in Table 197.

TABLE 197

| | Hole-transporting layer | Emitting layer | | Emitting | Luminous efficiency | Relative |
|---|---|---|---|---|---|---|
| Examples | Polymer | Host | Dopant | color | (cd/A) | lifetime |
| Example 9 | P1-1 | EM1 | D1 | Blue | 3.9 | 1.0 |
| Example 10 | P1-1 | EM1 | D2 | Blue | 3.8 | 1.1 |
| Com. Ex. 3 | P1-9 | EM1 | D1 | Blue | 0.9 | 0.1 |
| Com. Ex. 4 | P1-10 | EM1 | D1 | Blue | 1.0 | 0.1 |

*In the table, the relative lifetime is a value calculated by taking the lifetime of the device of Example 9 as 1.

The results of Examples 9 to 10 and Comparative Examples 3 and 4 show that organic EL devices using a biscarbazole polymer of the invention have superior luminous efficiency and longer lifetime as compared with organic EL devices using a comparative compound as an aromatic amine derivative.

Example 11 (Fabrication and Evaluation of Organic EL Device)

A glass substrate, measuring 25 mm×75 mm×1.1 mm thick, with an ITO transparent electrode (manufactured by Geomatics Co.) was subjected to ultrasonic cleaning in isopropyl alcohol for 5 minutes and then UV ozone cleaning for 30 minutes. On the cleaned glass substrate with a transparent electrode, a mixture of polyethylenedioxythiophene/polystyrenesulfonate (PEDOT:PSS) was formed into a 10 nm-thick film as a hole-injecting layer by spin coating (PSS: acceptor).

Subsequently, a xylene solution (1.0% by weight) of the polymer P1-1 obtained in Example 1 was formed into a 25 nm-thick film by spin coating. The resulting thin film was dried and hardened by heat treatment at 230° C. for 30 minutes to form a hole-transporting layer.

Next, a xylene solution (1.0% by weight) in which the compound EM1 (host) and the amine compound D1 including a styryl group (dopant) were mixed at the solid matter weight ratio of 95:5 was formed into a 40 nm-thick film by spin coating, dried at 150° C. for 30 minutes to obtain an emitting layer.

On the film obtained, Alq was deposited to form a 10 nm-thick film. The layer obtained served as an electron-injecting layer. Subsequently, Li as a reducing dopant (Li source: manufactured by SAES Getters Co., Ltd.) and Alq were co-deposited to form an Alq:Li film (film thickness: 10 nm) as an electron-injecting layer (cathode). On the Alq:Li film, metal Al was deposited to form a metallic cathode. Glass sealing was conducted in nitrogen to fabricate an organic EL device.

The fabricated organic EL device was evaluated by applying an electric current. The results are shown in Table 198.

Example 12

An organic EL device was fabricated and evaluated in the same manner as in Example 11, except that the polymer P1-2 obtained in Example 2 was used instead of P1-1 as a hole-transporting material. The results are shown in Table 198.

Example 13

An organic EL device was fabricated and evaluated in the same manner as in Example 11, except that the polymer P1-3 obtained in Example 3 was used instead of P1-1 as a hole-transporting material. The results are shown in Table 198.

Example 14

An organic EL device was fabricated and evaluated in the same manner as in Example 11, except that the polymer P1-4 obtained in Example 4 was used instead of P1-1 as a hole-transporting material. The results are shown in Table 198.

Example 15

An organic EL device was fabricated and evaluated in the same manner as in Example 11, except that the polymer P1-5 obtained in Example 5 was used instead of P1-1 as a hole-transporting material. The results are shown in Table 198.

Example 16

An organic EL device was fabricated and evaluated in the same manner as in Example 11, except that the polymer P1-6 obtained in Example 6 was used instead of P1-1 as a hole-transporting material. The results are shown in Table 198.

Example 17

An organic EL device was fabricated and evaluated in the same manner as in Example 11, except that the polymer P1-7 obtained in Example 7 was used instead of P1-1 as a hole-transporting material. The results are shown in Table 198.

Example 18

An organic EL device was fabricated and evaluated in the same manner as in Example 11, except that the polymer P1-8 obtained in Example 8 was used instead of P1-1 as a hole-transporting material. The results are shown in Table 198.

Example 19

An organic EL device was fabricated and evaluated in the same manner as in Example 11, except that the arylamine compound D2 was used instead of the amine compound D1 including a styryl group as a material for an emitting layer. The results are shown in Table 198.

Comparative Example 5

An organic EL device was fabricated and evaluated in the same manner as in Example 11, except that the polymer P1-9 obtained in Comparative Example 1 was used instead of P1-1 as a hole-transporting material. The results are shown in Table 198.

Comparative Example 6

An organic EL device was fabricated and evaluated in the same manner as in Example 11, except that the polymer P1-10 obtained in Comparative Example 2 was used instead of P1-1 as a hole-transporting material. The results are shown in Table 198.

TABLE 198

| Examples | Hole-transporting Polymer | Emitting layer Host | Emitting layer Dopant | Emitting color | Luminous efficiency [cd/A] | Relative lifetime |
|---|---|---|---|---|---|---|
| Example 11 | P1-1 | EM1 | D1 | Blue | 3.0 | 1.0 |
| Example 12 | P1-2 | EM1 | D1 | Blue | 2.9 | 0.9 |
| Example 13 | P1-3 | EM1 | D1 | Blue | 3.1 | 1.0 |
| Example 14 | P1-4 | EM1 | D1 | Blue | 3.2 | 1.1 |
| Example 15 | P1-5 | EM1 | D1 | Blue | 2.9 | 1.0 |
| Example 16 | P1-6 | EM1 | D1 | Blue | 3.1 | 0.9 |
| Example 17 | P1-7 | EM1 | D1 | Blue | 3.1 | 1.0 |
| Example 18 | P1-8 | EM1 | D1 | Blue | 3.2 | 0.9 |
| Example 19 | P1-9 | EM1 | D2 | Blue | 3.3 | 1.1 |
| Com. Ex. 5 | P1-9 | EM1 | D1 | Blue | 0.2 | 0.1 |
| Com. Ex. 6 | P1-10 | EM1 | D1 | Blue | 0.3 | 0.1 |

*In the table, the relative lifetime is a value calculated by taking the lifetime of the device of Example 11 as 1.

The results of Examples 11 to 19 and Comparative Examples 5 and 6 show that organic EL devices using a biscarbazole polymer of the invention have superior luminous efficiency and longer lifetime compared with organic EL devices using a comparative compound as an aromatic amine derivative.

In addition, it can be confirmed that even if a hole-injecting layer, a hole-transporting layer and an emitting layer are formed by a wet film forming method, an organic device obtained can exhibit excellent performances.

Second Invention

Production of Polymer

Example 21

Polymer P2-1 was synthesized according to the following synthesis scheme.

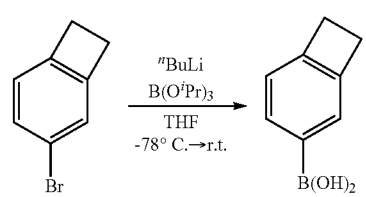

M-20

-continued

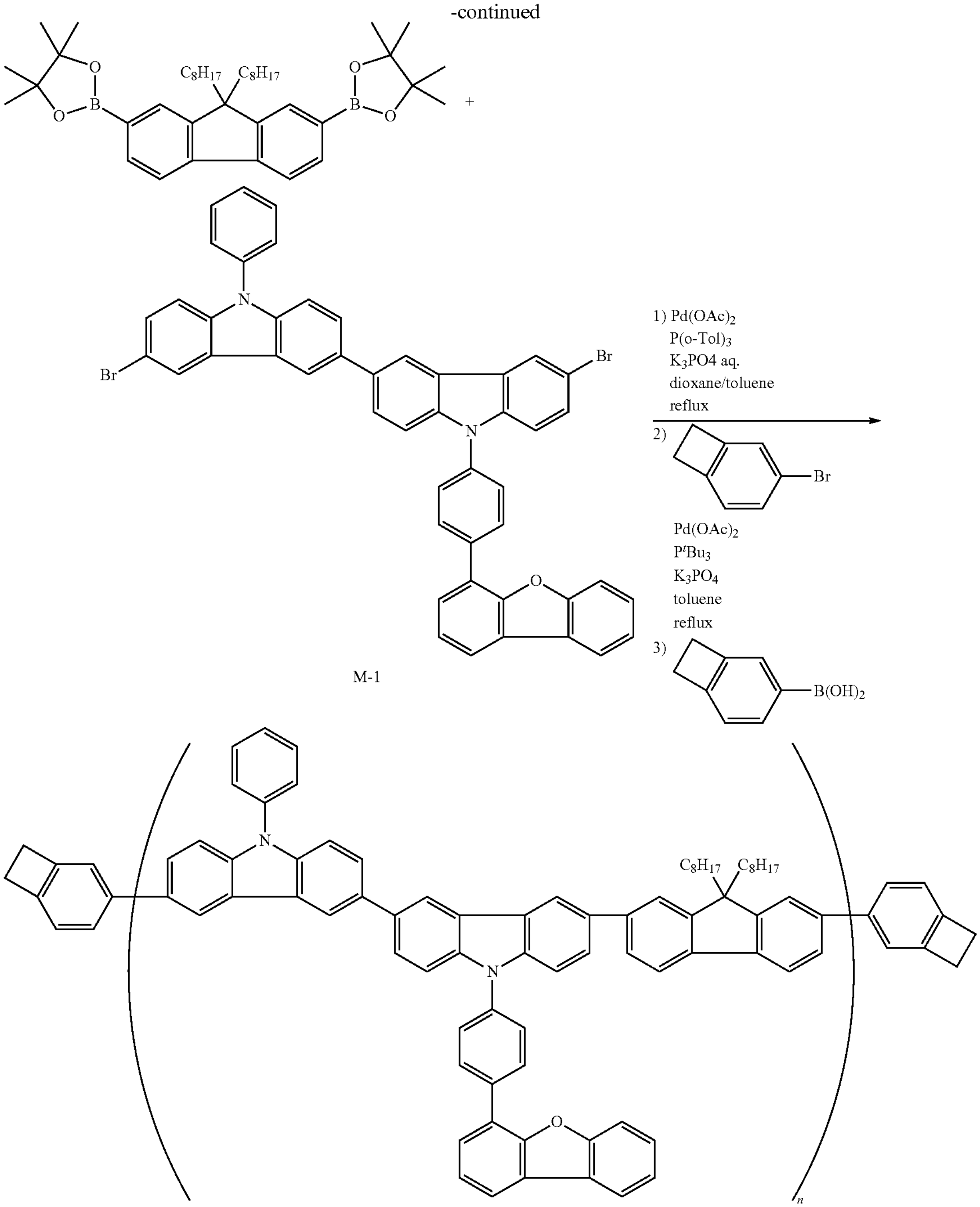

P2-1

(1) Synthesis of Cross-Linkage Group M-20

The cross-linkage group M-20 was synthesized in the same manner as in the synthesis of intermediate M-1-3, except that 4-bromobenzocyclobutene was used instead of the intermediate M-1-2 in Example 1. 5.8 g of an intended substance was obtained (yield: 78%).

By $^{1}$H-NMR spectrum and FD-MS analysis, the intended substance obtained was identified as M-2.

(2) Synthesis of Polymer P2-1

Under a nitrogen atmosphere, 4.1 g (6.2 mmol) of 2,7-bis(4,4,5,5-tetramethyl-1,3,2-dioxaborolane-2-yl)-9,9-di-n-octylfluorene, 5.0 g (6.2 mmol) of M-1 synthesized in the same manner as in Example 1 (1), 0.01 g (0.04 mmol) of $Pd(OAc)_2$, 0.06 g (0.2 mmol) of $P(o\text{-}Tol)_3$, 6.6 g (30.9 mmol) of potassium phosphate, 50 mL of dioxane, 12 mL of toluene and 11 mL of water were mixed and heated under reflux for 16 hours. After completion of the reaction, the solvent was removed under reduced pressure. By addition of 150 mL of toluene and 100 mL of water, an intended substance was extracted to take out an organic phase. $MgSO_4$ was added to the organic phase thus taken out for drying. $MgSO_4$ was removed by filtration. The solvent was concentrated under reduced pressure to obtain a concentrated liquid. Filtration was conducted by passing the concentrated liquid through silica gel. A collected solution was concentrated under reduced pressure. The concentrated solution was added to methanol dropwise to precipitate solids. The solids were filtered and dried under reduced pressure.

Under a nitrogen atmosphere, the resulting crude product, 0.3 g (1.7 mmol) of 4-bromobenzocyclobutene, 0.03 g (0.04 mmol) of $Pd(OAc)_2$, 0.01 g (0.05 mmol) of $P(t\text{-}Bu)_3$, 2.0 g (9.5 mmol) of potassium phosphate and 50 mL of toluene were mixed, and heated under reflux for 8 hours. Next, 0.3 g (1.9 mmol) of M-20 was added and heated further for 8 hours. After completion of the reaction, an intended substance was extracted by adding 100 mL of water to take out an organic phase. $MgSO_4$ was added to the organic phase thus taken out for drying. $MgSO_4$ was removed by filtration. The collected filtrate was filtered through silica gel. A collected solution was concentrated, followed by addition of an aqueous solution of diethyldithiacarbamate. The mixture was stirred at 80° C. for 8 hours. After cooling, an organic phase was washed with water. The resulting solution was added to methanol dropwise to obtain a precipitate by filtration.

The precipitate was dissolved in toluene and purified through a silica-gel column. The solution obtained was added to methanol dropwise and stirred. Then, the precipitate obtained was filtered and dried to obtain 4.4 g of polymer P2-1.

The polymer P2-1 had a number average molecular weight of $0.9\times10^4$ in terms of polystyrene and a weight average molecular weight of $2.2\times10^4$ in terms of polystyrene.

The molecular weight in terms of polystyrene and molecular weight distribution in terms of polystyrene of the polymer P2-1 were measured by means of size exclusion chromatography (SEC). The measurement was conducted as below.

10 mg of the polymer P2-1 as a sample was dissolved in 10 ml of THF (tetrahydrofuran). 100 μl of the solution obtained was injected into a SEC apparatus. The flow rate was set to 1 ml per minute. The column temperature was set to 40° C.

As a size exclusion chromatography (SEC) apparatus, HLC-8220 manufactured by TOSO CORPORATION was used. As a detector, a refractive index (RI) detector or an ultraviolet-visible (UV) detector was used. As columns, 2 of TSKgel GMH-XL and 1 of TSKgel G2000-XL manufactured by TOSO CORPORATION were used. As a standard sample, TSK standard polystyrene manufactured by TOSO CORPORATION was used.

Example 22

The polymer P2-2 was synthesized according to the following synthesis scheme.

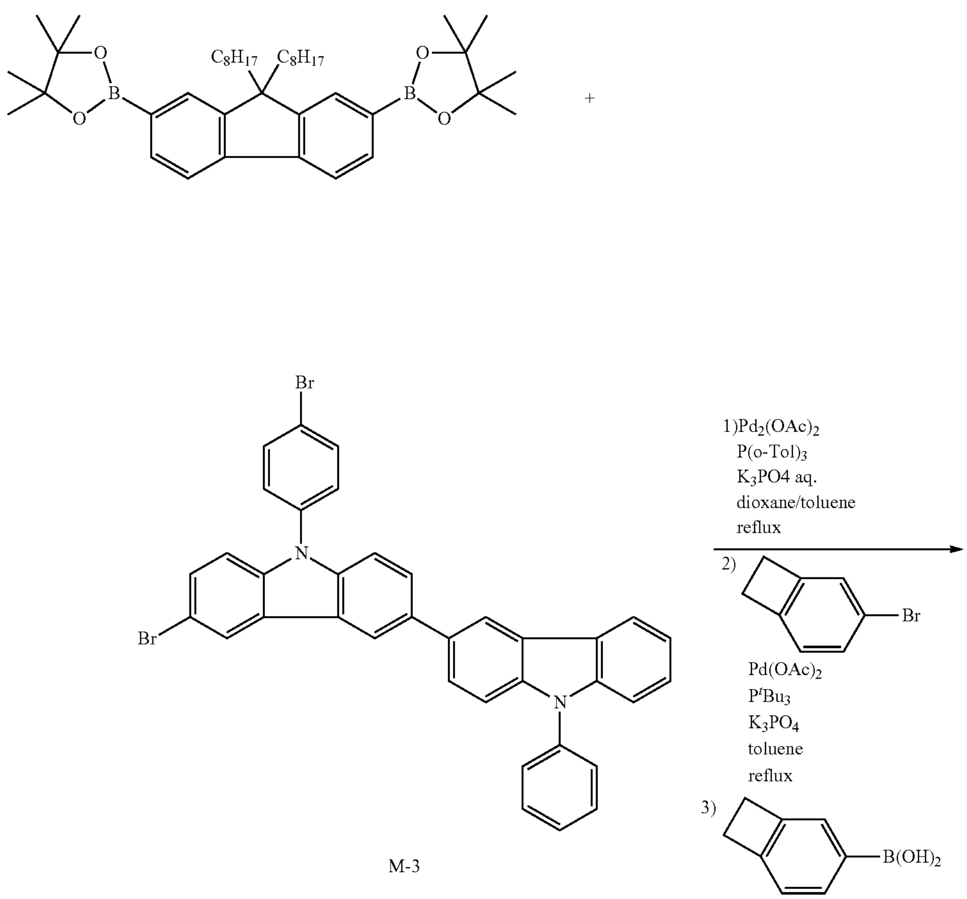

M-3

-continued

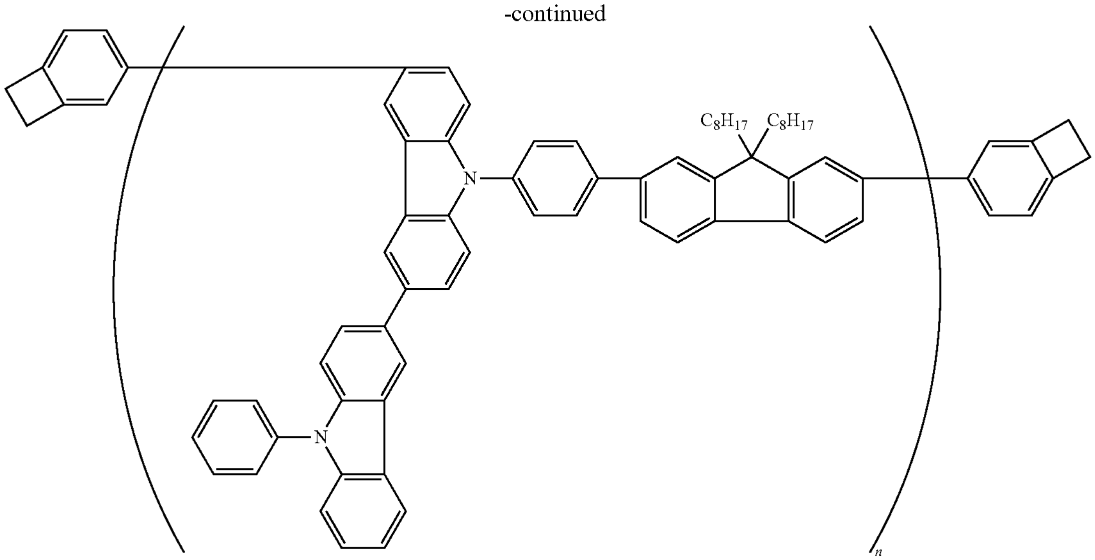

P2-2

The polymer P2-2 was synthesized in the same manner as in the synthesis of polymer P2-1, except that the monomer M-3 synthesized in the same manner as in Example 2 (1) was used instead of the monomer M-1. 3.8 g of the polymer P2-2 was obtained.

The polymer P2-2 had a number average molecular weight of $1.3\times10^4$ in terms of polystyrene and a weight average molecular weight of $3.0\times10^4$ in terms of polystyrene.

Example 23

The polymer P2-3 was synthesized according to the following synthesis scheme.

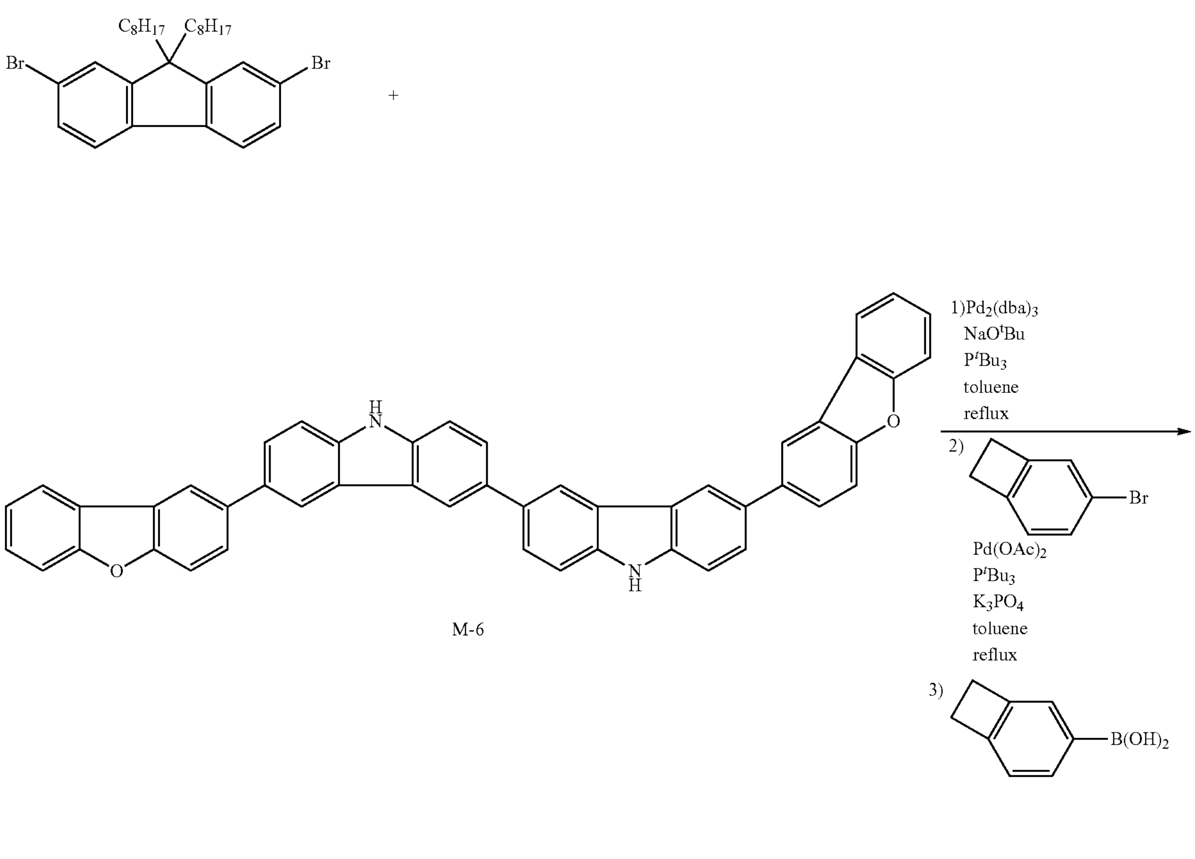

M-6

-continued

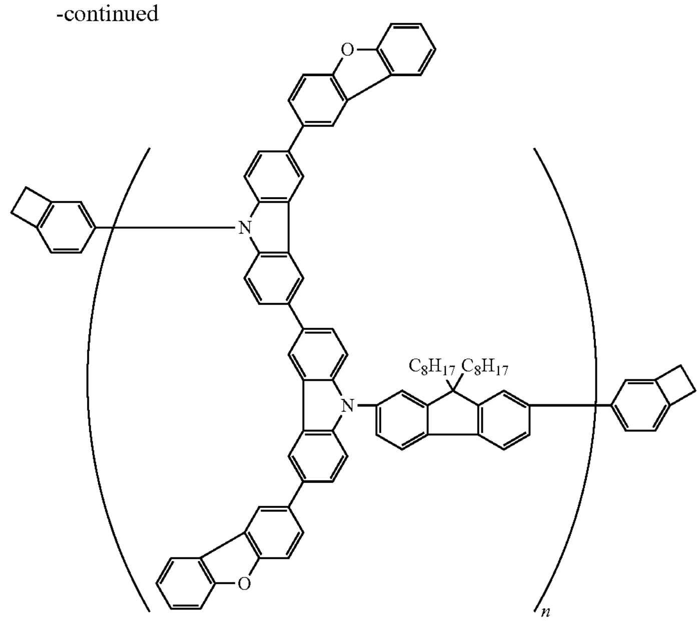

P2-3

Under a nitrogen atmosphere, 5.8 g (10.0 mmol) of 9,9-dioctyl-2,7-dibromofluorene, 7.0 g (10.5 mmol) of M-6 synthesized in the same manner as in Example 3 (2), 0.2 g (0.2 mmol) of $Pd_2(dba)_3$, 0.06 g (0.3 mmol) of $P(t\text{-}Bu)_3$, 3.0 g (31.5 mmol) of sodium-t-butoxide and 40 mL of xylene were mixed. The mixture was heated under reflux for 20 hours.

After completion of the reaction, the solvent was removed under reduced pressure. An intended substance was extracted by adding 100 mL of water to take out an organic phase. The thus taken organic phase was dried by adding $MgSO_4$. $MgSO_4$ was removed by filtration. The solvent was concentrated under reduced pressure. The concentrated liquid was filtered through silica gel. The collected solution was concentrated under reduced pressure. The concentrated solution was added to methanol dropwise to precipitate solids. The solids were collected by suction filtration and dried under reduced pressure.

Under a nitrogen atmosphere, the crude product, 0.6 g (3.2 mmol) of 4-bromobenzocyclobutene, 20.04 g (0.2 mmol) of Pd(OAc), 0.06 g (0.3 mmol) of $P(t\text{-}Bu)_3$, 1.1 g (5.2 mmol) of potassium phosphate and 40 mL of toluene were mixed. The mixture was heated under reflux for 8 hours. Next, 0.5 g (3.2 mmol) of M-20 was added thereto, and heated further for 8 hours.

After completion of the reaction, an intended substance was extracted by adding 100 mL of water to take out an organic phase. $MgSO_4$ was added to the organic phase thus taken out for drying. $MgSO_4$ was removed by filtration. A collected filtrate was filtered through silica gel. A collected solution was concentrated, followed by addition of an aqueous solution of sodium diethyldithiacarbamate. The mixture was stirred at 80° C. for 2 hours. After cooling, an organic phase was washed with water. The solution obtained was added to methanol dropwise to obtain a precipitate by filtration.

The precipitate was dissolved in toluene and purified through a silica-gel column. The solution obtained was added to methanol dropwise and stirred. Then, the precipitate obtained was filtered and dried to obtain 6.3 g of polymer P2-3.

The polymer P2-3 had a number average molecular weight of $1.2\times10^4$ in terms of polystyrene and a weight average molecular weight of $3.1\times10^4$ in terms of polystyrene.

Example 24

Polymer P2-4 was synthesized according to the following synthesis scheme.

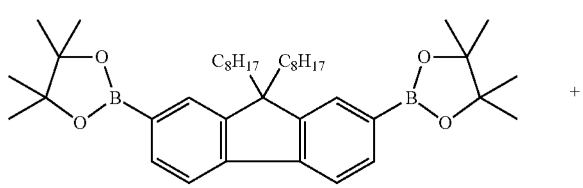

-continued

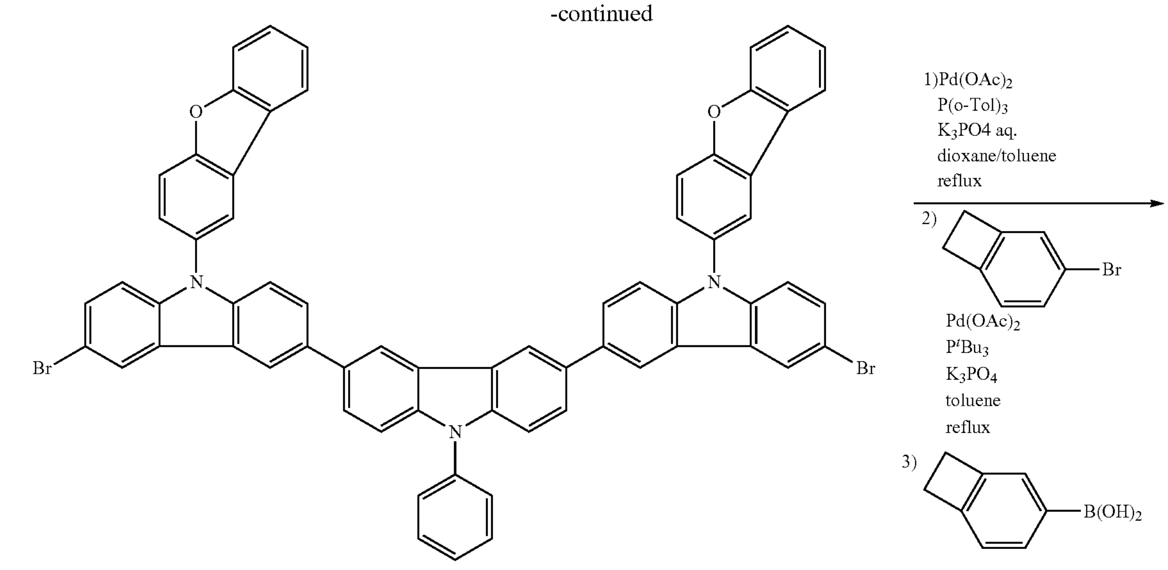

M-7

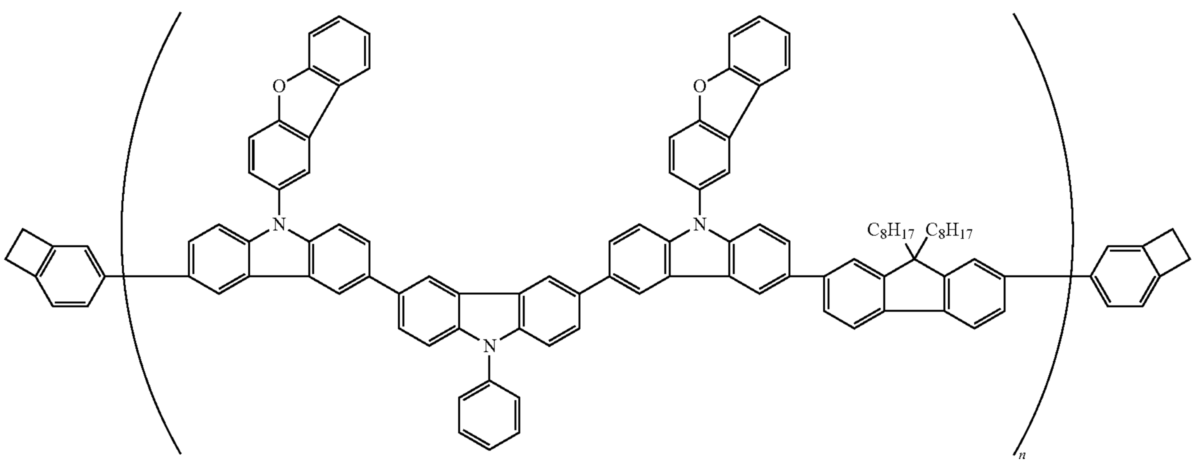

P2-4

The same reaction as in the synthesis of P2-1 was conducted, except that the monomer M-7 synthesized in the same manner as in Example 4 (1) was used instead of the monomer M-1, to obtain 2.8 g of the polymer P2-4.

The polymer P2-4 had a number average molecular weight of $1.7\times10^4$ in terms of polystyrene and a weight average molecular weight of $3.7\times10^4$ in terms of polystyrene.

Example 25

Polymer P2-5 was synthesized according to the following synthesis scheme.

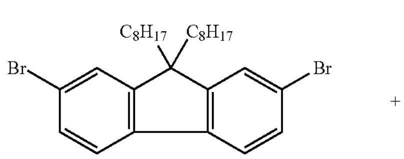

-continued

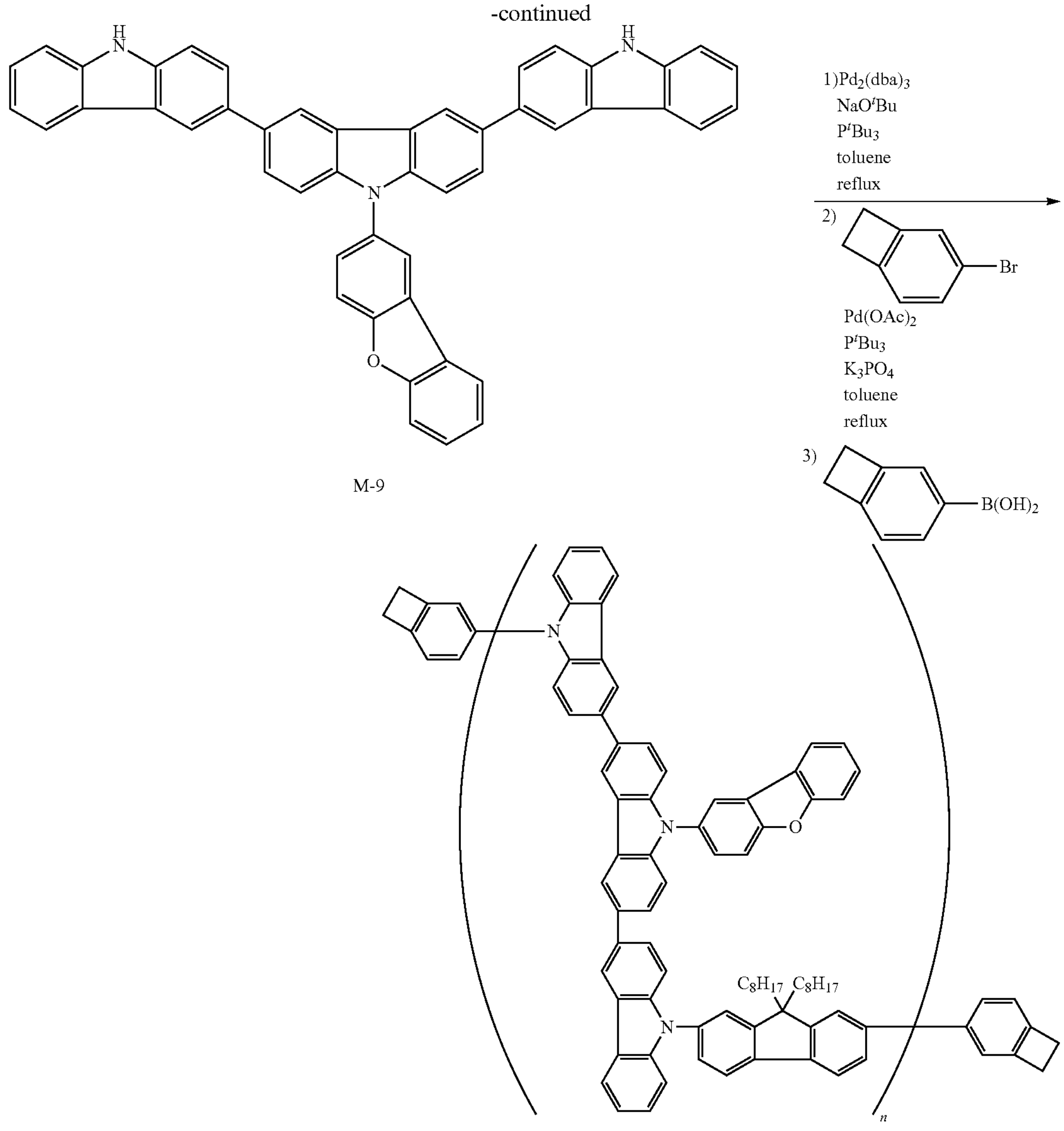

M-9

P2-5

The same reaction as in the synthesis of polymer P2-3 was conducted, except that the monomer M-9 synthesized in the same manner as in Example 5 (1) was used instead of the monomer M-4, to obtain 5.1 g of the polymer P2-5.

The polymer P2-5 had a number average molecular weight of $1.6\times10^4$ in terms of polystyrene and a weight average molecular weight of $3.9\times10^4$ in terms of polystyrene.

Example 26

Polymer P2-6 was synthesized according to the following synthesis scheme.

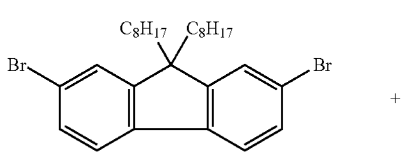

-continued

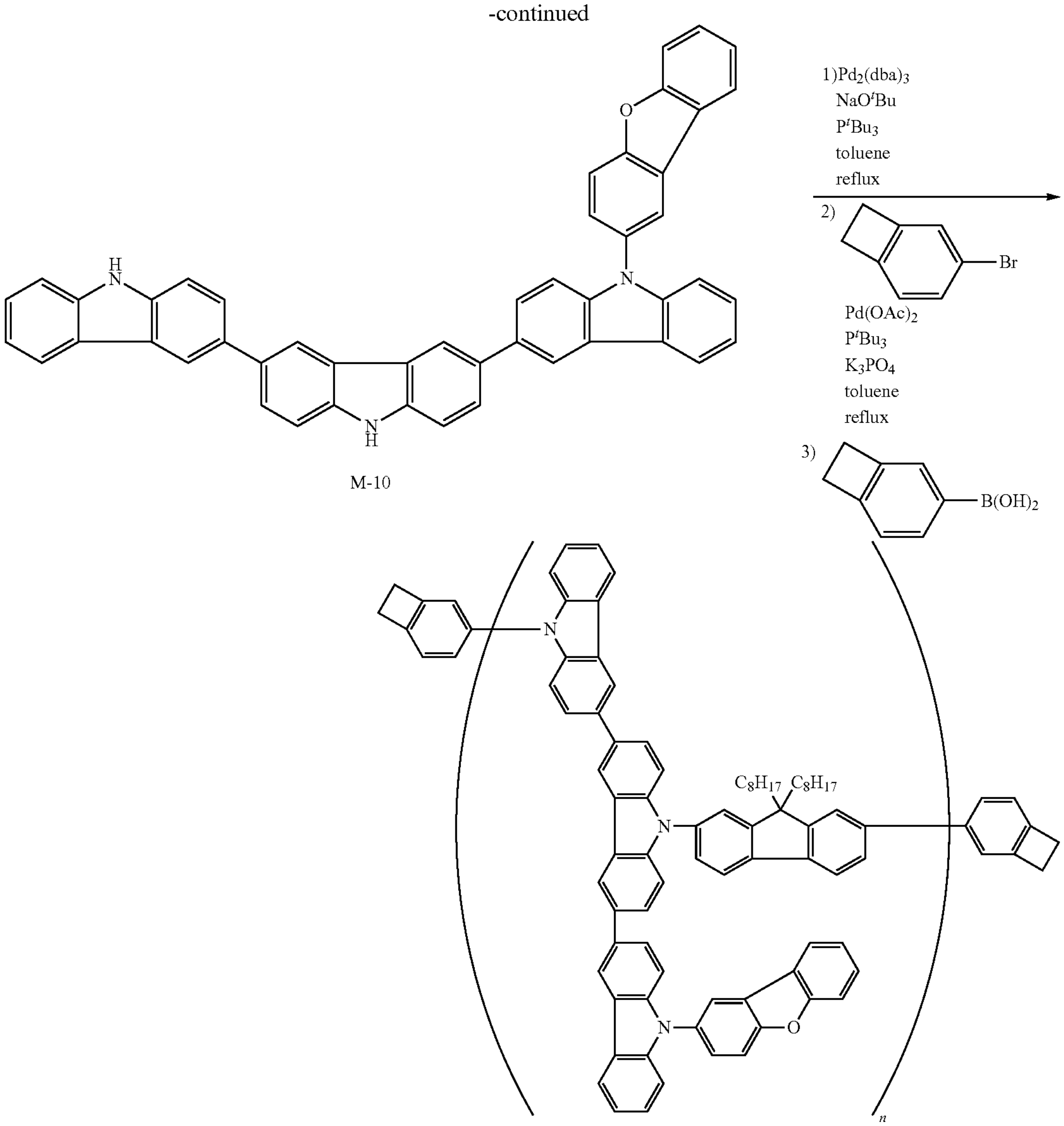

M-10

P2-6

The same reaction as in the synthesis of polymer P2-3 was conducted, except that the monomer M-10 synthesized in the same manner as in Example 6 (1) was used instead of the monomer M-4, to obtain 3.9 g of the polymer P2-6.

The polymer P2-6 had a number average molecular weight of $1.5\times10^4$ in terms of polystyrene and a weight average molecular weight of $3.6\times10^4$ in terms of polystyrene.

Example 27

Polymer P2-7 was synthesized according to the following synthesis scheme.

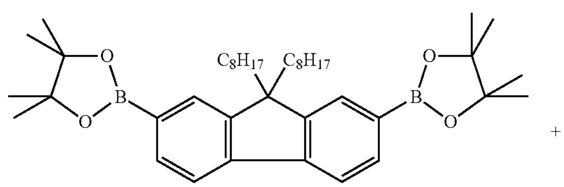

-continued

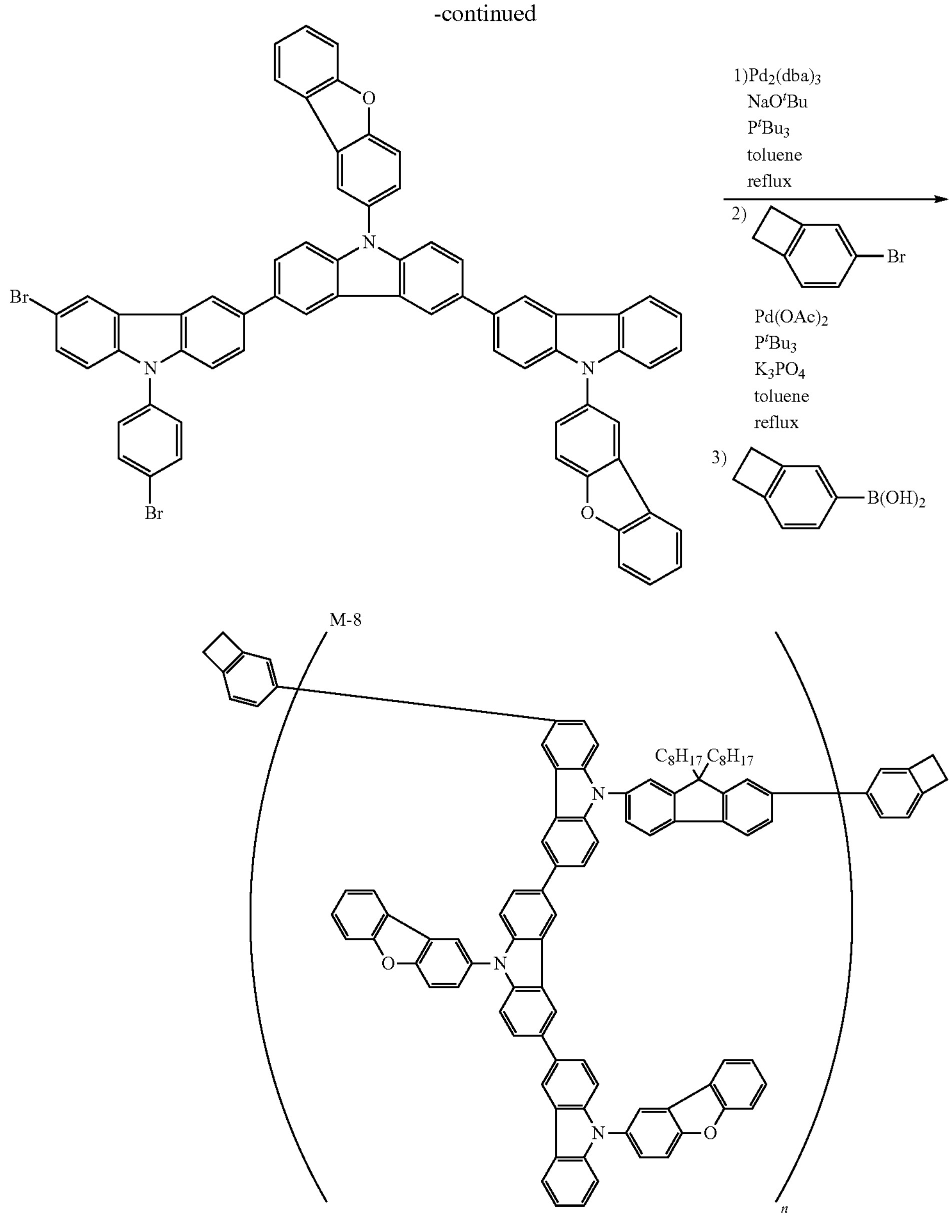

P2-7

The same reaction as in the synthesis of polymer P2-1 was conducted, except that the monomer M-12 synthesized in the same manner as in Example 7 (1) was used instead of the monomer M-1 to obtain 5.8 g of the polymer P2-7.

The polymer P2-7 had a number average molecular weight of $1.4\times10^4$ in terms of polystyrene and a weight average molecular weight of $3.1\times10^4$ in terms of polystyrene.

Fabrication (Applying+Deposition) and Evaluation of Organic EL Device

Example 28

A glass substrate, measuring 25 mm×75 mm×1.1 mm thick, with an ITO transparent electrode (manufactured by Geomatics Co.) was subjected to ultrasonic cleaning in isopropyl alcohol for 5 minutes and then UV ozone cleaning for 30 minutes. On the cleaned glass substrate with a transparent electrode, a mixture of polyethylenedioxythiophene/polystyrenesulfonate (PEDOT:PSS) was formed into a 10 nm-thick film as a hole-injecting layer by spin coating. Subsequently, a xylene solution (1.0% by weight) of the polymer P2-1 obtained in Example 21 was formed into a 25 nm-thick film by spin coating. Next, the resulting thin film was dried under reduced pressure at 120° C. for an hour to form a hole-transporting layer. Further, the compound EM1 was deposited to form a 40 nm-thick film thereon. At the same time, as light emitting molecules, the amine compound D1 including a styryl group was deposited such that the ratio by weight of EM1 to D1 became 95:5 to form an emitting layer. On this film, Alq was deposited to form a 10 nm-thick film. This layer served as an electron-injecting layer. After that, Li as a reducing dopant (Li source: manufactured by SAES Getters Co., Ltd.) and Alq were co-deposited to form an Alq:Li film (film thickness: 10 nm) as an electron-injecting layer (cathode). On the Alq:Li film, metal Al was deposited to form a metallic cathode. Glass sealing was conducted in nitrogen to fabricate an organic EL device.

Meanwhile, the compound EM1, D1 and Alq are as defined in Example 9.

The organic EL devices obtained were evaluated for the luminous efficiency and the emission lifetime. The results are shown in Table 199. As for the luminous lifetime, the life time of the device of Example 28 was used as a standard.

Example 29

An organic EL device was fabricated and evaluated in the same manner as in Example 28, except that the arylamine compound D2 used in Example 10 was used instead of the amine compound D1 including a styryl group as a material for an emitting layer. The results are shown in Table 199.

Comparative Example 21

Polymer P2-8 was synthesized according to the following synthesis scheme.

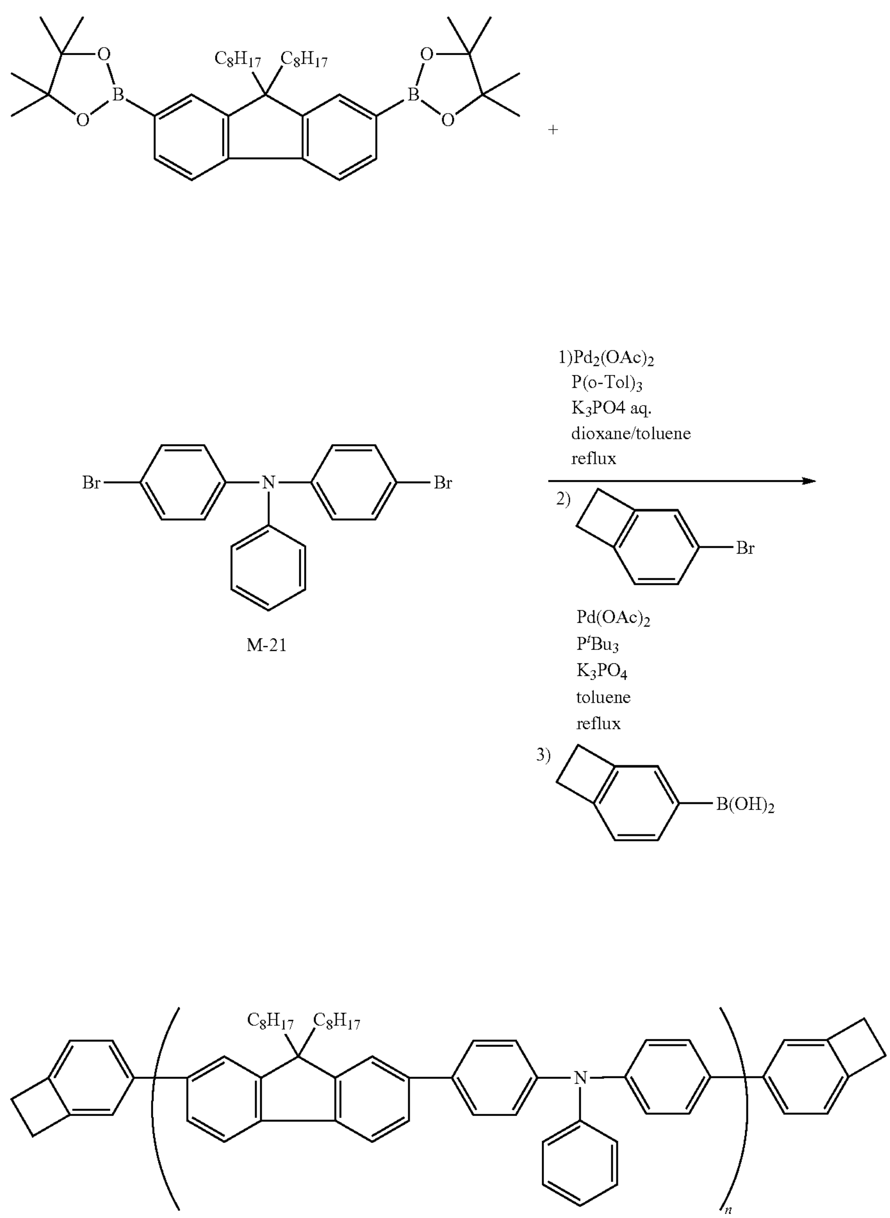

P2-8

The same reaction as in the synthesis of polymer P2-1 was conducted, except that the compound M-21 obtained according to the usual method was used instead of the intermediate M-1, to obtain 5.6 g of the polymer P2-8.

The polymer P2-8 had a number average molecular weight of $7.8\times10^3$ in terms of polystyrene and a weight average molecular weight of $2.4\times10^4$ in terms of polystyrene.

An organic EL device was fabricated and evaluated in the same manner as in Example 28, except that the polymer P2-8 was used as a hole-transporting material instead of the polymer P2-1. The results are shown in Table 199.

Comparative Example 22

Polymer P2-9 was synthesized according to the following synthesis scheme.

TABLE 199

| | Hole-transporting polymer | Emitting layer Host | Emitting layer Dopant | Emitting color | Luminous efficiency [cd/A] | Relative lifetime [−] |
|---|---|---|---|---|---|---|
| Example 28 | P2-1 | EM1 | D1 | Blue | 3.7 | 1.0 |
| Example 29 | P2-1 | EM1 | D2 | Blue | 3.8 | 0.9 |
| Com. Ex. 21 | P2-8 | EM1 | D1 | Blue | 1.0 | 0.5 |
| Com. Ex. 22 | P2-9 | EM1 | D1 | Blue | 1.1 | 0.4 |

*In the table, the relative lifetime is a value calculated by taking the emission lifetime of the device of Example 28 as 1.

The results of Examples 28 and 29 and Comparative Examples 21 and 22 show that organic EL devices using a biscarbazole polymer as a polymer of the invention have

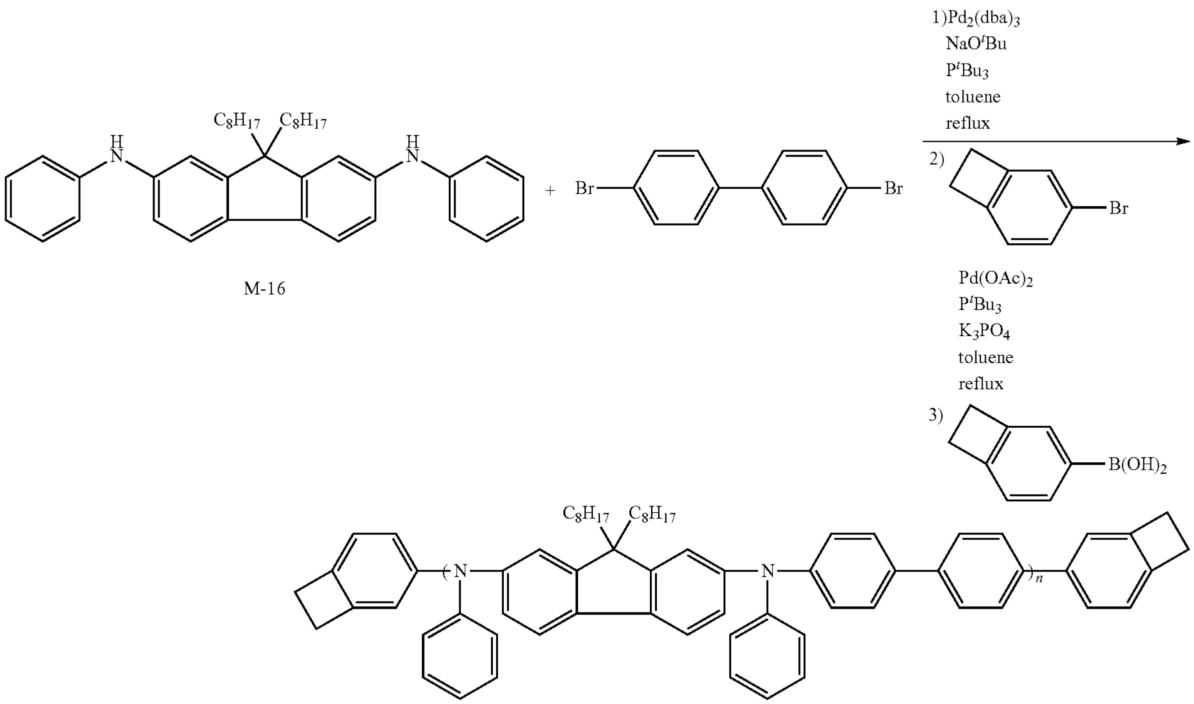

M-16

P2-9

The same reaction was conducted as in the synthesis of polymer P2-1, except that the monomer M-16 synthesized in the same manner as in Comparative Example 2(1) was used instead of 2,7-bis(4,4,5,5-tetramethyl-1,3,2-dioxaborolane-2-yl)-9,9-di-n-octylfluorene and 4,4'-dibromobiphenyl was used instead of the intermediate M-1 to obtain 2.8 g of the polymer P2-9.

The polymer P2-9 had a number average molecular weight of $1.1\times10^4$ in terms of polystyrene and a weight average molecular weight of $3.5\times10^4$ in terms of polystyrene.

An organic EL device was fabricated and evaluated in the same manner as in Example 28, except that the polymer P2-9 was used instead of the polymer P2-1 as a hole-transporting material. The results are shown in Table 199.

superior luminous efficiency and longer lifetime compared with organic EL devices using a comparative compound as an aromatic amine derivative.

Fabrication (Only Applying) and Evaluation of Organic EL Device

Example 30

A glass substrate, measuring 25 mm×75 mm×1.1 mm thick, with an ITO transparent electrode (manufactured by Geomatics Co.) was subjected to ultrasonic cleaning in isopropyl alcohol for 5 minutes and then UV ozone cleaning for 30 minutes. On the cleaned glass substrate with a transparent electrode, a mixture of polyethylenedioxythiophene/polystyrenesulfonate (PEDOT:PSS) was formed into a 10 nm-thick film as a hole-injecting layer by spin coating. Subsequently, a xylene solution (1.0% by weight) of the polymer P2-1 obtained in Example 21 was formed into a 25 nm-thick film by spin coating. The resulting thin film was dried and hardened by heat treatment at 230° C. for 30 minutes to form a hole-transporting layer. Next, a xylene solution (1.0% by weight) in which the compound EM1 (host) and the amine compound D1 including a styryl group (dopant) were mixed at the solid matter weight ratio of 95:5 was formed into a 40 nm-thick film by spin coating, and dried at 150° C. for 30 minutes to obtain an emitting layer. On the film obtained, Alq was deposited to form a 10 nm-thick film. The layer obtained served as an electron-injecting layer. After that, Li as a reducing dopant (Li source: manufactured by SAES Getters Co., Ltd.) and Alq were co-deposited to form an Alq:Li film (film thickness: 10 nm) as an electron-injecting layer (cathode). On the Alq:Li film, metal Al was deposited to form a metallic cathode. Glass sealing was conducted in nitrogen to fabricate an organic EL device.

The fabricated organic EL device was evaluated by applying an electric current. The results are shown in Table 200.

Example 31

An organic EL device was fabricated and evaluated in the same manner as in Example 30, except that the polymer P2-2 obtained in Example 22 was used instead of the polymer P2-1 as a hole-transporting material. The results are shown in Table 200.

Example 32

An organic EL device was fabricated and evaluated in the same manner as in Example 30, except that the polymer P2-3 obtained in Example 23 was used instead of the polymer P2-1 as a hole-transporting material. The results are shown in Table 200.

Example 33

An organic EL device was fabricated and evaluated in the same manner as in Example 30, except that the polymer P2-4 obtained in Example 24 was used instead of the polymer P2-1 as a hole-transporting material. The results are shown in Table 200.

Example 34

An organic EL device was fabricated and evaluated in the same manner as in Example 30, except that the polymer P2-5 obtained in Example 25 was used instead of the polymer P2-1 as a hole-transporting material. The results are shown in Table 200.

Example 35

An organic EL device was fabricated and evaluated in the same manner as in Example 30, except that the polymer P2-6 obtained in Example 26 was used instead of the polymer P2-1 as a hole-transporting material. The results are shown in Table 200.

Example 36

An organic EL device was fabricated and evaluated in the same manner as in Example 30, except that the polymer P2-7 obtained in Example 27 was used instead of the polymer P2-1 as a hole-transporting material. The results are shown in Table 200.

Example 37

An organic EL device was fabricated and evaluated in the same manner as in Example 30, except that the arylamine compound D2 was used instead of the amine compound D1 including a styryl group as a material for an emitting layer. The results are shown in Table 200.

Comparative Example 23

An organic EL device was fabricated and evaluated in the same manner as in Example 30, except that the polymer P2-8 obtained in Comparative Example 21 was used instead of the polymer P2-1 as a hole-transporting material. The results are shown in Table 200.

Comparative Example 24

An organic EL device was fabricated and evaluated in the same manner as in Example 31, except that the polymer P2-9 obtained in Comparative Example 22 was used instead of the polymer P2-1 as a hole-transporting material. The results are shown in Table 200.

TABLE 200

| | Hole-trans-porting polymer | Emitting layer Host | Emitting layer Dopant | Emitting color | Luminous efficiency [cd/A] | Relative lifetime [−] |
|---|---|---|---|---|---|---|
| Example 30 | P2-1 | EM1 | D1 | Blue | 2.9 | 1.0 |
| Example 31 | P2-2 | EM1 | D1 | Blue | 3.1 | 1.1 |
| Example 32 | P2-3 | EM1 | D1 | Blue | 3.0 | 0.9 |
| Example 33 | P2-4 | EM1 | D1 | Blue | 3.0 | 0.9 |
| Example 34 | P2-5 | EM1 | D1 | Blue | 3.1 | 1.0 |
| Example 35 | P2-6 | EM1 | D1 | Blue | 2.9 | 1.0 |
| Example 36 | P2-7 | EM1 | D1 | Blue | 2.8 | 1.0 |
| Example 37 | P2-1 | EM1 | D2 | Blue | 2.9 | 1.1 |
| Com. Ex. 23 | P2-8 | EM1 | D1 | Blue | 0.3 | 0.1 |
| Com. Ex. 24 | P2-9 | EM1 | D1 | Blue | 0.2 | 0.2 |

*In the table, the relative lifetime is a value calculated by taking the emission lifetime of the device of Example 30 as 1.

INDUSTRIAL APPLICABILITY

The polymer of the invention is useful as a material for electronics. In particular, it is suitable for a material for an organic electroluminescence device, specifically for a material used in a hole-transporting region between an anode and an emitting layer.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the Japanese application specification claiming priority under the Paris Convention are incorporated herein by reference in its entirety.

The invention claimed is:

1. A polymer comprising structural units represented by any of the following formulas (1) to (7):

(1)

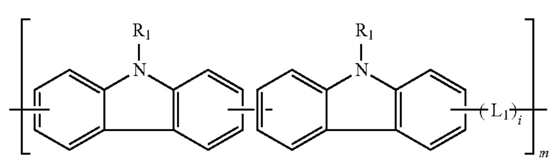

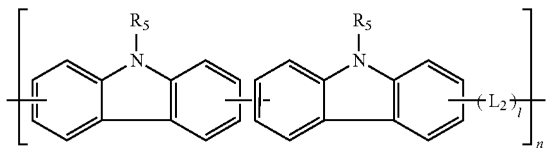
(2)
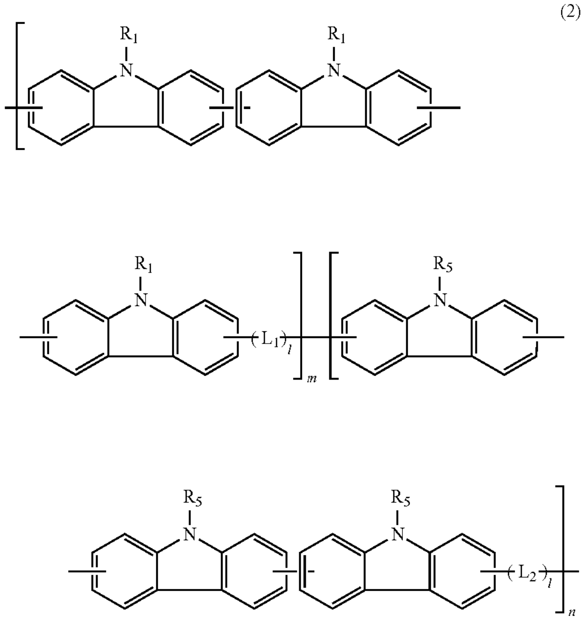
(3)
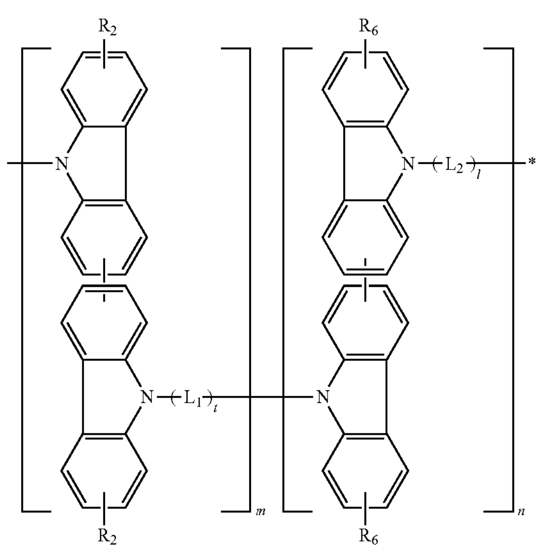
(4)
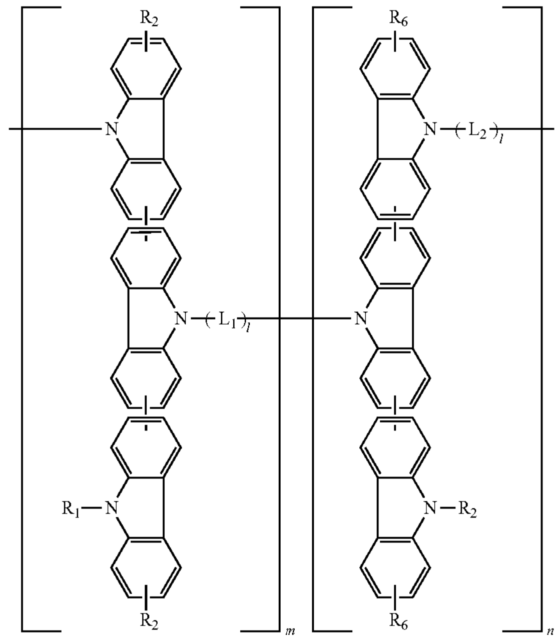
(5)
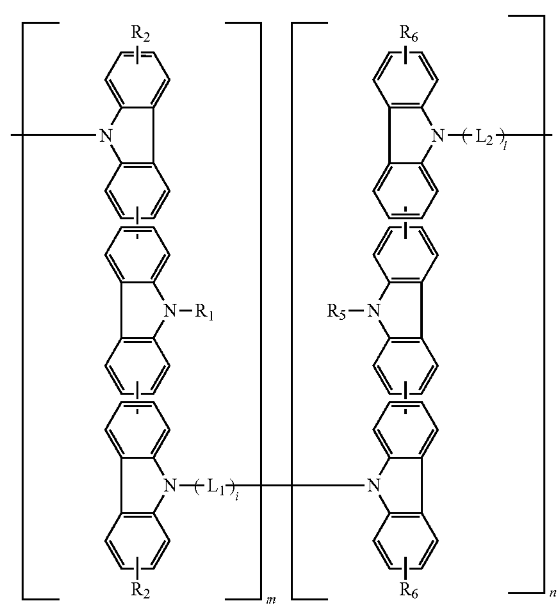

-continued (6)

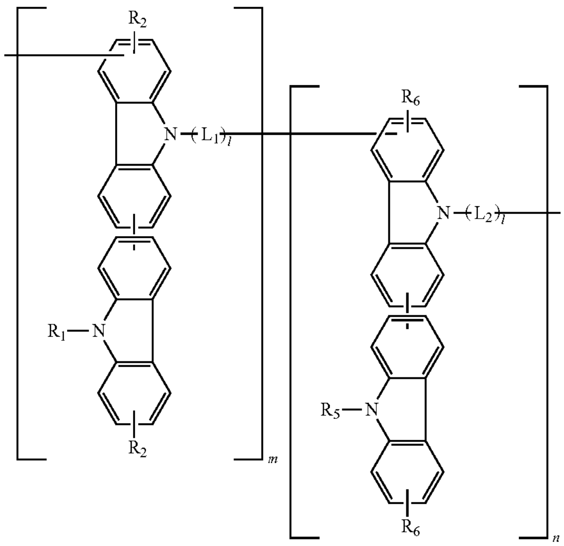

(7)

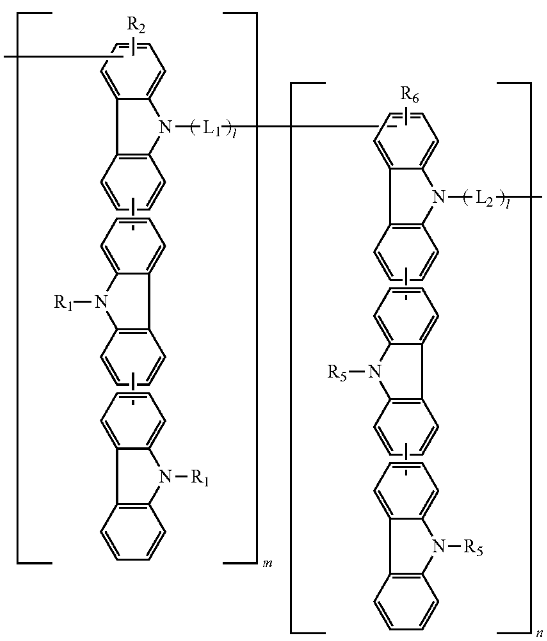

wherein $R_1$ and $R_2$ are independently a hydrogen atom, a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group having 3 to 30 ring atoms, a substituted or unsubstituted arylamino group or an arylsilyl group;

$L_1$ is a linkage group comprising a fluorene ring;

$R_5$ and $R_6$ are independently a hydrogen atom, a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group, an arylsilyl group or a cross-linkable group;

$L_2$ is independently a group comprising a fluorene ring and optionally a cross-linkable group;

and m and n are independently the amount ratio (molar ratio) of each structural unit in the polymer; m is 0.01 to 0.99, n is 0.01 to 0.99 and m+n=1;

1 is 0 or 1;

at least one of $R_1$, $R_2$, $R_5$ and $R_6$ is a group selected from the groups represented by the following formulas (51) to (55):

(51)

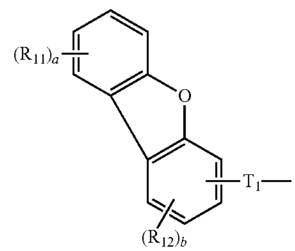

(52)

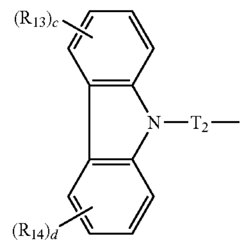

(53)

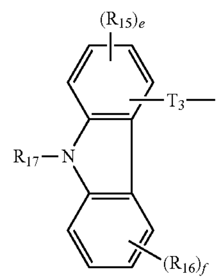

(54)

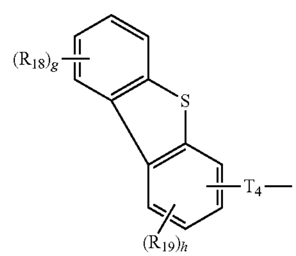

(55)

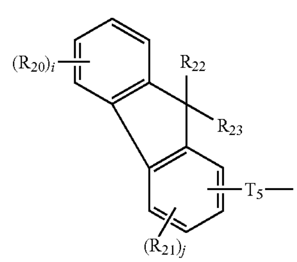

wherein $R_{11}$ to $R_{23}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted alkoxy group including 1 to 20 carbon atoms, a substituted or unsubstituted cycloalkoxy group including 3 to 10 ring carbon atoms, a substituted or unsubstituted aryloxy group including 6 to 30 ring carbon atoms, a substituted or unsubstituted aralkyl group including 7 to 40 carbon atoms, a substituted or unsubstituted heteroaryl group including 3 to 30 ring atoms, a substituted amino group, a substituted silyl group, a halogen atom, a nitro group, a cyano group or a hydroxyl group;

a, c, d, f, g and i are independently an integer of 0 to 4;

b, e, h and j are independently an integer of 0 to 3; and $T_1$ to $T_5$ are independently a substituted or unsubstituted aromatic hydrocarbon ring group including 6 to 50 ring carbon atoms or an aromatic heterocyclic group including 3 to 30 ring atoms, and the cross-linkable group is a group selected from groups represented by the following formulas (X13) to (X15):

(X13)

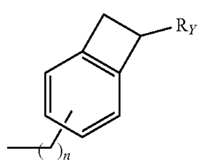

-continued (X14)

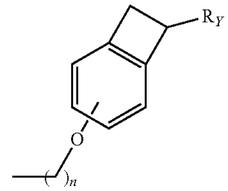

(X15)

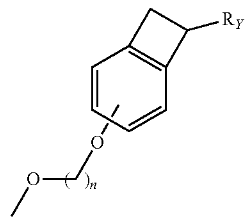

wherein n is an integer of 0 to 10; and $R_Y$ is a hydrogen atom or an alkyl group including 1 to 20 carbon atoms.

2. The polymer according to claim 1 which is represented by any of the following formulas (8) to (25):

(8)

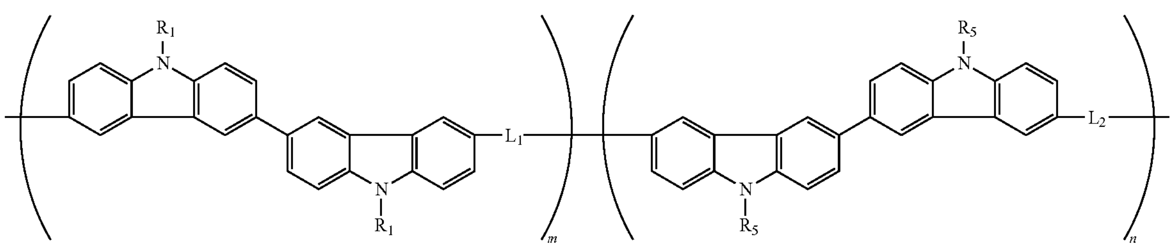

(9)

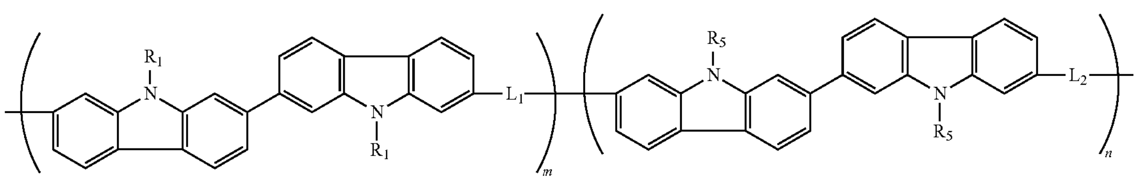

(10)

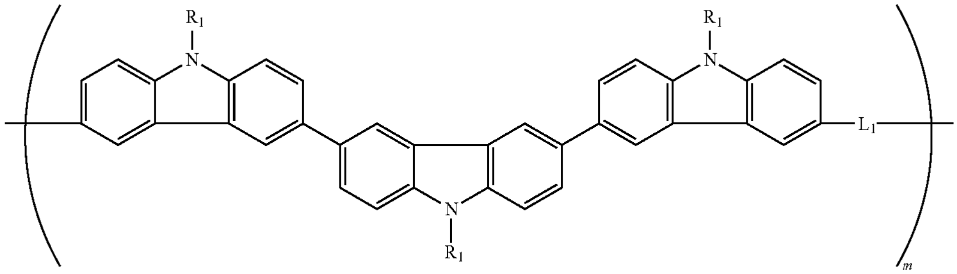

-continued
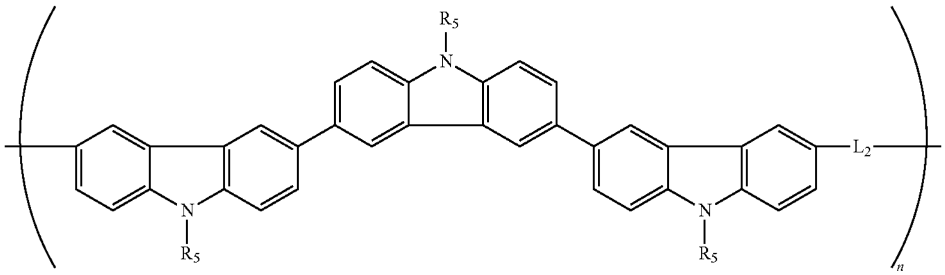
(11)
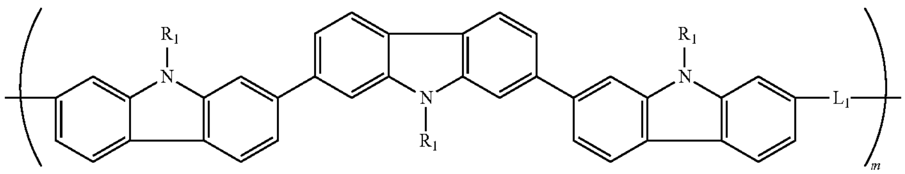
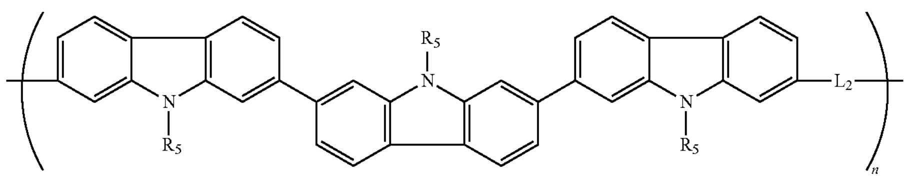
(12)
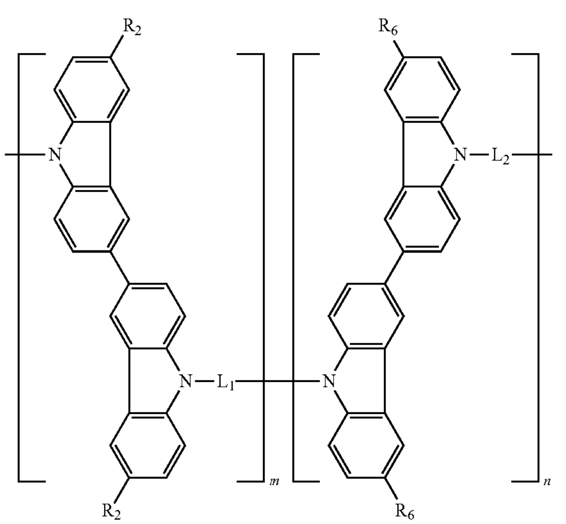
(13)
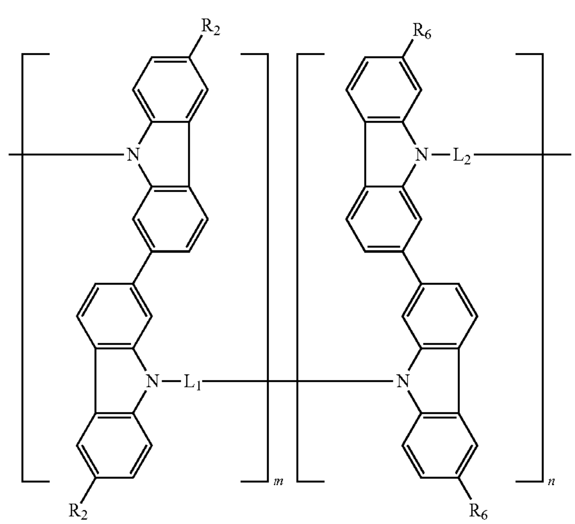

-continued
(14)
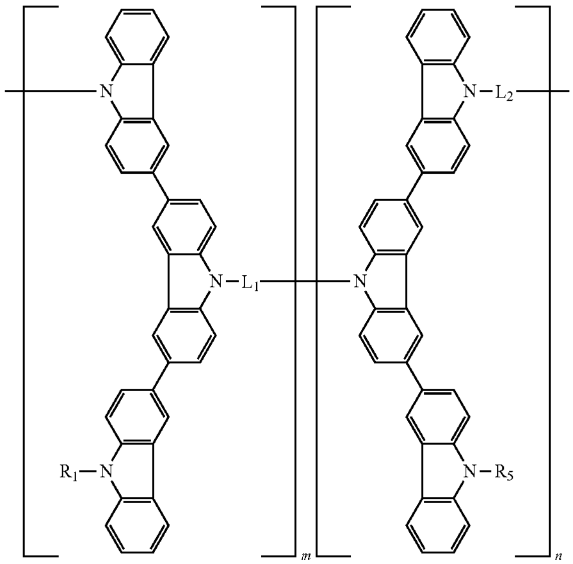
(15)
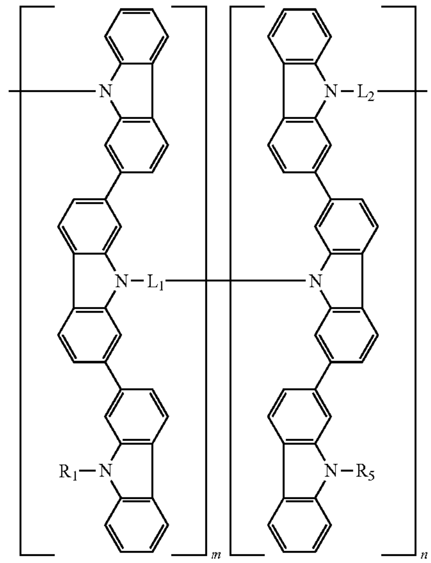
(16)
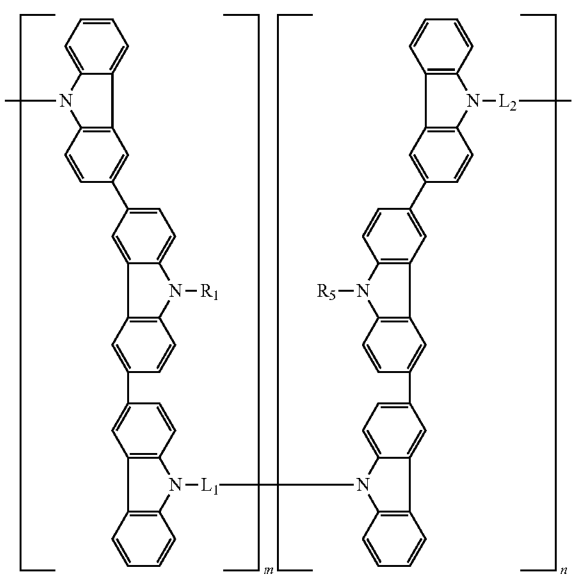
(17)
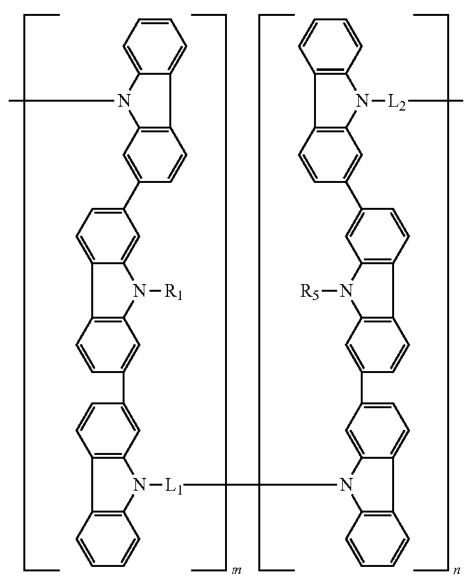

-continued
(18)
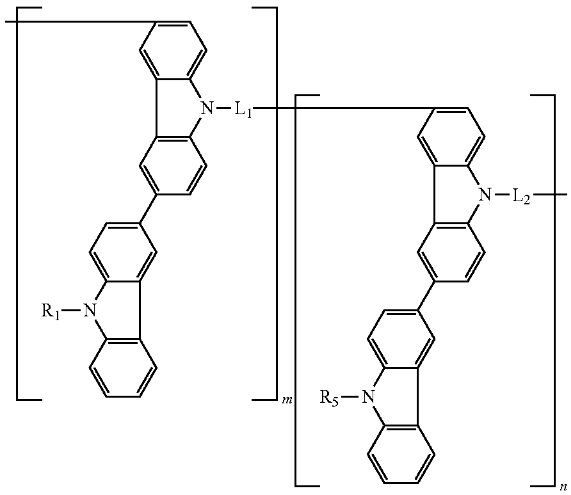
(19)
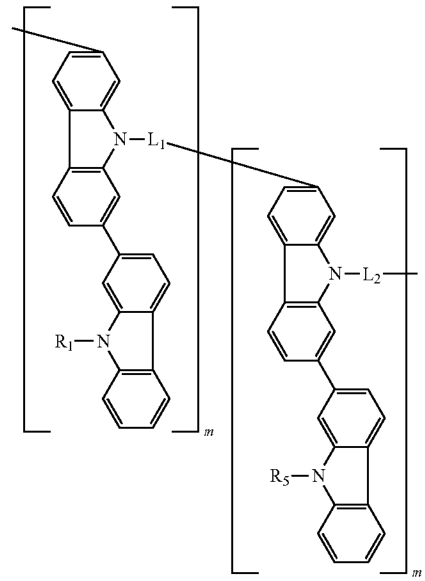
(20)
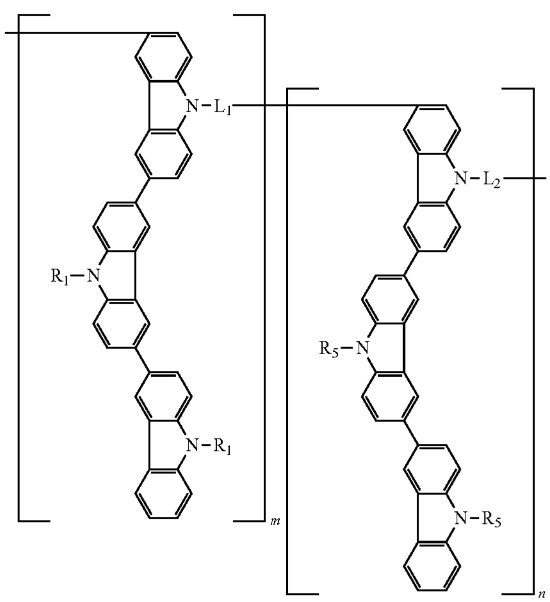
(21)
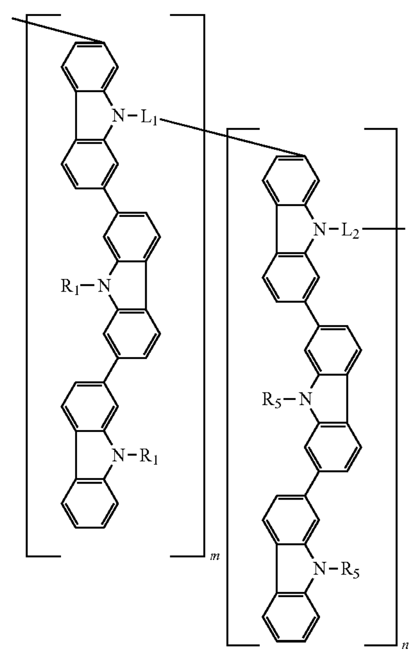

-continued (22)

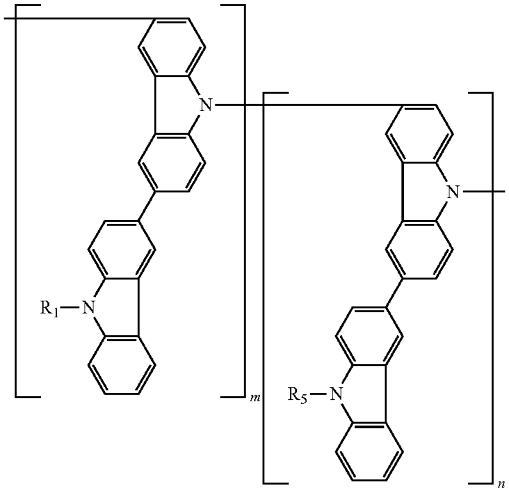

(23)

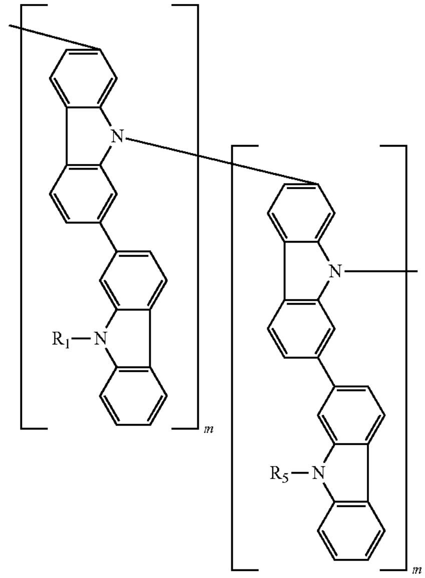

(24)

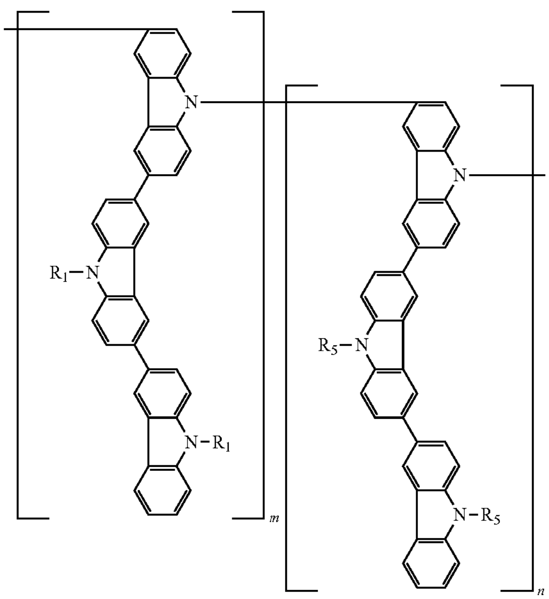

(25)

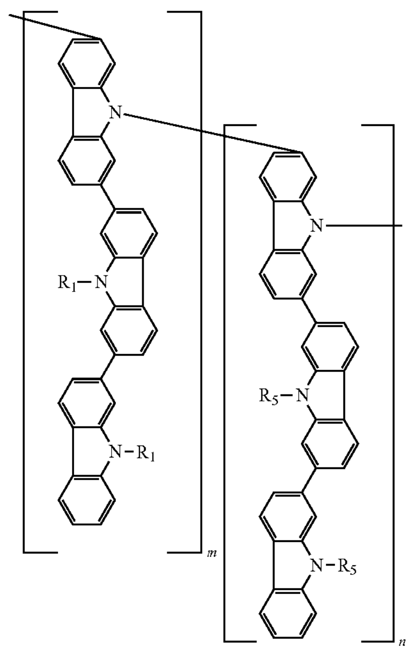

wherein in each formula, $R_1$, $R_2$, $R_5$, $R_6$, $L_1$ and $L_2$ are the same as $R_1$, $R_2$, $R_5$, $R_6$, $L_1$ and $L_2$ in the formulas (1) to (7);

m and n are independently the amount ratio (molar ratio) of each structural unit in the polymer; m is 0.01 to 0.99, n is 0.01 to 0.99 and m+n=1.

3. The polymer according to claim 1, wherein, in each of polymers represented by the formulas (1) to (7), at least one of $R_5$s or at least one of $R_6$s is a cross-linkable group and $L_2$ comprises no cross-linkable group.

4. The polymer according to claim 1, wherein the cross-linkable group is a group selected from groups represented by the following formulas (31) to (35) and (39) to (42):

(31)

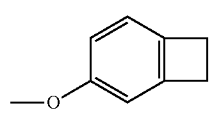

(32)

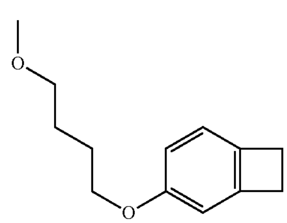

-continued (33)

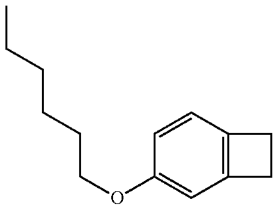

(34)

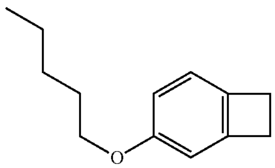

(35)

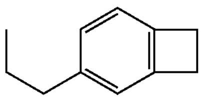

(39)

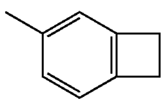

(40)

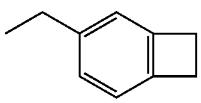

(41)

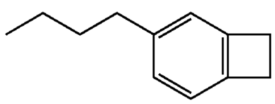

(42)

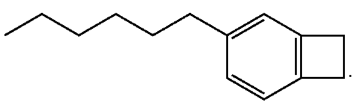

5. The polymer according to claim 4, wherein at least one of $R_5$s is a group represented by the formula (39).

6. An organic electroluminescence device comprising:

an anode and a cathode;

one or more organic thin film layers between the anode and the cathode;

one of one or more organic thin film layers being an emitting layer; and at least one of the organic thin film layers comprising the polymer according to claim 5, wherein at least one of the organic thin film layers is a hole-injecting layer or a hole-transporting layer.

7. The organic electroluminescence device according to claim 6, wherein the hole-injecting layer or the hole-transporting layer is in contact with the emitting layer.

8. The polymer according to claim 1, wherein, in each of polymers represented by the formulas (1) to (7), at least one of $L_2$s comprises a cross-linkable group, and $R_5$ and $R_6$ are not cross-linkable groups.

9. The polymer according to claim 8, wherein the $L_2$ is a group selected from groups represented by the following formulas (43) and (45):

(43)

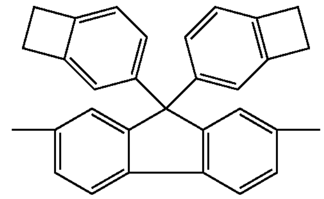

(45)

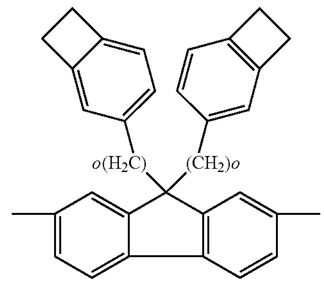

wherein in the formula (45), o is an integer of 1 to 10.

10. The polymer according to claim 9, wherein o is 6.

11. An organic electroluminescence device comprising:

an anode and a cathode;

one or more organic thin film layers between the anode and the cathode;

one of one or more organic thin film layers being an emitting layer; and at least one of the organic thin film layers comprising the polymer according to claim 10, wherein at least one of the organic thin film layers is a hole-injecting layer or a hole-transporting layer.

12. The organic electroluminescence device according to claim 11, wherein the hole-injecting layer or the hole-transporting layer is in contact with the emitting layer.

13. An applying liquid comprising the polymer according to claim 1 and a solvent.

14. The applying liquid according to claim 13, wherein at least one of the solvents is an organic solvent.

15. A method for producing an electronic device, wherein wet film formation is conducted by using the applying liquid according to claim 13.

16. The method for producing an electronic device according to claim 15, wherein the electronic device is an electroluminescence device, a photoelectronic conversion device or a transistor.

17. The method for producing an electronic device according to claim 15, wherein the electronic device is an organic electroluminescence device.

18. An organic electroluminescence device comprising:

an anode and a cathode;

one or more organic thin film layers between the anode and the cathode;

one of one or more organic thin film layers being an emitting layer; and at least one of the organic thin film layers comprising the polymer according to claim 1.

19. The organic electroluminescence device according to claim 18, wherein at least one of the organic thin film layers is a hole-injecting layer or a hole-transporting layer.

20. The organic electroluminescence device according to claim 19, wherein the hole-injecting layer or the hole-transporting layer is in contact with the emitting layer.

21. The organic electrolumnecence device according to claim 18 wherein the emitting layer is formed by a wet film formation method.

22. The polymer according to claim 1, wherein, in each of polymers represented by the formulas (1) to (7), $L_2$ has no cross-linkable group and $R_6$ is not a cross-linkable group.

23. An organic electroluminescence device comprising:
an anode and a cathode;
one or more organic thin film layers between the anode and the cathode;
one of one or more organic thin film layers being an emitting layer; and
at least one of the organic thin film layers comprising the polymer according to claim 22,
wherein at least one of the organic thin film layers is a hole-injecting layer or a hole-transporting layer.

24. The organic electroluminescence device according to claim 23, wherein the hole-injecting layer or the hole-transporting layer is in contact with the emitting layer.

25. The polymer according to claim 1, wherein the structural units represented by any of formulas (1) to (7) is represented by formula (2).

26. A polymer represented by any of the following formulas (101) to (107):

(101)

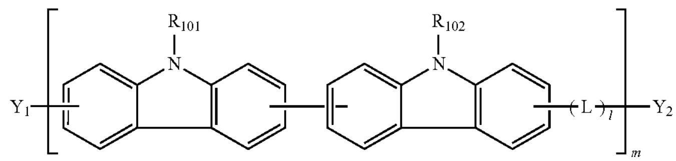

(102)

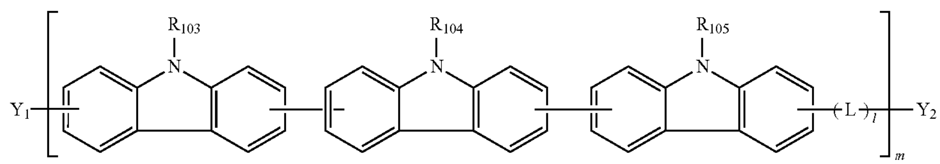

(103)

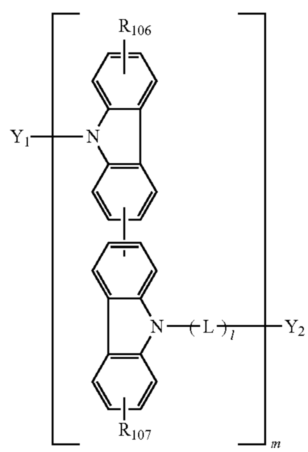

(104)

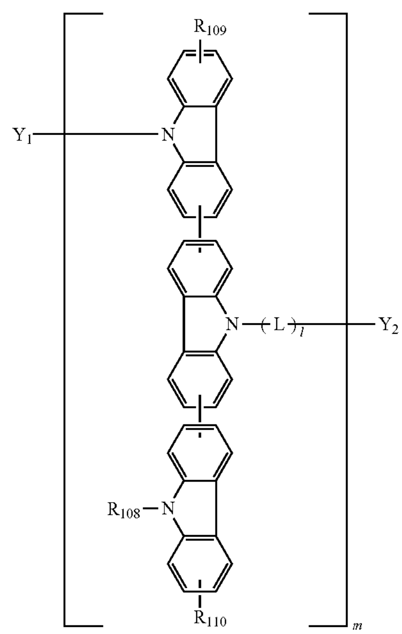

-continued (105)

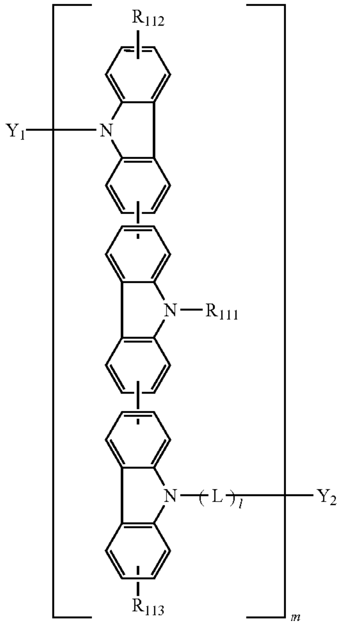

(106)

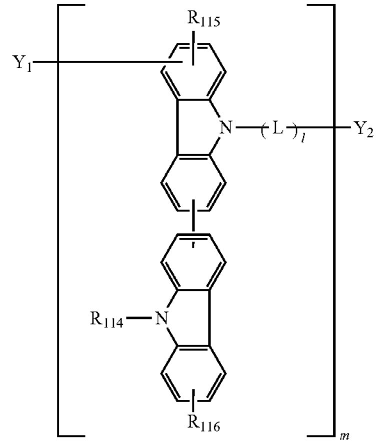

(107)

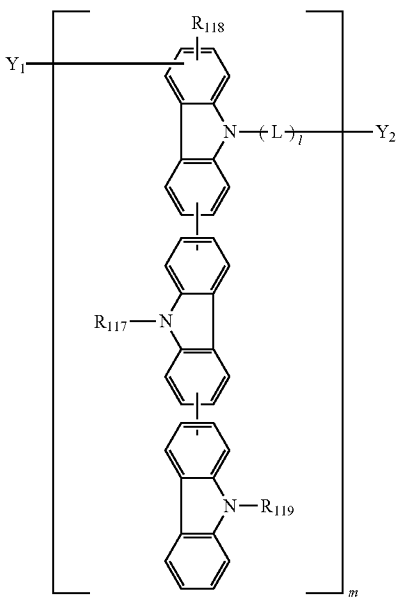

wherein

L is a linkage group comprising a fluorene ring;

$R_{101}$ to $R_{119}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group or a substituted or unsubstituted arylsilyl group;

I is an integer of 0 or 1;

m is a repeating unit;

in the formulas (101) to (107), at least one of $R_{101}$ and $R_{102}$, at least one of $R_{103}$ to $R_{105}$, at least one of $R_{106}$ and $R_{107}$, at least one of $R_{108}$ to $R_{110}$, at least one of $R_{111}$ to $R_{113}$, at least one of $R_{114}$ to $R_{116}$ and at least one of $R_{117}$ to $R_{119}$ are a group selected from the groups represented by the following formulas (51) to (55):

(51)

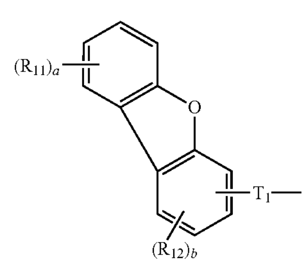

-continued (52)

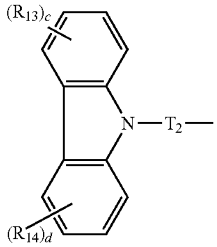

(53)

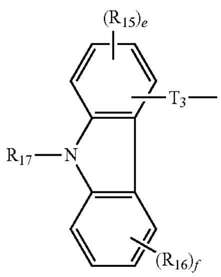

(54)

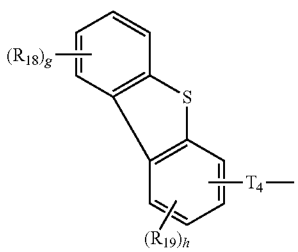

(55)

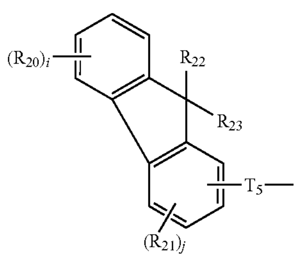

wherein $R_{11}$ to $R_{23}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted alkoxy group including 1 to 20 carbon atoms, a substituted or unsubstituted cycloalkoxy group including 3 to 10 ring carbon atoms, a substituted or unsubstituted aryloxy group including 6 to 30 ring carbon atoms, a substituted or unsubstituted aralkyl group including 7 to 40 carbon atoms, a substituted or unsubstituted heteroaryl group including 3 to 30 ring atoms, a substituted amino group, a substituted silyl group, a halogen atom, a nitro group, a cyano group or a hydroxyl group;

a, c, d, f, g and i are independently an integer of 0 to 4;

b, e, h and j are independently an integer of 0 to 3; and $T_1$ to $T_5$ are independently a substituted or unsubstituted aromatic hydrocarbon ring group including 6 to 50 ring carbon atoms or an aromatic heterocyclic group including 3 to 30 ring atoms; and $Y_1$ and $Y_2$ are independently a group selected from the groups represented by the following formulas (X13) to (X15);

(X13)

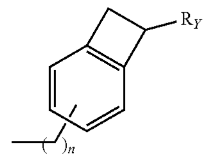

(X14)

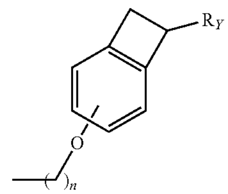

(X15)

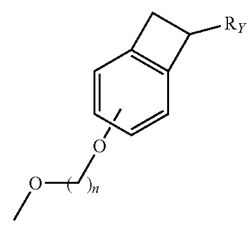

wherein n is an integer of 0 to 10; and $R_Y$ is a hydrogen atom or an alkyl group including 1 to 20 carbon atoms.

27. The polymer according to claim 26, wherein $Y_1$ and $Y_2$ are independently a group selected from the groups represented by the following formulas (31) to (35) and (39) to (42):

(31)

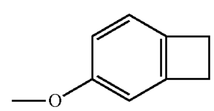

(32)

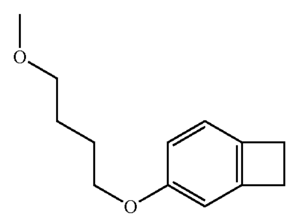

(33)

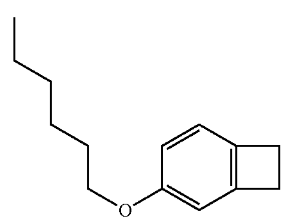

(34)

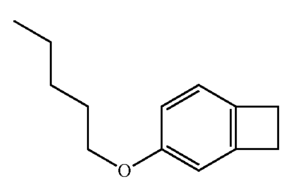

-continued (35)

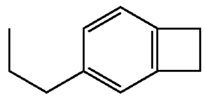

(39)

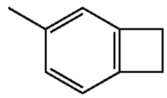

(40)

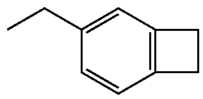

(41)

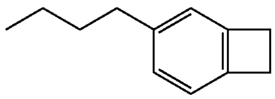

(42)

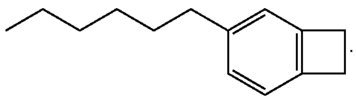

28. The polymer according to claim 27, wherein $Y_1$ and $Y_2$ are a group represented by the formula (39).

29. An organic electroluminescence device comprising:
- an anode and a cathode;
- one or more organic thin film layers between the anode and the cathode;
- one of one or more organic thin film layers being an emitting layer; and
- at least one of the organic thin film layers comprising the polymer according to claim 28,
- wherein at least one of the organic thin film layers is a hole-injecting layer or a hole-transporting layer.

30. The organic electroluminescence device according to claim 29, wherein the hole-injecting layer or the hole-transporting layer is in contact with the emitting layer.

31. An applying liquid comprising the polymer according to claim 26 and a solvent.

32. The applying liquid according to claim 31, wherein at least one of the solvents is an organic solvent.

33. A method for producing an electronic device, wherein wet film formation is conducted by using the applying liquid according to claim 31.

34. The method for producing an electronic device according to claim 33, wherein the electronic device is an electroluminescence device, a photoelectronic conversion device or a transistor.

35. The method for producing an electronic device according to claim 33, wherein the electronic device is an organic electroluminescence device.

36. An organic electroluminescence device comprising:
- an anode and a cathode;
- one or more organic thin film layers between the anode and the cathode;
- one of the one or more organic thin film layers being an emitting layer; and
- at least one of the organic thin film layers comprising the polymer according to claim 26.

37. The organic electroluminescence device according to claim 36, wherein at least one of the organic thin film layers is a hole-injecting layer or a hole-transporting layer.

38. The organic electroluminescence device according to claim 37, wherein the hole-injecting layer or the hole-transporting layer is in contact with the emitting layer.

39. The organic electroluminescence device according to claim 36 wherein the emitting layer is formed by a wet film formation method.

40. The polymer according to claim 26, wherein the polymer represented by any of the formulas (101) to (107) is represented by formula (105), formula (106) or combinations thereof; and wherein in the formulas (105) and (106), at least one of $R_{111}$ to $R_{113}$ is a group selected from the groups represented by the formulas (51) to (54).

41. A polymer represented by any of the following formula (105) and formula (106):

(105)

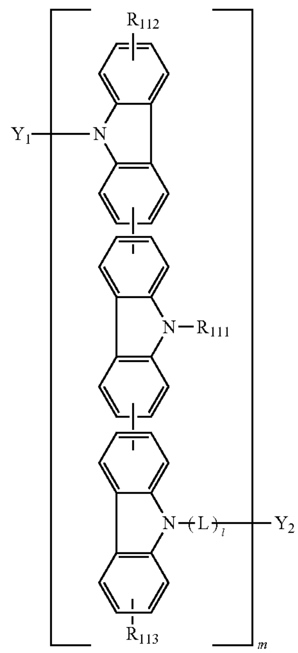

(106)

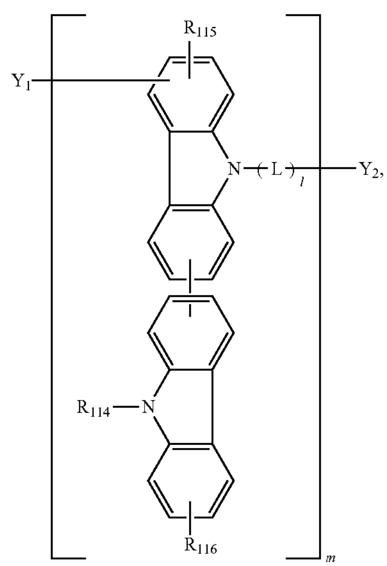

wherein
- L is a linkage group comprising a fluorene ring;
- $R_{111}$ to $R_{116}$ are independently a substituted or unsubstituted alkyl group including 1 to 20 carbon atoms, a substituted or unsubstituted cycloalkyl group including 3 to 10 ring carbon atoms, a substituted or unsubstituted aryl group including 6 to 30 ring carbon atoms, a substituted or unsubstituted heteroaryl group including 3 to 30 ring atoms, a substituted or unsubstituted arylamino group or a substituted or unsubstituted arylsilyl group;

I is an integer of 0 or 1;

m is a repeating unit; and $Y_1$ and $Y_2$ are independently a group selected from the groups represented by the following formulas (X13) to (X15);

(X13)

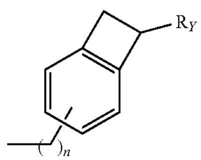

-continued (X14)

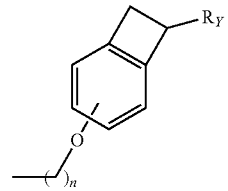

(X15)

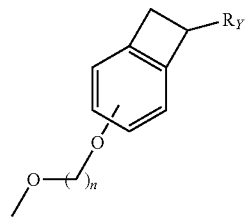

wherein n is an integer of 0 to 10; and $R_Y$ is a hydrogen atom or an alkyl group including 1 to 20 carbon atoms.

* * * * *